US012327790B2

(12) United States Patent
Lee et al.

(10) Patent No.: US 12,327,790 B2
(45) **Date of Patent: *Jun. 10, 2025**

(54) VERTICAL INTERCONNECT ELEVATOR BASED ON THROUGH SILICON VIAS

(71) Applicant: iCometrue Company Ltd., Zhubei (TW)

(72) Inventors: Jin-Yuan Lee, Miaoli County (TW); Mou-Shiung Lin, Hsinchu (TW)

(73) Assignee: iCometrue Company Ltd., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/406,162

(22) Filed: Jan. 7, 2024

(65) Prior Publication Data

US 2024/0203874 A1 Jun. 20, 2024

Related U.S. Application Data

(63) Continuation of application No. 16/984,663, filed on Aug. 4, 2020, now Pat. No. 11,887,930.

(Continued)

(51) Int. Cl.

*H01L 23/528* (2006.01)
*H01L 23/00* (2006.01)

(Continued)

(52) U.S. Cl.

CPC ........ *H01L 23/528* (2013.01); *H01L 23/5226* (2013.01); *H01L 23/53204* (2013.01);

(Continued)

(58) Field of Classification Search

CPC ............... H01L 23/528; H01L 23/5226; H01L 23/53204; H01L 23/5329; H01L 24/17;

(Continued)

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Patricia D Valenzuela

(57) ABSTRACT

A chip package includes a first integrated-circuit (IC) chip; a second integrated-circuit (IC) chip over the first integrated-circuit (IC) chip; a connector over the first integrated-circuit (IC) chip and on a same horizontal level as the second integrated-circuit (IC) chip, wherein the connector comprises a substrate over the first integrated-circuit (IC) chip and a plurality of through vias vertically extending through the substrate of the connector; a polymer layer over the first integrated-circuit (IC) chip, wherein the polymer layer has a portion between the second integrated-circuit (IC) chip and connector, wherein the polymer layer has a top surface coplanar with a top surface of the second integrated-circuit (IC) chip, a top surface of the substrate of the connector and a top surface of each of the plurality of through vias; and an interconnection scheme on the top surface of the polymer layer, the top surface of the second integrated-circuit (IC) chip, the top surface of the connector and the top surface of each of the plurality of through vias.

29 Claims, 140 Drawing Sheets

Related U.S. Application Data

(60) Provisional application No. 63/023,235, filed on May 11, 2020, provisional application No. 63/012,072, filed on Apr. 17, 2020, provisional application No. 62/983,634, filed on Feb. 29, 2020, provisional application No. 62/964,627, filed on Jan. 22, 2020, provisional application No. 62/903,655, filed on Sep. 20, 2019, provisional application No. 62/891,386, filed on Aug. 25, 2019, provisional application No. 62/882,941, filed on Aug. 5, 2019.

(51) Int. Cl.
*H01L 23/522* (2006.01)
*H01L 23/532* (2006.01)
*G11C 7/10* (2006.01)
*G11C 11/412* (2006.01)

(52) U.S. Cl.
CPC .......... *H01L 23/5329* (2013.01); *H01L 24/17* (2013.01); *G11C 7/106* (2013.01); *G11C 11/412* (2013.01)

(58) Field of Classification Search
CPC ......... H01L 24/19; H01L 24/20; H01L 24/08; H01L 24/16; H01L 24/80; H01L 24/81; H01L 2224/02126; H01L 2224/02331; H01L 2224/0235; H01L 2224/0401; H01L 2224/05009; H01L 2224/05025; H01L 2224/05166; H01L 2224/05186; H01L 2224/05569; H01L 2224/05609; H01L 2224/05611; H01L 2224/05639; H01L 2224/05644; H01L 2224/05647; H01L 2224/08145; H01L 2224/09181; H01L 2224/13082; H01L 2224/13109; H01L 2224/13111; H01L 2224/13139; H01L 2224/13144; H01L 2224/13147; H01L 2224/16014; H01L 2224/16058; H01L 2224/16146; H01L 2224/16235; H01L 2224/17181; H01L 2224/19; H01L 2224/73251; H01L 2224/73259; H01L 2224/80011; H01L 2224/80013; H01L 2224/80357; H01L 2224/81191; H01L 2224/81203; H01L 2224/95; H01L 2224/96; H01L 23/5385; H01L 23/49816; H01L 2224/05572; H01L 23/38; H01L 29/945; H01L 2224/13022; H01L 2224/73204; H01L 2224/80895; H01L 2224/80896; H01L 2224/94; H01L 23/481; H01L 23/5223; H01L 23/5384; H01L 21/76898; G11C 7/106; G11C 11/412; H10D 1/665
See application file for complete search history.

(56) References Cited

U.S. PATENT DOCUMENTS 5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,034,542 A 3/2000 Ridgeway
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,952,114 B2 10/2005 Turner
6,998,872 B1 2/2006 Chirania et al.
7,030,652 B1 4/2006 Lewis et al.
7,061,271 B1 6/2006 Young et al.
7,126,214 B2 10/2006 Huppenthal et al.
7,190,190 B1 3/2007 Camarota et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,550,994 B1 6/2009 Camarota
7,579,681 B2 8/2009 Chia et al.
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
7,977,783 B1 7/2011 Park et al.
8,064,224 B2 11/2011 Mahajan et al.
8,081,079 B1 12/2011 Camarota
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,368,458 B2 6/2016 Wu et al.
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.

(56) References Cited

U.S. PATENT DOCUMENTS 9,524,955 B2 12/2016 Huang et al.
9,543,276 B2 1/2017 Jee et al.
9,583,431 B1 2/2017 Rahman
9,593,009 B2 3/2017 Fuergut et al.
9,601,471 B2 3/2017 Zhai et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,262,974 B2 4/2019 Yeh et al.
10,276,382 B2 4/2019 Hunt et al.
10,290,611 B2 5/2019 Yu et al.
10,325,882 B2 6/2019 Kang et al.
10,333,623 B1 6/2019 Liao et al.
10,340,249 B1 7/2019 Yu et al.
10,347,606 B2 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,522,449 B2 12/2019 Chen et al.
10,529,666 B2 1/2020 Yu et al.
10,535,638 B2 1/2020 Yeh et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,867,965 B2 12/2020 Shih et al.
10,892,011 B2 1/2021 Lin et al.
10,892,291 B2 1/2021 Chhun et al.
10,943,869 B2 3/2021 Zhai et al.
11,056,463 B2 7/2021 Takahashi et al.
11,114,408 B2 9/2021 Shen et al.
11,211,334 B2 12/2021 Lin et al.
11,217,368 B2 1/2022 Choa et al.
11,276,661 B2 3/2022 Fang
11,545,438 B2 1/2023 Hsieh et al.
11,587,894 B2 2/2023 Chen et al.
11,728,254 B2 8/2023 Hou et al.
11,887,930 B2 * 1/2024 Lee .................... H01L 23/5226
2001/0045844 A1 11/2001 New et al.
2001/0051426 A1 12/2001 Pozder et al.
2002/0092307 A1 7/2002 Ghoshal
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0046002 A1 3/2005 Lee et al.
2005/0185457 A1 8/2005 Kim et al.
2005/0218929 A1 10/2005 Wang et al.
2006/0138509 A1 6/2006 Lee et al.
2007/0037379 A1 2/2007 Enquist et al.
2007/0164279 A1 7/2007 Lin et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0133704 A1 6/2010 Marimuthu et al.
2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 * 3/2014 Chiu .................. H01L 23/5381
438/107
2014/0070403 A1 3/2014 Pan et al.
2014/0131858 A1 5/2014 Pan et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2014/0339692 A1 11/2014 Kim et al.
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0287672 A1 10/2015 Yazdani
2015/0327367 A1 11/2015 Shen
2016/0079205 A1 3/2016 Lin et al.
2016/0118390 A1 4/2016 Liaw
2016/0133571 A1 5/2016 Lee et al.
2016/0141228 A1 5/2016 Leobandung
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0117263 A1 4/2017 Yeh et al.
2017/0301650 A1 10/2017 Yu
2017/0358557 A1 12/2017 Chen et al.

(56) References Cited

U.S. PATENT DOCUMENTS

| | | | |
|---|---|---|---|
| 2018/0053730 | A1 | 2/2018 | Shao |
| 2018/0061742 | A1 | 3/2018 | Ananiev |
| 2018/0068937 | A1 | 3/2018 | Marimuthu et al. |
| 2018/0076179 | A1 | 3/2018 | Hsu et al. |
| 2018/0102776 | A1 | 4/2018 | Chandrasekar et al. |
| 2018/0150667 | A1 | 5/2018 | Yu et al. |
| 2018/0151477 | A1 | 5/2018 | Yu et al. |
| 2018/0151501 | A1 | 5/2018 | Yu et al. |
| 2018/0158746 | A1 | 6/2018 | Lin |
| 2018/0165396 | A1 | 6/2018 | Lin et al. |
| 2018/0174865 | A1 | 6/2018 | Yu et al. |
| 2018/0204810 | A1 | 7/2018 | Yu et al. |
| 2018/0204828 | A1 | 7/2018 | Yu et al. |
| 2018/0210799 | A1 | 7/2018 | Gao |
| 2018/0226349 | A1 | 8/2018 | Yu et al. |
| 2018/0226371 | A1 | 8/2018 | Enquist |
| 2018/0247905 | A1 | 8/2018 | Yu et al. |
| 2018/0269188 | A1 | 9/2018 | Yu et al. |
| 2018/0275193 | A1 | 9/2018 | Rouge et al. |
| 2018/0284186 | A1 | 10/2018 | Chadha |
| 2018/0286776 | A1 | 10/2018 | Yu et al. |
| 2018/0301351 | A1 | 10/2018 | Yu et al. |
| 2018/0301376 | A1 | 10/2018 | Shih et al. |
| 2018/0350629 | A1 | 12/2018 | Liu et al. |
| 2018/0350763 | A1 | 12/2018 | Yu et al. |
| 2018/0358312 | A1 | 12/2018 | Yu et al. |
| 2018/0374824 | A1 | 12/2018 | Yu et al. |
| 2019/0013276 | A1 | 1/2019 | Lee et al. |
| 2019/0019756 | A1 | 1/2019 | Yu et al. |
| 2019/0020343 | A1 | 1/2019 | Lin et al. |
| 2019/0051641 | A1 | 2/2019 | Lin et al. |
| 2019/0057931 | A1 | 2/2019 | Hsu et al. |
| 2019/0057932 | A1 | 2/2019 | Wu et al. |
| 2019/0067152 | A1 | 2/2019 | Wuu et al. |
| 2019/0097304 | A1 | 3/2019 | Hsiao et al. |
| 2019/0129817 | A1 | 5/2019 | Zhuo |
| 2019/0164834 | A1 | 5/2019 | Or-Bach et al. |
| 2019/0221547 | A1 | 7/2019 | Drab et al. |
| 2019/0238134 | A1 | 8/2019 | Lin et al. |
| 2019/0238135 | A1 | 8/2019 | Lin et al. |
| 2019/0245543 | A1 | 8/2019 | Lin et al. |
| 2019/0253056 | A1 | 8/2019 | Lin et al. |
| 2019/0304803 | A1 | 10/2019 | Hu et al. |
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0371763 | A1 | 12/2019 | Agarwal et al. |
| 2019/0372574 | A1 | 12/2019 | Lin et al. |
| 2020/0006274 | A1 | 1/2020 | Chiang et al. |
| 2020/0058617 | A1 | 2/2020 | Wu et al. |
| 2020/0058626 | A1 | 2/2020 | Tai et al. |
| 2020/0082885 | A1 | 3/2020 | Lin et al. |
| 2020/0111734 | A1 | 4/2020 | Lin et al. |
| 2020/0144224 | A1 | 5/2020 | Lin et al. |
| 2020/0161242 | A1 | 5/2020 | Lin et al. |
| 2020/0243422 | A1 | 7/2020 | Kim et al. |
| 2020/0373215 | A1 | 11/2020 | Wu et al. |
| 2020/0395350 | A1 | 12/2020 | Wu et al. |
| 2021/0005592 | A1 | 1/2021 | Lin et al. |
| 2021/0043557 | A1 | 2/2021 | Lin et al. |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |
| 2022/0020729 | A1 | 1/2022 | Gao et al. |
| 2023/0014913 | A1 | 1/2023 | Chen et al. |
| 2023/0352439 | A1 | 11/2023 | Chen et al. |
| 2023/0352471 | A1 | 11/2023 | Yu et al. |
| 2023/0387038 | A1 | 11/2023 | Hsieh et al. |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

| Input | | | | Output | | | | |
|---|---|---|---|---|---|---|---|---|
| A1 | A0 x A3 | | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

VERTICAL INTERCONNECT ELEVATOR BASED ON THROUGH SILICON VIAS

PRIORITY CLAIM

This application is a continuation of application Ser. No. 16/984,663, filed Aug. 4, 2020, now patent Ser. No. 11/887,930, which claims priority benefits from U.S. provisional application No. 62/882,941, filed on Aug. 5, 2019 and entitled "VERTICAL INTERCONNECT ELEVATOR BASED ON THROUGH SILICON VIAS", U.S. provisional application No. 62/891,386, filed on Aug. 25, 2019 and entitled "VERTICAL INTERCONNECT ELEVATOR BASED ON THROUGH SILICON VIAS", U.S. provisional application No. 62/903,655, filed on Sep. 20, 2019 and entitled "3D CHIP PACKAGE BASED ON THROUGH-SILICON-VIA INTERCONNECTION ELEVATOR", U.S. provisional application No. 62/964,627, filed on Jan. 22, 2020 and entitled "3D chiplet system-in-a-package using vertical-through-via connector", U.S. provisional application No. 62/983,634, filed on Feb. 29, 2020 and entitled "A Non-volatile Programmable Logic Device Based On Multichip Package", U.S. provisional application No. 63/012,072, filed on Apr. 17, 2020 and entitled "VERTICAL INTERCONNECT ELEVATOR BASED ON THROUGH SILICON VIAS" and U.S. provisional application No. 63/023,235, filed on May 11, 2020 and entitled "3D Chip Package based on Through-Silicon-Via Interconnection Elevator". The present application incorporates the foregoing disclosures herein by reference.

BACKGROUND OF THE DISCLOSURE

Field of the Disclosure

The present invention relates to 3D IC multi-chip packaging technology, more specifically relates to 3D multi-chip stacking chip-scale packages.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT IC chip increases greatly (more than US $5M or even exceeding US $10M, US $20M, US $50M or US $100M), FIG. 36. The cost of a photo mask set for an ASIC or COT IC chip at the 16 nm technology node or generation may be over US SIM, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

An aspect of the disclosure provides a FPGA/HBM stacked 3D Chip-Scale-Package (CSP), comprising: (1) a FPGA (Field Programmable Gate Array) IC chip comprising programmable interconnections using configurable cross-point switches, and configurable logic blocks or cells using Look-Up-Tables (LUTs), and (2) a HBM (High Bandwidth Memory) IC chip or a HBM Stacked 3D Chip-Scale-Package (HBM SCSP); the HBM IC chip and HBM SCSP will be described and specified below. The FPGA/HBM stacked 3D Chip-Scale-Package (CSP) may be formed by stacking assembly the HBM IC chip or the HBM SCSP to the FPGA IC chip using flip-chip bonding, thermal compression bump bonding or oxide-to-oxide/metal-to-metal direct bonding. In the FPGA/HBM stacked 3D CSP, the transistors of the FPGA IC chip are facing up and the transistors of the HBM IC chip or the HBM chips in the HBM SCSP is facing down. The HBM IC chip or the HBM IC chips in the HBM SCSP may comprise an HBM SRAM IC chip, HBM DRAM IC chip, or cache SRAM IC chip. Alternatively, other logic IC chips, for example, a CPU (Central Processing Unit) IC chip, GPU (Graphical Processing Unit) IC chip, TPU (Tensor-Flow Processing Unit) IC chip, DSP (Digital Signal Processor) IC chip, APU (Application Processing Unit) IC chip, or ASIC (Application Specific Integrated Circuit) chip may be used to replace FPGA IC chip in the FPGA/HBM stacked 3D Chip-Scale-Package (CSP). Alternatively, MRAM (Magnetoresistive Random Access Memory) IC chip or chips, RRAM (Resistive Random Access Memory) IC chip or chips, PCM (Phase Change Random Access Memory) IC chip or chips, or FRAM (Ferroelectric Random Access Memory) IC chip or chips may be used as the HBM memory IC chip or chips in the FPGA/HBM, CPU/HBM, GPU/HBM, TPU/HMB, DSP/HBM, APU/HBM or ASIC/HBM stacked 3D CSP.

Another aspect of the disclosure provides the HBM SCSP for use in a FPGA/HBM or logic/HBM stacked 3D Chip-Scale-Package (CSP) as described and specified in above, wherein the logic IC chip may be a CPU, GPU, TPU, DSP, APU IC or ASIC chip, as described above. The HBM IC chip in the HBM SCSP may be the HBM SRAM IC chip, HBM cache SRAM IC chip, HBM DRAM IC chip, HBM MRAM IC chip, HBM RRAM IC chip, HBM PCM IC chip or FRAM IC chip, with data bit-width of equal to or greater than 256, 512, 1024, 2048, 4096, 8K, or 16K. Each of the HBM IC chips in the HBM SCSP comprises Through-Silicon-Vias (TSVs) with two types of functions or interconnections: (1) the TSV therein is connected or coupled to the interconnection scheme, circuit or transistor of at least one HBM IC chip in the HBM SCSP; (2) the TSV therein is not connected or coupled to the interconnection scheme, circuit or transistor of any HBM IC chip in the HBM SCSP. The Type (2) TSV is used for passing signal of an I/O circuit of the FPGA or logic IC chip through it to the external circuit of the FPGA/HBM or logic/HBM stacked 3D Chip-Scale-Package (CSP), while not connected or coupled to circuit or transistor of any HBM chip in the HBM SCSP. The HBM SCSP may be formed by stacking assembly of a plurality of HBM IC chips using the flip-chip bonding, thermal compression bump bonding or oxide-to-oxide/metal-to-metal direct bonding.

Another aspect of the disclosure provides a Vertical Interconnect Elevator (VIE) chip based on Trough-Silicon-Vias (TSVs) in a silicon substrate or Trough-Glass-Vias (TGVs) in a glass substrate. The VIE chip is for use in the FPGA/HBM or logic/HBM stacked 3D CSP as disclosed and specified above. The FPGA/HBM or logic/HBM stacked 3D CSP comprises both (1) the HBM IC chip or the HBM SCSP, and (2) the VIE chip stacked assembled on the FPGA or logic IC chip, wherein the HBM IC chip or the HBM SCSP is over the FPGA or logic IC chip, and the front-side (having transistors) of the FPGA or logic IC chip is facing up, and the front-side (having transistors) of the HBM IC chip or the HBM IC chips in the HBM SCSP is facing the FPGA or logic IC chip. The HBM IC chip or the HBM SCSP, and the VIE chip are side-by-side disposed on a same horizontal plane. The TSVs or TGVs in the VIE chip are used for passing power, ground, clocks or signals of the FPGA or logic IC chip therethrough to the external circuit of the FPGA/HBM or logic/HBM stacked 3D CSP. Both parts of (1) the HBM IC chip or the HBM SCSP and (2) the VIE chip may be stacking assembled on the FPGA or logic IC chip to form the FPGA/HBM or logic/HBM 3D stacking CSP, as described and specified above, using the flip-chip bonding, thermal compression bump bonding or oxide-to-oxide/metal-to-metal direct bonding.

Another aspect of the disclosure provides a standard common wafer for the VIE chips, as described and specified above. The VIE chip is for use in the chip package as disclosed and specified above, wherein the VIE chip is a VIE component comprising only passive elements and no active devices (for example, transistors). The standard wafer for the VIE chips is diced or sawed to form the separated VIE chips. The VIE components may be manufactured by the packaging manufacturing companies or facilities without front-end of line (for fabrication of circuits including transistors) manufacturing capability. The VIE component is for use in the FPGA/HBM or logic/HBM stacked 3D CSP as disclosed and specified above, wherein the VIE component comprises only passive elements and no active devices (for example, transistors).

Another aspect of the disclosure provides a standard common wafer for the VIE chips or components, as described and specified above. The VIE chip or component is for use in the FPGA/HBM or logic/HBM stacked 3D CSP as disclosed and specified above. The standard common wafers for the VIE chips or components may have a fixed pattern of design and layout for locations of the TSVs, and may be diced or separated into VIE chips or components each with different dimensions or shapes and different numbers of TSVs. In some applications, the aspect ratio of length to width for a diced or separated VIE chip or component may be between 2 and 10, between 4 and 10 or between 2 and 40. Assume that the width of a scribe line is $W_{sb}$, the space or separation between the scribe line and the TSV at the edge or boundary of the VIE chip or component is $W_{sbt}$, and the space or separation between two neighboring TSVs is $W_{sptsv}$. $W_{sptsv}$ is smaller than 50, 40 or 30 micrometers. In a case, if $W_{sptsv}$ is greater than $W_{sb}$+2 $W_{sbt}$, the standard common wafer is designed and layout with TSVs populated regularly in the whole wafer with a fixed pitch and separation (space $W_{sptsv}$) between two neighboring TSVs in x-direction and y-direction, respectively. The standard common VIE wafer may be cut or diced, through the space between two neighboring TSVs, to form separated or diced VIE chips or components each in a square or rectangular shape and with any dimension, and the separated or diced VIE chip or component may comprise any number of TSVs. In this case, in each separated or diced VIE chip or component, $W_{sbt}$ is smaller than $W_{sptsv}$. For example, a standard common VIE wafer with a given TSV layout may be cut or diced into separated or diced VIE chips or components each with an array of M1 by N1 (M1×N1) TSVs, M1 and N1 are positive integers, and wherein N1<M1, 1<=N1<=15, and 50<=M1<=500; or N1<M1, 1<=N1<=10, and 30<=M1<=200. For example, a separated or diced VIE chip or component may comprise an array of 100 by 5,200 by 5, or 300 by 10 TSVs. In another case, if $W_{sptsv}$ is equal to or smaller than $W_{sb}$+2 $W_{sbt}$, the standard common wafer is designed and layout with two alternatives: (1) with islands or regions of TSV arrays populated regularly in the whole wafer with reserved scribe lines. Each of the reserved scribe line has a fixed space or separation $W_{spild}$, between two neighboring islands or regions of TSV arrays (that is between two neighboring TSVs across the reserved scribe line) in x-direction and y-direction, respectively, that is, there are two different separation spaces, $W_{spild}$ and $W_{sptsv}$, between two neighboring TSVs in a separated or diced VIE chip or component. $W_{spild}$ is greater than $W_{sptsv}$. As an example, $W_{spild}$ is greater than 50, 40 or 30 micrometers, and $W_{sptsv}$ is smaller than 50, 40 or 30 micrometers. The reserved scribe line between two neighboring islands or regions of TSV arrays may be used as a scribe line for dicing and cutting. The standard common VIE wafer may be cut or diced, through the reserved scribe lines, to form separated or diced VIE chips or components in square or rectangular shape and with various dimensions. In this case, the separated or diced chip or component comprises M×N islands or regions of TSV arrays (wherein M and N are positive integers, wherein N<=M, 1<=N<=10, and 1<=M<=20) with the fixed space or separation $W_{spild}$ between two neighboring islands or regions of TSV arrays, wherein, for example, $W_{spild}$ is greater than 50, 40 or 30 micrometers, and $W_{sptsv}$ is smaller than 50, 40 or 30 micrometers. As example, the standard common VIE wafer with a given design and layout of islands or regions of TSV arrays may be cut or diced into a plurality of VIE chips or components, wherein each separated or diced VIE chip or component comprises one or a plurality of islands or regions of TSV arrays, for example, 3 by 1, 6 by 1, 4 by 2, 8 by 2, or 10 by 3 islands or regions of TSV arrays. If the separated or diced VIE chip or component comprises a plurality of (more than one) islands or regions of TSV arrays, there is the reserved scribe line between two neighboring islands or regions of TSV arrays therein. The diced or separated VIE chip or component may comprise repetitive islands or regions of TSV arrays with each island or region of TSV arrays comprising M2 by N2 TSVs, M2 and N2 are positive integers, and wherein N2<M2, 1<=N2<=15, and 25<=M2<=250; or N2<M2, 1<=N2<=10, and 15<=M2<=100. For example, a separated or diced VIE chip or component comprises repetitive islands or regions of TSV arrays with each island or region of TSV arrays comprising an array of 50 by 5, 150 by 5, 150 by 10, or 250 by 10 TSVs; (2) with TSVs populated regularly in the whole wafer with a fixed pitch and separation (space $W_{sptsv}$) between two neighboring TSVs in x-direction and y-direction, respectively. The standard common VIE wafer may be cut or diced through the TSVs to form separated or diced VIE chips or components in a square or rectangular shape and with any dimension, and the separated or diced VIE chip or component may comprise any number of TSVs. In this case, for each separated or diced VIE chip or component, $W_{sbt}$ may be equal to or greater than zero and is smaller than $W_{sptsv}$, and $W_{sptsv}$ is smaller than 50, 40 or 30 micrometers.

The above specifications for TSVs in the silicon substrate of the VIE chip or component (TSVIE) are applied to the specifications for TGVs in the glass substrate of the VIE chip or component (TGVIE).

Another aspect of the disclosure provides a standard common wafer for the VIE chips or components. The VIE chip or component is for use in the FPGA/HBM or logic/HBM stacked 3D CSP as disclosed and specified above. The standard common wafers for the VIE chips or components may have a fixed pattern of design and layout for locations of the metal pads or bumps on the TSVs, and may be diced or separated into VIE chips or components each with different dimensions or shapes and different numbers of the metal pads or bumps on the TSVs. In some applications, the aspect ratio of length to width for a deiced or separated VIE chip or component may be between 2 and 10, between 4 and 10 or between 2 and 40. Assume that the width of ascribe line is $W_{sb}$, the space or separation between the scribe line and the metal pad or bump on the TSV at the edge or boundary of the VIE chip is $WB_{sbt}$, and the space or separation between two neighboring metal pads or bumps on the TSVs is $WB_{sptsv}$. $WB_{sptsv}$ is smaller than 50, 40 or 30 micrometers. In a case, if $WB_{sptsv}$ is greater than $W_{sb}$+$2WB_{sbt}$, the standard common wafer is designed and layout with metal pads or bumps on the TSVs populated regularly in the whole wafer with a fixed pitch and separation (space $WB_{sptsv}$) between two neighboring metal pads or bumps on the TSVs in x-direction and y-direction, respectively. The standard common VIE wafer may be cut or diced, through the space between two neighboring metal pads or bumps on the TSVs, to form a separated or diced VIE chip or component in a square or rectangular shape and with any dimension, and the separated or diced VIE chip may comprise any number of metal pads or bumps on the TSVs. In this case, in each separated or diced VIE chip or component, the distance between the edge of the diced VIE chip or component to the nearest metal pad or bump on the TSV ($WB_{sbt}$) is smaller than $WB_{sptsv}$. For example, a standard common VIE wafer with a layout of given metal pads or bumps on the TSVs may be cut or diced into separated or diced VIE chips or components each with an array of M2 by N2 (M2×N2) metal pads or bumps on the TSVs, M2 and N2 are positive integers, and wherein N2<M2, 1<=N2<=15, and 25<=M2<=250; or N2<M2, 1<=N2<=10, and 15<=M2<=100. For example, a separated or diced VIE chip or component may comprise an array of 50 by 5, 150 by 5, 150 by 10, or 250 by 10 metal pads or bumps on the TSVs. In another case, if $WB_{sptsv}$ is equal to or smaller than $W_{sb}$+$2WB_{sbt}$, the standard common wafer is designed and layout with two alternatives: (1) with islands or regions of arrays of metal pads or bumps on the TSVs populated regularly in the whole wafer with reserved scribe lines. Each of the reserved scribe line has a fixed space or separation $WB_{spild}$ (equal to $W_{sb}$+$2WB_{sbt}$) between two neighboring islands or regions of arrays of metal pads or bumps on the TSVs (that is between two neighboring metal pads or bumps on the TSVs across the reserved scribe line) in x-direction and y-direction, respectively, that is, there are two different separation spaces, $WB_{spild}$ and $WB_{sptsv}$, between two neighboring metal pads or bumps on the TSVs in a separated or diced VIE chip or component. $WB_{spild}$ is greater than $WB_{sptsv}$. As an example, $WB_{spild}$ is greater than 50, 40 or 30 micrometers, and $WB_{sptsv}$ is smaller than 50, 40 or 30 micrometers. The reserved scribe line between two neighboring islands or regions of arrays of metal pads or bumps on the TSVs may be used as a scribe line for dicing and cutting. The standard common VIE wafer may be cut or diced, through the reserved scribe lines, to form separated or diced VIE chips or components in square or rectangular shape and with various dimensions. In this case, the separated or diced chip or component comprises M×N islands or regions of arrays of metal pads or bumps on the TSVs (wherein M and N are positive integers, wherein N<M, 1<=N<=10, and 2<=M<=20) with the fixed space or separation $WB_{spild}$ between two neighboring islands or regions of arrays of metal pads or bumps on the TSVs, wherein, for example, $WB_{spild}$ is greater than 50, 40 or 30 micrometers, and $WB_{sptsv}$ is smaller than 50, 40 or 30 micrometer. As an example, the standard common VIE wafer with a given design and layout of islands or regions of arrays of metal pads or bumps on the TSVs may be cut or diced into a plurality of VIE chips or components, wherein each separated or diced VIE chip or component comprises one or a plurality of islands or regions of arrays of metal pads or bumps on the TSVs, for example, 3 by 1 islands or regions of arrays of metal pads or bumps on the TSVs, 6 by 1 islands or regions of arrays of metal pads or bumps on the TSVs, 4 by 2 islands or regions of arrays of metal pads or bumps on the TSVs, 8 by 2 islands or regions of arrays of metal pads or bumps on the TSVs, or 10 by 3 islands or regions of arrays of metal pads or bumps on the TSVs. If the separated or diced VIE chip or component comprises a plurality of (more than one) islands or regions of arrays of metal pads or bumps on the TSVs, there is the reserved scribe line between two neighboring islands or regions of arrays of metal pads or bumps on the TSVs therein. The diced or separated VIE chip or component may comprise repetitive islands or regions of arrays of metal pads or bumps on the TSVs with each island or region of arrays of metal pads or bumps on the TSVs comprising an array of 30 by 2 metal pads or bumps on the TSVs, an array of 60 by 2 metal pads or bumps on the TSVs, an array of 50 by 5 metal pads or bumps on the TSVs, or an array of 100 by 5 metal pads or bumps on the TSVs; (2) with metal pads or bumps on the TSVs populated regularly in the whole wafer with a fixed pitch and separation (space $WB_{sptsv}$) between two neighboring metal pads or bumps on the TSVs in x-direction and y-direction, respectively. The standard common VIE wafer may be cut or diced through the metal pads or bumps on the TSVs to form separated or diced VIE chips or components in a square or rectangular shape and with any dimension, and the separated or diced VIE chip or component may comprise any number of metal pads or bumps on the TSVs. In this case, for each separated or diced VIE chip or component, $WB_{sbt}$ may be equal to or greater than zero, and is smaller than $WB_{sptsv}$, and $WB_{sptsv}$ is smaller than 50, 40 or 30 micrometers.

The above specifications for metal pads or bumps on TSVs in the silicon substrate of the VIE chip or component (TSVIE) are applied to the specifications for that of TGVs in the glass substrate of the VIE chip or component (TGVIE).

Another aspect of the disclosure provides methods for forming a Through-Silicon-Via (TSV) connector for use as the VIE chip or component (TSVIE).

Another aspect of the disclosure provides methods for forming a Through-Glass-Via (TGV) connector for use as the VIE chip or component (TGVIE).

Another aspect of the disclosure provides a method of forming the HBM SCSP. The HBM SCSP comprises an ASIC or logic IC chip and a plurality of High Bandwidth high speed Memory IC chips (HBM IC chips, for example, HBM DRAM IC chips, HMB SRAM IC chips, cache SRAM IC chips or high speed non-volatile Memory IC chips, for example, Magnetic RAM (MRAM) IC chip, Resistive RAM (RRAM) IC chip, Phase shifted RAM (PRAM) IC chip, or ferroelectric RAM (FRAM) IC chip) stacked assembled on the ASIC or logic IC chip. The ASIC or logic IC chip and the plurality of HBM IC chips, each has Through Silicon Vias (TSVs) in its silicon substrate for use in electrical communication with or coupling to the other IC chip or chips stacked assembled in the HBM SCSP, and the FPGA IC chip in the FPGA/HBM CSP. As an example, an HBM SCSP may comprise 2, 4, 8, 16, 24, 32 HBM DRAM or SRAM IC chips, or equal to or greater than 2, 4, 8, 16, 32 HBM DRAM or SRAM IC chips. Each HBM DRAM or SRAM IC chip may have the memory density of 512 Mb, 1 Gb, 4 Gb, 8 Gb, 16 Gb, 32 Gb, 64 Gb, or equal to or greater than 256 Mb, 1 Gb, 8 Gb, 16 Gb, wherein b is bit. The HBM DRAM or SRAM IC chips may be with data bit-width of equal or greater than 64, 128, 256, 512, 1024, 2048, 4096, 8K, or 16K for communication with or coupling to the FPGA IC chip in the FPGA/HBM CSP, through the TSVs in the HBM DRAM or SRAM IC chips or the ASIC or logic IC chip in the HMB SCSP. The HBM DRAM or SRAM IC chips are designed with small I/O drivers or receivers, or I/O circuits with small driving capability, wherein the loading, output capacitance, or input capacitance may be between 0.05 pF and 2 pF, or 0.05 pF and 1 pF, or smaller than 2 pF or 1 pF, for communication with or coupling to the FPGA IC chip in the FPGA/HBM CSP. The ASIC or logic IC chip is used for buffers, DRAM or SRAM memory controls, or interface circuits, and may be located at the bottom of HBM SCSP package. The HBM SCSP package has solder bumps, copper pillars or pads at the bottom of the HBM SCSP package. The HBM SCSP and the HBM DRAM or SRAM IC chips are designed in standard common specifications and features physically and functionally.

Another aspect of the disclosure provides a method of forming the standard commodity FPGA/HBM CSP for use as or in a logic drive; wherein the standard commodity FPGA/HBM CSP comprises a standard commodity FPGA IC chip and (i) a HBM IC chip mounted on the standard commodity FPGA IC chip, wherein the HBM IC chip may have or may not have TSVs in its silicon substrate, or (ii) a stacked package with a plurality of HBM IC chips (the HBM SCSP), mounted on the standard commodity FPGA IC chip. Each of the HBM IC chips in the HBM SCSP have TSVs in its silicon substrate. The HBM chip or the HBM SCSP has copper pads, pillars or solder bumps at the bottom. The standard commodity FPGA IC chip comprises (i) a first interconnection scheme (FISC) formed by a damascene copper electroplating process, (ii) a second interconnection scheme (SISC) formed by an embossing copper electroplating process, and (iii) micro copper pads, pillars or bumps for use in the flip-chip bonding. The standard commodity FPGA IC chip and the HBM IC chip or the HBM SCSP are described and specified in above. The process steps for forming the FPGA/HBM CSP are described as below:

(1) Performing flip-chip assembling, bonding or packaging: (a) First providing (i) a wafer having standard commodity FPGA IC chips as described and specified above, wherein the standard commodity FPGA IC chips comprising transistors, FISCs, the SISCs, micro copper pads, pillars or bumps, (ii) the HBM IC chips or HBM SCSPs and (iii) the VIE chips. The HBM IC chips or HBM SCSPs and the VIE chips to be assembled, bonded or packaged to the FPGA wafer are described and specified above. Each of the HBM IC chips or HBM SCSPs and VIE chips has copper pads, pillars or solder bumps at its bottom. In the HBM SCSPs, the ASIC or logic IC chips are at the bottoms of the stacks of the HBM SCSPs; (b) flip-chip assembling, bonding or packaging the HBM IC chips or HBM SCSPs and the VIE chips to and on the micro copper pads, pillars or bumps on the FPGA IC chips of the FPGA wafer, wherein the front-side or surface of the FPGA wafer with transistors is facing up, and the front-side or surface of the of the HBM IC chip or the HBM IC chips in the HBM SCSP with transistors is facing down. As an example, the micro copper pads exposed at the top surface of the FPGA IC chips in the FPGA wafer are used for flip-chip bonding assembly using solder reflow process or thermal compression bonding. Alternatively, copper pillars or solder bumps on the top surface of the FPGA wafer may be used for flip-chip bonding assembly; (c) Filling the gaps or spaces between the FPGA wafer and the HBM IC chips or HBM SCSPs, and between the FPGA wafer and the VIE chips (and between micro solder bumps or copper pillars of (i) the HBM IC chips or HBM SCSPs and (ii) the VIE chips) with an underfill material by, for example, a dispensing method using a dispenser. Alternatively, the HBM IC chips or HBM SCSPs and the VIE chips are bonded to the FPGA IC chips by oxide-to-oxide metal-to-metal direct bonding, using copper pads (i) on the FPGA IC chips and on the HBM IC chips or HBM SCSPs, and (ii) on the FPGA IC chips and on the VIE chips.

(2) Applying a material, resin, or molding compound to fill the gaps or spaces (i) between HBM IC chips or HBM SCSPs, (ii) between VIE chips, and (iii) between (the HBM IC chips or HBM SCSPs) and the VIE chips; and cover the backside surfaces of HBM IC chips or HBM SCSPs and VIE chips by methods, for example, spin-on coating, screen-printing, dispensing or molding in the wafer format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the FPGA wafer and on or over the backside of the HBM IC chips or HBM SCSPs and VIE chips to a level to: (i) fill gaps or spaces between HBM IC chips or HBM SCSPs, (ii) fill gaps or spaces between VIEs, (iii) fill gaps or spaces between VIEs and (HBM IC chips or HBM SCSPs), (iv) cover the top surface of the TSVs or TGVs in the VIE chips, (v) cover the top-most backside surface of the HBM IC chips or HBM SCSPs and VIE chips. Applying a CMP, polishing or grinding process to planarize the surface of the applied material, resin or molding compound. The CMP, polishing or grinding process is performed until a level where the backside surfaces of the HBM IC chips or HBM SCSPs and VIE chips and the top surfaces of the TSVs or TGVs in the VIE chips are fully exposed. Alternatively, the top surfaces of TSVs in silicon substrates of the HBM IC chips or the top-most HBM IC chips of the HBM SCSPs, in addition to the top surfaces of the TSVs or TGVs in the VIE chips, are exposed for connecting or coupling to an interconnection scheme (BISD), to be formed latter, on or over the TSVs.

(3) forming copper pads, pillars or solder bumps on exposed top surfaces of the TSVs or TGVs in the VIE chips. Alternatively, depositing a layer of insulating dielectric layer on the planarized surface of the applied material, resin or compound, the backside surfaces of HBM IC chips or HBM SCSPs and VIE chips and the exposed top surfaces of the TSVs or TGVs in the VIE chips (and, in some cases, the exposed top surfaces of TSVs in silicon substrates of the HBM IC chips or the top-most HBM IC chips of the HBM SCSPs). Forming openings in the insulating dielectric layer to expose top surfaces of the TSVs or TGVs in the VIE chips and/or TSVs in the HBM IC chips or HBM SCSPs (and, in some cases, also expose top surfaces of TSVs in silicon substrates of the HBM IC chips or the top-most HBM IC chips of the HBM SCSPs). Then forming copper pads, pillars or solder bumps on and over the exposed top surfaces of the TSVs or TGVs in the VIE chips, and, in some cases, TSVs in the HBM IC chips or HBM SCSPs, exposed in openings in the insulating dielectric layer. The copper pads, pillars or solder bumps on the TSVs or TGVs of the VIE chip are used for connecting or coupling power, ground, clock and/or signal from circuits external to the FPGA/HBM CSP to the FPGA IC chip and the HBM IC chip or the HBM IC chips of the HBM SCSP, through the TSVs or TGVs in the VIE chip. The power supply to the HBM IC chip or the HBM IC chips of the HBM SCSP from circuits external to the FPGA/HBM CSP is through, in sequence, (i) the copper pads, pillars or solder bumps on the TSVs or TGVs in the VIE chip, (ii) the TSVs or TGVs in the VIE chip, (iii) Power/ground buses provided by metal lines or traces having the thickness thicker than 0.5 micrometers or 1 micrometer in the SISC or top layers of the FISC (for example, top 1, 2, 3, or 4 metal layers of the FISC) on the FPGA IC chip, (iv) bonding pads, pillars or bumps between the FPGA IC chip and the HBM IC chip or the HBM SCSP, (v) the power/ground buses on the HBM IC chip or the HBM IC chips of the HBM SCSP. The power supply to the FPGA IC chip from circuits external to the FPGA/HBM CSP is through, in sequence, (i) the copper pads, pillars or solder bumps on the TSVs or TGVs in the VIE chip, (ii) the TSVs or TGVs in the VIE chip, (iii) Power/ground buses provided by metal lines or traces having the thickness thicker than 0.5 micrometers or 1 micrometer in the SISC or top layers of the FISC (for example, top 1, 2, 3, or 4 layers of the FISC) on the FPGA IC chip.

Alternatively, a Backside metal Interconnection Scheme at the backside surface of the HBM IC chip or HBM SCSP of the FPGA/HBM CSP for use as the logic drive (abbreviated as BISD in below) may be further formed. The BISD may comprise metal lines, traces, or planes in multiple interconnection metal layers, and is formed on or over (i) the backside of HBM IC chips or HBM SCSPs and VIE chips (the front sides (having transistors) of HBM IC chips or the HBM IC chips of the HBM SCSPs are facing down), (ii) the material, resin or molding compound after the process step of planarization of the material, resin or molding compound, and (iii) the exposed top surfaces of the TSVs or TGVs in the VIE chips, (and, in some cases, the exposed top surfaces of TSVs in silicon substrates of the HBM IC chips or the top-most HBM IC chips of the HBM SCSPs). The BISD provides additional interconnection metal layer or layers at the backside of the FPGA/HBM CSP, and provides copper pads, copper pillars or solder bumps in an area array at the backside (top side) of the FPGA/HBM CSP, including at locations vertically over the HBM IC chip or HBM SCSP of the FPGA/HBM CSP (the front-side (having transistors) of the HBM chip or the HBM IC chips of the HBM SCSP is facing down). The TSVs or TGVs in the VIE chip are used for connecting or coupling circuits or components (for example, the transistors, the FISC and/or SISC) of the FPGA IC chip to that (for example, the BISD, or the copper pads, copper pillars or solder bumps on the BISD) at the backside (top) of the FPGA/HBM CSP. The process steps for forming the BISD are: (a) depositing a bottom-most insulting dielectric layer, whole wafer, on or over the exposed backside of the HBM IC chips or HBM SCSPs and VIE chips, molding compound and the exposed top surfaces of the TSVs or TGVs in the VIE chips (and, in some cases, the exposed top surfaces of TSVs in silicon substrates of the HBM IC chips or the top-most HBM IC chips of the HBM SCSPs). The bottom-most insulting dielectric layer may be a polymer material includes, for example, polyimide, BenzoCycloButene (BCB), parylene, epoxy-based material or compound, photo epoxy SU-8, elastomer, or silicone; (b) performing an emboss copper electroplating process to form metal vias in the openings of the cured bottom-most polymer insulating dielectric layer, and to form metal lines, traces or planes of an bottom-most interconnection metal layer of the BISD on or over the insulating dielectric layer. The processes of forming the bottom-most insulating dielectric layer and openings in it, and the emboss copper electroplating processes for forming the metal vias in the bottom-most insulting dielectric layer and the metal lines, traces, or planes of the bottom-most interconnection metal layer, may be repeated to form a metal layer of multiple interconnection metal layers in or of the BISD; wherein the repeated bottom-most insulating dielectric layer is used as the inter-metal dielectric layer between two interconnection metal layers of the BISD, and the metal vias in the bottom-most insulating dielectric layer (now the inter-metal dielectric layer) are used for connecting or coupling metal lines, traces, or planes of the two neighboring interconnection metal layers, above and below the metal vias, of the BISD. The top-most interconnection metal layer of the BISD is covered with a top-most insulating dielectric layer of the BISD. Forming copper pads, pillars or solder bumps on or over the top-most interconnection metal layer of BISD exposed in openings in a top-most insulating dielectric layer of BISD using emboss copper electroplating process as described and specifies in above. The locations of the copper pads, pillars or solder bumps are on or over a space outside and beyond the edges or sidewalls of the HBM IC chips or the HBM SCSPs, for example, on or over the peripheral area of each of the FPGA IC chips, where no HBM IC chip or HBM SCSP is flip-chip assembled on or over the FPGA IC chips. Alternatively, the locations of the copper pads, pillars or solder bumps are, in addition, vertically on or over the backside of the HBM IC chips or HBM SCSPs of the FPGA/HBM CSPs. The BISD may comprise 1 to 10 layers, or 2 to 6 layers of interconnection metal layers. The interconnection metal lines, traces or planes of the BISD have, same as in the SISC of the FPGA IC chip, an adhesion layer (Ti or TiN, for example) and a copper seed layer only at the bottom, but not at the sidewalls of the metal lines or traces. The interconnection metal lines or traces of FISC of the FPGA IC chip have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

The interconnection metal lines or traces of the FISC and/or SISC of the FPGA IC chip for the FPGA/HBM CSP may: (a) comprise a first interconnection net or scheme of metal lines or traces in or of the FISC and/or SISC of a FPGA IC chip for connecting or coupling to transistors, a second interconnection net or scheme of metal lines or traces and/or the micro copper pads, pillars or bumps of the FPGA IC chip. The first interconnection net or scheme of metal lines or traces in or of the FISC and/or SISC may be further connected or coupled to the circuits or components outside or external to the FPGA/HBM CSP through the TSVs or TGVs in the VIE chip in the FPGA/HBM CSP. The first interconnection net or scheme may be further connected or coupled to the HBM chip or HBM SCSP on or over the FPGA IC chip. The first interconnection net or scheme of metal lines or traces in or of the FISC and/or SISC may be a net or scheme for signals, clock or the power supply or ground. In this case, the TSVs or TGVs in the VIE chip are used as metal vias, pillars or posts for signals, clock or the power supply or ground; (b) comprise direct and vertical connection between the circuits of the FPGA IC chip and the HBM IC chip or HBM SCSP by using the stacked metal vias/metal layers in the FISC and SISC. The copper pads, pillars or solder bumps of the HBM IC chip or HBM SCSP are flip-chip bonded and coupled to the copper pads, pillars or bumps of the FPGA IC chip, wherein the copper pads, pillars or bumps of the HBM IC chip or HBM SCSP are vertically over the stacked vias/metal layers of FISC and/or SISC of the FPGA IC chip. The vertical connects provide high bandwidth, high speed and wide bit-width communication, connection or coupling between the FPGA IC chip and the HBM IC chip or HBM SCSP. The HBM IC chip or HBM SCSP may be with data bit-width of equal or greater than 64, 128, 256, 512, 1024, 2048, 4096, 8K, or 16K in communication with or coupling to the underlying the FPGA IC chip. The HBM IC chip or each of the HBM IC chips in the HBM SCSP is designed with small I/O drivers or receivers, or I/O circuits in communication with or coupling to the small I/O drivers or receivers, or I/O circuits of the underlying FPGA IC chip, wherein the loading, output capacitance, input capacitance or driving capability of the small I/O drivers or receivers, or I/O circuits may be between 0.05 pF and 2 pF, or 0.05 pF and 1 pF, or smaller than 2 pF or 1 pF. The HBM IC chip or each of the HBM IC chips in the HBM SCSP may be with data bit-width of equal or greater than 64, 128, 256, 512, 1024, 2048, 4096, 8K, or 16K.

(4) Separating, cutting or dicing the finished FPGA wafer, including separating, cutting or dicing through materials or structures between two neighboring FPGA IC chips, VIE chips, HBM IC chips or HBM SCSPs. The material, resin or molding compound filling gaps or spaces between two neighboring FPGA IC chips, VIE chips, HBM IC chips or HBM SCSPs is separated, cut or diced to from individual unit of FPGA/HBM CSP.

Another aspect of the disclosure provides the FPGA/HBM CSP with the TSVs or TGVs in the VIE chip for use in the logic drive in a standard format or having standard sizes. For example, the FPGA/HBM CSP may be in a shape of square or rectangle, with a certain widths, lengths and thicknesses; and/or with a standard layout of the locations of the copper pads or pillars or solder bumps on or over the BISD. An industry standard may be set for the shape and dimensions of the FPGA/HBM CSP. For example, the standard shape of the FPGA/HBM CSP may be a square, with a width greater than or equal to 3 mm, 6 mm, 8 mm, 10 mm, 12 mm, 15 mm, 20 mm, 25 mm or 30 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the FPGA/HBM CSP may be a rectangle, with a width greater than or equal to 3 mm, 6 mm, 8 mm, 10 mm, 12 mm, 15 mm, 20 mm, or 25 mm, or 30 mm and a length greater than or equal to 5 mm, 7 mm, 10 mm, 12 mm, 15 mm, 20 mm, 25 mm, 30 mm, 35 mm, or 40 mm; and having a thickness greater than or equal to 0.03 mm, 0.05 mm, 0.1 mm, 0.3 mm, 0.5 mm, 1 mm, 2 mm, 3 mm, 4 mm, or 5 mm.

Another aspect of the disclosure provides a 3D stacked chip package, for use as the logic drive, similar to the FPGA/HBM or logic/HBM CSP as described and specified above, except that, the FPGA wafer used in the process is replaced by a molded substrate or wafer with FPGA IC chips embedded or molded in the material, resin, or molding compound, wherein the material, resin, or molding compound is as described and specified above. The material, resin, or molding compound is in the gaps between FPGFA chips, and the micro copper pads, pillars or bumps of the FPGA IC chips are exposed on the top surface of the molded substrate or wafer. The VIE chips and HBM IC chips or HBM SCSPs are then flip-chip assembled to the exposed the micro copper pads, pillars or bumps of the FPGA IC chips using solder reflow process, thermal compression bonding or oxide-to-oxide metal-to-metal direct bonding. Each unit of the 3D stacked chip package formed using the molded substrate or wafer, after separating or dicing, may comprise one or a plurality of FPGA IC chips, one or a plurality of CPU IC chips, one or a plurality of GPU IC chips, one or a plurality of TPU IC chips, one or a plurality of DSP IC chips, one or a plurality of APU IC chips, and/or one or a plurality of ASIC chips.

Alternatively, silicon Fineline Interconnection Bridges (FIB) may be, in addition to the VIE chips and HBM IC chips or HBM SCSPs, are flip-chip assembled to the exposed the micro copper pads, pillars or bumps of the FPGA IC chips using solder reflow process, thermal compression bonding or oxide-to-oxide metal-to-metal direct bonding. The FIB is used for high speed, high density interconnection between the underlined neighboring FPGA IC chips, or the underlined neighboring IC chips, (CPU, GPU, TPU, DSP, APU and/or ASIC IC chips) in the 3D stacked chip package. The FIB comprises a silicon substrate, a First Interconnection Scheme on the silicon substrates of FIBs (FISIB) on or over the silicon substrate and/or a Second Interconnection Scheme of FIBs (SISIB) over the silicon substrate and on or over the FISIB. Copper pads, pillars or bumps are formed on or over the SISIB. The front side (having the FISIB and/or SISIB) of the FIB is facing down, that is facing the FPGA IC chips. The FISIB is formed by the damascene copper electroplating processes as described above in forming the FISC of the FPGA IC chips, and the SISIB is formed on or over the FISIB by the embossing copper electroplating processes as described above in forming the SISC of the FPGA IC chips.

Another aspect of the disclosure provides a 3D stacked chip package, for use as the logic drive, similar to the FPGA/HBM or logic/HBM CSP as described and specified above, except that, (i) the FPGA wafer used in the process is replaced by a molded substrate or wafer with the VIE chips and HBM IC chips or HBM SCSPs molded or embedded in the material, resin, or molding compound, wherein the material, resin, or molding compound is as described and specified above. The material, resin, or molding compound is in the gaps between the VIE chips and the HBM IC chips or HBM SCSPs, and the micro copper pads, pillars or bumps of the VIE chips and HBM IC chips or HBM SCSPs are exposed on the top surface of the molded substrate or wafer, wherein the front side (having transistors) of the HBM IC chips or HBM SCSPs are facing up; (ii) The FPGA IC chips are then flip-chip bonding assembled to the exposed the micro copper pads, pillars or bumps of the VIE chips and HBM IC chips or HBM SCSPs (embedded or molded in the molded substrate or wafer) using solder reflow process, thermal compression bonding or oxide-to-oxide metal-to-metal direct bonding, wherein the front side (having transistors) of the FPGA IC chips are facing down; (iii) turning the molded substrate or wafer upside down, with the FPGA IC chips at the bottom and the VIE chips and HBM IC chips or HBM SCSPs at the top, wherein the front side (having transistors) of the FPGA IC chips are facing up and the front side (having transistors) of the HBM IC chips or the HBM IC chips in the HBM SCSPs are facing down; (iv) following the same or similar process steps in forming the FPGA/HBM CSP as described and specified above. In step (ii) the CPU IC chips, GPU IC chips, TPU IC chips, DSP IC chips, APU IC chips and/or ASIC chips may be, in addition to the FPGA IC chips, flip-chip bonding assembled to the exposed the micro copper pads, pillars or bumps of the VIE chips and HBM IC chips or HBM SCSPs (embedded or molded in the molded substrate or wafer). The molded substrate or wafer is separated, sawed or diced apart to form separate unit of the 3D stacked chip package, each separate unit of the 3D stacked chip package may comprise one or a plurality of FPGA IC chips, one or a plurality of CPU IC chips, one or a plurality of GPU IC chips, one or a plurality of TPU IC chips, one or a plurality of DSP IC chips, one or a plurality of APU IC chips, and/or one or a plurality of ASIC chips.

Alternatively, the FIB may be, in addition, molded in the molded substrate or wafer with the VIE chips and HBM IC chips or HBM SCSPs in the material, resin, or molding compound. The FIB is as described and specified above. In the finished product of the separate unit of 3D stacked chip package, the front side (having the FISIB and/or SISIB) of the FIB is facing down, that is facing the FPGA IC chips.

Another aspect of the disclosure provides a logic drive in a multichip package comprising a standard commodity FPGA IC chip, an NVM (non-volatile memory) IC chip, and an auxiliary or supporting (AS) IC chip, wherein the auxiliary or supporting IC chip is a cryptography or security IC chip. The multichip package is a FPGA/AS CSP or a 3D stacked chip package similar to the FPGA/HBM CSP or the 3D stacked chip package as described and specified above, except that the HBM IC chip or HBM SCSP therein is replaced by the auxiliary or supporting (AS) IC chip. The NVM IC chip is packaged using the same method as that of the AS IC chip, and is on or over the FPGA IC chip and is disposed on the same horizontal level as the AS IC chip in the FPGA/AS CSP or the 3D stacked chip package. The FPGA IC chip may be configured to perform a logic function by configuring data or information in the memory cells thereof (for example, SRAM cells) of LUTs for logic operations, and/or of configurable cross-point switches for programmable interconnections in the FPGA IC chips, wherein the configuring data or information in the memory cells of the FPGA IC chip may be stored, saved and backup in the non-volatile memory cells of the NVM IC chip in the same multichip package. When the power supply of the logic drive is turned on, the configuring data or information in the non-volatile memory cells of the NVM IC chip is passing or transferring to the SRAM memory cells of the FPGA IC chip through the TSVs or TGVs of the VIE chip. The logic drive may comprise cryptography or security circuits (encryption/decryption circuits and cryptography key or password) for protection of the developed configuration data or information (related to the innovation, architecture, algorithm and/or applications) for the FPGA IC chip in the logic drive, wherein the encryption/decryption circuits is controlled and secured by the cryptography key or password. In some cases, the cryptography key or password is stored in non-volatile memory cells comprising the FGMOS NVM cells, MRAM cells, RRAM cells, FRAM cells, e-fuses or anti-fuses on the FPGA IC chip. While in this aspect of disclosure, the cryptography or security circuits are included in the auxiliary or supporting IC chip, that is the cryptography or security IC chip. The cryptography or security IC chip comprises non-volatile memory cells comprising the FGMOS NVM cells, MRAM cells, RRAM cells, FRAM cells, e-fuses or anti-fuses for saving or storing the cryptography key or password for security purpose. The auxiliary or supporting IC chip (the cryptography or security IC chip) may be designed and implemented using a technology node more mature or less advanced than the FPGA IC chip. For example, the FPGA IC chip may be designed and implemented using a technology node more advanced than 20 nm or 10 nm, while the cryptography or security IC chip may be designed and implemented using a technology node less advanced than 20 nm or 30 nm. The semiconductor technology node used to fabricate the FPGA IC chip is more advanced than that used to fabricate the cryptography or security IC chip. For example, the FPGA IC chip may be designed and implemented using FINFET or GAAFET (Gate-All-Around Field-Effect-Transistor) transistors, while the cryptography or security IC chip may be designed and implemented using conventional planar MOSFET transistors. The purposes, functions and specifications of the FPGA IC chip, NVM IC chip and the cryptography or security IC chip in the FPGA/AS CSP or the 3D stacked chip package are as described above. The logic drive in the FPGA/AS CSP or the 3D stacked chip package becomes a nonvolatile programmable device with security when comprising (i) the FPGA IC chip; (ii) the NVM IC chip to store, save and backup the configuration data for configuring the standard commodity FPGA IC chip in the same multichip package; and (iii) the cryptography or security IC chip comprising the cryptography or security circuits (including the encryption/decryption circuit and the cryptography key or password).

Another aspect of the disclosure provides a logic drive in a multichip package comprising a standard commodity FPGA IC chip, an NVM IC chip, and an auxiliary or supporting IC chip, wherein the auxiliary or supporting IC chip is an I/O or control IC chip. The I/O or control circuits on the FPGA IC chip (as described and specified above) may be separated from the FPGA IC chip to form the auxiliary or supporting IC chip, that is the I/O or control IC chip. The FPGA IC chip, NVM IC chip, and auxiliary or supporting IC chip (the I/O or control IC chip) may be packaged in a FPGA/AS CSP or the 3D stacked chip package, as described and specified above. The purposes, functions and specifications of the FPGA IC chip, NVM IC chip and the I/O or control IC chip in the multichip package are as described above.

When the I/O or control circuits on the FPGA IC chip (as described and specified above) are separated from the FPGA IC chip to form the auxiliary or supporting IC chip (the I/O or control IC chip), the FPGA IC chip may become a standard commodity product. None or minimal area of the standard commodity FPGA IC chip is used for the control or I/O circuits, for example, less than 15%, 10%, 5%, 2% or 1% area (not counting the seal ring and the dicing area of the chip; that means, only including area up to the inner boundary of the seal ring) is used for the control or IO circuits; or, none or minimal transistors of the standard commodity FPGA IC chip are used for the control or I/O circuits, for example, less than 15%, 10%, 5%, 2% or 1% of the total number of transistors are used for the control or I/O circuits. All or most area of the standard commodity FPGA IC chip is used for (i) logic blocks comprising logic gate arrays, computing units or operators, and/or Look-Up-Tables (LUTs) and multiplexers, and/or (ii) programmable interconnection. For example, greater than 85%, 90%, 95% or 99% area of the standard commodity FPGA IC chip (not counting the seal ring and the dicing area of the chip; that means, only including area up to the inner boundary of the seal ring) is used for logic blocks, and/or programmable interconnection; or, all or most transistors of the standard commodity FPGA IC chip are used for logic blocks or repetitive arrays, and/or programmable interconnection, for example, greater than 85%, 90%, 95% or 99% of the total number of transistors are used for logic blocks, and/or programmable interconnection.

The auxiliary or supporting chip (the I/O or control IC chip) is designed, implemented and fabricated using varieties of semiconductor technology nodes or generations, including old or matured technology nodes or generations, for example, a semiconductor note or generation less advanced than or equal to, or above or equal to 20 nm, 30 nm, 40 nm, 50 nm, 90 nm, 130 nm, 250 nm, 350 nm, or 500 nm. The semiconductor technology node or generation used in the I/O or control chip is 1, 2, 3, 4, 5 or greater than 5 nodes or generations older, more matured or less advanced than that used in the standard commodity FPGA IC chip packaged in the same logic drive. Transistors used in the I/O or control IC chip may be a Fully Depleted Silicon-on-insulator (FDSOI) MOSFET, a Partially Depleted Silicon-on-insulator (PDSOI) MOSFET or a conventional planar MOSFET. Transistors used in the I/O or control IC chip may be different from that used in the standard commodity FPGA IC chip packaged in the same logic drive; for example; the I/O or control IC chip may use the conventional planar MOSFET, while the standard commodity FPGA IC chip packaged in the same logic drive may use the FINFET or GAAFET. The power supply voltage (Vcc) used in the I/O or control IC chip may be greater than or equal to 1.5V, 2.0 V, 2.5V, 3 V, 3.3V, 4V, or 5V, while the power supply voltage (Vcc) used in the standard commodity FPGA IC chip packaged in the same logic drive may be smaller than or equal to 1.8V, 1.5V, or 1 V. The power supply voltage used in the I/O or control IC chip may be higher than that that used in the standard commodity FPGA IC chip packaged in the same logic drive; for example, the I/O or control IC chip may use a power supply of 3.3V, while the standard commodity FPGA IC chip packaged in the same logic drive may use a power supply voltage of 1V; or the I/O or control IC chip may use a power supply of 2.5V, while the standard commodity FPGA IC chip packaged in the same logic drive may use a power supply of 0.75V. The gate oxide (physical) thickness of the Field-Effect-Transistors (FETs) used in the I/O or control IC chip may be thicker than or equal to 5 nm, 6 nm, 7.5 nm, 10 nm, 12.5 nm, or 15 nm, while the gate oxide (physical) thickness of FETs used in the standard commodity FPGA IC chip packaged in the same logic drive may be thinner than 4.5 nm, 4 nm, 3 nm or 2 nm. The gate oxide (physical) thickness of FETs used in the I/O or control IC chip may be thicker than that used in the standard commodity FPGA IC chip packaged in the same logic drive; for example, the I/O or control IC chip may use a FET having a gate oxide with a (physical) thickness of 10 nm, while the standard commodity FPGA IC chip packaged in the same logic drive may use a FET having a gate oxide with a (physical) thickness of 3 nm; or the I/O or control IC chip may use a FET having a gate oxide with a (physical) thickness of 7.5 nm, while the standard commodity FPGA IC chip packaged in the same logic drive may use a FET having a gate oxide with a (physical) thickness of 2 nm. The I/O or control IC chip provides input and output circuits, and ESD protection circuits for the logic drive. The I/O or control IC chip provides (i) large drivers or receivers, or I/O circuits for connecting or coupling to external or outside (of the logic drive) circuits, and (ii) small drivers or receivers, or I/O circuits for connecting or coupling to IC chips in or of the logic drive. The large drivers or receivers, or I/O circuits for connecting or coupling to external or outside (of the logic drive) circuits have driving capability, loading, output capacitance or input capacitance lager or bigger than that of the small drivers or receivers, or I/O circuits for connecting or coupling to IC chips in or of the logic drive. The FPGA IC chip provides only the small drivers or receivers, or I/O circuits for connecting or coupling to the small drivers or receivers, or I/O circuits on the I/O or control IC chip and other IC chips in or of the logic drive. The driving capability, loading, output capacitance, or input capacitance of the large I/O drivers or receivers, or I/O circuits for connecting or coupling to external or outside (of the logic drive) circuits may be between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. The driving capability, loading, output capacitance, or input capacitance of the small I/O drivers or receivers, or I/O circuits for connecting or coupling to IC chips in or of the logic drive may be between 0.1 pF and 5 pF, 0.1 pF and 2 pF or 0.1 pF and 1 pF; or smaller than 10 pF, 5 pF, 3 pF, 2 pF or 1 pF. The size of ESD protection device on the I/O or control IC chip is larger than that on the standard commodity FPGA IC chip in the same logic drive. The size of the ESD device in the large I/O circuits on the I/O or control IC chip may be between 0.5 pF and 20 pF, 0.5 pF and 15 pF, 0.5 pF and 10 pF, 0.5 pF and 5 pF or 0.5 pF and 2 pF; or larger than 0.5 pF, 1 pF, 2 pF, 3 pF, 5 pF or 10 pF. The size of the ESD device in the small I/O circuits on the I/O or control IC chip and the standard commodity FPGA IC chip may be between 0.1 pF and 2 pF, or 0.1 pF and 1 pF; or smaller than 0.5 pF, 1 pF, or 2 pF. For example, a bi-directional (or tri-state) I/O pad or circuit on the I/O or control IC chip may be used for the large I/O drivers or receivers, or I/O circuits for connecting or coupling to external or outside (of the logic drive) circuits, and may comprise an ESD circuit, a receiver, and a driver, and may have an input capacitance, output capacitance or driving capability between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. For example, a bi-directional (or tri-state) I/O pad or circuit on the I/O or control IC chip and the standard commodity FPGA IC chip may be used for the small I/O drivers or receivers, or I/O circuits for connecting or coupling to IC chips in or of the logic drive, and may comprise an ESD circuit, a receiver, and a driver, and may have an input capacitance, output capacitance or driving capability between 0.1 pF and 2 pF or 0.1 pF and 2 pF; or smaller than 2 pF or 1 pF.

The I/O or control IC chip in the multichip package of the standard commodity logic drive may comprise a buffer and/or driver circuits for (i) downloading the programing codes from the non-volatile memory cells on the non-volatile IC chip in the logic drive to the 5T or 6T SRAM cells of the programmable interconnection on the standard commodity FPGA IC chip through the TSVs or TGVs of the VIE chip. The programming codes from the non-volatile IC chip in the logic drive may go through the buffer or driver in or of the I/O or control IC chip before getting into the 5T or 6T SRAM cells of the programmable interconnection on the standard commodity FPGA IC chips. The buffer in or of the I/O or control IC chip may latch the data from the non-volatile IC chip and increase the bit-width of the data. For example, the data bit-width (in a SATA standard) from the non-volatile IC chip is 1 bit, and the buffer may latch the 1 bit data in each of the multiple SRAM cells in the buffer on the non-volatile IC chip, and output the data stored or latched in the multiple SRAM cells (on the I/O or control IC chip) in parallel and simultaneously to increase the data bit-width; for example, equal to or greater than 4, 8, 16, 32, or 64 data bit-width. For another example, the data bit-width (in a PCIe standard) from the non-volatile IC chip is 32 bits, the buffer on the non-volatile IC chip may increase the data bit-width to equal to or greater than 64, 128, or 256 data bit-width. The driver in or of the I/O or control IC chip may further amplify the data signals from the non-volatile IC chip; (ii) downloading data from the non-volatile memory cells on the non-volatile IC chip in the logic drive to the 5T or 6T SRAM cells of the LUTs on the standard commodity FPGA IC chip through the TSVs or TGVs of the VIE chip. The data from the non-volatile IC chip in the logic drive may go through the buffer or driver in or of the I/O or control IC chip before getting into the 5T or 6T SRAM cells of LUTs on the standard commodity FPGA IC chip. The buffer in or of the I/O or control IC chip may latch the data from the non-volatile IC chip and increase the bit-width of the data. For example, the data bit-width (in a SATA standard) from the non-volatile IC chip is 1 bit, the buffer on the non-volatile IC chip may latch the 1 bit data in each of the multiple SRAM cells in the buffer, and output the data stored or latched in the multiple SRAM cells (on the I/O or control IC chip) in parallel and simultaneously to increase the data bit-width; for example, equal to or greater than 4, 8, 16, 32, or 64 data bit-width. For another example, the data bit-width (in a PCIe standard) from the non-volatile IC chip is 32 bits, the buffer may increase the data bit-width to equal to or greater than 64, 128, or 256 data bit-width. The driver in or of the I/O or control IC chip may further amplify the data signals from the non-volatile IC chip.

The I/O or control IC chip in the multichip package of the standard commodity logic drive may comprise I/O circuits or pads (or micro copper pillars or solder bumps) for I/O ports comprising one or more than one (2, 3, 4, or more than 4) Universal Serial Bus (USB) ports, one or more than one wide-bit I/O ports, one or more than one SerDes ports, one or more than one thunderbolt ports, one or more than one Serial Advanced Technology Attachment (SATA) ports, one or more than one Peripheral Components Interconnect express (PCIe) ports, one or more IEEE 1394 ports, one or more Ethernet ports, one or more than one audio ports or serial ports, RS-232 or COM (communication) ports, wireless transceiver I/O ports, and/or Bluetooth transceiver I/O ports. The I/O or control IC chip may comprise I/O circuits or pads (or micro copper pillars or bumps) for connecting or coupling to Serial Advanced Technology Attachment (SATA) ports, Peripheral Components Interconnect express (PCIe) ports, wide-bit I/O ports for communicating, connecting or coupling with the memory storage drive.

Another aspect of the disclosure provides a logic drive in a multichip package comprising a standard commodity FPGA IC chip, an NVM IC chip, and an auxiliary or supporting IC chip, wherein the auxiliary or supporting IC chip is a power management IC chip. The power management IC chip, comprising a voltage regulator, provides power supply voltages for the FPGA IC chip through the TSVs or TGVs of the VIE chip. The FPGA IC chip, NVM IC chip, and auxiliary or supporting IC chip may be packaged in a FPGA/AS CSP or the 3D stacked chip package as described and specified above. The auxiliary or supporting IC chip (the power management IC chip) may be designed and implemented using a technology node more mature or less advanced than the FPGA IC chip. For example, the FPGA IC chip may be designed and implemented using a technology node more advanced than 20 nm or 10 nm, while the power management IC chip may be designed and implemented using a technology node less advanced than 20 nm or 30 nm. The semiconductor technology node used to fabricate the FPGA IC chip is more advanced than that used to fabricate the power management IC chip. For example, the FPGA IC chip may be designed and implemented using FINFET or GAAFET transistors, while the power management IC chip may be designed and implemented using conventional planar MOSFET transistors. The purposes, functions and specifications of the FPGA IC chip, NVM IC chip and the power management IC chip in the multichip package are as described above.

Another aspect of the disclosure provides a logic drive in a multichip package comprising a standard commodity FPGA IC chip, an NVM IC chip, and an auxiliary or supporting IC chip, wherein the auxiliary or supporting IC chip is an Innovated ASIC or COT (abbreviated as IAC below) IC chip. The FPGA IC chip, NVM IC chip and IAC IC chip, may be packaged in a FPGA/AS CSP or the 3D stacked chip package as described and specified above, wherein the IAC IC chip couples to the standard commodity FPGA IC chip through the TSVs or TGVs in the VIE chip. As described above, the innovators may implement their innovation using the standard commodity FPGA IC chip (fabricated in the advanced technology nodes more advanced than 20 nm or 10 nm). The IAC IC chip, in addition to the standard commodity FPGA IC chip, provides innovators further freedom to implement their innovation with further customized or personalized capability using less expensive technology nodes less advanced than 20 nm or 30 nm. The semiconductor technology node used to fabricate the FPGA IC chip is more advanced than that used to fabricate the IAC IC chip. For example, the IAC IC chip provides innovators an affordable expense for realizing or implementing their innovated Intellectual Property (IP) circuits, Application Specific (AS) circuits, analog circuits, mixed-mode signal circuits, Radio-Frequency (RF) circuits, and/or transmitter, receiver, transceiver circuits, etc. The purposes, functions and specifications of the FPGA IC chip, NVM IC chip and the IAC IC chip in the multichip package are as described above.

The IAC IC chip is designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The semiconductor technology node or generation used in the IAC IC chip is 1, 2, 3, 4, 5 or greater than 5 nodes or generations older, more matured or less advanced than that used in the standard commodity FPGA IC chip packaged in the same logic drive. Transistors used in the IAC IC chip may be a FINFET, a Fully Depleted Silicon-on-insulator (FDSOI) MOSFET, a Partially Depleted Silicon-On-Insulator (PDSOI) MOSFET or a conventional planar MOSFET. Transistors used in the IAC IC chip may be different from that used in the standard commodity FPGA IC chip packaged in the same logic drive; for example, the IAC IC chip may use the conventional planar MOSFET, while the standard commodity FPGA IC chip packaged in the same logic drive may use the FINFET or GAAFET; or the IAC IC chip may use the Fully Depleted Silicon-on-insulator (FDSOI) MOSFET, while the standard commodity FPGA IC chips packaged in the same logic drive may use the FINFET. Since the IAC IC chip in this aspect of disclosure may be designed and fabricated using older or less advanced technology nodes or generations, its NRE cost is cheaper than or less than that of the current ASIC or COT IC chip designed and fabricated using an advanced IC technology node or generation. The NRE cost for designing a current ASIC or COT IC chip using an advanced IC technology node or generation, for example, more advanced than or below 20 nm or 10 nm, may be more than US $5M, US $10M, US $20M or even exceeding US $50M, or US $100M. The cost of a photo mask set for an ASIC or COT IC chip at the 16 nm technology node or generation is over US $2M, US $5M, or US $10M. Implementing the same or similar innovation and/or application using the logic drive including the IAC IC chip designed and fabricated using more matured or less advanced technology nodes or generations may reduce NRE cost down to less than US $10M, US $7M, US $5M, US $3M or US $1M. Compared to the implementation by developing the current logic ASIC or COT IC chip, the NRE cost of developing the IAC IC chip for use in the standard commodity logic drive to achieve the same or similar innovation and/or application may be reduced by a factor of 2, 5, 10, 20, or 30.

Another aspect of the disclosure provides a logic drive in a multichip package comprising a standard commodity FPGA IC chip, a NVM IC chip, and one or a plurality of auxiliary or supporting IC chips, wherein the one or a plurality of auxiliary or supporting IC chips provide one or more than one of any combined functions provided by the cryptography or security IC chip, the I/O or control IC chip, the power management IC chip, and/or the IAC IC chip, as described and specified above. The functions of cryptography or security, I/O or control, the power management and the IAC may be combined in one auxiliary or supporting IC chip, or partitioned into two or three auxiliary or supporting IC chips, or separated in four auxiliary or supporting IC chips. Any of the functions of cryptography or security, I/O or control, the power management and the IAC not included in the one or the plurality of auxiliary or supporting IC chips may be included and kept in the standard commodity FPGA IC chip in the logic drive. The FPGA IC chip, NVM IC chip, and one or the plurality of auxiliary or supporting IC chips may be packaged in a FPGA/AS CSP or the 3D stacked chip package as described and specified above, wherein the one or the plurality of auxiliary or supporting IC chips couple to the FPGA IC chip through the TSVs or TGVs in the VIE chip in the multichip package. The purposes, functions and specifications of the FPGA IC chip, NVM IC chip and the one or a plurality auxiliary or supporting IC chips in the multichip package are as described above.

Another aspect of the disclosure provides the FPGA/AS CSP or the 3D stacked chip package, as described and specified above, as a multichip package for use as the logic drive. The logic drive may be in 3 types of the multichip packages: (i) the first type of the multichip package comprises a standard commodity FPGA IC chip and a NVM IC chip, wherein the standard commodity FPGA IC chip may comprise circuits providing functions of cryptography or security, I/O or control, power management and/or the IAC; (ii) the second type of the multichip package comprises the standard commodity FPGA IC chip, the NVM IC chip and an auxiliary or supporting IC chip, wherein the auxiliary or supporting IC chip is one of the cryptography or security IC chip, the I/O or control IC chip, the power management IC chip, or the IAC IC chip, as described and specified above. For the second type, functions of cryptography or security, I/O or control, the power management and the IAC not included in the auxiliary or supporting IC chip may be included and kept in the standard commodity FPGA IC chip in the logic drive; or (iii) the third type of the multichip package comprises the standard commodity FPGA IC chip, the NVM IC chip and a plurality of auxiliary or supporting IC chips, wherein the plurality of auxiliary or supporting IC chips provide one or more than one of any combined functions provided by the cryptography or security IC chip, the I/O or control IC chip, the power management IC chip, and/or the IAC IC chip, as described and specified above. For the third type, functions of cryptography or security, I/O or control, the power management and the IAC not included in the plurality of auxiliary or supporting IC chips may be included and kept in the standard commodity FPGA IC chip in the logic drive. The functions of cryptography or security, I/O or control, the power management and the IAC may be combined in one auxiliary or supporting IC chip, or partitioned into two or three auxiliary or supporting IC chips, or separated in four auxiliary or supporting IC chips.

Another aspect of the disclosure provides a logic drive in multi-chip package format, comprising a plurality of FPGA/HBM or logic/HBM 3D stacked CSPs as described and specified above. Each of the plurality of FPGA/HBM or logic/HBM 3D stacked CSPs comprises the HBM IC chip, HBM CSP or VIE chip on the FPGA or logic IC chip, wherein the VIE chip has a plurality of copper pads, copper pillars or solder bumps on the top surfaces of the TSVs or TGVs. The FPGA/HBM or logic/HBM 3D stacked CSPs are flipped bonded to an interposer, wherein the interposer comprises a substrate (for example, silicon, glass, ceramics, polymer) with fan-out interconnection, redistribution layer (RDL) or interconnection schemes on or over the substrate. As an example, the interposer comprises a silicon substrate with Trough-Silicon-vias in it, a First Interconnection Scheme of the interposer (FISIP) on or over the silicon substrate, and/or a Second Interconnection Scheme of the interposer (SISIP) over the silicon substrate and on or over the FISIP. Copper pads, pillars or solder bumps are formed on or over the SISIP. The FISIP is formed by the damascene copper electroplating processes as described above in forming the FISC of the FPGA IC chips, and the SISIP is formed by the embossing copper electroplating processes as described above in forming the SISC of the FPGA IC chips. In this aspect, the surface with transistors of the FPGA or logic IC chip is facing down, and the front side (having the FISIB and/or SISIB) of the interposer is facing up.

Another aspect of the disclosure provides a logic drive in multi-chip package format, comprising a plurality of FPGA/HBM or logic/HBM 3D stacked CSPs as described and specified above. Each of the plurality of FPGA/HBM or logic/HBM 3D stacked CSPs comprises the HBM IC chip, HBM CSP or VIE chip on the FPGA or logic IC chip, wherein the VIE chip has a plurality of copper pads, copper pillars or solder bumps on the top surfaces of the TSVs or TGVs. The plurality of FPGA/HBM or logic/HBM 3D stacked CSPs are packaged in a multi-chip package, wherein the plurality of FPGA/HBM or logic/HBM 3D stacked CSPs are disposed on a same horizontal plane and molded using the material, resin, or molding compound, wherein the material, resin, or molding compound is as described and specified above. The material, resin, or molding compound fills the gap between two neighboring FPGA/HBM or logic/HBM 3D stacked CSPs. A fan-out interconnection, redistribution layer (RDL) or interconnection scheme is then formed on or over the FPGA/HBM or logic/HBM 3D stacked CSPs and the material, resin, or molding compound in the gaps. The fan-out interconnection, redistribution layer (RDL) or interconnection scheme is formed by the embossing copper electroplating processes as described above in forming the SISC of the FPGA IC chips. In this aspect, the surface with transistors of the FPGA or logic IC chip is facing the fan-out interconnection, redistribution layer (RDL) or interconnection scheme.

Another aspect of the disclosure provides a standardized commodity logic drive in a multichip package comprising one or a plurality of FPGA IC chips, one or a plurality of HBM IC chips or one or a plurality of HBM SCSPs, one or a plurality of non-volatile memory IC chips, and/or one or a plurality of auxiliary or supporting IC chips for use in different algorithms, architectures and/or applications requiring logic, computing and/or processing functions by field programming, wherein data stored in the one or a plurality of non-volatile memory IC chips are used for configuring the one or a plurality of FPGA IC chips in the same multichip package. The multichip package may be a FPGA/HBM CSP, FPGA/AS CSP or the 3D stacked chip package, as described and specified above. Uses of the standardized commodity logic drive is analogues to uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 36. The standardized commodity logic drive may comprise one or a plurality of FPGA IC chips, one or a plurality of HBM IC chips or one or a plurality of HBM SCSPs, one or a plurality of non-volatile memory IC chips, and/or one or a plurality of auxiliary or supporting IC chips. The standardized commodity logic drive may be packaged in a multichip package, such as the FPGA/HBM CSP, the FPGA/AS CSP or the 3D stacked chip package, as described and specified above. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The developed software codes or programs related to the innovation are used for configuring the one or a plurality of FPGA IC chips in the multichip package, and may be stored in the one or a plurality of non-volatile memory IC chips in the same multichip package. With non-volatile memory cells in the one or a plurality of non-volatile memory IC chips in the multichip package, the logic drive may be used as an alternative of the ASIC chip fabricated using advanced technology nodes. The standard commodity logic drive comprises one or a plurality of FPGA IC chips fabricated by using advanced technology nodes or generations more advanced than 20 nm or 10 nm. The innovation is implemented in the logic drive by configuring the hardware of FPGA IC chips by altering the data in the 5T or 6T SRAM cells of the programmable interconnection (configurable switches including pass/no-pass switching gates and multiplexers) and/or programmable logic circuits, cells or blocks (including LUTs and multiplexers) therein using the data stored in the non-volatile memory cells in the one or a plurality of non-volatile memory IC chips or the one or a plurality of FPGA IC chips in the multichip package. Compared to the implementation by developing a logic ASIC or COT IC chip, implementing the same or similar innovation and/or application using the logic drive may reduce the NRE cost down to smaller than US SIM by developing a software and installing it in the purchased or rented standard commodity logic drive. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 36. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, it is "club innovation platform" for club innovators only. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm or 10 nm technology nodes) and writing software programs in common programing languages, for example, C, Java, C++, C#, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better than that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or NAND flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 3F is a schematically top view showing a decoupling capacitor between four vertical through vias (VTVs) in accordance with an embodiment of the present application, wherein FIG. 3E is a schematically cross-sectional view along a cross-sectional line A-A on FIG. 3F.

FIG. 3M is a schematically top view showing a decoupling capacitor among four through silicon vias (TSVs) in accordance with another embodiment of the present application, wherein FIG. 3L is a schematically cross-sectional view along a cross-sectional line B-B on FIG. 3M.

FIGS. 41 and 4J are schematically top views showing various arrangements of reserved scribe lines and micro-bumps or micro-pillars for each of first and second types of vertical-through-via (VTV) connectors for the second case in accordance with an embodiment of the present application.

Figures 1A, 1B, 1C:
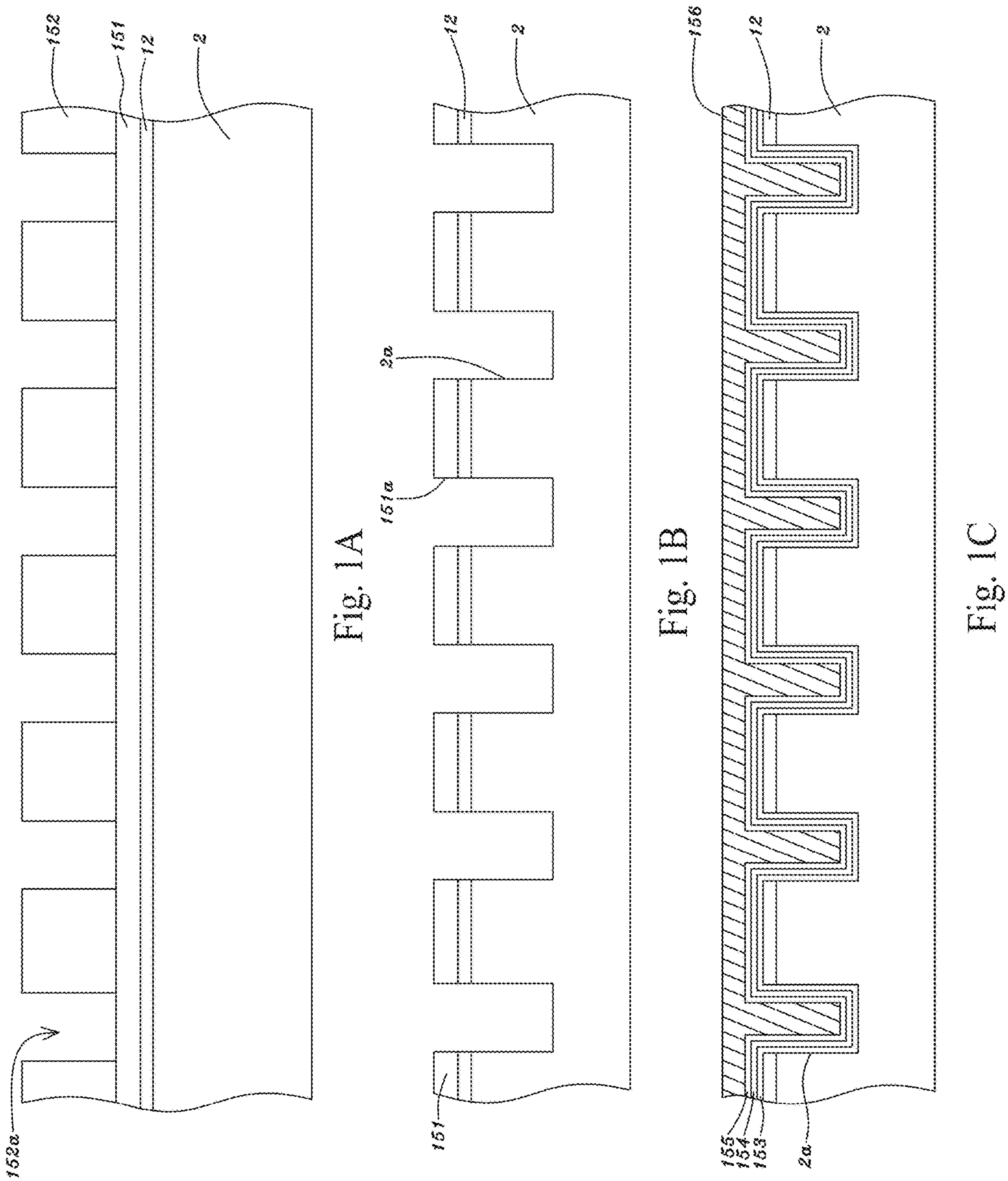
FIGS. 1A-1G are schematically cross-sectional views showing a process for forming first and second types of vertical-through-via (VTV) connectors processed from single-layered through-silicon-via (TSV) wafers for a first case in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification and Process for First and Second Types of Vertical-Through-Via (VTV) Connectors (Vertical-Interconnect-Elevator (VIE) Chips or Components) Processed from Through-Silicon-Via (TSV) Wafer(s)

A vertical-through-via (VTV) connector is provided with multiple vertical through vias (VTVs) for vertical connection to transmit signals or clocks or deliver power or ground in a vertical direction. The vertical-through-via (VTV) connector may be processed from one or more through-silicon-via (TSV) wafer(s), mentioned as below:

1. First and Second Types of Vertical-Through-Via (VTV) Connectors for Through-Silicon-Via Interconnect Elevators (TSVIEs) Processed from Single-Layered Through-Silicon-Via (TSV) Wafers FIGS. 1A-1G are schematically cross-sectional views showing a process for forming first and second types of vertical-through-via (VTV) connectors processed from single-layered through-silicon-via (TSV) wafers for a first case in accordance with an embodiment of the present application. FIGS. 1H-1J are schematically cross-sectional views showing a process for forming first and second types of vertical-through-via (VTV) connectors processed from single-layered through-silicon-via (TSV) wafers for a second case in accordance with an embodiment of the present application. FIGS. 1K-1M are schematically cross-sectional views showing a process for forming first and second types of vertical-through-via (VTV) connectors processed from single-layered through-silicon-via (TSV) wafers for a third case in accordance with an embodiment of the present application. Referring to FIG. 1A, a semiconductor substrate, standard common wafer or semiconductor blank wafer 2 may be a silicon substrate or silicon wafer. After the semiconductor substrate 2 is provided, an insulating dielectric layer 12 may be formed on the semiconductor substrate 2. The insulating dielectric layer 12 may include a silicon-oxide layer having a thickness between 0.1 and 2 μm. Next, a masking insulating layer 151 may be formed, using a thermal oxidation process or chemical vapor deposition (CVD) process, on a top surface of the insulating layer 12. The masking insulating layer 151 may include thermally grown silicon oxide ($SiO_2$) and/or CVD silicon nitride ($Si_3N_4$). Alternatively, the masking insulating layer 151 may include an oxide layer, oxynitride layer or nitride layer having a thickness between, for example, 3 nm and 500 nm, between 10 nm and 1,000 nm, between 10 nm and 2,000 nm or between 10 nm and 3,000 nm, or thinner than 5 nm, 10 nm, 30 nm, 50 nm, 100 nm, 200 nm, 300 nm, 500 nm, 1,000 nm or 2,000 nm. Next, a photoresist layer 152 may be formed, using a spin-on coating process, on the masking insulating layer 151. Next, multiple openings **152*a* may be formed, using a photolithography process, in the photoresist layer 152 to expose the masking insulating layer 151**.

Next, referring to FIG. 1B, multiple openings 151*a* may be formed, using an etching process, in the masking insulating layer 151 under the openings 152*a* in the photoresist layer 152 to expose the insulating dielectric layer 12. Next, the photoresist layer 152 may be removed. Next, multiple blind holes 2*a* may be formed in the insulating dielectric layer 12 and semiconductor substrate 2 under the openings 151*a* in the masking insulating layer 151 by etching the insulating dielectric layer 12 and semiconductor substrate 2 for a predetermined time period. Each of the blind holes 2*a* may have a depth between 30 μm and 2,000 μm and a diameter or largest transverse dimension between 2 μm and 20 μm or between 4 μm and 10 μm.

Next, referring to FIG. 1C, the masking insulating layer 151 may be removed. Next, an insulating lining layer 153 may be formed, using a thermal oxidation process or chemical vapor deposition (CVD) process, on the sidewalls and bottoms of the blind holes 2*a* and on the top surface of the insulating dielectric layer 12. The insulating lining layer 153 may be, for example, a thermally grown silicon oxide ($SiO_2$) and/or a CVD silicon nitride ($Si_3N_4$). Next, an adhesion layer 154 may be deposited on the insulating lining layer 153 by, for example, sputtering or chemical vapor depositing (CVD) a titanium (Ti) or titanium nitride (TiN) layer 154 having a thickness between 1 nm to 50 nm on the insulating lining layer 153. Next, a seed layer 155 may be deposited on the adhesion layer 154 by, for example, sputtering or chemical vapor depositing (CVD) a copper seed layer 155 having a thickness between 3 nm and 200 nm on the adhesion layer 154. Next, a copper layer 156 having a thickness, for example, between 10 nm and 3,000 nm, between 10 nm and 1,000 nm or between 10 nm and 500 nm may be electroplated on the copper seed layer 155.

Figure 1D:
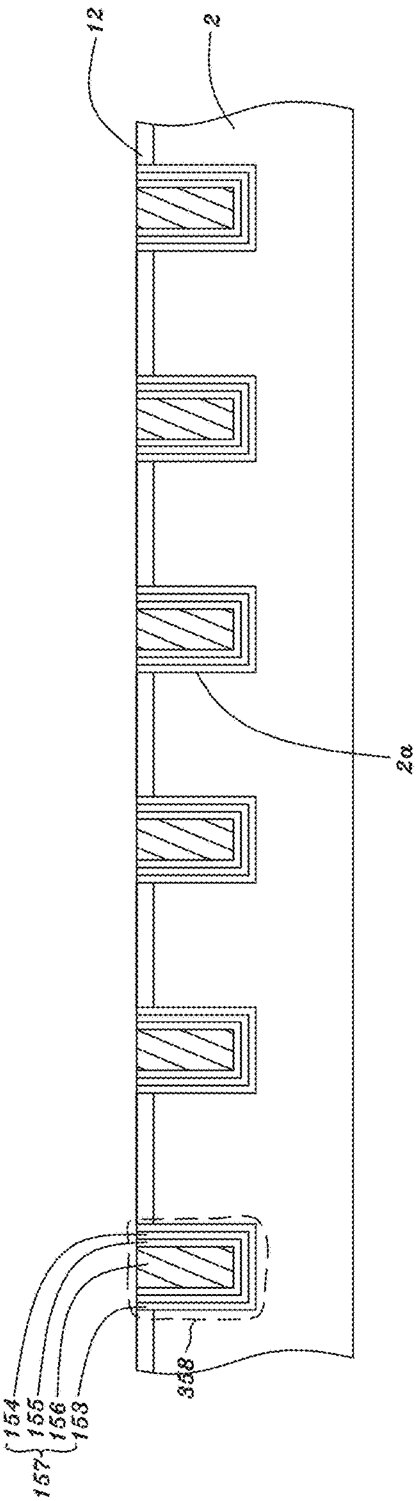

Next, the copper layer 156, seed layer 155, adhesion layer 154 and insulating lining layer 153 outside the blind holes 2*a* and over the insulating dielectric layer 12 may be removed as seen in FIG. 1D by a chemical-mechanical polishing (CMP) process to expose the top surface of the insulating dielectric layer 12. The remaining copper layer 156, seed layer 155, adhesion layer 154 and insulating lining layer 153 may be employed to form multiple through silicon vias (TSVs) 157. Thereby, each of the through silicon vias (TSVs) 157 may vertically extend in one of the blind holes 2*a* in the semiconductor substrate 2 and through the insulating dielectric layer 12. For each of the through silicon vias (TSVs) 157, its insulating lining layer 153 may be provided on a sidewall and bottom of one of the blind holes 2*a*, its copper layer 156 may be provided in said one of the blind holes 2*a* and have a front side coplanar with a front side of the insulating dielectric layer 12, its adhesion layer 154 may be provided on its insulating lining layer 153, between its insulating lining layer 153 and copper layer 156 and at a sidewall and bottom of its copper layer 156, and its seed layer 155 may be provided between its adhesion layer 154 and copper layer 156 and at a sidewall and bottom of its copper layer 156. Each of the through silicon vias (TSVs) 157 may be used as a vertical through via (VTV) 358 for a dedicated vertical path. Each of the vertical through vias (VTVs) 358 formed by the through silicon vias (TSVs) may have a depth between 30 μm and 200 μm and a largest transverse dimension, such as diameter or width, between 2 μm and 20 μm or between 4 μm and 10 μm.

Figure 1E:
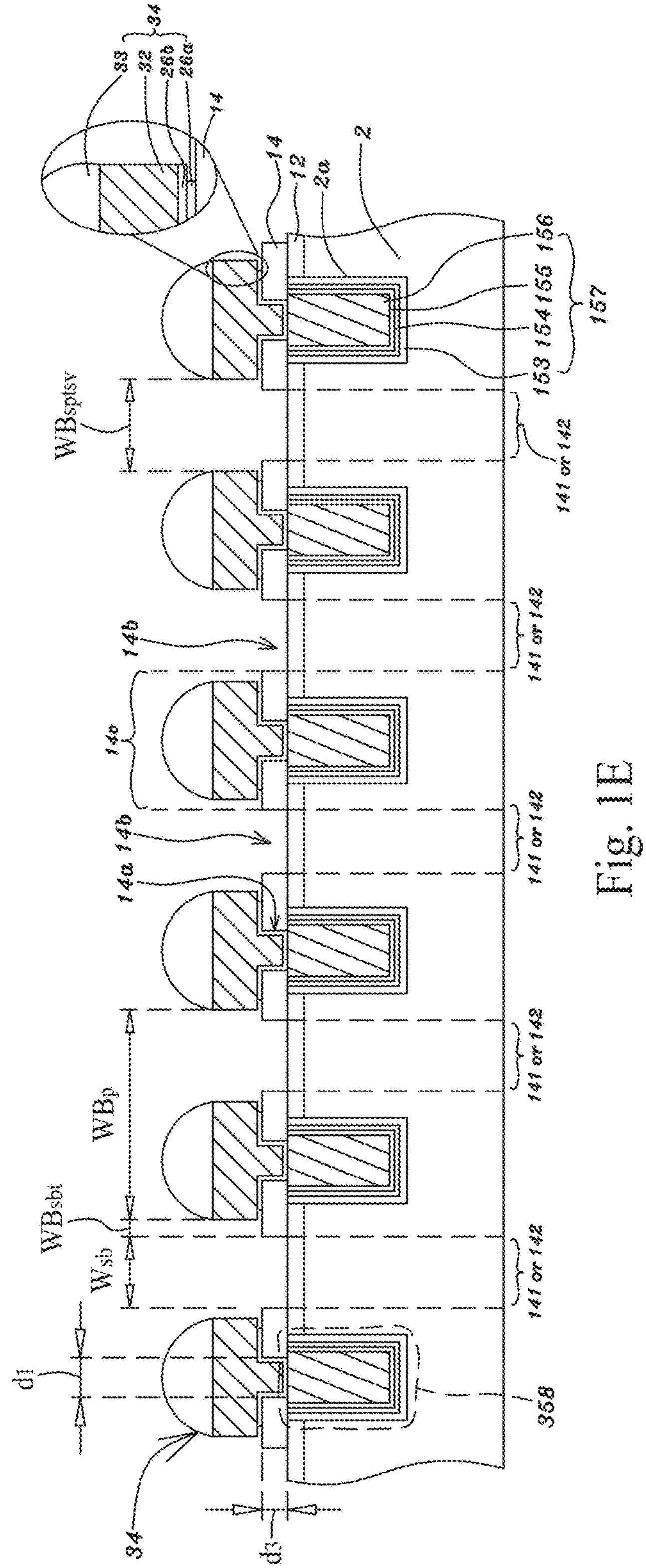
Figure 1F:
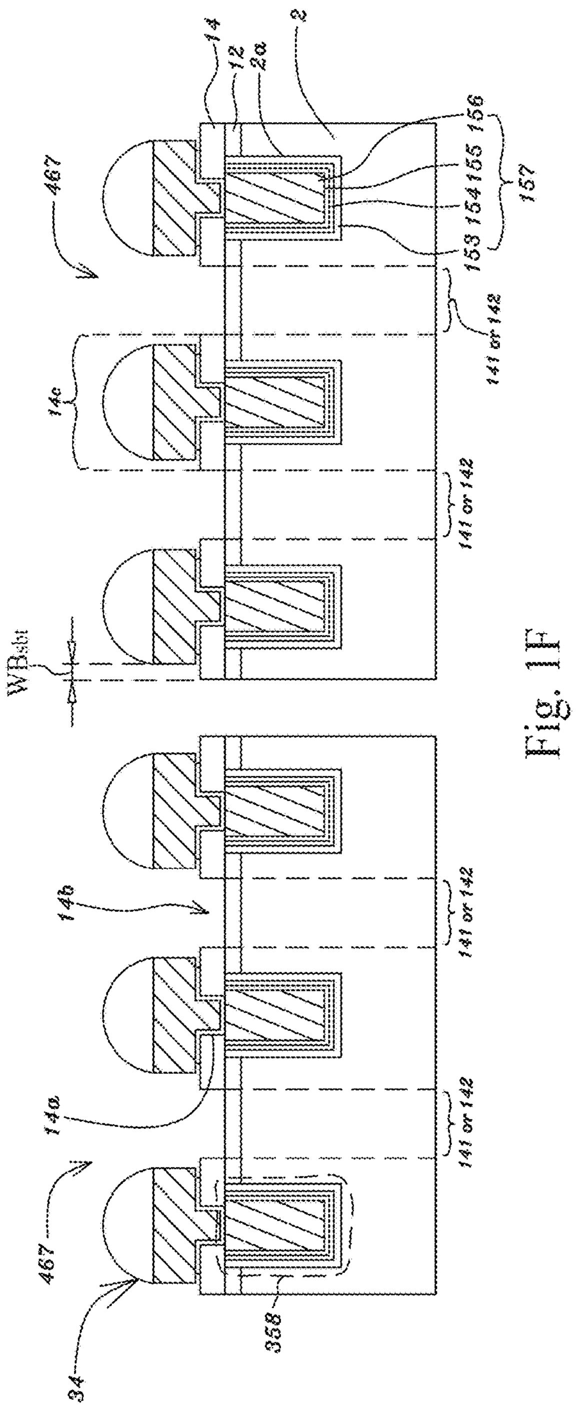

Next, for forming a first type of vertical-through-via (VTV) connector as seen in FIG. 1F, referring to FIG. 1E, a passivation layer 14 may be formed on the top surface of the insulating dielectric layer 12. The passivation layer 14 may include a mobile ion-catching layer or layers, for example, a combination of silicon nitride, silicon oxynitride, and/or silicon carbon nitride layer or layers deposited by a chemical vapor deposition (CVD) process. For example, the passivation layer 14 may include a silicon-nitride layer having a thickness of more than 0.3 micrometers. Alternatively, the passivation layer 14 may include a polymer layer, such as polyimide, having a thickness between 1 and 5 micrometers. Next, multiple openings 14*a* may be formed in the passivation layer 14 and each of the openings 14*a* may expose the copper layer 156 of one of the through silicon vias (TSVs) 157. Each of the openings 14*a* may have a transverse dimension d, from a top view, between 0.5 and 20 micrometers or between 20 and 200 micrometers. The shape of the opening 14*a* from a top view may be a circle, and the diameter of the circle-shaped opening 14*a* may be between 0.5 and 20 micrometers or between 20 and 200 micrometers. Alternatively, the shape of the opening 14*a* from a top view may be a square, and the width of the square-shaped opening 14*a* may be between 0.5 and 20 micrometers or between 20 and 200 micrometers. Alternatively, the shape of the opening 14*a* from a top view may be a polygon, such as hexagon or octagon, and the polygon-shaped opening 14*a* may have a width between 0.5 and 20 micrometers or between 20 and 200 micrometers. Alternatively, the shape of the opening 14*a* from a top view may be a rectangle, and the rectangle-shaped opening 14*a* may have a shorter width between 0.5 and 20 micrometers or between 20 and 200 micrometers.

Next, for forming the first type of vertical-through-via (VTV) connector as seen in FIG. 1F, referring to FIG. 1E, a micro-bump or micro-pillar 34 may be formed on the copper layer 156 of each of the through silicon vias (TSVs) 157 at a bottom of one of the openings 14*a* in the passivation layer 14. The micro-bumps or micro-pillars 34 may be of various types. A first type of micro-bumps or micro-pillars 34 may include (1) an adhesion layer 26*a*, such as titanium (Ti) or titanium nitride (TiN) layer having a thickness between 1 nm and 50 nm, on the copper layer 156 of the through silicon vias (TSVs) 157, (2) a seed layer 26*b*, such as copper, on its adhesion layer 26*a* and (3) an copper layer 32 having a thickness between 1 μm and 60 μm on its seed layer 26*b*.

Alternatively, a second type of micro-bumps or micro-pillars 34 may include the adhesion layer 26*a*, seed layer 26*b* and copper layer 32 as mentioned above, and may further include, as seen in FIG. 1E, a tin-containing solder cap 33 made of tin or a tin-silver alloy having a thickness between 1 μm and 50 μm on its copper layer 32.

Figure 20B:
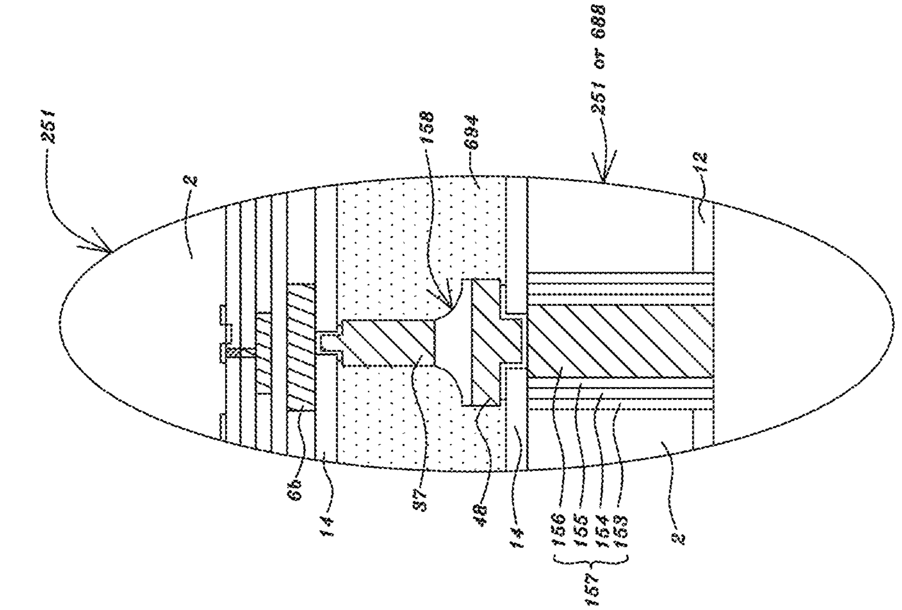
FIGS. 20A and 20B are schematically cross-sectional views showing a process of bonding a thermal compression bump to a thermal compression pad in accordance with an embodiment of the present application.
Figure 20A:
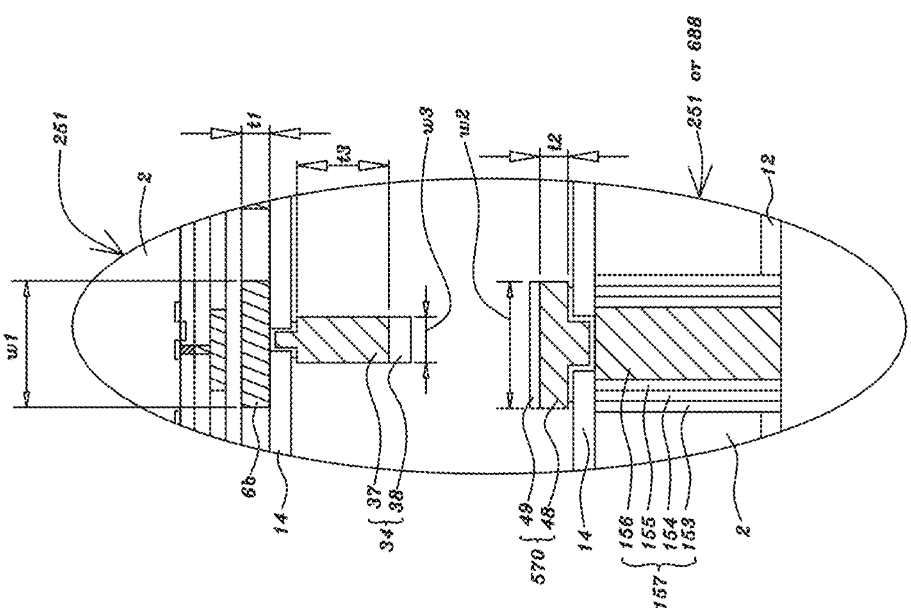
Figure 22B:
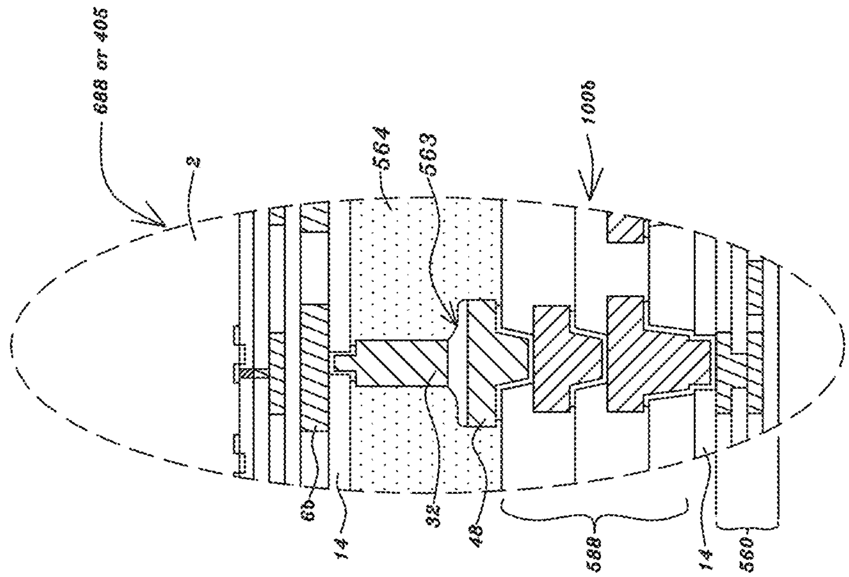
FIGS. 22A and 22B are schematically cross-sectional views showing a process of bonding a thermal compression bump to a thermal compression pad in accordance with an embodiment of the present application.
Figure 22A:
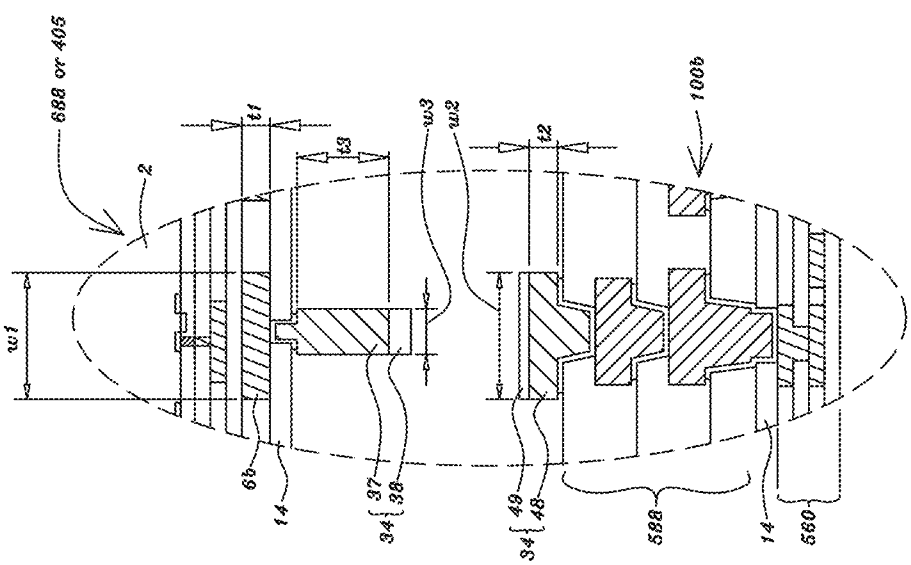

Alternatively, a third type of micro-bumps or micro-pillars 34 may be thermal compression bumps, including the adhesion layer 26*a* and seed layer 26*b* as mentioned above, and may further include, as seen in any of FIGS. 20A and 22A, a copper layer 37 having a thickness t3 between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, between 1 μm and 15 μm, such as 3 μm, on its copper layer 37.

Alternatively, a fourth type of micro-bumps or micro-pillars 34 may be thermal compression bumps, including the adhesion layer 26*a* and seed layer 26*b* as mentioned above, and may further include, as seen in FIG. 22A, a copper layer 48 having a thickness t2 of between 2 μm and 20 μm, such as 3 μm, and a largest transverse dimension w2, such as diameter in a circular shape, greater than 25 μm or between 25 μm and 150 μm, on its seed layer 26*b* and a solder cap 49 made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, greater than 25 μm or between 25 μm and 150 μm, on its copper layer 48. A space between neighboring two of the fourth type of micro-bumps or micro-pillars 34 may be greater than 25 μm, 30 μm or 50 μm.

Figure 1G:
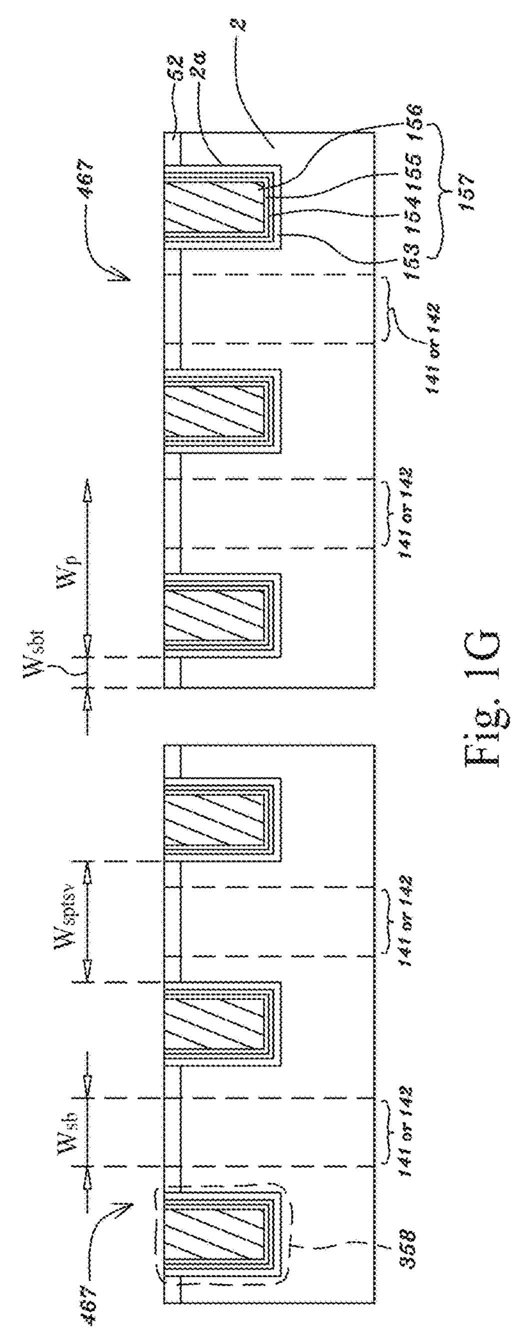
Figure 1H:
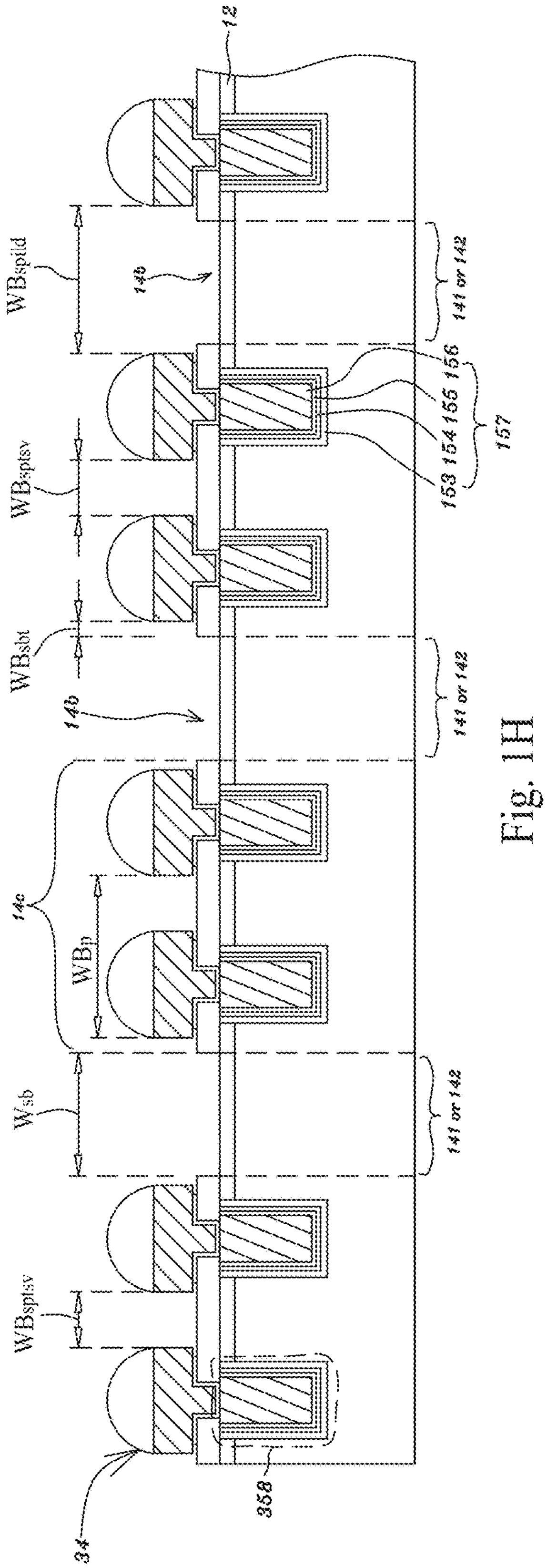
FIGS. 1H-1J are schematically cross-sectional views showing a process for forming first and second types of vertical-through-via (VTV) connectors processed from single-layered through-silicon-via (TSV) wafers for a second case in accordance with an embodiment of the present application.
Figure 1I:
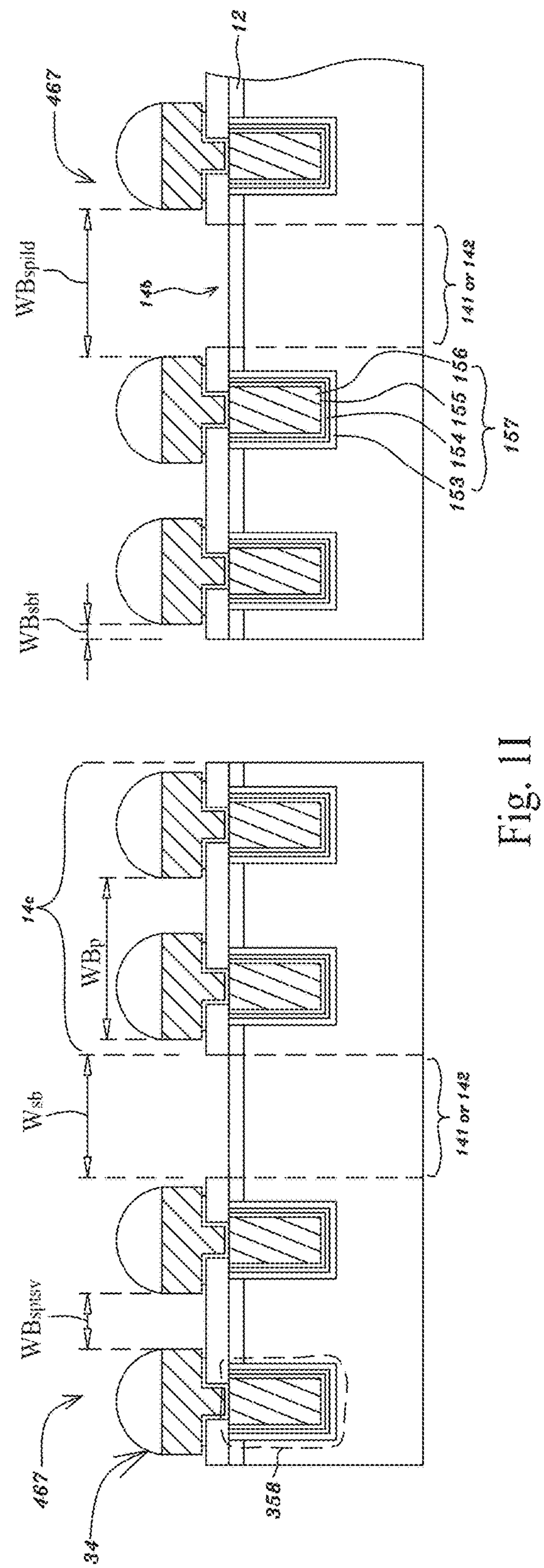
Figure 1J:
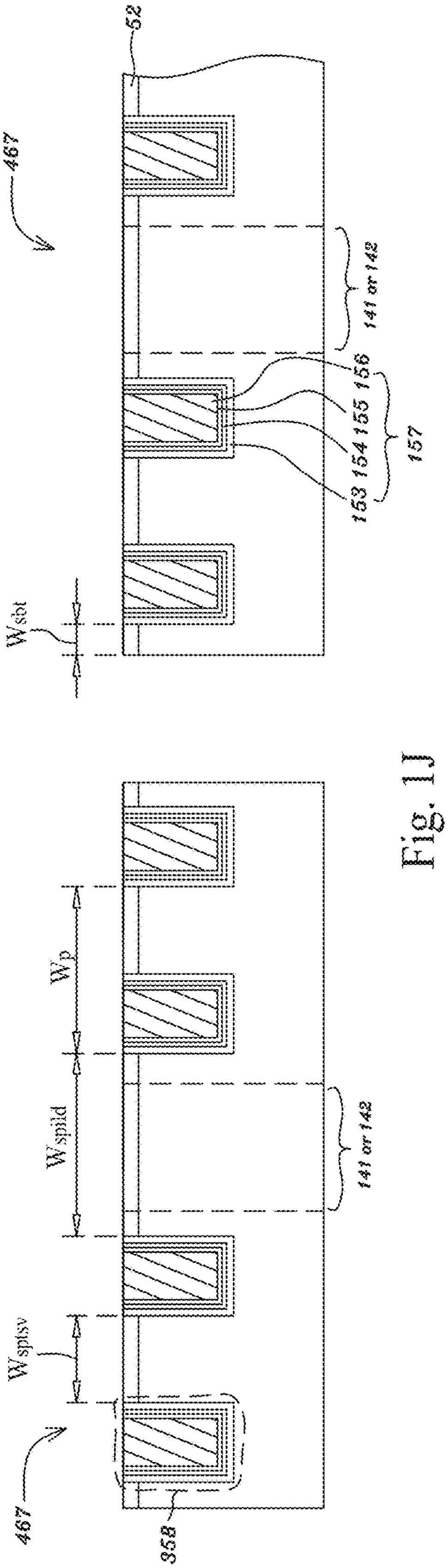
Figure 1K:
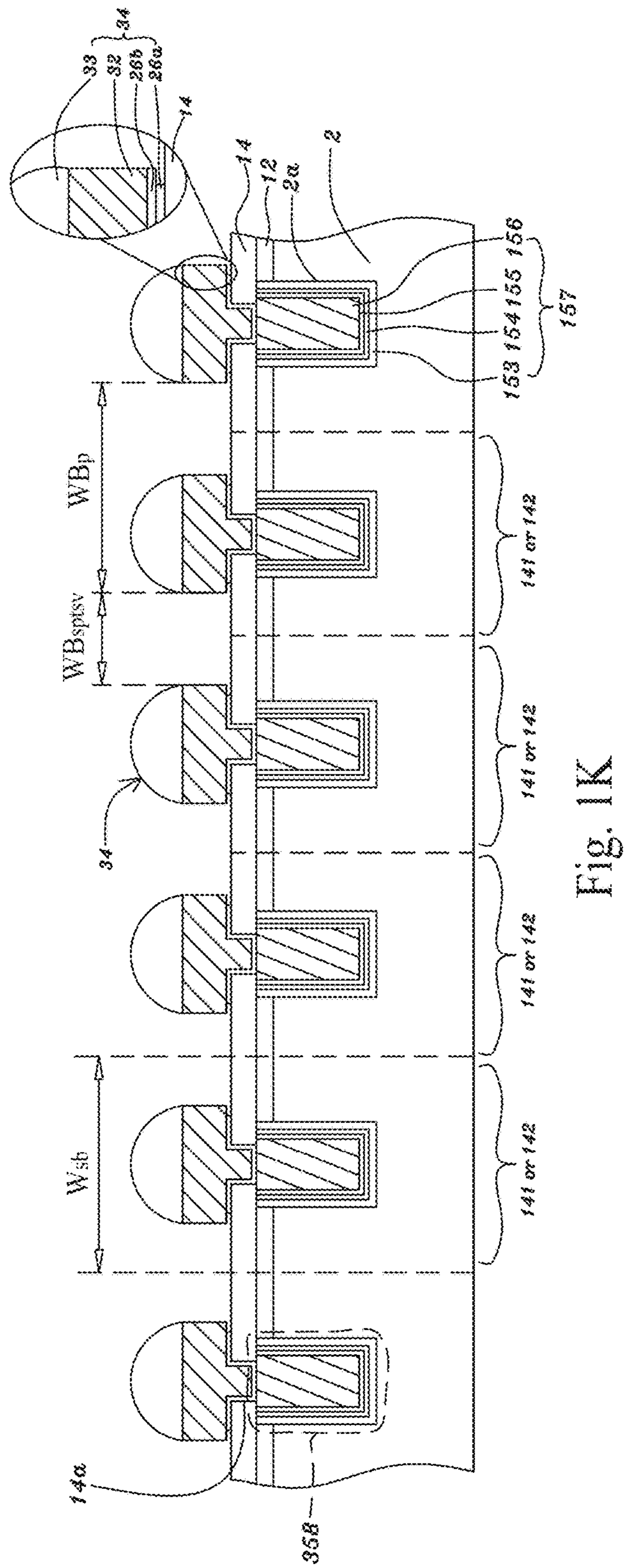
FIGS. 1K-1M are schematically cross-sectional views showing a process for forming first and second types of vertical-through-via (VTV) connectors processed from single-layered through-silicon-via (TSV) wafers for a third case in accordance with an embodiment of the present application.
Figure 1L:
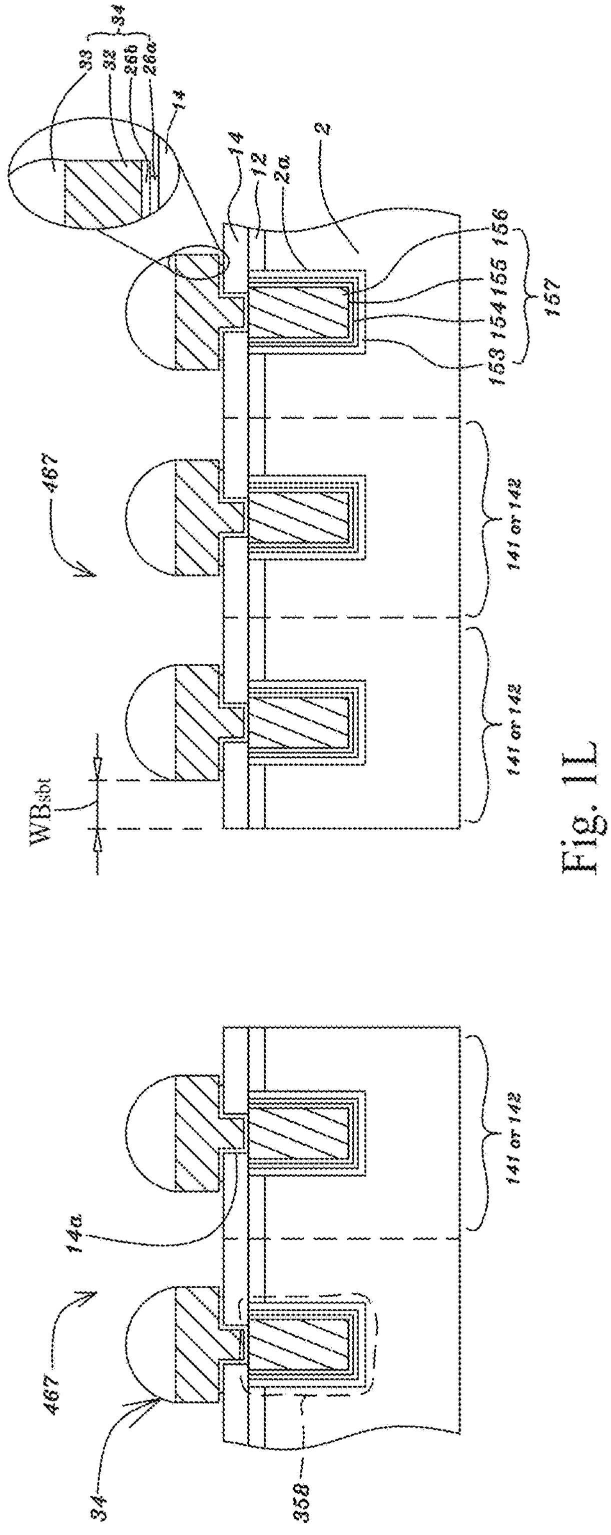
Figure 1M:
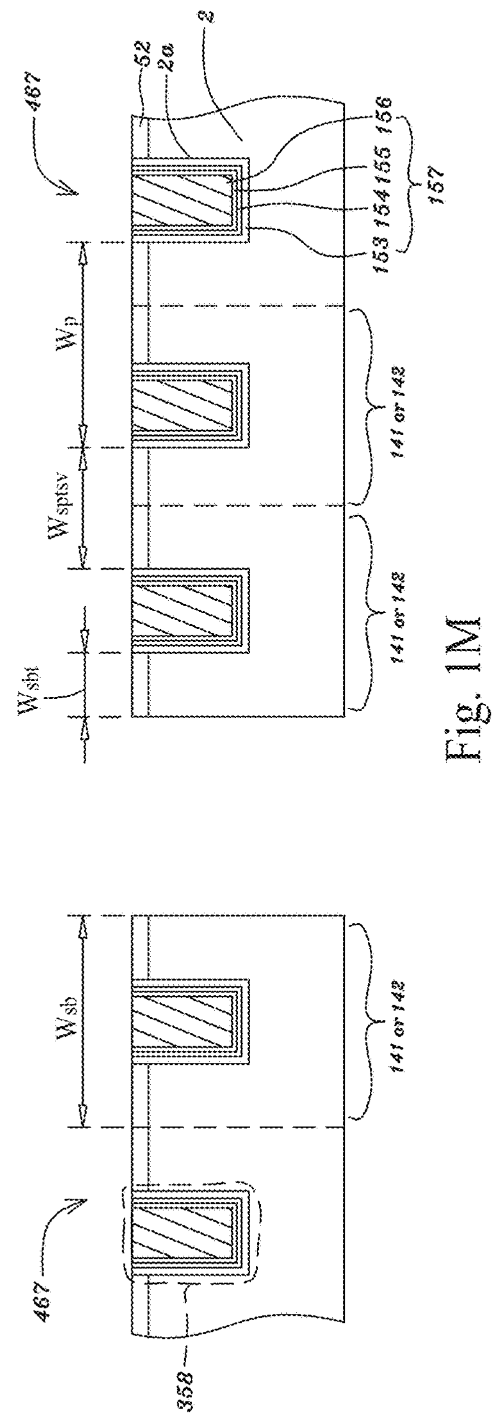

Alternatively, for forming a second type of vertical-through-via (VTV) connector as seen in FIG. 1G, none of the passivation layer 14 and micro-bumps or micro-pillars 34 as illustrated in FIG. 1E may be formed as seen in FIG. 1D and the insulating dielectric layer 12 may act as an insulating bonding layer 52.

Figure 4A:
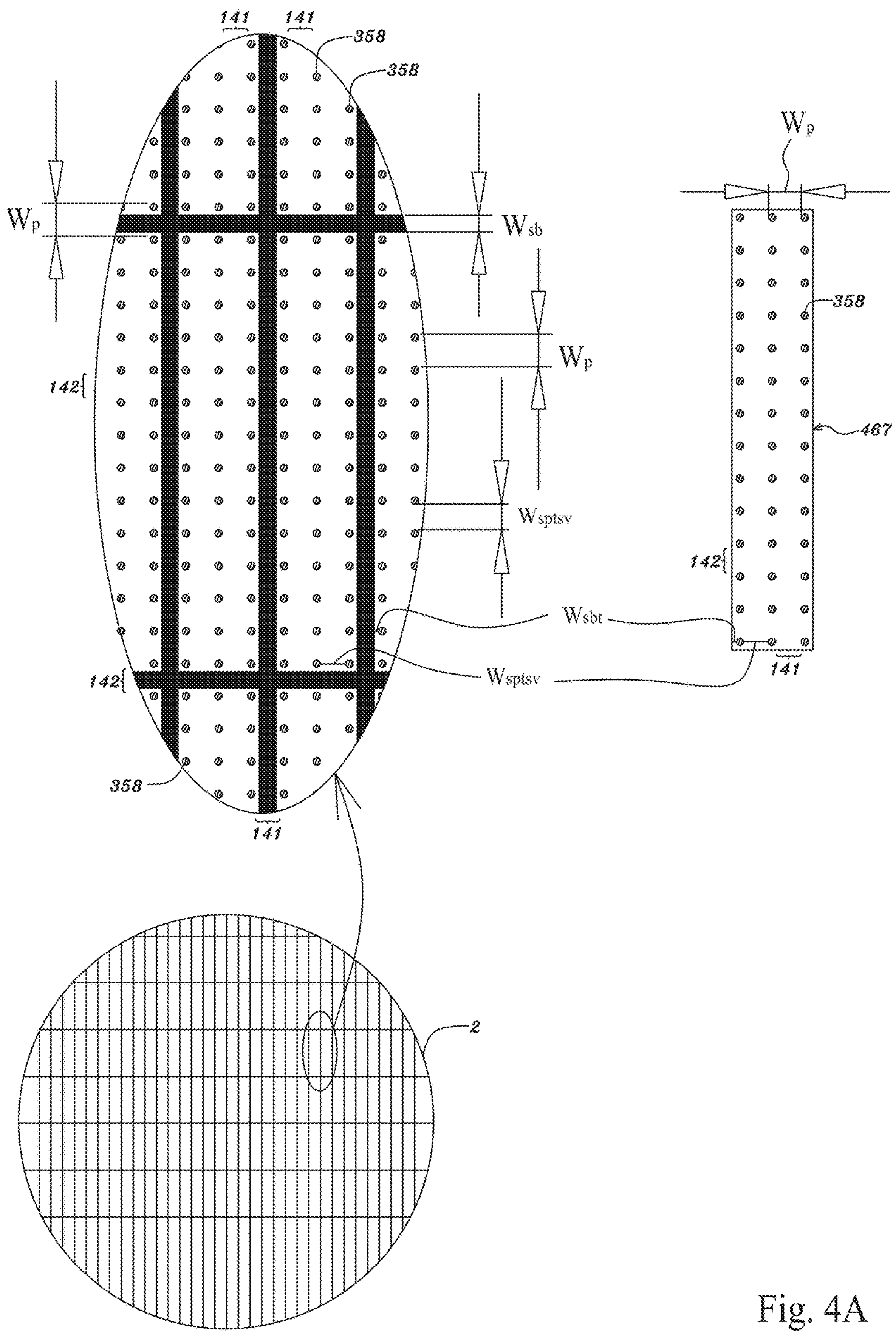
FIGS. 4A and 4B are schematically top views showing various arrangements of reserved scribe lines and vertical through vias (VTVs) for each of first and second types of vertical-through-via (VTV) connectors for a first case in accordance with an embodiment of the present application.
Figure 4B:
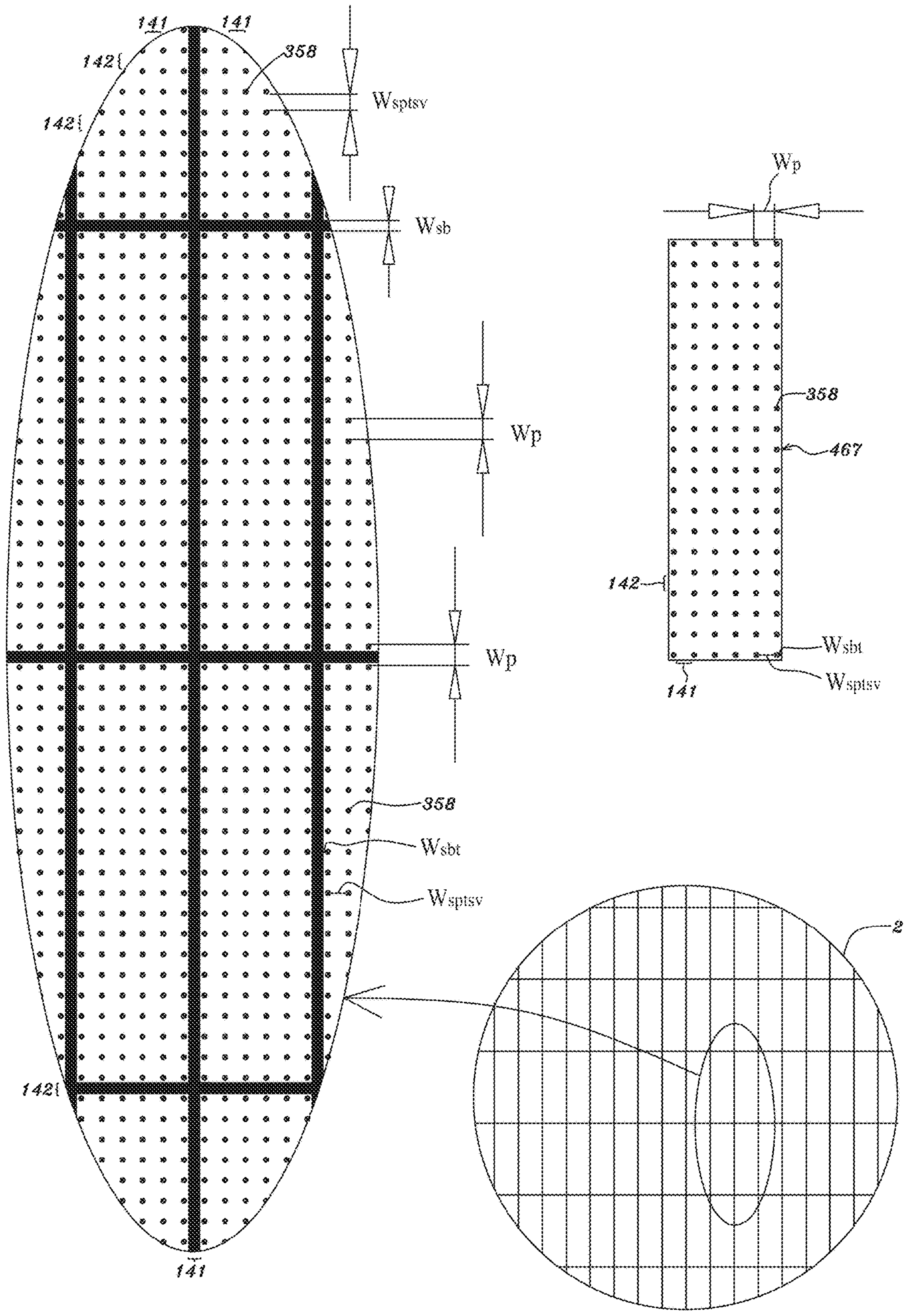
Figure 4C:
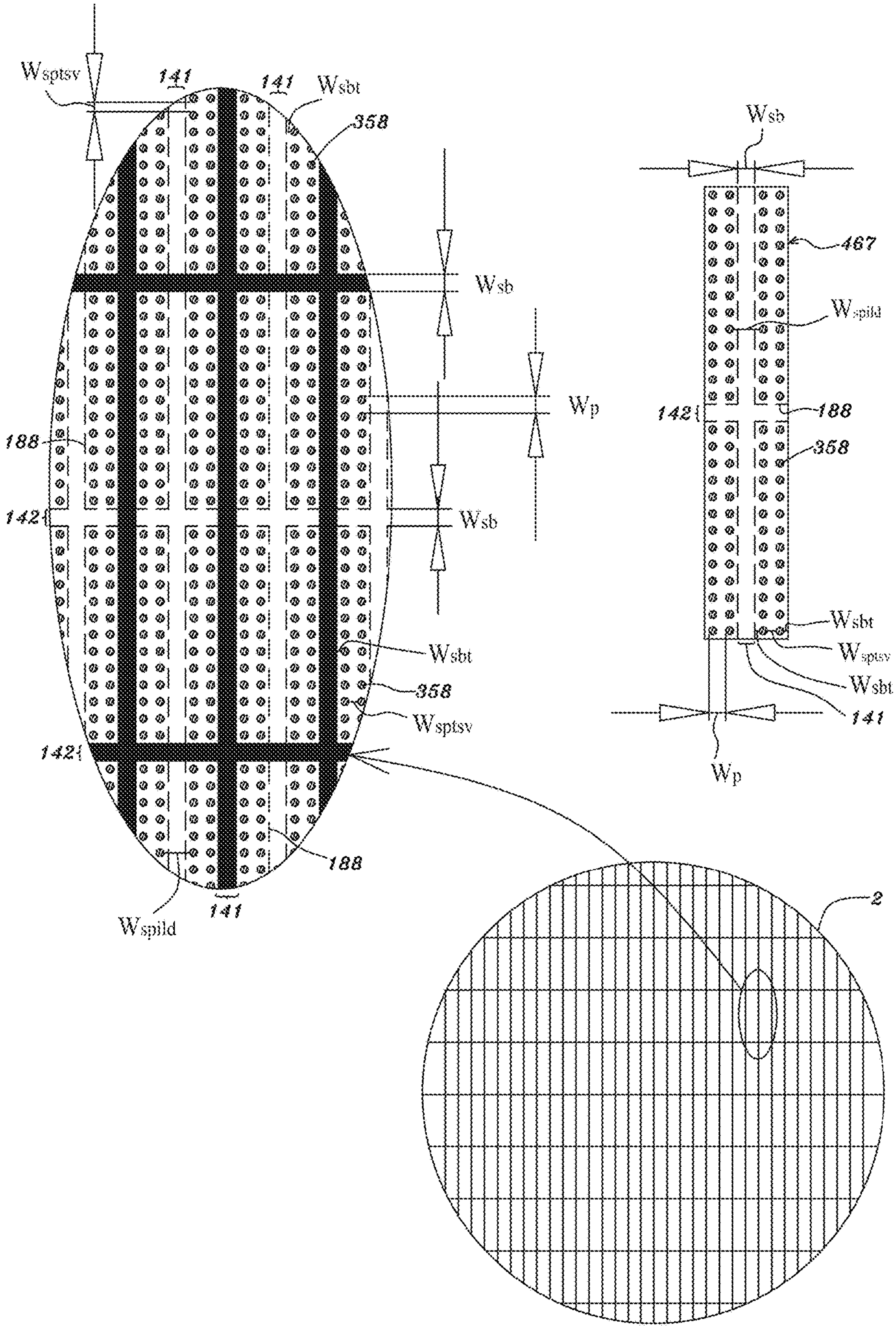
FIGS. 4C and 4D are schematically top views showing various arrangements of reserved scribe lines and vertical through vias (VTVs) for each of first and second types of vertical-through-via (VTV) connectors for a second case in accordance with an embodiment of the present application.
Figure 4D:
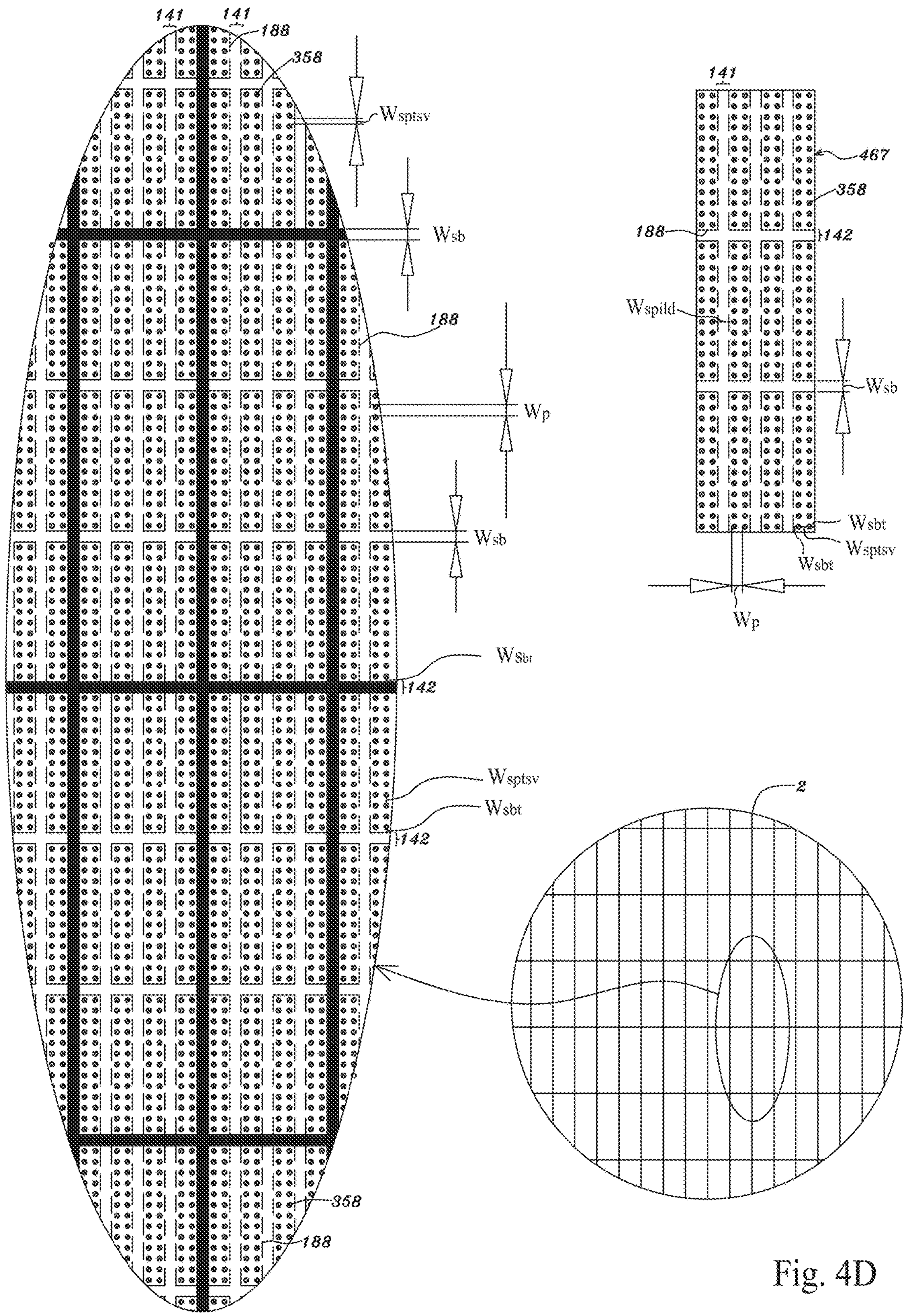
Figure 4E:
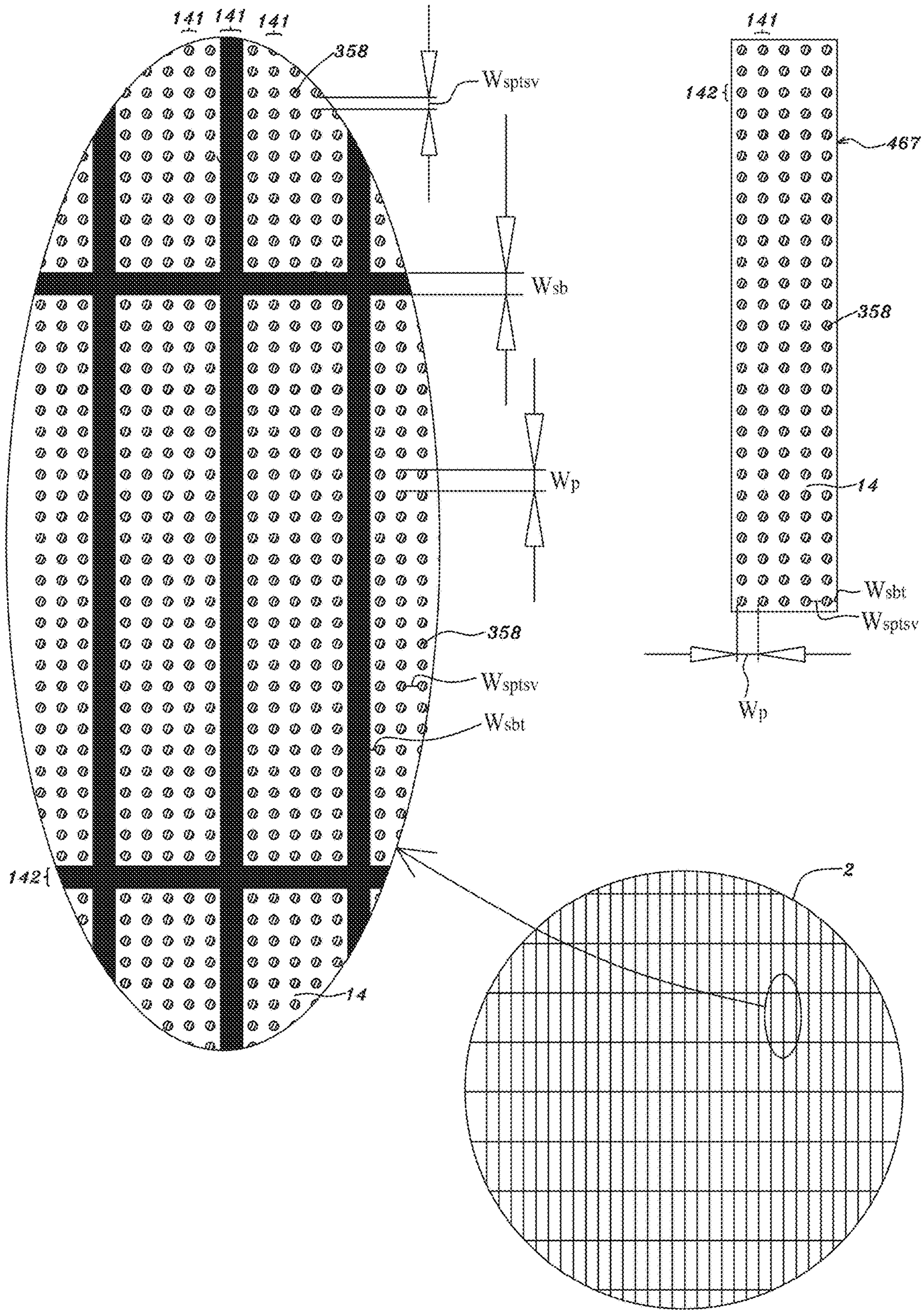
FIGS. 4E and 4F are schematically top views showing various arrangements of reserved scribe lines and vertical through vias (VTVs) for each of first and second types of vertical-through-via (VTV) connectors for a third case in accordance with an embodiment of the present application.
Figure 4F:
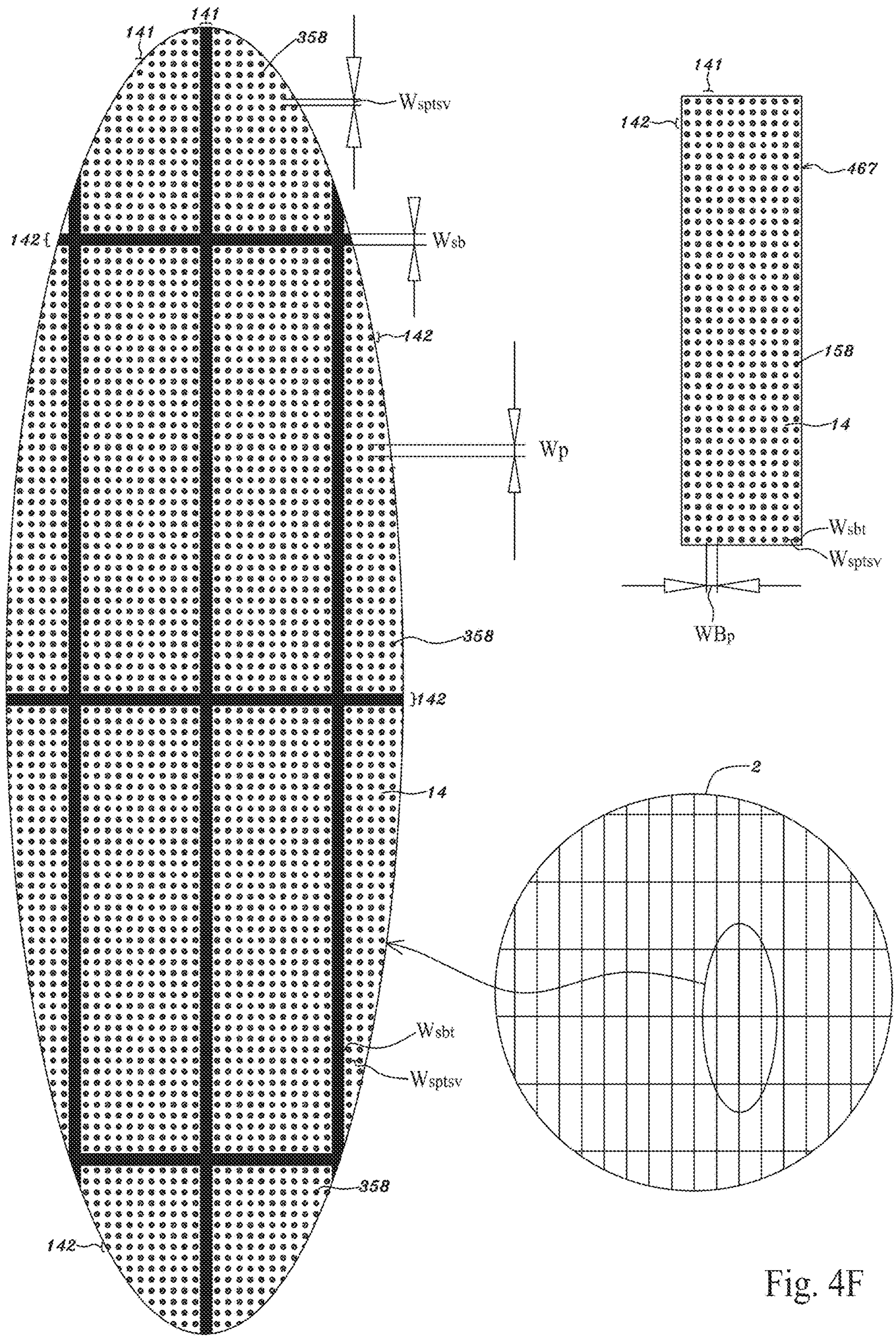

FIGS. 4A and 4B are schematically top views showing various arrangements of reserved scribe lines and vertical through vias (VTVs) for each of first and second types of vertical-through-via (VTV) connectors for a first case in accordance with an embodiment of the present application. FIGS. 4C and 4D are schematically top views showing various arrangements of reserved scribe lines and vertical through vias (VTVs) for each of first and second types of vertical-through-via (VTV) connectors for a second case in accordance with an embodiment of the present application. FIGS. 4E and 4F are schematically top views showing various arrangements of reserved scribe lines and vertical through vias (VTVs) for each of first and second types of vertical-through-via (VTV) connectors for a third case in accordance with an embodiment of the present application. For the first case, referring to FIGS. 1E, 1G, 4A and 4B, a pitch $W_p$ between each neighboring two of the vertical through vias (VTVs) 358 in the semiconductor substrate 2 may range from 20 to 150 micrometers or from 40 to 100 micrometers or may be smaller than 50, 40 or 30 micrometers; and a space $W_{sptsv}$ between each neighboring two of the vertical through vias (VTVs) 358 in the semiconductor substrate 2 may range from 20 to 150 micrometers or from 40 to 100 micrometers or may be smaller than 50, 40 or 30 micrometers. Multiple trenches 14*b* for reserved scribe lines may be formed in the passivation layer 14 to form multiple insulating-material islands 14*c* between neighboring two of the trenches 14*b*. The trenches 14*b* in a first group for multiple first reserved scribe lines 141 may extend in a y direction and the trenches 14*b* in a second group for multiple second reserved scribe lines 142 may extend in an x direction vertical to the y direction. The vertical through vias (VTVs) 358 arranged in only one line in the y direction are arranged between neighboring two of the first reserved scribe lines 141, and the vertical through vias (VTVs) 358 arranged in only one line in the x direction are arranged between neighboring two of the second reserved scribe lines 142. Each of the insulating-material islands 14*c* may be aligned with only one of the vertical through vias (VTVs) 358, and one of the openings 14*a* in said each of the insulating-material islands 14*c* may be arranged over said only one of the vertical through vias (VTVs) 358. None of the vertical through vias (VTVs) 358 may be arranged under each of the trenches 14*b*. Accordingly, the pitch $W_p$ and space $W_{sptsv}$ in the y direction between each neighboring two of the vertical through vias (VTVs) 358 may be greater than a width $W_{sb}$ of the second reserved scribe lines 142 or greater than the width $W_{sb}$ of the second reserved scribe lines 142 plus two times of a predetermined space $W_{sbt}$ between one of the second reserved scribe lines 142 and one of said each neighboring two of the vertical through vias (VTVs) 358 adjacent to said one of the second reserved scribe lines 142. The pitch $W_p$ and space $W_{sptsv}$ in the x direction between each neighboring two of the vertical through vias (VTVs) 358 may be greater than a width $W_{sb}$ of the first reserved scribe lines 141 or greater than the width $W_{sb}$ of the first reserved scribe lines 141 plus two times of a predetermined space $W_{sbt}$ between one of the first reserved scribe lines 141 and one of said each neighboring two of the vertical through vias (VTVs) 358 adjacent to said one of the first reserved scribe lines 141.

For the second case, referring to FIGS. 1H, 1J, 4C and 4D, the vertical through vias (VTVs) 358 may be populated regularly in multiple islands or regions 188 of arrays of vertical through vias (VTVs) with the first and second reserved scribe lines 141 and 142 each between neighboring two of the islands or regions 188 of arrays of vertical through vias (VTVs). A pitch $W_p$ between each neighboring two of the vertical through vias (VTVs) 358 aligned with one of the islands or regions 88 of arrays of vertical through vias (VTVs) may range from 5 to 50 micrometers or from 5 to 20 micrometers or may be smaller than 50, 40 or 30 micrometers; and a space $W_{sptsv}$ between neighboring two of the vertical through vias (VTVs) 358 aligned with one of the islands or regions 188 of arrays of vertical through vias (VTVs) may range from 5 to 50 micrometers or from 5 to 20 micrometers or may be smaller than 50, 40 or 30 micrometers. For each of the islands or regions 188 of arrays of vertical through vias (VTVs), its vertical through vias (VTVs) 358 may be arranged in multiple columns, such as two columns for an embodiment shown in FIGS. 1H, 1J, 4C and 4D, and in multiple rows, such as thirteen rows for an embodiment shown in FIGS. 1H, 1J, 4C and 4D; its insulating-material island 14*c* may be aligned with its vertical through vias (VTVs) 358, and multiple of the openings 14*a* in its insulating-material island 14*c* may be arranged over its vertical through vias (VTVs) 358 respectively. The pitch $W_p$ and space $W_{sptsv}$ in the y direction between each neighboring two of the vertical through vias (VTVs) 358 aligned with one of the islands or regions 188 of arrays of vertical through vias (VTVs) may be smaller than the width $W_{sb}$ of the second reserved scribe lines 142 and/or smaller than a first space $W_{spild}$ between neighboring two of the vertical through vias (VTVs) 358 aligned with neighboring two of the islands or regions 188 of arrays of vertical through vias (VTVs) respectively and across one of the second reserved scribe lines 142 between said neighboring two of the islands or regions 188 of arrays of vertical through vias (VTVs). The first space $W_{spild}$ or a width of the trench 14*b* extending in the x direction between neighboring two of the insulating-material islands 14*c* may be greater than 50, 40 or 30 micrometers. The first space $W_{spild}$ may be greater than the width $W_{sb}$ of the second reserved scribe lines 142 or greater than the width $W_{sb}$ of the second reserved scribe lines 142 plus two times of a predetermined space $W_{sbt}$ in the y direction between one of the second reserved scribe lines 142 and one of the vertical through vias (VTVs) 358 adjacent to said one of the second reserved scribe lines 142. The pitch $W_p$ and space $W_{sptsv}$ in the x direction between each neighboring two of the vertical through vias (VTVs) 358 aligned with one of the islands or regions 188 of arrays of vertical through vias (VTVs) may be smaller than the width $W_{sb}$ of the first reserved scribe lines 141 and/or smaller than a second space $W_{spild}$ between neighboring two of the vertical through vias (VTVs) 358 aligned with neighboring two of the islands or regions 188 of arrays of vertical through vias (VTVs) respectively and across one of the first reserved scribe lines 141 between said neighboring two of the islands or regions 188 of arrays of vertical through vias (VTVs). The second space $W_{spild}$ or a width of the trench 14*b* extending in the y direction between neighboring two of the insulating-material islands 14*c* may be greater than 50, 40 or 30 micrometers. The second space $W_{spild}$ may be greater than or equal to the width $W_{sb}$ of the first reserved scribe lines 141 or greater than or equal to the width $W_{sb}$ of the first reserved scribe lines 141 plus two times of a predetermined space $W_{sbt}$ in the x direction between one of the first reserved scribe lines 141 and one of the vertical through vias (VTVs) 358 adjacent to said one of the first reserved scribe lines 141.

For the third case, referring to FIGS. 1K, 1M, 4E and 4F, a pitch $W_p$ between each neighboring two of the vertical through vias (VTVs) 358 in the semiconductor substrate 2 may range from 5 to 50 micrometers or from 5 to 20 micrometers or may be smaller than 50, 40 or 30 micrometers; and a space $W_{sptsv}$ between neighboring two of the vertical through vias (VTVs) 358 may range from 5 to 50 micrometers or from 5 to 20 micrometers or may be smaller than 50, 40 or 30 micrometers. Multiple first reserved scribe lines 141 may extend in a y direction, wherein each of the first reserved scribe lines 141 may extend in line with multiple of the vertical through vias (VTVs) 358 arranged in a line in the y direction. Multiple second reserved scribe lines 142 may extend in an x direction, wherein each of the second reserved scribe lines 142 may extend in line with multiple of the vertical through vias (VTVs) 358 arranged in a line in the x direction. Accordingly, the pitch $W_p$ and space $W_{sptsv}$ in the y direction between each neighboring two of the vertical through vias (VTVs) 358 may be smaller than a width $W_{sb}$ of the second reserved scribe lines 142 or smaller than the width $W_{sb}$ of the second reserved scribe lines 142 plus two times of a predetermined space $W_{sbt}$ between one of the second reserved scribe lines 142 and one of the vertical through vias (VTVs) 358 adjacent to said one of the second reserved scribe lines 142. The pitch $W_p$ and space $W_{sptsv}$ in the x direction between each neighboring two of the vertical through vias (VTVs) 358 may be smaller than a width $W_{sb}$ of the first reserved scribe lines 141 or smaller than the width $W_{sb}$ of the first reserved scribe lines 141 plus two times of a predetermined space $W_{sbt}$ between one of the first reserved scribe lines 141 and one of the vertical through vias (VTVs) 358 adjacent to said one of the first reserved scribe lines 141.

Figure 4G:
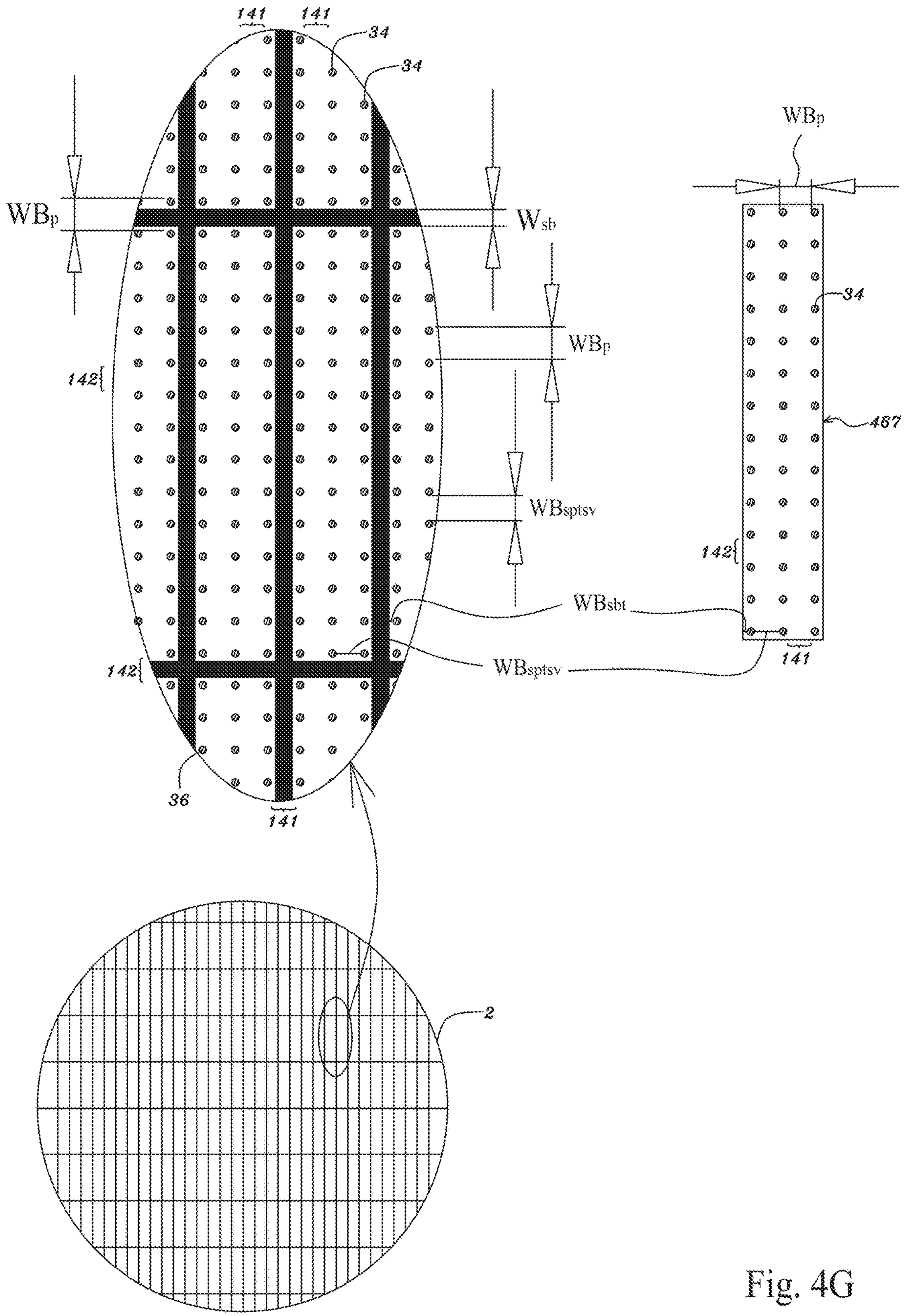
FIGS. 4G and 4H are schematically top views showing various arrangements of reserved scribe lines and micro-bumps or micro-pillars for each of first and second types of vertical-through-via (VTV) connectors for the first case in accordance with an embodiment of the present application.
Figure 4H:
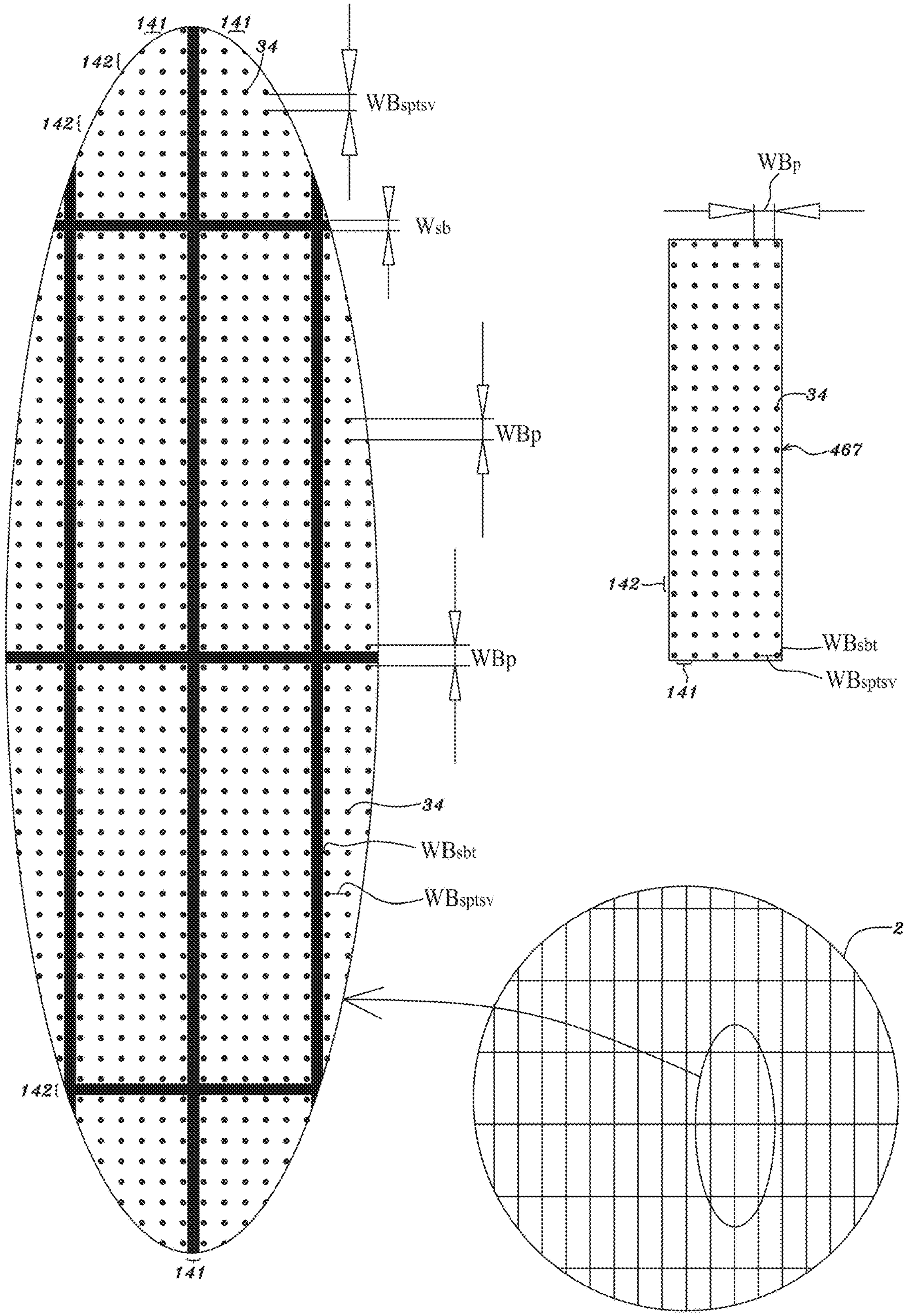

FIGS. 4G and 4H are schematically top views showing various arrangements of reserved scribe lines and micro-bumps or micro-pillars for a first type of vertical-through-via (VTV) connector for the first case in accordance with an embodiment of the present application. FIGS. 41 and 4J are schematically top views showing various arrangements of reserved scribe lines and micro-bumps or micro-pillars for a first type of vertical-through-via (VTV) connector for the second case in accordance with an embodiment of the present application. FIGS. 4K and 4L are schematically top views showing various arrangements of reserved scribe lines and micro-bumps or micro-pillars for a first type of vertical-through-via (VTV) connector for the third case in accordance with an embodiment of the present application. For the first case, referring to FIGS. 1E, 4G and 4H, a pitch $WB_p$ between each neighboring two of the first, second, third or fourth type of micro-bumps or micro-pillars 34 may range from 20 to 150 micrometers or from 40 to 100 micrometers; and a space $WB_{sptsv}$ between each neighboring two of the first, second, third or fourth type of micro-bumps or micro-pillars 34 may range from 20 to 150 micrometers or from 40 to 100 micrometers. The first, second, third or fourth type of micro-bumps or micro-pillars 34 arranged in only one line in the y direction are arranged between neighboring two of the first reserved scribe lines 141, and the first, second, third or fourth type of micro-bumps or micro-pillars 34 arranged in only one line in the x direction are arranged between neighboring two of the second reserved scribe lines 142. Each of the insulating-material islands 14*c* may be aligned with only one of the first, second, third or fourth type of micro-bumps or micro-pillars 34, and one of the openings 14*a* in said each of the insulating-material islands 14*c* may be arranged under said only one of the first, second, third or fourth type of micro-bumps or micro-pillars 34. Accordingly, the pitch $WB_p$ and space $WB_{sptsv}$ in the y direction between each neighboring two of the first, second, third or fourth type of micro-bumps or micro-pillars 34 may be greater than the width $W_{sb}$ of the second reserved scribe lines 142 or greater than the width $W_{sb}$ of the second reserved scribe lines 142 plus two times of a predetermined space $WB_{sbt}$ between one of the second reserved scribe lines 142 and one of said each neighboring two of the first, second, third or fourth type of micro-bumps or micro-pillars 34 adjacent to said one of the second reserved scribe lines 142. The pitch $WB_p$ and space $WB_{sptsv}$ in the x direction between each neighboring two of the first, second, third or fourth type of micro-bumps or micro-pillars 34 may be greater than the width $W_{sb}$ of the first reserved scribe lines 141 or greater than the width $W_{sb}$ of the first reserved scribe lines 141 plus two times of a predetermined space $WB_{sbt}$ between one of the first reserved scribe lines 141 and one of said each neighboring two of the first, second, third or fourth type of micro-bumps or micro-pillars 34 adjacent to said one of the first reserved scribe lines 141.

Figure 4I:
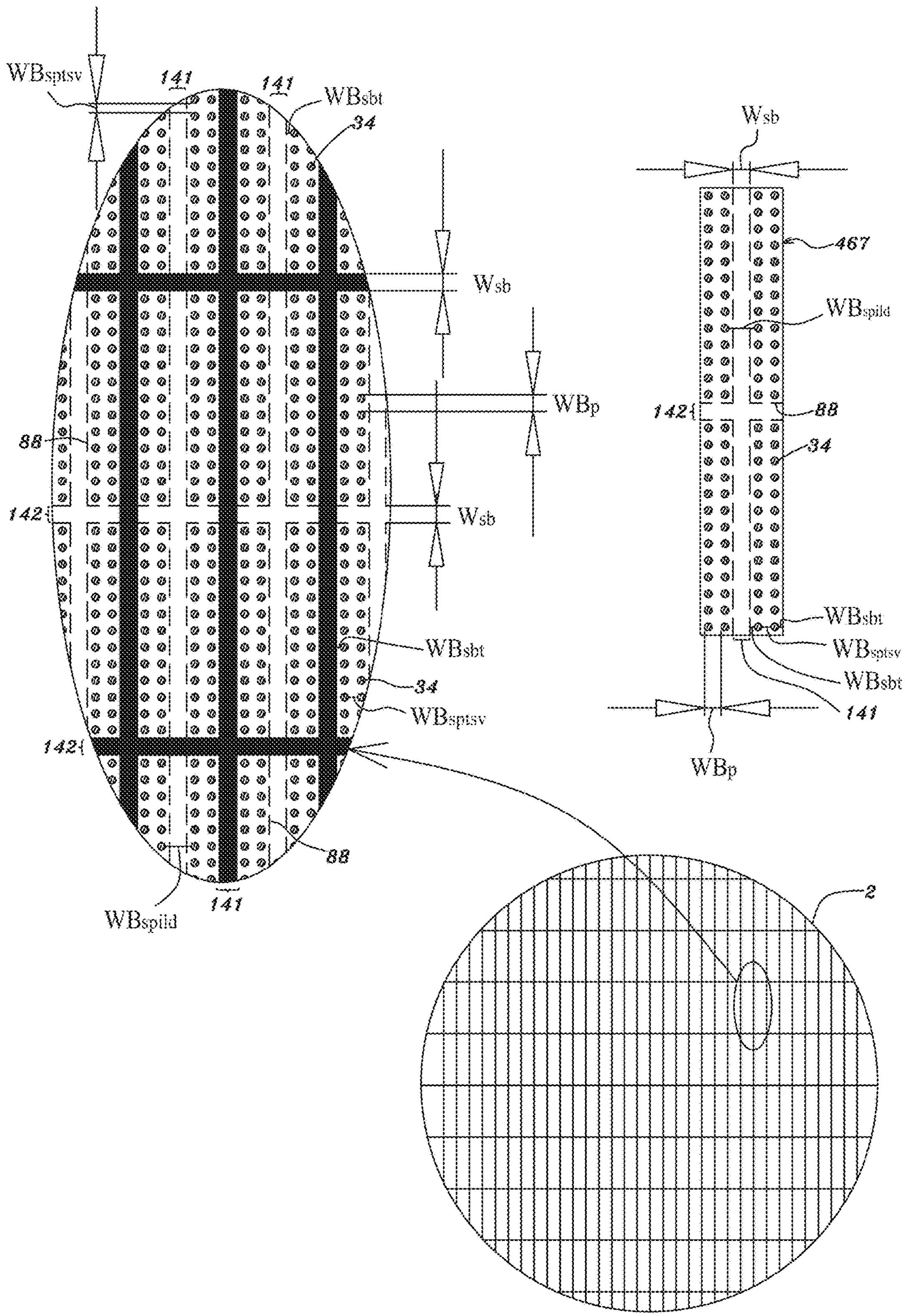
Figure 4J:
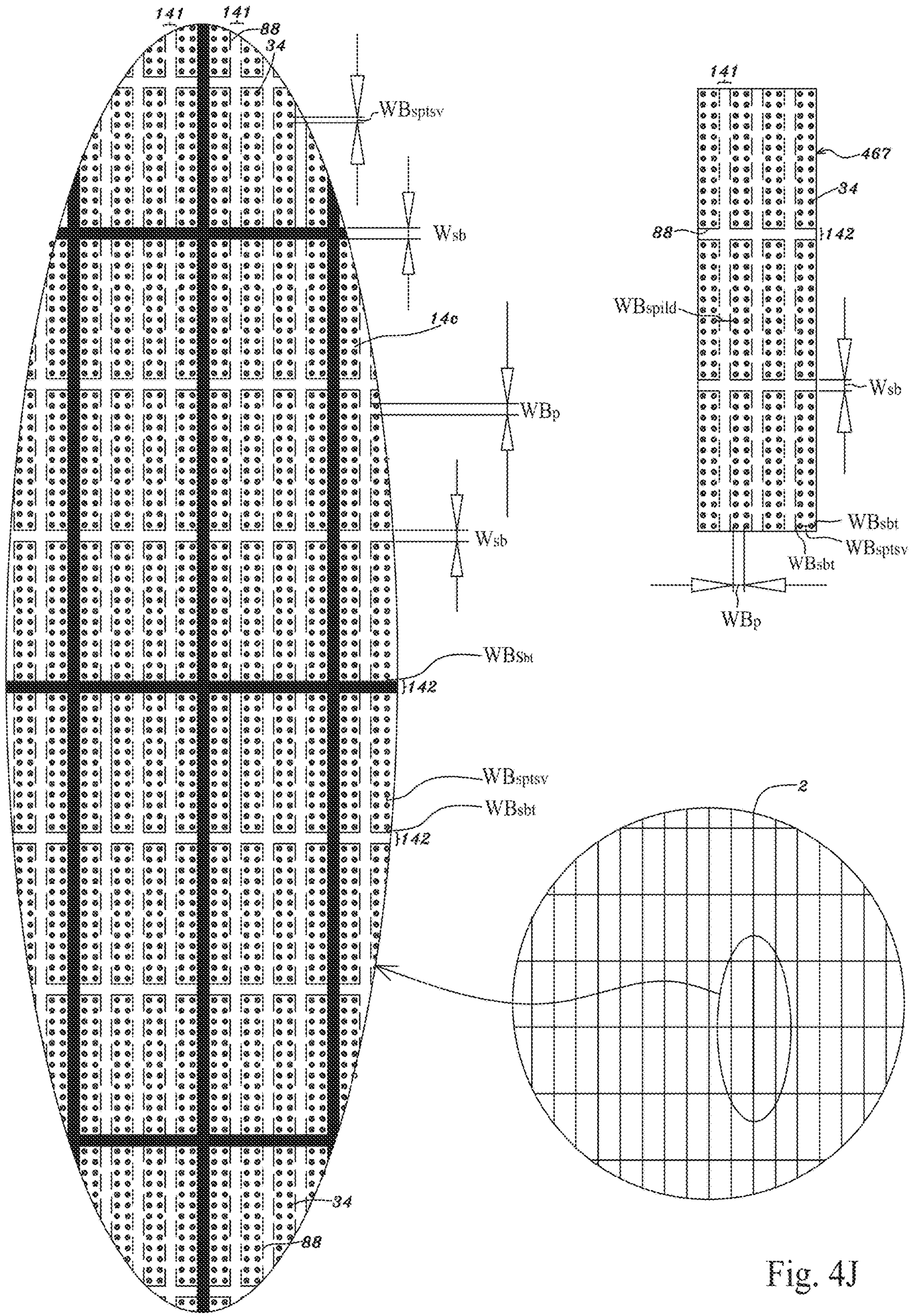
Figure 4K:
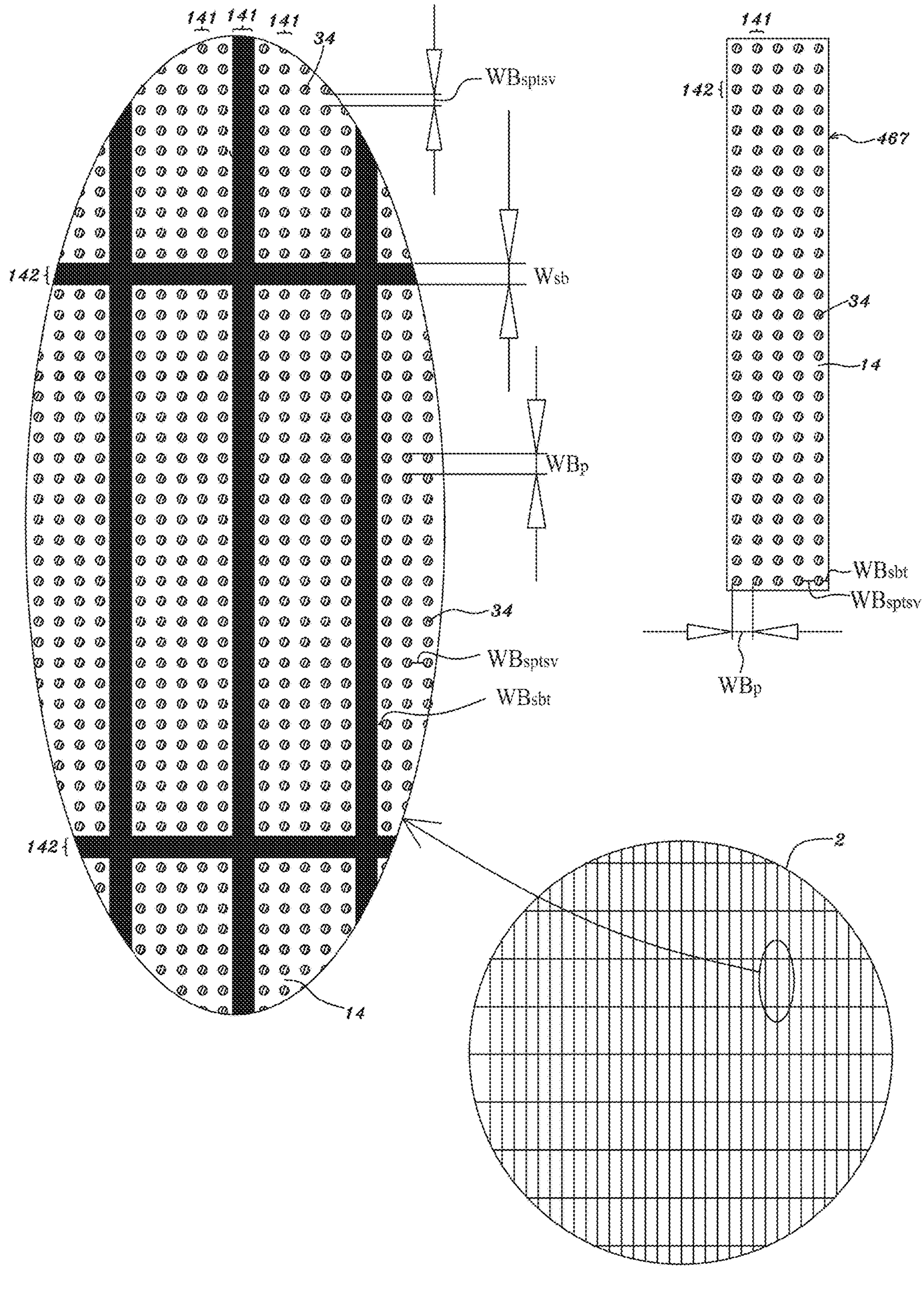
FIGS. 4K and 4L are schematically top views showing various arrangements of reserved scribe lines and micro-bumps or micro-pillars for each of first and second types of vertical-through-via (VTV) connectors for the third case in accordance with an embodiment of the present application.
Figure 4L:
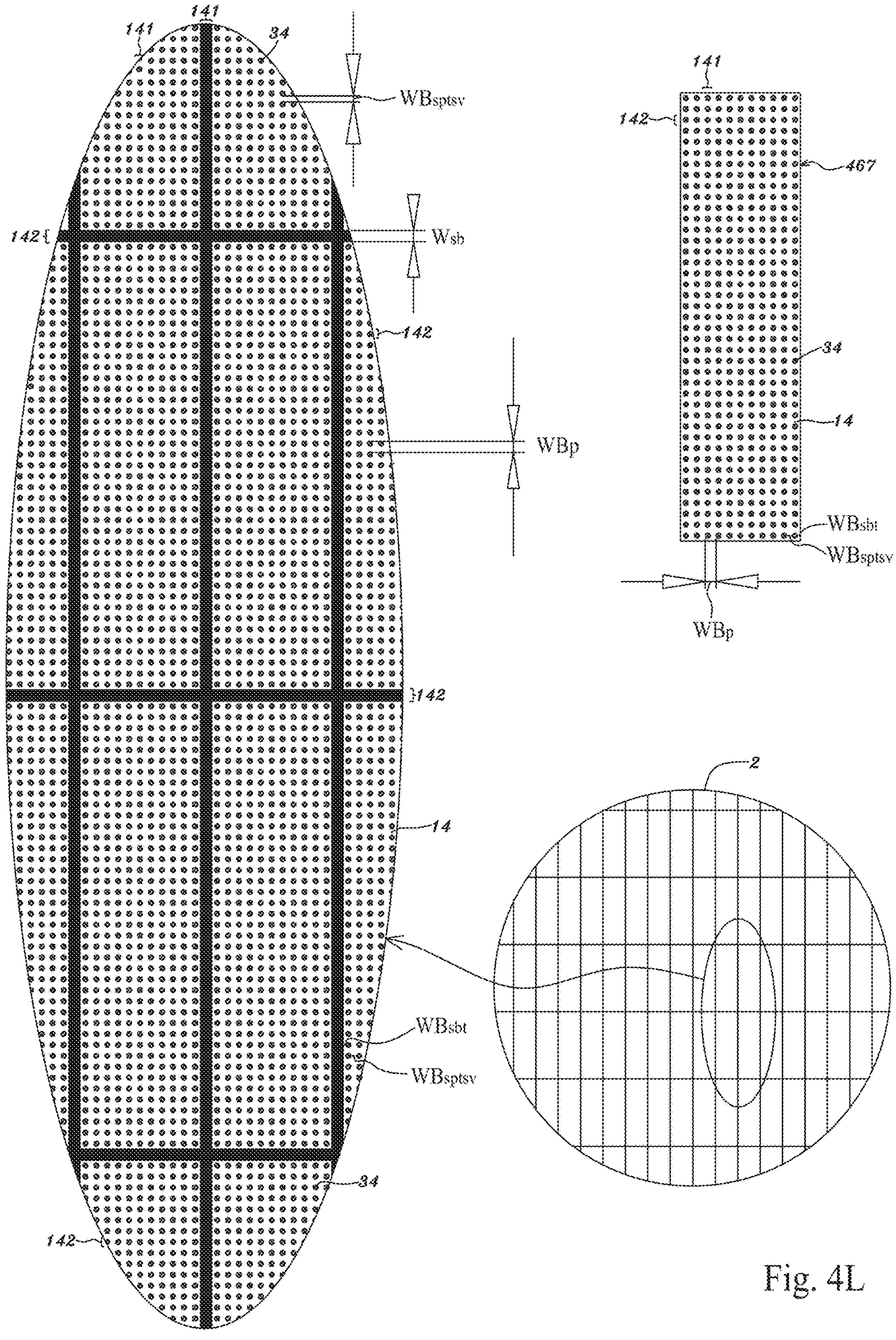

For the second case, referring to FIGS. 1H, 4I and 4J, the first, second, third or fourth type of micro-bumps or micro-pillars 34 may be populated regularly in multiple islands or regions 88 of arrays of micro-bumps or micro-pillars with the first and second reserved scribe lines 141 and 142 each between neighboring two of the islands or regions 88 of arrays of micro-bumps or micro-pillars. A pitch $WB_p$ between each neighboring two of the first, second, third or fourth type of micro-bumps or micro-pillars 34 aligned with one of the islands or regions 88 of arrays of micro-bumps or micro-pillars may range from 5 to 50 micrometers or from 5 to 20 micrometers or may be smaller than 50, 40 or 30 micrometers; and a space $WB_{sptsv}$ between neighboring two of the first, second, third or fourth type of micro-bumps or micro-pillars 34 aligned with one of the islands or regions 88 of arrays of micro-bumps or micro-pillars may range from 5 to 50 micrometers or from 5 to 20 micrometers or may be smaller than 50, 40 or 30 micrometers. For each of the islands or regions 88 of arrays of micro-bumps or micro-pillars, its first, second, third or fourth type of micro-bumps or micro-pillars 34 may be arranged in multiple columns, such as two columns for an embodiment shown in FIGS. 1H, 4I and 4J, and in multiple rows, such as thirteen rows for an embodiment shown in FIGS. 1H, 4I and 4J; its insulating-material island 14*c* may be aligned with its first, second, third or fourth type of micro-bumps or micro-pillars 34, and multiple of the openings 14*a* in its insulating-material island 14*c* may be arranged under its first, second, third or fourth type of micro-bumps or micro-pillars 34 respectively. The pitch $WB_p$ and space $WB_{sptsv}$ in the y direction between each neighboring two of the first, second, third or fourth type of micro-bumps or micro-pillars 34 aligned with one of the islands or regions 88 of arrays of micro-bumps or micro-pillars may be smaller than the width $W_{sb}$ of the second reserved scribe lines 142 and/or smaller than a first space $WB_{spild}$ between neighboring two of the first, second, third or fourth type of micro-bumps or micro-pillars 34 aligned with neighboring two of the islands or regions 88 of arrays of micro-bumps or micro-pillars respectively and across one of the second reserved scribe lines 142 between said neighboring two of the islands or regions 88 of arrays of micro-bumps or micro-pillars. The first space $WB_{spild}$ or a width of the trench **14*b* extending in the x direction between neighboring two of the insulating-material islands 14*c* may be greater than 50, 40 or 30 micrometers. The first space $WB_{spild}$ may be greater than the width $W_{sb}$ of the second reserved scribe lines 142 or greater than the width $W_{sb}$ of the second reserved scribe lines 142 plus two times of a predetermined space $WB_{sbt}$ in the y direction between one of the second reserved scribe lines 142 and one of the first, second, third or fourth type of micro-bumps or micro-pillars 34 adjacent to said one of the second reserved scribe lines 142. The pitch $WB_p$ and space $WB_{sptsv}$ in the x direction between each neighboring two of the first, second, third or fourth type of micro-bumps or micro-pillars 34 aligned with one of the islands or regions 88 of arrays of micro-bumps or micro-pillars may be smaller than the width $W_{sb}$ of the first reserved scribe lines 141 and/or smaller than a second space $WB_{spild}$ between neighboring two of the first, second, third or fourth type of micro-bumps or micro-pillars 34 aligned with neighboring two of the islands or regions 88 of arrays of micro-bumps or micro-pillars respectively and across one of the first reserved scribe lines 141 between said neighboring two of the islands or regions 88 of arrays of micro-bumps or micro-pillars. The second space $WB_{spild}$ or a width of the trench 14*b* extending in the x direction between neighboring two of the insulating-material islands 14*c* may be greater than 50, 40 or 30 micrometers. The second space $WB_{spild}$ may be greater than or equal to the width $W_{sb}$ of the first reserved scribe lines 141 or greater than or equal to the width $W_{sb}$ of the first reserved scribe lines 141 plus two times of a predetermined space $WB_{sbt}$ in the x direction between one of the first reserved scribe lines 141 and one of the first, second, third or fourth type of micro-bumps or micro-pillars 34 adjacent to said one of the first reserved scribe lines 141**.

For the third case, referring to FIGS. 1K, 4K and 4L, a pitch $WB_p$ between each neighboring two of the first, second, third or fourth type of micro-bumps or micro-pillars 34 may range from 5 to 50 micrometers or from 5 to 20 micrometers or may be smaller than 50, 40 or 30 micrometers; and a space $WB_{sptsv}$ between neighboring two of the first, second, third or fourth type of micro-bumps or micro-pillars 34 may range from 5 to 50 micrometers or from 5 to 20 micrometers or may be smaller than 50, 40 or 30 micrometers. Each of the first reserved scribe lines 141 may extend in line with multiple of the first, second, third or fourth type of micro-bumps or micro-pillars 34 arranged in a line in the y direction. Each of the second reserved scribe lines 142 may extend in line with multiple of the first, second, third or fourth type of micro-bumps or micro-pillars 34 arranged in a line in the x direction. Accordingly, the pitch $WB_p$ and space $WB_{sptsv}$ in the y direction between each neighboring two of the first, second, third or fourth type of micro-bumps or micro-pillars 34 may be smaller than the width $W_{sb}$ of the second reserved scribe lines 142 or smaller than the width $W_{sb}$ of the second reserved scribe lines 142 plus two times of a predetermined space $W_{sbt}$ between one of the second reserved scribe lines 142 and one of the first, second, third or fourth type of micro-bumps or micro-pillars 34 adjacent to said one of the second reserved scribe lines 142. The pitch $WB_p$ and space $WB_{sptsv}$ in the x direction between each neighboring two of the first, second, third or fourth type of micro-bumps or micro-pillars 34 may be smaller than the width $W_{sb}$ of the first reserved scribe lines 141 or smaller than the width $W_{sb}$ of the first reserved scribe lines 141 plus two times of a predetermined space $WB_{sbt}$ between one of the first reserved scribe lines 141 and one of the first, second, third or fourth type of micro-bumps or micro-pillars 34 adjacent to said one of the first reserved scribe lines 141.

The first type of vertical-through-via (VTV) connector 467 to be processed from the through-silicon-via (TSV) wafer as seen in FIG. 1E, 1H or 1K may have a size to be selected from various sizes after the first, second, third or fourth micro-bumps or micro-pillars 34 are formed. When a size for the first type of vertical-through-via (VTV) connectors 467 is selected or determined, the through-silicon-via (TSV) wafer shown in FIG. 1E, 1H or 1K may be cut or diced along (or through) some or all of the first reserved scribe lines 141 and some or all of the second reserved scribe lines 142 to form a number of the first type of vertical-through-via (VTV) connectors 467 in a single-die type, i.e., through-silicon-via interconnect elevators (TSVIEs), each having the selected or predetermined size, as shown in FIG. 1F, 1I or 1L respectively, by a laser cutting process or by a mechanical cutting process.

The second type of vertical-through-via (VTV) connector 467 to be processed from the through-silicon-via (TSV) wafer as seen in FIG. 1D may have a size to be selected from various sizes after the vertical through vias (VTVs) 358 are formed. When a size for the second type of vertical-through-via (VTV) connectors 467 is selected or determined, the through-silicon-via (TSV) wafer shown in FIG. 1D may be cut or diced along (or through) some or all of the first reserved scribe lines 141 and some or all of the second reserved scribe lines 142 to form a number of the second type of vertical-through-via (VTV) connectors 467 in a single-die type, i.e., through-silicon-via interconnect elevators (TSVIEs), each having the selected or predetermined size, as shown in FIG. 1G, 1J or 1M for the first, second or third case respectively, by a laser cutting process or by a mechanical cutting process.

The aspect ratio of the length to the width for each of the first and second types of vertical-through-via (VTV) connectors 467 may be between 2 and 10, between 4 and 10 or between 2 and 40. Each of the first and second types of vertical-through-via (VTV) connectors 467 may be provided with passive elements, such as capacitors, but without any active device, i.e., transistor, therein. Each of the first and second types of vertical-through-via (VTV) connectors 467 may be manufactured by packaging manufacturing companies or facilities without front-end of line manufacturing capability.

For the first case, referring to FIGS. 1F, 1G, 4A and 4B, for each of the first and second types of vertical-through-via (VTV) connectors 467, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358. Furthermore, referring to FIGS. 1F, 4G and 4H, for the first type of vertical-through-via (VTV) connector 467, the distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers.

For the second case, referring to FIGS. 1I, 1J, 4C and 4D, for each of the first and second types of vertical-through-via (VTV) connectors 467, each of its first and second spaces $W_{spild}$ between neighboring two of its vertical through vias (VTVs) 358 and across one of its first and second reserved scribe lines 141 and 142 between said neighboring two of its vertical through vias (VTVs) 358 may be greater than 50 or 40 micrometers, and the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358. Furthermore, referring to FIGS. 1I, 4I and 4J, the first type of vertical-through-via (VTV) connector 467 may include the insulating-material islands 14*c* having the trench 14*b* therebetween having a width greater than 50 or 40 micrometers; each of its first and second spaces $WB_{spild}$ between neighboring two of its first, second, third or fourth type of micro-bumps or micro-pillars 34 and across one of its first and second reserved scribe lines 141 and 142 between said neighboring two of its first, second, third or fourth type of micro-bumps or micro-pillars 34 may be greater than 50, 40 or 30 micrometers; the distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers.

For the third case, referring to FIGS. 1L, 1M, 4E and 4F, for each of the first and second types of vertical-through-via (VTV) connectors 467, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358, wherein the space $W_{sptsv}$ between neighboring two of its vertical through vias (VTVs) 358 may be smaller than 50, 40 or 30 micrometers. Furthermore, referring to FIGS. 1L, 4K and 4L, for the first type of vertical-through-via (VTV) connector 467, the distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers; the space $WB_{sptsv}$ between neighboring two of its first, second, third or fourth type of micro-bumps or micro-pillars 34 may be smaller than 50, 40 or 30 micrometers.

For the first case, referring to FIGS. 1F and 1G, each of the first and second types of vertical-through-via (VTV) connectors 467 may be arranged with a size as seen in FIG. 4A for containing 14-by-3 vertical through vias (VTVs) 358 or another size as seen in FIG. 4B for containing 21-by-6 vertical through vias (VTVs) 358, for example. Furthermore, for the first case, referring to FIG. 1F, the first type of vertical-through-via (VTV) connector 467 may be arranged with a size as seen in FIG. 4G for containing 14-by-3 first, second, third or fourth type of micro-bumps or micro-pillars 34 and 14-by-3 insulating-material islands 14*c* or another size as seen in FIG. 4H for containing 21-by-6 first, second, third or fourth type of micro-bumps or micro-pillars 34 and 21-by-6 insulating-material islands 14*c*, for example.

For the second case, referring to FIGS. 1I and 1J, each of the first and second types of vertical-through-via (VTV) connectors 467 may be arranged with a size as seen in FIG. 4C for containing 2-by-2 islands or regions 188 of arrays of vertical through vias (VTVs) 358, each island or region 188 of which contains 13-by-2 vertical through vias (VTVs) 358, or another size as seen in FIG. 4D for containing 3-by-4 islands or regions 188 of arrays of vertical through vias (VTVs) 358, each island or region 188 of which contains 13-by-2 vertical through vias (VTVs) 358, for example. Furthermore, for the second case, referring to FIG. 1I, the first type of vertical-through-via (VTV) connector 467 may be arranged with a size as seen in FIG. 4I for containing 2-by-2 islands or regions 88 of arrays of micro-bumps or micro-pillars, each island or region 88 of which contains 13-by-2 first, second, third or fourth type of micro-bumps or micro-pillars 34, and 2-by-2 insulating-material islands 14*c* or another size as seen in FIG. 4J for containing 3-by-4 islands or regions 88 of arrays of micro-bumps or micro-pillars, each island or region 88 of which contains 13-by-2 first, second, third or fourth type of micro-bumps or micro-pillars 34, and 3-by-4 insulating-material islands 14*c*, for example.

For the third case, referring to FIGS. 1L and 1M, each of the first and second types of vertical-through-via (VTV) connectors 467 may be arranged with a size as seen in FIG. 4E for containing 27-by-5 vertical through vias (VTVs) 358 or another size as seen in FIG. 4F for containing 41-by-11 vertical through vias (VTVs) 358, for example. Furthermore, for the third case, referring to FIG. 1L, the first type of vertical-through-via (VTV) connector 467 may be arranged with a size as seen in FIG. 4K for containing 27-by-5 first, second, third or fourth type of micro-bumps or micro-pillars 34 or another size as seen in FIG. 4L for containing 41-by-11 first, second, third or fourth type of micro-bumps or micro-pillars 34, for example.

Accordingly, for each of the first through third cases, each of the first and second types of vertical-through-via (VTV) connectors 467 may be arranged with a size for containing vertical through vias (VTVs) 358 arranged in an array with M1 row(s) by N1 column(s); furthermore, for each of the first through third cases, the first type of vertical-through-via (VTV) connector 467 may be arranged with a size for containing the first, second, third or fourth type of micro-bumps or micro-pillars 34 arranged in an array with M2 row(s) by N2 column(s), wherein M1, M2, N1 and N2 are integers, M1 is greater than N1 and M2 is greater than N2. For an example, each of the numbers M1 and M2 may be greater than or equal to 50 and smaller than or equal to 500, and each of the numbers N1 and N2 may be greater than or equal to 1 and smaller than or equal to 15. For another example, each of the numbers N1 and N2 may be greater than or equal to 30 and smaller than or equal to 200, and each of the numbers M1 and M2 may be greater than or equal to 1 and smaller than or equal to 10. The standard common through-silicon-via (TSV) wafers as seen in FIG. 1E, 1H or 1K may have a fixed pattern of design and layout for locations of the vertical through vias (VTVs) 358 and first, second, third or fourth type of micro-bumps or micro-pillars 34, and may be cut or diced to form a number of the first type of vertical-through-via (VTV) connectors 467 in a single-die type, i.e., through-silicon-via interconnect elevators (TSVIEs), as seen in FIG. 1F, 1I or 1L, having various dimensions or shapes, various numbers of the vertical through vias (VTVs) 358 and various numbers of the first, second, third or fourth type of micro-bumps or micro-pillars 34. Alternatively, the standard common through-silicon-via (TSV) wafer as seen in FIG. 1D may have a fixed pattern of design and layout for locations of the vertical through vias (VTVs) 358, and may be cut or diced to form a number of the second type of vertical-through-via (VTV) connectors 467 in a single-die type, i.e., through-silicon-via interconnect elevators (TSVIEs), as seen in FIG. 1G, 1J or 1M for the first, second or third case respectively, having various dimensions or shapes, various numbers of the vertical through vias (VTVs) 358.

Figure 2A:
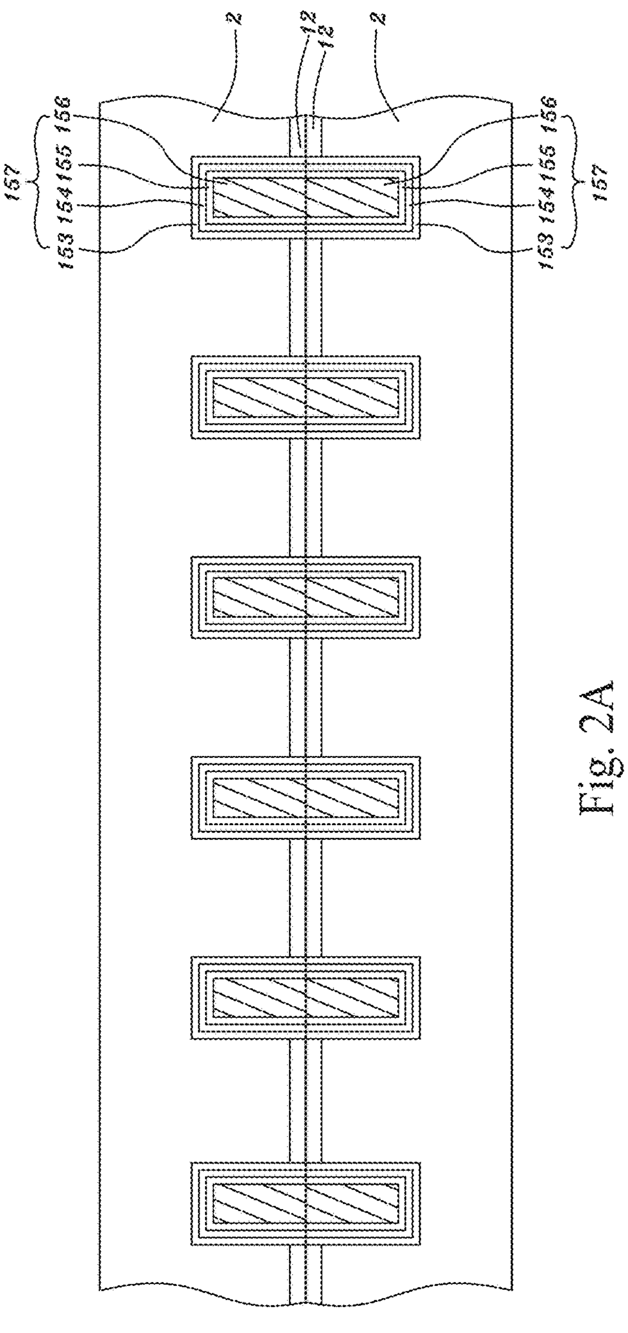
FIGS. 2A-2F are schematically cross-sectional views showing a process for forming first and second types of vertical-through-via (VTV) connectors processed from stacked through-silicon-via (TSV) wafers for the first case in accordance with an embodiment of the present application.

2. First and Second Types of Vertical-Through-Via (VTV) Connectors for Through-Silicon-Via Interconnect Elevators (TSVIEs) Processed from Stacked Through-Silicon-Via (TSV) Wafers FIGS. 2A-2F are schematically cross-sectional views showing a process for forming first and second types of vertical-through-via (VTV) connectors processed from stacked through-silicon-via (TSV) wafers for the first case in accordance with an embodiment of the present application. FIGS. 2G-2I are schematically cross-sectional views showing a process for forming first and second types of vertical-through-via (VTV) connectors processed from stacked through-silicon-via (TSV) wafers for the second case in accordance with an embodiment of the present application. FIGS. 2J-2L are schematically cross-sectional views showing a process for forming first and second types of vertical-through-via (VTV) connectors processed from stacked through-silicon-via (TSV) wafers for the third case in accordance with an embodiment of the present application. Referring to FIG. 2A, a number of through-silicon-via (TSV) wafers each as seen in FIG. 1D may be provided, a second one of which is flipped to be stacked over a first one thereof by (1) activating a joining surface, i.e., silicon oxide, of the insulating dielectric layer 12 of each of the first and second ones of the through-silicon-via (TSV) wafers with nitrogen plasma for increasing hydrophilic property thereof, (2) next rinsing the joining surface of the insulating dielectric layer 12 of each of the first and second ones of the through-silicon-via (TSV) wafers with deionized water for water adsorption and cleaning, (3) next placing the second one of the through-silicon-via (TSV) wafers onto the first one of the through-silicon-via (TSV) wafers with each of the through silicon vias (TSVs) 157 of the second one of the through-silicon-via (TSV) wafers in contact with one of the through silicon vias (TSVs) 157 of the first one of the through-silicon-via (TSV) wafers and with the joining surface of the insulating dielectric layer 12 of the second one of the through-silicon-via (TSV) wafers in contact with the joining surface of the insulating dielectric layer 12 of the first one of the through-silicon-via (TSV) wafers, and (4) next performing a direct bonding process including (a) oxide-to-oxide bonding at a temperature between 100 and 200 degrees Celsius and for a time period between 5 and 20 minutes to bond the joining surface of the insulating dielectric layer 12 of the second one of the through-silicon-via (TSV) wafers to the joining surface of the insulating dielectric layer 12 of the first one of the through-silicon-via (TSV) wafers and (b) copper-to-copper bonding at a temperature between 300 and 350 degrees Celsius and for a time period between 10 and 60 minutes to bond the copper layer 156 of each of the through silicon vias (TSVs) 157 of the second one of the through-silicon-via (TSV) wafers to the copper layer 156 of one of the through silicon vias (TSVs) 157 of the first one of the through-silicon-via (TSV) wafers, wherein the oxide-to-oxide bonding may be caused by water desorption from reaction between the joining surface of the insulating dielectric layer 12 of the second one of the through-silicon-via (TSV) wafers and the joining surface of the insulating dielectric layer 12 of the first one of the through-silicon-via (TSV) wafers, and the copper-to-copper bonding may be caused by metal inter-diffusion between the copper layer 156 of each of the through silicon vias (TSVs) 157 of the second one of the through-silicon-via (TSV) wafers and the copper layer 156 of one of the through silicon vias (TSVs) 157 of the first one of the through-silicon-via (TSV) wafers.

Figure 2B:
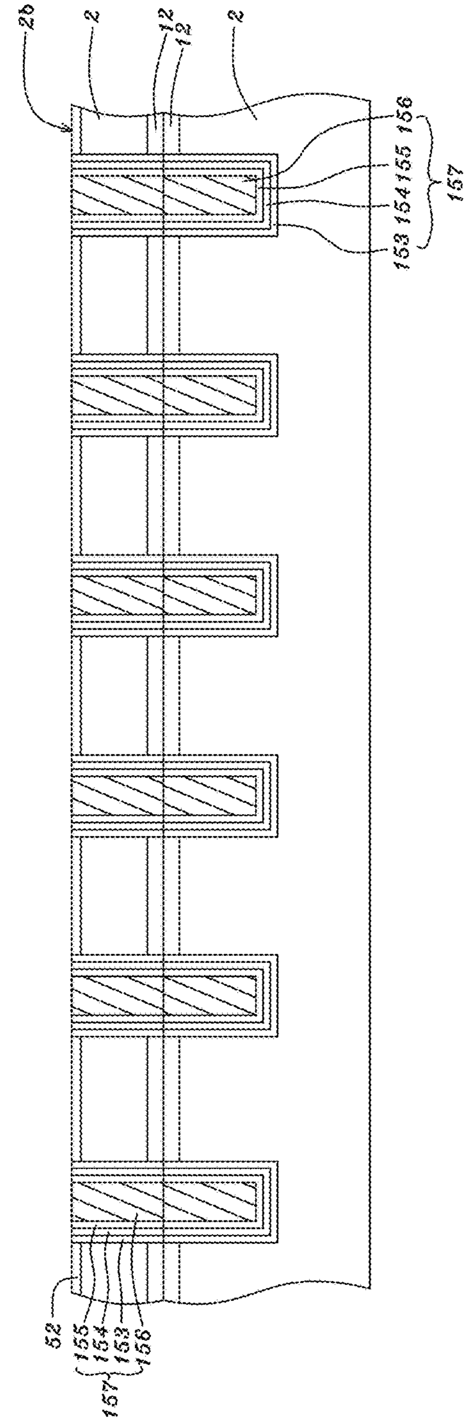

Next, referring to FIG. 2B, the semiconductor substrate 2 of the second one of the through-silicon-via (TSV) wafers at the top side thereof has a backside to be polished by a chemically-mechanically polishing (CMP) process or a wafer backside grinding process until each of the through silicon vias (TSVs) 157 of the second one of the through-silicon-via (TSV) wafers is exposed. For each of the through silicon vias (TSVs) 157 of the second one of the through-silicon-via (TSV) wafers, its insulating lining layer 153, adhesion layer 154 and seed layer 155 at its backside are removed to expose a backside of its copper layer 156. Each of the through silicon vias (TSVs) 157 of each of the first and second ones of the through-silicon-via (TSV) wafers may have a depth between 30 μm and 2,000 μm and a diameter or largest transverse dimension between 2 μm and 20 μm or between 4 μm and 10 μm. A pitch between neighboring two of the through silicon vias (TSVs) 157 of each of the first and second ones of the through-silicon-via (TSV) wafers may range from 5 to 50 micrometers or from 5 to 20 micrometers or may be smaller than 50, 40 or 30 micrometers. Next, a top portion of the semiconductor substrate 2 of the second one of the through-silicon-via (TSV) wafers at the backside thereof may be removed by an etching process to form a recess from the backside of the copper layer 156 of each of the through silicon vias (TSVs) 157 of the second one of the through-silicon-via (TSV) wafers. Next, an insulating bonding layer 52 may be formed on the backside of the semiconductor substrate 2 of the second one of the through-silicon-via (TSV) wafers and a backside of the copper layer 156 of each of the through silicon vias (TSVs) 157 of the second one of the through-silicon-via (TSV) wafers. Next, a chemical-mechanical polishing (CMP) process may be applied to remove the insulating bonding layer 52 on the backside of the copper layer 156 of each of the through silicon vias (TSVs) 157 of the second one of the through-silicon-via (TSV) wafers until the backside of the copper layer 156 of each of the through silicon vias (TSVs) 157 of the second one of the through-silicon-via (TSV) wafers is exposed. Thus, for the second one of the through-silicon-via (TSV) wafers, its insulating bonding layer 52 may have a top surface substantially coplanar with the backside of the copper layer 156 of each of its through silicon vias (TSVs) 157 and have a thickness between 1 and 1,000 nanometers.

Figure 2C:
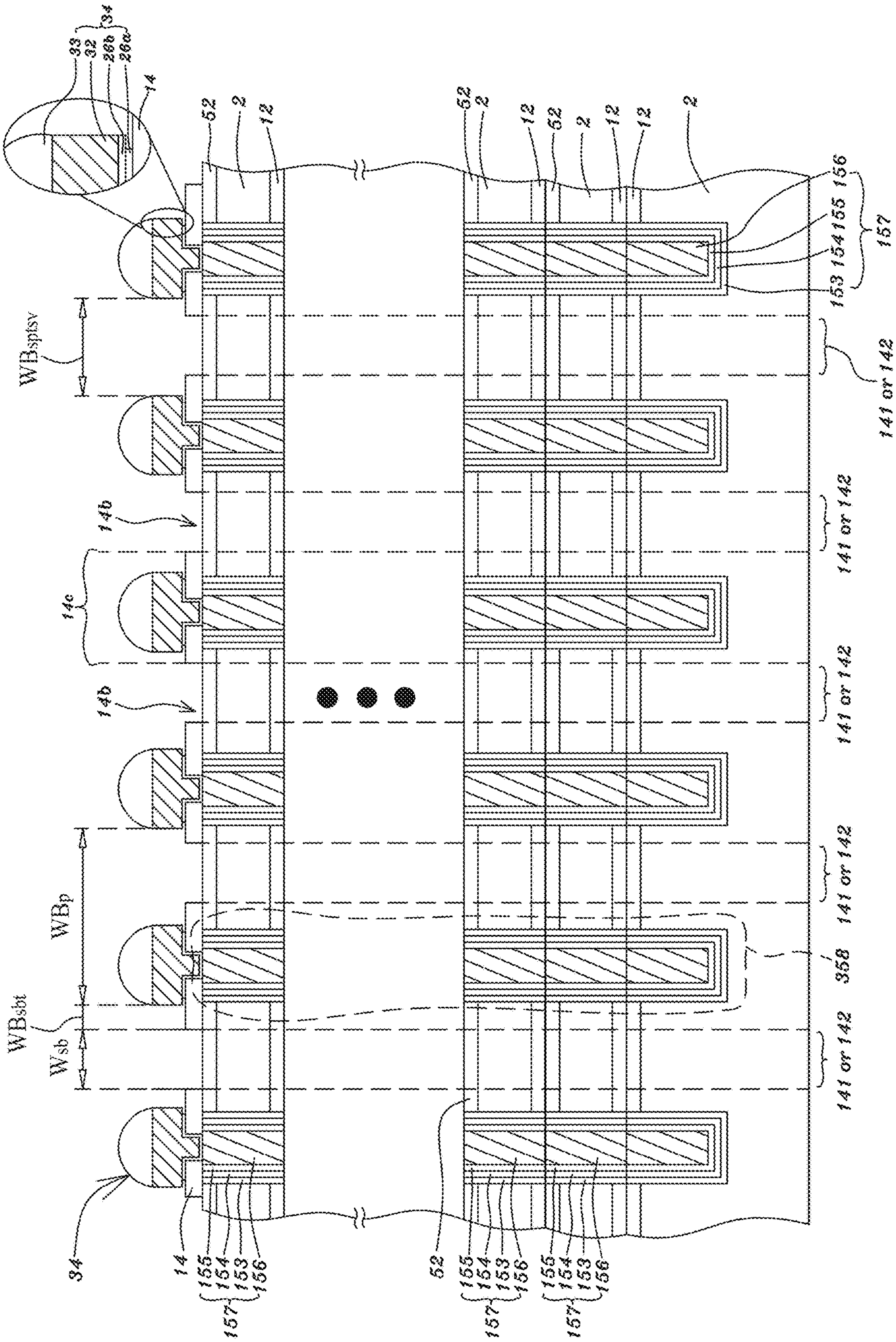

Next, referring to FIG. 2C, a third one of the through-silicon-via (TSV) wafers as seen in FIG. 1D may be flipped to be stacked over the second one of the through-silicon-via (TSV) wafers by (1) activating a joining surface, i.e., silicon oxide, of the insulating dielectric layer 12 of the third one of the through-silicon-via (TSV) wafers and a joining surface, i.e., silicon oxide, of the insulating bonding layer 52 on the semiconductor substrate 2 of the second one of the through-silicon-via (TSV) wafers with nitrogen plasma for increasing hydrophilic property thereof, (2) next rinsing the joining surface of the insulating dielectric layer 12 of the third one of the of the second one of the through-silicon-via (TSV) wafers and the joining surface, i.e., silicon oxide, of the insulating bonding layer 52 on the semiconductor substrate 2 of the second one of the through-silicon-via (TSV) wafers with deionized water for water adsorption and cleaning, (3) next placing the third one of the through-silicon-via (TSV) wafers onto the insulating bonding layer 52 on the semiconductor substrate 2 of the second one of the through-silicon-via (TSV) wafers with each of the through silicon vias (TSVs) 157 of the third one of the through-silicon-via (TSV) wafers in contact with one of the through silicon vias (TSVs) 157 of the second one of the through-silicon-via (TSV) wafers and with the joining surface of the insulating dielectric layer 12 of the third one of the through-silicon-via (TSV) wafers in contact with the joining surface of the insulating bonding layer 52 on the semiconductor substrate 2 of the second one of the through-silicon-via (TSV) wafers, and (4) next performing a direct bonding process including (a) oxide-to-oxide bonding at a temperature between 100 and 200 degrees Celsius and for a time period between 5 and 20 minutes to bond the joining surface of the insulating dielectric layer 12 of the third one of the through-silicon-via (TSV) wafers, i.e., at the upper side, to the joining surface of the insulating bonding layer 52 on the semiconductor substrate 2 of the second one of the through-silicon-via (TSV) wafers, and (b) copper-to-copper bonding at a temperature between 300 and 350 degrees Celsius and for a time period between 10 and 60 minutes to bond the copper layer 156 of each of the through silicon vias (TSVs) 157 of the third one of the through-silicon-via (TSV) wafers to the backside of the copper layer 156 of one of the through silicon vias (TSVs) 157 of the second one of the through-silicon-via (TSV) wafers, wherein the oxide-to-oxide bonding may be caused by water desorption from reaction between the joining surface of the insulating dielectric layer 12 of the third one of the through-silicon-via (TSV) wafers and the joining surface of the insulating bonding layer 52 on the semiconductor substrate 2 of the second one of the through-silicon-via (TSV) wafers, and the copper-to-copper bonding may be caused by metal inter-diffusion between the copper layer 156 of each of the through silicon vias (TSVs) 157 of the third one of the through-silicon-via (TSV) wafers, i.e., at the upper side, and the copper layer 156 of one of the through silicon vias (TSVs) 157 of the second one of the through-silicon-via (TSV) wafers.

Next, the semiconductor substrate 2 of the third one of the through-silicon-via (TSV) wafers at the top side thereof has a backside 2*b* to be polished by a chemically-mechanically polishing (CMP) process or a wafer backside grinding process until each of the through silicon vias (TSVs) 157 of the third one of the through-silicon-via (TSV) wafers is exposed. For each of the through silicon vias (TSVs) 157 of the third one of the through-silicon-via (TSV) wafers, its insulating lining layer 153, adhesion layer 154 and seed layer 155 at its backside are removed to expose a backside of its copper layer 156. The specification for the through silicon vias (TSVs) 157 of the third one of the through-silicon-via (TSV) wafers may be referred to that for the through silicon vias (TSVs) 157 of the second one of the through-silicon-via (TSV) wafers as illustrated in FIG. 2B. Next, a top portion of the semiconductor substrate 2 of the third one of the through-silicon-via (TSV) wafers at the backside thereof may be removed by an etching process to form a recess from the backside of the copper layer 156 of each of the through silicon vias (TSVs) 157 of the third one of the through-silicon-via (TSV) wafers. Next, an insulating bonding layer 52 may be formed on the backside of the semiconductor substrate 2 of the third one of the through-silicon-via (TSV) wafers and a backside of the copper layer 156 of each of the through silicon vias (TSVs) 157 of the third one of the through-silicon-via (TSV) wafers. Next, a chemical-mechanical polishing (CMP) process may be applied to remove the insulating bonding layer 52 on the backside of the copper layer 156 of each of the through silicon vias (TSVs) 157 of the third one of the through-silicon-via (TSV) wafers until the backside of the copper layer 156 of each of the through silicon vias (TSVs) 157 of the third one of the through-silicon-via (TSV) wafers is exposed. Thus, for the third one of the through-silicon-via (TSV) wafers, its insulating bonding layer 52 may have a top surface substantially coplanar with the backside of the copper layer 156 of each of its through silicon vias (TSVs) 157. The specification for the insulating bonding layer 52 on the backside of the semiconductor substrate 2 of the third one of the through-silicon-via (TSV) wafers may be referred to that for the insulating bonding layer 52 on the backside of the semiconductor substrate 2 of the second one of the through-silicon-via (TSV) wafers as illustrated in FIG. 2B.

The step for flipping another of the through-silicon-via (TSV) wafers as seen in FIG. 1D to be stacked over the topmost one of the through-silicon-via (TSV) wafers stacked in the previous steps, as mentioned in FIGS. 2A-2C, may be repeated one or more times to form stacked through-silicon-via (TSV) wafers as seen in FIG. 2C. Referring to FIG. 2C, the semiconductor substrate 2 of a last one of the stacked through-silicon-via (TSV) wafers at the top side thereof has a backside 2*b* to be polished by a chemically-mechanically polishing (CMP) process or a wafer backside grinding process until each of the through silicon vias (TSVs) 157 of the last one of the stacked through-silicon-via (TSV) wafers is exposed. For each of the through silicon vias (TSVs) 157 of the last one of the stacked through-silicon-via (TSV) wafers, its insulating lining layer 153, adhesion layer 154 and seed layer 155 at its backside are removed to expose a backside of its copper layer 156. Its copper layer 156 may have a backside coplanar with the backside 2*b* of the semiconductor substrate 2 of the last one of the stacked through-silicon-via (TSV) wafers. The specification for the through silicon vias (TSVs) 157 of the last one of the stacked through-silicon-via (TSV) wafers may be referred to that for the through silicon vias (TSVs) 157 of the second one of the through-silicon-via (TSV) wafers as illustrated in FIG. 2B. Thereby, multiple of the through silicon vias (TSVs) 157 may be stacked with each other or one another to form a vertical through via (VTV) 358 for a dedicated vertical path, wherein an upper one of said multiple of the through silicon vias (TSVs) 157 may be stacked with a lower one of said multiple of the through silicon vias (TSVs) 157 directly.

Figure 2D:
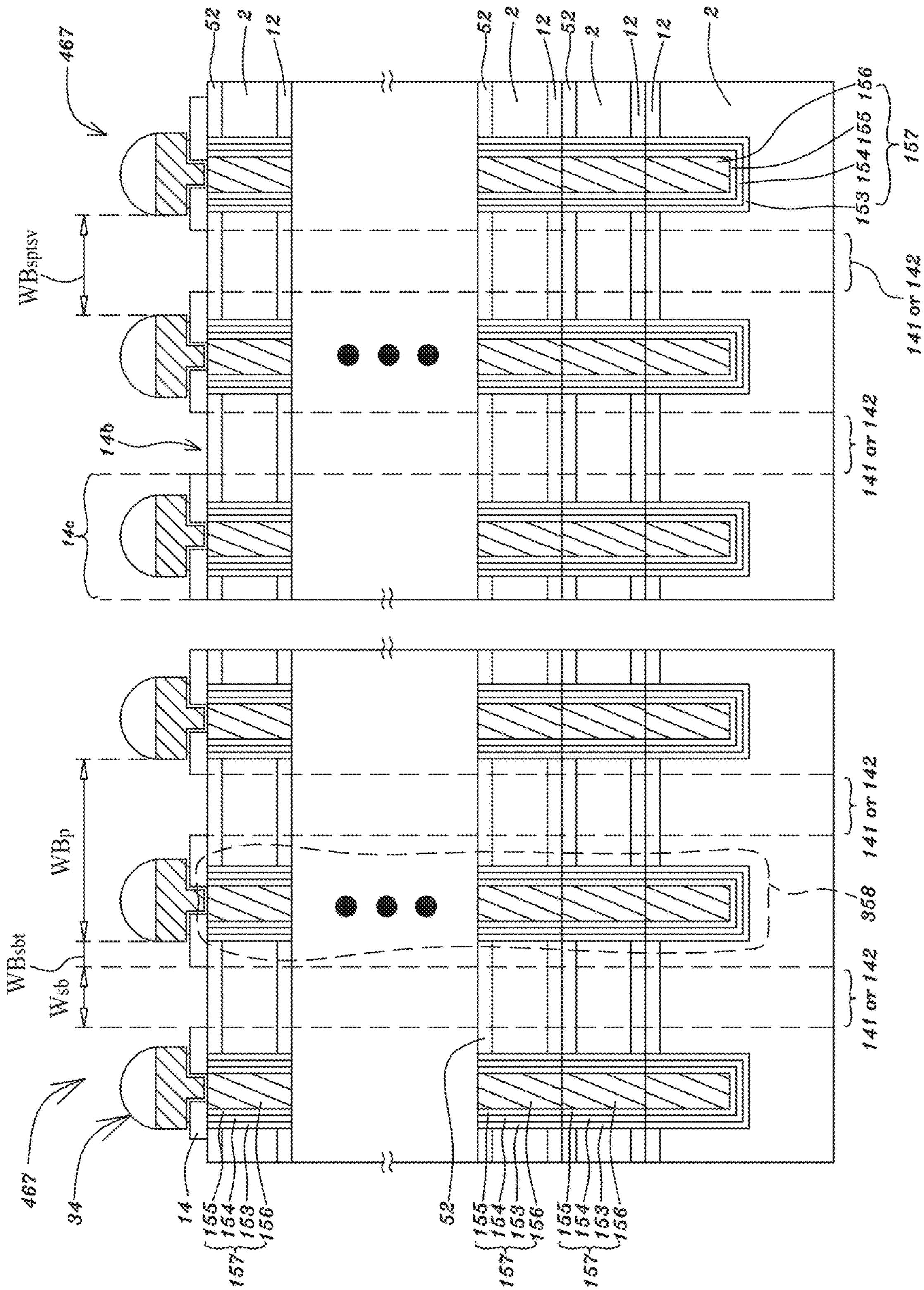

Next, for forming a first type of vertical-through-via (VTV) connector as seen in FIG. 2D, referring to FIG. 2C, a passivation layer 14 may be formed on the backside 2*b* of the semiconductor substrate 2 of the last one of the stacked through-silicon-via (TSV) wafers. The specification for the passivation layer 14 herein may be referred to that as illustrated in FIG. 1E. Next, multiple openings 14*a* may be formed in the passivation layer 14 and each of the openings 14*a* may expose the backside of the copper layer 156 of one of the through silicon vias (TSVs) 157 of the last one of the stacked through-silicon-via (TSV) wafers. The specification for the openings 14*a* in the passivation layer 14 herein may be referred to that as illustrated in FIG. 1E. Next, for forming the first type of vertical-through-via (VTV) connector as seen in FIG. 2D, a micro-bump or micro-pillar 34, which may be of one of the first through fourth types having the same specifications as the first through fourth types of micro-bumps or micro-pillars 34 as illustrated in FIG. 1E respectively, may be formed on the backside of the copper layer 156 of each of the through silicon vias (TSVs) 157 of the last one of the stacked through-silicon-via (TSV) wafers.

Figure 2E:
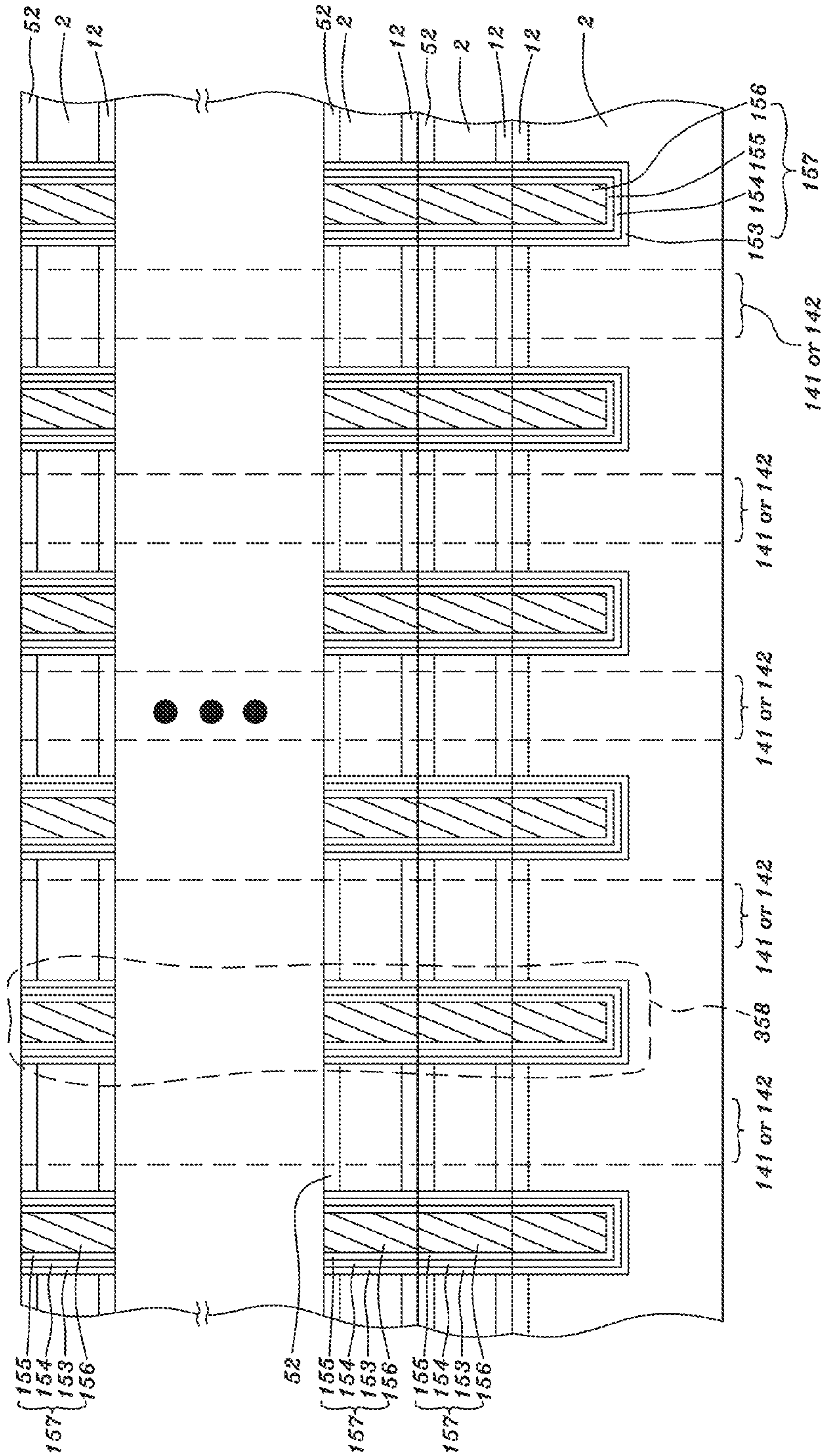
Figure 2F:
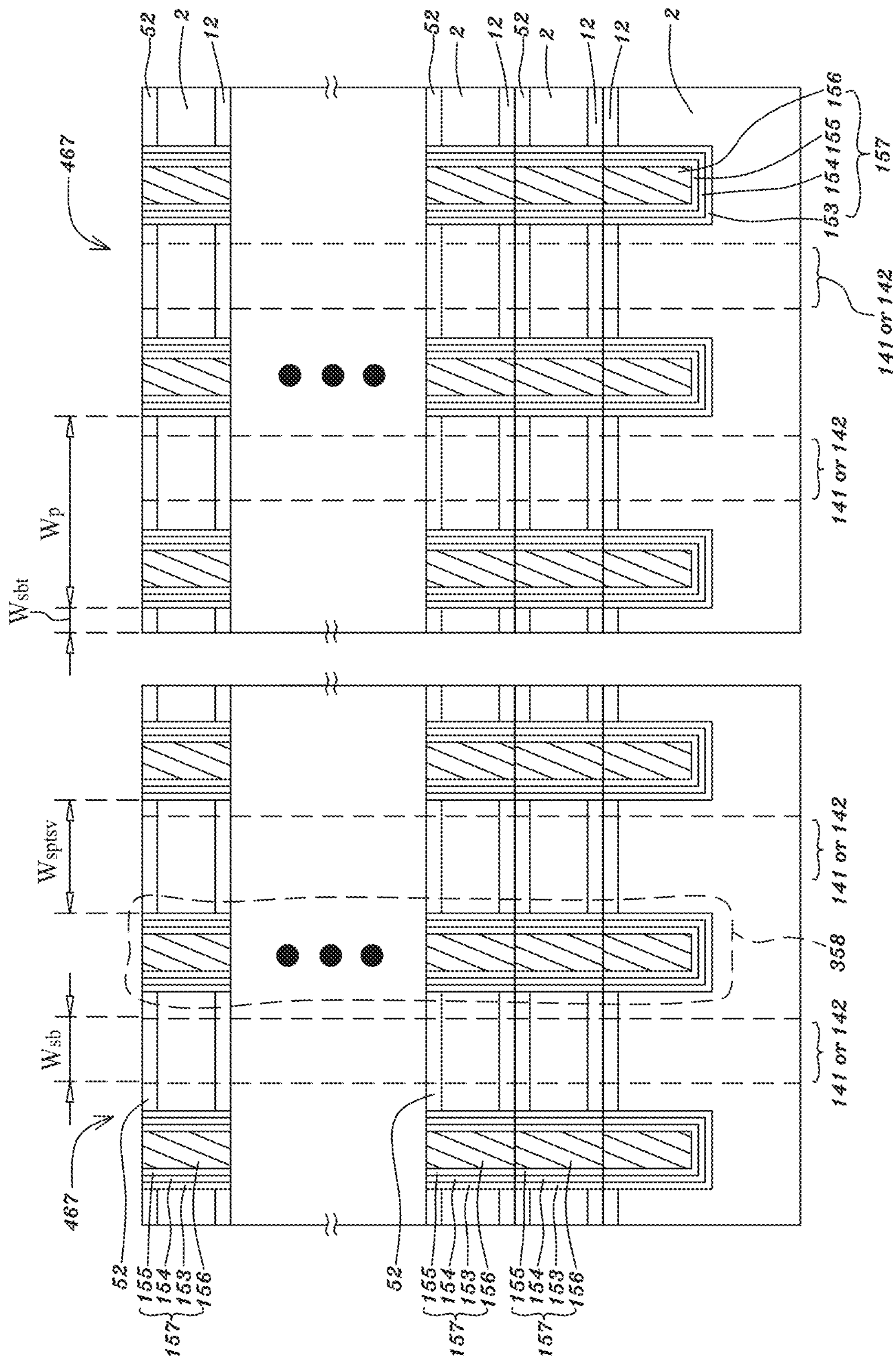
Figure 2G:
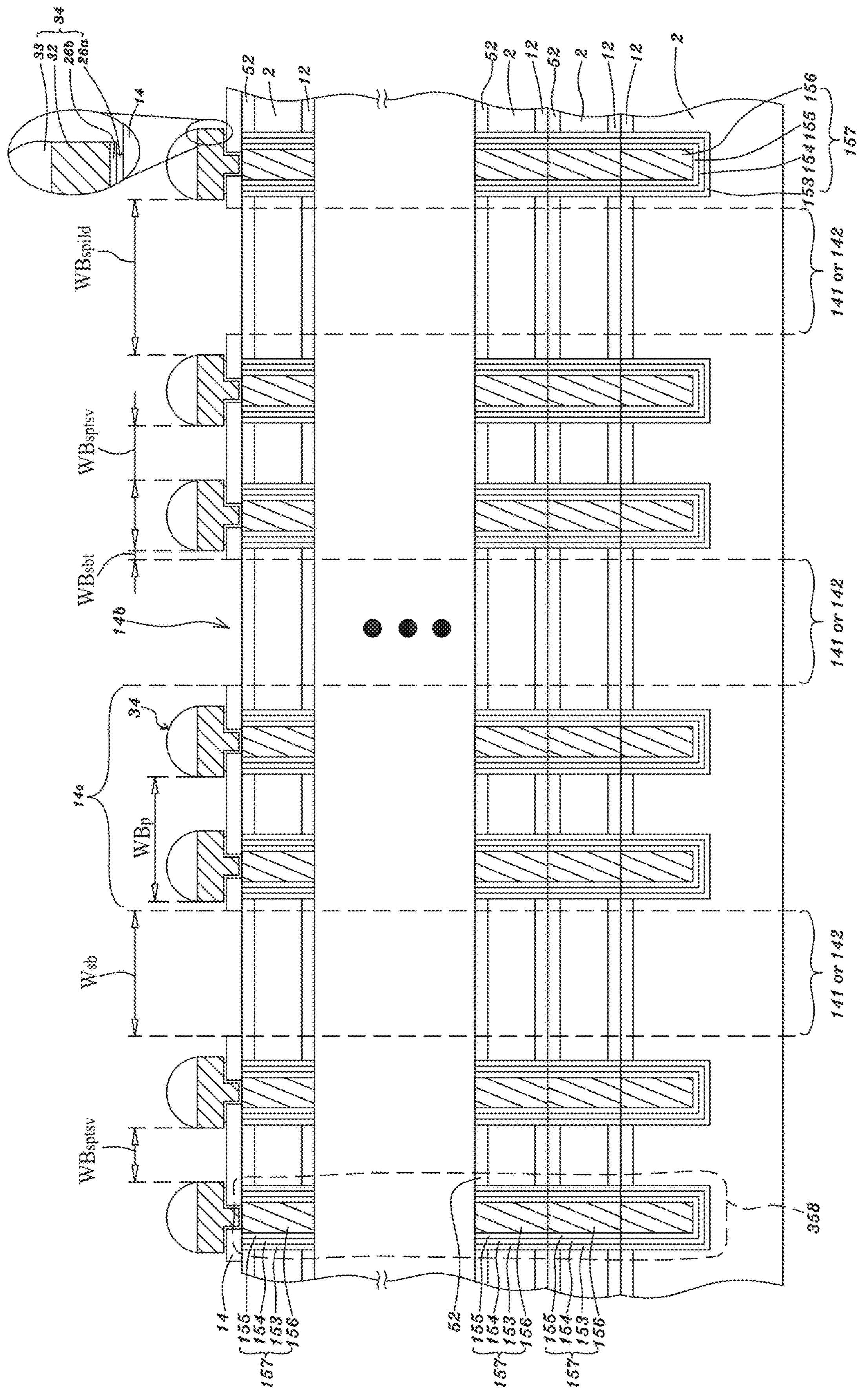
FIGS. 2G-2I are schematically cross-sectional views showing a process for forming first and second types of vertical-through-via (VTV) connectors processed from stacked through-silicon-via (TSV) wafers for the second case in accordance with an embodiment of the present application.
Figure 2H:
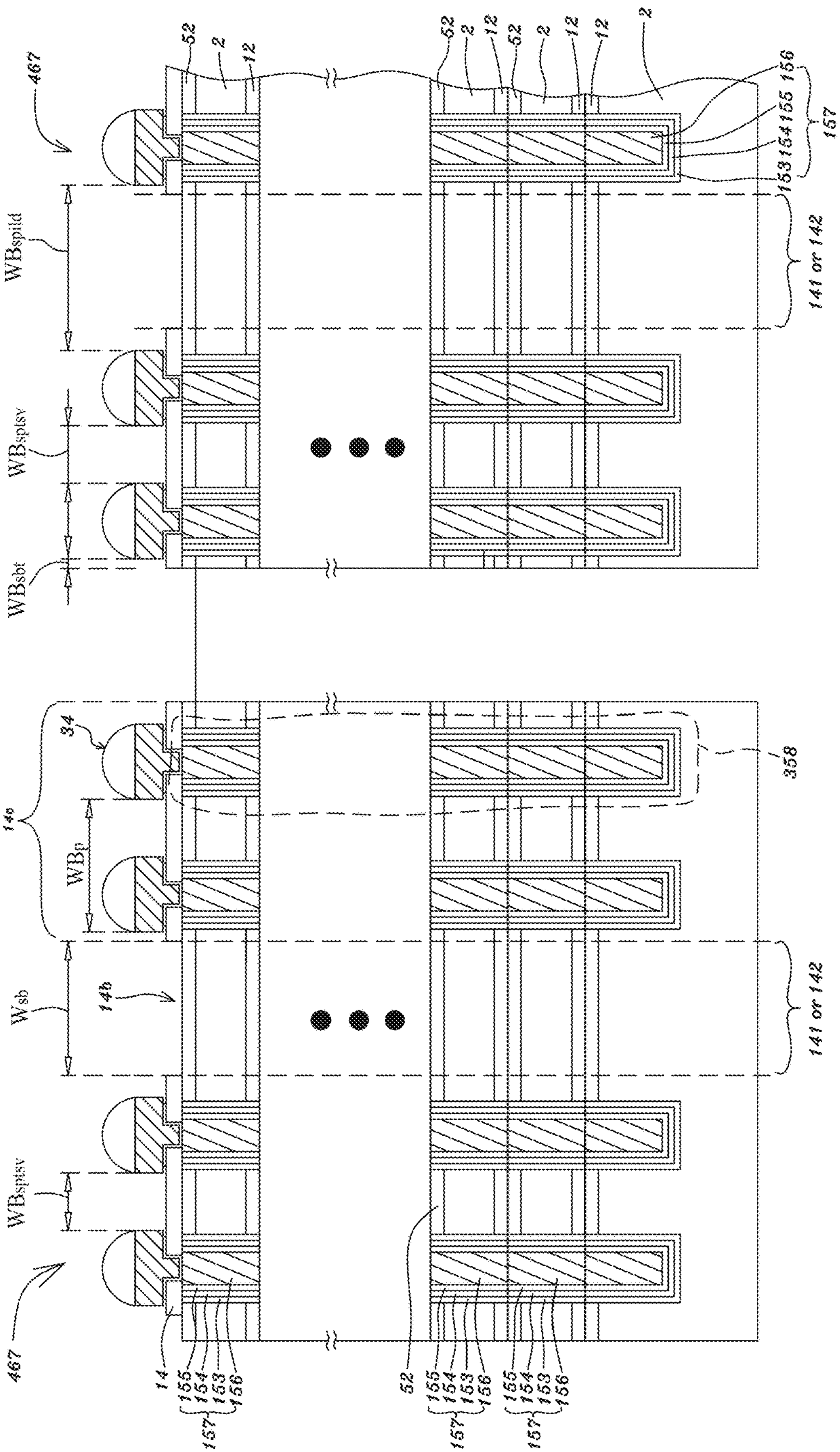
Figure 2I:
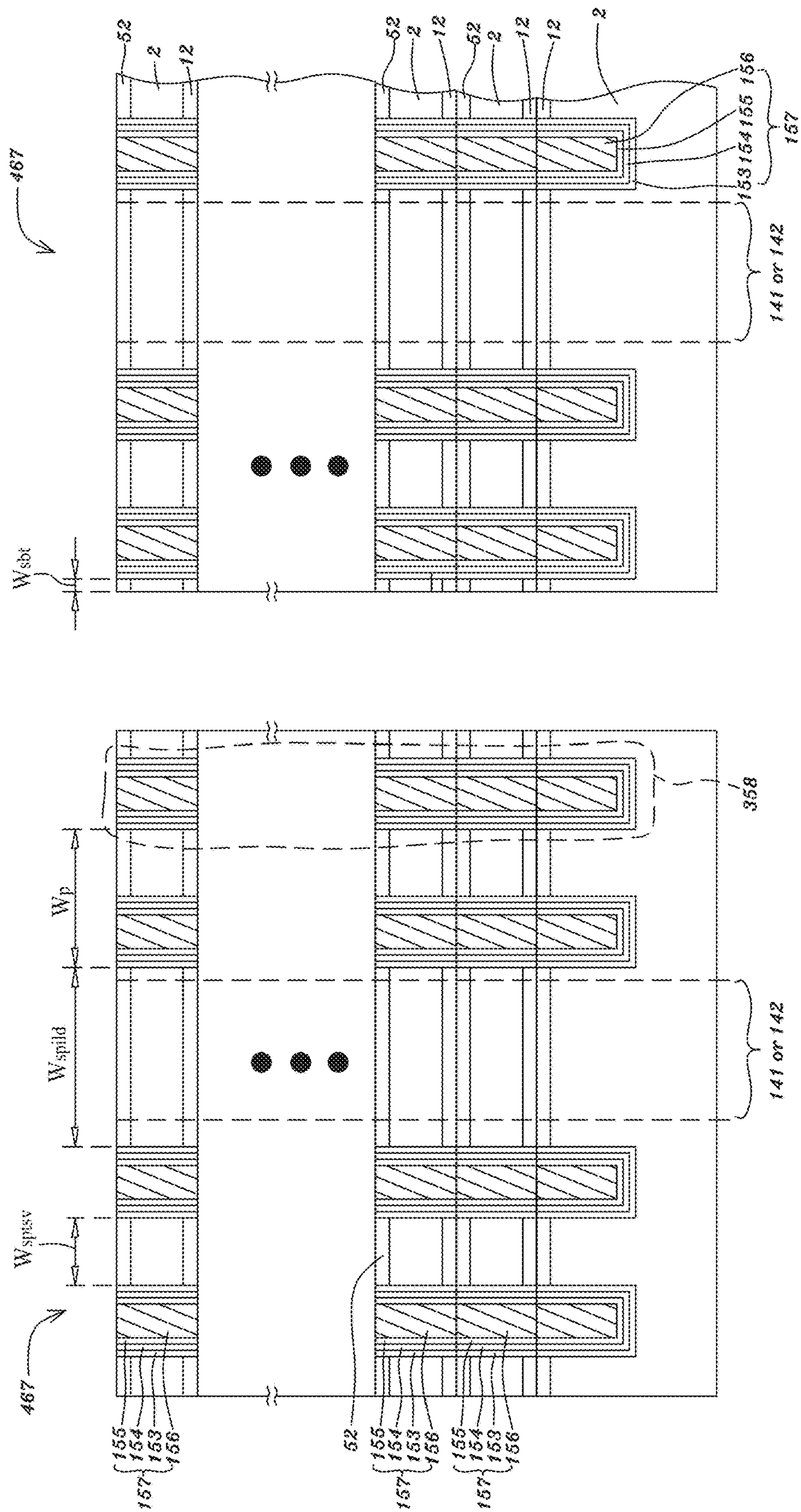
Figure 2J:
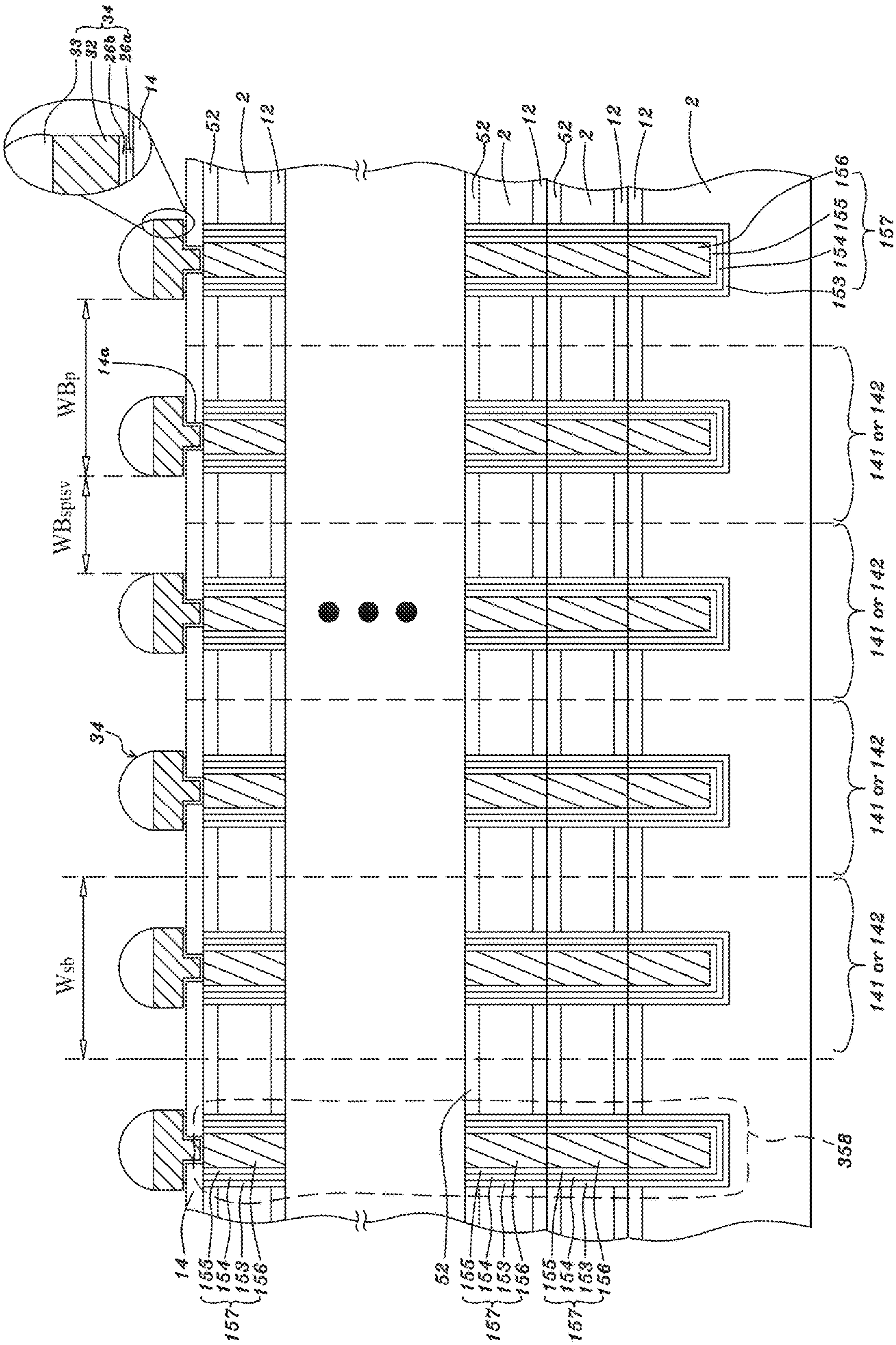
FIGS. 2J-2L are schematically cross-sectional views showing a process for forming first and second types of vertical-through-via (VTV) connectors processed from stacked through-silicon-via (TSV) wafers for the third case in accordance with an embodiment of the present application.
Figure 2K:
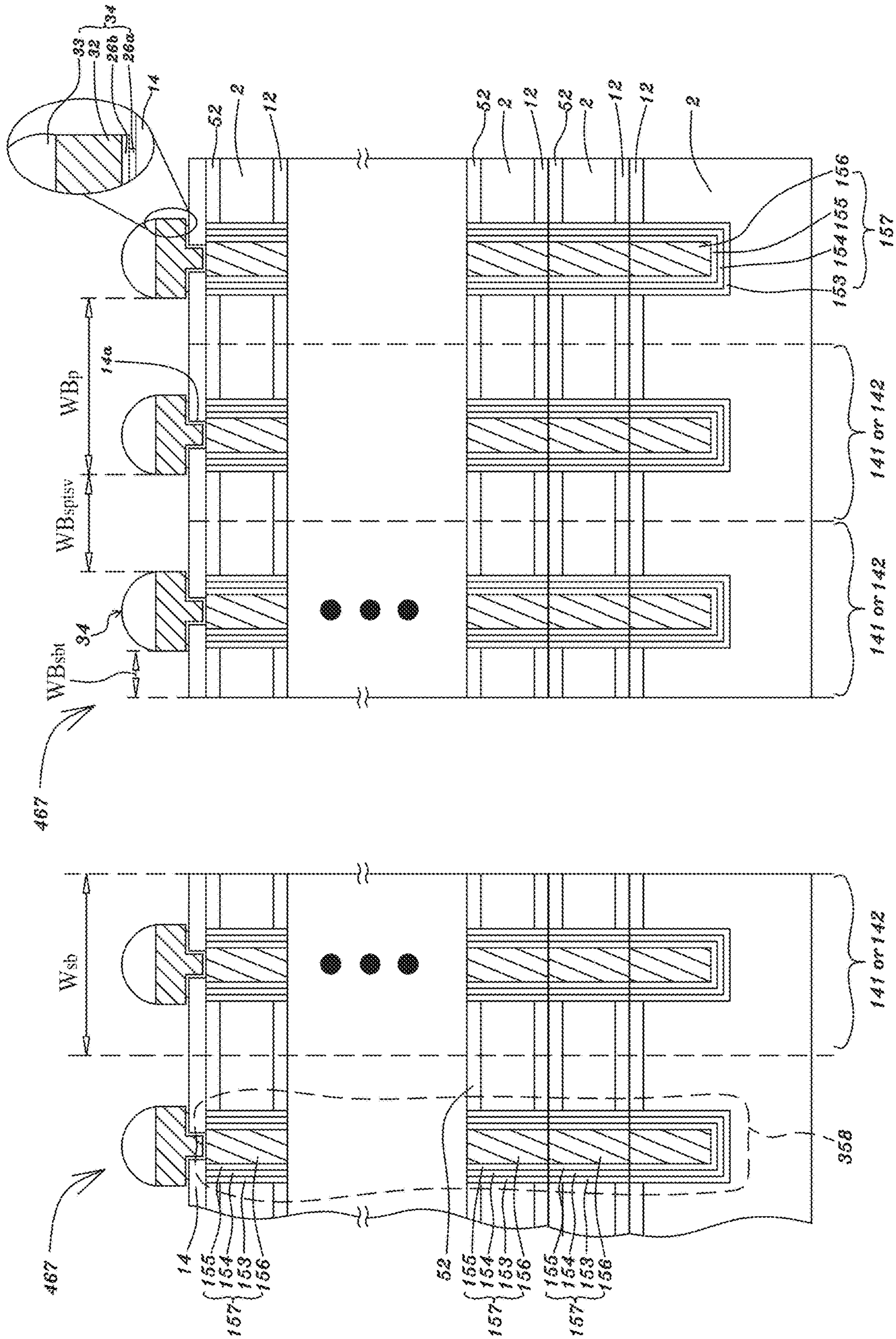
Figure 2L:
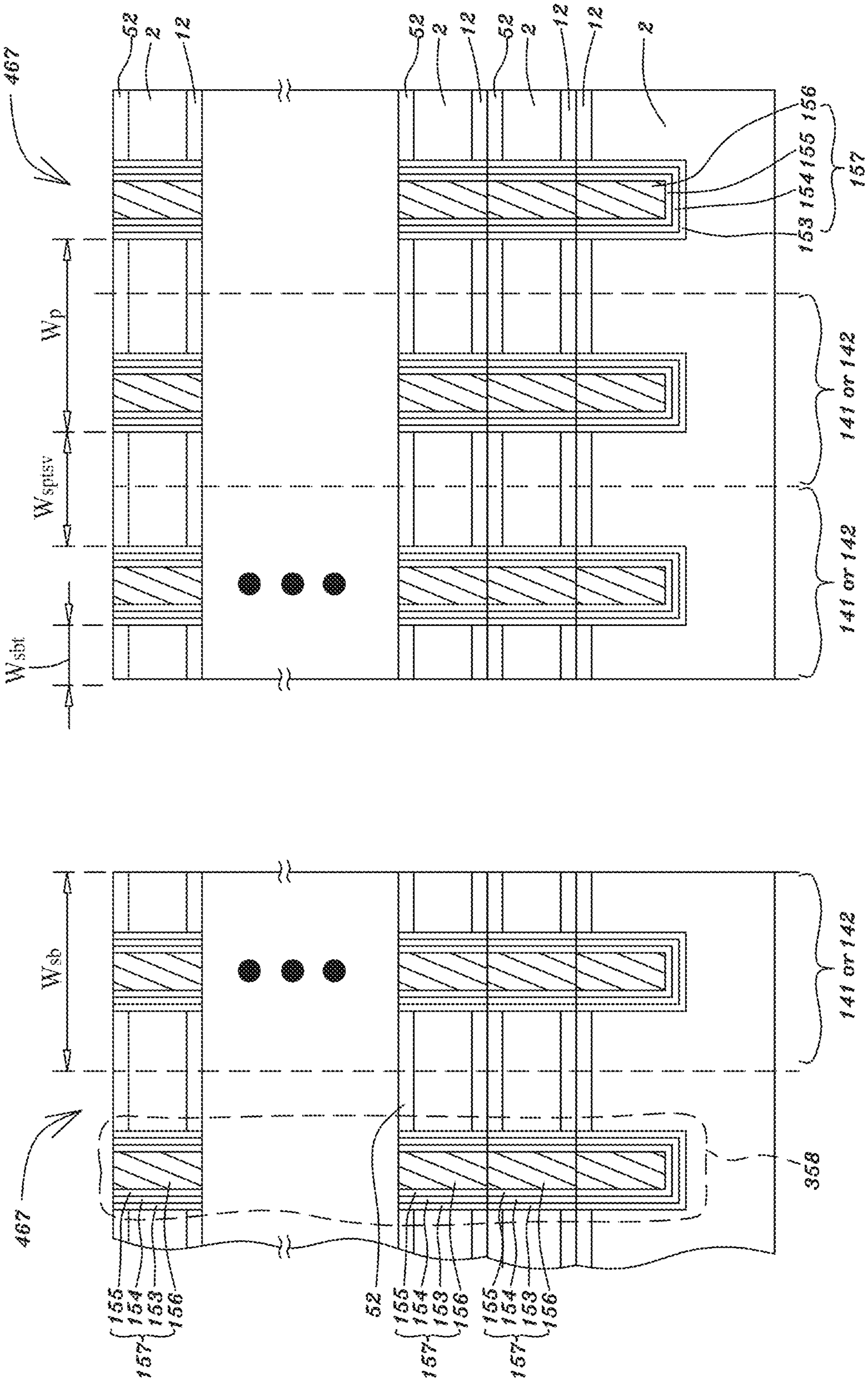

Alternatively, for forming a second type of vertical-through-via (VTV) connector as seen in FIG. 2F, none of the passivation layer 14 and micro-bumps or micro-pillars 34 as illustrated in FIG. 2C may be formed. Referring to FIG. 2E, after the vertical through vias (VTV) 358 are formed as illustrated in FIG. 2C, a top portion of the semiconductor substrate 2 of the last one of the stacked through-silicon-via (TSV) wafers at the backside thereof may be removed by an etching process to form a recess from the backside of the copper layer 156 of each of the through silicon vias (TSVs) 157 of the last one of the stacked through-silicon-via (TSV) wafers. Next, an insulating bonding layer 52 may be formed on the backside of the semiconductor substrate 2 of the last one of the stacked through-silicon-via (TSV) wafers and a backside of the copper layer 156 of each of the through silicon vias (TSVs) 157 of the last one of the stacked through-silicon-via (TSV) wafers. Next, a chemical-mechanical polishing (CMP) process may be applied to remove the insulating bonding layer 52 on the backside of the copper layer 156 of each of the through silicon vias (TSVs) 157 of the last one of the stacked through-silicon-via (TSV) wafers until the backside of the copper layer 156 of each of the through silicon vias (TSVs) 157 of the last one of the stacked through-silicon-via (TSV) wafers is exposed. Thus, for the last one of the stacked through-silicon-via (TSV) wafers, its insulating bonding layer 52 may have a top surface substantially coplanar with the backside of the copper layer 156 of each of its through silicon vias (TSVs) 157. The specification for the insulating bonding layer 52 on the backside of the semiconductor substrate 2 of the third one of the through-silicon-via (TSV) wafers may be referred to that for the insulating bonding layer 52 on the backside of the semiconductor substrate 2 of the second one of the through-silicon-via (TSV) wafers as illustrated in FIG. 2B.

Referring to FIGS. 2C-2F for the first case, the arrangements for the vertical through vias (VTVs) 358 for each of the first and second types of vertical-through-via (VTV) connectors may be the same as those as illustrated in FIGS. 1E-1G, 4A and 4B. The arrangements for the trenches 14*b*, insulating-material islands 14*c* and first, second, third or fourth type of micro-bumps or micro-pillars 34 for the first type of vertical-through-via (VTV) connector may be the same as those as illustrated in FIGS. 1E, 1F, 4G and 4H.

Alternatively, referring to FIGS. 2G-2I for the second case, the arrangements for the vertical through vias (VTVs) 358 and islands or regions 188 of arrays of vertical through vias (VTVs) for each of the first and second types of vertical-through-via (VTV) connectors may be the same as those as illustrated in FIGS. 1H-1J. The arrangements for the islands or regions of arrays 88 of micro-bumps or micro-pillars, trenches 14*b*, insulating-material islands 14*c* and first, second, third or fourth type of micro-bumps or micro-pillars 34 for the first type of vertical-through-via (VTV) connector may be the same as those as illustrated in FIGS. 1H, 1I, 4I and 4J.

Alternatively, referring to FIGS. 2J-2L for the third case, the arrangements for the vertical through vias (VTVs) 358 for each of the first and second types of vertical-through-via (VTV) connectors may be the same as those as illustrated in FIGS. 1K-1M, 4E and 4F. The arrangements for the first, second, third or fourth type of micro-bumps or micro-pillars 34 for the first type of vertical-through-via (VTV) connector may be the same as those as illustrated in FIGS. 1K, 1L, 4K and 4L.

The first type of vertical-through-via (VTV) connector 467 to be processed from the stacked through-silicon-via (TSV) wafers as seen in FIG. 2C, 2G or 2J may have a size to be selected from various sizes after the first, second, third or fourth micro-bumps or micro-pillars 34 are formed. When a size for the first type of vertical-through-via (VTV) connectors 467 is selected or determined, the stacked through-silicon-via (TSV) wafers shown in FIG. 2C, 2G or 2J may be cut or diced along (or through) some or all of the first reserved scribe lines 141 and some or all of the second reserved scribe lines 142 to form a number of the first type of vertical-through-via (VTV) connectors 467 in a single-die type, i.e., through-silicon-via interconnect elevators (TSVIEs), each having the selected or predetermined size, as shown in FIG. 2D, 2H or 2K respectively, by a laser cutting process or by a mechanical cutting process.

The second type of vertical-through-via (VTV) connector 467 to be processed from the through-silicon-via (TSV) wafer as seen in FIG. 1E may have a size to be selected from various sizes after the vertical through vias (VTVs) 358 are formed. When a size for the second type of vertical-through-via (VTV) connectors 467 is selected or determined, the through-silicon-via (TSV) wafer shown in FIG. 1E may be cut or diced along (or through) some or all of the first reserved scribe lines 141 and some or all of the second reserved scribe lines 142 to form a number of the second type of vertical-through-via (VTV) connectors 467 in a single-die type, i.e., through-silicon-via interconnect elevators (TSVIEs), each having the selected or predetermined size, as shown in FIG. 2F, 2I or 2L for the first, second or third case respectively, by a laser cutting process or by a mechanical cutting process.

The aspect ratio of the length to the width for each of the first and second types of vertical-through-via (VTV) connectors 467 may be between 2 and 10, between 4 and 10 or between 2 and 40. Each of the first and second types of vertical-through-via (VTV) connector 467 may be provided with passive elements, such as capacitors, but without any active device, i.e., transistor, therein. For each of the first and second types of vertical-through-via (VTV) connectors 467, each of its vertical through vias (VTVs) 358 may be formed by stacking multiple of its through silicon vias (TSVs) 157 up to a total height between 100 and 2,000 micrometers, between 100 and 1,000 micrometers or between 100 and 500 micrometers. Each of the first and second types of vertical-through-via (VTV) connectors 467 may be manufactured by packaging manufacturing companies or facilities without front-end of line manufacturing capability.

For the first case, referring to FIGS. 2D, 2F, 4A and 4B, for each of the first and second types of vertical-through-via (VTV) connectors 467, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358. Furthermore, referring to FIGS. 2D, 4G and 4H, for the first type of vertical-through-via (VTV) connector 467, the distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers.

For the second case, referring to FIGS. 2H, 2I, 4C and 4D, for each of the first and second types of vertical-through-via (VTV) connectors 467, each of its first and second spaces $W_{spild}$ between neighboring two of its vertical through vias (VTVs) 358 and across one of its first and second reserved scribe lines 141 and 142 between said neighboring two of its vertical through vias (VTVs) 358 may be greater than 50, 40 or 30 micrometers, and the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358. Furthermore, referring to FIGS. 2H, 4I and 4J, the first type of vertical-through-via (VTV) connector 467 may include the insulating-material islands 14*c* having the trench 14*b* therebetween having a width greater than 50 or 40 micrometers; each of its first and second spaces $WB_{spild}$ between neighboring two of its first, second, third or fourth type of micro-bumps or micro-pillars 34 and across one of its first and second reserved scribe lines 141 and 142 between said neighboring two of its first, second, third or fourth type of micro-bumps or micro-pillars 34 may be greater than 50, 40 or 30 micrometers; the distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34 and/or 36; alternatively, the distance $WB_{sbt}$ between its edge and one of its first, second, third or fourth type of micro-bumps or micro-pillars 34 may be smaller than 50, 40 or 30 micrometers.

For the third case, referring to FIGS. 2K, 2L, 4E and 4F, for the first type of vertical-through-via (VTV) connector 467, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358, wherein the space $W_{sptsv}$ between neighboring two of its vertical through vias (VTVs) 358 may be smaller than 50, 40 or 30 micrometers. Furthermore, referring to FIGS. 2K, 4K and 4L, for the first type of vertical-through-via (VTV) connector 467, the distance $WB_{sbt}$ between its edge and one of its first, second, third or fourth type of micro-bumps or micro-pillars 34 may be smaller than the space $WB_{sptsv}$ between neighboring two of its first, second, third or fourth type of micro-bumps or micro-pillars 34 and optionally its edge may be aligned with an edge of said one of its first, second, third or fourth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers; the space $WB_{sptsv}$ between neighboring two of its first, second, third or fourth type of micro-bumps or micro-pillars 34 may be smaller than 50, 40 or 30 micrometers.

For the first case, referring to FIGS. 2D and 2F, each of the first and second types of vertical-through-via (VTV) connectors 467 may be arranged with a size as seen in FIG. 4A for containing 14-by-3 vertical through vias (VTVs) 358 or another size as seen in FIG. 4B for containing 21-by-6 vertical through vias (VTVs) 358, for example. Furthermore, for the first case, referring to FIG. 2D, the first type of vertical-through-via (VTV) connector 467 may be arranged with a size as seen in FIG. 4G for containing 14-by-3 first, second, third or fourth type of micro-bumps or micro-pillars 34 and 14-by-3 insulating-material islands 14*c* or another size as seen in FIG. 4H for containing 21-by-6 first, second, third or fourth type of micro-bumps or micro-pillars 34 and 21-by-6 insulating-material islands 14*c*, for example.

For the second case, referring to FIGS. 2H and 2I, each of the first and second types of vertical-through-via (VTV) connectors 467 may be arranged with a size as seen in FIG. 4C for containing 2-by-2 islands or regions 188 of arrays of vertical through vias (VTVs) 358, each island or region 188 of which contains 13-by-2 vertical through vias (VTVs) 358, or another size as seen in FIG. 4D for containing 3-by-4 islands or regions 188 of arrays of vertical through vias (VTVs) 358, each island or region 188 of which contains 13-by-2 vertical through vias (VTVs) 358, for example. Furthermore, for the second case, referring to FIG. 2H, the first type of vertical-through-via (VTV) connector 467 may be arranged with a size as seen in FIG. 4I for containing 2-by-2 islands or regions 88 of arrays of micro-bumps or micro-pillars, each island or region 88 of which contains 13-by-2 first, second, third or fourth type of micro-bumps or micro-pillars 34, and 2-by-2 insulating-material islands 14*c* or another size as seen in FIG. 4J for containing 3-by-4 islands or regions 88 of arrays of micro-bumps or micro-pillars, each island or region 88 of which contains 13-by-2 first, second, third or fourth type of micro-bumps or micro-pillars 34, and 3-by-4 insulating-material islands 14*c*, for example.

For the third case, referring to FIGS. 2K and 2L, each of the first and second types of vertical-through-via (VTV) connectors 467 may be arranged with a size as seen in FIG. 4E for containing 27-by-5 vertical through vias (VTVs) 358 or another size as seen in FIG. 4F for containing 41-by-11 vertical through vias (VTVs) 358, for example. Furthermore, for the third case, referring to FIG. 2K, the first type of vertical-through-via (VTV) connector 467 may be arranged with a size as seen in FIG. 4K for containing 27-by-5 first, second, third or fourth type of micro-bumps or micro-pillars 34 or another size as seen in FIG. 4L for containing 41-by-11 first, second, third or fourth type of micro-bumps or micro-pillars 34, for example.

Accordingly, for each of the first through third cases, each of the first and second types of vertical-through-via (VTV) connectors 467 may be arranged with a size for containing vertical through vias (VTVs) 358 arranged in an array with M1 row(s) by N1 column(s); furthermore, for each of the first through third cases, the first type of vertical-through-via (VTV) connector 467 may be arranged with a size for containing the first, second, third or fourth type of micro-bumps or micro-pillars 34 arranged in an array with M2 row(s) by N2 column(s), wherein M1, M2, N1 and N2 are integers, M1 is greater than N1 and M2 is greater than N2. For an example, each of the numbers M1 and M2 may be greater than or equal to 50 and smaller than or equal to 500, and each of the numbers N1 and N2 may be greater than or equal to 1 and smaller than or equal to 15. For another example, each of the numbers N1 and N2 may be greater than or equal to 30 and smaller than or equal to 200, and each of the numbers M1 and M2 may be greater than or equal to 1 and smaller than or equal to 10. The number of the semiconductor substrates 2 stacked for the first type of vertical-through-via (VTV) connector 467 may range from 2 to 10. The standard common wafers, i.e., stacked through-silicon-via (TSV) wafers, as seen in FIG. 2C, 2G or 2J may have a fixed pattern of design and layout for locations of the vertical through vias (VTVs) 358 and first, second, third or fourth type of micro-bumps or micro-pillars 34, and may be cut or diced to form a number of the first type of vertical-through-via (VTV) connectors 467 in a single-die type, i.e., through-silicon-via interconnect elevators (TSVIEs), as seen in FIG. 2D, 2H or 2K, having various dimensions or shapes, various numbers of vertical through vias (VTVs) 358 and various numbers of the first, second, third or fourth type of micro-bumps or micro-pillars 34. Alternatively, the standard common wafers, i.e., stacked through-silicon-via (TSV) wafers, as seen in FIG. 2E may have a fixed pattern of design and layout for locations of the vertical through vias (VTVs) 358, and may be cut or diced to form a number of the second type of vertical-through-via (VTV) connectors 467 in a single-die type, i.e., through-silicon-via interconnect elevators (TSVIEs), as seen in FIG. 2F, 2I or 2L for the first, second or third case respectively, having various dimensions or shapes, various numbers of vertical through vias (VTVs) 358.

3. Decoupling Capacitors Formed in First Type of Vertical-Through-Via (VTV) Connector for Through-Silicon-Via Interconnect-Elevator (TSVIE)

Figure 3A:
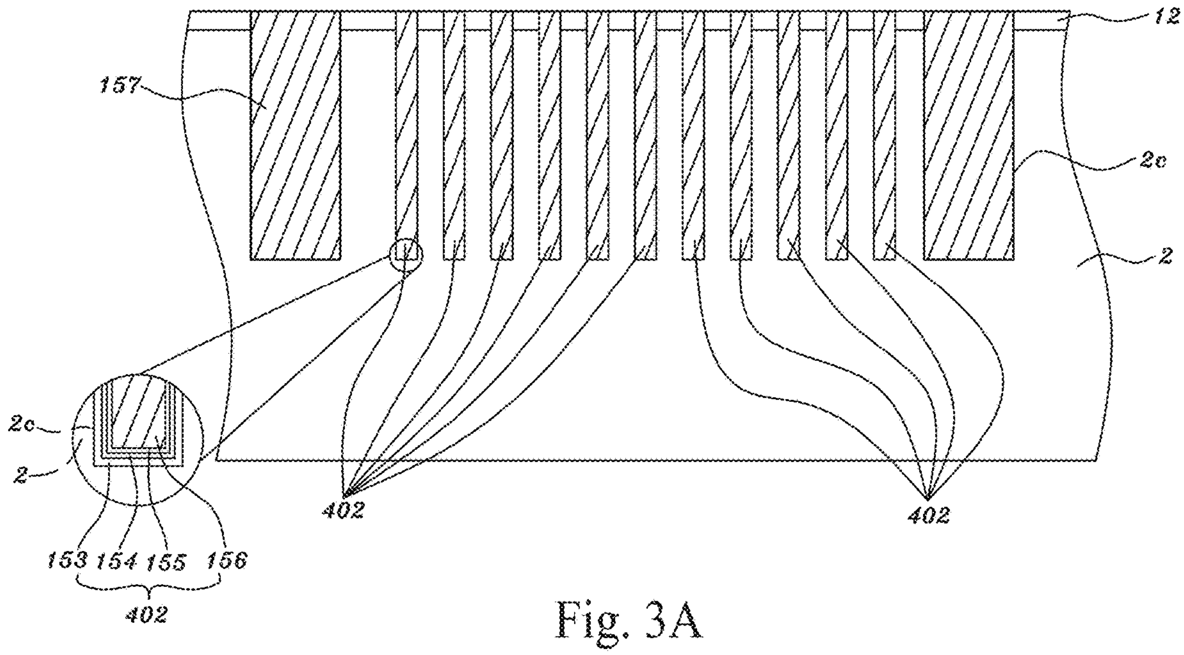
FIGS. 3A-3E are schematically cross-sectional views showing a process for forming a decoupling capacitor in a first type of vertical-through-via (VTV) connector in accordance with an embodiment of the present application.
Figure 3B:
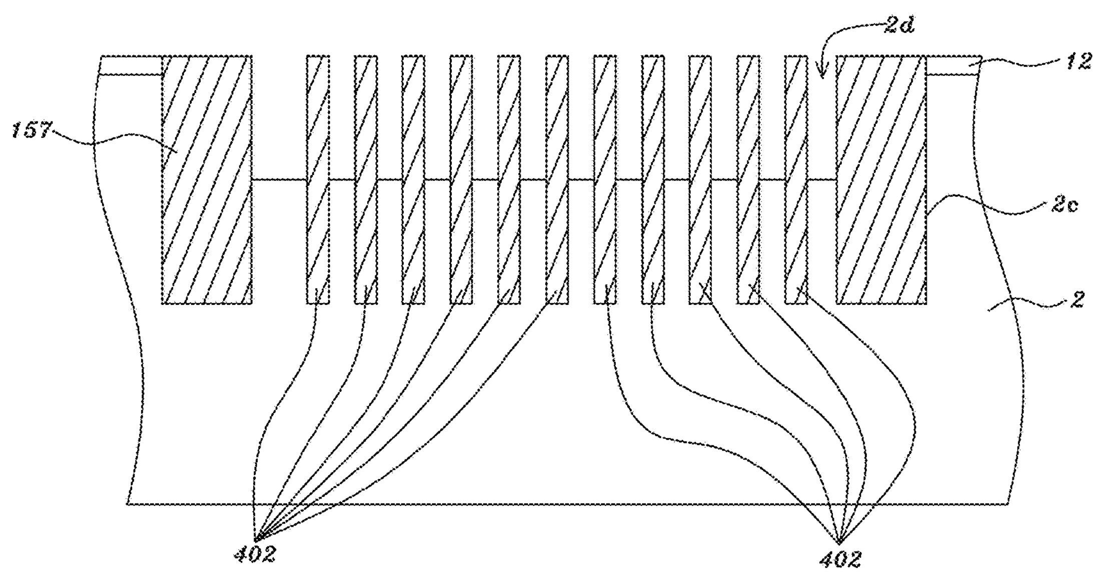
Figure 3C:
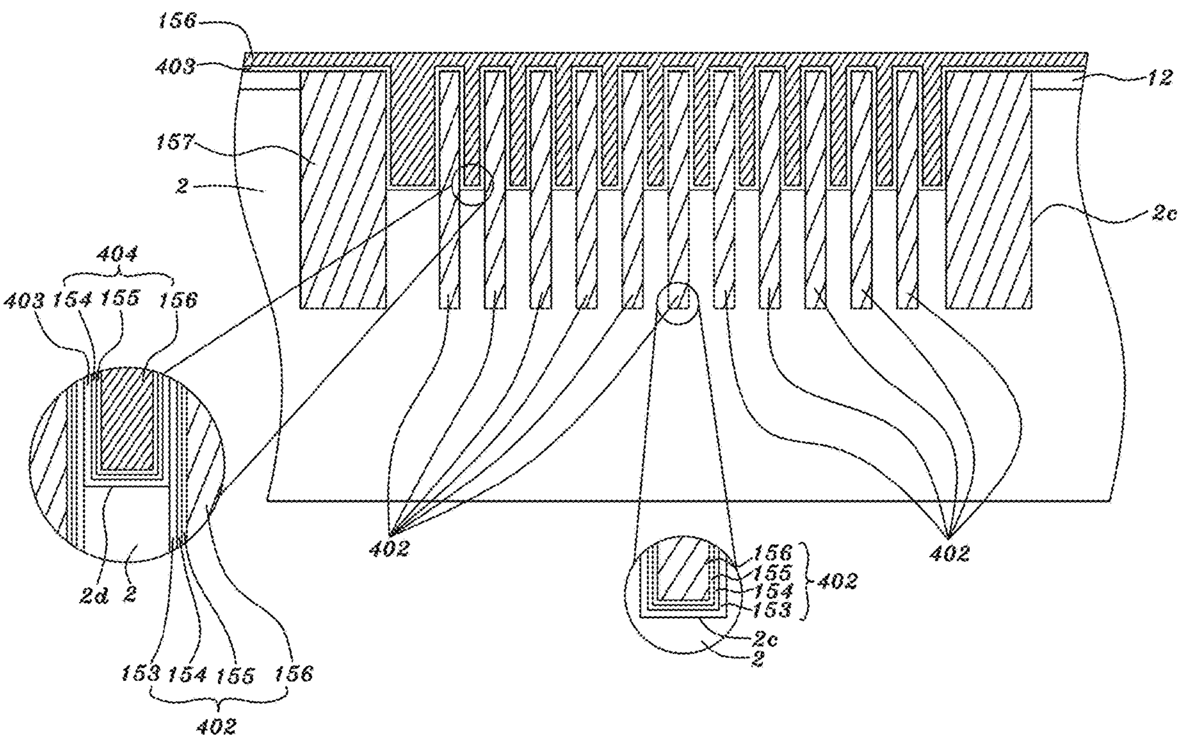
Figure 3D:
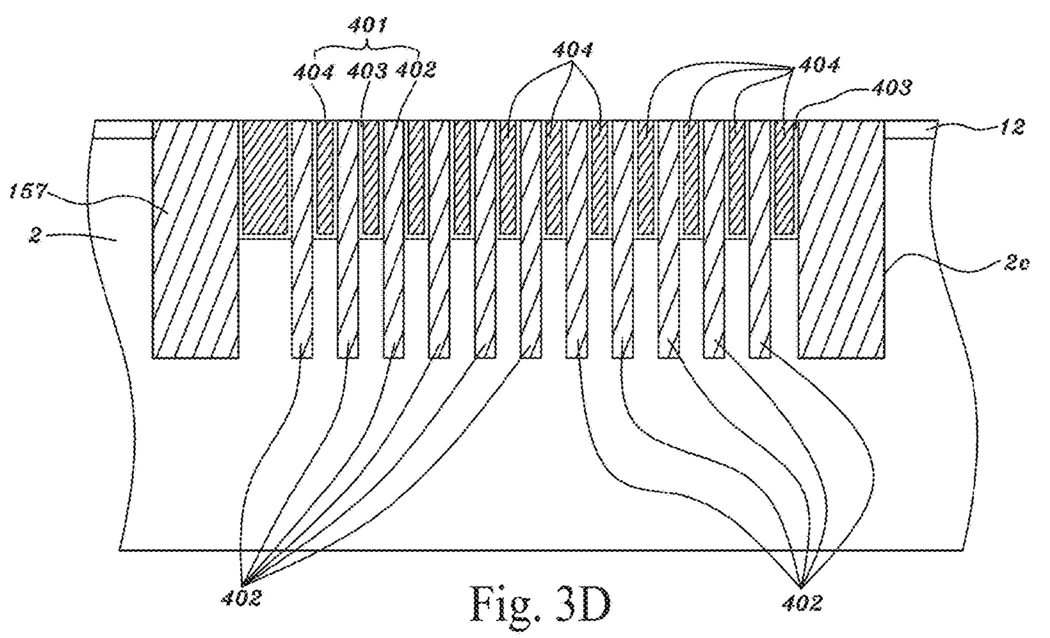
Figure 3E:
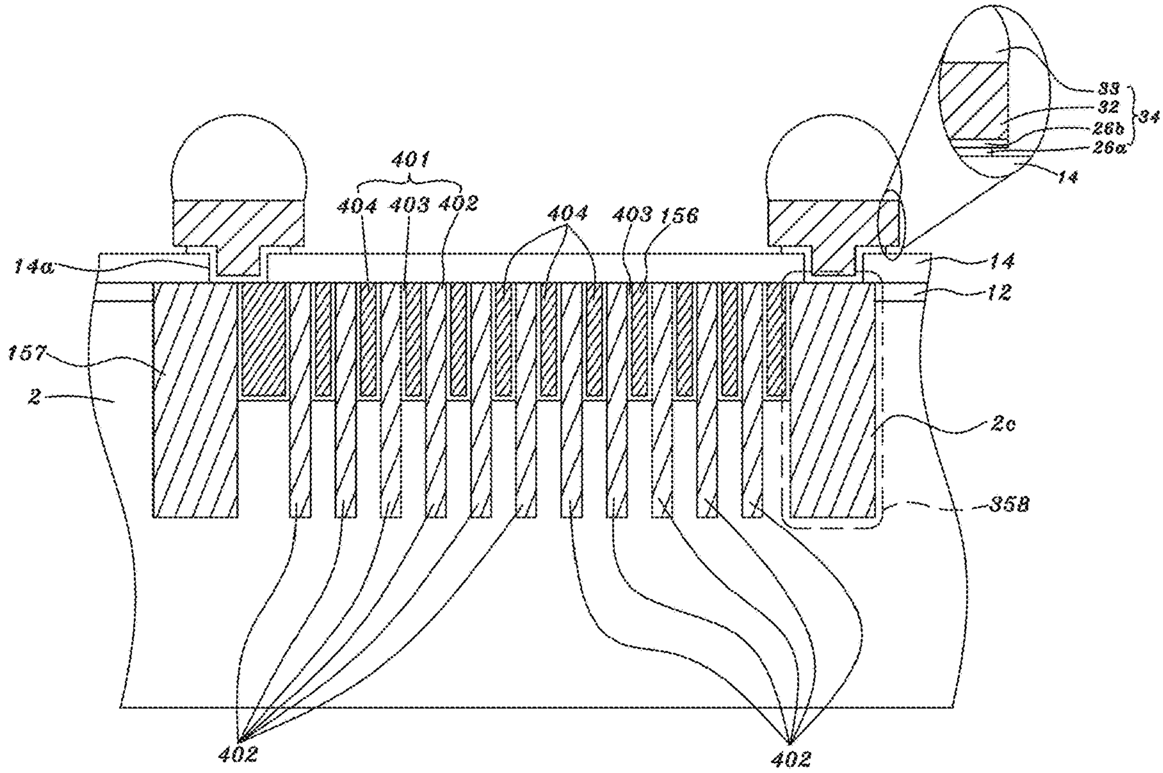
Figure 3F:
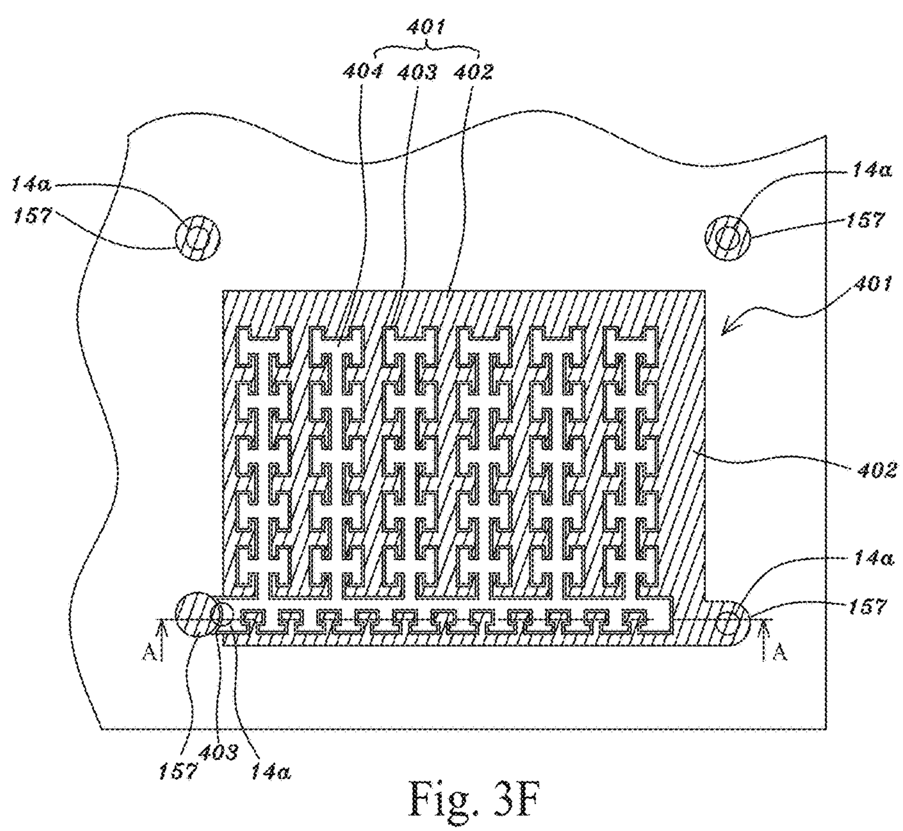

FIGS. 3A-3E are schematically cross-sectional views showing a process for forming a decoupling capacitor in a first type of vertical-through-via (VTV) connector in accordance with an embodiment of the present application. FIG. 3F is a schematically top view showing a decoupling capacitor between four vertical through vias (VTVs) in accordance with an embodiment of the present application, wherein FIG. 3E is a schematically cross-sectional view along a cross-sectional line A-A on FIG. 3F. Referring to FIG. 3A, an insulating dielectric layer 12 may be formed on the semiconductor substrate 2 and then multiple deep trenches 2*c* having a depth between 30 μm and 2,000 μm may be formed in the insulating dielectric layer 12 and semiconductor substrate 2 by forming a first masking insulating layer (not shown) on the insulating dielectric layer 12, patterning the first masking insulating layer to form multiple openings in the first masking insulating layer and then etching the insulating dielectric layer 12 and semiconductor substrate 2 under the openings in the first masking insulating layer for a predetermined time period. The specification for the insulating dielectric layer 12 and semiconductor substrate 2 may be referred to that as illustrated in FIG. 1A. The specification and process for forming the deep trenches 2*c* in the insulating dielectric layer 12 and semiconductor substrate 2 may be referred to those for forming the blind holes 2*a* in the insulating dielectric layer 12 and semiconductor substrate 2 as illustrated in FIGS. 1A and 1B.

Next, the first masking insulating layer may be removed. Next, referring to FIGS. 3A and 3F, an insulating lining layer 153, adhesion layer 154, seed layer 155 and copper layer 156 as illustrated in FIG. 1C may be formed in the deep trenches 2*c* to form a first electrode 402 of a decoupling capacitor 401 and multiple through silicon vias (TSVs) 157, wherein the first electrode 402 of the decoupling capacitor 401 couples to one of the through silicon vias (TSVs) 157, e.g., a right one of the two through silicon vias (TSVs) 157. The specification and process for forming the insulating lining layer 153, adhesion layer 154, seed layer 155 and copper layer 156 in the deep trenches 2*c* may be referred to those for forming the insulating lining layer 153, adhesion layer 154, seed layer 155 and copper layer 156 in the blind holes 2*a* as illustrated in FIGS. 1C and 1D. Each of the through silicon vias (TSVs) 157 may have a depth between 30 μm and 2,000 μm and a diameter or largest transverse dimension between 2 μm and 20 μm or between 4 μm and 10 μm. A pitch between neighboring two of the through silicon vias (TSVs) 157 may range from 5 to 50 micrometers or from 5 to 20 micrometers or may be smaller than 50, 40 or 30 micrometers.

Next, referring to FIG. 3B, a shallow trench 2*d* having a depth between 5 μm and 30 μm and less than the depth of the deep trenches 2*c* may be formed in the insulating dielectric layer 12 and semiconductor substrate 2 by forming a second masking insulating layer 161 on the insulating dielectric layer 12, through silicon vias (TSVs) 157 and first electrode 402 of the decoupling capacitor 401, patterning the second masking insulating layer 161 to form multiple openings 161*a* in the second masking insulating layer 161 and then etching the insulating dielectric layer 12 and semiconductor substrate 2 under the openings 161*a* in the second masking insulating layer 161 for a predetermined time period. The process for forming the shallow trench 2*d* in the insulating dielectric layer 12 and semiconductor substrate 2 may be referred to that for forming the blind holes 2*a* in the insulating dielectric layer 12 and semiconductor substrate 2 as illustrated in FIGS. 1A and 1B.

Next, the second masking insulating layer 161 as seen in FIG. 3B may be removed as seen in FIG. 3C. Next, referring to FIGS. 3C and 3F, a dielectric layer 403, such as tantalum oxide ($Ta_2O_5$), hafnium oxide ($HfO_2$), zirconium oxide ($ZrO_2$), titanium oxide ($TiO_2$) or silicon nitride ($Si_3N_4$), having a thickness between 100 and 1,000 angstroms, may be formed on a sidewall and bottom of the shallow trench 2*d* and on a sidewall and top of the first electrode 402 of the decoupling capacitor 401, on a top of each of the through silicon vias (TSVs) 157 and on a top surface of the insulating dielectric layer 12. Next, an adhesion layer 154 may be formed on the dielectric layer 403 and in the shallow trench 2*d*. Next, a seed layer 155 may be deposited on the adhesion layer 154 and in the shallow trench 2*d*. Next, a copper layer 156 may be electroplated on the seed layer 155 and in the shallow trench 2*d*. The specification and process for forming the adhesion layer 154, seed layer 155 and copper layer 156 in the shallow trenches 2*d* and over the first electrode 402 of the decoupling capacitor 401, through silicon vias (TSVs) 157 and insulating dielectric layer 12 may be referred to those for forming the adhesion layer 154, seed layer 155 and copper layer 156 in the blind holes 2*a* and over the insulating dielectric layer 12 as illustrated in FIG. 1C.

Next, the copper layer 156, seed layer 155, adhesion layer 154 and dielectric layer 403 outside the shallow trench 2*d* may be removed as seen in FIG. 3D by a chemical-mechanical polishing (CMP) process to expose the top surface of the insulating dielectric layer 12, the top of the first electrode 402 of the decoupling capacitor 401 and the top of each of the through silicon vias (TSVs) 157. The copper layer 156, seed layer 155 and adhesion layer 154 in the shallow trench 2*d* may be employed as a second electrode 404 of the decoupling capacitor 401 as seen in FIGS. 3D and 3F. Thereby, the decoupling capacitor 401 may be provided with the dielectric layer 403 between its first and second electrodes 402 and 404, wherein its first electrode 402 may have a depth between 30 and 2,000 micrometers and its second electrode 404 may have a depth between 5 and 20 micrometers.

Next, referring to FIGS. 3E and 3F, a passivation layer 14 may be formed on the top surface of the insulating dielectric layer 12 and on the tops of the first and second electrodes 402 and 404 of the decoupling capacitor 401. The specification for the passivation layer 14 may be referred to that as illustrated in FIG. 1E. Next, multiple openings 14*a* may be formed in the passivation layer 14 and each of the openings 14*a* may expose a backside of the copper layer 156 of one of the through silicon vias (TSVs) 157. The specification for the openings 14*a* in the passivation layer 14 may be referred to that as illustrated in FIG. 1E. One of the openings 14*a* in the passivation layer 14 may further expose the second electrode 404 of the decoupling capacitor 401 beside the copper layer 156 of one of the through silicon vias (TSVs) 157, e.g., a left one of the through silicon vias (TSVs) 157. Next, a micro-bump or micro-pillar 34, which may be of one of the first through fourth types having the same specifications as the first through fourth types of micro-bumps or micro-pillars 34 as illustrated in FIG. 1E respectively, may be formed on the copper layer 156 of each of the through silicon vias (TSVs) 157 at a bottom of one of the openings 14*a* in the passivation layer 14. One of the micro-bumps or micro-pillars 34 may be further formed on the second electrode 404 of the decoupling capacitor 401 beside the copper layer 156 of said one of the through silicon vias (TSVs) 157 to couple said one of the through silicon vias (TSVs) 157 to the second electrode 404 of the decoupling capacitor 401. Each of the through silicon vias (TSVs) 157 may be used as a vertical through via (VTV) 358 for a dedicated vertical path.

Figure 3G:
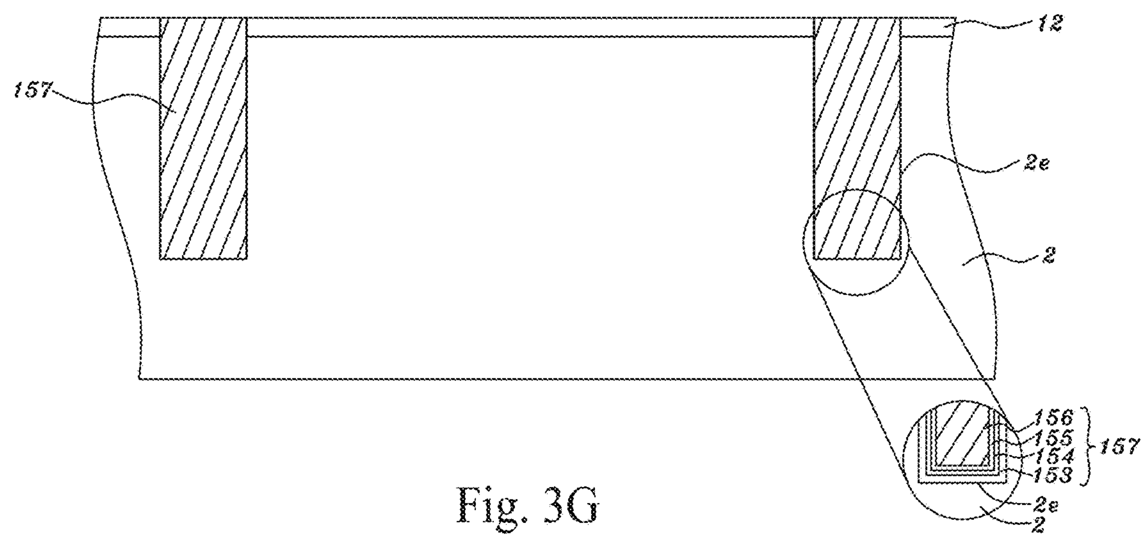
FIGS. 3G-3L are schematically cross-sectional views showing a process for forming a decoupling capacitor in a first type of vertical-through-via (VTV) connector in accordance with another embodiment of the present application.
Figure 3H:
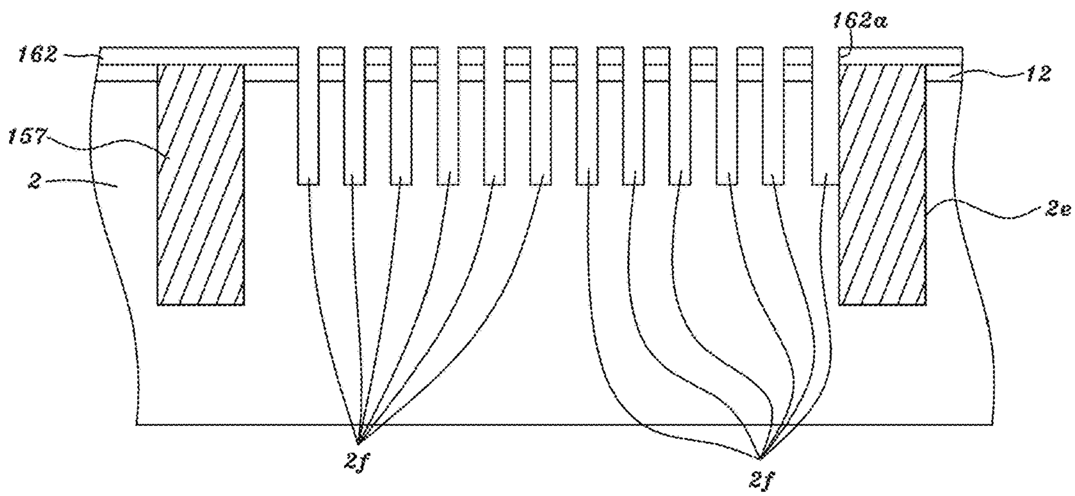
Figure 3I:
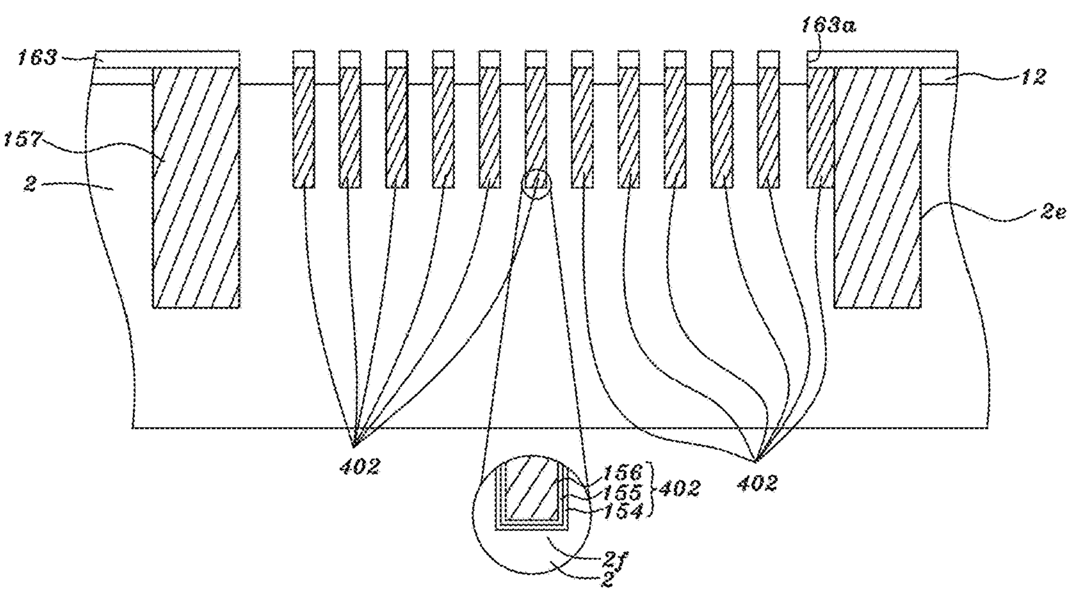
Figure 3J:
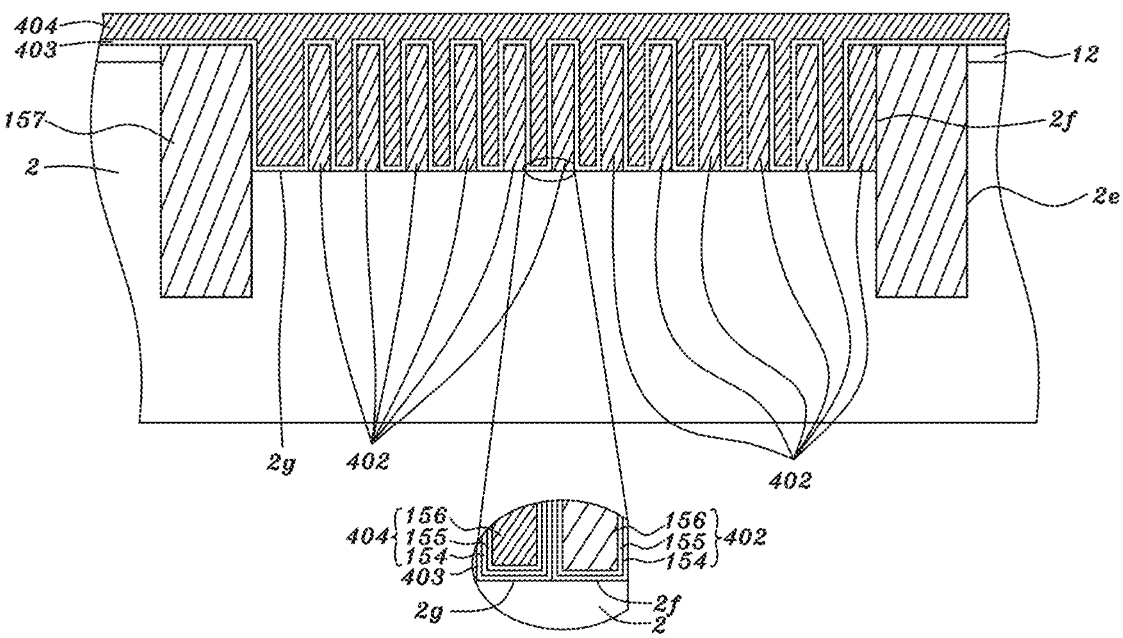
Figure 3K:
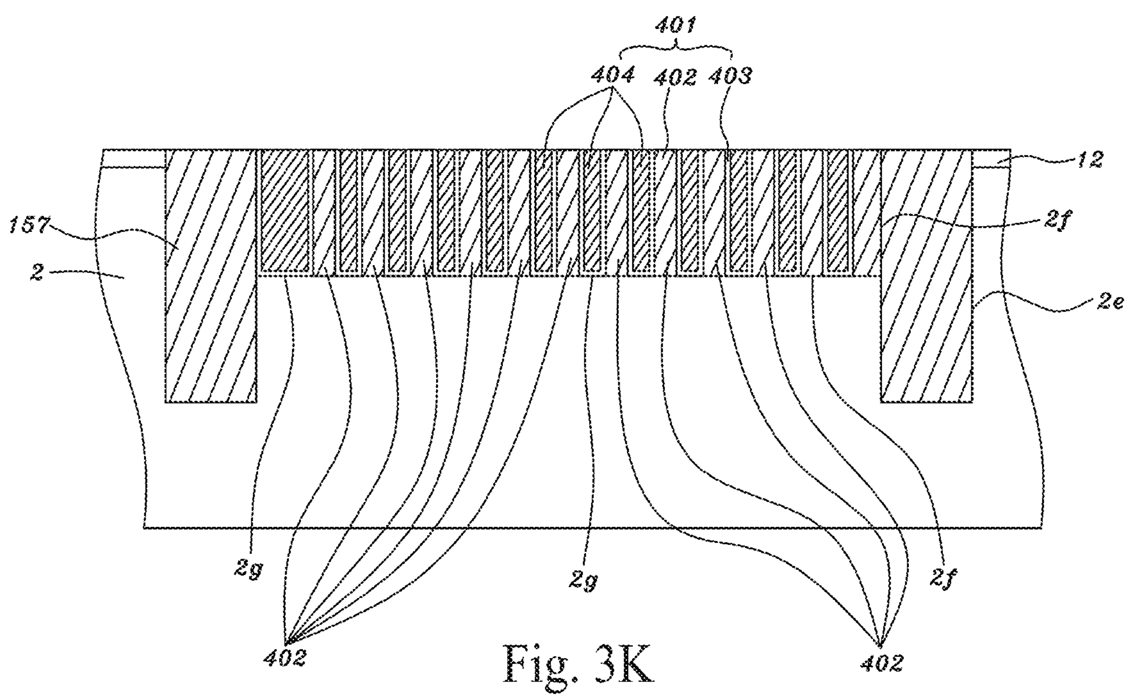
Figure 3L:
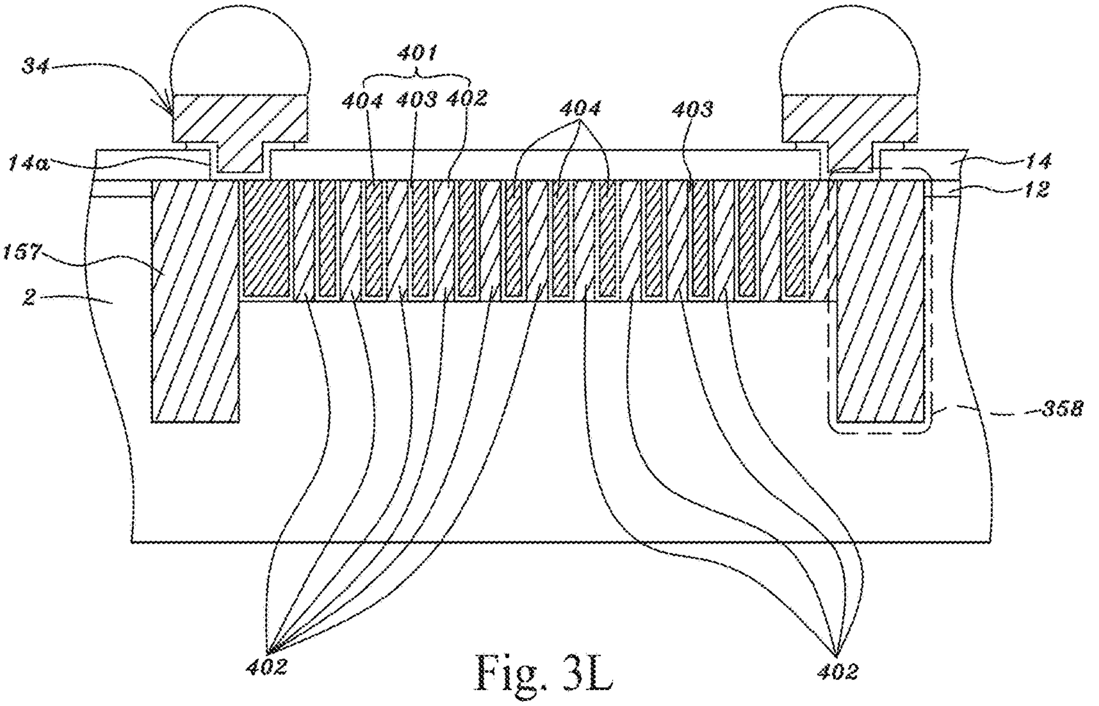
Figure 3M:
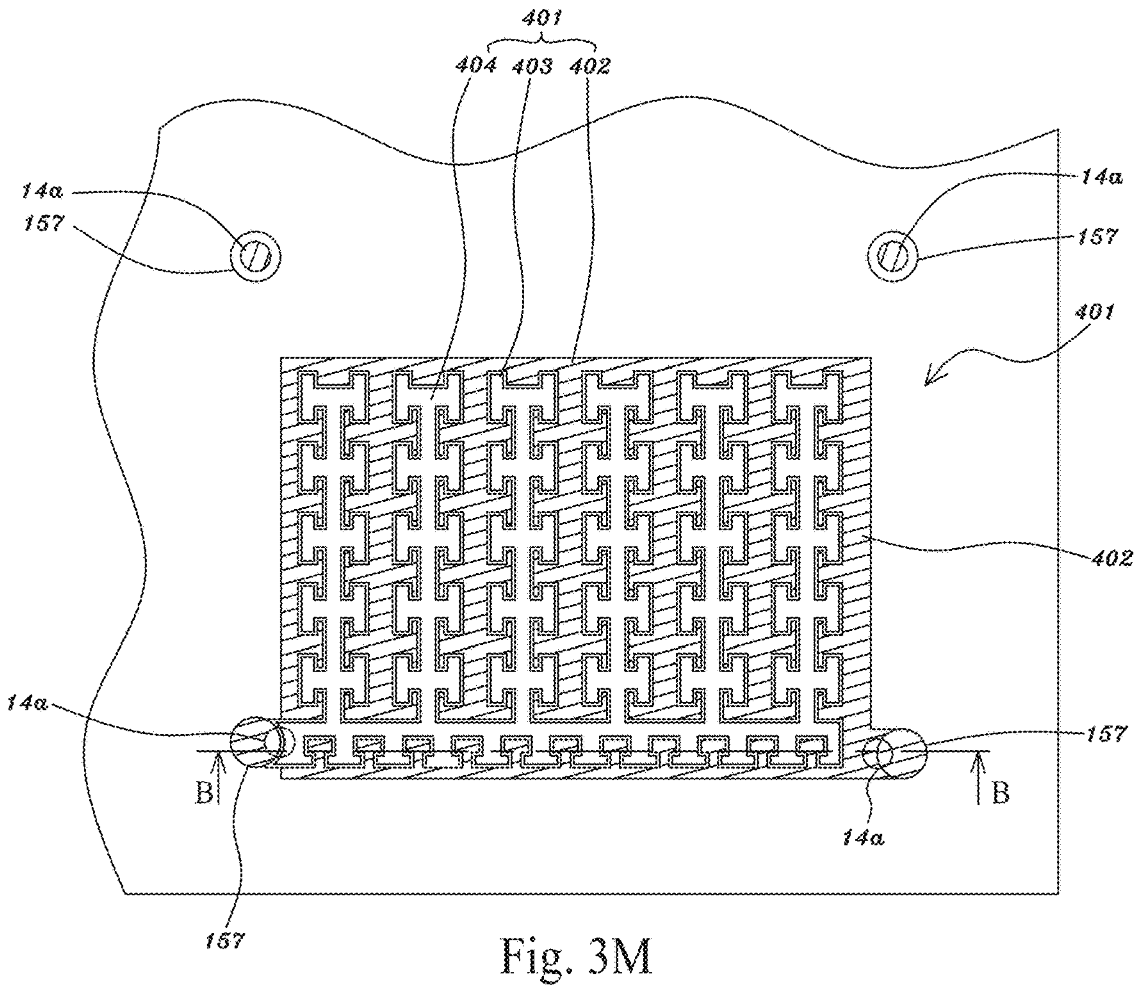

Alternatively, FIGS. 3G-3L are schematically cross-sectional views showing a process for forming a decoupling capacitor in a first type of vertical-through-via (VTV) connector in accordance with another embodiment of the present application. FIG. 3M is a schematically top view showing a decoupling capacitor among four through silicon vias (TSVs) in accordance with another embodiment of the present application, wherein FIG. 3L is a schematically cross-sectional view along a cross-sectional line B-B on FIG. 3M. Referring to FIG. 3G, an insulating dielectric layer 12 may be formed on the semiconductor substrate 2 and then multiple deep trenches 2*e* having a depth between 30 μm and 2,000 μm may be formed in the insulating dielectric layer 12 and semiconductor substrate 2 by forming a first masking insulating layer (not shown) on the insulating dielectric layer 12, patterning the first masking insulating layer to form multiple openings in the first masking insulating layer and then etching the insulating dielectric layer 12 and semiconductor substrate 2 under the openings in the first masking insulating layer for a predetermined time period. The specification for the insulating dielectric layer 12 and semiconductor substrate 2 may be referred to that as illustrated in FIG. 1A. The specification and process for forming the deep trenches 2*e* in the insulating dielectric layer 12 and semiconductor substrate 2 may be referred to those for forming the blind holes 2*a* in the insulating dielectric layer 12 and semiconductor substrate 2 as illustrated in FIGS. 1A and 1B.

Next, the first masking insulating layer may be removed. Next, referring to FIGS. 3G and 3M, an insulating lining layer 153, adhesion layer 154, seed layer 155 and copper layer 156 as illustrated in FIG. 1C may be formed in the deep trenches 2*e* to form multiple through silicon vias (TSVs) 157. The specification and process for forming the insulating lining layer 153, adhesion layer 154, seed layer 155 and copper layer 156 in the deep trenches 2*e* may be referred to those for forming the insulating lining layer 153, adhesion layer 154, seed layer 155 and copper layer 156 in the blind holes 2*a* as illustrated in FIGS. 1C and 1D. Each of the through silicon vias (TSVs) 157 may have a depth between 30 μm and 2,000 μm and a diameter or largest transverse dimension between 2 μm and 20 μm or between 4 μm and 10 μm. A pitch between neighboring two of the through silicon vias (TSVs) 157 may range from 5 to 50 micrometers or from 5 to 20 micrometers or may be smaller than 50, 40 or 30 micrometers.

Next, referring to FIGS. 3H and 3M, a first shallow trench 2*f* having a depth between 5 μm and 30 μm and less than the depth of the deep trenches 2*e* may be formed in the insulating dielectric layer 12 and semiconductor substrate 2 by forming a second masking insulating layer 162 on the insulating dielectric layer 12 and through silicon vias (TSVs) 157, patterning the second masking insulating layer 162 to form an opening 162*a* in the second masking insulating layer 162 and then etching the insulating dielectric layer 12 and semiconductor substrate 2 under the opening 162*a* in the second masking insulating layer 162 for a predetermined time period. The process for forming the first shallow trench 2*f* in the insulating dielectric layer 12 and semiconductor substrate 2 may be referred to that for forming the blind holes 2*f* in the insulating dielectric layer 12 and semiconductor substrate 2 as illustrated in FIGS. 1A and 1B.

Next, the second masking insulating layer 162 as seen in FIG. 3H may be removed as see in FIG. 3I. Next, referring to FIGS. 3I and 3M, an adhesion layer 154 may be deposited on the sidewall and bottom of the first shallow trench 2*f* and on the top surface of the insulating dielectric layer 12 by, for example, sputtering or chemical vapor depositing (CVD) a titanium (Ti) or titanium nitride (TiN) layer 154 having a thickness between 1 nm to 50 nm on the sidewall and bottom of the first shallow trench 2*f* and on the top surface of the insulating dielectric layer 12. Next, a seed layer 155 may be deposited on the adhesion layer 154 by, for example, sputtering or chemical vapor depositing (CVD) a copper seed layer 155 having a thickness between 3 nm and 200 nm on the adhesion layer 154. Next, a copper layer 156 having a thickness, for example, between 10 nm and 3,000 nm, between 10 nm and 1,000 nm or between 10 nm and 500 nm may be electroplated on the copper seed layer 155. The specification and process for forming the adhesion layer 154, seed layer 155 and copper layer 156 in the first shallow trenches 2*f* and over the through silicon vias (TSVs) 157 and insulating dielectric layer 12 may be referred to those for forming the adhesion layer 154, seed layer 155 and copper layer 156 in the blind holes 2*a* and over the insulating dielectric layer 12 as illustrated in FIG. 1C. Next, the copper layer 156, seed layer 155 and adhesion layer 154 outside the first shallow trench 2*f* and over the insulating dielectric layer 12 may be removed by a chemical-mechanical polishing (CMP) process to expose the top surface of the insulating dielectric layer 12. The remaining copper layer 156, seed layer 155 and adhesion layer 154 in the first shallow trench 2*f* may be employed to form a first electrode 402 of a decoupling capacitor 401 as seen in FIG. 3K. For the first electrode 402 of the decoupling capacitor 401, its copper layer 156 may be provided in the first shallow trench 2*f* and have a front side coplanar with a front side of the insulating dielectric layer 12, its adhesion layer 154 may be provided on the sidewall and bottom of the first shallow trench 2*f* and at a sidewall and bottom of its copper layer 156, and its seed layer 155 may be provided between its adhesion layer 154 and copper layer 156 and at a sidewall and bottom of its copper layer 156.

Next, referring to FIGS. 3I and 3J, a second shallow trench 2*g* having a depth between 5 μm and 30 μm and less than the depth of the deep trenches 2*e* may be formed in the insulating dielectric layer 12 and semiconductor substrate 2 by forming a third masking insulating layer 163 on the insulating dielectric layer 12, through silicon vias (TSVs) 157 and first electrode 402 of the decoupling capacitor 401, patterning the third masking insulating layer 163 to form an opening 163*a* in the third masking insulating layer 163, etching, as seen in FIG. 3I, the insulating dielectric layer 12 under the opening 163*a* in the third masking insulating layer 163 until a top surface of the semiconductor substrate 2 is exposed via the opening 163*a* in the third masking insulating layer 163, and then etching, as seen in FIG. 3J, the semiconductor substrate 2 under the openings 163*a* in the third masking insulating layer 163 for a predetermined time period. The process for forming the second shallow trench 2*g* in the insulating dielectric layer 12 and semiconductor substrate 2 may be referred to that for forming the blind holes 2*a* in the insulating dielectric layer 12 and semiconductor substrate 2 as illustrated in FIGS. 1A and 1B.

Next, the third masking insulating layer 163 as seen in FIG. 3I may be removed as seen in FIG. 3J. Next, referring to FIGS. 3J and 3M, a dielectric layer 403, such as tantalum oxide ($Ta_2O_3$), hafnium oxide ($HfO_2$), zirconium oxide ($ZrO_2$), titanium oxide ($TiO_2$) or silicon nitride ($Si_3N_4$), having a thickness between 100 and 1,000 angstroms, may be formed on a sidewall and bottom of the second shallow trench 2*g* and on a sidewall and top of the first electrode 402 of the decoupling capacitor 401, on a top of each of the through silicon vias (TSVs) 157 and on a top surface of the insulating dielectric layer 12. Next, an adhesion layer 154 may be formed on the dielectric layer 403 and in the second shallow trench 2*g*. Next, a seed layer 155 may be deposited on the adhesion layer 154 and in the second shallow trench 2*g*. Next, a copper layer 156 may be electroplated on the seed layer 155 and in the second shallow trench 2*g*. The specification and process for forming the adhesion layer 154, seed layer 155 and copper layer 156 in the second shallow trenches 2*g* and over the first electrode 402 of the decoupling capacitor 401, through silicon vias (TSVs) 157 and insulating dielectric layer 12 may be referred to those for forming the adhesion layer 154, seed layer 155 and copper layer 156 in the blind holes 2*a* and over the insulating dielectric layer 12 as illustrated in FIG. 1C.

Next, the copper layer 156, seed layer 155, adhesion layer 154 and dielectric layer 403 outside the second shallow trench 2*g* may be removed as seen in FIG. 3K by a chemical-mechanical polishing (CMP) process to expose the top surface of the insulating dielectric layer 12, the top of the first electrode 402 of the decoupling capacitor 401 and the top of each of the through silicon vias (TSVs) 157. The copper layer 156, seed layer 155 and adhesion layer 154 in the second shallow trench 2*g* may be employed as a second electrode 404 of the decoupling capacitor 401 as seen in FIGS. 3K and 3M. Thereby, the decoupling capacitor 401 may be provided with the dielectric layer 403 between its first and second electrodes 402 and 404, wherein its first electrode 402 may have a depth between 5 and 20 micrometers and its second electrode 404 may have a depth between 5 and 20 micrometers.

Next, referring to FIGS. 3L and 3M, a passivation layer 14 may be formed on the top surface of the insulating dielectric layer 12 and on the tops of the first and second electrodes 402 and 404 of the decoupling capacitor 401. The specification for the passivation layer 14 may be referred to that as illustrated in FIG. 1E. Next, multiple openings 14*a* may be formed in the passivation layer 14 and each of the openings 14*a* may expose a backside of the copper layer 156 of one of the through silicon vias (TSVs) 157. The specification for the openings 14*a* in the passivation layer 14 may be referred to that as illustrated in FIG. 1E. A first one of the openings 14*a* in the passivation layer 14 may further expose the first electrode 402 of the decoupling capacitor 401 beside the copper layer 156 of a first one of the through silicon vias (TSVs) 157, e.g., a right one of the through silicon vias (TSVs) 157; a second one of the openings 14*a* in the passivation layer 14 may further expose the second electrode 404 of the decoupling capacitor 401 beside the copper layer 156 of a second one of the through silicon vias (TSVs) 157, e.g., a left one of the through silicon vias (TSVs) 157. Next, a micro-bump or micro-pillar 34, which may be of one of the first through fourth types having the same specifications as the first through fourth types of micro-bumps or micro-pillars 34 as illustrated in FIG. 1E respectively, may be formed on the copper layer 156 of each of the through silicon vias (TSVs) 157 at a bottom of one of the openings 14*a* in the passivation layer 14. A first one of the micro-bumps or micro-pillars 34 may be further formed on the first electrode 402 of the decoupling capacitor 401 beside the copper layer 156 of the first one of the through silicon vias (TSVs) 157 to couple the first one of the through silicon vias (TSVs) 157 to the first electrode 402 of the decoupling capacitor 401; a second one of the micro-bumps or micro-pillars 34 may be further formed on the second electrode 404 of the decoupling capacitor 401 beside the copper layer 156 of the second one of the through silicon vias (TSVs) 157 to couple the second one of the through silicon vias (TSVs) 157 to the second electrode 404 of the decoupling capacitor 401. Each of the through silicon vias (TSVs) 157 may be used as a vertical through via (VTV) 358 for a dedicated vertical path. The first electrode 402 of the decoupling capacitor 401 is configured to electrically couple to the semiconductor substrate 2 and configured to electrically couple to a voltage Vss of ground reference via the first one of the micro-bumps or micro-pillars 34. The first and second electrodes 402 and 404 of the decoupling capacitor 401 as shown in FIG. 3L may have substantially the same depth between 5 and 30 μm less than the depth of the through silicon vias (TSVs) 157, wherein the depth of the through silicon vias (TSVs) 157 may range from 30 to 2,000 μm. For an element indicated by the same reference number shown in FIGS. 3A-3M, the specification of the element as seen in FIGS. 3G-3M may be referred to that of the element as illustrated in FIGS. 3A-3F.

For example, the decoupling capacitor 401 as illustrated in each of FIGS. 3E and 3L may have capacitance between 10 and 5,000 nF. The decoupling capacitor 401 as illustrated in each of FIGS. 3E and 3L may be formed (1) for the first case among any four of the vertical through vias (VTVs) 358, as seen in FIGS. 4A and 4B, and in the semiconductor substrate 2 of the first or second type of vertical-through-via (VTV) connector 467 as seen in FIG. 1F or 1G, (2) for the second case among any four of the vertical through vias (VTVs) 358, as seen in FIGS. 4C and 4D, and in the semiconductor substrate 2 of the first or second type of vertical-through-via (VTV) connector 467 as seen in FIG. 1I or 1J, or (3) for the third case among any four of the vertical through vias (VTVs) 358, as seen in FIGS. 4E and 4F, and in the semiconductor substrate 2 of the first or second type of vertical-through-via (VTV) connector 467 as seen in FIG. 1L or 1M. Alternatively, the decoupling capacitor 401 as illustrated in each of FIGS. 3E and 3L may be formed (1) for the first case among any four of the vertical through vias (VTVs) 358 as seen in FIGS. 4A and 4B, i.e., among any four of the through silicon vias (TSVs) 157, and in one of the stacked semiconductor substrates 2 of the first or second type of vertical-through-via (VTV) connector 467 as seen in FIG. 2D or 2F, (2) for the second case among any four of the vertical through vias (VTVs) 358 as seen in FIGS. 4C and 4D, i.e., among any four of the through silicon vias (TSVs) 157, and in one of the stacked semiconductor substrates 2 of the first or second type of vertical-through-via (VTV) connector 467 as seen in FIG. 2H or 2I, or (3) for the third case among any four of the vertical through vias (VTVs) 358 as seen in FIGS. 4E and 4F, i.e., among any four of the through silicon vias (TSVs) 157, and in one of the stacked semiconductor substrates 2 of the first or second type of vertical-through-via (VTV) connector 467 as seen in FIG. 2K or 2L.

Specification and Process for First Type of Vertical-Through-Via (VTV) Connector (Vertical-Interconnect-Elevator (VIE) Chip or Component) Processed from Through-Glass-Via (TGV) Substrate(s)

Figure 5A:
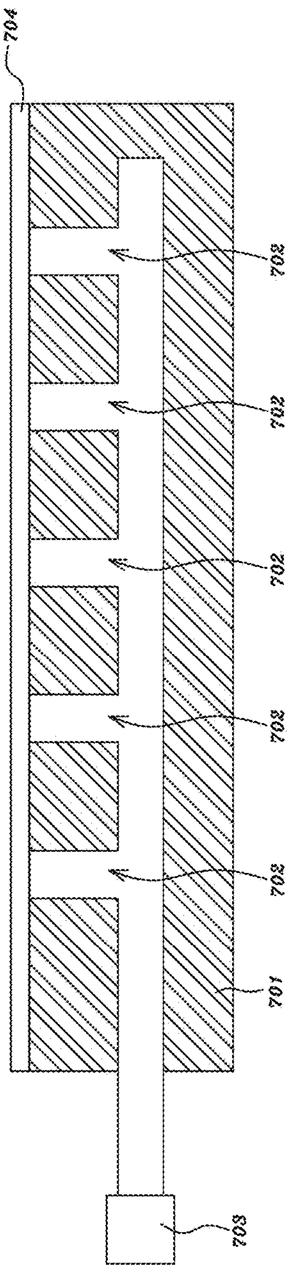
FIGS. 5A-5J are schematically cross-sectional views showing a process for forming a first type of vertical-through-via (VTV) connector based on a single-layered through-glass-via (TGV) substrate for the first case in accordance with an embodiment of the present application.

Alternatively, the vertical-through-via (VTV) connector may be processed from one or more through-glass-via (TGV) substrate(s), mentioned as below:

1. First Type of Vertical-Through-Via (VTV) Connector for Through-Glass-Via Interconnect Elevator (TGVIE) Processed from Single-Layered Through-Glass-Via (TGV) Substrate FIGS. 5A-5J are schematically cross-sectional views showing a process for forming a first type of vertical-through-via (VTV) connector based on a single-layered through-glass-via (TGV) substrate for the first case in accordance with an embodiment of the present application. FIGS. 5K and 5L are schematically cross-sectional views showing a process for forming a first type of vertical-through-via (VTV) connector based on a single-layered through-glass-via (TGV) substrate for the second case in accordance with an embodiment of the present application. FIGS. 5M and 5N are schematically cross-sectional views showing a process for forming a first type of vertical-through-via (VTV) connector based on a single-layered through-glass-via (TGV) substrate for the third case in accordance with an embodiment of the present application. Referring to FIG. 5A, a supporting holder 701, i.e., vacuum chuck, made by a ceramic material, such as Al oxide, SiC or Zr oxide, a metal alloy, such as stainless steel 304 or 316, or a metal, such as Mo, W, Fe Ni or Cr, may be provided with multiple air channels 702 extending to a top surface of the supporting holder 701. A vacuum pump 703 may be provided to couple to the air channels 702 to vacuum through the air channels 702. Next, a copper plate 704, i.e., copper foil, having a thickness between 50 and 1,000 micrometers may be provided to be fixed on the top surface of the supporting holder 701 by the vacuum pump 703 vacuuming a bottom surface of the copper plate 704 through the air channels 702.

Figure 5B:
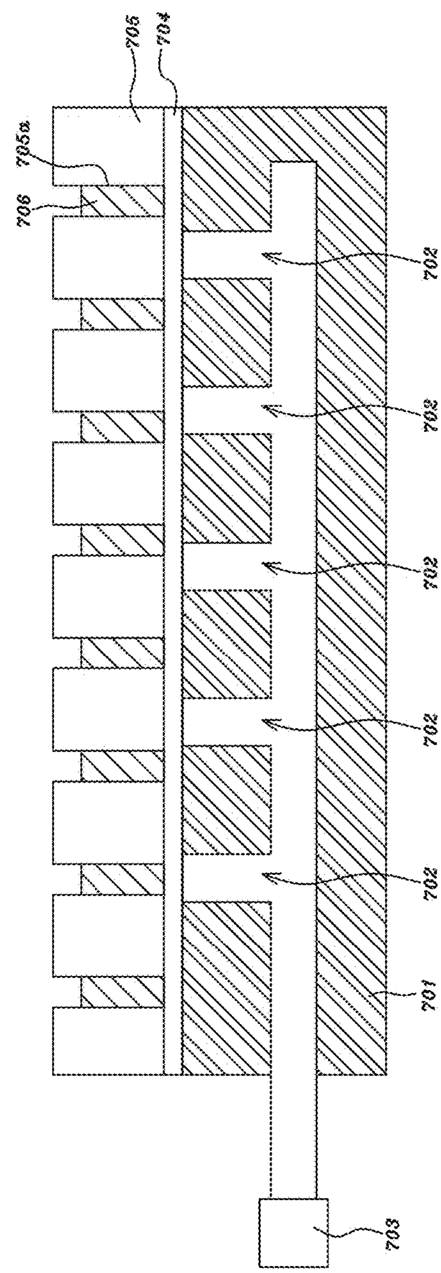

Next, referring to FIG. 5B, a photoresist layer 705 may be formed on a top surface of the copper plate 704 by a coating process and then multiple openings 705a each having a circular shape may be formed in the photoresist layer 705 by a photolithography process including exposing and developing steps, wherein each of the openings 705a in the photoresist layer 705 may expose the top surface of the copper plate 704. Next, multiple copper posts 706 may be electroplated in the openings 705a respectively and on the top surface of the copper plate 704. Each of the copper posts 706 may have a circular shape with a diameter or largest transverse dimension between 3 and 30 micrometers and a height between 30 and 100 micrometers.

Figure 5C:
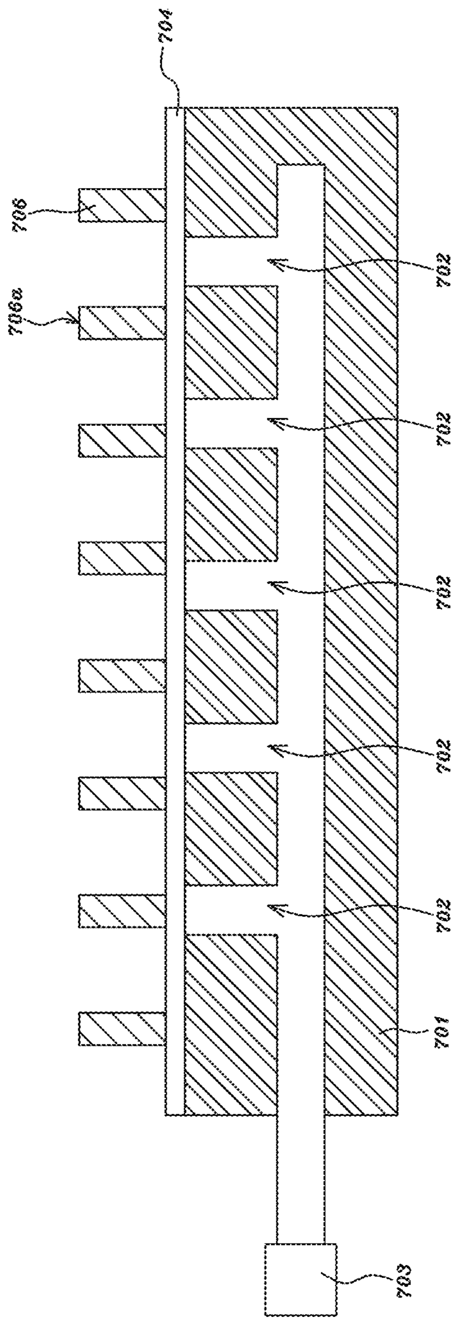

Next, the photoresist layer 705 may be removed or stripped from the top surface of copper plate 704 to expose the top surface of the copper plate 704 and a sidewall of each of the copper posts 706, as seen in FIG. 5C.

Figure 5D:
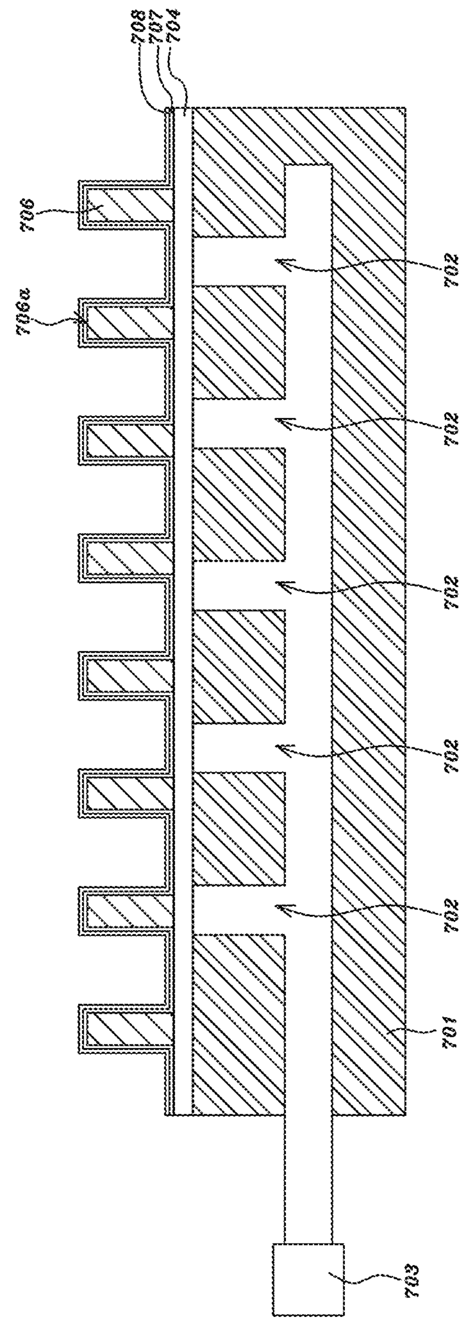

Next, referring to FIG. 5D, a cap layer 707 may be formed on the top surface of the copper plate 704 and a first end 706a and sidewall of each of the copper posts 706 by depositing a layer 707 of a titanium tungsten alloy on the top surface of the copper plate 704 and the first end 706a and sidewall of said each of the copper posts 706 using a physical-vapor-deposition (PVD) process or by depositing a tungsten layer 707 on the top surface of the copper plate 704 and the first end 706a and sidewall of said each of the copper posts 706 using a chemical-vapor-deposition (CVD) process. Alternatively, the cap layer 707 may be titanium nitride or another high melting-point metal having a melting temperature greater than 1,100 or 1,500 degrees Celsius. Next, a glass wetting layer 708 may be formed on the cap layer 707 by depositing a layer 708 of silicon oxide on the cap layer 707 using a plasma-enhanced-chemical-vapor-deposition (PECVD) process.

Figure 5E:
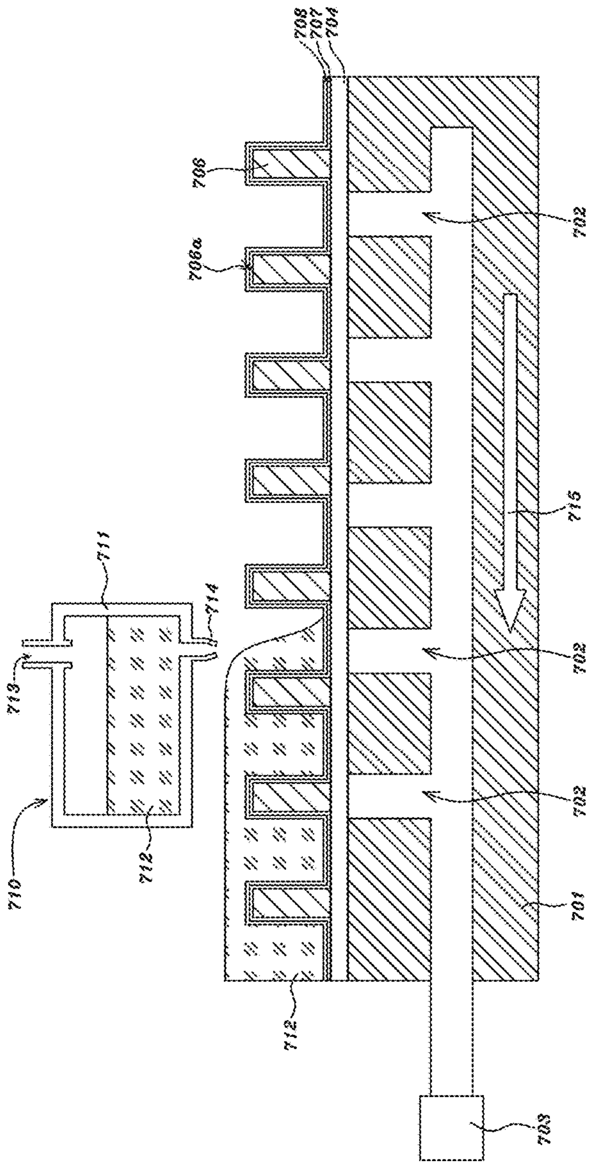

Referring to FIG. 5E, after the glass wetting layer 708 is formed as illustrated in FIG. 5D, a glass substrate 202, i.e., glass plate, may be formed of silicon oxide on the glass wetting layer 708 with covering the glass wetting layer 708 over the first end 706a of each of the copper posts 706 by screen printing glass particles, e.g., silicon-oxide particles having between 90 and 95 percent of silicon dioxide by weight, on the glass wetting layer 708 with covering the glass wetting layer 708 over the first end 706a of each of the copper posts 706 and then performing a firing process to the glass particles. In the firing process, the supporting holder 701 may be heated at a temperature between 800 and 1,000 degrees Celsius for a firing time between 1 and 30 minutes.

Figure 5F:
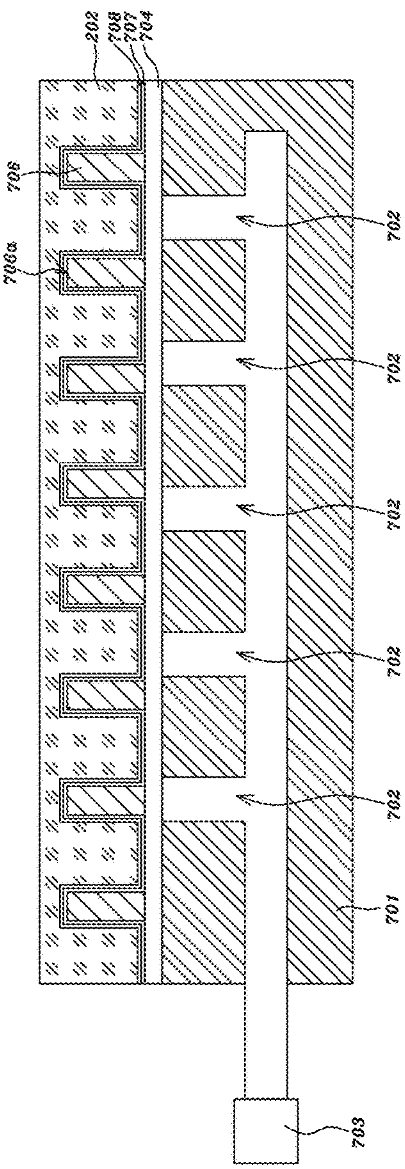

Alternatively, referring to FIG. 5F, a fixed kiln 710 may be provided with (1) a container 711 configured to contain a molten or liquid glass 712 and (2) a coil heater (not shown) on a wall of the container 711, configured to heat the molten or liquid glass 712 having between 90 and 95 percent of silicon dioxide by weight at a temperature between 800 and 1,000 degrees Celsius, (3) an inlet 713 for air pressure control and (4) a nozzle 714 at a bottom of the container 711, configured to drop or flow the molten or liquid glass 712 from the container 711 to the copper plate 704. After the glass wetting layer 708 is formed as illustrated in FIG. 5D, the glass substrate 202 as seen in FIG. 5E may be formed of silicon oxide by moving the supporting holder 701 in horizontal directions 715 under the fixed kiln 710 as seen in FIG. 5F, wherein the supporting holder 701 may be heated at a temperature between 590 and 900 degrees Celsius, to drop or flow the molten or liquid glass 712 from the container 711 to the copper plate 704 through the nozzle 714 with covering the glass wetting layer 708 over the first end 706a of each of the copper posts 706.

Figure 5G:
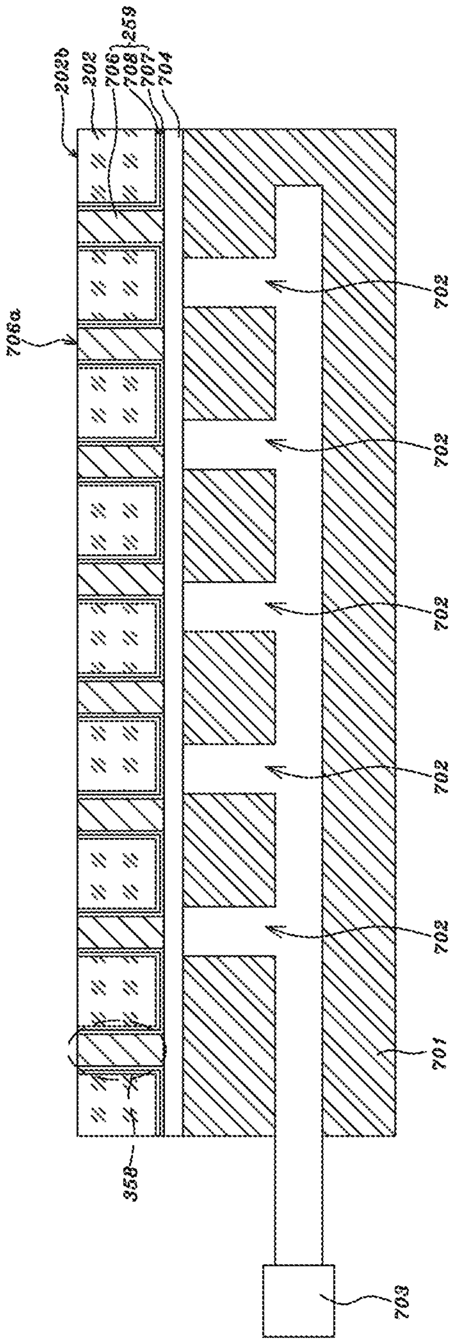

Next, referring to FIG. 5G, a chemical mechanical polishing (CMP), polishing or grinding process may be performed to remove a top portion of the glass substrate 202 to planarize the first end 706a of each of the copper posts 706 and a frontside 202b of the glass substrate 202. Thereby, the glass wetting layer 708 and cap layer 707 over the first end 706a of each of the copper posts 706 are removed to expose the first end 706a of each of the copper posts 706. The first end 706a of each of the copper posts 706 is coplanar with the frontside 202b of the glass substrate 202. Thereby, a through-glass-via (TGV) substrate may be formed as seen in FIG. 5G. The copper posts 706 and cap layer 707 in the glass substrate 202 may compose multiple through glass vias (TGVs) 259. Each of the through glass vias (TGVs) 259 may be used as a vertical through via (VTV) 358 for a dedicated vertical path. For each of the through glass vias (TGVs) 259, its copper post 706 may be in the glass substrate 202 and its cap layer 707 may be on the sidewall of its copper post 706 and around its copper post 706.

Figure 5H:
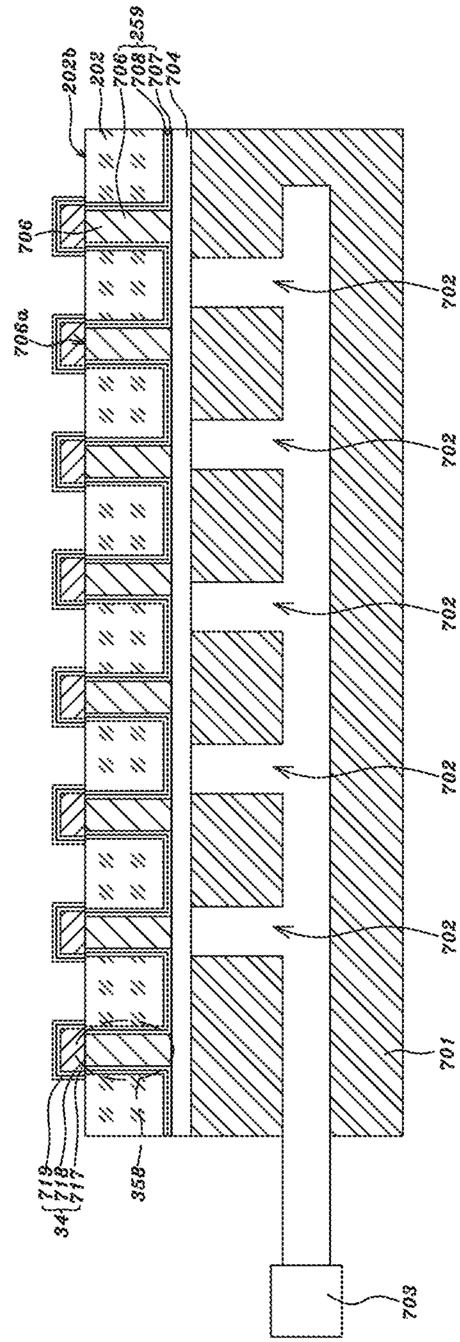

Next, referring to FIG. 5H, a fifth type of micro-bump or micro-pillar 34, i.e., metal bump or pad, may be formed on the first end 706*a* of the copper post 706 of each of the through glass vias (TGVs) 259 by electroplating a coper layer 717 with a thickness between 3 and 10 micrometers on the first end 706*a* of the copper post 706 of said each of the through glass vias (TGVs) 259, electroplating a nickel layer 718 with a thickness between 1 and 5 micrometers on a top and sidewall of the copper layer 717 and electroplating a solder layer 719, such as a tin-silver alloy or a tin-lead alloy, with a thickness between 1 and 20 micrometers on a top and sidewall of the nickel layer 718.

Figure 5I:
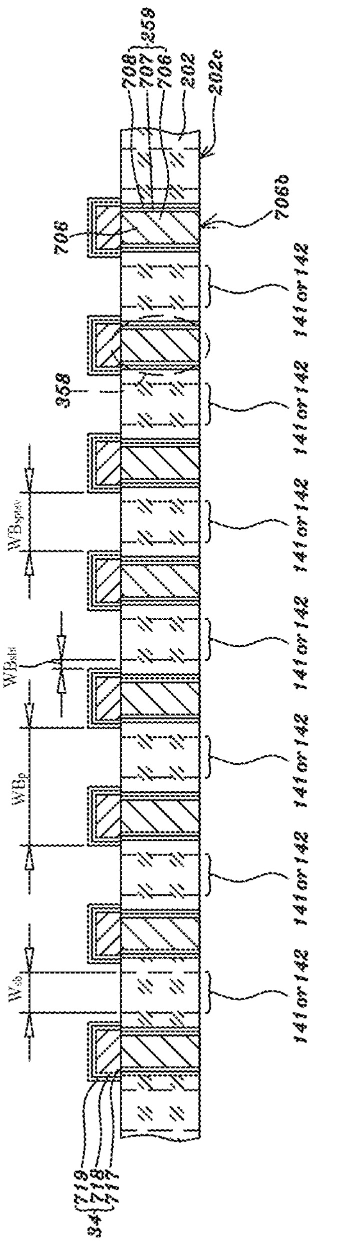
Figure 5J:
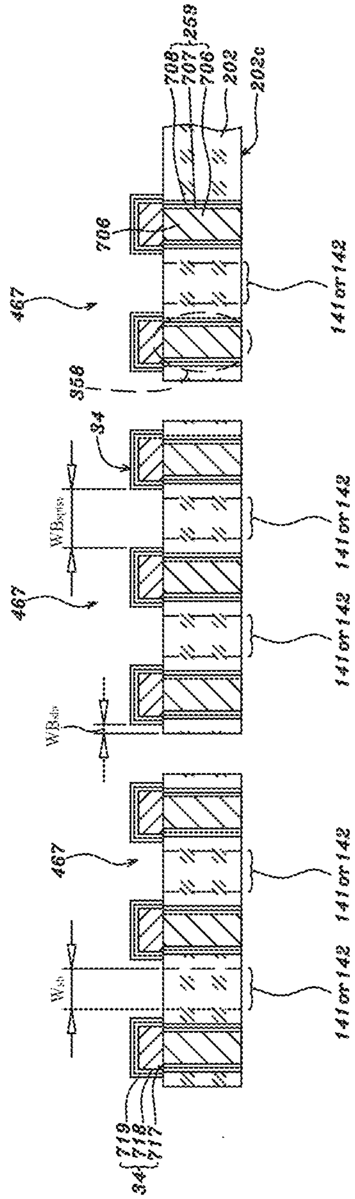
Figure 5K:
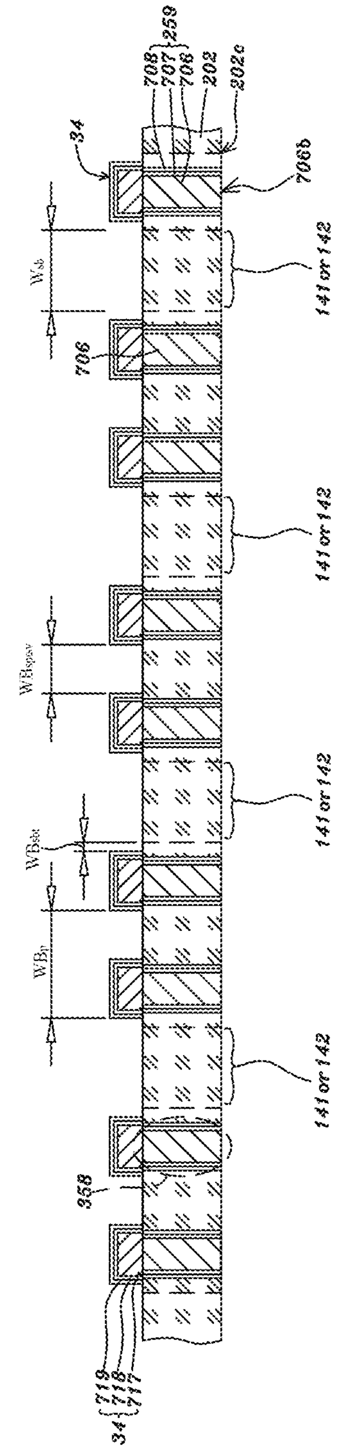
FIGS. 5K and 5L are schematically cross-sectional views showing a process for forming a first type of vertical-through-via (VTV) connector based on a single-layered through-glass-via (TGV) substrate for the second case in accordance with an embodiment of the present application.
Figure 5L:
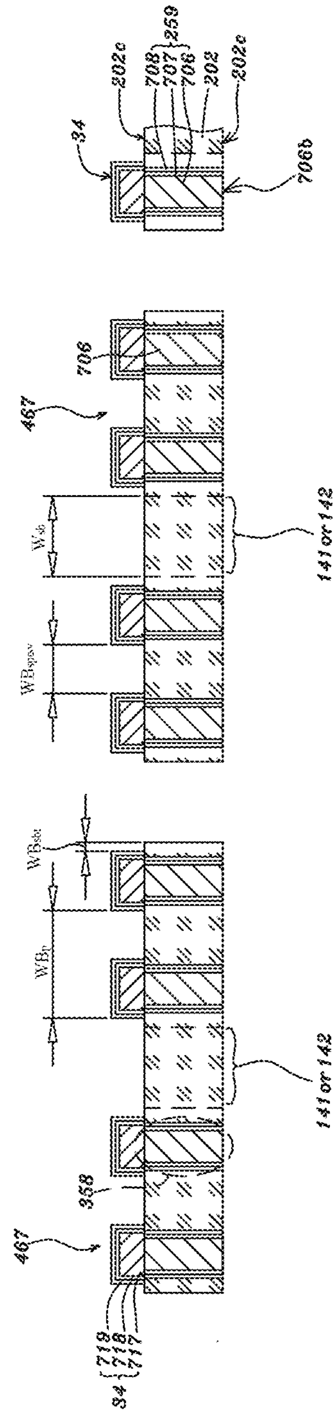
Figure 5M:
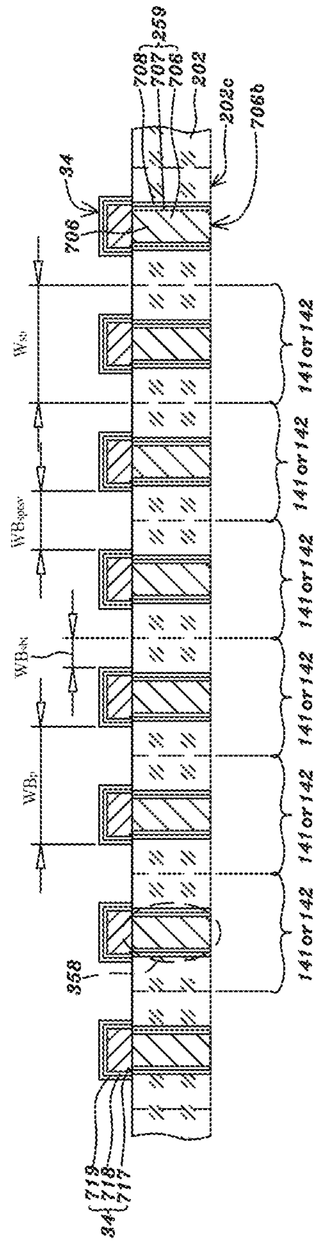
FIGS. 5M and 5N are schematically cross-sectional views showing a process for forming a first type of vertical-through-via (VTV) connector based on a single-layered through-glass-via (TGV) substrate for the third case in accordance with an embodiment of the present application.
Figure 5N:
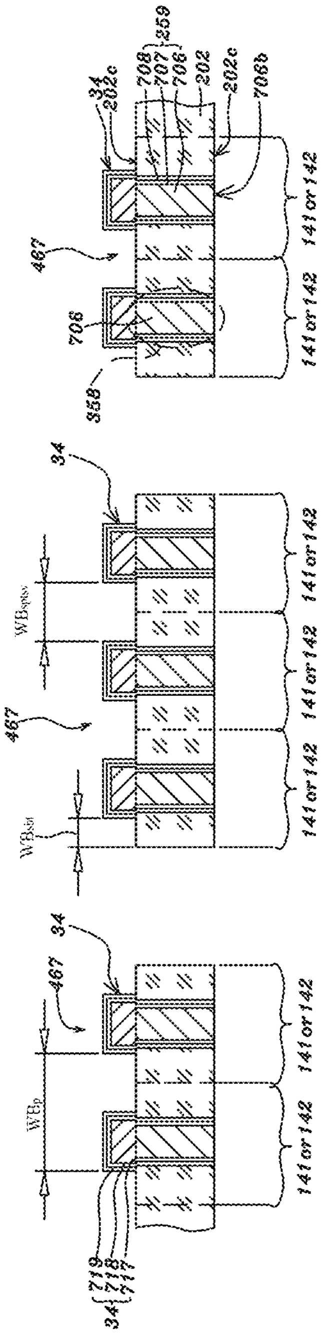

Next, referring to FIG. 5I, the copper plate 704, glass wetting layer 708 and cap layer 707 under the glass substrate 202 may be removed as seen in FIG. 5J by a chemical-mechanical polishing (CMP) process or mechanical grinding process to expose a second end 706*b* of the copper post 706 of each of the through glass vias (TGVs) 259. The second end 706*b* of the copper post 706 of each of the through glass vias (TGVs) 259 is coplanar with a backside 202*c* of the glass substrate 202.

2. First Type of Vertical-Through-Via (VTV) Connector for Through-Glass-Via Interconnect Elevator (TGVIE) Processed from Stacked Through-Glass-Via (TGV) Substrates FIGS. 6A-6D are schematically cross-sectional views showing a process for forming a first type of vertical-through-via (VTV) connector based on stacked through-glass-via (TGV) substrates for the first case in accordance with an embodiment of the present application. FIGS. 6E and 6F are schematically cross-sectional views showing a process for forming a first type of vertical-through-via (VTV) connector based on stacked through-glass-via (TGV) substrates for the second case in accordance with an embodiment of the present application. FIGS. 6G and 6H are schematically cross-sectional views showing a process for forming a first type of vertical-through-via (VTV) connector based on stacked through-glass-via (TGV) substrates for the third case in accordance with an embodiment of the present application.

Figure 6A:
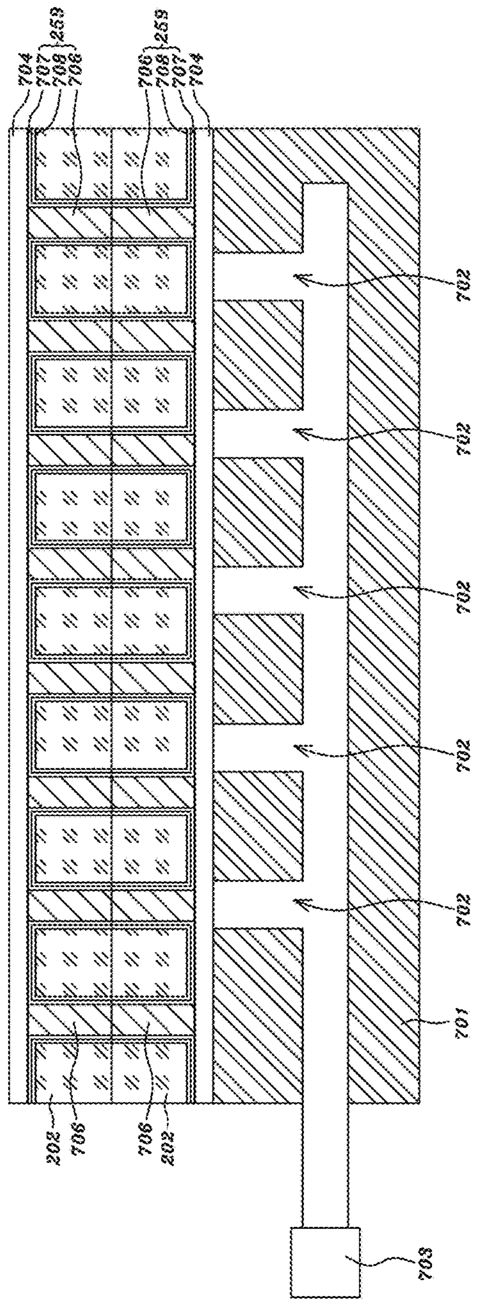
FIGS. 6A-6D are schematically cross-sectional views showing a process for forming a first type of vertical-through-via (VTV) connector based on stacked through-glass-via (TGV) substrates for the first case in accordance with an embodiment of the present application.

Referring to FIG. 6A, a number of through-glass-via (TGV) substrates each as illustrated in FIG. 5G may be provided, a second one of which is flipped to be stacked over a first one thereof by (1) activating the frontside 202*b*, i.e., silicon oxide, of the glass substrate 202 of each of the first and second ones of the through-glass-via (TGV) substrates with nitrogen plasma for increasing hydrophilic property thereof, (2) next rinsing the frontside 202*b* of the glass substrate 202 of each of the first and second ones of the through-glass-via (TGV) substrates with deionized water for water adsorption and cleaning, (3) next placing the second one of the through-glass-via (TGV) substrates onto the first one of the through-glass-via (TGV) substrates with each of the through glass vias (TGVs) 259 of the second one of the through-glass-via (TGV) substrates in contact with one of the through glass vias (TGVs) 259 of the first one of the through-glass-via (TGV) substrates and with the frontside 202*b* of the glass substrate 202 of the second one of the through-glass-via (TGV) substrates in contact with the frontside 202*b* of the glass substrate 202 of the first one of the through-glass-via (TGV) substrates, and (4) next performing a direct bonding process including (a) oxide-to-oxide bonding at a temperature between 100 and 200 degrees Celsius and for a time period between 5 and 20 minutes to bond the frontside 202*b* of the glass substrate 202 of the second one of the through-glass-via (TGV) substrates to the frontside 202*b* of the glass substrate 202 of the first one of the through-glass-via (TGV) substrates and (b) copper-to-copper bonding at a temperature between 300 and 350 degrees Celsius and for a time period between 10 and 60 minutes to bond the first end 706*a* of the copper post 706 of each of the through glass vias (TGVs) 259 of the second one of the through-glass-via (TGV) substrates to the first end 706*a* of the copper post 706 of one of the through glass vias (TGVs) 259 of the first one of the through-glass-via (TGV) substrates, wherein the oxide-to-oxide bonding may be caused by water desorption from reaction between the frontside 202*b* of the silicon substrate 202 of the second one of the through-glass-via (TGV) substrates and the frontside 202*b* of the silicon substrate 202 of the first one of the through-glass-via (TGV) substrates, and the copper-to-copper bonding may be caused by metal inter-diffusion between the first end 706*a* of the copper post 706 of each of the through glass vias (TGVs) 259 of the second one of the through-glass-via (TGV) substrates and the first end 706*a* of the copper post 706 of one of the through glass vias (TGVs) 259 of the first one of the through-glass-via (TGV) substrates.

Figure 6B:
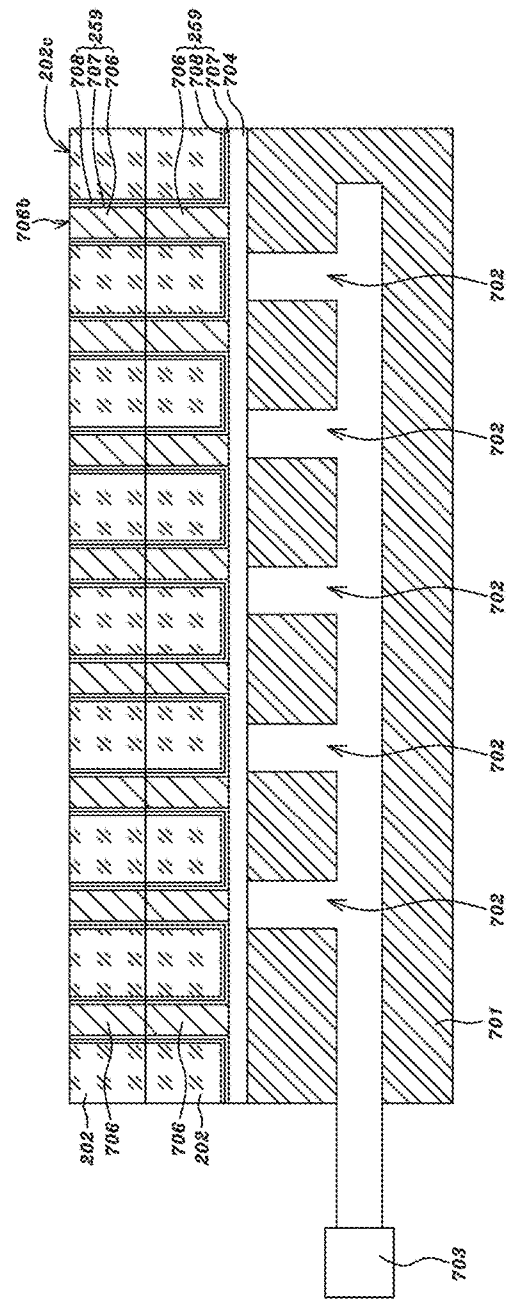

Next, the copper plate 704, glass wetting layer 708 and cap layer 707 over the glass substrate 202 of the second one of the through-glass-via (TGV) substrates at the top side thereof may be removed as seen in FIG. 6B by a chemical-mechanical polishing (CMP) process to expose a second end 706*b* of each of the copper posts 706 of the second one of the through-glass-via (TGV) substrates. The second end 706*b* of each of the copper posts 706 of the second one of the through-glass-via (TGV) substrates is coplanar with a backside 202*c* of the glass substrate 202 of the second one of the through-glass-via (TGV) substrates. For each of the through glass vias (TGVs) 259 of the second one of the through-glass-via (TGV) substrates, its copper post 706 may be in the glass substrate 202 of the second one of the through-glass-via (TGV) substrates and its cap layer 707 may be on the sidewall of its copper post 706 and around its copper post 706.

Figure 6C:
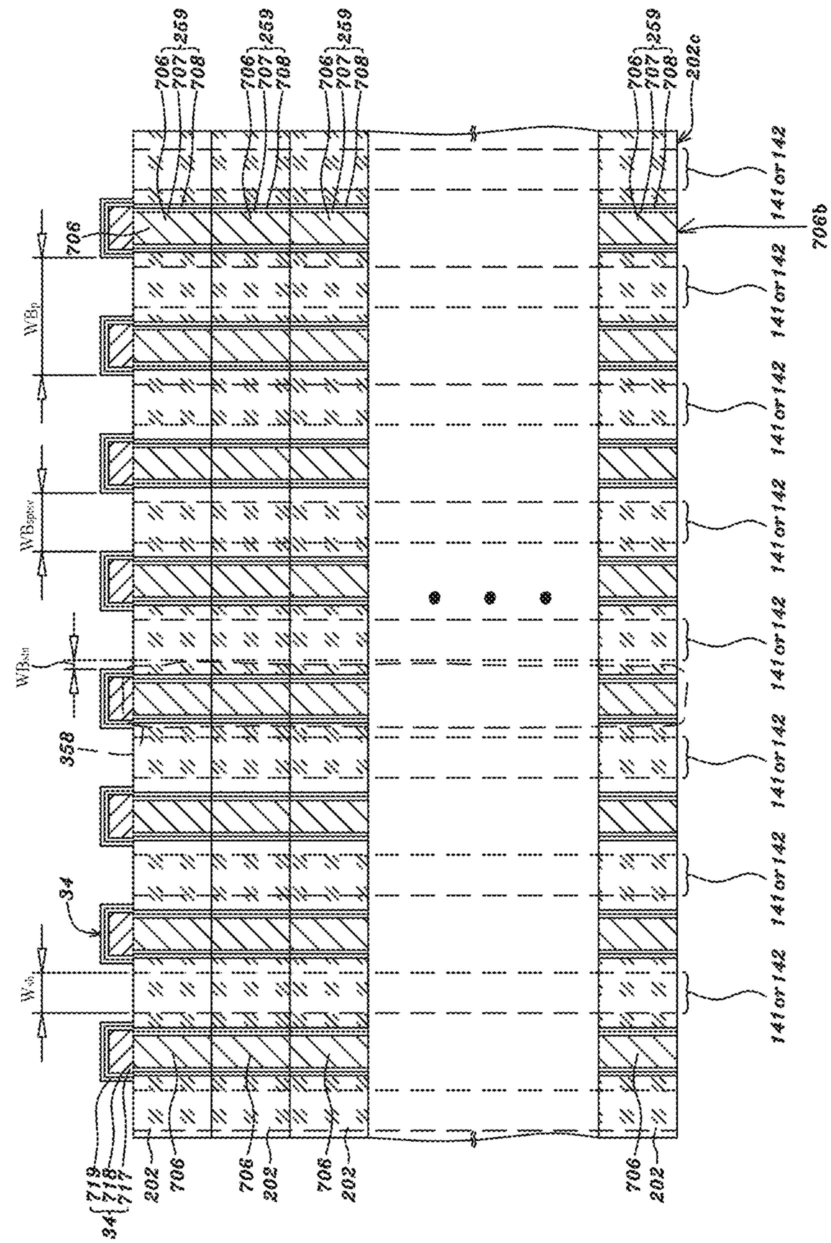

Next, referring to FIGS. 6B and 6C, a third one of the through-glass-via (TGV) substrates as seen in FIG. 5G may be flipped to be stacked over the second one of the through-glass-via (TGV) substrates by (1) activating the frontside 202*b*, i.e., silicon oxide, of the glass substrate 202 of the third one of the through-glass-via (TGV) substrates and the backside 202*c*, i.e., silicon oxide, of the glass substrate 202 of the second one of the through-glass-via (TGV) substrates with nitrogen plasma for increasing hydrophilic property thereof, (2) next rinsing the frontside 202*b* of the glass substrate 202 of the third one of the through-glass-via (TGV) substrates and the backside 202*c* of the glass substrate 202 of the second one of the through-glass-via (TGV) substrates with deionized water for water adsorption and cleaning, (3) next placing the third one of the through-glass-via (TGV) substrates onto the second one of the through-glass-via (TGV) substrates with each of the through glass vias (TGVs) 259 of the third one of the through-glass-via (TGV) substrates in contact with one of the through glass vias (TGVs) 259 of the second one of the through-glass-via (TGV) substrates and with the frontside 202*b* of the glass substrate 202 of the third one of the through-glass-via (TGV) substrates in contact with the backside 202*c* of the glass substrate 202 of the second one of the through-glass-via (TGV) substrates, and (4) next performing a direct bonding process including (a) oxide-to-oxide bonding at a temperature between 100 and 200 degrees Celsius and for a time period between 5 and 20 minutes to bond the frontside 202*b* of the glass substrate 202 of the third one of the through-glass-via (TGV) substrates to the backside 202*c* of the glass substrate 202 of the second one of the through-glass-via (TGV) substrates and (b) copper-to-copper bonding at a temperature between 300 and 350 degrees Celsius and for a time period between 10 and 60 minutes to bond the first end 706*a* of the copper post 706 of each of the through glass vias (TGVs) 259 of the third one of the through-glass-via (TGV) substrates to the second end 706*b* of the copper post 706 of one of the through glass vias (TGVs) 259 of the second one of the through-glass-via (TGV) substrates, wherein the oxide-to-oxide bonding may be caused by water desorption from reaction between the frontside 202*b* of the glass substrate 202 of the third one of the through-glass-via (TGV) substrates and the backside 202*c* of the glass substrate 202 of the second one of the through-glass-via (TGV) substrates, and the copper-to-copper bonding may be caused by metal inter-diffusion between the first end 706*a* of the copper post 706 of each of the through glass vias (TGVs) 259 of the third one of the through-glass-via (TGV) substrates and the second end 706*b* of the copper post 706 of one of the through glass vias (TGVs) 259 of the second one of the through-glass-via (TGV) substrates.

Next, the copper plate 704, glass wetting layer 708 and cap layer 707 over the glass substrate 202 of the third one of the through-glass-via (TGV) substrates at the top side thereof may be removed as seen in FIG. 6C by a chemical-mechanical polishing (CMP) process or mechanical grinding process to expose a second end 706*b* of each of the copper posts 706 of the third one of the through-glass-via (TGV) substrates. The second end 706*b* of each of the copper posts 706 of the third one of the through-glass-via (TGV) substrates is coplanar with a backside 202*c* of the glass substrate 202 of the third one of the through-glass-via (TGV) substrates. For each of the through glass vias (TGVs) 259 of the third one of the through-glass-via (TGV) substrates, its copper post 706 may be in the glass substrate 202 of the third one of the stacked through-glass-via (TGV) substrates and its cap layer 707 may be on the sidewall of its copper post 706 and around its copper post 706.

The step for flipping another of the through-glass-via (TGV) substrates as seen in FIG. 5G to be stacked over the topmost one of the through-glass-via (TGV) substrates stacked in the previous steps, as mentioned in FIG. 6C, may be repeated one or more times to form stacked through-glass-via (TGV) substrates as seen in FIG. 6C. The copper plate 704, glass wetting layer 708 and cap layer 707 over the glass substrate 202 of a last one of the stacked through-glass-via (TGV) substrates at the top side thereof may be removed as seen in FIG. 6C by a chemical-mechanical polishing (CMP) process or mechanical grinding process to expose a second end 706*b* of each of the copper posts 706 of the last one of the stacked through-glass-via (TGV) substrates. The second end 706*b* of each of the copper posts 706 of the last one of the stacked through-glass-via (TGV) substrates is coplanar with a backside 202*c* of the glass substrate 202 of the last one of the stacked through-glass-via (TGV) substrates. For each of the through glass vias (TGVs) 259 of the last one of the stacked through-glass-via (TGV) substrates, its copper post 706 may be in the glass substrate 202 of the last one of the stacked through-glass-via (TGV) substrates and its cap layer 707 may be on the sidewall of its copper post 706 and around its copper post 706.

Next, referring to FIG. 6C, a fifth type of micro-bump or micro-pillar 34, i.e., metal bump or pad, may be formed on the second end 706*b* of the copper post 706 of each of the through glass vias (TGVs) 259 of the last one of the stacked through-glass-via (TGV) substrates at the top side thereof by electroplating a coper layer 717 with a thickness between 3 and 10 micrometers on the second end 706*b* of the copper post 706 of said each of the through glass vias (TGVs) 259, electroplating a nickel layer 718 with a thickness between 1 and 5 micrometers on a top and sidewall of the copper layer 717 and electroplating a solder layer 719, such as a tin-silver alloy or a tin-lead alloy, with a thickness between 1 and 20 micrometers on a top and sidewall of the nickel layer 718.

Next, referring to FIG. 6C, the copper plate 704, glass wetting layer 708 and cap layer 707 under the glass substrate 202 of the first one of the stacked through-glass-via (TGV) substrates may be removed by a chemical-mechanical polishing (CMP) process or mechanical grinding process to expose a second end 706*b* of each of the copper posts 706 of the first one of the stacked through-glass-via (TGV) substrates. The second end 706*b* of each of the copper posts 706 of the first one of the stacked through-glass-via (TGV) substrates is coplanar with a backside 202*c* of the glass substrate 202 of the first one of the stacked through-glass-via (TGV) substrates. Thus, multiple of the through glass vias (TGVs) 259 may be stacked with each other or one another to form a vertical through via (VTV) 358 for a dedicated vertical path, wherein an upper one of said multiple of the through glass vias (TGVs) 259 may be stacked with a lower one of said multiple of the through glass vias (TGVs) 259 via copper-to-copper bonding. Each of the through glass vias (TGVs) 259 of each of the stacked through-glass-via (TGV) substrates may have a thickness between 30 and 100 micrometers.

3. Arrangements for First Type of Vertical-Through-Via (VTV) Connector Processed from Single-layered or Stacked Through-Glass-Via (TGV) Substrate(s)

Referring to each of FIGS. 5I and 6C for the first case, the arrangements for the vertical through vias (VTVs) 358 may be the same as those as illustrated in FIGS. 4A and 4B. Referring to FIGS. 4A, 4B, 5I and 6C, a pitch $W_p$ in one of the x and y directions between each neighboring two of the vertical through vias (VTVs) 358 may range from 20 to 150 micrometers or from 40 to 100 micrometers; and a space $W_{sptsv}$ in each of the x and y directions between each neighboring two of the vertical through vias (VTVs) 358 may range from 20 to 150 micrometers or from 40 to 100 micrometers. Between each neighboring two of the vertical through vias (VTVs) 358 is one of the first and second reserved scribe lines 141 and 142. The arrangements for the first and second reserved scribe lines 141 and 142 may be the same as those as illustrated in FIGS. 4A and 4B. Referring to FIGS. 4A, 4B, 5I and 6C, the first reserved scribe lines 141 may extend in the y direction, and the second reserved scribe lines 142 may extend in the x direction. The arrangements for the fifth type of micro-bumps or micro-pillars 34 may be the same, respectively, as those for the first, second, third or fourth type of micro-bumps or micro-pillars 34 as illustrated in FIGS. 4G and 4H. Referring to FIGS. 4G, 4H, 5I and 6C, a pitch $WB_p$ in one of the x and y directions between each neighboring two of the fifth type of micro-bumps or micro-pillars 34 may range from 20 to 150 micrometers or from 40 to 100 micrometers; and a space $WB_{sptsv}$ in one of the x and y directions between each neighboring two of the fifth type of micro-bumps or micro-pillars 34 may range from 20 to 150 micrometers or from 40 to 100 micrometers. Between each neighboring two of the fifth type of micro-bumps or micro-pillars 34 is one of the first and second reserved scribe lines 141 and 142.

Alternatively, referring to each of FIGS. 5K and 6E for the second case, the arrangements for the islands or regions 188 of arrays of vertical through vias (VTVs) and vertical through vias (VTVs) 358 may be the same as those as illustrated in FIGS. 4C and 4D. Referring to FIGS. 4C, 4D, 5K and 6E, between each neighboring two islands or regions 188 of arrays of vertical through vias (VTVs) is one of the x and y reserved scribe lines 141 and 142, but neighboring two of the vertical through vias (VTVs) 358 in each of the islands or regions 188 of arrays of vertical through vias (VTVs) is none of the first and second reserved scribe lines 141 and 142. The arrangements for the first and second reserved scribe lines 141 and 142 may be the same as those as illustrated in FIGS. 4C and 4D. Referring to FIGS. 4C, 4D, 5K and 6E, the first reserved scribe lines 141 may extend in the y direction, and the second reserved scribe lines 142 may extend in the x direction. A pitch $W_p$ in one of the x and y directions between each neighboring two of the vertical through vias (VTVs) 358 in each of the islands or regions 188 of arrays of vertical through vias (VTVs) may range from 5 to 50 micrometers or from 5 to 20 micrometers or may be smaller than 50, 40 or 30 micrometers; and a space $W_{sptsv}$ in one of the x and y directions between each neighboring two of the vertical through vias (VTVs) 358 in each of the islands or regions 188 of arrays of vertical through vias (VTVs) may range from 5 to 50 micrometers or from 5 to 20 micrometers or may be smaller than 50, 40 or 30 micrometers. The pitch $W_p$ and space $W_{sptsv}$ in one of the x and y directions between each neighboring two of the vertical through vias (VTVs) 358 in each of the islands or regions 188 of arrays of vertical through vias (VTVs) may be smaller than a width $W_{sb}$ of said one of the x and y directions of one of the first and second reserved scribe lines 141 and 142 and/or smaller than a space $W_{spild}$ in said one of the x and y directions between neighboring two of the vertical through vias (VTVs) 358 respectively in neighboring two of the islands or regions 188 of arrays of vertical through vias (VTVs) and across said one of the first and second reserved scribe lines 141 or 142. The space $W_{spild}$ in one of the x and y directions between each neighboring two of the vertical through vias (VTVs) 358 respectively in neighboring two of the islands or regions 188 of arrays of vertical through vias (VTVs) may be greater than 50, 40 or 30 micrometers. The arrangements for the islands or regions of arrays 88 of micro-bumps or micro-pillars and fifth type of micro-bumps or micro-pillars 34 may be the same, respectively, as those for the islands or regions of arrays 88 of micro-bumps or micro-pillars and first, second, third or fourth type of micro-bumps or micro-pillars 34 as illustrated in FIGS. 41 and 4J. Referring to FIGS. 4I, 4J, 5K and 6E, between each neighboring two of the islands or regions of arrays 88 of micro-bumps or micro-pillars is one of the first and second reserved scribe lines 141 and 142, but neighboring two of the fifth type of micro-bumps or micro-pillars 34 in each of the islands or regions of arrays 88 of micro-bumps or micro-pillars is none of the first and second reserved scribe lines 141 and 142. A pitch $WB_p$ in one of the x and y directions between each neighboring two of the fifth type of micro-bumps or micro-pillars 34 in each of the islands or regions of arrays 88 of micro-bumps or micro-pillars may range from 5 to 50 micrometers or from 5 to 20 micrometers or may be smaller than 50, 40 or 30 micrometers; and a space $WB_{sptsv}$ in one of the x and y directions between each neighboring two of the fifth type of micro-bumps or micro-pillars 34 in each of the islands or regions of arrays 88 of micro-bumps or micro-pillars may range from 5 to 50 micrometers or from 5 to 20 micrometers or may be smaller than 50, 40 or 30 micrometers. The pitch $WB_p$ and space $WB_{sptsv}$ in one of the x and y directions between each neighboring two of the fifth type of micro-bumps or micro-pillars 34 in each of the islands or regions of arrays 88 of micro-bumps or micro-pillars may be smaller than the width $W_{sb}$ of said one of the x and y directions of one of the first and second reserved scribe lines 141 and 142 and/or smaller than a space $WB_{spildd}$ in said one of the x and y directions between neighboring two of the fifth type of micro-bumps or micro-pillars 34 respectively in neighboring two of the islands or regions of arrays 88 of micro-bumps or micro-pillars and across said one of the first and second reserved scribe lines 141 or 142. The space $WB_{spild}$ in one of the x and y directions between each neighboring two of the fifth type of micro-bumps or micro-pillars 34 respectively in neighboring two of the islands or regions of arrays 88 of micro-bumps or micro-pillars may be greater than 50, 40 or 30 micrometers.

Alternatively, referring to each of FIGS. 5M and 6G for the third case, the arrangements for the vertical through vias (VTVs) 358 may be the same as those as illustrated in FIGS. 4E and 4F. Referring to FIGS. 4E, 4F, 5M and 6G, a pitch $W_p$ in one of the x and y directions between each neighboring two of the vertical through vias (VTVs) 358 may range from 5 to 50 micrometers or from 5 to 20 micrometers or may be smaller than 50, 40 or 30 micrometers; and a space $W_{sptsv}$ in one of the x and y directions between each neighboring two of the vertical through vias (VTVs) 358 may range from 5 to 50 micrometers or from 5 to 20 micrometers or may be smaller than 50, 40 or 30 micrometers. The arrangements for the first and second reserved scribe lines 141 and 142 may be the same as those as illustrated in FIGS. 4E and 4F. Referring to FIGS. 4E, 4F, 5M and 6G, multiple first reserved scribe lines 141 may extend in the y direction, wherein each of the first reserved scribe lines 141 may extend in line with multiple of the vertical through vias (VTVs) 358 arranged in a line in the y direction; multiple second reserved scribe lines 142 may extend in the x direction, wherein each of the second reserved scribe lines 142 may extend in line with multiple of the vertical through vias (VTVs) 358 arranged in a line in the x direction. Accordingly, the pitch $W_p$ and space $W_{sptsv}$ in one of the x and y directions between each neighboring two of the vertical through vias (VTVs) 358 may be smaller than the width $W_{sb}$ of said one of the x and y directions of one of the first and second reserved scribe lines 141 and 142. The arrangements for the fifth type of micro-bumps or micro-pillars 34 may be the same, respectively, as those for the first, second, third or fourth type of micro-bumps or micro-pillars 34 as illustrated in FIGS. 4K and 4L. Referring to FIGS. 4K, 4L, 5M and 6G, a pitch $WB_p$ in one of the x and y directions between each neighboring two of the fifth type of micro-bumps or micro-pillars 34 may range from 5 to 50 micrometers or from 5 to 20 micrometers or may be smaller than 50, 40 or 30 micrometers; and a space $WB_{sptsv}$ in one of the x and y directions between each neighboring two of the fifth type of micro-bumps or micro-pillars 34 may range from 5 to 50 micrometers or from 5 to 20 micrometers or may be smaller than 50, 40 or 30 micrometers. Each of the first reserved scribe lines 141 may extend in line with multiple of the fifth type of micro-bumps or micro-pillars 34 arranged in a line in the y direction; each of the second reserved scribe lines 142 may extend in line with multiple of the vertical through vias (VTVs) 358 arranged in a line in the x direction. Accordingly, the pitch $WB_p$ and space $WB_{sptsv}$ in one of the x and y directions between each neighboring two of the fifth type of micro-bumps or micro-pillars 34 may be smaller than the width $W_{sb}$ of said one of the x and y directions of one of the first and second reserved scribe lines 141 and 142.

Figure 6D:
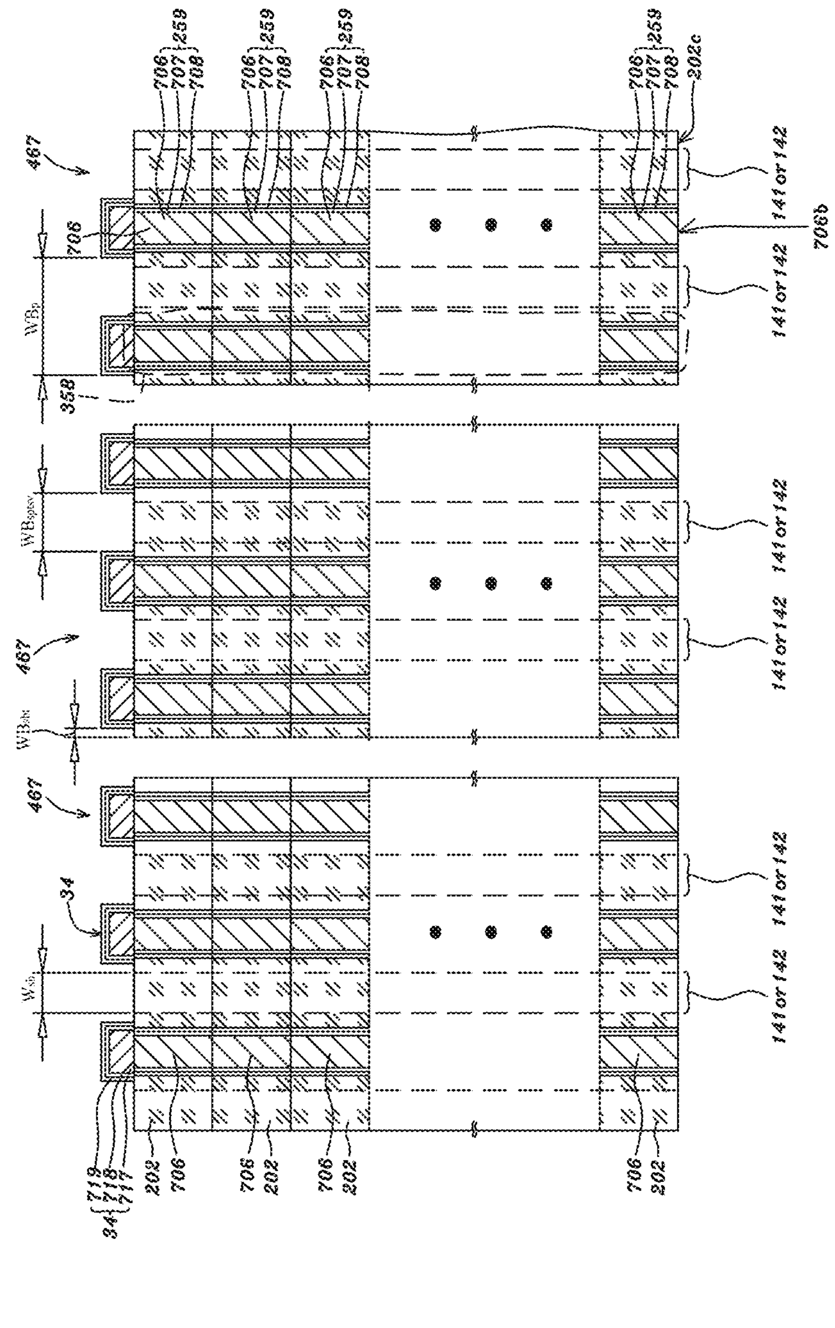
Figure 6E:
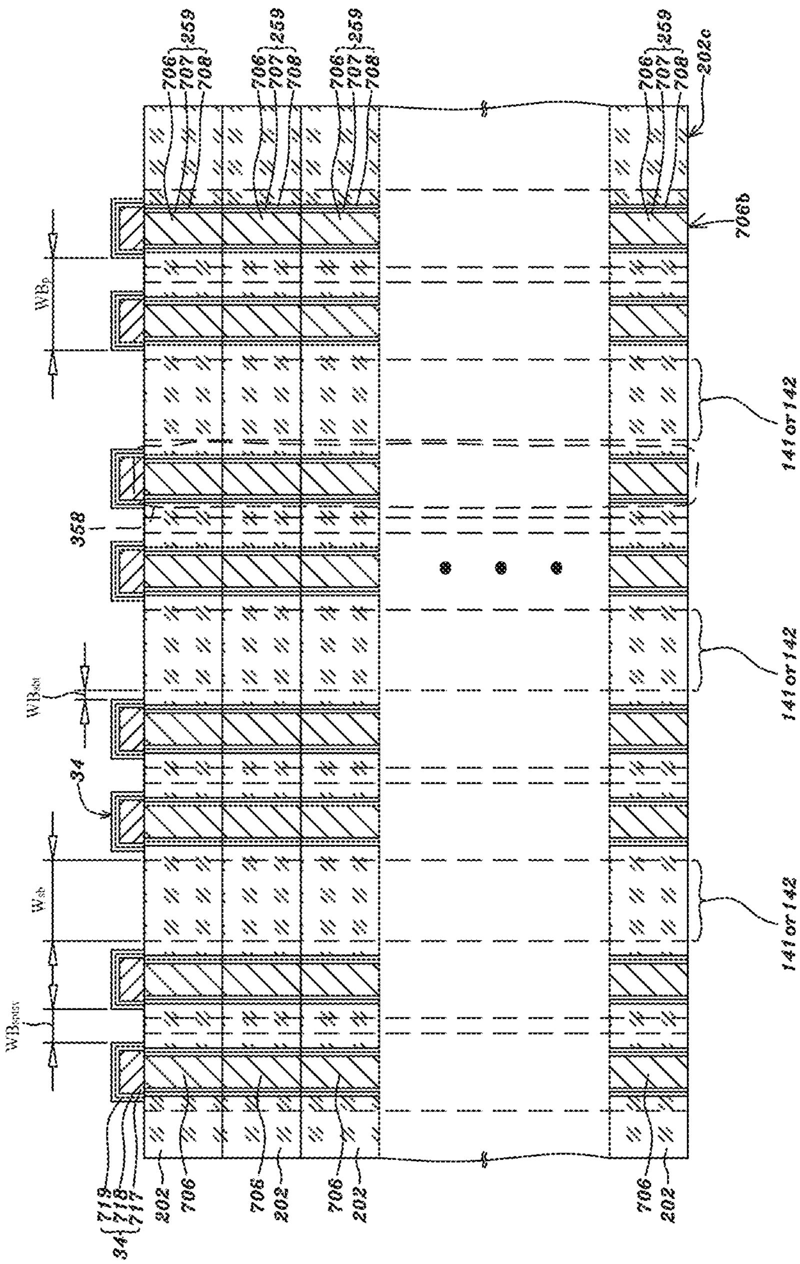
FIGS. 6E and 6F are schematically cross-sectional views showing a process for forming a first type of vertical-through-via (VTV) connector based on stacked through-glass-via (TGV) substrates for the second case in accordance with an embodiment of the present application.
Figure 6F:
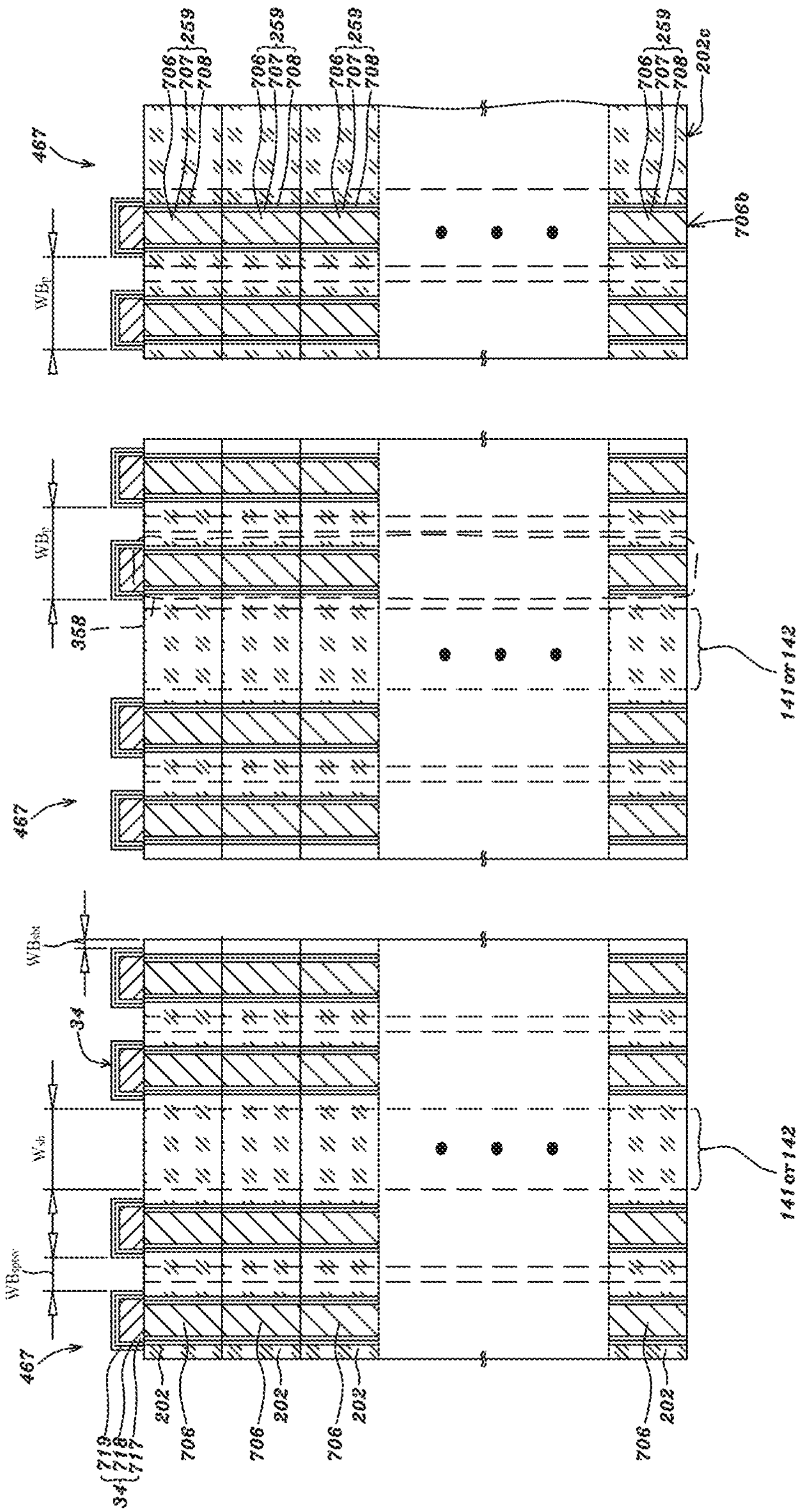
Figure 6G:
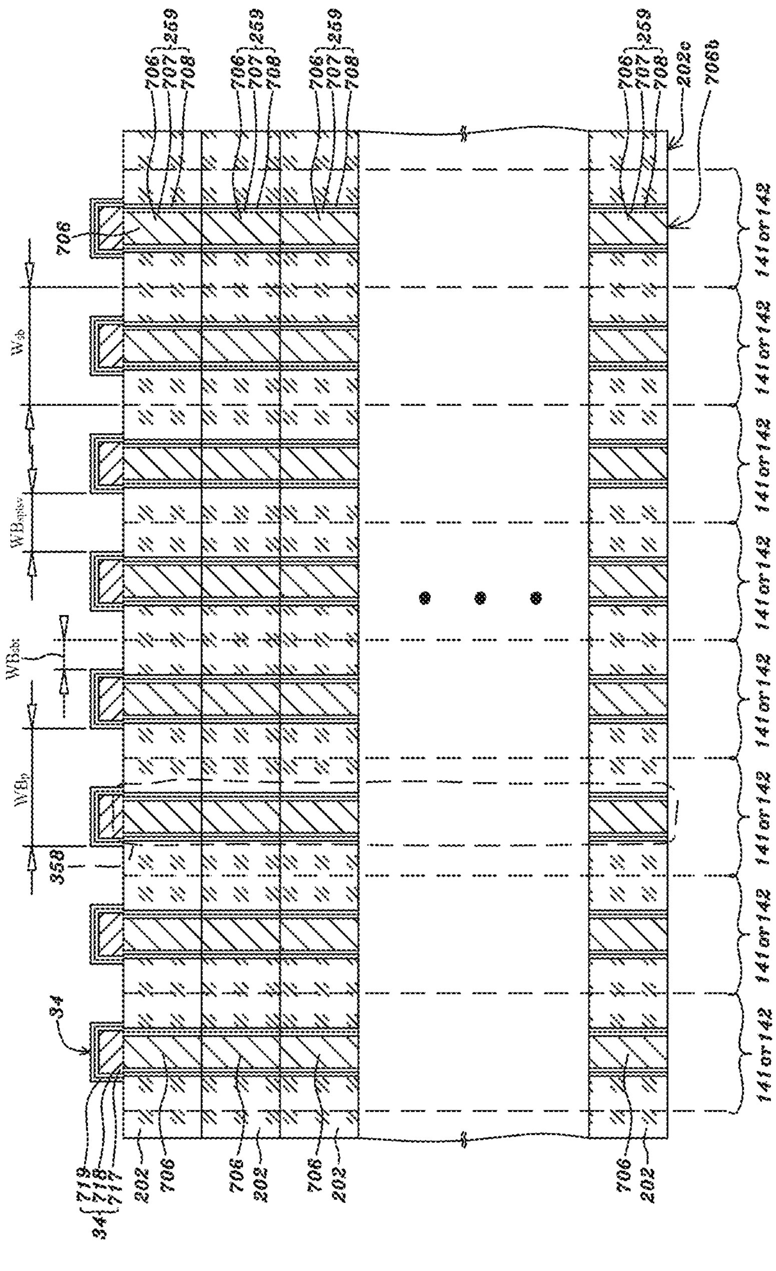
FIGS. 6G and 6H are schematically cross-sectional views showing a process for forming a first type of vertical-through-via (VTV) connector based on stacked through-glass-via (TGV) substrates for the third case in accordance with an embodiment of the present application.
Figure 6H:
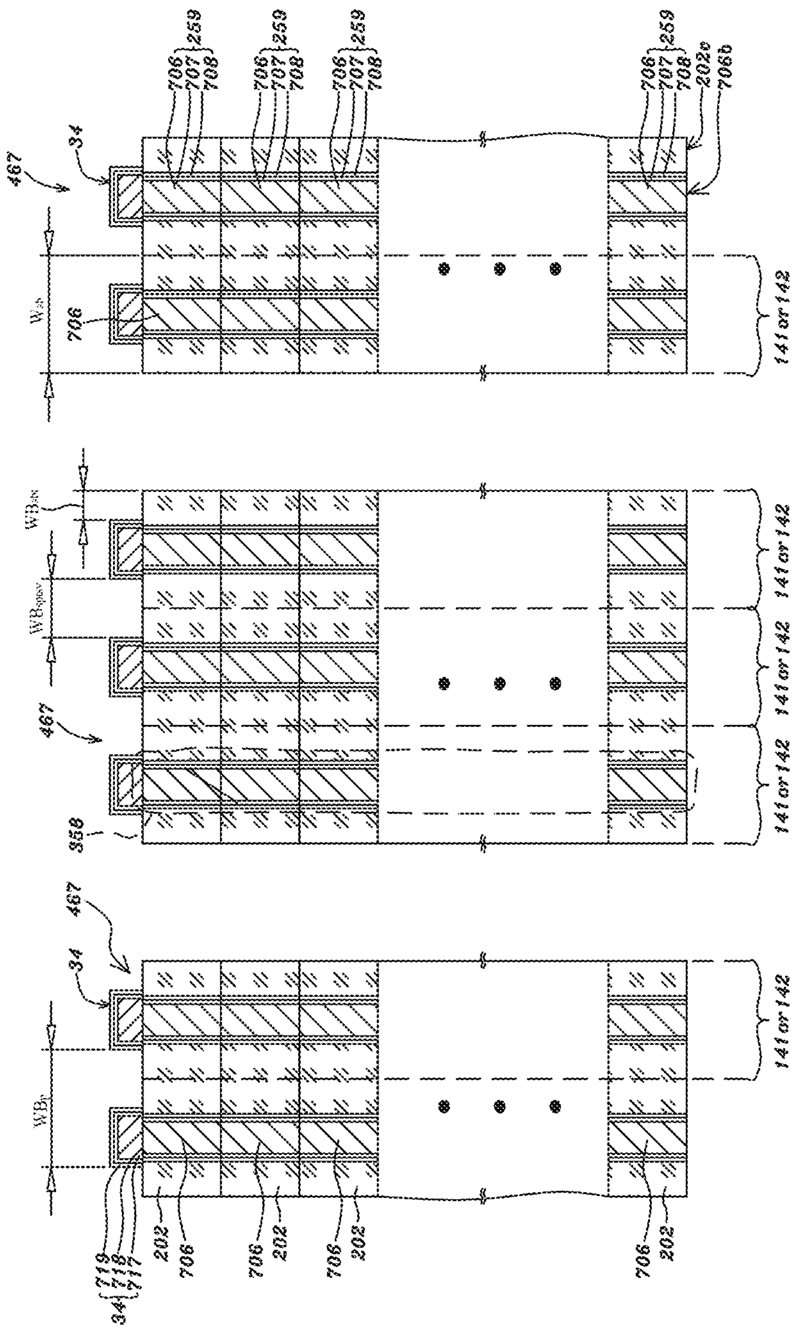

The first type of vertical-through-via (VTV) connector 467 to be processed from the single-layered through-glass-via (TGV) substrate as seen in FIG. 5I, 5K or 5M or stacked through-glass-via (TGV) substrate as seen in FIG. 6C, 6E or 6G may have a size to be selected from various sizes after the temporary substrate (T-sub) 590 and sacrificial bonding layer 591 are released from the single-layered through-glass-via (TGV) substrate. When a size for the first type of vertical-through-via (VTV) connectors 467 is selected or determined, the single-layered through-glass-via (TGV) substrate shown in FIG. 5I, 5K or 5M may be cut or diced along (or through) some or all of the first reserved scribe lines 141 and some or all of the second reserved scribe lines 142 to form a number of the first type of vertical-through-via (VTV) connectors 467 in a single-die type, i.e., through-glass-via interconnect elevators (TGVIEs), each having the selected or predetermined size, as shown in FIG. 5J, 5L or 5N respectively, by a laser cutting process or by a mechanical cutting process; the stacked through-glass-via (TGV) substrate as seen in FIG. 6C, 6E or 6G may be cut or diced along (or through) some or all of the first reserved scribe lines 141 and some or all of the second reserved scribe lines 142 to form a number of the first type of vertical-through-via (VTV) connectors 467 in a single-die type, i.e., through-glass-via interconnect elevators (TGVIEs), each having the selected or predetermined size, as shown in FIG. 6D, 6F or 6H respectively, by a laser cutting process or by a mechanical cutting process. The aspect ratio of the length to the width for the first type of vertical-through-via (VTV) connector 467 may be between 2 and 10, between 4 and 10 or between 2 and 40. The first type of vertical-through-via (VTV) connector 467 may be provided with passive elements, such as capacitors. The first type of vertical-through-via (VTV) connector 467 may be manufactured by packaging manufacturing companies or facilities without front-end of line manufacturing capability. For the first type of vertical-through-via (VTV) connector 467 as seen in FIG. 5J, 5L or 5N, each of its vertical through vias (VTVs) 358 may have a thickness between 30 and 100 micrometers. For the first type of vertical-through-via (VTV) connector 467 as seen in FIG. 6D, 6F or 6H, each of its vertical through vias (VTVs) 358 may be formed by stacking multiple of its through glass vias (TGVs) 259 up to a total height between 100 and 2,000 micrometers, between 100 and 1,000 micrometers or between 100 and 500 micrometers.

For the first case, referring to FIGS. 4A, 4B, 4G and 4H, for the first type of vertical-through-via (VTV) connector 467 as seen in FIG. 5J or 6D, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358; furthermore, the distance $WB_{sbt}$ between its edge and one of its fifth type of micro-bumps or micro-pillars 34 may be smaller than the space $WB_{sptsv}$ between neighboring two of its fifth type of micro-bumps or micro-pillars 34 and optionally its edge may be aligned with an edge of said one of its fifth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers. For the second case, referring to FIGS. 4C, 4D, 4I and 4J, for the first type of vertical-through-via (VTV) connector 467 as seen in FIG. 5L or 6M, its space $W_{spild}$ in one of the x and y directions between each neighboring two of its vertical through vias (VTVs) 358 respectively in neighboring two of the islands or regions 188 of arrays of vertical through vias (VTVs) and across one of its first and second reserved scribe lines 141 and 142 between said neighboring two of its vertical through vias (VTVs) 358 may be greater than 50, 40 or 30 micrometers, and its space $WB_{spild}$ in one of the x and y directions between neighboring two of its fifth type of micro-bumps or micro-pillars 34 and across one of its first and second reserved scribe lines 141 and 142 between said neighboring two of its fifth type of micro-bumps or micro-pillars 34 may be greater than 50, 40 or 30 micrometers; furthermore, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358; the distance $WB_{sbt}$ between its edge and one of its fifth type of micro-bumps or micro-pillars 34 may be smaller than the space $WB_{sptsv}$ between neighboring two of its fifth type of micro-bumps or micro-pillars 34 and optionally its edge may be aligned with an edge of said one of its fifth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers. For the third case, referring to FIGS. 4E, 4F, 4K and 4L, for the first type of vertical-through-via (VTV) connector 467 as seen in FIG. 5N or 6H, the distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of said one of its vertical through vias (VTVs) 358, wherein the space $W_{sptsv}$ between neighboring two of its vertical through vias (VTVs) 358 may be smaller than 50, 40 or 30 micrometers; furthermore, the distance $WB_{sbt}$ between its edge and one of its fifth type of micro-bumps or micro-pillars 34 may be smaller than the space $WB_{sptsv}$ between neighboring two of its fifth type of micro-bumps or micro-pillars 34 and optionally its edge may be aligned with an edge of said one of its fifth type of micro-bumps or micro-pillars 34; alternatively, the distance $WB_{sbt}$ between its edge and one of its first, second, third or fourth type of micro-bumps or micro-pillars 34 may be smaller than 50, 40 or 30 micrometers; the space $WB_{sptsv}$ between neighboring two of its fifth type of micro-bumps or micro-pillars 34 may be smaller than 50, 40 or 30 micrometers.

For the first case, each of the first type of vertical-through-via (VTV) connectors 467 as seen in FIGS. 5J and 6D may be arranged with a size as seen in FIGS. 4A and 4G for containing 14-by-3 vertical through vias (VTVs) 358 and 14-by-3 fifth type of micro-bumps or micro-pillars 34 or another size as seen in FIGS. 4B and 4H for containing 21-by-6 vertical through vias (VTVs) 358 and 21-by-6 fifth type of micro-bumps or micro-pillars 34, for example. For the second case, each of the first type of vertical-through-via (VTV) connectors 467 as seen in FIGS. 5L and 6F may be arranged with a size as seen in FIGS. 4C and 4I for containing 2-by-2 islands or regions 188 of arrays of vertical through vias (VTVs), each island or region 188 of which contains 13-by-2 vertical through vias (VTVs) 358, and 2-by-2 islands or regions 88 of arrays of micro-bumps or micro-pillars, each island or region 88 of which contains 13-by-2 fifth type of micro-bumps or micro-pillars 34, or another size as seen in FIGS. 4D and 4J for containing 3-by-4 islands or regions 188 of arrays of vertical through vias (VTVs), each island or region 188 of which contains 13-by-2 vertical through vias (VTVs) 358, and 3-by-4 islands or regions 88 of arrays of micro-bumps or micro-pillars, each island or region 88 of which contains 13-by-2 fifth type of micro-bumps or micro-pillars 34, for example. For the third case, each of the first type of vertical-through-via (VTV) connectors 467 as seen in FIGS. 5N and 6H may be arranged with a size as seen in FIGS. 4E and 4K for containing 27-by-5 vertical through vias (VTVs) 358 and 27-by-5 fifth type of micro-bumps or micro-pillars 34 or another size as seen in FIGS. 4F and 4L for containing 41-by-11 vertical through vias (VTVs) 358 and 41-by-11 fifth type of micro-bumps or micro-pillars 34, for example. Accordingly, for each of the first through third cases, the first type of vertical-through-via (VTV) connector 467 may be arranged with a size for containing vertical through vias (VTVs) 358 arranged in an array with M1 row(s) by N1 column(s) and the fifth type of micro-bumps or micro-pillars 34 arranged in an array with M2 row(s) by N2 column(s), wherein M1, M2, N1 and N2 are integers, M1 is greater than N1 and M2 is greater than N2. For an example, each of the numbers M1 and M2 may be greater than or equal to 50 and smaller than or equal to 500, and each of the numbers N1 and N2 may be greater than or equal to 1 and smaller than or equal to 15. For another example, each of the numbers N1 and N2 may be greater than or equal to 30 and smaller than or equal to 200, and each of the numbers M1 and M2 may be greater than or equal to 1 and smaller than or equal to 10. Each of the standard common through-glass-via (TGV) substrates as seen in FIGS. 5I, 5K and 5M may have a fixed pattern of design and layout for locations of its vertical through vias (VTVs) 358 and a fixed pattern of design and layout for locations of its fifth type of micro-bumps or micro-pillars 34, and may be cut or diced to form a number of the first type of vertical-through-via (VTV) connectors 467 in a single-die type, i.e., through-glass-via interconnect elevators (TGVIEs), as seen in FIGS. 5J, 5L and 5N respectively, having various dimensions or shapes, various numbers of the vertical through vias (VTVs) 358 and various numbers of the fifth type of micro-bumps or micro-pillars 34. Each of the standard common stacked through-glass-via (TGV) substrates as seen in FIGS. 6C, 6E and 6G may have a fixed pattern of design and layout for locations of its vertical through vias (VTVs) 358 and a fixed pattern of design and layout for locations of its fifth type of micro-bumps or micro-pillars 34, and may be cut or diced to form a number of the first type of vertical-through-via (VTV) connectors 467 in a single-die type, i.e., through-glass-via interconnect elevators (TGVIEs), as seen in FIGS. 6D, 6F and 6H respectively, having various dimensions or shapes, various numbers of the vertical through vias (VTVs) 358 and various numbers of the fifth type of micro-bumps or micro-pillars 34.

Figure 7A:
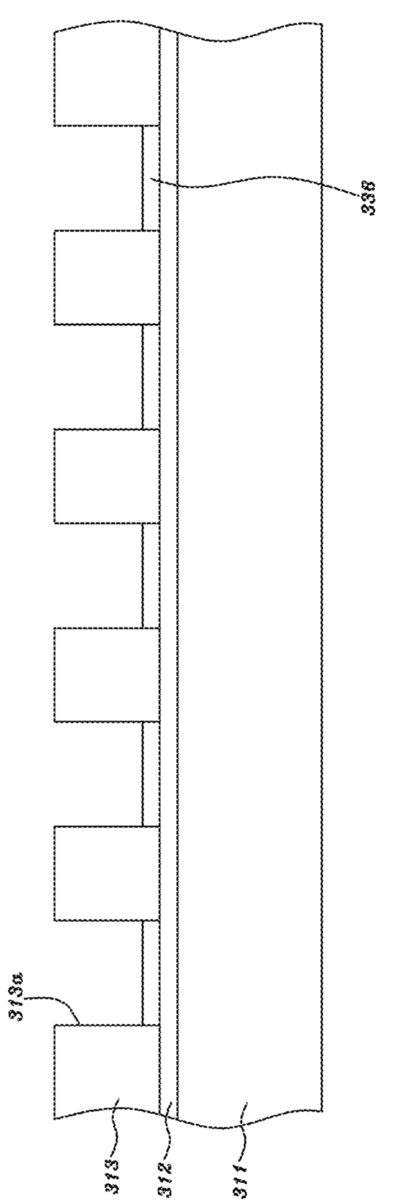
FIGS. 7A-7E are schematically cross-sectional views showing a process for forming a first type of vertical-through-via (VTV) connector based on a through-polymer-via (TPV) substrate in accordance with an embodiment of the present application.

Specification for First Type of Vertical-Through-Via (VTV) Connector (Vertical-Interconnect-Elevator (VIE) Chip or Component) Processed from Through-Polymer-Via (TPV) Substrate FIGS. 7A-7E are schematically cross-sectional views showing a process for forming a first type of vertical-through-via (VTV) connector based on a through-polymer-via (TPV) substrate in accordance with an embodiment of the present application. Referring to FIG. 7A, a temporary holder 311, which may be a substrate of glass, silicon, metal, aluminum stainless steel or ceramic, is first provided to have a copper plate 312, or copper foil or layer, to be attached to a top surface thereof. Next, a photoresist layer 313 may be laminated on the copper plate 312 and multiple openings 313*a* may be formed in the photoresist layer 313 by a lithography process to expose the copper plate 312. Next, multiple metal pads 336 may be formed on the copper plate 312 and in the respective openings 313*a* in the photoresist layer 313 by, for a first alternative, electroplating a solder layer, such as a tin-silver alloy, with a thickness between 1 and 20 micrometers on the copper plate 312 and in the openings 313*a* in the photoresist layer 313 and then electroplating a nickel layer with a thickness between 1 and 5 micrometers on the solder layer 315 and in the openings 313*a* in the photoresist layer 313 or, for a second alternative, electroplating a nickel layer with a thickness between 1 and 5 micrometers on the copper plate 312 and in the openings 313*a* in the photoresist layer 313.

Figure 7B:
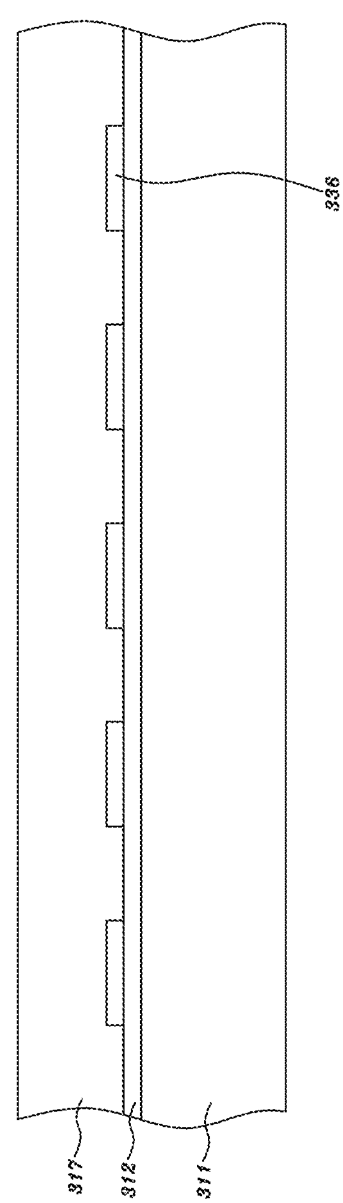

Next, the photoresist layer 313 is removed from the top surface of the copper plate 312. Next, an epoxy-based polymer layer 317 may be formed on the top surface of the copper plate 312 and on the nickel layer of each of the metal pads 336 and then multiple openings 317*a* may be formed in the epoxy-based polymer layer 317 by a laser drill process to expose the nickel layer of each of the metal pads 336, as seen in FIG. 7B. The nickel layer of each of the metal pads 336 may be used to stop laser for drilling one of the openings 317 over said each of the metal pads 336.

Figures 7C, 7D, 7E:
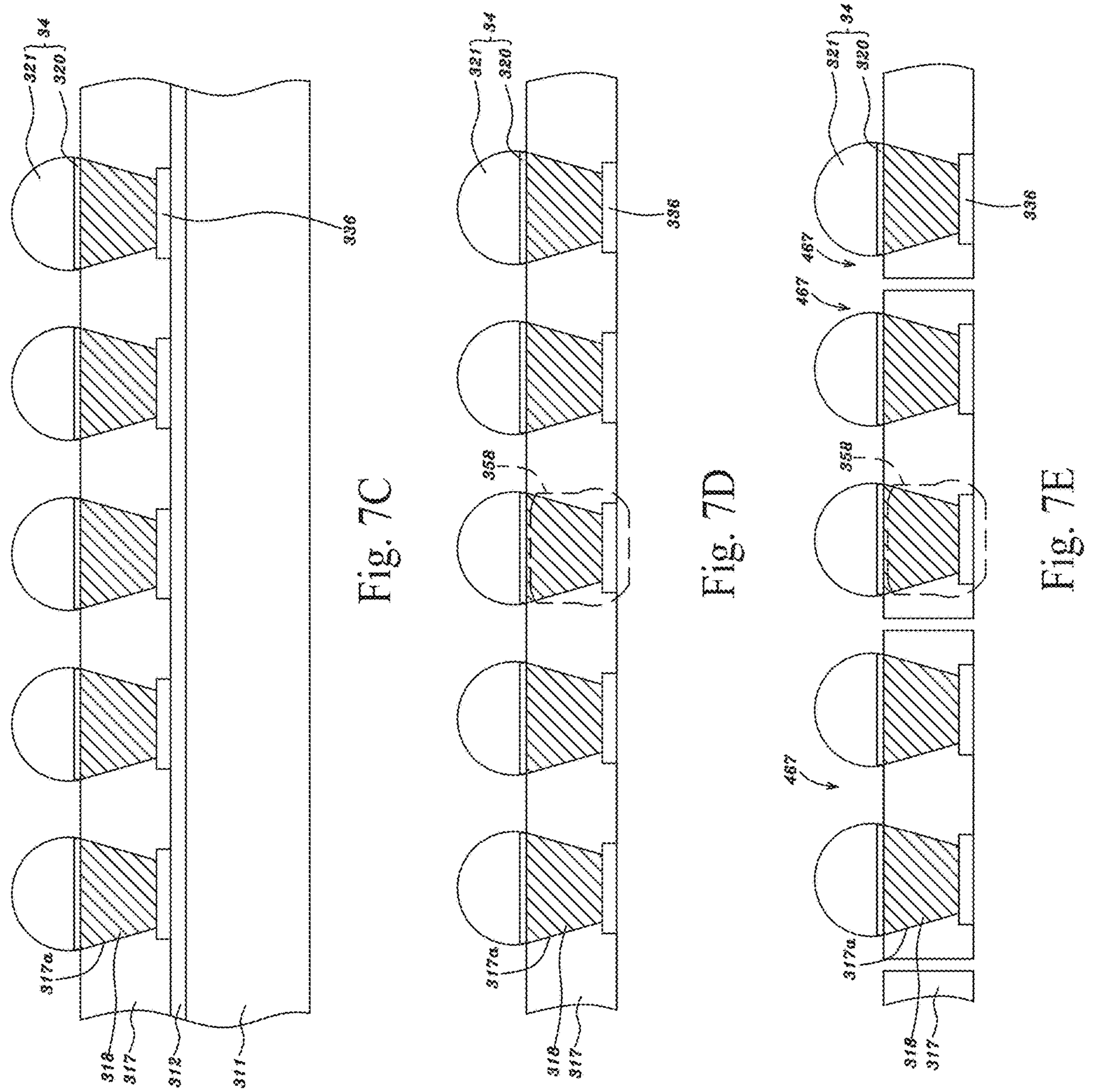

Next, referring to FIG. 7C, a copper layer 318 may be electroplated on the nickel layer of each of the metal pads 336 and in each of the openings 317*a* in the epoxy-based polymer layer 317. The copper layer 318 in each of the openings 317*a* in the epoxy-based polymer layer 317 is shaped as a copper post. Next, a polishing or grinding process may be performed to planarize a top of each of the copper posts 318 and a top surface of the epoxy-based polymer layer 317. The top of each of the copper posts 318 is coplanar with the top surface of the epoxy-based polymer layer 317. Next, a sixth type of micro-bumps or micro-pillars 34 may be formed on the top of each of the copper posts 318 by electroplating a nickel layer 320 with a thickness between 1 and 5 micrometers on the top of said each of the copper posts 318, electroplating a solder layer 321, such as a tin-silver alloy, with a thickness between 1 and 20 micrometers on a top and sidewall of the nickel layer 320 and then performing a reflow process to shape the solder layer 321 into multiple solder balls.

Next, the temporary holder 311 may be removed from the copper plate 312. Next, a polishing or grinding process or wet-etching process may be performed to remover the copper plate 312 from a bottom surface of the epoxy-based polymer layer 317 and a bottom surface of each of the metal pads 336, as seen in FIG. 7D, to expose the solder layer for the first alternative or the nickel layer for the second alternative. Thus, each of the copper posts 318 and underlying one of the metal pads 336 may be used as a vertical through via (VTV) 358, i.e., through polymer via (TPV), for a dedicated vertical path.

A first type of vertical-through-via (VTV) connector 467 to be processed from the through-polymer-via (TPV) substrate as seen in FIG. 7D may have a size to be selected from various sizes after the temporary holder 311 and copper plate 312 are removed therefrom. When a size for the first type of vertical-through-via (VTV) connectors 467 is selected or determined, the through-polymer-via (TPV) substrate as seen in FIG. 7D may be cut or diced to form a number of the first type of vertical-through-via (VTV) connectors 467 in a single-die type, i.e., through-polymer-via interconnect elevators (TPVIEs), each having the selected or predetermined size by a laser cutting process or by a mechanical cutting process, as seen in FIG. 7E.

Specification for Ferroelectric Random-Access-Memory (FRAM) Cell

Figure 8A:
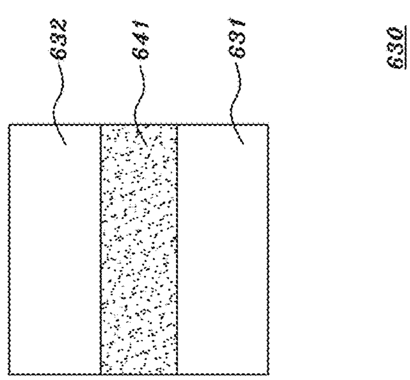
FIG. 8A is a schematically cross-sectional view showing a structure of a ferroelectric random-access-memory (FRAM) cell in accordance with an embodiment of the present application.

FIG. 8A is a schematically cross-sectional view showing a structure of a ferroelectric random-access-memory (FRAM) cell in accordance with an embodiment of the present application. Referring to FIG. 8A, a ferroelectric random-access-memory (FRAM) cell 630 is a type of non-volatile memory (NVM) cell, including (i) a bottom electrode 631 made of a layer of platinum having a thickness between 5 and 200 nanometers, (ii) a top electrode 632 made of a layer of platinum having a thickness between 5 and 200 nanometers, and (iii) a ferroelectric layer 641 made of a layer of lead zirconate titanate or $SrBi_2Ta_2O_9$ having a thickness between 3 and 100 nanometers between its bottom and top electrodes 631 and 632.

Figure 8B:
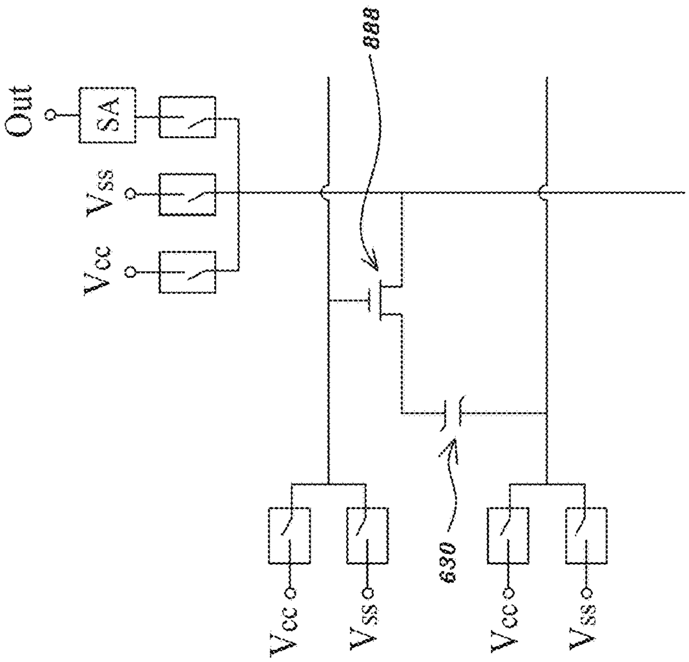
FIG. 8B is a circuit diagram illustrating operation of a ferroelectric random-access-memory (FRAM) cell in accordance with an embodiment of the present application.

FIG. 8B is a circuit diagram illustrating operation of a ferroelectric random-access-memory (FRAM) cell in accordance with an embodiment of the present application. Referring to FIGS. 8A and 8B, a switch 888, e.g., N-type metal-oxide-semiconductor (MOS) transistor, are arranged in an array. Alternatively, the switch 888 may be a P-type MOS transistor. The N-type MOS transistors 888 is configured to form a channel with two opposite terminals, one of which couples in series to one of the bottom and top electrodes 631 and 632 of the ferroelectric random-access-memory (FRAM) cell 630 and the other of which couples to a bit line 876, and has a gate terminal coupling to a word line 875. A drive line 877 may couple to the other of the bottom and top electrodes 631 and 632 of the ferroelectric random-access-memory (FRAM) cell 630.

Referring to FIGS. 8A and 8B, when the ferroelectric random-access-memory (FRAM) cell 630 is written to a logic level of "0", i.e., in a positive polarization state, (1) the word line 875 may be switched to couple to a voltage of power supply, that is, the word line 875 is asserted, (2) the bit line 876 may be switched to couple to a voltage of power supply, and (3) the drive line 877 may be switched to couple to a voltage of ground reference. Thereby, the ferroelectric layer 641 of the ferroelectric random-access-memory (FRAM) cell 630 may be polarized with positive charges close to said the other of the bottom and top electrodes 631 and 632 of the ferroelectric random-access-memory (FRAM) cell 630 and negative charges close to said one of the bottom and top electrodes 631 and 632 of the ferroelectric random-access-memory (FRAM) cell 630.

Referring to FIGS. 8A and 8B, when the ferroelectric random-access-memory (FRAM) cell 630 is written to a logic level of "1", i.e., in a negative polarization state, (1) the word line 875 may be switched to couple to a voltage of power supply, that is, the word line 875 is asserted, (2) the bit line 876 may be switched to couple to a voltage of ground reference, and (3) the drive line 877 may be switched to couple to a voltage of power supply. Thereby, the ferroelectric layer 641 of the ferroelectric random-access-memory (FRAM) cell 630 may be polarized with positive charges close to said one of the bottom and top electrodes 631 and 632 of the ferroelectric random-access-memory (FRAM) cell 630 and negative charges close to said the other of the bottom and top electrodes 631 and 632 of the ferroelectric random-access-memory (FRAM) cell 630.

Referring to FIGS. 8A and 8B, when the ferroelectric random-access-memory (FRAM) cell 630 is in operation to be read, in an initial time period (1) the word line 875 may be switched to couple to a voltage of ground reference, that is, the word line 875 is deserted, (2) the bit line 876 may be switched to be floating, and (3) the drive line 877 may be switched to couple to a voltage of power supply. Thereby, the drive line 877 may be pre-charged in the initial state. In a first subsequent time period after the initial time period, (1) the word line 875 may be switched to couple to a voltage of power supply, that is, the word line 875 is asserted, (2) the bit line 876 may be switched to be floating, and (3) the drive line 877 may be switched to be floating. Thereby, in the first subsequent time period, when the ferroelectric random-access-memory (FRAM) cell 630 is at a logic level of "0", a relatively small voltage may be developed on the bit line 876; when the ferroelectric random-access-memory (FRAM) cell 630 is at a logic level of "1", a relatively large voltage may be developed on the bit line 876. In a second subsequent time period after the first subsequent time period, (1) the word line 875 may be switched to couple to a voltage of power supply, that is, the word line 875 is asserted, (2) the bit line 876 may be switched to couple to a sense amplifier 666, and (3) the drive line 877 may be switched to be floating. Thereby, the relatively small or large voltage at the bit line 876 may be sensed by the sense amplifier 666 as a data output "Out" at an output point of the sense amplifier 666.

Thereafter, since data saved or stored in the ferroelectric random-access-memory (FRAM) cell 630 may be destructive in the operation to be read, the data output "Out" of the sense amplifier 666 may be written back to the ferroelectric random-access-memory (FRAM) cell 630 to restore the ferroelectric random-access-memory (FRAM) cell 630 to be in an original state before the operation.

Specification for Programmable Logic Blocks

Figure 9A:
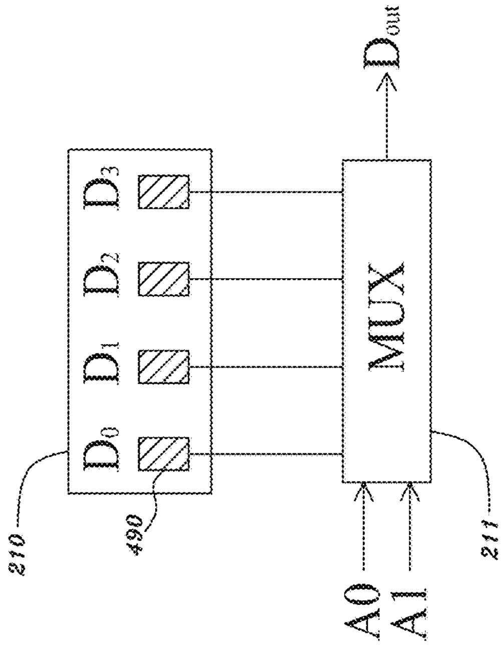
FIG. 9A is a schematic view showing a block diagram of a programmable logic cell in accordance with an embodiment of the present application.

FIG. 9A is a schematic view showing a block diagram of a programmable logic cell in accordance with an embodiment of the present application. Referring to FIG. 9A, a programmable logic block (LB) or element may include one or a plurality of programmable logic cells (LC) 1014 each configured to perform logic operation on its input data set at its input points. Each of the programmable logic cells (LC) 1014 may include multiple memory cells 490, i.e., configuration-programming-memory (CPM) cells, each configured to save or store one of resulting values of a look-up table (LUT) 210 and a selection circuit 211, such as multiplexer (MUXER), having a first set of two input points arranged in parallel for a first input data set, e.g., A0 and A1, and a second set of four input points arranged in parallel for a second input data set, e.g., D0, D1, D2 and D3, each associated with one of the resulting values or programming codes of the look-up table (LUT) 210. The selection circuit 211 is configured to select, in accordance with its first input data set associated with the input data set of said each of the programmable logic cells (LC) 1014, a data input, e.g., D0, D1, D2 or D3, from its second input data set as a data output Dout at its output point acting as a data output of said each of the programmable logic cells (LC) 1014 at an output point of said each of the programmable logic cells (LC) 1014.

Referring to FIG. 9A, the selection circuit 211 may have the second input data set, e.g., D0, D1, D2 and D3, each associated with a data output, i.e., configuration-programming-memory (CPM) data, of one of the memory cells 490, i.e., configuration-programming-memory (CPM) cells. For each of the programmable logic cells (LC) 2014, each of the resulting values or programing codes of its look-up table (LUT) 210 stored in one of its memory cells 490 that may be of a first type, i.e., volatile memory cell such as static random-access memory (SRAM) cell, may be associated with data saved or stored in a non-volatile memory cell, such as ferroelectric random-access-memory (FRAM) cell 630 as illustrated in FIGS. 8A and 8B, magnetoresistive random access memory (MRAM) cell, resistive random access memory (RRAM) cell, anti-fuse or e-fuse. Alternatively, for each of the programmable logic cells (LC) 2014, each of its memory cells 490 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Referring to FIG. 9A, each of the programmable logic cells (LC) 2014 may have the memory cells 490, i.e., configuration-programming-memory (CPM) cells, configured to be programed to store or save the resulting values or programing codes of the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells (LC) 2014 may perform the logic operation on its input data set, e.g., A0 and A1, at its input points as a data output Dout at its output point. For more elaboration, each of the programmable logic cells (LC) 1014 may include the number $2^n$ of memory cells 490, i.e., configuration-programming-memory (CPM) cells, each configured to save or store one of resulting values of the look-up table (LUT) 210 and the selection circuit 211 having a first set of the number n of input points arranged in parallel for a first input data set, e.g., A0-A1, and a second set of the number $2^n$ of input points arranged in parallel for a second input data set, e.g., D0-D3, each associated with one of the resulting values or programming codes of the look-up table (LUT) 210, wherein the number n may range from 2 to 8, such as 2 for this case. The selection circuit 211 is configured to select, in accordance with its first input data set associated with the input data set of said each of the programmable logic cells (LC) 1014, a data input, e.g., one of D0-D3, from its second input data set as a data output Dout at its output point acting as a data output of said each of the programmable logic cells (LC) 1014 at an output point of said each of the programmable logic cells (LC) 1014.

Figure 9B:
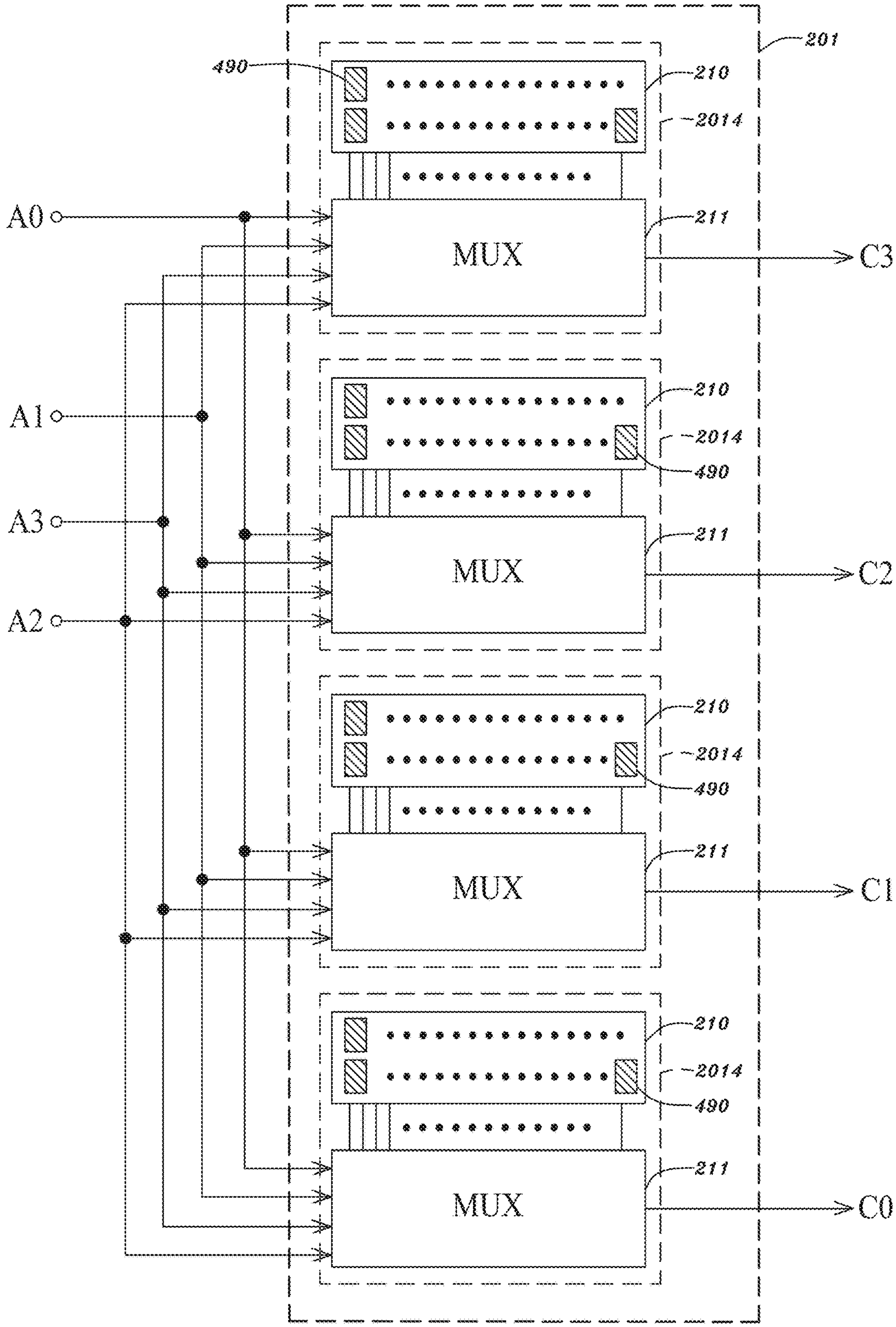
FIG. 9B is a block diagram illustrating a computation operator in accordance with an embodiment of the present application.
Figures 9C, 9D:
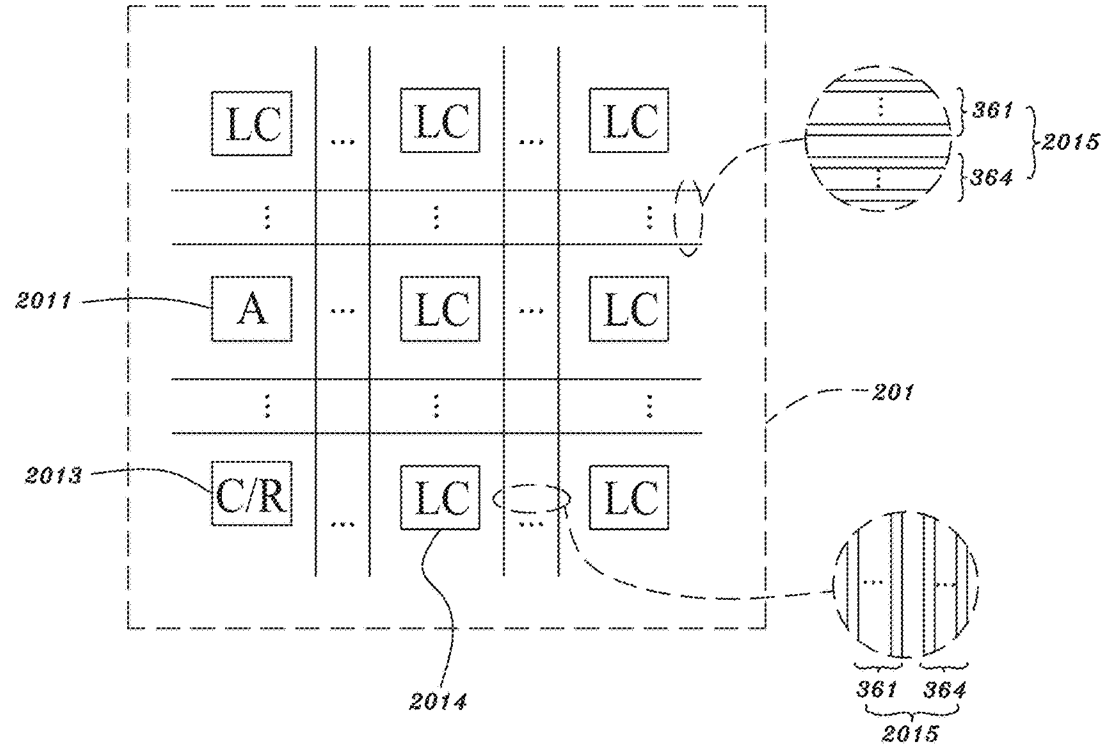
FIG. 9C shows a truth table for a logic operator as seen in FIG. 9B.
FIG. 9D is a block diagram illustrating a programmable logic block for a standard commodity FPGA IC chip in accordance with an embodiment of the present application.

Alternatively, a plurality of programmable logic cells (LC) 2014 as illustrated in FIG. 9A are configured to be programed to be integrated into a programmable logic block (LB) or element 201 as seen in FIG. 9B acting as a computation operator to perform computation operation, such as addition, subtraction, multiplication or division operation. The computation operator may be an adder, a multiplier, a multiplexer, a shift register, floating-point circuits and/or division circuits. FIG. 9B is a block diagram illustrating a computation operator in accordance with an embodiment of the present application. For example, the computation operator as seen in FIG. 9B may be configured to multiply two two-binary-digit data inputs, i.e., [A1, A0] and [A3, A2], into a four-binary-digit output data set, i.e., [C3, C2, C1, C0], as seen in FIG. 9C. FIG. 9C shows a truth table for a logic operator as seen in FIG. 9B.

Referring to FIGS. 9B and 9C, four programmable logic cells (LC) 2014, each of which may be referred to one as illustrated in FIG. 9A, may be programed to be integrated into the computation operator. Each of the four programmable logic cells (LC) 2014 may have its input data set at its four input points associated with an input data set [A1, A0, A3, A2] of the computation operator respectively. Each of the programmable logic cells (LC) 2014 of the computation operator may generate a data output, e.g., C0, C1, C2 or C3, of the four-binary-digit data output of the computation operator based on its input data set [A1, A0, A3, A2]. In the multiplication of the two-binary-digit number, i.e., [A1, A0], by the two-binary-digit number, i.e., [A3, A2], the programmable logic block 201 may generate its four-binary-digit output data set, i.e., [C3, C2, C1, C0], based on its input data set [A1, A0, A3, A2]. Each of the four programmable logic cells (LC) 2014 may have its memory cells 490 to be programed to save or store resulting values or programming codes of its look-up table 210, e.g., Table-0, Table-1, Table-2 or Table-3.

For example, referring to FIGS. 9B and 9C, a first one of the four programmable logic cells (LC) 2014 may have its memory cells 490, i.e., configuration-programming-memory (CPM) cells, configured to save or store the resulting values or programming codes of its look-up table (LUT) 210 of Table-0 and its selection circuit 211 configured to select, in accordance with the first input data set of its selection circuit 211 associated with the input data set [A1, A0, A3, A2] of the computation operator respectively, a data input from the second input data set D0-D15 of its selection circuit 211, each associated with the data output of one of its memory cells 490 associated with one of the resulting values or programming codes of its look-up table (LUT) 210 of Table-0, as its data output C0 acting as a binary-digit data output of the four-binary-digit output data set, i.e., [C3, C2, C1, C0], of the programmable logic block 201. A second one of the four programmable logic cells (LC) 2014 may have its memory cells 490, i.e., configuration-programming-memory (CPM) cells, configured to save or store the resulting values or programming codes of its look-up table (LUT) 210 of Table-1 and its selection circuit 211 configured to select, in accordance with the first input data set of its selection circuit 211 associated with the input data set [A1, A0, A3, A2] of the computation operator respectively, a data input from the second input data set D0-D15 of its selection circuit 211, each associated with the data output of one of its memory cells 490 associated with one of the resulting values or programming codes of its look-up table (LUT) 210 of Table-1, as its data output C1 acting as a binary-digit data output of the four-binary-digit output data set, i.e., [C3, C2, C1, C0], of the programmable logic block 201. A third one of the four programmable logic cells (LC) 2014 may have its memory cells 490, i.e., configuration-programming-memory (CPM) cells, configured to save or store the resulting values or programming codes of its look-up table (LUT) 210 of Table-2 and its selection circuit 211 configured to select, in accordance with the first input data set of its selection circuit 211 associated with the input data set [A1, A0, A3, A2] of the computation operator respectively, a data input from the second input data set D0-D15 of its selection circuit 211, each associated with the data output of one of its memory cells 490 associated with one of the resulting values or programming codes of its look-up table (LUT) 210 of Table-2, as its data output C2 acting as a binary-digit data output of the four-binary-digit output data set, i.e., [C3, C2, C1, C0], of the programmable logic block 201. A fourth one of the four programmable logic cells (LC) 2014 may have its memory cells 490, i.e., configuration-programming-memory (CPM) cells, configured to save or store the resulting values or programming codes of its look-up table (LUT) 210 of Table-3 and its selection circuit 211 configured to select, in accordance with the first input data set of its selection circuit 211 associated with the input data set [A1, A0, A3, A2] of the computation operator respectively, a data input from the second input data set D0-D15 of its selection circuit 211, each associated with the data output of one of its memory cells 490 associated with one of the resulting values or programming codes of its look-up table (LUT) 210 of Table-3, as its data output C3 acting as a binary-digit data output of the four-binary-digit output data set, i.e., [C3, C2, C1, C0], of the programmable logic block 201.

Thereby, referring to FIGS. 9B and 9C, the programmable logic block 201 acting as the computation operator may be composed of the four programmable logic cells (LC) 2014 to generate its four-binary-digit output data set, i.e., [C3, C2, C1, C0], based on its input data set [A1, A0, A3, A2].

Referring to FIGS. 9B and 9C, in a particular case for multiplication of 3 by 3, each of the four programmable logic cells (LC) 2014 may have its selection circuit 211 configured to select, in accordance with the first input data set of its selection circuit 211 associated with the input data set, i.e., [A1, A0, A3, A2]=[1, 1, 1, 1], of the computation operator respectively, a data input from the second input data set D0-D15 of its selection circuit 211, each associated with one of the resulting values or programming codes of its look-up table (LUT) 210, i.e., one of Table-0, Table-1, Table-2 and Table-3, as its data output, i.e., one of C0, C1, C2 and C3, acting as a binary-digit data output of the four-binary-digit output data set, i.e., [C3, C2, C1, C0]=[1, 0, 0, 1], of the programmable logic block 201. The first one of the four programmable logic cells (LC) 2014 may generate its data output C0 at a logic level of "1" based on its input data set, i.e., [A1, A0, A3, A2]=[1, 1, 1, 1]; the second one of the four programmable logic cells (LC) 2014 may generate its data output C1 at a logic level of "0" based on its input data set, i.e., [A1, A0, A3, A2]=[1, 1, 1, 1]; the third one of the four programmable logic cells (LC) 2014 may generate its data output C2 at a logic level of "0" based on its input data set, i.e., [A1, A0, A3, A2]=[1, 1, 1, 1]; the fourth one of the four programmable logic cells (LC) 2014 may generate its data output C3 at a logic level of "1" based on its input data set, i.e., [A1, A0, A3, A2]=[1, 1, 1, 1].

Alternatively, FIG. 9D is a block diagram illustrating a programmable logic block for a standard commodity FPGA IC chip in accordance with an embodiment of the present application. Referring to FIG. 9D, the programmable logic block 201 may include (1) one or more cells (A) 2011 for fixed-wired adders, having the number ranging from 1 to 16 for example, (2) one or more cells (C/R) 2013 for caches and registers, each having capacity ranging from 256 to 2048 bits for example, and (3) the programmable logic cells (LC) 2014 as illustrated in FIGS. 9A-9C having the number ranging from 64 to 2048 for example. The programmable logic block 201 may further include multiple intra-block interconnects 2015 each extending over spaces between neighboring two of its cells 2011, 2013 and 2014 arranged in an array therein. For the programmable logic block (LB) 201, its intra-block interconnects 2015 may be divided into programmable interconnects 361 configured to be programmed for interconnection by its memory cells 362 as seen in FIG. 10 and non-programmable interconnects configured not to be programmable for interconnection.

Referring to FIG. 9D, each of the programmable logic cells (LC) 2014 may have the memory cells 490, i.e., configuration-programming-memory (CPM) cells, having the number ranging from 4 to 256 for example, each configured to save or store one of the resulting values or programming codes of its look-up table 210 and the selection circuit 211 configured to select, in accordance with the first input data set of its selection circuit 211 having a bit-width ranging from 2 to 8 for example at its input points coupling to at least one of the programmable interconnects 361 and non-programmable interconnects 364 of the intra-block interconnects 2015, a data input from the second input data set of its selection circuit 211 having a bit-width ranging from 4 to 256 for example as its data output at its output point coupling to at least one of the programmable interconnects 361 and non-programmable interconnects 364 of the intra-block interconnects 2015.

Specification for Programmable or Configurable Switch Cell

Figure 10:
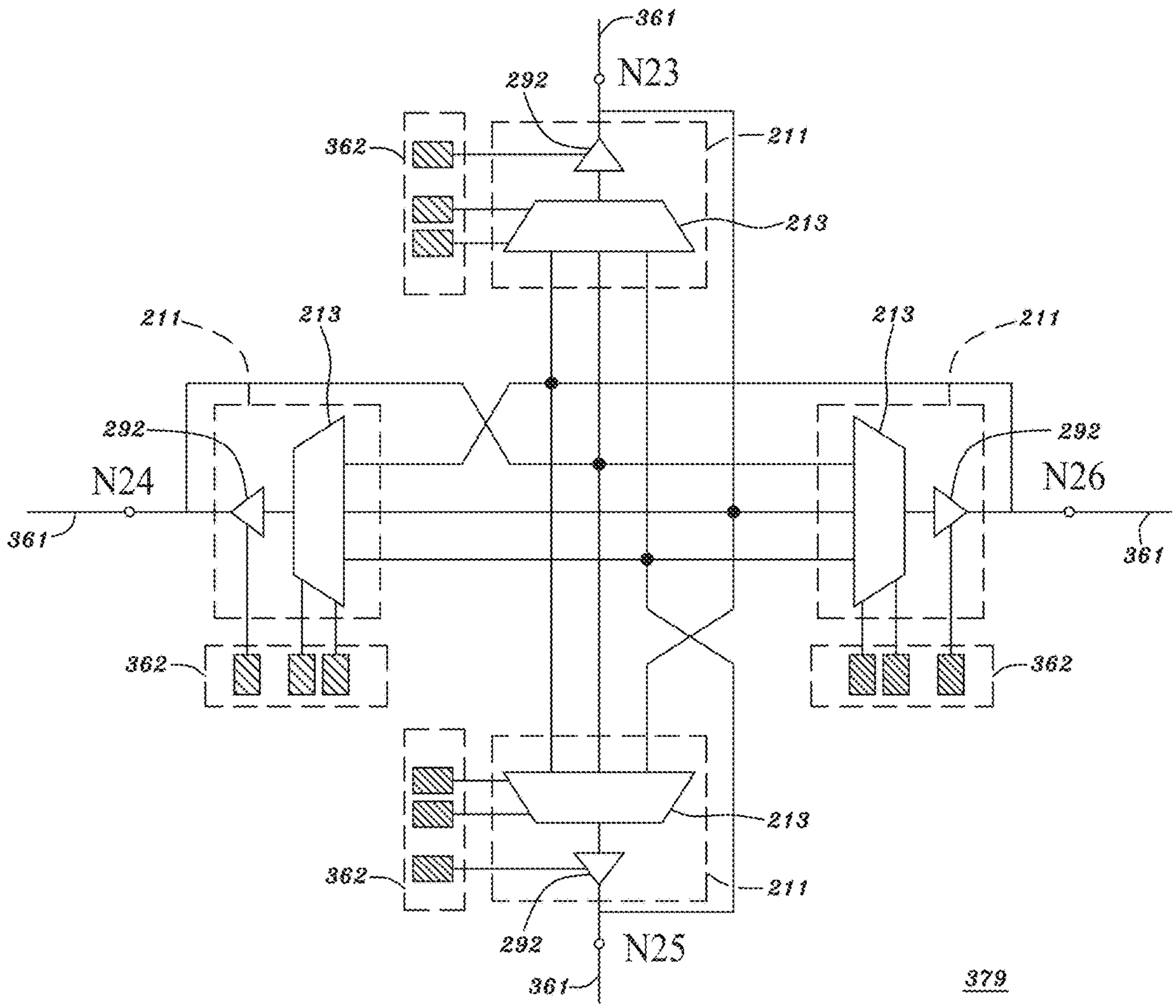
FIG. 10 is a circuit diagram illustrating programmable interconnects controlled by a programmable switch cell in accordance with an embodiment of the present application.

FIG. 10 is a circuit diagram illustrating programmable interconnects controlled by a programmable switch cell in accordance with an embodiment of the present application. Referring to FIG. 10, a cross-point switch may be provided for a programmable switch cell 379, i.e., configurable switch cell, including four selection circuits 211 at its top, bottom, left and right sides respectively, each having a multiplexer 213 and a pass/no-pass switch or switch buffer 292 coupling to the multiplexer 213 thereof, and four sets of memory cells 362 each configured to save or store programming codes to control the multiplexer 213 and pass/no-pass switch or switch buffer 292 of one of its four selection circuits 211. For the programmable switch cell 379, the multiplexer 213 of each of its four selection circuits 211 may be configured to select, in accordance with the first input data set thereof at the first set of input points thereof each associated with one of the programming codes saved or stored in its memory cells 362, a data input from the second input data set thereof at the second set of input points thereof as the data output thereof. The pass/no-pass switch 292 of each of its four selection circuits 211 is configured to control, in accordance with a first data input thereof associated with another of the programming codes saved or stored in its memory cells 362, coupling between the input point thereof for a second data input thereof associated with the data output of the multiplexer 213 of said each of its four selection circuits 211 and the output point thereof for a data output thereof and amplify the second data input thereof as the data output thereof to act as a data output of said each of its four selection circuits 211. Each of the second set of three input points of the multiplexer 213 of one of its four selection circuits 211 may couple to one of the second set of three input points of the multiplexer 213 of each of another two of its four selection circuits 211 and to one of the four programmable interconnects 361 coupling to the output point of the other of its four selection circuits 211. Each of the four programmable interconnects 361 may couple to the output point of one of its four selection circuits 211 and one of the second set of three input points of the multiplexer 213 of each of the other three of its four selection circuits 211. Thereby, for each of the four selection circuits 211 of the programmable switch cell 379, its multiplexer 213 may select, in accordance with the first input data set thereof at the first set of input points thereof, a data input from the second input data set thereof at the second set of three input points thereof coupling to respective three of four nodes N23-N26 coupling to respective three of four programmable interconnects 361 extending in four different directions respectively, and its second type of pass/no-pass switch 292 is configured to generate the data output of said each of the four selection circuits 211 at the other of the four nodes N23-N26 coupling to the other of the four programmable interconnects 361.

For example, referring to FIG. 10, for the top one of the four selection circuits 211 of the programmable switch cell 379, its multiplexer 213 may select, in accordance with the first input data set thereof at the first set of input points thereof each associated with one of the programming codes saved or stored in the memory cells 362 of the programmable switch cell 379, a data input from the second input data set thereof at the second set of three input points thereof coupling to the respective three nodes N24-N26 coupling to the respective three programmable interconnects 361 extending in left, down and right directions respectively, and its pass/no-pass switch 292 is configured, in accordance with another of the programming codes saved or stored in the memory cells 362 of the programmable switch cell 379, to or not to generate the data output of the top one of the four selection circuits 211 of the programmable switch cell 379 at the node N23 coupling to the programmable interconnect 361 extending in an up direction. Thereby, data from one of the four programmable interconnects 361 may be switched by the programmable switch cell 379 to be passed to another one, two or three of the four programmable interconnects 361.

Referring to FIG. 10, for the programmable switch cell 379, each of the programming codes saved or stored in one of the memory cells 362 that may be of a first type, i.e., volatile memory cell such as static random-access memory (SRAM) cell, may be associated with data saved or stored in a non-volatile memory cell, such as ferroelectric random-access-memory (FRAM) cell 630 as illustrated in FIGS. 8A and 8B, magnetoresistive random access memory (MRAM) cell, resistive random access memory (RRAM) cell, anti-fuse or e-fuse. Alternatively, for the programmable switch cell 379, each of its memory cells 362 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Figure 11:
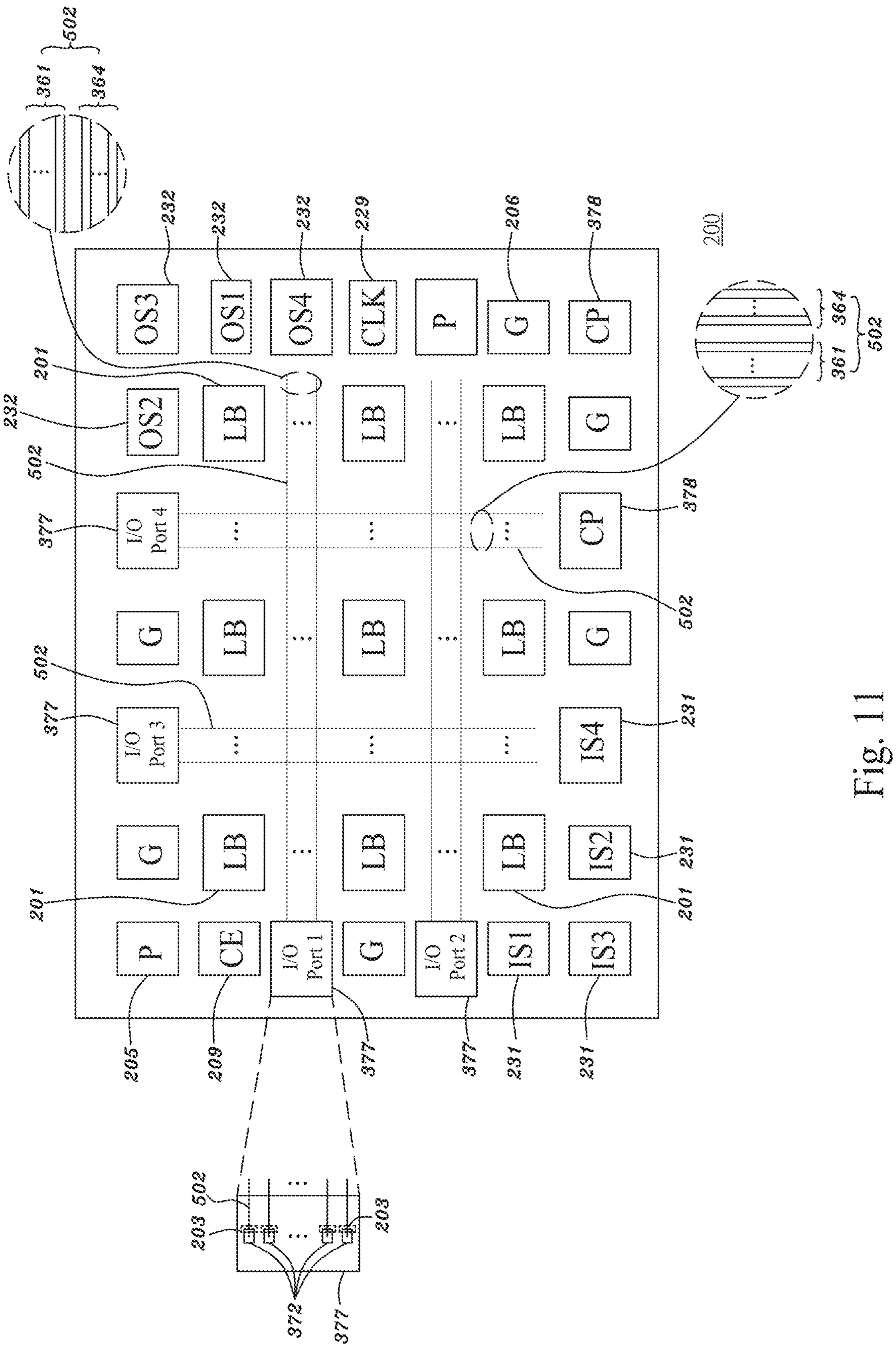
FIG. 11 is a schematically top view showing a block diagram of a standard commodity FPGA IC chip in accordance with an embodiment of the present application.

Specification for Standard Commodity Field-Programmable-Gate-Array (FPGA) Integrated-Circuit (IC) Chip FIG. 11 is a schematically top view showing a block diagram of a standard commodity FPGA IC chip in accordance with an embodiment of the present application. Referring to FIG. 11, the standard commodity FPGA IC chip 200 may include (1) a plurality of programmable logic cells or blocks 2014 or 201 as illustrated in FIGS. 9A-9D arranged in an array in a central region thereof, (2) a plurality of programmable switch cells 379 as illustrated in FIG. 10 arranged around each of the programmable logic blocks (LB) 201, (3) multiple intra-chip interconnects 502 each extending over spaces between neighboring two of the programmable logic blocks 201, wherein the intra-chip interconnects 502 may include the programmable interconnects 361 as seen in FIG. 10 configured to be programmed for interconnection by its memory cells 362 and the non-programmable interconnects 364 as illustrated in FIG. 10 configured not to be programmable for interconnection, and (4) multiple I/O ports 377 having the number ranging from 2 to 64 for example, such as I/O Port 1, I/O Port 2, I/O Port 3 and I/O Port 4 for this case. Each of the I/O ports 377 may include (1) the small I/O circuits 203 having the number ranging from 4 to 256, such as 64 for this case, arranged in parallel for data transmission with bit width ranging from 4 to 256, such as 64 for this case, and (2) the I/O pads 372 having the number ranging from 4 to 256, such as 64 for this case, arranged in parallel and vertically over the small I/O circuits 203 respectively. Each of its small input/output (I/O) circuits 203 may include a small driver configured to drive data from the standard commodity FPGA IC chip 200 to its external circuits and a small receiver configured to receive data from its external circuits to the standard commodity FPGA IC chip 200, wherein the small driver of each of its small input/output (I/O) circuits 203 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF.

Referring to FIG. 11, in a first clock cycle, for one of the small input/output (I/O) circuits 203 of the standard commodity FPGA IC chip 200, its small driver may be enabled by a data input at a first input point of its small driver and its small receiver may be inhibited by a data input at a first input point of its small receiver. Thereby, its small driver may amplify a data input at a second input point of its small driver, associated with the resulting value or programming code from one of the memory cells 490 of one of the programmable logic cells 2014 of the standard commodity FPGA IC chip 200 or one of the memory cells 362 of one of the programmable switch cells 379 of the standard commodity FPGA IC chip 200, as a data output of its small driver at an output point of its small driver to be transmitted to one of the I/O pads 372 vertically over said one of the small input/output (I/O) circuits 203 for external connection to the external circuits of the standard commodity FPGA IC chip 200, such as non-volatile memory (NVM) integrated-circuit (IC) chip.

In a second clock cycle, for said one of the small input/output (I/O) circuits 203 of the standard commodity FPGA IC chip 200, its small driver may be disabled by a data input at the first input point of its small driver and its small receiver may be activated by a data input at the first input point of its small receiver. Thereby, its small receiver may amplify a data input, i.e., a resulting value or programming code, at a second input point of its small receiver associated with data passed from the external circuits of the standard commodity FPGA IC chip 200, such as non-volatile memory (NVM) integrated-circuit (IC) chip, through said one of the I/O pads 372 as an data output of its small receiver at an output point of its small receiver to be passed to and stored in one of the memory cells 490 of one of the programmable logic cells 2014 of the standard commodity FPGA IC chip 200 or one of the memory cells 362 of one of the programmable switch cells 379 of the standard commodity FPGA IC chip 200.

In a third clock cycle, for said one of the small input/output (I/O) circuits 203 of the standard commodity FPGA IC chip 200, its small driver may be enabled by a data input at the first input point of its small driver and its small receiver may be inhibited by a data input at the first input point of its small receiver. Thereby, its small driver may amplify a data input at the second input point of its small driver, associated with the data output of one of the programmable logic cells 2014 of the standard commodity FPGA IC chip 200 as illustrated in FIGS. 9A-9D for example through first one or more of the programmable interconnects 361 of the standard commodity FPGA IC chip 200 and/or one or more of the programmable switch cells 379 of the standard commodity FPGA IC chip 200 each coupled between two of said first one or more of the programmable interconnects 361, as a data output of its small driver at the output point of its small driver to be transmitted to said one of the I/O pads 372 vertically over said one of the small input/output (I/O) circuits 203 for external connection to circuits outside the standard commodity FPGA IC chip 200, such as non-volatile memory (NVM) integrated-circuit (IC) chip.

In a fourth clock cycle, for said one of the small input/output (I/O) circuits 203 of the standard commodity FPGA IC chip 200, its small driver may be disabled by a data input at the first input point of its small driver and its small receiver may be activated by a data input at the first input point of its small receiver. Thereby, its small receiver may amplify a data input at the second input point of its small receiver transmitted from circuits, such as non-volatile memory (NVM) integrated-circuit (IC) chip, outside the standard commodity FPGA IC chip 200 through said one of the I/O pads 372 as a data output of its small receiver at the output point of its small driver associated with a data input of the input data set of one of the programmable logic cells 2014 of the standard commodity FPGA IC chip 200 as illustrated in FIGS. 9A-9D for example through second one or more of the programmable interconnects 361 of the standard commodity FPGA IC chip 200 and/or one or more of the programmable switch cells 379 of the standard commodity FPGA IC chip 200 each coupled between two of said second one or more of the programmable interconnects 361.

Referring to FIG. 11, the standard commodity FPGA IC chip 200 may further include a chip-enable (CE) pad 209 configured for enabling or disabling the standard commodity FPGA IC chip 200. For example, when the chip-enable (CE) pad 209 is at a logic level of "0", the standard commodity FPGA IC chip 200 may be enabled to process data and/or operate with circuits outside of the standard commodity FPGA IC chip 200; when the chip-enable (CE) pad 209 is at a logic level of "1", the standard commodity FPGA IC chip 200 may be disabled not to process data and/or operate with circuits outside of the standard commodity FPGA IC chip 200.

Referring to FIG. 11, the standard commodity FPGA IC chip 200 may further include multiple input selection (IS) pads 231, e.g., IS1, IS2, IS3 and IS4 pads, each configured to receive a data input associated with the data input at the first input point of the small receiver of each of the small I/O circuits 203 of one of its I/O ports 377, e.g., I/O Port 1, I/O Port 2, I/O Port 3 and I/O Port 4. For more elaboration, for the standard commodity FPGA IC chip 200, its IS1 pad 231 may receive a data input associated with the data input at the first input point of the small receiver of each of the small I/O circuits 203 of its I/O Port 1; its IS2 pad 231 may receive a data input associated with the data input at the first input point of the small receiver of each of the small I/O circuits 203 of its I/O Port 2; its IS3 pad 231 may receive a data input associated with the data input at the first input point of the small receiver of each of the small I/O circuits 203 of its I/O Port 3; and its IS4 pad may receive a data input associated with the data input at the first input point of the small receiver of each of the small I/O circuits 203 of its I/O Port 4. The standard commodity FPGA IC chip 200 may select, in accordance with logic levels at the input selection (IS) pads 231, e.g., IS1, IS2, IS3 and IS4 pads, one or more from its I/O ports 377, e.g., I/O Port 1, I/O Port 2, I/O Port 3 and I/O Port 4, to pass data for its input operation. For each of the small I/O circuits 203 of each of the one or more I/O ports 377 selected in accordance with the logic levels at the input selection (IS) pads 231, its small receiver may be activated by the data input at the first input point of its small receiver transmitted from circuits outside of the standard commodity FPGA IC chip 200 through one of the input selection (IS) pads 231 to amplify or pass the data input at the second input point of its small receiver, transmitted from circuits outside the standard commodity FPGA IC chip 200 through one of the I/O pads 372 of said each of the one or more I/O ports 377 selected in accordance with the logic levels at the input selection (IS) pads 231, as the data output of its small receiver associated with a data input of the input data set of one of the programmable logic cells 2014 as seen in FIGS. 9A-9D of the standard commodity FPGA IC chip 200 through one or more of the programmable interconnects 361 as seen in FIG. 10 of the standard commodity FPGA IC chip 200, for example. For each of the small I/O circuits 203 of each of the I/O ports 377, not selected in accordance with in accordance with the logic levels at the input selection (IS) pads 231, of the standard commodity FPGA IC chip 200, its small receiver 375 may be inhibited by the data input at the first input point of its small receiver associated with the logic level at one of the input selection (IS) pads 231 of the standard commodity FPGA IC chip 200.

For example, referring to FIG. 11, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "0", (4) the IS3 pad 231 at a logic level of "0" and (5) the IS4 pad 231 at a logic level of "0", the standard commodity FPGA IC chip 200 may be enabled in accordance with the logic level at its chip-enable (CE) pad 209 and may select, in accordance with the logic levels at its IS1, IS2, IS3 and IS4 pads 231, one or more I/O port, e.g., I/O Port 1, from its I/O ports 377, i.e., I/O Port 1, I/O Port 2, I/O Port 3 and I/O Port 4, to pass data for the input operation. For each of the small I/O circuits 203 of the selected I/O port 377, i.e., I/O Port 1, of the standard commodity FPGA IC chip 200, its small receiver may be activated by the data input at the first input point of its small receiver associated with the logic level at the IS1 pad 231 of the standard commodity FPGA IC chip 200. For each of the small I/O circuits 203 of each of the unselected I/O ports, i.e., I/O Port 2, I/O Port 3 and I/O Port 4, of the standard commodity FPGA IC chip 200, its small receiver may be inhibited by the data input at the first input point of its small receiver associated with the logic level at one of the IS2, IS3 and IS4 pads 231 of the standard commodity FPGA IC chip 200.

For example, referring to FIG. 11, provided that the standard commodity FPGA IC chip 200 may have (1) the chip-enable (CE) pad 209 at a logic level of "0", (2) the IS1 pad 231 at a logic level of "1", (3) the IS2 pad 231 at a logic level of "1", (4) the IS3 pad 231 at a logic level of "1" and (5) the IS4 pad 231 at a logic level of "1", the standard commodity FPGA IC chip 200 may be enabled in accordance with the logic level at its chip-enable (CE) pad 209 and may select, in accordance with the logic levels at its IS1, IS2, IS3 and IS4 pads 231, all from its I/O ports 377, i.e., I/O Port 1, I/O Port 2, I/O Port 3 and I/O Port 4, to pass data for the input operation at the same clock cycle. For each of the small I/O circuits 203 of each of the selected I/O ports 377, i.e., I/O Port 1, I/O Port 2, I/O Port 3 and I/O Port 4, of the standard commodity FPGA IC chip 200, its small receiver may be activated by the data input at the first input point of its small receiver associated with the logic level at one of the IS1, IS2, IS3 and IS4 pads 231 of the standard commodity FPGA IC chip 200.

Referring to FIG. 11, the standard commodity FPGA IC chip 200 may include multiple output selection (OS) pads 232, e.g., OS1, OS2, OS3 and OS4 pads, each configured to receive a data input associated with the data input at the first input point of the small driver of each of the small I/O circuits 203 of one of its I/O ports 377, e.g., I/O Port 1, I/O Port 2, I/O Port 3 and I/O Port 4. For more elaboration, for the standard commodity FPGA IC chip 200, its OS1 pad 232 may receive a data input associated with the data input at the first input point of the small driver of each of the small I/O circuits 203 of its I/O Port 1; its OS2 pad 232 may receive a data input associated with the data input at the first input point of the small driver of each of the small I/O circuits 203 of its I/O Port 2; its OS3 pad 232 may receive a data input associated with the data input at the first input point of the small driver of each of the small I/O circuits 203 of its I/O Port 3; its OS4 pad 232 may receive a data input associated with the data input at the first input point of the small driver of each of the small I/O circuits 203 of its I/O Port 4. The standard commodity FPGA IC chip 200 may select, in accordance with logic levels at the output selection (OS) pads 232, e.g., OS1, OS2, OS3 and OS4 pads, one or more from its I/O ports 377, e.g., I/O Port 1, I/O Port 2, I/O Port 3 and I/O Port 4, to pass data for its output operation. For each of the small I/O circuits 203 of each of the one or more I/O ports 377 selected in accordance with the logic levels at the output selection (OS) pads 232, its small driver may be enabled by the data input at the first input point of its small driver transmitted from circuits outside of the standard commodity FPGA IC chip 200 through one of the output selection (OS) pads 232 to amplify or pass the data input at the second input point of its small driver, associated with the data output of one of the programmable logic cells 2014 as seen in FIGS. 9A-9D of the standard commodity FPGA IC chip 200 through one or more of the programmable interconnects 361 as seen in FIG. 10 of the standard commodity FPGA IC chip 200, as the data output of its small driver to be transmitted to circuits outside the standard commodity FPGA IC chip 200 through one of the I/O pads 372 of said each of the one or more I/O ports 377 selected in accordance with the logic levels at the output selection (OS) pads 232, for example. For each of the small I/O circuits 203 of each of the I/O ports 377, not selected in accordance with in accordance with the logic levels at the output selection (OS) pads 232, of the standard commodity FPGA IC chip 200, its small driver may be disabled by the data input at the first input point of its small driver associated with the logic level at one of the output selection (OS) pads 232 of the standard commodity FPGA IC chip 200.

For example, referring to FIG. 11, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "1", (4) the OS3 pad 232 at a logic level of "1" and (5) the OS4 pad 232 at a logic level of "1", the standard commodity FPGA IC chip 200 may be enabled in accordance with the logic level at its chip-enable (CE) pad 209 and may select, in accordance with the logic levels at its OS1, OS2, OS3 and OS4 pads 232, one or more I/O port, e.g., I/O Port 1, from its I/O ports 377, i.e., I/O Port 1, I/O Port 2, I/O Port 3 and I/O Port 4, to pass data for the output operation. For each of the small I/O circuits 203 of the selected I/O port 377, i.e., I/O Port 1, of the standard commodity FPGA IC chip 200, its small driver may be enabled by the data input at the first input point of its small driver associated with the logic level at the OS1 pad 232 of the standard commodity FPGA IC chip 200. For each of the small I/O circuits 203 of each of the unselected I/O ports, i.e., I/O Port 2, I/O Port 3 and I/O Port 4, of the standard commodity FPGA IC chip 200, its small driver may be disabled by the data input at the first input point of its small driver associated respectively with the logic level at one of the OS2, OS3 and OS4 pads 232 of the standard commodity FPGA IC chip 200.

For example, referring to FIG. 11, provided that the standard commodity FPGA IC chip 200 may have (1) the chip-enable (CE) pad 209 at a logic level of "0", (2) the OS1 pad 232 at a logic level of "0", (3) the OS2 pad 232 at a logic level of "0", (4) the OS3 pad 232 at a logic level of "0" and (5) the OS4 pad 232 at a logic level of "0", the standard commodity FPGA IC chip 200 may be enabled in accordance with the logic level at its chip-enable (CE) pad 209 and may select, in accordance with the logic levels at its OS1, OS2, OS3 and OS4 pads 232, all from its I/O ports 377, i.e., I/O Port 1, I/O Port 2, I/O Port 3 and I/O Port 4, to pass data for the output operation at the same clock cycle. For each of the small I/O circuits 203 of each of the selected I/O ports 377, i.e., I/O Port 1, I/O Port 2, I/O Port 3 and I/O Port 4, of the standard commodity FPGA IC chip 200, its small driver may be enabled by the data input at the first input point of its small driver associated with the logic level at one of the OS1, OS2, OS3 and OS4 pads 232 of the standard commodity FPGA IC chip 200.

Thereby, referring to FIG. 11, in a clock cycle, for the standard commodity FPGA IC chip 200, one or more of its I/O ports 377, i.e., I/O Port 1, I/O Port 2, I/O Port 3 and I/O Port 4, may be selected, in accordance with the logic levels at its IS1, IS2, IS3 and IS4 pads 231, to pass data for its input operation, while another one or more of its I/O ports 377, i.e., I/O Port 1, I/O Port 2, I/O Port 3 and I/O Port 4, may be selected, in accordance with the logic levels at its OS1, OS2, OS3 and OS4 pads 232, to pass data for its output operation. Its input selection (IS) pads 231 and output selection (OS) pads 232 may be provided as I/O-port selection pads.

Referring to FIG. 11, the programmable interconnects 361 of the intra-chip interconnects 502 may couple to the programmable interconnects 361 of the intra-block interconnects 2015 of each of the programmable logic blocks (LB) 201 as seen in FIG. 9D. The non-programmable interconnects 364 of the intra-chip interconnects 502 may couple to the non-programmable interconnects 364 of the intra-block interconnects 2015 of each of the programmable logic blocks (LB) 201 as seen in FIG. 9D.

Referring to FIG. 11, the standard commodity FPGA IC chip 200 may further include (1) multiple power pads 205 for applying the voltage Vcc of power supply to its memory cells 490 for the look-up tables (LUT) 210 of its programmable logic cells (LC) 2014 as illustrated in FIGS. 9A-9D, the selection circuits 211 of its programmable logic cells (LC) 2014, the memory cells 362 of its programmable switch cells 379 as illustrated in FIG. 10, the selection circuits 211 of its programmable switch cells 379 and/or the small drivers and receivers of its small I/O circuits 203 through one or more of its non-programmable interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to its memory cells 490 for the look-up tables (LUT) 210 of its programmable logic cells (LC) 2014 as illustrated in FIGS. 9A-9D, the selection circuits 211 of its programmable logic cells (LC) 2014, the memory cells 362 of its programmable switch cells 379 as illustrated in FIG. 10, the selection circuits 211 of its programmable switch cells 379 and/or the small drivers 374 and receivers 375 of its small I/O circuits 203 through one or more of its non-programmable interconnects 364.

Referring to FIG. 11, the standard commodity FPGA IC chip 200 may further include a clock pad (CLK) 229 configured to receive a clock signal from circuits outside of the standard commodity FPGA IC chip 200 and multiple control pads (CP) 378 configured to receive control commands to control the standard commodity FPGA IC chip 200.

Referring to FIG. 11, for the standard commodity FPGA IC chip 200, its programmable logic cells (LC) 2014 as seen in FIGS. 9A-9D may be reconfigurable for artificial-intelligence (AI) application. For example, in a clock cycle, one of the programmable logic cells (LC) 2014 of the standard commodity FPGA IC chip 200 may have the memory cells 490 to be programmed to perform OR operation; however, after one or more events happens, in another clock cycle said one of its programmable logic cells (LC) 2014 of the standard commodity FPGA IC chip 200 may have the memory cells 490 to be programmed to perform NAND operation for better AI performance.

Referring to FIG. 11, the standard commodity FPGA IC chip 200 may include a cryptography block or circuit configured to decrypt, in accordance with a password or key stored or saved in a non-volatile memory cell of its cryptography block or circuit, which may be composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor, encrypted data from a memory integrated-circuit (IC) chip as decrypted data to be passed to the memory cells 490 for the look-up tables (LUT) 210 of its programmable logic cells (LC) 2014 or the memory cells 362 of its programmable switch cells 379 and to encrypt, in accordance with the password or key, data from the memory cells 490 for the look-up tables (LUT) 210 of its programmable logic cells (LC) 2014 or the memory cells 362 of its programmable switch cells 379 as encrypted data to be passed to the memory integrated-circuit (IC) chip.

Referring to FIG. 11, the standard commodity FPGA IC chip 200 may include (1) a large-input/output (I/O) block provided with a plurality of large input/output (I/O) circuits each having an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example, and (2) a small-input/output (I/O) block provided with a plurality of small input/output (I/O) circuits each having an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF for example.

Figure 12:
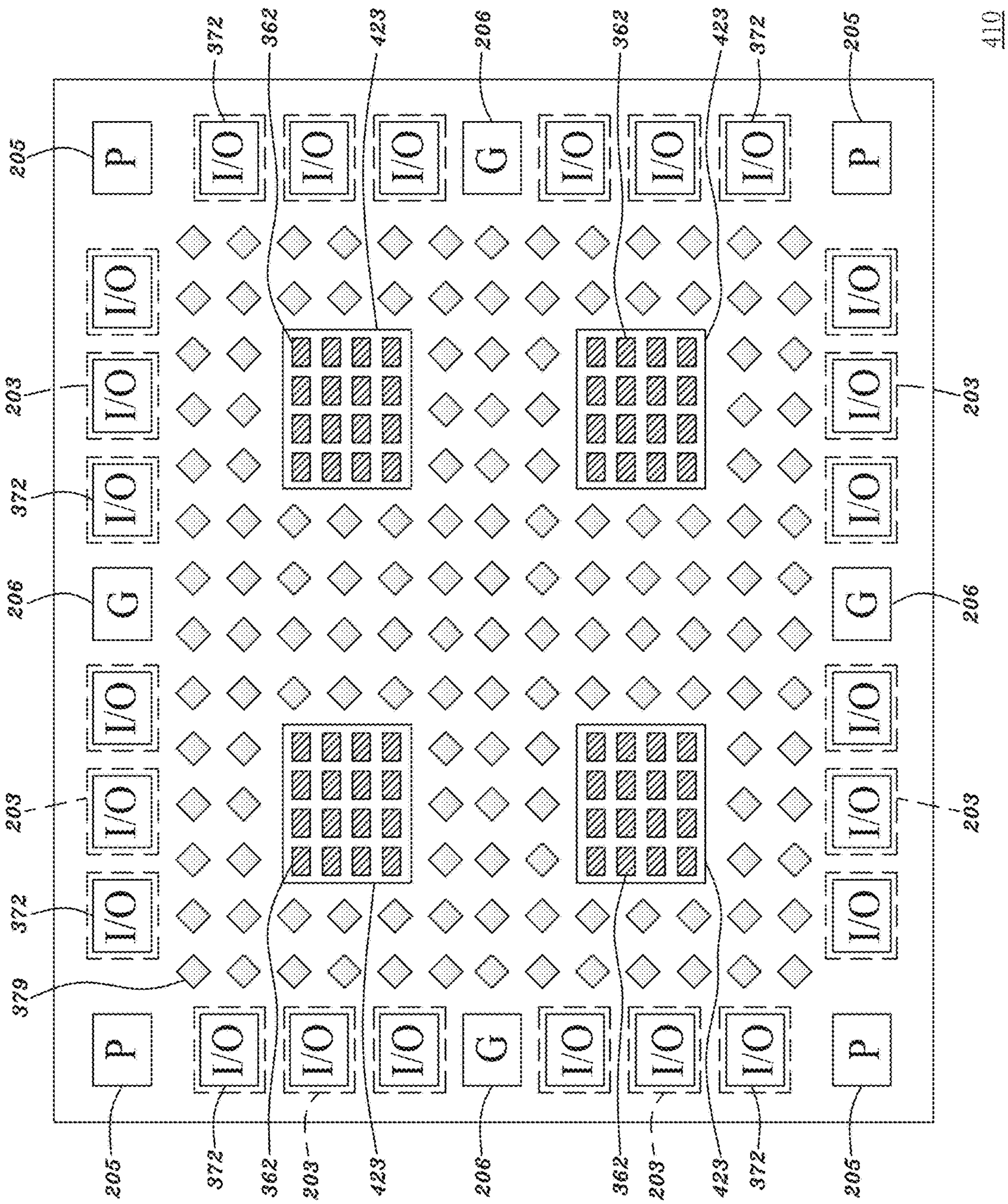
FIG. 12 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 12 is a schematically top view showing a block diagram of a dedicated programmable interconnection (DPI) integrated-circuit (IC) chip in accordance with an embodiment of the present application. Referring to FIG. 12, a dedicated programmable interconnection (DPI) integrated-circuit (IC) chip 410 may include (1) multiple memory-array blocks 423 arranged in an array in a central region thereof, (2) multiple groups of programmable switch cells 379 as illustrated in FIG. 10, each group of which is arranged in one or more rings around one of the memory-array blocks 423, and (3) multiple small input/output (I/O) circuits 203 each having a small receiver configured to generate a data output associated with a data input at one of the nodes N23-N26 of one of its programmable switch cells 379 as illustrated in FIG. 10 through one or more of its programmable interconnects 361 and a small driver configured to receive a data input associated with a data output at one of the nodes N23-N26 of another of its programmable switch cells 379 as illustrated in FIG. 10 through another one or more of its programmable interconnects 361, wherein the small driver of each of its small input/output (I/O) circuits 203 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF.

Referring to FIG. 12, for the DPIIC chip 410, each of its programmable switch cells 379 as seen in FIG. 10 may include the memory cells 362 in one of its four memory-array blocks 423 arranged in an array and the selection circuits 211 close to said one of its memory-array blocks 423, wherein each of the selection circuits 211 of said each of its programmable switch cells 379 may have the first set of input points for multiple data inputs of the first input data set of said each of its selection circuits 211 each associated with a data output, i.e., configuration-programming-memory (CPM) data, of one of the memory cells 362, i.e., configuration-programming-memory (CPM) cells, of said each of its programmable switch cells 379.

Referring to FIG. 12, the DPIIC chip 410 may include the I/O pads 372 each vertically over one of its small input/output (I/O) circuits 203. For one of the small input/output (I/O) circuits 203 of the DPIIC chip 410, in a first clock cycle, data from one of the nodes N23-N26 of one of the programmable switch cells 379 of the DPIIC chip 410 as illustrated in FIG. 10 may be associated with the data input of its small driver through one or more of the programmable interconnects 361 programmed by a first group of the programmable switch cells 379 of the DPIIC chip 410 and then its small driver may amplify or pass the data input of its small driver as a data output of its small driver to be transmitted to one of the I/O pads 372 of the DPIIC chip 410 vertically over said one of the small input/output (I/O) circuits 203 of the DPIIC chip 410 for external connection to circuits outside the DPIIC chip 410. In a second clock cycle, data from circuits outside the DPIIC chip 410 may be associated with a data input of its small receiver through said one of the I/O pads 372 of the DPIIC chip 410, and then its small receiver may amplify or pass the data input of its small receiver as a data output of its small receiver to be passed to one of the nodes N23-N26 of another of the programmable switch cells 379 of the DPIIC chip 410 as illustrated in FIG. 10 through another one or more of the programmable interconnects 361 programmed by a second group of the programmable switch cells 379 of the DPIIC chip 410.

Referring to FIG. 12, the DPIIC chip 410 may further include (1) multiple power pads 205 for applying the voltage Vcc of power supply to the memory cells 362 of its programmable switch cells 379 as illustrated in FIG. 10 and/or the selection circuits 211 of its programmable switch cells 379, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to the memory cells 362 of its programmable switch cells 379 as illustrated in FIG. 10 and/or the selection circuits 211 of its programmable switch cells 379.

Referring to FIG. 12, the DPIIC chip 410 may further include multiple SRAM cells used as cache memory for data latch or storage and a sense amplifier configured for reading, amplifying or detecting data from its SRAM cells acting as the cache memory.

Specification for Auxiliary and Supporting (AS) Integrated-Circuit (IC) Chip

Figure 13:
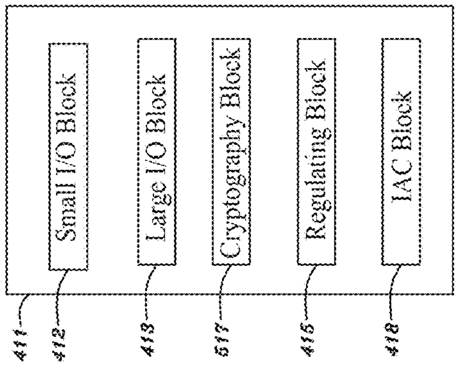
FIG. 13 is a schematically top view showing a block diagram of an auxiliary and supporting (AS) integrated-circuit (IC) chip in accordance with an embodiment of the present application.

FIG. 13 is a schematically top view showing a block diagram of an auxiliary and supporting (AS) integrated-circuit (IC) chip in accordance with an embodiment of the present application. Referring to FIG. 13, the auxiliary and supporting (AS) integrated-circuit (IC) chip 411 may include one, more or all of the following circuit blocks: (1) a large-input/output (I/O) block 412 configured for serial-advanced-technology-attachment (SATA) ports or peripheral-components-interconnect express (PCIe) ports each having a plurality of large input/output (I/O) circuits configured to couple to a memory integrated-circuit (IC) chip, such as non-volatile memory (NVM) integrated-circuit (IC) chip, NAND flash memory integrated-circuit (IC) chip or NOR flash memory integrated-circuit (IC) chip, for data transmission between the auxiliary and supporting (AS) integrated-circuit (IC) chip 411 and the memory integrated-circuit (IC) chip, wherein each of the large input/output (I/O) circuits may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example, (2) a small-input/output (I/O) block 413 having a plurality of small input/output (I/O) circuits configured to couple to a logic integrated-circuit (IC) chip, such as field-programmable-gate-array (FPGA) integrated-circuit (IC) chip, central-processing-unit (CPU) integrated-circuit (IC) chip, graphic-processing-unit (GPU) integrated-circuit (IC) chip, application-processing-unit (APU) chip or digital-signal-processing (DSP) integrated-circuit (IC) chip, for data transmission between the auxiliary and supporting (AS) integrated-circuit (IC) chip 411 and the logic integrated-circuit (IC) chip, wherein each of the small input/output (I/O) circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF for example, (3) a cryptography block or circuit 517 configured to decrypt, in accordance with a password or key stored or saved in a non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor, encrypted data from the memory integrated-circuit (IC) chip as decrypted data to be passed to the logic integrated-circuit (IC) chip and to encrypt, in accordance with the password or key, data from the logic integrated-circuit (IC) chip as encrypted data to be passed to the memory integrated-circuit (IC) chip, (4) a regulating block 415 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to the logic integrated-circuit (IC) chip, and (5) an innovated application-specific-integrated-circuit (ASIC) or customer-owned tooling (COT) block 418, i.e., IAC block, configured to implement intellectual-property (IP) circuits, application-specific (AS) circuits, analog circuits, mixed-mode signal circuits, radio-frequency (RF) circuits, and/or transmitter, receiver, transceiver circuits for customers.

Specification for Logic Drive

Figure 14A:
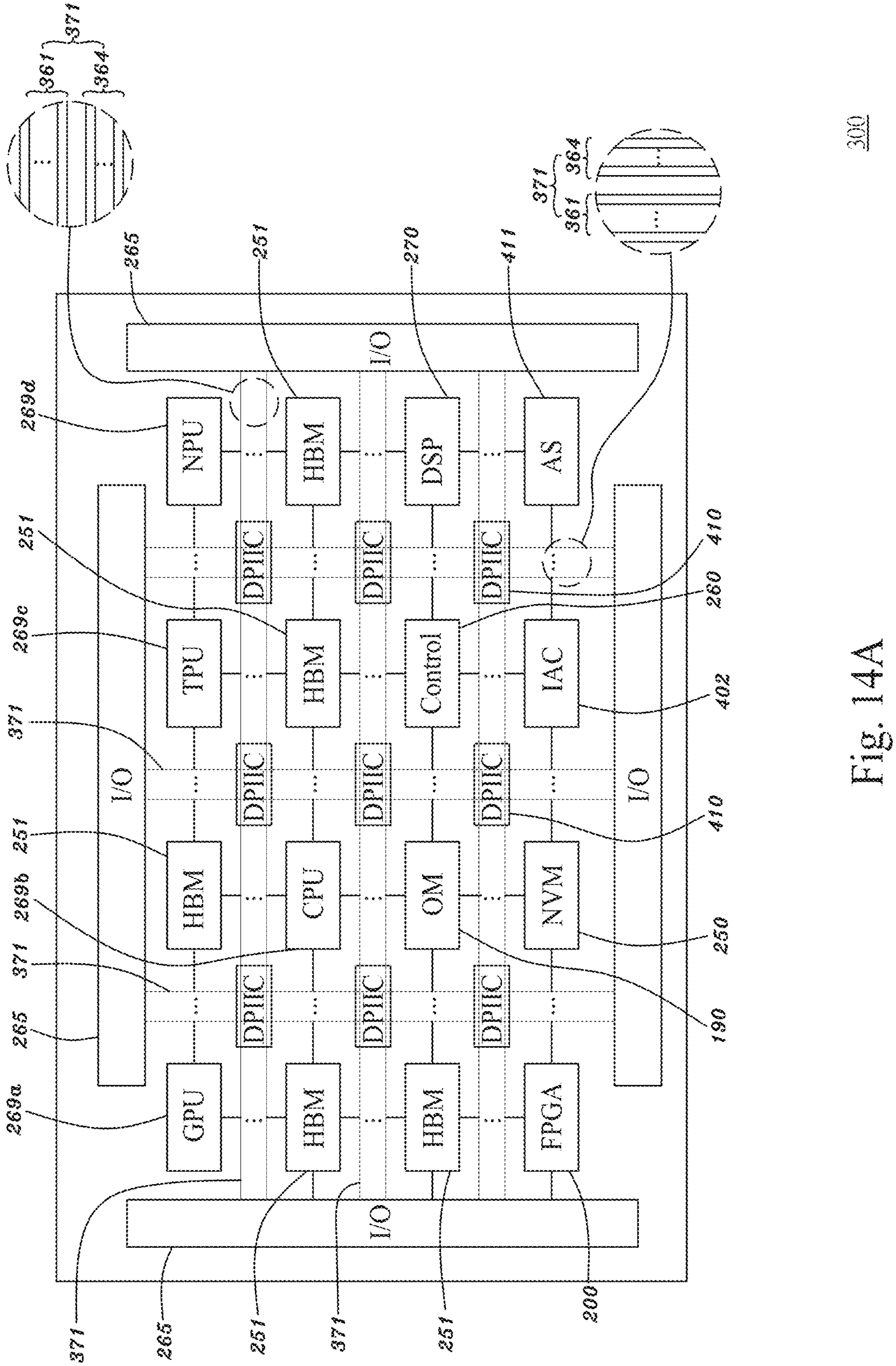
FIG. 14A is a schematically top view showing arrangement for various semiconductor chips or operation modules packaged in a standard commodity logic drive in accordance with an embodiment of the present application.

FIG. 14A is a schematically top view showing arrangement for various semiconductor chips or operation modules packaged in a standard commodity logic drive in accordance with an embodiment of the present application. Referring to FIG. 14A, a standard commodity logic drive 300 may be packaged with a standard commodity FPGA IC chip 200, graphic-processing-unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d* and digital-signal-processing (DSP) integrated-circuit (IC) chip 270 each assembled in a single-die type or in an operation module 190 as seen in FIG. 21F, 21G, 23F, 23G, 24G, 24H, 25G, 25H, 26F, 26G, 26H, 27F, 27G, 27H, 28J, 29, 30, 31, 32 or 33. Further, the standard commodity logic drive 300 may be packaged with one or more auxiliary and supporting (AS) integrated-circuit (IC) chips 411 (only one is shown therein) each assembled in a single-die type or in an operation module 190 as seen in FIG. 21F, 21G, 23F, 23G, 24G, 24H, 25G, 25H, 26F, 26G, 26H, 27F, 27G, 27H, 28J, 29, 30, 31, 32 or 33. Further, the standard commodity logic drive 300 may be packaged with multiple high-bandwidth-memory (HBM) integrated-circuit (IC) chips 251 each assembled in a single-die type or in an operation module 190 as seen in FIG. 21F, 21G, 23F, 23G, 24G, 24H, 25G, 25H, 26F, 26G, 26H, 27F, 27G, 27H, 28J, 29, 30, 31, 32 or 33. Each of the HBM IC chips 251 in the standard commodity logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip, high speed, high bandwidth, wide bitwidth resistive random-access-memory (RRAM) chip or high speed, high bandwidth, wide bitwidth phase change random access memory (PCM) chips. For the standard commodity logic drive 300, each of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d* and digital-signal-processing (DSP) integrated-circuit (IC) chip 270 in the single-die type may be arranged horizontally adjacent to one of its HBM IC chips 251 in the single-die type for communication therebetween in a high speed, high bandwidth and wide bitwidth. The standard commodity logic drive 300 may be further packaged with one or more non-volatile memory (NVM) IC chips 250 (only one is shown therein) configured to store the resulting values or programming codes in a non-volatile manner for programming or configuring the programmable logic cells 2014 and programmable switch cells 379 of its standard commodity FPGA IC chip 200 as seen in FIGS. 9A-9D and 10 and for programming or configuring the cross-point switches 379 of its DPIIC chips 410 as seen in FIG. 12, and to store data in a non-volatile manner from its HBM IC chips 251. The standard commodity logic drive 300 may be further packaged with an innovated application-specific-IC (ASIC) or customer-owned-tooling (COT) (abbreviated as IAC below) chip 402 for intellectual-property (IP) circuits, application-specific (AS) circuits, analog circuits, mixed-mode signal circuits, radio-frequency (RF) circuits, and/or transmitter, receiver or transceiver circuits, etc. The standard commodity logic drive 300 may be further packaged with a dedicated control and input/output (I/O) chip 260 to control data transmission between any two of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC chip 402 and non-volatile memory (NVM) IC chip 250.

Referring to FIG. 14A, for the standard commodity logic drive, its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC chip 402, non-volatile memory (NVM) IC chip 250 and dedicated control and I/O chip 260 may be arranged in an array. The standard commodity logic drive 300 may include multiple inter-chip interconnects 371 each extending alone edges of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC chip 402, non-volatile memory (NVM) IC chip 250 and dedicated control and I/O chip 260.

Referring to FIG. 14A, the standard commodity logic drive 300 may include a plurality of DPIIC chips 410 aligned with a cross of a vertical bundle of inter-chip interconnects 371 and a horizontal bundle of inter-chip interconnects 371. For the standard commodity logic drive 300, each of its DPIIC chips 410 may be arranged at corners of four of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC chip 402, non-volatile memory (NVM) IC chip 250 and dedicated control and I/O chip 260 around said each of its DPIIC chips 410. The inter-chip interconnects 371 may be formed for the programmable interconnect 361. Data transmission may be built (1) between one of the programmable interconnects 361 of the inter-chip interconnects 371 and one of the programmable interconnects 361 of the standard commodity FPGA IC chip 200 via one of the small input/output (I/O) circuits 203 of the standard commodity FPGA IC chip 200, and (2) between one of the programmable interconnects 361 of the inter-chip interconnects 371 and one of the programmable interconnects 361 of one of the DPIIC chips 410 via one of the small input/output (I/O) circuits 203 of said one of the DPIIC chips 410.

Referring to FIG. 14A, for the standard commodity logic drive 300, one or more of the programmable interconnects 361 of its inter-chip interconnects 371 may couple from its standard commodity FPGA IC chip 200 in a single-die type or in the operation module 190 to all of the DPIIC chips 410. One or more of the programmable interconnects 361 of its inter-chip interconnects 371 may couple from the standard commodity FPGA IC chip 200 in a single-die type or in the operation module 190 to its dedicated control and input/output (I/O) chip 260. One or more of the programmable interconnects 361 of its inter-chip interconnects 371 may couple from its standard commodity FPGA IC chip 200 in a single-die type or in the operation module 190 to its NVM IC chip 250. One or more of the programmable interconnects 361 of its inter-chip interconnects 371 may couple from its standard commodity FPGA IC chip 200 in a single-die type or in the operation module 190 to its GPU chip 269*a* in a single-die type or in the operation module 190. One or more of the programmable interconnects 361 of its inter-chip interconnects 371 may couple from its standard commodity FPGA IC chip 200 in a single-die type or in the operation module 190 to its CPU chip 269*b* in a single-die type or in the operation module 190. One or more of the programmable interconnects 361 of its inter-chip interconnects 371 may couple from its standard commodity FPGA IC chip 200 in a single-die type or in the operation module 190 to its DSP chip 270 in a single-die type or in the operation module 190. One or more of the programmable interconnects 361 of its inter-chip interconnects 371 may couple from its standard commodity FPGA IC chip 200 in a single-die type to one of its HBMIC chips 251 in a single-die type next to its standard commodity FPGA IC chip 200 and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its standard commodity FPGA IC chip 200 in a single-die type or in the operation module 190 to its IAC chip 402. One or more of the programmable interconnects 361 of its inter-chip interconnects 371 may couple from its standard commodity FPGA IC chip 200 in a single-die type or in the operation module 190 to its TPU chip 269*c* in a single-die type or in the operation module 190. One or more of the programmable interconnects 361 of its inter-chip interconnects 371 may couple from its standard commodity FPGA IC chip 200 in a single-die type or in the operation module 190 to its NPU chip 269*d* in a single-die type or in the operation module 190. One or more of the programmable interconnects 361 of its inter-chip interconnects 371 may couple from its standard commodity FPGA IC chip 200 in a single-die type to its standard commodity FPGA IC chip 200 in the operation module 190.

Referring to FIG. 14A, for the standard commodity logic drive 300, one or more of the programmable interconnects 361 of its inter-chip interconnects 371 may couple from each of its DPIIC chips 410 to its dedicated control and input/output (I/O) chip 260. One or more of the programmable interconnects 361 of its inter-chip interconnects 371 may couple from each of its DPIIC chips 410 to its NVM IC chip 250. One or more of the programmable interconnects 361 of its inter-chip interconnects 371 may couple from each of its DPIIC chips 410 to its GPU chip 269*a* in a single-die type or in the operation module 190. One or more of the programmable interconnects 361 of its inter-chip interconnects 371 may couple from each of its DPIIC chips 410 to its CPU chip 269*b* in a single-die type or in the operation module 190. One or more of the programmable interconnects 361 of its inter-chip interconnects 371 may couple from each of its DPIIC chips 410 to its DSP chip 270 in a single-die type or in the operation module 190. One or more of the programmable interconnects 361 of its inter-chip interconnects 371 may couple from each of its DPIIC chips 410 to all of its HBM IC chips 251 each in a single-die type or in the operation module 190. One or more of the programmable interconnects 361 of its inter-chip interconnects 371 may couple from each of its DPIIC chips 410 to the others of the DPIIC chips 410. One or more of the programmable interconnects 361 of its inter-chip interconnects 371 may couple from each of its DPIIC chips 410 to its IAC chip 402. One or more of the programmable interconnects 361 of its inter-chip interconnects 371 may couple from each of its DPIIC chips 410 to its TPU chip 269*c* in a single-die type or in the operation module 190. One or more of the programmable interconnects 361 of its inter-chip interconnects 371 may couple from each of its DPIIC chips 410 to its NPU chip 269*d* in a single-die type or in the operation module 190.

Referring to FIG. 14A, for the standard commodity logic drive 300, one or more of the programmable interconnects 361 of its inter-chip interconnects 371 may couple from its CPU chip 269*b* in a single-die type or in the operation module 190 to its GPU chip 269*a* in a single-die type or in the operation module 190. One or more of the programmable interconnects 361 of its inter-chip interconnects 371 may couple from its TPU chip 269*c* in a single-die type or in the operation module 190 to its GPU chip 269*a* in a single-die type or in the operation module 190. One or more of the programmable interconnects 361 of its inter-chip interconnects 371 may couple from its NPU chip 269*d* in a single-die type or in the operation module 190 to its GPU chip 269*a* in a single-die type or in the operation module 190. One or more of the programmable interconnects 361 of its inter-chip interconnects 371 may couple from its DSP chip 270 in a single-die type or in the operation module 190 to its GPU chip 269*a* in a single-die type or in the operation module 190. One or more of the programmable interconnects 361 of its inter-chip interconnects 371 may couple from its CPU chip 269*b* in a single-die type or in its operation module 190 to its NVM IC chip 250. One or more of the programmable interconnects 361 of its inter-chip interconnects 371 may couple from its TPU chip 269*c* in a single-die type or in its operation module 190 to its NVM IC chip 250. One or more of the programmable interconnects 361 of its inter-chip interconnects 371 may couple from its NPU chip 269*d* in a single-die type or in its operation module 190 to its NVM IC chip 250. One or more of the programmable interconnects 361 of its inter-chip interconnects 371 may couple from its DSP chip 270 in a single-die type or in its operation module 190 to its NVM IC chip 250. One or more of the programmable interconnects 361 of its inter-chip interconnects 371 may couple from its CPU chip 269*b* in a single-die type to one of its HBM IC chips 251 in a single-die type next to its CPU chip 269*b* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its TPU chip 269*c* in a single-die type to one of its HBM IC chips 251 in a single-die type next to its TPU chip 269*c* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its NPU chip 269*d* in a single-die type to one of its HBM IC chips 251 in a single-die type next to its NPU chip 269*d* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its DSP chip 270 in a single-die type to one of its HBM IC chips 251 in a single-die type next to its DSP chip 270 and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its CPU chip 269*b* in a single-die type or in its operation module 190 to the IAC chip 402. One or more of the programmable interconnects 361 of its inter-chip interconnects 371 may couple from its TPU chip 269*c* in a single-die type or in its operation module 190 to the IAC chip 402. One or more of the programmable interconnects 361 of its inter-chip interconnects 371 may couple from its NPU chip 269*d* in a single-die type or in its operation module 190 to the IAC chip 402. One or more of the programmable interconnects 361 of its inter-chip interconnects 371 may couple from its DSP chip 270 in a single-die type or in its operation module 190 to its IAC chip 402. One or more of the programmable interconnects 361 of its inter-chip interconnects 371 may couple from its CPU chip 269*b* in a single-die type or in its operation module 190 to its DSP chip 270 in a single-die type or in its operation module 190. One or more of the programmable interconnects 361 of its inter-chip interconnects 371 may couple from its CPU chip 269*b* in a single-die type or in its operation module 190 to its TPU chip 269*c* in a single-die type or in its operation module 190. One or more of the programmable interconnects 361 of its inter-chip interconnects 371 may couple from its CPU chip 269*b* in a single-die type or in its operation module 190 to its NPU chip 269*d* in a single-die type or in its operation module 190. One or more of the programmable interconnects 361 of its inter-chip interconnects 371 may couple from its TPU chip 269*c* in a single-die type or in its operation module 190 to its NPU chip 269*d* in a single-die type or in its operation module 190. One or more of the programmable interconnects 361 of its inter-chip interconnects 371 may couple from its GPU chip 269*a* in a single-die type to one of its HBM IC chips 251 in a single-die type next to its GPU chip 269*a* and the communication therebetween may have a data bit width of equal to or greater than 64, 128, 256, 512, 1024, 2048, 4096, 8K, or 16K. One or more of the programmable interconnects 361 of its inter-chip interconnects 371 may couple from its GPU chip 269*a* in a single-die type or in its operation module 190 to its NVM IC chip 250. One or more of the programmable interconnects 361 of its inter-chip interconnects 371 may couple from its GPU chip 269*a* in a single-die type to its GPU chip 269*a* in its operation module 190. One or more of the programmable interconnects 361 of its inter-chip interconnects 371 may couple from its GPU chip 269*a* in a single-die type or in its operation module 190 to its IAC chip 402. One or more of the programmable interconnects 361 of its inter-chip interconnects 371 may couple from its NVM IC chip 250 to its dedicated control and input/output (I/O) chip 260. One or more of the programmable interconnects 361 of its inter-chip interconnects 371 may couple from each of its HBM IC chips 251 in a single-die type or in its operation module 190 to its dedicated control and input/output (I/O) chip 260. One or more of the programmable interconnects 361 of its inter-chip interconnects 371 may couple from its GPU chip 269*a* in a single-die type or in its operation module 190 to its dedicated control and input/output (I/O) chip 260. One or more of the programmable interconnects 361 of its inter-chip interconnects 371 may couple from its CPU chip 269*b* in a single-die type or in its operation module 190 to its dedicated control and input/output (I/O) chip 260. One or more of the programmable interconnects 361 of its inter-chip interconnects 371 may couple from its TPU chip 269*c* in a single-die type or in its operation module 190 to its dedicated control and input/ output (I/O) chip 260. One or more of the programmable interconnects 361 of its inter-chip interconnects 371 may couple from its NPU chip 269*d* in a single-die type or in its operation module 190 to its dedicated control and input/output (I/O) chip 260. One or more of the programmable interconnects 361 of its inter-chip interconnects 371 may couple from its DSP chip 270 in a single-die type or in its operation module 190 to its dedicated control and input/output (I/O) chip 260. One or more of the programmable interconnects 361 of its inter-chip interconnects 371 may couple from its NVM IC chip 250 to each of its HBM IC chips 251 in a single-die type or in its operation module 190. One or more of the programmable interconnects 361 of its inter-chip interconnects 371 may couple from its NVM IC chip 250 to its IAC chip 402. One or more of the programmable interconnects 361 of its inter-chip interconnects 371 may couple from each of its HBM IC chips 251 in a single-die type or in its operation module 190 to its IAC chip 402. One or more of the programmable interconnects 361 of its inter-chip interconnects 371 may couple from its IAC chip 402 to its dedicated control and input/output (I/O) chip 260. One or more of the programmable interconnects 361 of its inter-chip interconnects 371 may couple from each of its HBM IC chips 251 in a single-die type or in its operation module 190 to one of the others of the HBM IC chips 251 in a single-die type or in its operation module 190.

Referring to FIG. 14A, the standard commodity logic drive 300 may include multiple dedicated input/output (I/O) chips 265 in a peripheral region thereof surrounding a central region thereof, in which its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, HBM IC chips 251, IAC chip 402, non-volatile memory (NVM) IC chip 250, dedicated control and I/O chip 260 and DPIIC chips 410 are located. For the standard commodity logic drive 300, one or more of the programmable interconnects 361 of its inter-chip interconnects 371 may couple from its standard commodity FPGA IC chip 200 in a single-die type or in its operation module 190 to all of its dedicated input/output (I/O) chips 265. One or more of the programmable interconnects 361 of its inter-chip interconnects 371 may couple from each of its DPIIC chips 410 to all of its dedicated input/output (I/O) chips 265. One or more of the programmable interconnects 361 of its inter-chip interconnects 371 may couple from its NVM IC chip 250 to all of its dedicated input/output (I/O) chips 265. One or more of the programmable interconnects 361 of its inter-chip interconnects 371 may couple from its dedicated control and input/output (I/O) chip 260 to all of its dedicated input/output (I/O) chips 265. One or more of the programmable interconnects 361 of its inter-chip interconnects 371 may couple from its GPU chip 269*a* in a single-die type or in its operation module 190 to all of its dedicated input/output (I/O) chips 265. One or more of the programmable interconnects 361 of its inter-chip interconnects 371 may couple from its CPU chip 269*b* in a single-die type or in its operation module 190 to all of its dedicated input/output (I/O) chips 265. One or more of the programmable interconnects 361 of its inter-chip interconnects 371 may couple from its TPU chip 269*c* in a single-die type or in its operation module 190 to all of its dedicated input/output (I/O) chips 265. One or more of the programmable interconnects 361 of its inter-chip interconnects 371 may couple from its NPU chip 269*d* in a single-die type or in its operation module 190 to all of its dedicated input/output (I/O) chips 265. One or more of the programmable interconnects 361 of its inter-chip interconnects 371 may couple from its DSP chip 270 in a single-die type or in its operation module 190 to all of its dedicated input/output (I/O) chips 265. One or more of the programmable interconnects 361 of its inter-chip interconnects 371 may couple from each of its HBM IC chips 251 in a single-die type or in its operation module 190 to all of its dedicated input/output (I/O) chips 265. One or more of the programmable interconnects 361 of its inter-chip interconnects 371 may couple from its IAC chip 402 to all of its dedicated input/output (I/O) chips 265. For the standard commodity logic drive 300, its dedicated control and input/output (I/O) chip 260 is configured to control data transmission between each of its dedicated input/output (I/O) chips 265 and one of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, HBM IC chips 251, IAC chip 402, non-volatile memory (NVM) IC chip 250, dedicated control and I/O chip 260 and DPIIC chips 410.

Referring to FIG. 14A, for the standard commodity logic drive 300 being in operation, each of its DPIIC chips 410 may be arranged with the SRAM cells acting as cache memory to store data from any of its standard commodity FPGA IC chip 200, graphic-processing unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, HBM IC chips 251, IAC chip 402, non-volatile memory (NVM) IC chip 250, dedicated control and I/O chip 260 and DPIIC chips 410.

Referring to FIG. 14A, for the standard commodity logic drive 300, its non-volatile memory (NVM) IC chip 250 may include multiple large input/output (I/O) circuits each having an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Alternatively, its non-volatile memory (NVM) IC chip 250 may include a cryptography block or circuit configured to decrypt, in accordance with a password or key stored or saved in a non-volatile memory cell of the cryptography block or circuit of its non-volatile memory (NVM) IC chip 250, which may be composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor, encrypted data from multiple non-volatile memory cells of its non-volatile memory (NVM) IC chip 250 as decrypted data and to encrypt, in accordance with the password or key, data as encrypted data to be stored in multiple non-volatile memory cells of its non-volatile memory (NVM) IC chip 250.

Referring to FIG. 14A, for a first aspect of the standard commodity logic drive 300, a first one of the large I/O circuits of its NVM IC chip 250 may have a large driver coupling to a large receiver of a second one of the large I/O circuits of one of the AS IC chip 411 via one of the non-programmable interconnects 364 of the inter-chip interconnects 371 for passing first encrypted CPM data from the large driver of the first one of the large I/O circuits to the large receiver of the second one of the large I/O circuits. Next, the first encrypted CPM data may be decrypted as illustrated in FIG. 13, in accordance with a password or key, by the cryptography block or circuit 517 of its AS IC chip 411 as first decrypted CPM data. Next, a first one of the small I/O circuits of its AS IC chip 411 may have a small driver coupling to a small receiver of a second one of the small I/O circuits of its standard commodity FPGA IC chip 200 via another of the non-programmable interconnects 364 of the inter-chip interconnects 371 for passing the first decrypted CPM data from the small driver of the first one of the small I/O circuits to the small receiver 375 of the second one of the small I/O circuits. Next, one of the first type of memory cells 490 of one of the programmable logic cells (LC) 2014 of its standard commodity FPGA IC chip 200 as seen in FIGS. 9A-9D may be programmed or configured in accordance with the first decrypted CPM data, or one of the first type of memory cells 362 of one of the programmable switch cells 379 of its standard commodity FPGA IC chip 200 as seen in FIG. 10 may be programmed or configured in accordance with the first decrypted CPM data. Alternatively, a third one of the small I/O circuits of its standard commodity FPGA IC chip 200 may have a small driver coupling to a small receiver of a fourth one of the small I/O circuits of its AS IC chip 411 via another of the non-programmable interconnects 364 of the inter-chip interconnects 371 for passing second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 from the small driver of the third one of the small I/O circuits to the small receiver of the fourth one of the small I/O circuits. Next, the second CPM data may be encrypted as illustrated in FIG. 13, in accordance with the password or key, by the cryptography block or circuit 517 of its AS IC chip 411 as second encrypted CPM data. Next, a third one of the large I/O circuits of its AS IC chip 411 may have a large driver coupling to a large receiver of a fourth one of the large I/O circuits of its NVM IC chip 250 via another of the non-programmable interconnects 364 of the inter-chip interconnects 371 for passing the second encrypted CPM data from the large driver of the third one of the large I/O circuits to the large receiver of the fourth one of the large I/O circuits to be stored in its NVM IC chip 250.

Referring to FIG. 14A, for a second aspect of the standard commodity logic drive 300, a first one of the large I/O circuits of its NVM IC chip 250 may have a large driver coupling to a large receiver of a second one of the large I/O circuits of its AS IC chip 411 via one of the non-programmable interconnects 364 of the inter-chip interconnects 371 for passing first encrypted CPM data from the large driver 274 of the first one of the large I/O circuits to the large receiver 275 of the second one of the large I/O circuits 341. Next, a first one of the small I/O circuits of its AS IC chip 411 may have a small driver coupling to a small receiver of a second one of the small I/O circuits of its standard commodity FPGA IC chip 200 via another of the non-programmable interconnects 364 of the inter-chip interconnects 371 for passing the first encrypted CPM data from the small driver 374 of the first one of the small I/O circuits to the small receiver of the second one of the small I/O circuits. Next, its standard commodity FPGA IC chip 200 may include the cryptography block or circuit as illustrated in FIG. 11 configured to decrypt, in accordance with a password or key, the first encrypted CPM data as first decrypted CPM data. Next, one of the first type of memory cells 490 of one of the programmable logic cells (LC) 2014 of its standard commodity FPGA IC chip 200 as seen in FIGS. 9A-9D may be programmed or configured in accordance with the first decrypted CPM data, or one of the first type of memory cells 362 of one of the programmable switch cells 379 of its standard commodity FPGA IC chip 200 as seen in FIG. 10 may be programmed or configured in accordance with the first decrypted CPM data. Alternatively, second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 may be encrypted, in accordance with the password or key, by the cryptography block or circuit of its standard commodity FPGA IC chip 200 as second encrypted CPM data. Next, a third one of the small I/O circuits 203 of its standard commodity FPGA IC chips 200 may have a small driver coupling to a small receiver of a fourth one of the small I/O circuits of its AS IC chip 411 via another of the non-programmable interconnects 364 of the inter-chip interconnects 371 for passing the second encrypted CPM data from the small driver 374 of the third one of the small I/O circuits 203 to the small receiver 375 of the fourth one of the small I/O circuits 203. Next, a third one of large I/O circuits of its AS IC chip 411 may have a large driver coupling to a large receiver of a fourth one of the large I/O circuits of its NVM IC chip 250 via another of the non-programmable interconnects 364 of the inter-chip interconnects 371 for passing the second encrypted CPM data from the large driver of the third one of the large I/O circuits to the large receiver 275 of the fourth one of the large I/O circuits to be stored in its NVM IC chip 250.

Referring to FIG. 14A, for a third aspect of the standard commodity logic drive 300, a first one of the large I/O circuits of its NVM IC chip 250 may have a large driver coupling to a large receiver of a second one of the large I/O circuits of its standard commodity FPGA IC chip 200 via one of the non-programmable interconnects 364 of the inter-chip interconnects 371 for passing first encrypted CPM data from the large driver of the first one of the large I/O circuits to the large receiver of the second one of the large I/O circuits. Next, its standard commodity FPGA IC chip 200 may include the cryptography block or circuit as illustrated in FIG. 11 configured to decrypt, in accordance with a password or key, the first encrypted CPM data as first decrypted CPM data. Next, one of the first type of memory cells 490 of one of the programmable logic cells (LC) 2014 of its standard commodity FPGA IC chip 200 as seen in FIGS. 9A-9D may be programmed or configured in accordance with the first decrypted CPM data, or one of the first type of memory cells 362 of one of the programmable switch cells 379 of its standard commodity FPGA IC chip 200 as seen in FIG. 10 may be programmed or configured in accordance with the first decrypted CPM data. Alternatively, second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 may be encrypted, in accordance with the password or key, by the cryptography block or circuit of its standard commodity FPGA IC chip 200 as second encrypted CPM data. Next, a third one of the large I/O circuits of its standard commodity FPGA IC chip 200 may have a large driver coupling to a large receiver of a fourth one of the large I/O circuits of its NVM IC chip 250 via another of the non-programmable interconnects 364 of the inter-chip interconnects 371 for passing the second encrypted CPM data from the large driver of the third one of the small I/O circuits 203 to the large receiver of the fourth one of the small I/O circuits 203 to be stored in its NVM IC chip 250.

Referring to FIG. 14A, for a fourth aspect of the standard commodity logic drive 300, its NVM IC chip 250 may include the cryptography block or circuit configured to decrypt, in accordance with a password or key, first encrypted CPM data stored therein as first decrypted CPM data. A first one of the large I/O circuits of its NVM IC chip 250 may have a large driver coupling to a large receiver of a second one of the large I/O circuits of its AS IC chip 411 via one of the non-programmable interconnects 364 of the inter-chip interconnects 371 for passing the first decrypted CPM data from the large driver of the first one of the large I/O circuits to the large receiver of the second one of the large I/O circuits. Next, a first one of the small I/O circuits of its AS IC chip 411 may have a small driver coupling to a small receiver of a second one of the small I/O circuits of its standard commodity FPGA IC chip 200 via another of the non-programmable interconnects 364 of the inter-chip interconnects 371 for passing the first decrypted CPM data from the small driver of the first one of the small I/O circuits to the small receiver of the second one of the small I/O circuits. Next, one of the first type of memory cells 490 of one of the programmable logic cells (LC) 2014 of its standard commodity FPGA IC chip 200 as seen in FIGS. 9A-9D may be programmed or configured in accordance with the first decrypted CPM data, or one of the first type of memory cells 362 of one of the programmable switch cells 379 of its standard commodity FPGA IC chip 200 as seen in FIG. 10 may be programmed or configured in accordance with the first decrypted CPM data. Alternatively, a third one of the small I/O circuits 203 of its standard commodity FPGA IC chip 200 may have a small driver coupling to a small receiver of a fourth one of the small I/O circuits of its AS IC chip 411 via another of the non-programmable interconnects 364 of the inter-chip interconnects 371 for passing second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chip 200 from the small driver of the third one of the small I/O circuits to the small receiver of the fourth one of the small I/O circuits. Next, a third one of the large I/O circuits of its AS IC chip 411 may have a large driver coupling to a large receiver of a fourth one of the large I/O circuits of its NVM IC chip 250 via another of the non-programmable interconnects 364 of the inter-chip interconnects 371 for passing the second CPM data from the large driver of the third one of the large I/O circuits to the large receiver of the fourth one of the large I/O circuits. The second CPM data may be encrypted, in accordance with the password or key, by the cryptography block or circuit of its NVM IC chip 250 as second encrypted CPM data to be stored in its NVM IC chip 250.

Referring to FIG. 14A, for a fifth aspect of the standard commodity logic drive 300, its NVM IC chip 250 may include the cryptography block or circuit configured to decrypt, in accordance with a password or key, first encrypted CPM data stored therein as first decrypted CPM data. A first one of the large I/O circuits of its NVM IC chip 250 may have a large driver coupling to a large receiver of a second one of the large I/O circuits of its standard commodity FPGA IC chip 200 via one of the non-programmable interconnects 364 of the inter-chip interconnects 371 for passing the first decrypted CPM data from the large driver of the first one of the large I/O circuits to the large receiver of the second one of the large I/O circuits. Next, one of the first type of memory cells 490 of one of the programmable logic cells (LC) 2014 of its standard commodity FPGA IC chip 200 as seen in FIGS. 9A-9D may be programmed or configured in accordance with the first decrypted CPM data, or one of the first type of memory cells 362 of one of the programmable switch cells 379 of its standard commodity FPGA IC chip 200 as seen in FIG. 10 may be programmed or configured in accordance with the first decrypted CPM data. Alternatively, a third one of the large I/O circuits of its standard commodity FPGA IC chips 200 may have a large driver coupling to a large receiver of a fourth one of the large I/O circuits of its NVM IC chip 250 via another of the non-programmable interconnects 364 of the inter-chip interconnects 371 for passing second CPM data used to program or configure the first type of memory cells 490 of one of the programmable logic cells (LC) 2014 of its standard commodity FPGA IC chip 200 or the first type of memory cells 362 of one of the programmable switch cells 379 of its standard commodity FPGA IC chips 200 from the large driver of the third one of the large I/O circuits to the large receiver of the fourth one of the large I/O circuits. The second CPM data may be encrypted, in accordance with the password or key, by the cryptography block or circuit of its NVM IC chip 250 as second encrypted CPM data to be stored in its NVM IC chip 250.

Figure 14B:
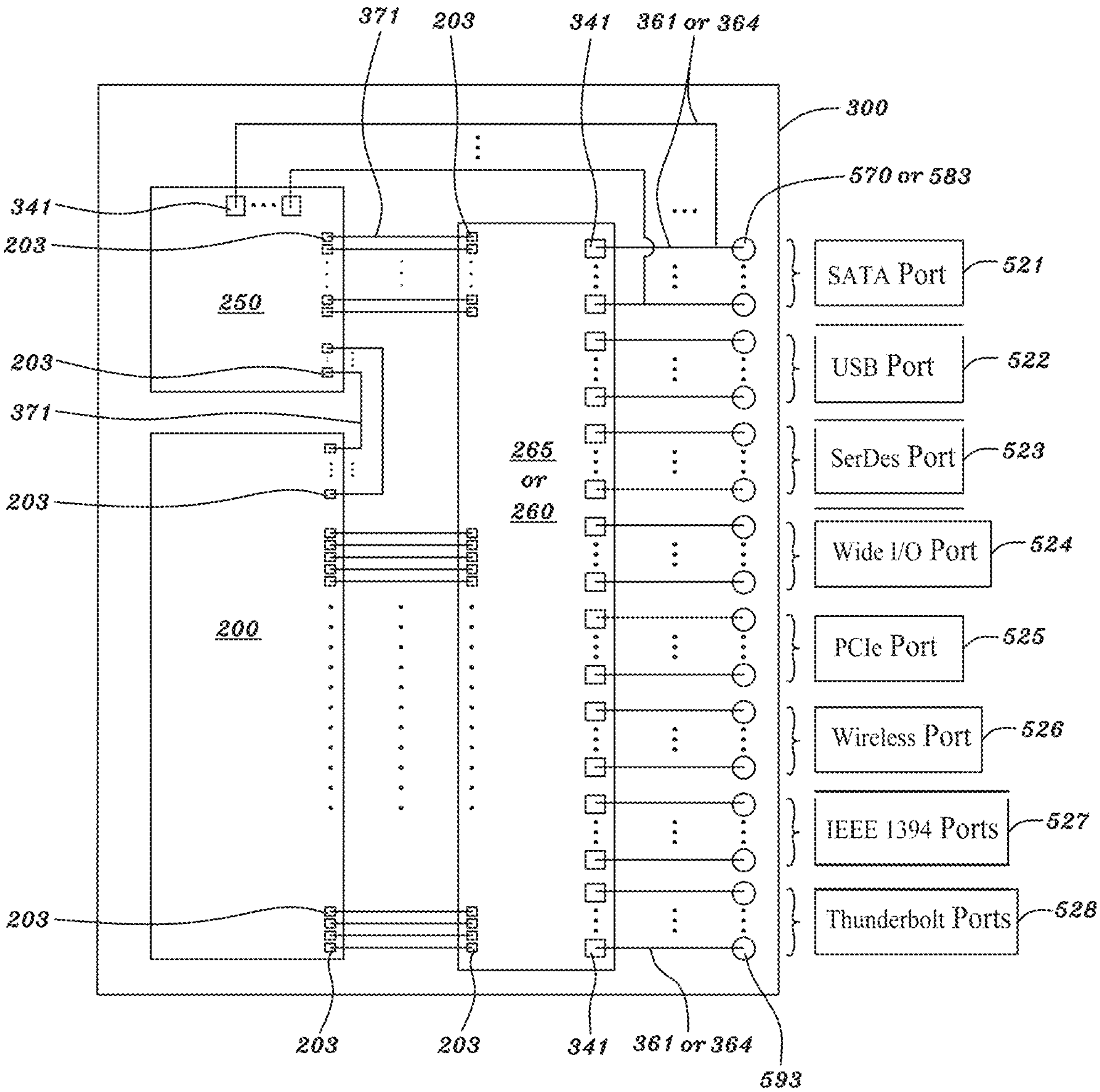
FIG. 14B is a block diagram showing interconnection in a standard commodity logic drive in accordance with an embodiment of the present application.
Figure 34:
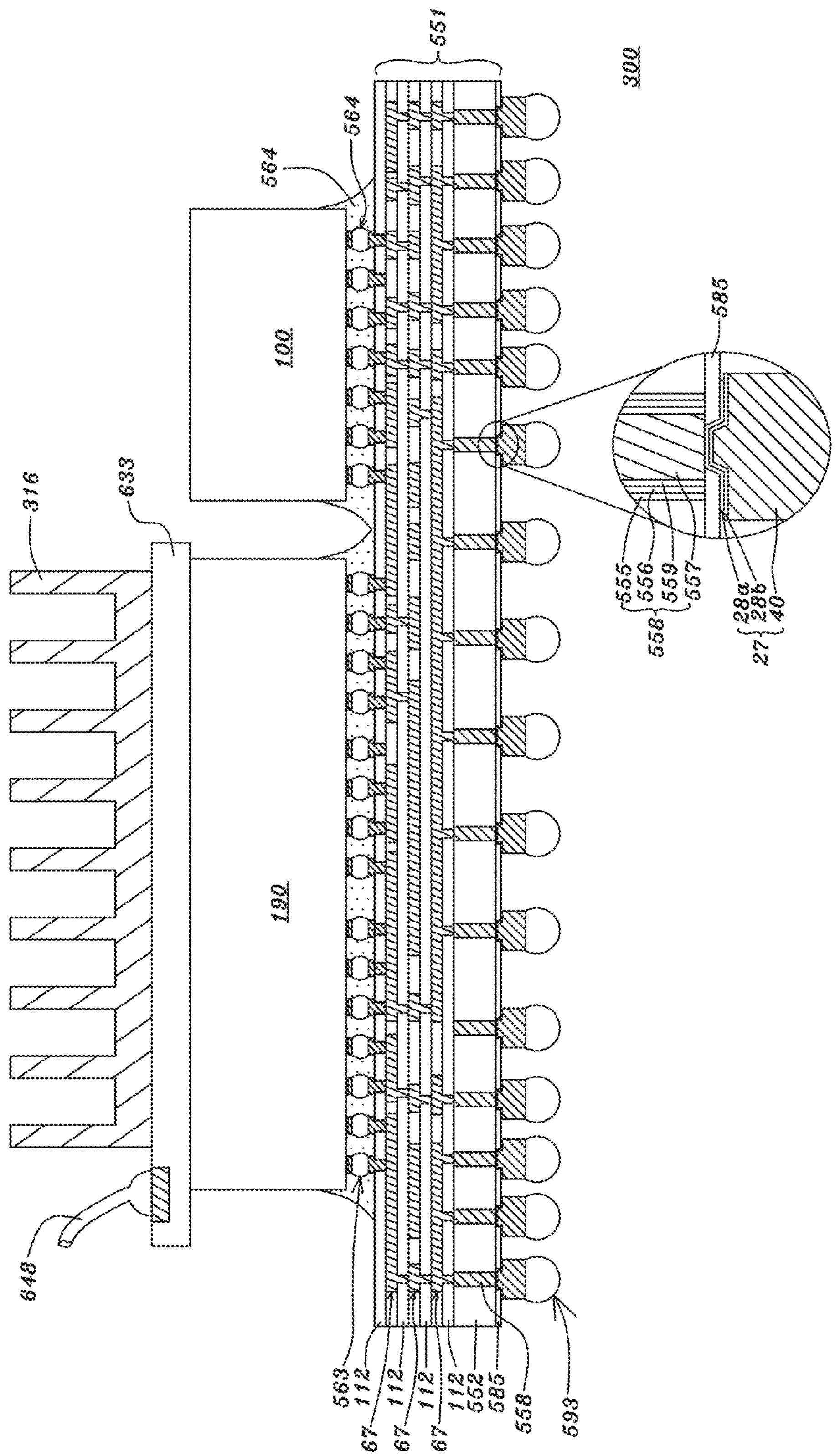
FIG. 34 is a schematically cross-sectional view showing a first type of chip package for a standard commodity logic drive in accordance with an embodiment of the present application.
Figure 35:
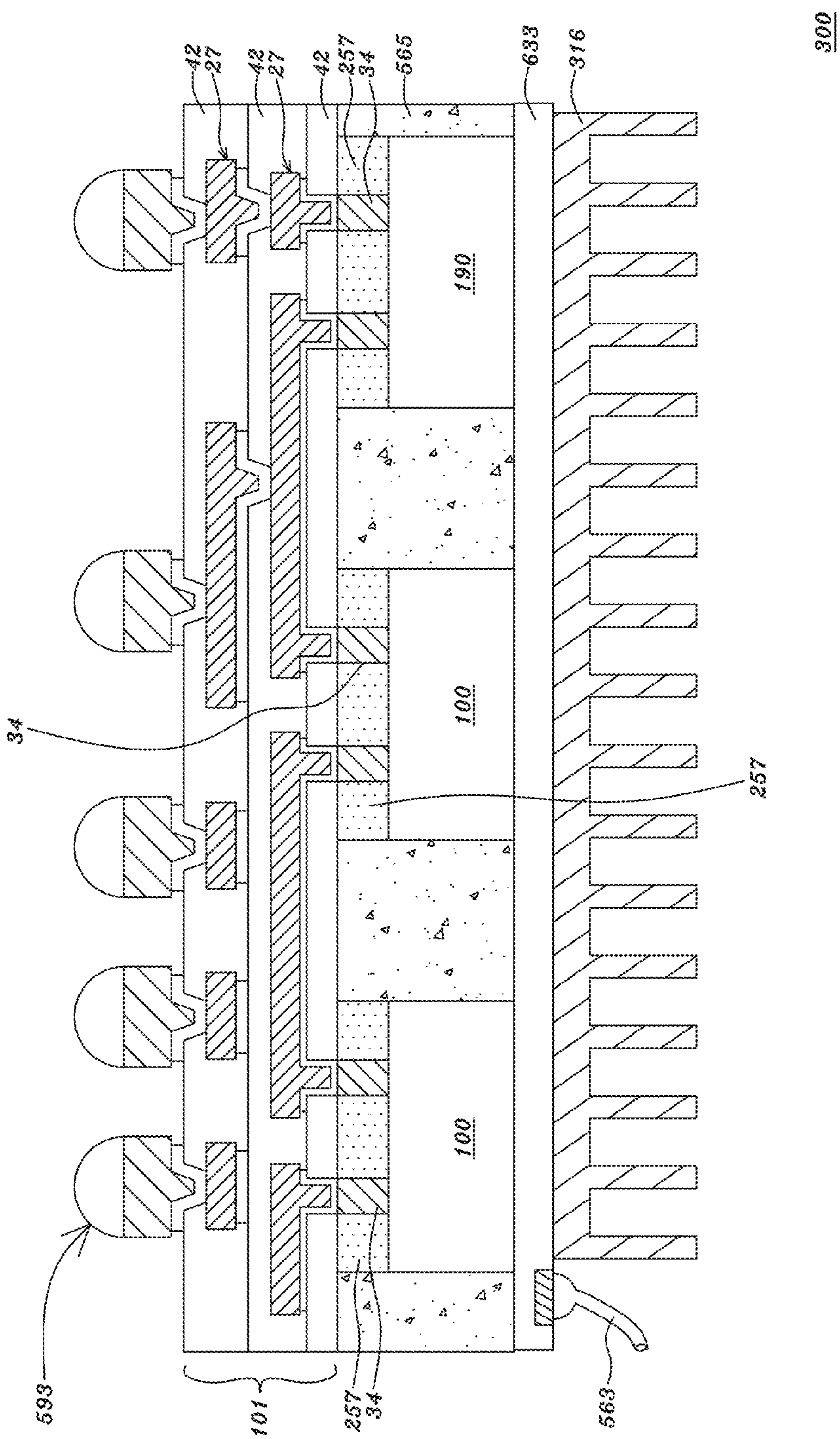
FIG. 35 is a schematically cross-sectional view showing a second type of chip package for a standard commodity logic drive in accordance with an embodiment of the present application.
Figure 36:
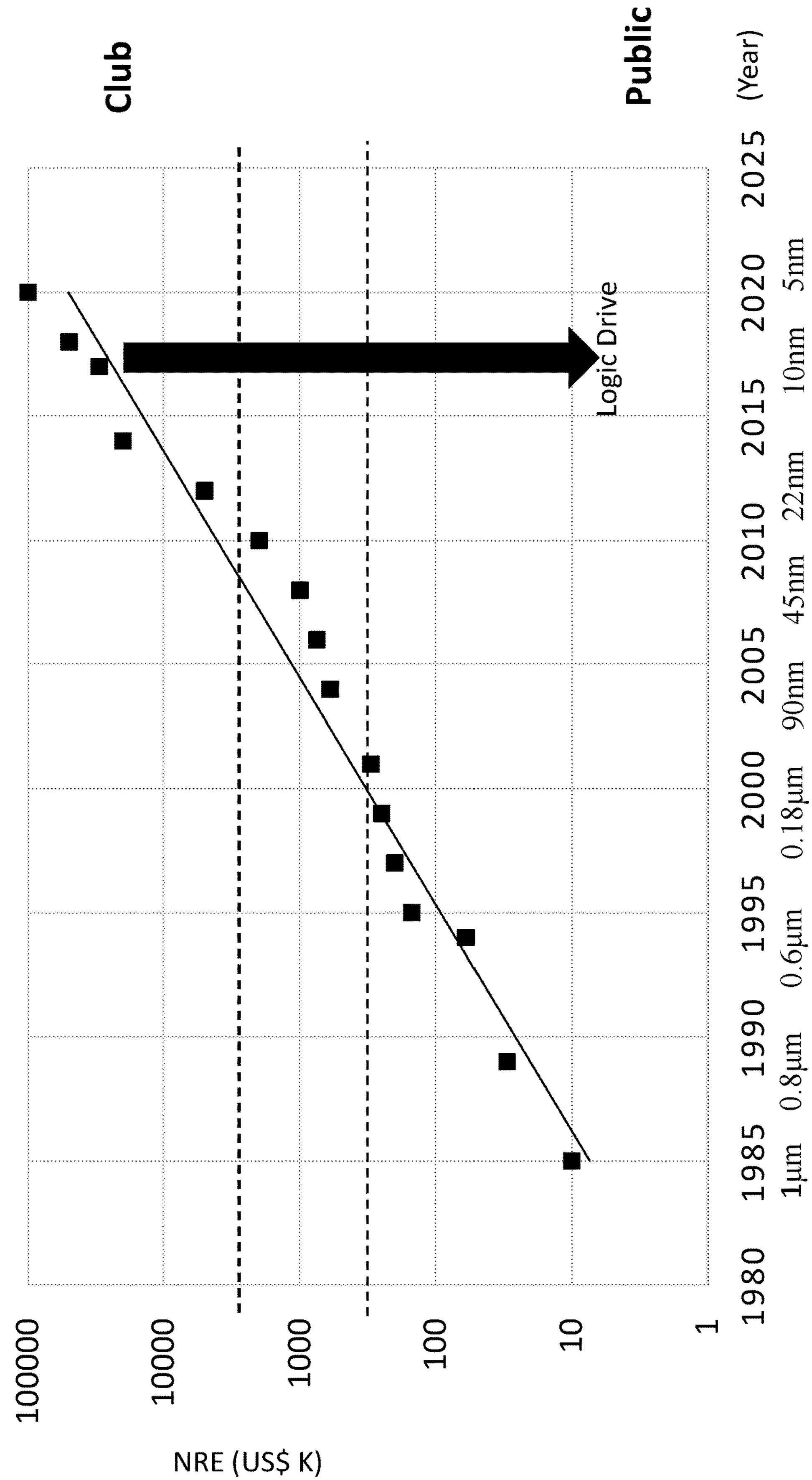
FIG. 36 is a chart showing a trend of relationship between non-recurring engineering (NRE) costs and technology nodes.

FIG. 14B is a block diagram showing interconnection in a standard commodity logic drive in accordance with an embodiment of the present application. Referring to FIG. 14B, for the standard commodity logic drive 300 as illustrated in FIG. 14A, each of its dedicated I/O chips 265 and control and I/O chip 260 may include a first group of small I/O circuits 203 each coupling to one of a first group of small I/O circuits 203 of its FPGA IC chip 200 through one of its inter-chip interconnect 371, i.e., programmable or non-programmable interconnect 361 or 364, and a second group of small I/O circuits 203 each coupling to one of a first group of small I/O circuits 203 of its NVM IC chip 250 through one of its inter-chip interconnect 371, i.e., programmable or non-programmable interconnect 361 or 364. Its FPGA IC chip 200 may include a second group of small I/O circuits 203 each coupling to one of a second group of small I/O circuits 203 of its NVM IC chip 250 through one of its inter-chip interconnect 371, i.e., programmable or non-programmable interconnect 361 or 364. Each of its dedicated I/O chips 265 and control and I/O chip 260 may include (1) a first group of large I/O circuits 341 each coupling to one of its metal bumps or pillars 593 as seen in FIGS. 34 and 35 for one or more serial-advanced-technology-attachment (SATA) ports 521 and one of the large I/O circuits 341 of its NVM IC chip 250 through one of its programmable or non-programmable interconnects 361 or 364, (2) a second group of large I/O circuits 341 each coupling to one of its metal bumps or pillars 593 for one or more universal serial bus (USB) ports 522 through one of its programmable or non-programmable interconnects 361 or 364, (3) a third group of large I/O circuits 341 each coupling to one of its metal bumps or pillars 593 for one or more serializer/deserializer (SerDes) ports 523 through one of its programmable or non-programmable interconnects 361 or 364, (4) a fourth group of large I/O circuits 341 each coupling to one of its metal bumps or pillars 593 for one or more wide input/output (I/O) ports 523 through one of its programmable or non-programmable interconnects 361 or 364, (5) a fifth group of large I/O circuits 341 each coupling to one of its metal bumps or pillars 593 for one or more peripheral-components-interconnect express (PCIe) ports 525 through one of its programmable or non-programmable interconnects 361 or 364, (6) a sixth group of large I/O circuits 341 each coupling to one of its metal bumps or pillars 593 for one or more wireless ports 526 through one of its programmable or non-programmable interconnects 361 or 364, (7) a seventh group of large I/O circuits 341 each coupling to one of its metal bumps or pillars 593 for one or more IEEE 1394 ports 527 through one of its programmable or non-programmable interconnects 361 or 364 and (8) an eighth group of large I/O circuits 341 each coupling to one of its metal bumps or pillars 593 for one or more thunderbolt ports 528 through one of its programmable or non-programmable interconnects 361 or 364.

Embodiment for Fine-Line Interconnection Bridge (FIB)

Figure 15A:
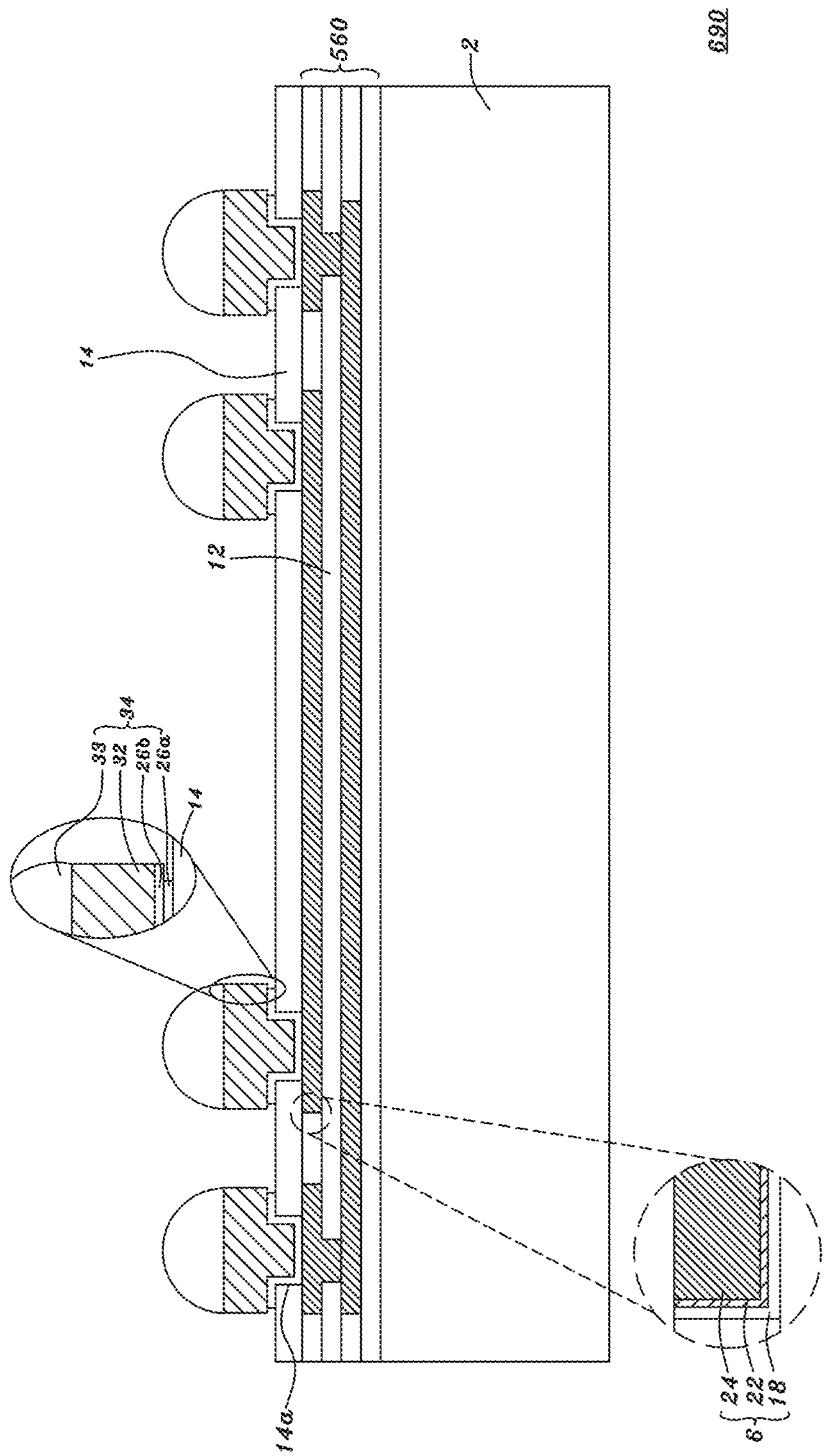
FIGS. 15A and 15B are schematically cross-sectional views showing various fine-line interconnection bridges in accordance with an embodiment of the present application.
Figure 15B:
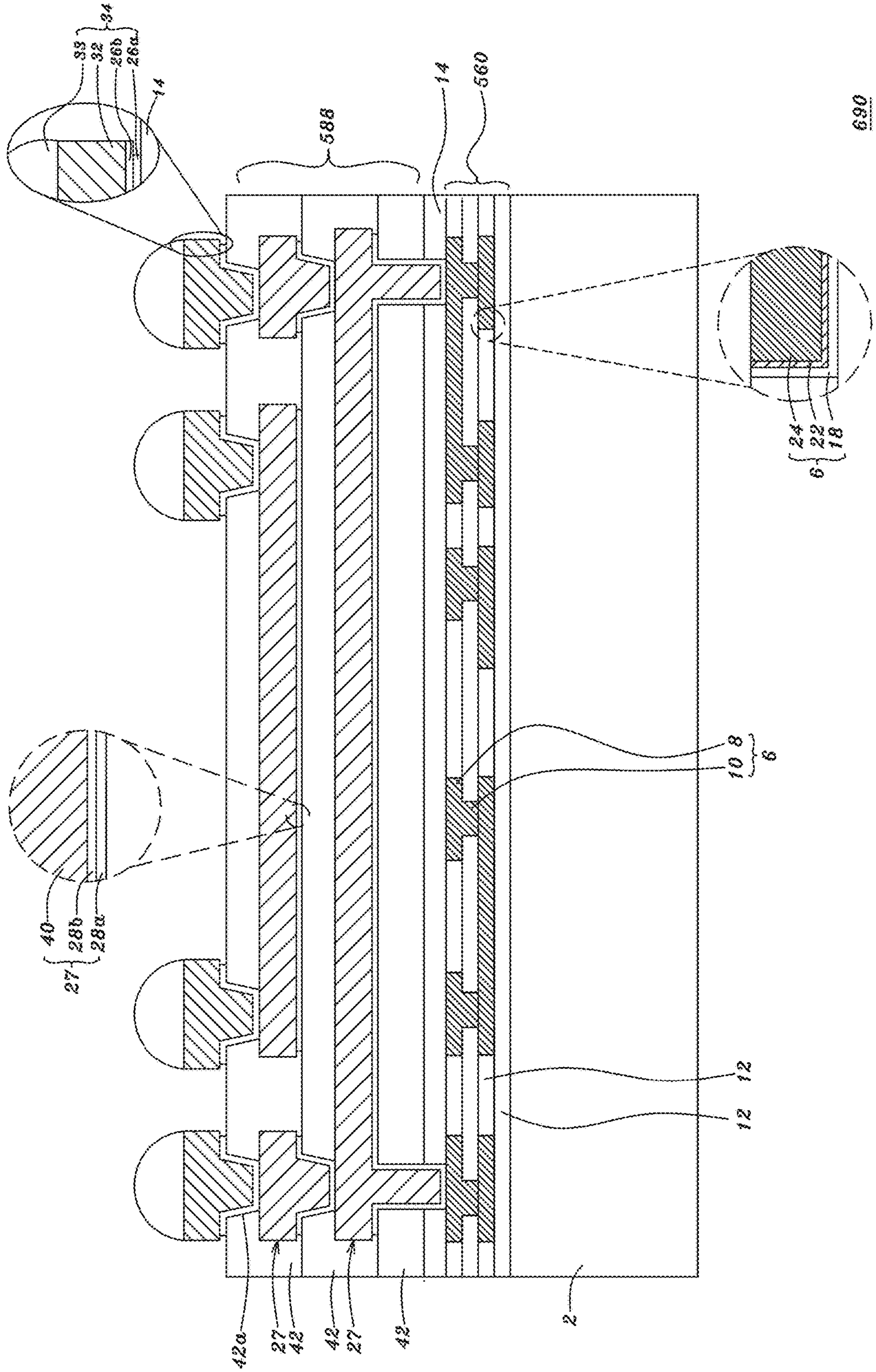

FIGS. 15A and 15B are schematically cross-sectional views showing various fine-line interconnection bridges in accordance with an embodiment of the present application. Referring to FIGS. 15A and 15B, a first or second type of fine-line interconnection bridge (FIB) 690 is provided for horizontal connection to transmit signals in a horizontal direction.

1. First Type of Fine-Line Interconnection Bridge (FIB)

Referring to FIGS. 15A, a first type of fine-line interconnection bridge (FIB) 690 may include (1) a semiconductor substrate 2, (2) a first interconnection scheme 560 on the semiconductor substrate 2, wherein its first interconnection scheme 560 may include multiple insulating dielectric layers 12 and multiple interconnection metal layers 6 each in neighboring two of the insulating dielectric layers 12, wherein each of the interconnection metal layers 6 of its first interconnection scheme 560 is patterned with multiple metal pads, lines or traces 8 in an upper one of the neighboring two of the insulating dielectric layers 12 of its first interconnection scheme 560 and multiple metal vias 10 in a lower one of the neighboring two of the insulating dielectric layers 12 of its first interconnection scheme 560, wherein between each neighboring two of the interconnection metal layers 6 of its first interconnection scheme 560 is provided one of the insulating dielectric layers 12 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 12 of its first interconnection scheme 560 between the upper and lower ones of the interconnection metal layers 6 of its first interconnection scheme 560, (3) a passivation layer 14 as illustrated in FIG. 1E on its first interconnection scheme 560, wherein the topmost one of the interconnection metal layers 6 of its first interconnection scheme 560 may have the metal pads 8 at bottoms of multiple openings **14*a* in the passivation layer 14, and (4) multiple micro-bumps or micro-pillars 34 as illustrated in FIG. 1E on the metal pads 8 of the topmost one of the interconnection metal layers 6 of its first interconnection scheme 560 at the bottoms of the openings 14*a* in its passivation layer 14**.

Referring to FIG. 15A, for the first interconnection scheme 560, one of the metal pads, lines or traces 8 of each of its interconnection metal layers 6 may have a thickness between 3 nm and 500 nm and may have a width between 3 nm and 500 nm. A space or pitch between neighboring two of the metal pads, lines or traces 8 of each of its interconnection metal layers 6 may be between 3 nm and 500 nm. Each of its insulating dielectric layers 12 may include a layer of silicon oxide, silicon oxynitride or silicon oxycarbide having a thickness between 3 nm and 500 nm. Each of its interconnection metal layers 6 may include (1) a copper layer 24 having lower portions in openings in a lower one of the insulating dielectric layers 12, such as SiOC layer having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12.

2. Second Type of Fine-Line Interconnection Bridge (FIB)

Referring to FIGS. 15B, a second type of fine-line interconnection bridge (FIB) 690 may have a structure similar to that as illustrated in FIG. 15A. For an element indicated by the same reference number shown in FIGS. 15A and 15B, the specification of the element as seen in FIG. 15B may be referred to that of the element as illustrated in FIG. 15A. The difference between the first and second types of fine-line interconnection bridges (FIB) 690 is that the second type of fine-line interconnection bridge (FIB) 690 may further include a second interconnection scheme 588 over the passivation layer 14, wherein the second interconnection scheme 588 may include one or more interconnection metal layers 27 coupling to the metal pads 8 of the topmost one of the interconnection metal layers 6 of its first interconnection scheme 560 through the openings **14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, and multiple micro-bumps or micro-pillars 34 as illustrated in FIG. 1E may be formed on the metal pads of the topmost one of the interconnection metal layers 27 of its second interconnection scheme 588 at the bottoms of the openings 42***a* in the topmost one of the polymer layers 42 of its second interconnection scheme 588.

Referring to FIG. 15B, for the second interconnection scheme 588, each of its interconnection metal layers 27 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*.

Embodiment for Through-Silicon-Via (TSV) Bridge

Figure 16A:
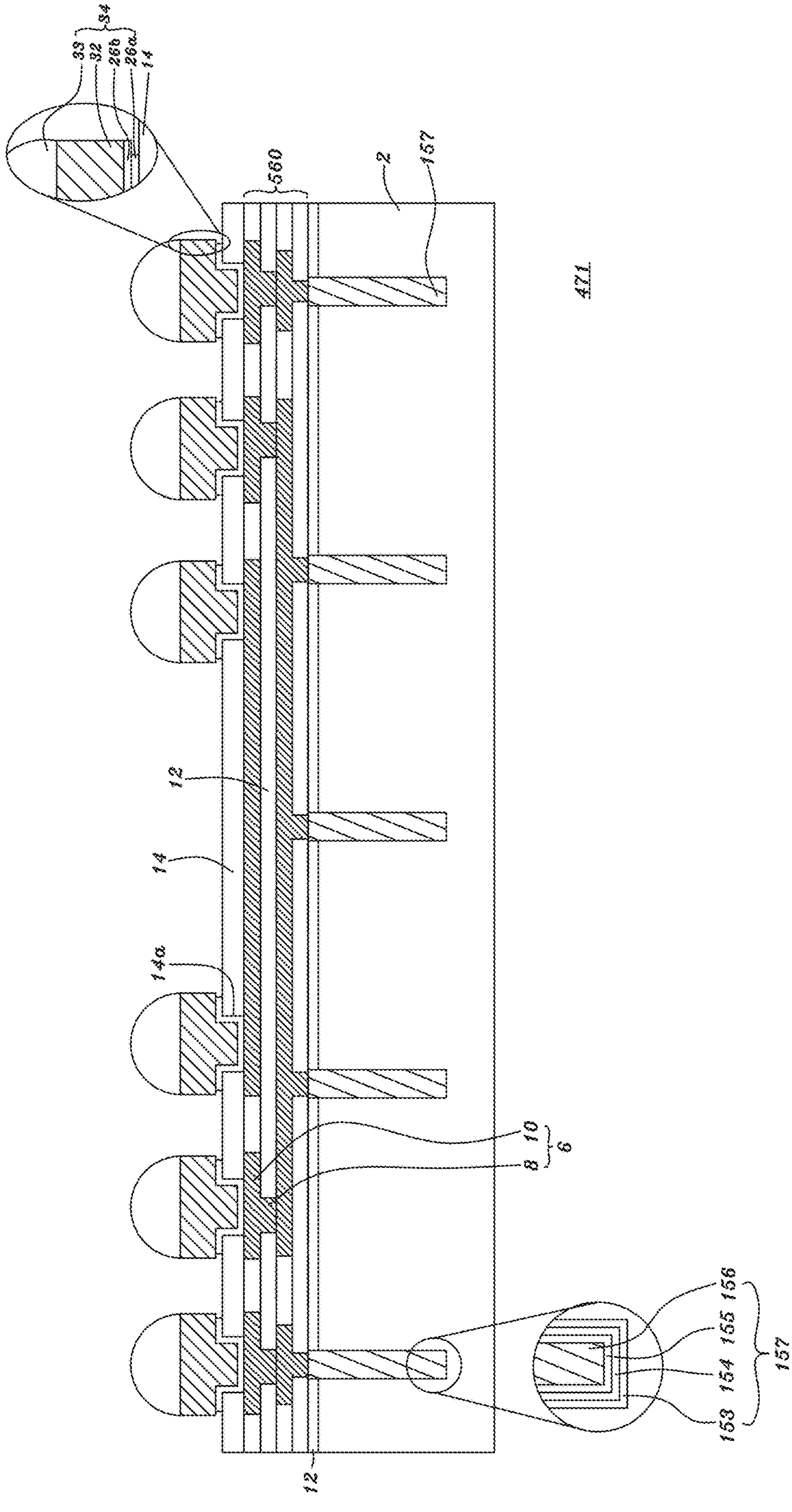
FIGS. 16A and 16B are schematically cross-sectional views showing various through-silicon-via (TSV) bridges in accordance with an embodiment of the present application.
Figure 16B:
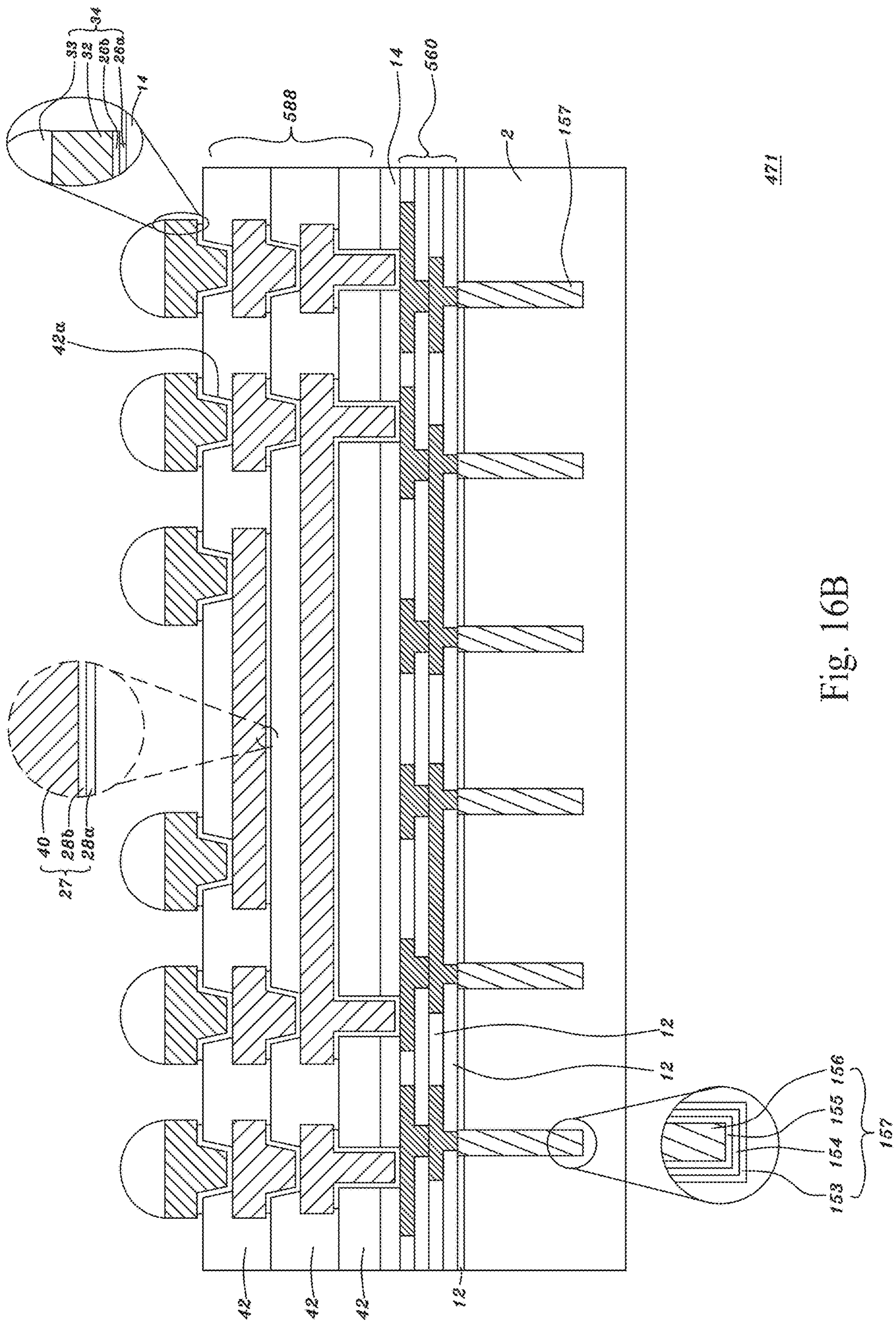

FIGS. 16A and 16B are schematically cross-sectional views showing various through-silicon-via (TSV) bridges in accordance with an embodiment of the present application. Referring to FIGS. 16A and 16B, a first or second type of through-silicon-via (TSV) bridge 471 is provided for both horizontal and vertical connection to transmit signals in horizontal and vertical directions.

1. First Type of Through-Silicon-Via (TSV) Bridge

Referring to FIG. 16A, the first interconnection scheme 560, passivation layer 14 and micro-bumps or micro-pillars 34 of the first type of fine-line interconnection bridge (FIB) 690 as illustrated in FIG. 15A may be provided for au upper portion of a first type of through-silicon-via (TSV) bridge 471, and the semiconductor substrate 2, insulating dielectric layer 12 and through silicon vias (TSVs) 157 of the second type of vertical-through-via (VTV) connector 467 as illustrated in FIG. 1G, 1J or 1M may be provided for a lower portion of the first type of through-silicon-via (TSV) bridge 471. For an element indicated by the same reference number shown in FIGS. 1G, 1J, 1M 15A and 16A, the specification of the element as seen in FIG. 16A may be referred to that of the element as illustrated in FIG. 1G, 1J, 1M or 15A. For the first type of through-silicon-via (TSV) bridge 471, a bottommost one of the insulating dielectric layers 12 of its first interconnection scheme 560 provided by the first type of fine-line interconnection bridge (FIB) 690 may be formed on its insulating dielectric layer 12 provided by the first type of vertical-through-via (VTV) connector 467. Each opening in the bottommost one of the insulating dielectric layers 12 of its first interconnection scheme 560 may be aligned with one of its through silicon vias (TSVs) 157 to connect the bottommost one of the interconnection metal layers 6 of its first interconnection scheme 560 to said one of its through silicon vias (TSVs) 157. Alternatively, the decoupling capacitor 401 as seen in FIG. 3E or 3L may be formed in its semiconductor substrate 2 and among four of its through silicon vias (TSVs) 157; for the first type of through-silicon-via (TSV) bridge 471, the first and second electrodes 402 and 404 of its decoupling capacitor 401 may be covered by the bottommost one of the insulating dielectric layers 12 of its first interconnection scheme 560. In a case for its decoupling capacitor 401 as seen in FIG. 3E, one of the openings in the bottommost one of the insulating dielectric layers 12 of its first interconnection scheme 560 may be aligned with an edge of one of its through silicon vias (TSVs) 157 and an edge of the second electrode 404 of its decoupling capacitor 401 to connect said one of its through silicon vias (TSVs) 157 and the second electrode 404 of its decoupling capacitor 401 through the bottommost one of the interconnection metal layers 6 of its first interconnection scheme 560 in said one of the openings. In another case for its decoupling capacitor 401 as seen in FIG. 3L, a first one of the openings in the bottommost one of the insulating dielectric layers 12 of its first interconnection scheme 560 may be aligned with an edge of a first one of its through silicon vias (TSVs) 157 and an edge of the first electrode 402 of its decoupling capacitor 401 to connect the first one of its through silicon vias (TSVs) 157 and the first electrode 402 of its decoupling capacitor 401 through the bottommost one of the interconnection metal layers 6 of its first interconnection scheme 560 in the first one of the openings; a second one of the openings in the bottommost one of the insulating dielectric layers 12 of its first interconnection scheme 560 may be aligned with an edge of a second one of its through silicon vias (TSVs) 157 and an edge of the second electrode 404 of its decoupling capacitor 401 to connect the second one of its through silicon vias (TSVs) 157 and the second electrode 404 of its decoupling capacitor 401 through the bottommost one of the interconnection metal layers 6 of its first interconnection scheme 560 in the second one of the openings.

2. Second Type of Through-Silicon-Via Bridge

Referring to FIG. 16B, a second type of through-silicon-via (TSV) bridge 471 may have similar structure as illustrated in FIG. 16A. For an element indicated by the same reference number shown in FIGS. 16A and 16B, the specification of the element as seen in FIG. 16B may be referred to that of the element as illustrated in FIG. 16A. The difference between the first and second types of through-silicon-via (TSV) bridges 471 is that the second type of through-silicon-via (TSV) bridge 471 may further include the second interconnection scheme 588 as illustrated in FIG. 15B over its passivation layer 14. For the second type of through-silicon-via (TSV) bridge 471, its micro-bumps or micro-pillars 34 may be formed on the metal pads of the topmost one of the interconnection metal layers 27 of its second interconnection scheme 588 at the bottoms of the openings 42*a* in the topmost one of the polymer layers 42 of its second interconnection scheme 588.

Specification for Semiconductor Chip

FIGS. 17A-17F are schematically cross-sectional views showing various semiconductor chips in accordance with an embodiment of the present application. Referring to FIGS. 17A-17F, either type of semiconductor chip 100 may be provided for the standard commodity FPGA IC chip 200, DPIIC chip 410, dedicated I/O chip 265, dedicated control and I/O chip 260, NVM IC chip 250, IAC chip 402, HBM IC chips 251, GPU chip 269*a*, CPU chip 269*b*, TPU chip 269*c*, NPU chip 269*d*, digital-signal-processing (DSP) integrated-circuit (IC) chip 270 and auxiliary and supporting (AS) integrated-circuit (IC) chip 411 as seen in FIG. 14A.

1. First Type of Semiconductor Chip

Figure 17A:
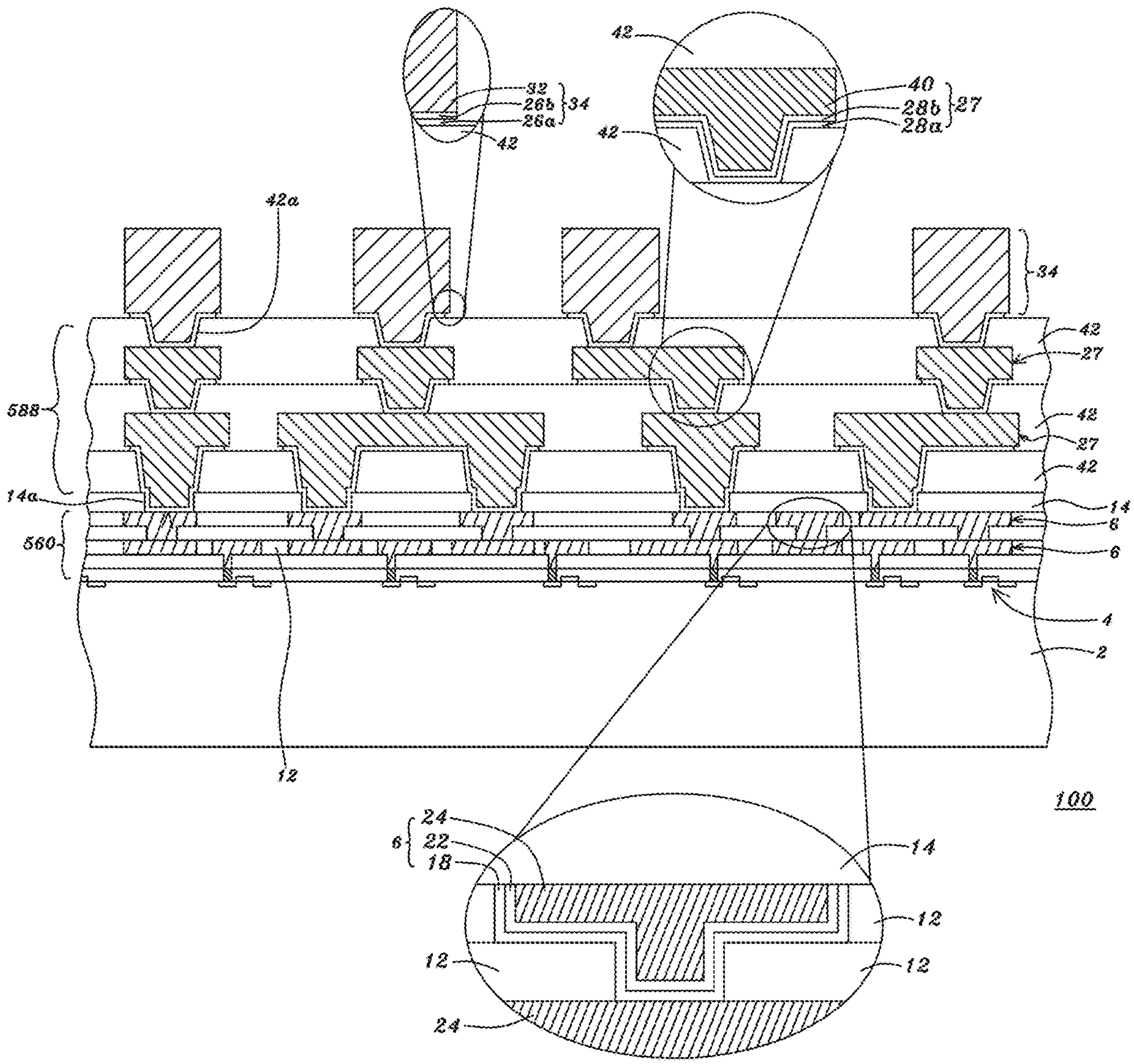
FIGS. 17A-17F are schematically cross-sectional views showing various semiconductor chips in accordance with an embodiment of the present application.

Referring to FIG. 17A, a first type of semiconductor chip 100 may have the structure as illustrated in FIG. 15A or 15B. For an element indicated by the same reference number shown in FIGS. 15A, 15B and 17A, the specification of the element as seen in FIG. 17A may be referred to that of the element as illustrated in FIG. 15A or 15B. The difference between the first type of semiconductor chip 100 and the second type of fine-line interconnection bridge (FIB) 690 is that the first type of semiconductor chip 100 as seen in FIG. 17A may further include multiple semiconductor devices 4 at an active surface of its semiconductor substrate 2 and under its first interconnection scheme 560, wherein each of its semiconductor devices 4 may couple to the interconnection metal layers 6 of its first interconnection scheme 560. For the first type of semiconductor chip 100, its semiconductor devices 4 may include a memory cell, logic circuit, passive device, such as resistor, capacitor, inductor or filter, or active device, such as P-type or N-type metal-oxide-semiconductor (MOS) transistor. Multiple of the semiconductor devices 4 may compose the selection circuits 211 of the programmable logic cells (LC) 2014, memory cells 490 of the programmable logic cells (LC) 2014, memory cells 362 for the cross-point switches 379, small I/O circuits 203, large I/O circuits and/or cryptography block or circuit as illustrated in FIGS. 9A-9D, 10 and 11, for the standard commodity FPGA IC chip 200 of the standard commodity logic drive 300 as seen in FIG. 14A. The semiconductor devices 4 may compose the memory cells 362 for the programmable switch cells 379 and small I/O circuits 203, as illustrated in FIGS. 10 and 12, for each of the DPIIC chips 410 of the standard commodity logic drive 300 as seen in FIG. 14A. Multiple of the semiconductor devices 4 may compose the large I/O circuits of large-input/output (I/O) block 412, small I/O circuits of the small-input/output (I/O) block 413, cryptography block or circuit 517, regulating block 415 and innovated application-specific-integrated-circuit (ASIC) or customer-owned tooling (COT) block 418, as illustrated in FIG. 13, for the auxiliary and supporting (AS) integrated-circuit (IC) chip 411 of the standard commodity logic drive 300 as seen in FIG. 14A.

2. Second Type of Semiconductor Chip

Figure 17B:
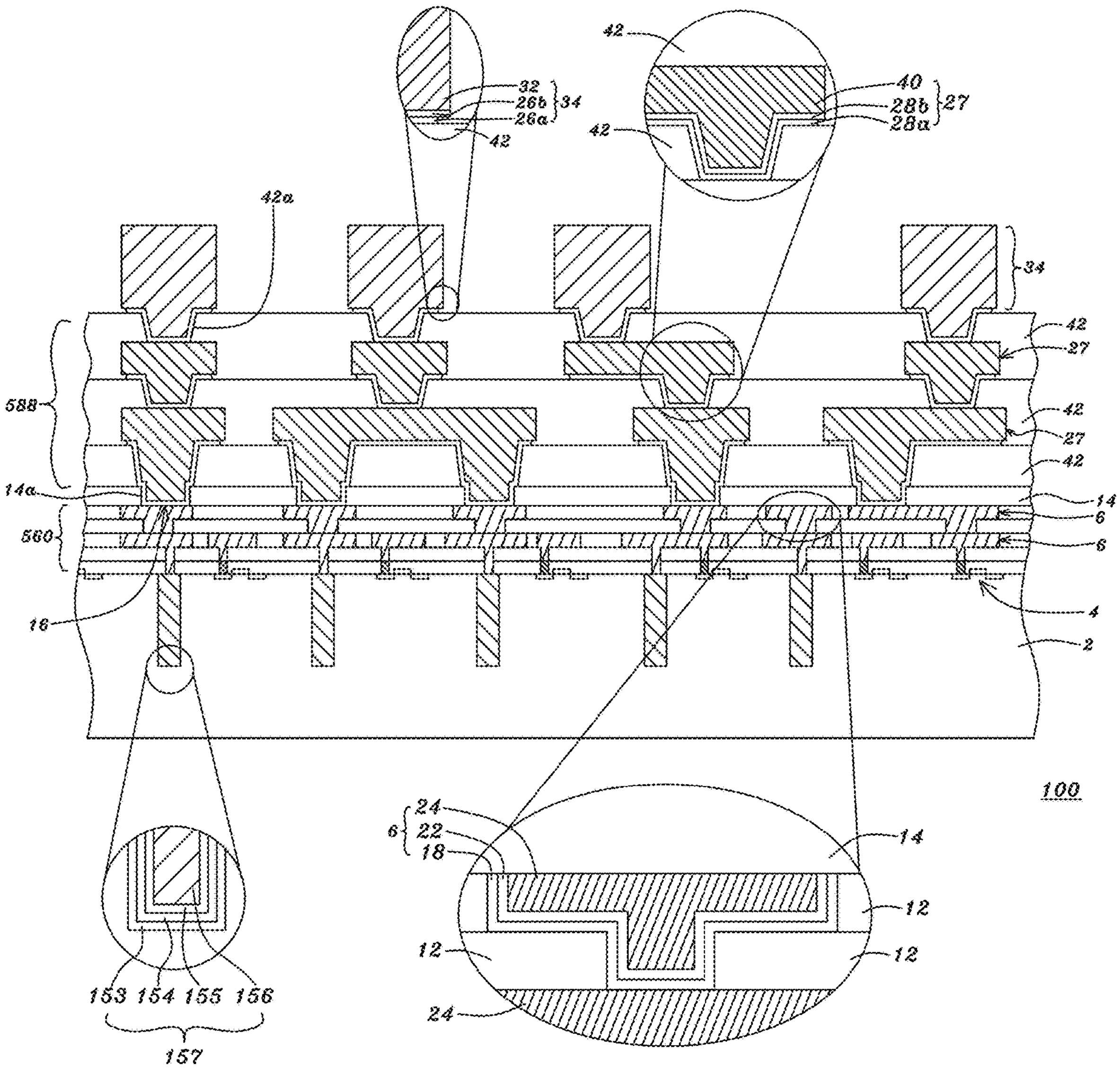

Referring to FIGS. 17B, a second type of semiconductor chip 100 may have similar structure as illustrated in FIG. 17A. For an element indicated by the same reference number shown in FIG. 1F, 15A, 15B, 17A or 17B, the specification of the element as seen in FIG. 17B may be referred to that of the element as illustrated in FIG. 1F, 15A, 15B or 17A. The difference between the first and second types of semiconductor chips 100 is that the second type of semiconductor chip 100 may further include multiple through silicon vias (TSVs) 157 as illustrated in FIG. 1F in its semiconductor substrate 2, wherein each of its through silicon vias (TSVs) 157 may couple to one or more of its semiconductor devices 4 through one or more the interconnection metal layers 6 of its first interconnection scheme 560.

3. Third Type of Semiconductor Chip

Figure 17C:
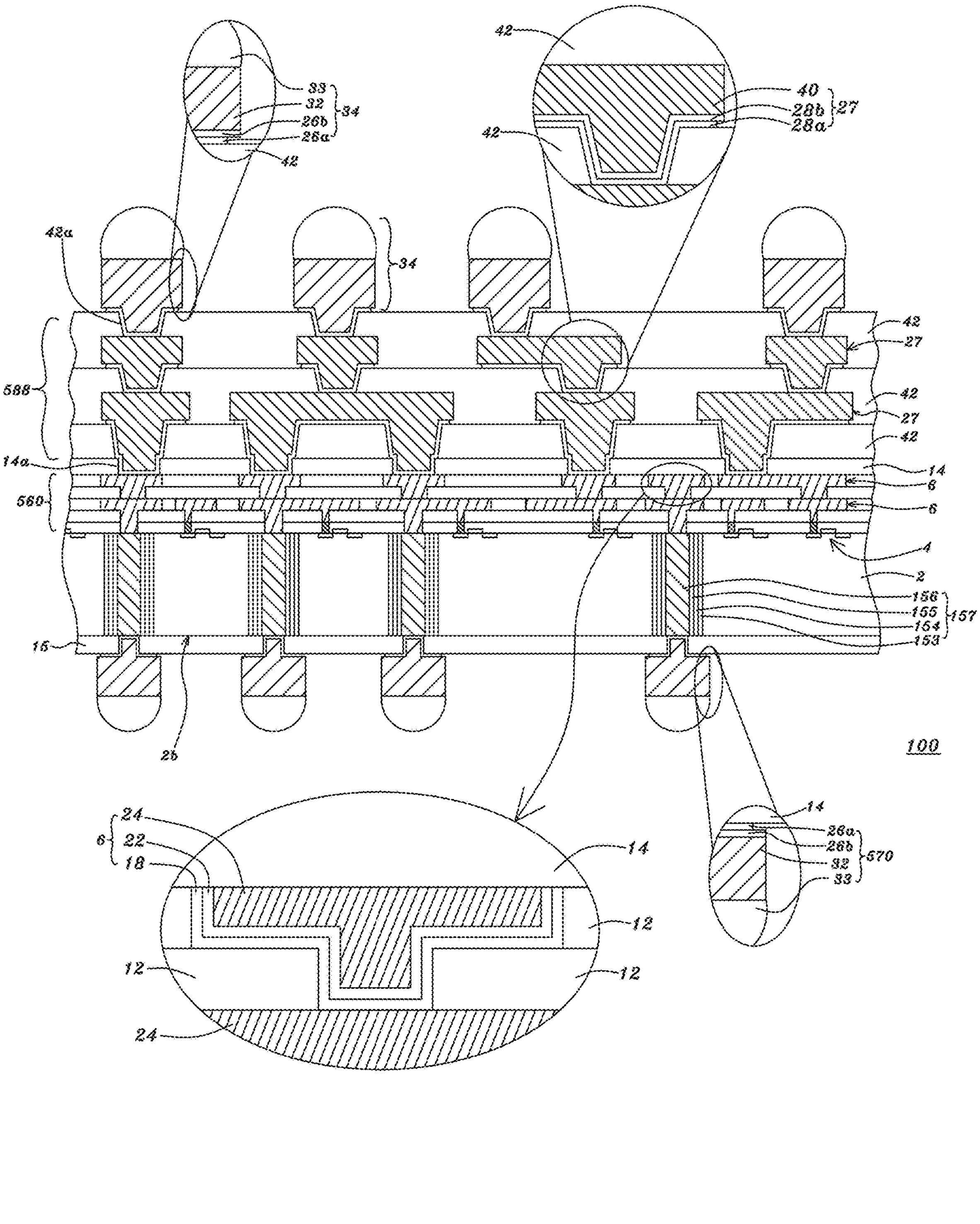

Referring to FIG. 17C, a third type of semiconductor chip 100 may have similar structure as illustrated in FIG. 17B. For an element indicated by the same reference number shown in FIG. 1F, 15A, 15B, 17A, 17B or 17C, the specification of the element as seen in FIG. 17C may be referred to that of the element as illustrated in FIG. 1F, 15A, 15B, 17A or 17B. The difference between the second and third types of semiconductor chips 100 is that each of the through silicon vias (TSVs) 157 of the third type of semiconductor chip 100 may have the copper layer 156 having a backside surface coplanar to a backside 2*b* of the semiconductor substrate 2 of the third type of semiconductor chip 100 and have the insulating lining 153 surrounding the adhesion layer 154, seed layer 155 and copper layer 156 of said each of the through silicon vias (TSVs) 157. The third type of semiconductor chip 100 may further include a passivation layer 15 on the backside 2*b* of its semiconductor substrate 2, wherein each opening 15*a* in its passivation layer 15 may be aligned with the backside of the copper layer 156 of one of its through silicon vias (TSVs) 157. The passivation layer 15 may have the same specifications as those of the passivation layer 14 as illustrated in FIG. 1F. The third type of semiconductor chip 100 may further include multiple micro-bumps or micro-pillars 570 each on the backside of copper layer 156 of one of its through silicon vias (TSVs) 157. The micro-bumps or micro-pillars 570 may be of one of the first through fourth types having the same specifications as the first through fourth types of micro-bumps or micro-pillars 34 as illustrated in FIG. 1F, respectively. It is noted that the fourth type of micro-bumps or micro-pillars 570 may have the same specification as referred to that as illustrated in FIG. 20A.

4. Fourth Type of Semiconductor Chip

Figure 17D:
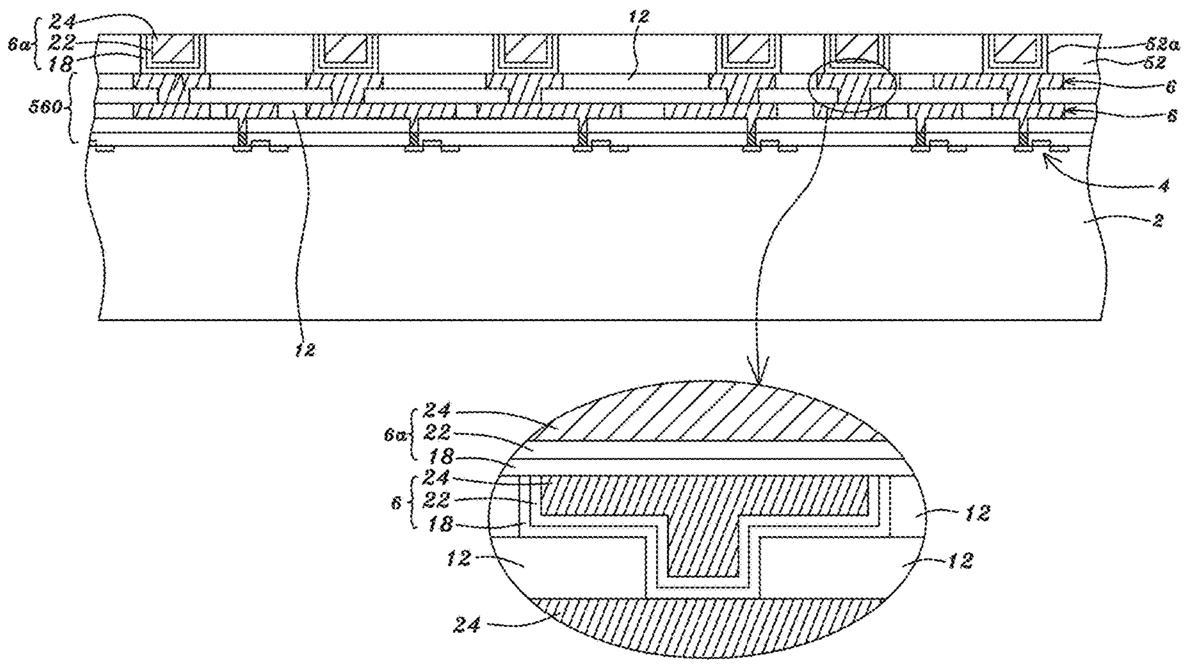

Referring to FIGS. 17D, a fourth type of semiconductor chip 100 may have similar structure as illustrated in FIG. 17A. For an element indicated by the same reference number shown in FIG. 1F, 15A, 17A or 17D, the specification of the element as seen in FIG. 17D may be referred to that of the element as illustrated in FIG. 1F, 15A or 17A. The difference between the first and fourth types of semiconductor chips 100 is that the fourth type of semiconductor chip 100 may be provided with (1) an insulating bonding layer 52 at its active side and on the topmost one of the insulating dielectric layers 12 of its first interconnection scheme 560 and (2) multiple metal pads 6*a* at its active side and in multiple openings 52*a* in its insulating bonding layer 52 and on the topmost one of the interconnection metal layers 6 of its first interconnection scheme 560, instead of the passivation layer 14 and micro-bumps or micro-pillars 34 as seen in FIG. 17A. For the fourth type of semiconductor chip 100, its insulating bonding layer 52 may include a silicon-oxide layer having a thickness between 0.1 and 2 μm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a*, and (3) a seed layer 22, such as copper, between the copper layer 24 and adhesion layer 18 of said each of its metal pads 6*a*, wherein the copper layer 24 of said each of its metal pads 6*a* may have a top surface substantially coplanar with a top surface of the silicon-oxide layer of its insulating bonding layer 52.

5. Fifth Type of Semiconductor Chip

Figure 17E:
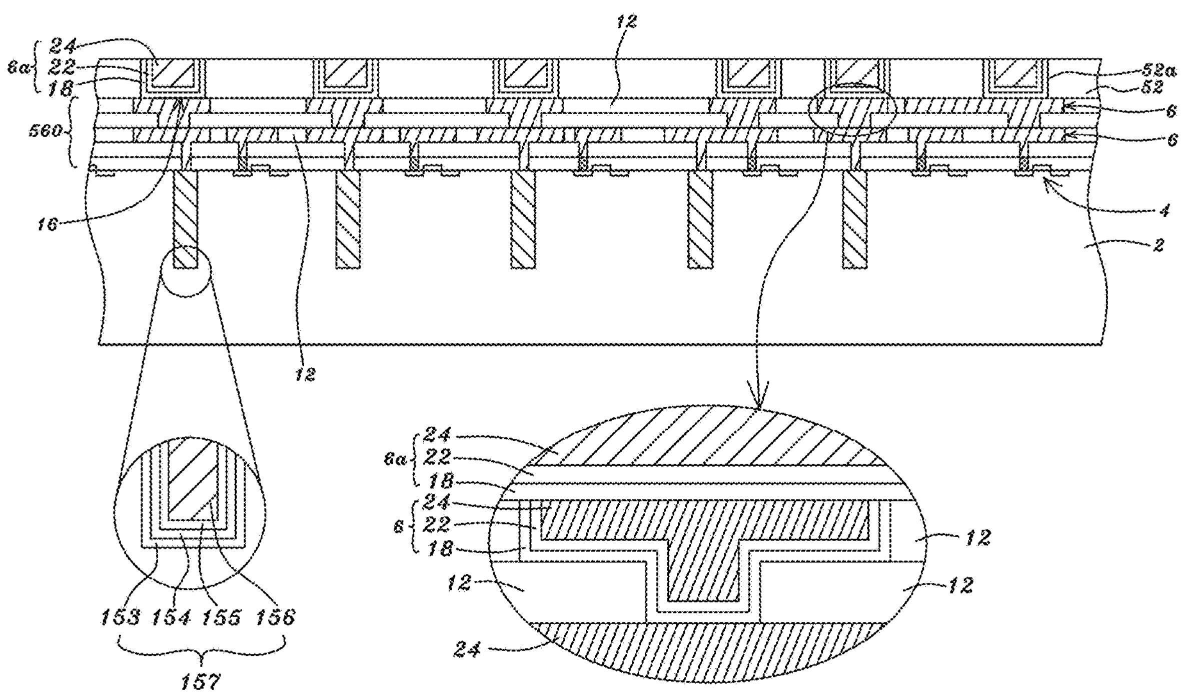

Referring to FIGS. 17E, a fifth type of semiconductor chip 100 may have similar structure as illustrated in FIG. 17D. For an element indicated by the same reference number shown in FIG. 1F, 15A, 15B, 17A, 17B, 17D or 17E, the specification of the element as seen in FIG. 19E may be referred to that of the element as illustrated in FIG. 1F, 15A, 15B, 17A, 17B or 17D. The difference between the fourth and fifth types of semiconductor chips 100 is that the fifth type of semiconductor chip 100 may further include multiple through silicon vias (TSVs) 157 as illustrated in FIG. 1F in its semiconductor substrate 2, wherein each of its through silicon vias (TSVs) 157 may couple to one or more of its semiconductor devices 4 through one or more the interconnection metal layers 6 of its first interconnection scheme 560.

6. Sixth Type of Semiconductor Chip

Figure 17F:
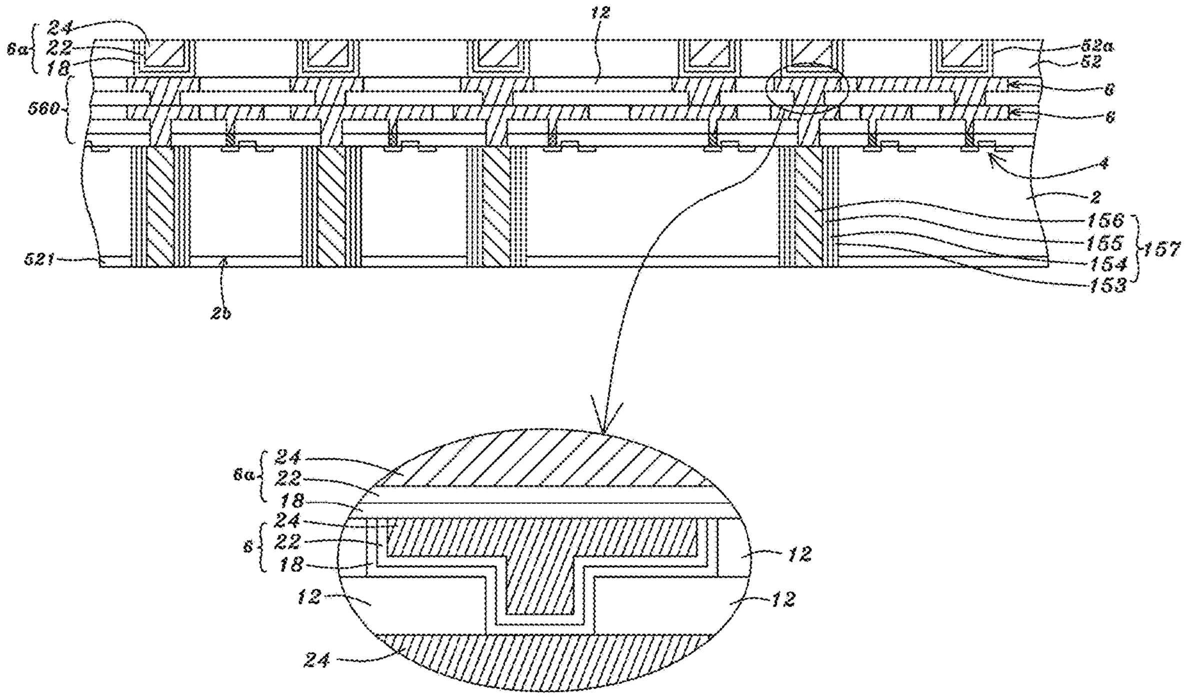

Referring to FIG. 17F, a sixth type of semiconductor chip 100 may have similar structure as illustrated in FIG. 17E. For an element indicated by the same reference number shown in FIG. 1F, 15A, 15B or 17A-17F, the specification of the element as seen in FIG. 17F may be referred to that of the element as illustrated in FIG. 1F, 15A, 15B or 17A-17E. The difference between the fifth and sixth types of semiconductor chips 100 is that the sixth type of semiconductor chip 100 may be provided with an insulating bonding layer 521 on a backside 2*b* of its semiconductor substrate 2, wherein the insulating bonding layer 521 may include a silicon-oxide layer having a thickness between 0.1 and 2 μm. For the sixth type of semiconductor chip 100, each of its through silicon vias (TSVs) 157 may include (1) the copper layer 156 having a backside substantially coplanar with a bottom surface of its insulating bonding layer 521 and (2) the insulating lining 153 surrounding the adhesion layer 154, seed layer 155 and copper layer 156 of said each of its through silicon vias (TSVs) 157.

Structure for Thermoelectric (TE) Cooler

Figure 18A:
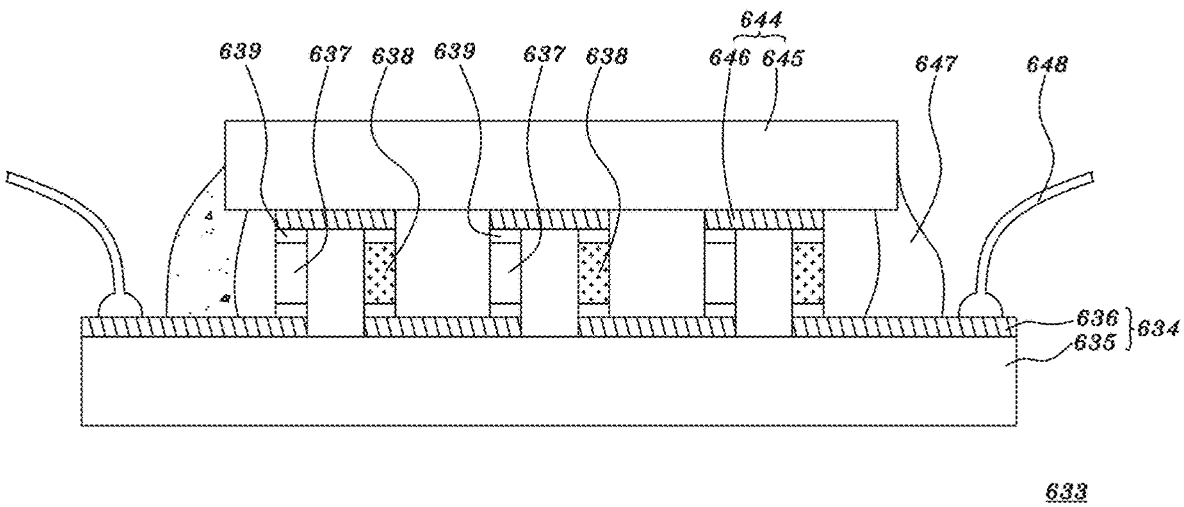
FIG. 18A is a schematically cross-sectional view showing a first type of thermoelectric (TE) cooler in accordance with an embodiment of the present application.

FIG. 18A is a schematically cross-sectional view showing a first type of thermoelectric (TE) cooler in accordance with an embodiment of the present application. Referring to FIG. 18A, a first type of thermoelectric (TE) cooler 633 includes (1) a first circuit substrate 634 having a first insulating panel 63, such as ceramic substrate made of aluminum oxide (Al2O3), aluminum nitride (AlN) or beryllium oxide (BeO) having a thickness between 0.1 and 25 μm, and a patterned circuit layer 636 on a top surface of the first insulating panel 635, wherein the patterned circuit layer 636 may include a patterned copper layer having a thickness between 5 and 50 μm on the top surface of the first insulating panel 635, (2) multiple N-type semiconductor spacers 637, such as bismuth telluride ($Bi_2Te_3$) or bismuth selenide ($Bi_2Se_3$), each having a bottom surface mounted to the patterned circuit layer 636 via an adhesive material 639 such as tin-containing solder, e.g., tin-lead alloy or tin-silver alloy, wherein each of the N-type semiconductor spacers 637 may have a width or largest horizontally transverse dimension between 100 and 1,000 μm and a height between 750 and 3,000 μm, (3) multiple P-type semiconductor spacers 638, such as bismuth telluride ($Bi_2Te_3$) or bismuth selenide ($Bi_2Se_3$), each having a bottom surface mounted to the patterned circuit layer 636 via the adhesive material 639 such as tin-containing solder, e.g., tin-lead alloy or tin-silver alloy, wherein each of the P-type semiconductor spacers 638 may have a width or largest horizontally transverse dimension between 100 and 1,000 μm and a height between 750 and 3,000 μm, wherein the N-type and P-type semiconductor spacers 637 and 638 are alternately arranged over the first insulating panel 635, that is, each of the N-type semiconductor spacers 637 in a center region is between neighboring two of the P-type semiconductor spacers 638 and each of the P-type semiconductor spacers 638 in a center region is between neighboring two of the N-type semiconductor spacers 637, (4) a second circuit substrate 644 having a second insulating panel 645, such as ceramic substrate made of aluminum oxide (Al2O3), aluminum nitride (AlN) or beryllium oxide (BeO) having a thickness between 0.1 and 25 μm, and a patterned circuit layer 646 on a bottom surface of the second insulating panel 645, wherein the patterned circuit layer 646 may include a patterned copper layer having a thickness between 5 and 50 μm on the bottom surface of the second insulating panel 645, wherein the patterned circuit layer 646 is bonded to the N-type and P-type semiconductor spacers 637 and 368 via the adhesive material 639 such as tin-containing solder, e.g., tin-lead alloy or tin-silver alloy, wherein the N-type and P-type semiconductor spacers 637 and 638 in each pair couple to each other through the patterned circuit layer 636, and the N-type and P-type semiconductor spacers 637 and 638 in each neighboring pairs couple to each other through the patterned circuit layer 646, and (5) an encapsulant 647 surrounding a gap between the first and second circuit substrates 634 and 635 to seal the N-type and P-type semiconductor spacers 637 and 638 in the gap.

Referring to FIG. 18A, the patterned circuit layer 636 of the first type of thermoelectric (TE) cooler 633 may have two terminals coupling respectively to one of the N-type semiconductor spacers 637 at its leftmost side and one of the P-type semiconductor spacers 638 at its rightmost side, configured to have two wires 648 bonded thereto respectively by a wirebonding process. For example, when a left one of the wires 648 couples to a voltage Vcc of power supply and a right one of the wires 648 couples to a voltage Vss of ground reference, an electric current may be generated from one of the two terminals of the first type of thermoelectric (TE) cooler 633, e.g., a left one of the two terminals, to the other of the two terminals of the first type of thermoelectric (TE) cooler 633, e.g., a right one of the two terminals, alternately through the N-type and P-type semiconductor spacers 637 and 638 such that electrons in the patterned circuit layer 646 may absorb heat or energy from the second insulating panel 645 to move to each of the N-type semiconductor spacers 637 and electrons in each of the N-type semiconductor spacers 637 may release heat or energy to the first insulating panel 635 to move to the patterned circuit layer 636, and electric charges in the patterned circuit layer 646 may absorb heat or energy from the second insulating panel 645 to move to each of the P-type semiconductor spacers 638 and electric charges in each of the P-type semiconductor spacers 638 may release heat or energy to the first insulating panel 635 to move to the patterned circuit layer 636. Thereby, the first insulating panel 635 is at a hot side of the first type of thermoelectric (TE) cooler 633, and the second insulating panel 645 is at a cold side of the first type of thermoelectric (TE) cooler 633.

Alternatively, when the right one of the wires 648 couples to a voltage Vcc of power supply and the left one of the wires 648 couples to a voltage Vss of ground reference, an electric current may be generated from one of the two terminals of the first type of thermoelectric (TE) cooler 633, e.g., the right one of the two terminals, to the other of the two terminals of the first type of thermoelectric (TE) cooler 633, e.g., the left one of the two terminals, alternately through the P-type and N-type semiconductor spacers 638 and 637 such that electrons in the patterned circuit layer 636 may absorb heat or energy from the first insulating panel 635 to move to each of the N-type semiconductor spacers 637 and electrons in each of the N-type semiconductor spacers 637 may release heat or energy to the second insulating panel 635 to move to the patterned circuit layer 646, and electric charges in the patterned circuit layer 636 may absorb heat or energy from the first insulating panel 635 to move to each of the P-type semiconductor spacers 638 and electric charges in each of the P-type semiconductor spacers 638 may release heat or energy to the second insulating panel 645 to move to the patterned circuit layer 646. Thereby, the first insulating panel 635 is at a cold side of the first type of thermoelectric (TE) cooler 633, and the second insulating panel 645 is at a hot side of the first type of thermoelectric (TE) cooler 633.

Figure 18B:
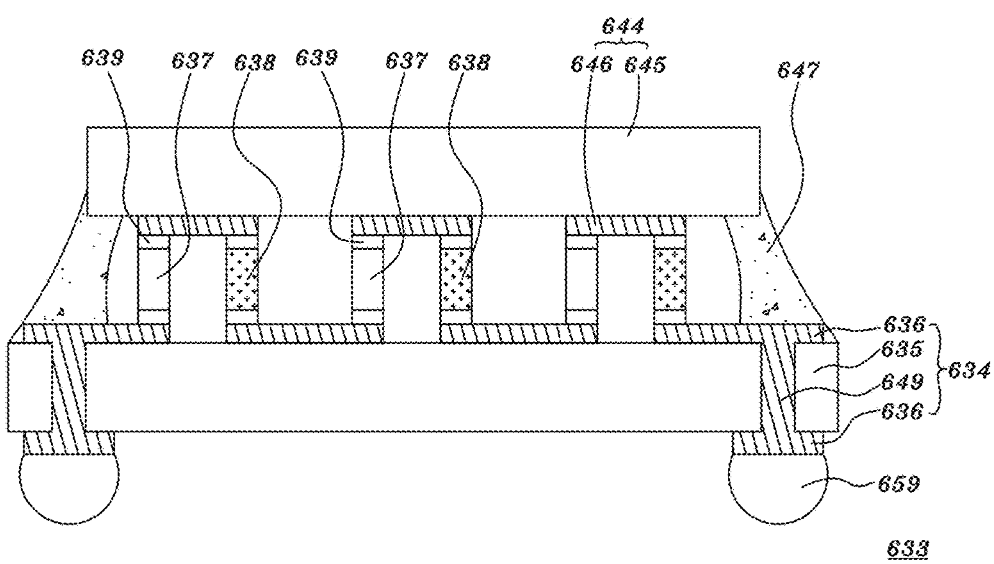
FIG. 18B is a schematically cross-sectional view showing a second type of thermoelectric (TE) cooler in accordance with an embodiment of the present application.

Alternatively, FIG. 18B is a schematically cross-sectional view showing a second type of thermoelectric (TE) cooler in accordance with an embodiment of the present application. The difference between the first and second types of thermoelectric (TE) coolers 633 shown in FIGS. 18A and 18B is that the first circuit substrate 634 of the second type of thermoelectric (TE) cooler 633 shown in FIG. 18B may include two patterned circuit layers 636 on two opposite surfaces of its first insulating panel 635 respectively and two metal vias 649, such as copper vias, vertically through its first insulating panel 635 to couple the two patterned circuit layers 636, wherein each of the patterned circuit layers 636 may include a patterned copper layer having a thickness between 5 and 50 μm on one of top and bottom surfaces of the first insulating panel 635. Referring to FIG. 18B, for the second type of thermoelectric (TE) cooler 633, its patterned circuit layer 636 at its bottom side may have two terminals coupling respectively to one of the N-type semiconductor spacers 637 at its leftmost side through one of the metal vias 649 at its left side and one of the P-type semiconductor spacers 638 at its rightmost side through the other of the metal vias 649 at its right side, configured to have two solder bumps 659 such as tin-lead alloy or tin-silver alloy formed thereon respectively by a solder printing process.

Specification for Memory Module (HBM Tacked 3D Chip-Scale-Package (CSP)

1. First Type of Memory Module

Figure 19A:
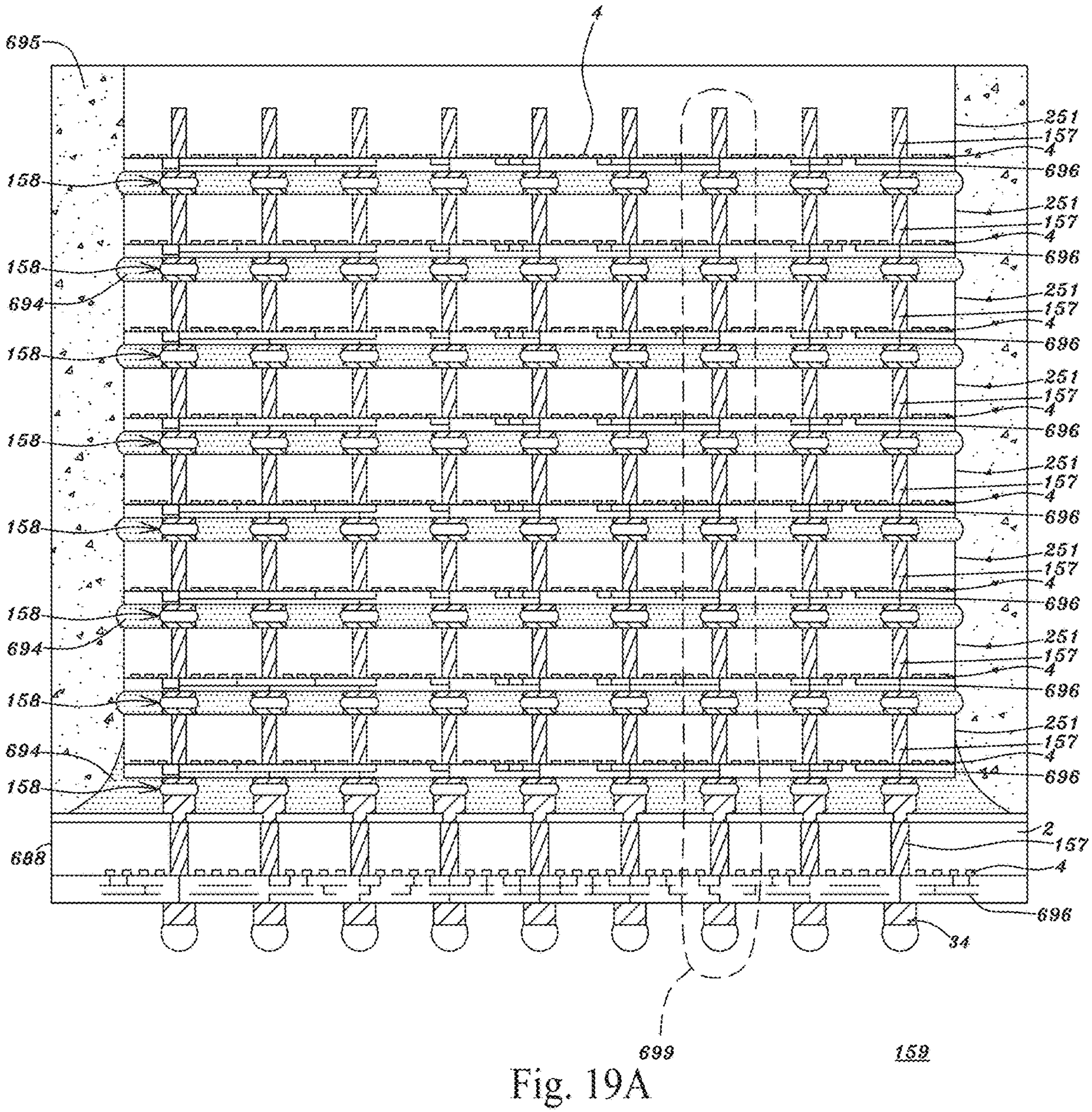
FIG. 19A is a schematically cross-sectional view showing a first type of memory module in accordance with an embodiment of the present application.

FIG. 19A is a schematically cross-sectional view showing a first type of memory module in accordance with an embodiment of the present application. Referring to FIG. 19A, a memory module 159 may include (1) multiple memory chips 251, such as volatile-memory (VM) integrated circuit (IC) chips for a VM module, dynamic-random-access-memory (DRAM) IC chips for a high-bitwidth memory (HBM) module, statistic-random-access-memory (SRAM) IC chips for a SRAM module, magnetoresistive random-access-memory (MRAM) IC chips for a MRAM module, resistive random-access-memory (RRAM) IC chips for a RRAM module, ferroelectric random-access-memory (FRAM) IC chips for a FRAM module or phase change random access memory (PCM) IC chips for a PCM module, vertically stacked together, wherein the number of the memory chips 251 in the memory module 159 may have the number equal to or greater than 2, 4, 8, 16, 32, (2) a control chip 688, i.e., ASIC or logic chip, under the stacked memory chips 251, (3) multiple bonded contacts 158 between neighboring two of the memory chips 251 and between the bottommost one of the memory chips 251 and the control chip 688, and (4) multiple micro-bumps or micro-pillars 34 on a bottom surface of the control chip 688.

Referring to FIG. 19A, each of the memory chips 251 may have the structure as illustrated in FIG. 17C, which may include the through silicon vias (TSVs) 157 in its semiconductor substrate 2, each aligned with and connected to one of the bonded contacts 158 at its backside.

FIGS. 20A and 20B are schematically cross-sectional views showing a process of bonding a thermal compression bump to a thermal compression pad in accordance with an embodiment of the present application. For a first case, referring to FIGS. 19A, 20A and 20B, an upper one of the memory chips 251 may have the third type of micro-bumps or micro-pillars 34 to be bonded to the fourth type of micro-bumps or micro-pillars 570 of a lower one of the memory chips 251. For example, the third type of micro-bumps or micro-pillars 34 of the upper one of the memory chips 251 may have the solder caps 38 to be thermally compressed, at a temperature between 240 and 300 degrees Celsius, at a pressure between 0.3 and 3 MPa and for a time period between 3 and 15 seconds, onto the metal caps 49 of the fourth type of micro-bumps or micro-pillars 570 of the lower one of the memory chips 251 into multiple bonded contacts 158 between the upper and lower ones of the memory chips 251. A force applied to the upper one of the memory chips 251 in the thermal compression process may be substantially equal to the pressure times a contact area between one of the third type of micro-pillars or micro-bumps 34 and one of the fourth type of micro-bumps or micro-pillars 570 times the total number of the third type of micro-pillars or micro-bumps 34 of the upper one of the memory chips 251. Each of the third type of micro-bumps or micro-pillars 34 of the upper one of the memory chips 251 may have the copper layer 37 having the thickness t3 greater than the thickness t2 of the copper layer 48 of each of the fourth type of micro-bumps or micro-pillars 570 of the lower one of the memory chips 251 and having the largest transverse dimension w3 equal to between 0.7 and 0.1 times of the largest transverse dimension w2 of the copper layer 48 of each of the fourth type of micro-bumps or micro-pillars 570 of the lower one of the memory chips 251. Alternatively, each of the third type of micro-pillars or micro-bumps 34 may be provided with the copper layer 37 having a cross-sectional area equal to between 0.5 and 0.01 times of the cross-sectional area of the copper layer 48 of each of the fourth type of micro-bumps or micro-pillars 570 of the lower one of the memory chips 251. For example, for the upper one of the memory chips 251, its third type of micro-bumps or micro-pillars 34 may be formed respectively on a front surface of the metal pads 6*b* provided by the frontmost one of the interconnection metal layers 27 of its second interconnection scheme 588 or by, if the second interconnection scheme 588 is not provided, the frontmost one of the interconnection metal layers 6 of its first interconnection scheme 560, wherein each of the metal pads 6*b* may have a thickness t1 between 1 and 10 micrometers or between 2 and 10 micrometers and a largest transverse dimension w1, such as diameter in a circular shape, between 1 μm and 15 μm, such as 5 μm, and each of its third type of micro-bumps or micro-pillars 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pillars 34 may be provided with the copper layer 37 having a cross-sectional area equal to between 0.5 and 0.01 times of the cross-sectional area of its metal pads 6*b*. A bonded solder between the copper layers 37 and 48 of each of the bonded contacts 158 may be mostly kept on a top surface of the copper layer 48 of one of the fourth type of micro-bumps or micro-pillars 570 of the lower one of the memory chips 251 and extends out of the edge of the copper layer 48 of said one of the fourth type of micro-bumps or micro-pillars 570 of the lower one of the memory chips 251 less than 0.5 micrometers. Thus, a short between neighboring two of the bonded contacts 158 even in a fine-pitched fashion may be avoided.

Alternatively, for a second case, referring to FIG. 19A, an upper one of the memory chips 251 may have the second type of micro-bumps or micro-pillars 34 to be bonded to the first type of micro-bumps or micro-pillars 570 of a lower one of the memory chips 251. For example, the second type of micro-bumps or micro-pillars 34 of the upper one of the memory chips 251 may have the solder caps 33 to be bonded onto the copper layer 32 of the first type of micro-bumps or micro-pillars 570 of the lower one of the memory chips 251 into multiple bonded contacts 158 between the upper and lower ones of the memory chips 251. Each of the second type of micro-bumps or micro-pillars 34 of the upper one of the memory chips 251 may have the copper layer 32 having a thickness greater than that of the copper layer 32 of each of the first type of micro-bumps or micro-pillars 570 of the lower one of the memory chips 251.

Alternatively, for a third case, referring to FIG. 19A, an upper one of the memory chips 251 may have the first type of micro-bumps or micro-pillars 34 to be bonded to the second type of micro-bumps or micro-pillars 570 of a lower one of the memory chips 251. For example, the first type of micro-bumps or micro-pillars 34 of the upper one of the memory chips 251 may have the electroplated metal layer 32, e.g. copper layer, to be bonded onto the solder caps 33 of the second type of micro-bumps or micro-pillars 570 of the lower one of the memory chips 251 into multiple bonded contacts 158 between the upper and lower ones of the memory chips 251. Each of the first type of micro-bumps or micro-pillars 34 of the upper one of the memory chips 251 may have the copper layer 32 having a thickness greater than that of the copper layer 32 of each of the second type of micro-bumps or micro-pillars 570 of the lower one of the memory chips 251.

Alternatively, for a fourth case, referring to FIG. 19A, an upper one of the memory chips 251 may have the second type of micro-bumps or micro-pillars 34 to be bonded to the second type of micro-bumps or micro-pillars 570 of a lower one of the memory chips 251. For example, the second type of micro-bumps or micro-pillars 34 of the upper one of the memory chips 251 may have the solder caps 33 to be bonded onto the solder caps 33 of the second type of micro-bumps or micro-pillars 570 of the lower one of the memory chips 251 into multiple bonded contacts 158 between the upper and lower ones of the memory chips 251. Each of the second type of micro-bumps or micro-pillars 34 of the upper one of the memory chips 251 may have the copper layer 32 having a thickness greater than that of the copper layer 32 of each of the second type of micro-bumps or micro-pillars 570 of the lower one of the memory chips 251.

Referring to FIG. 19A, each of the through silicon vias (TSVs) 157 of the topmost one of the memory chips 251 may have its sidewall and backside enclosed by its semiconductor substrate 2. The bottommost one of the memory chips 251 may provide the micro-bumps or micro-pillars 34 on its bottom surface to be bonded to the micro-bumps or micro-pillars 570 on a top surface of the control chip 688 into multiple bonded contacts 158 between the control chip 688 and the bottommost one of the memory chips 251. The specification of the bonded contacts 158 between the control chip 688 and the bottommost one of the memory chips 251 and the process for forming the same may be referred to the specification of those between the upper and lower ones of the memory chips 251 as above illustrated in FIGS. 19A, 20A and 20B and the above-mentioned process for forming the same.

Referring to FIG. 19A, the through silicon vias (TSVs) 157 in the memory chips 251, which are aligned in a vertical direction, may couple to each other or one another through the bonded contacts 158 therebetween aligned in the vertical direction and with the through silicon vias (TSVs) 157 therein in the vertical direction. Each of the memory chips 251 and control chip 688 may include multiple interconnects 696 each provided by the interconnection metal layers 6 of its first interconnection scheme 560 and/or the interconnection metal layers 27 of its second interconnection scheme 588 to connect one or more of its through silicon vias (TSVs) 157 to one or more of the bonded contacts 158 at its bottom surface. An underfill 694, e.g., a polymer, may be provided between each neighboring two of the memory chips 251 to enclose the bonded contacts 158 therebetween and between the bottommost one of the memory chips 251 and the control chip 688 to enclose the bonded contacts 158 therebetween. A molding compound 695, e.g. a polymer, may be formed around the memory chips 251 and over the control chip 688, wherein the topmost one of the memory chips 251 may have a top surface coplanar with a top surface of the molding compound 695.

Referring to FIG. 19A, for the first type of memory module 159, each of its memory chips 251 may have a data bit-width, equal to or greater than 64, 128, 256, 512, 1024, 2048, 4096, 8K, or 16K, with external circuits of the first type of memory module 159 via its micro-bumps or micro-pillars 34. The first type of memory module 159 may include multiple vertical interconnects 699 each composed of one of the through silicon vias (TSVs) 157 in each of the memory chips 251 of the first type of memory module 159, wherein for each of the vertical interconnects 699 of the first type of memory module 159, its through silicon vias (TSVs) 157 in the memory chips 251 of the first type of memory module 159 are aligned with each other or one another and are connected to one or more transistors of the semiconductor devices 4 of the memory chips 251 of the first type of memory module 159. Each of the memory chips 251 and control chip 688 may be provided with one or more small I/O circuits, having driving capability, loading, output capacitance or input capacitance between 0.05 pF and 2 pF, or 0.05 pF and 1 pF, or smaller than 2 pF or 1 pF, coupling to one of the vertical interconnects 699 of the first type of memory module 159.

Referring to FIG. 19A, the control chip 688 may be configured to control data access to the memory chips 251. The control chip 688 may be used for buffering and controlling the memory chips 251. The control chip 688 may include the through silicon vias (TSVs) 157 in its semiconductor substrate 2, each aligned with and connected to one or more of its micro-bumps or micro-pillars 34 on its bottom surface.

Figure 19B:
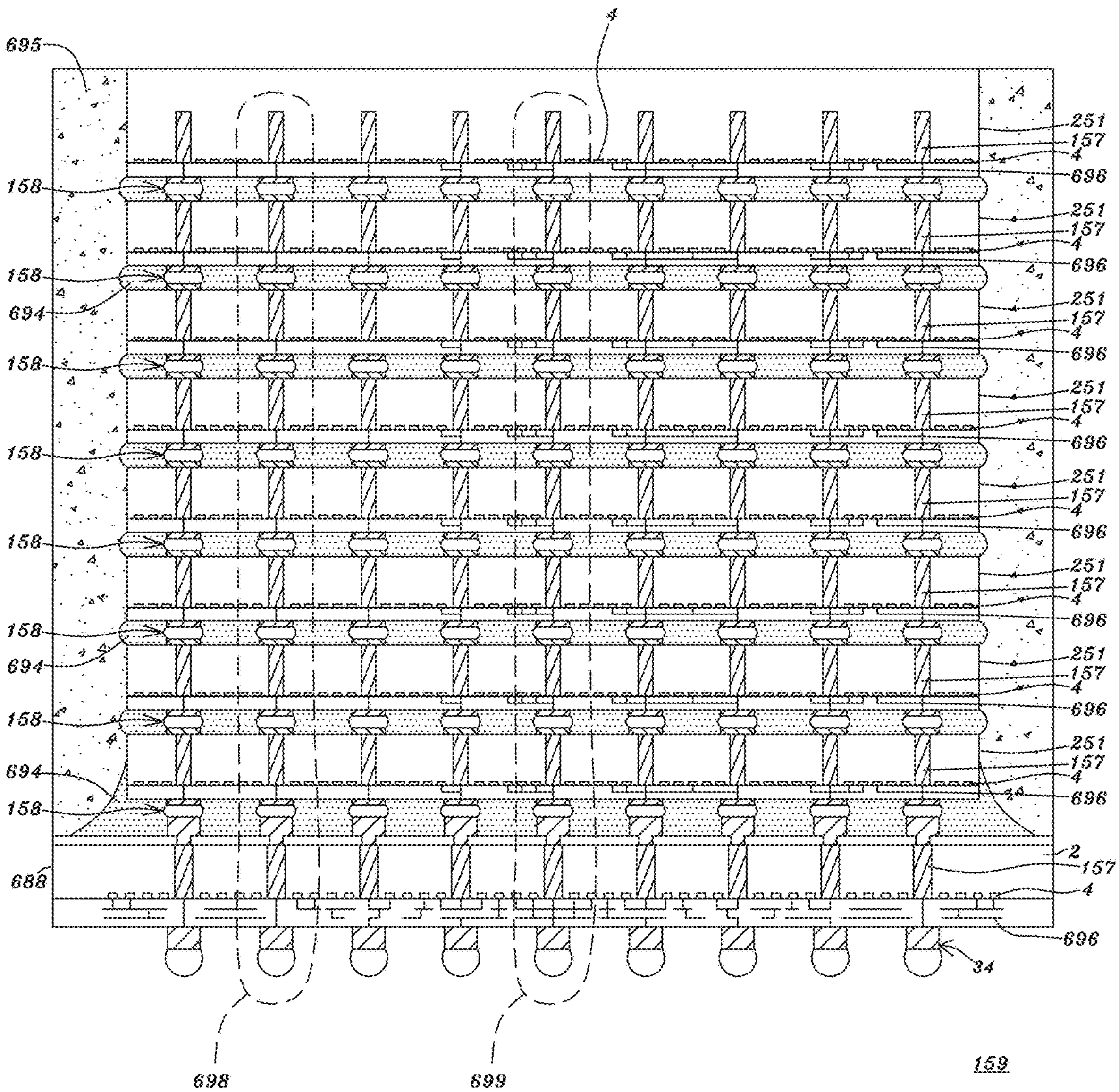
FIGS. 19B and 19D are schematically cross-sectional views showing various second type of memory modules in accordance with an embodiment of the present application.
Figure 19C:
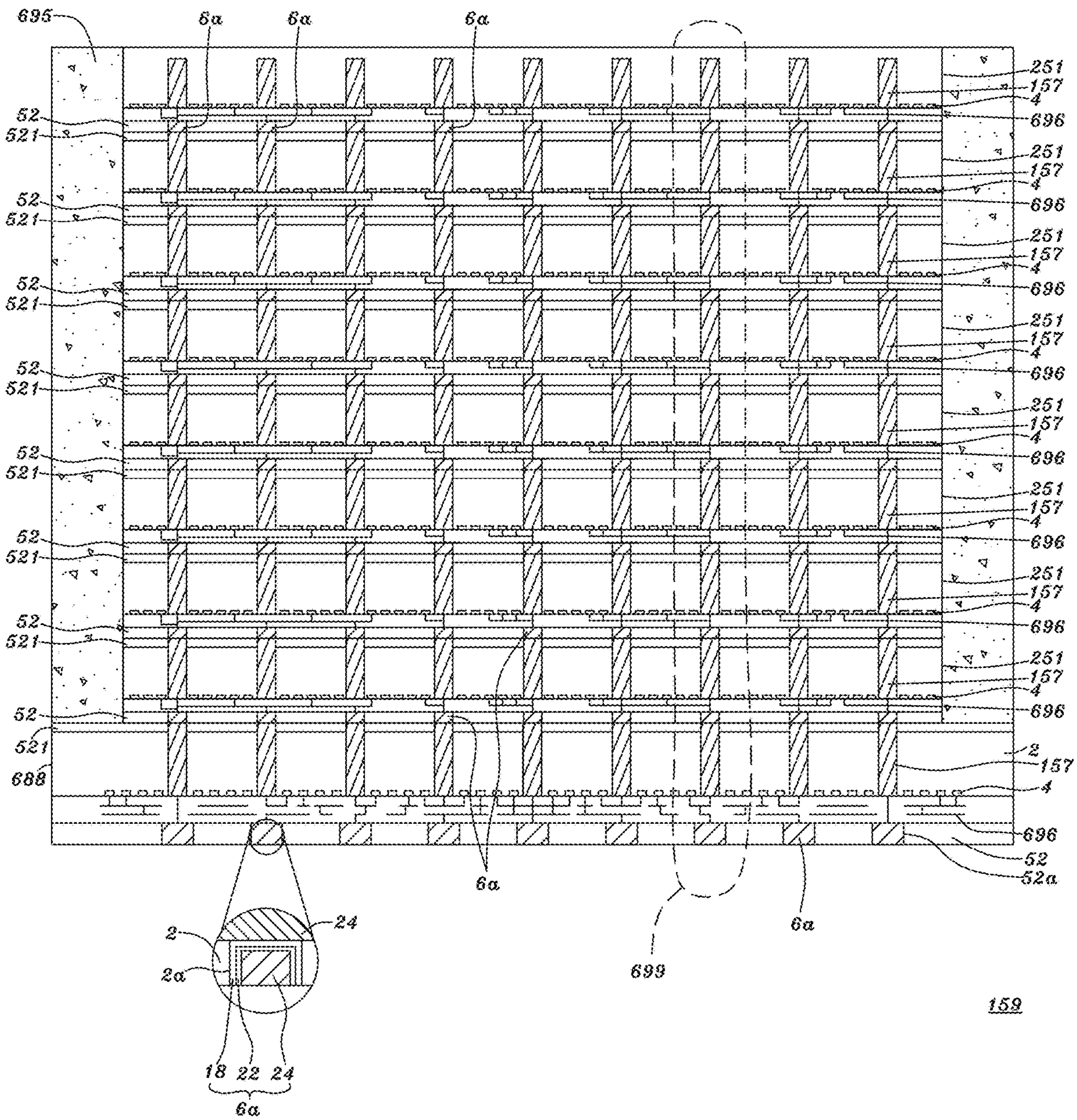
FIG. 19C is a schematically cross-sectional view showing a first type of memory module in accordance with another embodiment of the present application.
Figure 20D:
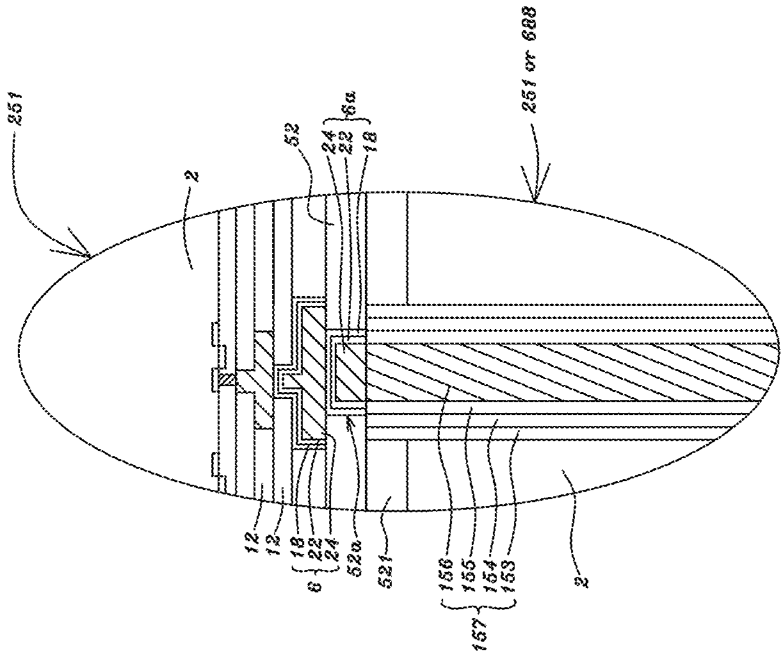
FIGS. 20C and 20D are schematically cross-sectional views showing a direct bonding process in accordance with an embodiment of the present application.
Figure 20C:
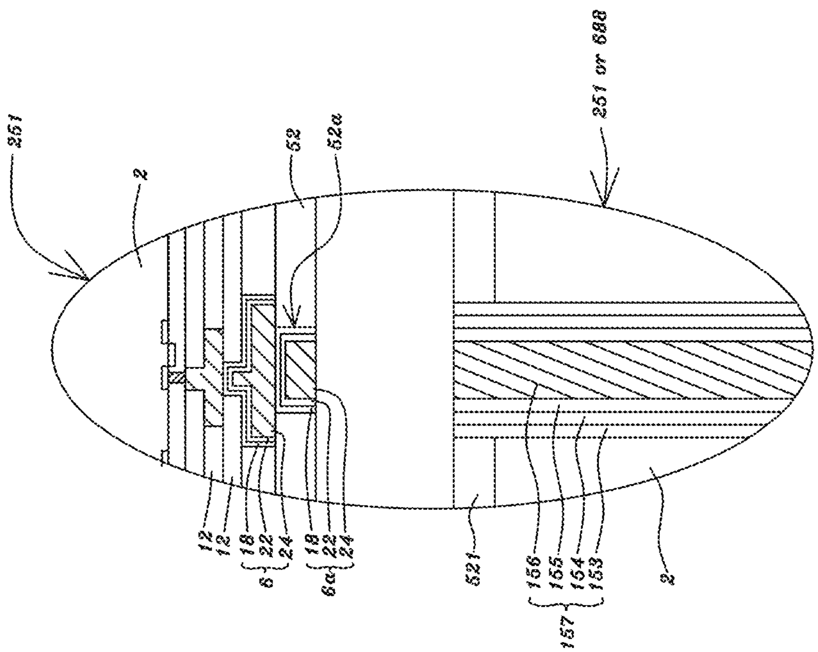

Alternatively, FIG. 19C is a schematically cross-sectional view showing a first type of memory module in accordance with another embodiment of the present application. Referring to FIG. 19C, the first type of memory module 159 may have a structure similar to that as illustrated in FIG. 19A. For an element indicated by the same reference number shown in FIGS. 19A and 19C, the specification of the element as seen in FIG. 19C may be referred to that of the element as illustrated in FIG. 19A. The difference between the first type of memory modules 159 as seen in FIGS. 19A and 19C is that a direct bonding process may be performed for the first type of memory module 159 as seen in FIG. 19C. FIGS. 20C and 20D are schematically cross-sectional views showing a direct bonding process in accordance with an embodiment of the present application. Referring to FIGS. 19C, 20C and 20D, each of the memory chips 251 and control chip 688 may have the structure as illustrated in FIG. 17F, which may include the through silicon vias (TSVs) 157 in its semiconductor substrate 2 each aligned with its metal pads 6*a* at its active side. An upper one of the memory chips 251 may join a lower one of the memory chips 251 and control chip 688 by (1) activating a joining surface, i.e., silicon oxide, of the insulating bonding layer 52 at the active side of the upper one of the memory chips 251 and a joining surface, i.e., silicon oxide, of the insulating bonding layer 521 at the backside of the lower one of the memory chips 251 and control chip 688 with nitrogen plasma for increasing hydrophilic property thereof, (2) next rinsing the joining surface of the insulating bonding layer 52 at the active side of the upper one of the memory chips 251 and the joining surface of the insulating bonding layer 521 at the backside of the lower one of the memory chips 251 and control chip 688 with deionized water for water adsorption and cleaning, (3) next placing the upper one of the memory chips 251 onto the lower one of the memory chips 251 and control chip 688 with each of the metal pads 6*a* at the active side of the upper one of the memory chips 251 in contact with one of the through silicon vias (TSVs) 157 of the lower one of the memory chips 251 and control chip 688 and with the joining surface of the insulating bonding layer 52 at the active side of the upper one of the memory chips 251 in contact with the joining surface of the insulating bonding layer 521 at the backside of the lower one of the memory chips 251 and control chip 688, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the upper one of the memory chips 251 to the joining surface of the insulating bonding layer 521 at the backside of the lower one of the memory chips 251 and control chip 688 and (b) copper-to-copper bonding at a temperature between 300 and 350 degrees Celsius and for a time period between 10 and 60 minutes to bond the copper layer 24 of each of the metal pads 6*a* at the active side of the upper one of the memory chips 251 to the copper layer 156 of one of the through silicon vias (TSVs) 157 of the lower one of the memory chips 251 and control chip 688, wherein the oxide-to-oxide bonding may be caused by water desorption from reaction between the joining surface of the insulating bonding layer 52 at the active side of the upper one of the memory chips 251 and the joining surface of the insulating bonding layer 521 at the backside of the lower one of the memory chips 251, and the copper-to-copper bonding may be caused by metal inter-diffusion between the copper layer 24 of the metal pads 6*a* at the active side of the upper one of the memory chips 251 and the copper layer 156 of the through silicon vias (TSVs) 157 of the lower one of the memory chips 251 and control chip 688.

2. Second Type of Memory Module

Figure 19D:
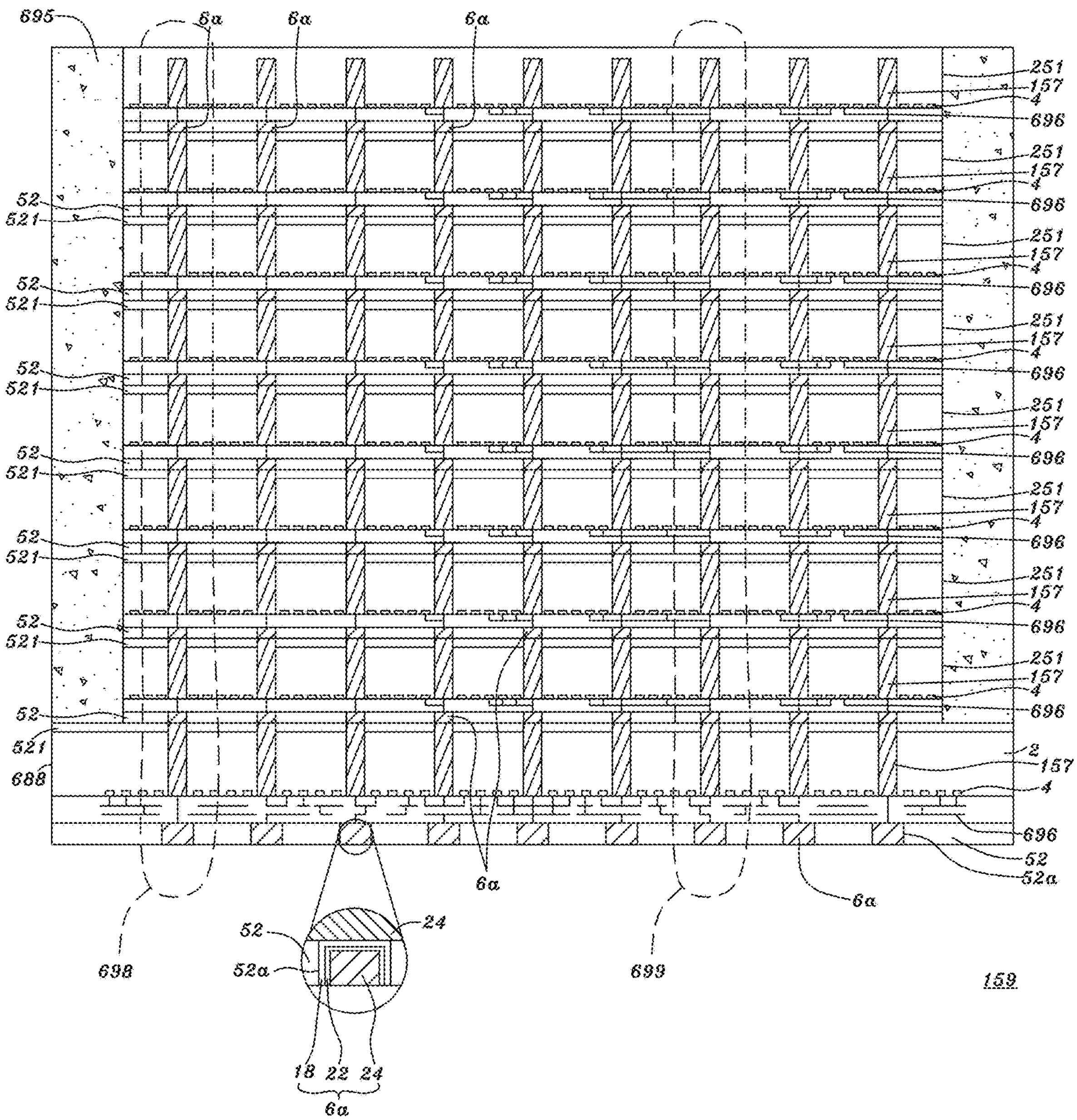

FIGS. 19B and 19D are schematically cross-sectional views showing various second type of memory modules in accordance with an embodiment of the present application. Referring to FIG. 19B, the second type of memory module 159 may have a structure similar to that as illustrated in FIG. 19A. For an element indicated by the same reference number shown in FIGS. 19A and 19B, the specification of the element as seen in FIG. 19B may be referred to that of the element as illustrated in FIG. 19A. Referring to FIG. 19D, the second type of memory module 159 may have a structure similar to that as illustrated in FIG. 19C. For an element indicated by the same reference number shown in FIGS. 19A, 19C and 19D, the specification of the element as seen in FIG. 19D may be referred to that of the element as illustrated in FIG. 19A or 19C. The difference between the first and second types of memory modules 159 is that the second type of memory module 159 may further include multiple dedicated vertical bypasses 698 each composed of one of the through silicon vias (TSVs) 157 in each of the memory chips 251 and control chip 688 of the second type of memory module 159, wherein for each of the dedicated vertical bypasses 698 of the second type of memory module 159, its through silicon vias (TSVs) 157 in the memory chips 251 and control chip 688 of the second type of memory module 159 are aligned with each other or one another and are not connected to any transistor of the memory chips 251 or control chip 688 of the second type of memory module 159.

Process for Fabricating Operation Module (Logic/HBM Stacked 3D Chip-Scale-Package (CSP))

1. First Type of Operation Module (Stacked 3D Chip-Scale-Package (CSP))

Figure 21A:
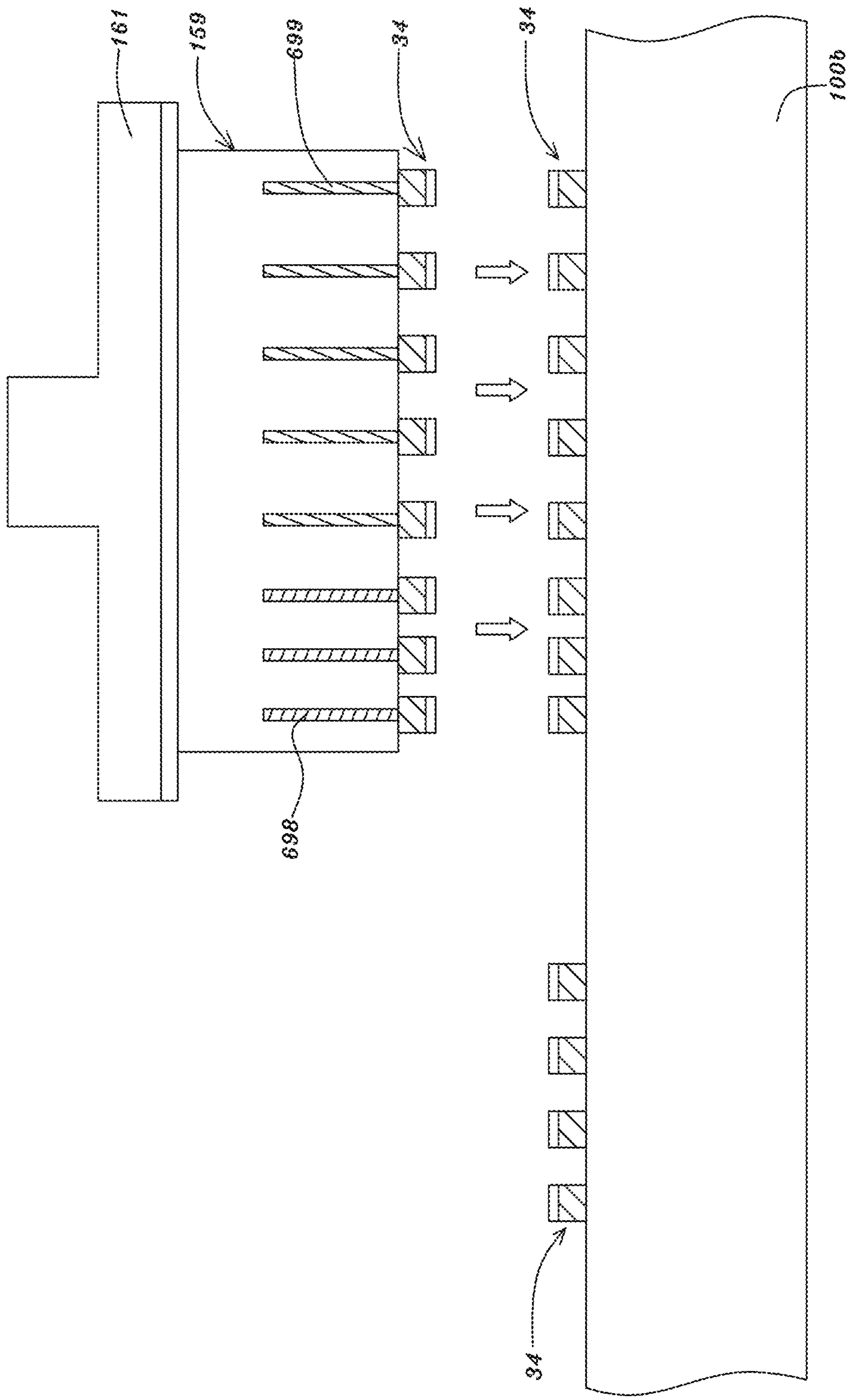
FIGS. 21A-21G and 23A-23G are schematically cross-sectional views showing various processes for fabricating various first type of operation modules for a standard commodity logic drive in accordance with an embodiment of the present application.
Figure 21B:
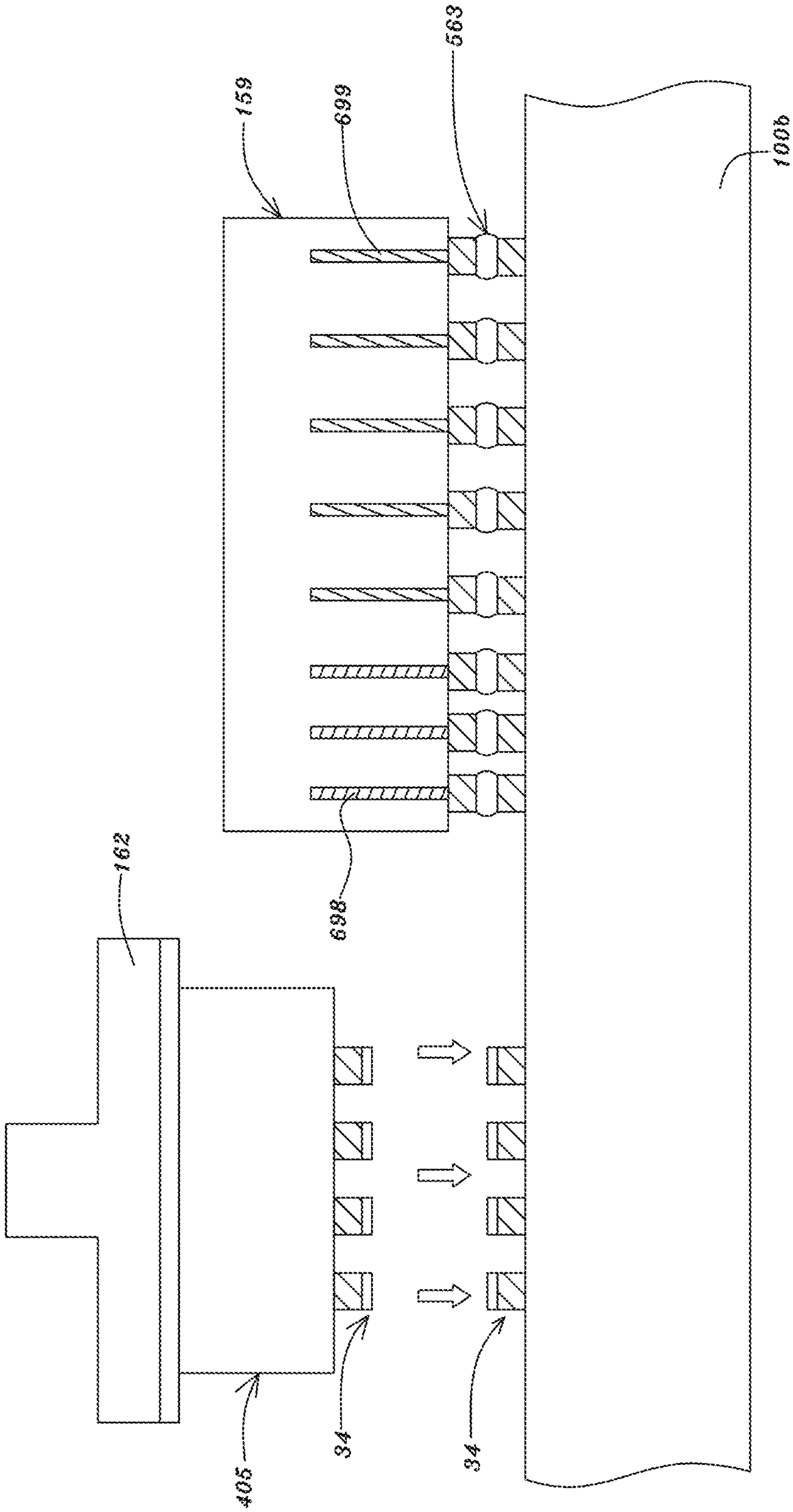

FIGS. 21A-21F are schematically cross-sectional views showing a process for fabricating a first type of operation module for a standard commodity logic drive in accordance with an embodiment of the present application. Referring to FIGS. 21A and 21B, a semiconductor wafer 100*b* may be provided with the first and/or second interconnection scheme(s) 560 and/or 588 and first, second or fourth type of micro-bumps or micro-pillars 34 as illustrated in FIG. 17A. Each of the second type of memory modules 159 (only one is shown) formed as illustrated in FIG. 19B may be held by a bonding head 161 to have its first, second or third type of micro-bumps or micro-pillars 34 to be bonded to the first, second or fourth type of micro-bumps or micro-pillars 34 preformed at an active side of the semiconductor wafer 100*b* into multiple bonded contacts 563 respectively therebetween. Alternatively, each of the second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip having the first and/or second interconnection scheme(s) 560 and/or 588 and the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 therebetween. Alternatively, each of the second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip having the first and/or second interconnection scheme(s) 560 and/or 588 and the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 therebetween. Alternatively, each of the second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B having the first and/or second interconnection scheme(s) 560 and/or 588 and the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 therebetween.

Figure 21C:
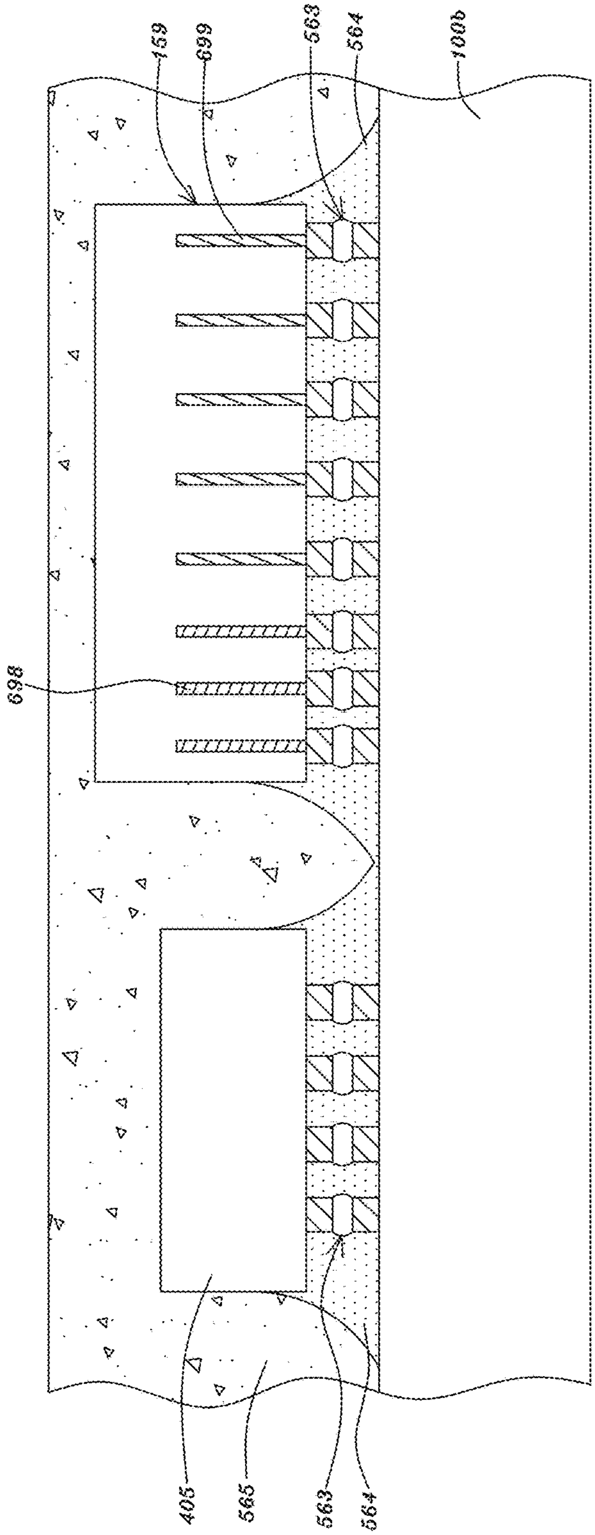

Next, referring to FIGS. 21B and 21C, multiple known-good semiconductor chips 405 (only one is shown), such as application specific integrated-circuit (ASIC) chips each having analog circuits, mixed-mode signal circuits, radio-frequency (RF) circuits, transmitter, receiver or transceiver therein, each may be provided with the first and/or second interconnection scheme(s) 560 and/or 588 and first, second or third type of micro-bumps or micro-pillars 34 as illustrated in FIG. 17A. Each of the known-good semiconductor chips 405 may be held by a bonding head 162 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 respectively therebetween.

FIGS. 22A and 22B are schematically cross-sectional views showing a process of bonding a thermal compression bump to a thermal compression pad in accordance with an embodiment of the present application. For a first case, referring to FIGS. 21A-21C, 22A and 22B, each of the second type of memory modules 159, or known-good memory or logic chips or known-good ASIC chips, and known-good semiconductor chips 405 may have the third type of micro-bumps or micro-pillars 34 to be bonded to the fourth type of micro-bumps or micro-pillars 34 of the semiconductor wafer 100*b*. For example, the third type of micro-bumps or micro-pillars 34 of said each of the second type of memory modules 159, or known-good memory or logic chips or known-good ASIC chips, and known-good semiconductor chips 405 may have the solder caps 38 to be thermally compressed, at a temperature between 240 and 300 degrees Celsius, at a pressure between 0.3 and 3 Mpa and for a time period between 3 and 15 seconds, onto the metal caps 49 of the fourth type of micro-bumps or micro-pillars 34 of the semiconductor wafer 100*b* into multiple bonded contacts 563 between said each of the second type of memory modules 159, or known-good memory or logic chips or known-good ASIC chips, and known-good semiconductor chips 405 and the semiconductor wafer 100*b*. A force applied to said each of the second type of memory modules 159, or known-good memory or logic chips or known-good ASIC chips, and known-good semiconductor chips 405 in the thermal compression process may be substantially equal to the pressure times a contact area between one of the third type of micro-pillars or micro-bumps 34 of said each of the second type of memory modules 159, or known-good memory or logic chips or known-good ASIC chips, and known-good semiconductor chips 405 and one of the fourth type of micro-bumps or micro-pillars 34 of the semiconductor wafer 100*b* times the total number of the third type of micro-pillars or micro-bumps 34 of said each of the second type of memory modules 159, or known-good memory or logic chips or known-good ASIC chips, and known-good semiconductor chips 405. Each of the third type of micro-bumps or micro-pillars 34 of said each of the second type of memory modules 159, or known-good memory or logic chips or known-good ASIC chips, and known-good semiconductor chips 405 may have the copper layer 37 having the thickness t3 greater than the thickness t2 of the copper layer 48 of each of the fourth type of micro-bumps or micro-pillars 34 of the semiconductor wafer 100*b* and having the largest transverse dimension w3 equal to between 0.7 and 0.1 times of the largest transverse dimension w2 of the copper layer 48 of each of the fourth type of micro-bumps or micro-pillars 34 of the semiconductor wafer 100*b*. Alternatively, each of the third type of micro-pillars or micro-bumps 34 of said each of the second type of memory modules 159, or known-good memory or logic chips or known-good ASIC chips, and known-good semiconductor chips 405 may be provided with the copper layer 37 having a cross-sectional area equal to between 0.5 and 0.01 times of the cross-sectional area of the copper layer 48 of each of the fourth type of micro-bumps or micro-pillars 34 of the semiconductor wafer 100*b*. For example, for said each of the second type of memory modules 159, its third type of micro-bumps or micro-pillars 34 may be formed respectively on a front surface of the metal pads 6*b* provided by the frontmost one of the interconnection metal layers 27 of the second interconnection scheme 588 of its control chip 688 or by, if the second interconnection scheme 588 is not provided for its control chip 688, the frontmost one of the interconnection metal layers 6 of the first interconnection scheme 560 of its control chip 688, wherein each of its third type of micro-bumps or micro-pillars 34 may be provided with the copper layer 37 having the thickness t3 greater than the thickness t1 of each of the metal pads 6*b* of its control chip 688 and having the largest transverse dimension w3 equal to between 0.7 and 0.1 times of the largest transverse dimension w1 of each of the metal pads 6*b* of its control chip 688; alternatively, each of its third type of micro-bumps or micro-pillars 34 may be provided with the copper layer 37 having a cross-sectional area equal to between 0.5 and 0.01 times of the cross-sectional area of each of the metal pads 6*b* of its control chip 688; each of the metal pads 6*b* of its control chip 688 may have a thickness t1 between 1 and 10 micrometers or between 2 and 10 micrometers and a largest transverse dimension w1, such as diameter in a circular shape, between 1 μm and 15 μm, such as 5 μm. For said each of the known-good memory or logic chips or known-good ASIC chips, in case of replacing the second type of memory modules 159, and known-good semiconductor chips 405, its third type of micro-bumps or micro-pillars 34 may be formed respectively on a front surface of the metal pads 6*b* provided by the frontmost one of the interconnection metal layers 27 of its second interconnection scheme 588 or by, if the second interconnection scheme 588 is not provided, the frontmost one of the interconnection metal layers 6 of its first interconnection scheme 560, wherein each of its third type of micro-bumps or micro-pillars 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pillars 34 may be provided with the copper layer 37 having a cross-sectional area equal to between 0.5 and 0.01 times of the cross-sectional area of its metal pads 6*b*; each of its metal pads 6*b* may have a thickness t1 between 1 and 10 micrometers or between 2 and 10 micrometers and a largest transverse dimension w1, such as diameter in a circular shape, between 1 μm and 15 μm, such as 5 μm. A bonded solder between the copper layers 37 and 48 of each of the bonded contacts 563 may be mostly kept on a top surface of the copper layer 48 of one of the fourth type of micro-bumps or micro-pillars 34 of the semiconductor wafer 100*b* and extends out of the edge of the copper layer 48 of said one of the fourth type of micro-bumps or micro-pillars 34 of the semiconductor wafer 100*b* less than 0.5 micrometers. Thus, a short between neighboring two of the bonded contacts 563 even in a fine-pitched fashion may be avoided.

Alternatively, for a second case, referring to FIGS. 21A-21C, each of the second type of memory modules 159, or known-good memory or logic chips or known-good ASIC chips, and known-good semiconductor chips 405 may have the second type of micro-bumps or micro-pillars 34 to be bonded to the first type of micro-bumps or micro-pillars 34 of the semiconductor wafer 100*b*. For example, the second type of micro-bumps or micro-pillars 34 of said each of the second type of memory modules 159, or known-good memory or logic chips or known-good ASIC chips, and known-good semiconductor chips 405 may have the solder caps 33 to be bonded onto the copper layer 32 of the first type of micro-bumps or micro-pillars 34 of the semiconductor wafer 100*b* into multiple bonded contacts 563 between said each of the second type of memory modules 159, or known-good memory or logic chips or known-good ASIC chips, and known-good semiconductor chips 405 and the semiconductor wafer 100*b*. Each of the second type of micro-bumps or micro-pillars 34 of said each of the second type of memory modules 159, or known-good memory or logic chips or known-good ASIC chips, and known-good semiconductor chips 405 may have the copper layer 32 having a thickness greater than that of the copper layer 32 of each of the first type of micro-bumps or micro-pillars 34 of the semiconductor wafer 100*b*.

Alternatively, for a third case, referring to FIGS. 21A-21C, each of the second type of memory modules 159, or known-good memory or logic chips or known-good ASIC chips, and semiconductor chips 405 may have the first type of micro-bumps or micro-pillars 34 to be bonded to the second type of metal bumps or pillars 34 of the semiconductor wafer 100*b*. For example, the first type of micro-bumps or micro-pillars 34 of said each of the second type of memory modules 159, or known-good memory or logic chips or known-good ASIC chips, and known-good semiconductor chips 405 may have the electroplated metal layer 32, e.g. copper layer, to be bonded onto the solder caps 33 of the second type of micro-bumps or micro-pillars 34 of the semiconductor wafer 100*b* into multiple bonded contacts 563 between said each of the second type of memory modules 159, or known-good memory or logic chips or known-good ASIC chips, and known-good semiconductor chips 405 and the semiconductor wafer 100*b*. Each of the first type of micro-bumps or micro-pillars 34 of said each of the second type of memory modules 159, or known-good memory or logic chips or known-good ASIC chips, and known-good semiconductor chips 405 may have the copper layer 32 having a thickness greater than that of the copper layer 32 of each of the second type of micro-bumps or micro-pillars 34 of the semiconductor wafer 100*b*.

Alternatively, for a fourth case, referring to FIGS. 21A-21C, each of the second type of memory modules 159, or known-good memory or logic chips or known-good ASIC chips, and known-good semiconductor chips 405 may have the second type of micro-bumps or micro-pillars 34 to be bonded to the second type of micro-bumps or micro-pillars 34 of the semiconductor wafer 100*b*. For example, the second type of micro-bumps or micro-pillars 34 of said each of the second type of memory modules 159, or known-good memory or logic chips or known-good ASIC chips, and known-good semiconductor chips 405 may have the solder caps 33 to be bonded onto the solder caps 33 of the second type of micro-bumps or micro-pillars 34 of the semiconductor wafer 100*b* into multiple bonded contacts 563 between said each of the second type of memory modules 159, or known-good memory or logic chips or known-good ASIC chips, and known-good semiconductor chips 405 and the semiconductor wafer 100*b*. Each of the second type of micro-bumps or micro-pillars 34 of said each of the second type of memory modules 159, or known-good memory or logic chips or known-good ASIC chips, and known-good semiconductor chips 405 may have the copper layer 32 having a thickness greater than that of the copper layer 32 of each of the second type of micro-bumps or micro-pillars 34 of the semiconductor wafer 100*b*.

Next, referring to FIG. 21C, an underfill 564, such as epoxy resins or compounds, may be filled into a gap between each of the second type of memory modules 159, or known-good memory or logic chips or known-good ASIC chips, and the semiconductor wafer 100*b* to enclose the bonded contacts 563 therebetween and into a gap between each of the known-good semiconductor chips 405 and the semiconductor wafer 100*b* to enclose the bonded contacts 563 therebetween. The underfill 564 may be cured at temperature equal to or above 100, 120 or 150 degrees Celsius.

Figure 23A:
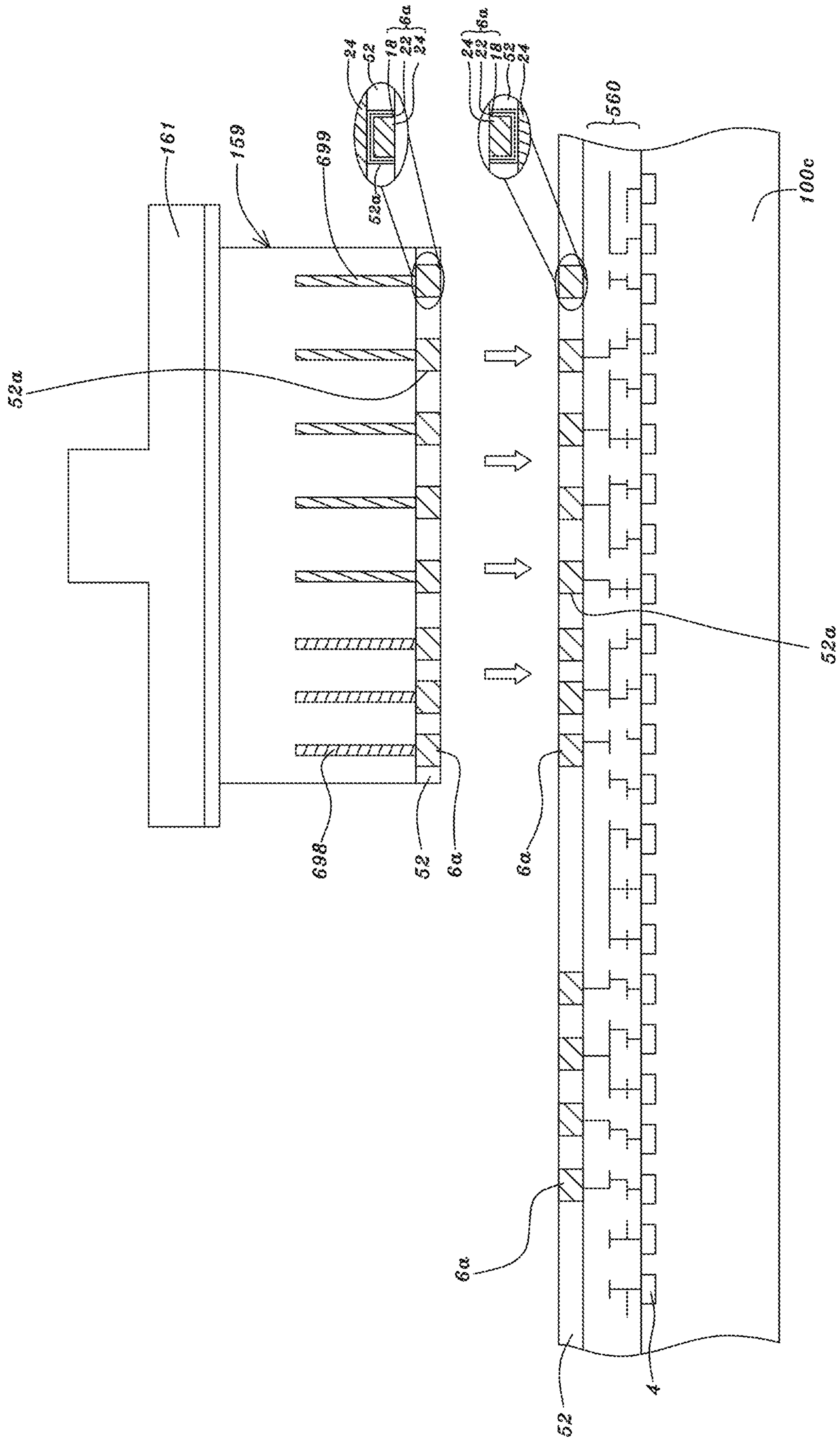
Figure 23B:
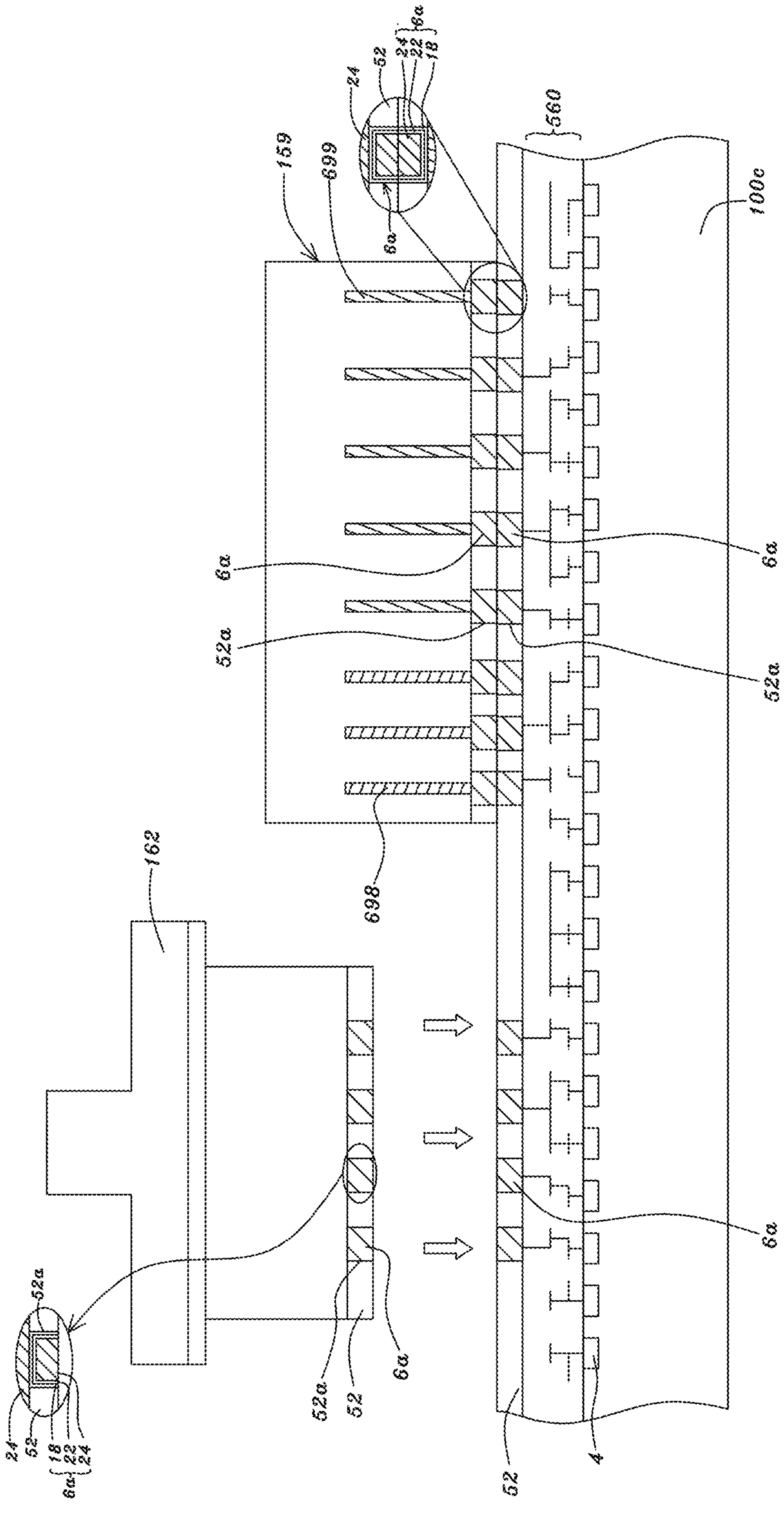
Figure 23C:
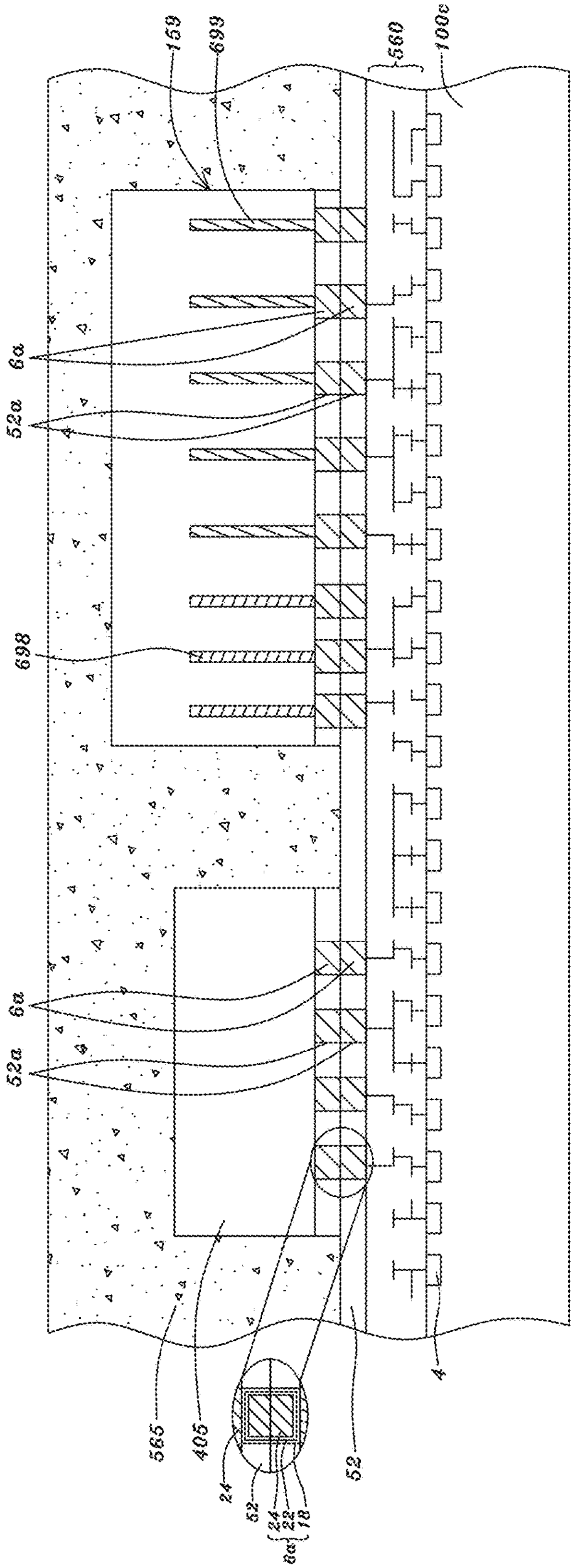

Alternatively, FIGS. 23A-23F are schematically cross-sectional views showing another process for fabricating another first type of operation module in accordance with an embodiment of the present application. Referring to FIGS. 23A-23C, a semiconductor wafer 100*c* may be provided at an active side thereof with the insulating bonding layer 52 and metal pads 6*a* as illustrated in FIG. 17D. Each of known-good semiconductor chips 405 (only one is shown), such as application specific integrated-circuit (ASIC) chips may have analog circuits, mixed-mode signal circuits, radio-frequency (RF) circuits, transmitter, receiver or transceiver therein and have the structure as illustrated in FIG. 17D provided at the active side thereof with the insulating bonding layer 52 to be bonded to the insulating bonding layer 52 of the semiconductor wafer 100*c* and the metal pads 6*a* to be bonded to the metal pads 6*a* of the semiconductor wafer 100*c*. Each of second type of memory modules 159 may have the structure as illustrated in FIG. 19D provided with the insulating bonding layer 52 to be bonded to the insulating bonding layer 52 of the semiconductor wafer 100*c* and the metal pads 6*a* to be bonded to the metal pads 6*a* of the semiconductor wafer 100*c*. Alternatively, each of the second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip having the structure as illustrated in FIG. 17E provided at an active side thereof with the insulating bonding layer 52 to be bonded to the insulating bonding layer 52 of the semiconductor wafer 100*c* and the metal pads 6*a* to be bonded to the metal pads 6*a* of the semiconductor wafer 100*c*. Alternatively, each of the second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip having the structure as illustrated in FIG. 17E provided at an active side thereof with the insulating bonding layer 52 to be bonded to the insulating bonding layer 52 of the semiconductor wafer 100*c* and the metal pads 6*a* to be bonded to the metal pads 6*a* of the semiconductor wafer 100*c*. Alternatively, each of the second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B having the structure as illustrated in FIG. 17E provided at an active side thereof with the insulating bonding layer 52 to be bonded to the insulating bonding layer 52 of the semiconductor wafer 100*c* and the metal pads 6*a* to be bonded to the metal pads 6*a* of the semiconductor wafer 100*c*.

Referring to FIGS. 23A-23C, before the second type of memory modules 159, or known-good memory or logic chips or known-good ASIC chips, and the known-good semiconductor chips 405 join the semiconductor wafer 100*c*, a joining surface, i.e., silicon oxide, of the insulating bonding layer 52 at the active side of the semiconductor wafer 100*c* may be activated with nitrogen plasma for increasing a hydrophilic property thereof, and then the joining surface of the insulating bonding layer 52 at the active side of the semiconductor wafer 100*c* may be rinsed with deionized water for water adsorption and cleaning. Further, a joining surface, i.e., silicon oxide, of the insulating bonding layer 52 at the active side of the control chip 688 of each of the second type of memory modules 159, the exposed backside of the topmost one of the memory chips 251 of which may be attached to a temporary substrate (not shown) in advance, or at the active side of each of the known-good memory or logic chips or known-good ASIC chips, the backside of which may be attached to a temporary substrate (not shown) in advance, and a joining surface, i.e., silicon oxide, of the insulating bonding layer 52 at the active side of each of the known-good semiconductor chips 405, the backside of which may be attached to a temporary substrate in advance, may be activated with nitrogen plasma for increasing a hydrophilic property thereof, and then the joining surface of the insulating bonding layer 52 at the active side of the control chip 688 of each of the second type of memory modules 159, or at the active side of each of the known-good memory or logic chips or known-good ASIC chips, and the joining surface of the insulating bonding layer 52 at the active side of each of the known-good semiconductor chips 405 may be rinsed with deionized water for water adsorption and cleaning. Next, each of the second type of memory modules 159, or known-good memory or logic chips or known-good ASIC chips, and the known-good semiconductor chips 405 may be released from the temporary substrate(s).

Next, referring to FIGS. 23A-23C, the second type of memory modules 159, or known-good memory or logic chips or known-good ASIC chips, and the known-good semiconductor chips 405 may join the semiconductor wafer 100*c* by (1) picking up, by a bonding head 161, each of the second type of memory modules 159, or known-good memory or logic chips or known-good ASIC chips, to be placed on the semiconductor wafer 100*c* with each of the metal pads 6*a* at the active side of the control chip 688 of each of the second type of memory modules 159, or at the active side of each of the known-good memory or logic chips or known-good ASIC chips, in contact with one of the metal pads 6*a* at the active side of the semiconductor wafer 100*c* and with the joining surface of the insulating bonding layer 52 at the active side of the control chip 688 of each of the second type of memory modules 159, or at the active side of each of the known-good memory or logic chips or known-good ASIC chips, in contact with the joining surface of the insulating bonding layer 52 at the active side of the semiconductor wafer 100*c*, (2) picking up, by a bonding head 162, each of the known-good semiconductor chips 405 to be placed on the semiconductor wafer 100*c* with each of the metal pads 6*a* at the active side of each of the known-good semiconductor chips 405 in contact with one of the metal pads 6*a* at the active side of the semiconductor wafer 100*c* and with the joining surface of the insulating bonding layer 52 at the active side of each of the known-good semiconductor chips 405 in contact with the joining surface of the insulating bonding layer 52 at the active side of the semiconductor wafer 100*c*, and (3) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the control chip 688 of each of the second type of memory modules 159, or at the active side of each of the known-good memory or logic chips or known-good ASIC chips, and the joining surface of the insulating bonding layer 52 at the active side of each of the known-good semiconductor chips 405 to the joining surface of the insulating bonding layer 52 at the active side of the semiconductor wafer 100*c* and (b) copper-to-copper bonding at a temperature between 300 and 350 degrees Celsius and for a time period between 10 and 60 minutes to bond the copper layer 24 of each of the metal pads 6*a* at the active side of the control chip 688 of each of the second type of memory modules 159, or at the active side of each of the known-good memory or logic chips or known-good ASIC chips, to the copper layer 24 of one of the metal pads 6*a* at the active side of the semiconductor wafer 100*c* and to bond the copper layer 24 of each of the metal pads 6*a* at the active side of each of the known-good semiconductor chips 405 to the copper layer 24 of one of the metal pads 6*a* at the active side of the semiconductor wafer 100*c*, wherein the oxide-to-oxide bonding may be caused by water desorption from reaction between the joining surface of the insulating bonding layer 52 at the active side of the control chip 688 of each of the second type of memory modules 159, or at the active side of each of the known-good memory or logic chips or known-good ASIC chips, and the joining surface of the insulating bonding layer 52 at the active side of the semiconductor wafer 100*c* and between the joining surface of the insulating bonding layer 52 at the active side of each of the known-good semiconductor chips 405 and the joining surface of the insulating bonding layer 52 at the active side of the semiconductor wafer 100*c*, and the copper-to-copper bonding may be caused by metal inter-diffusion between the copper layer 24 of the metal pads 6*a* at the active side of the control chip 688 of each of the second type of memory modules 159, or at the active side of each of the known-good memory or logic chips or known-good ASIC chips, and the copper layer 24 of the metal pads 6*a* at the active side of the semiconductor wafer 100*c* and between the copper layer 24 of the metal pads 6*a* at the active side of each of the known-good semiconductor chips 405 and the copper layer 24 of the metal pads 6*a* at the active side of the semiconductor wafer 100*c*.

Next, referring to FIGS. 21C and 23C, a polymer layer 565, e.g., resin or compound, may be applied to fill a gap between each neighboring two of the second type of memory modules 159, or known-good memory or logic chips or known-good ASIC chips, and known-good semiconductor chips 405 and to cover a backside of each of the second type of memory modules 159, or known-good memory or logic chips or known-good ASIC chips, and a backside of each of the known-good semiconductor chips 405 by methods, for example, spin-on coating, screen-printing, dispensing or molding. The polymer layer 565 may be, for example, polyimide, BenzoCycloButene (BCB), parylene, epoxy-based material or compound, photo epoxy SU-8, elastomer, or silicone. The polymer layer 565 may be cured or cross-linked at a temperature higher than or equal to 50, 70, 90, 100, 125, 150, 175, 200, 225, 250, 275 or 300 degrees Celsius.

Figure 21D:
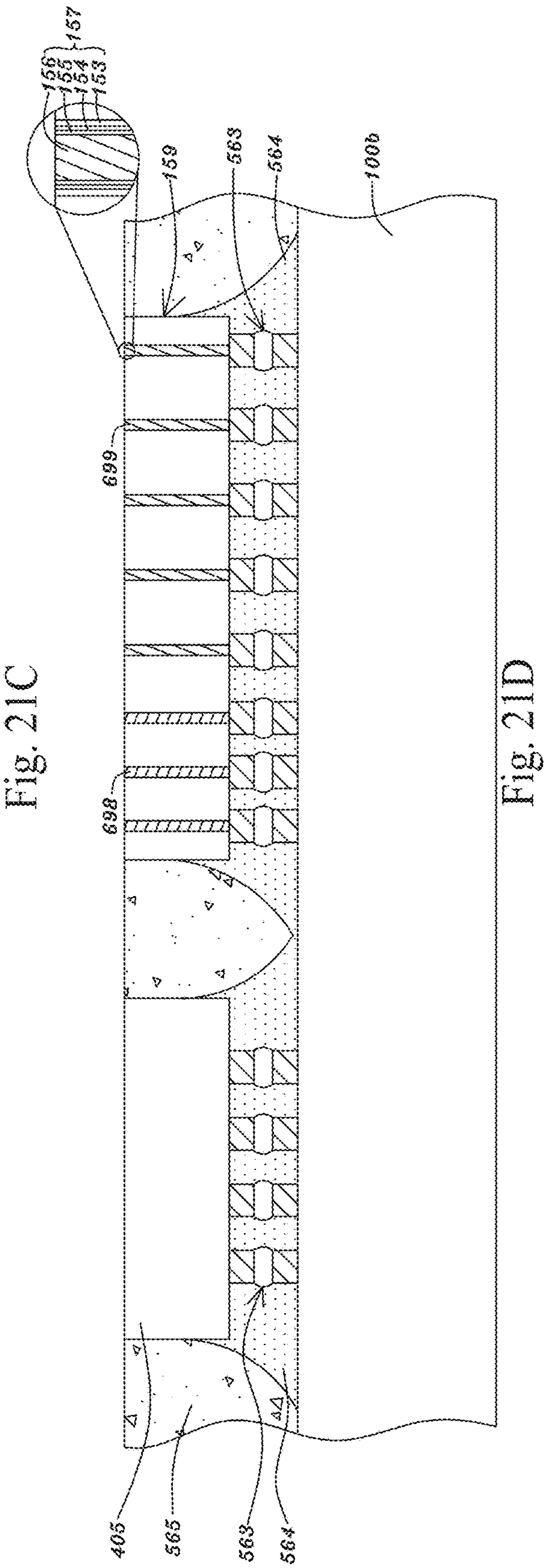
Figure 23D:
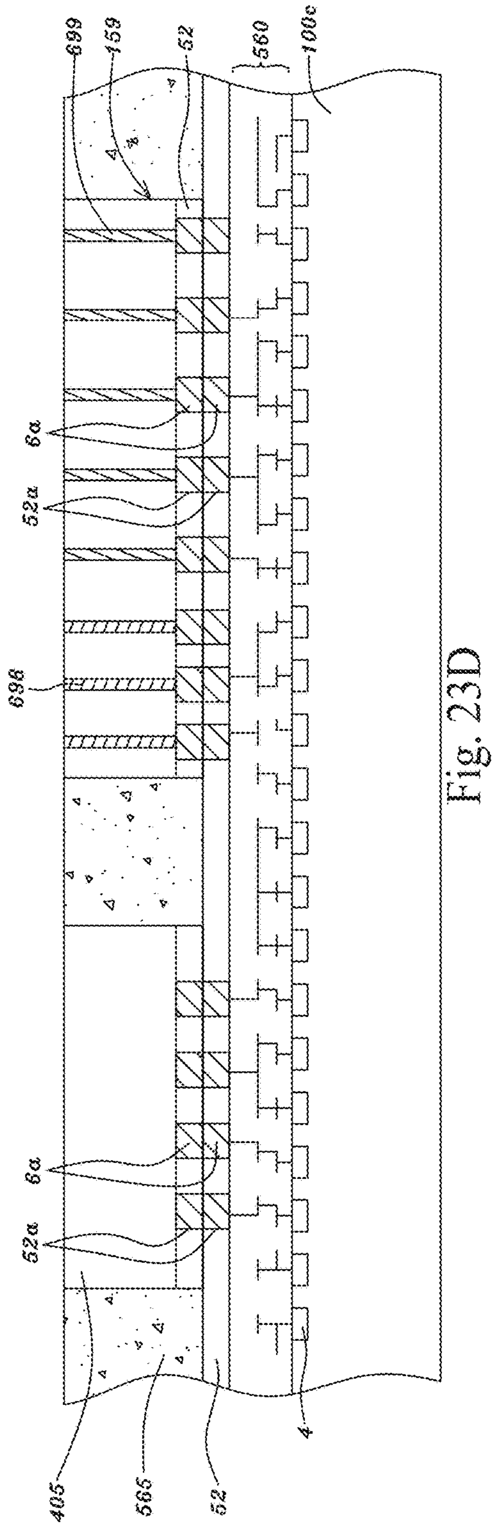

Next, referring to FIGS. 21D and 23D, a chemical mechanical polishing (CMP), polishing or grinding process may be applied to remove a top portion of the polymer layer 565, a top portion of each of the second type of memory modules 159, or known-good memory or logic chips or known-good ASIC chips, and a top portion of each of the known-good semiconductor chips 405, to planarize a top surface of the polymer layer 565, a top surface of each of the second type of memory modules 159, or known-good memory or logic chips or known-good ASIC chips, and a top surface of each of the semiconductor chips 405 and to expose a backside of the copper layer 156 of each of the through silicon vias (TSVs) 157 of the topmost one of the memory chips 251 of each of the second type of memory modules 159, or the copper layer 156 of the through silicon vias (TSVs) 157 of each of the known-good memory or logic chips or known-good ASIC chips in case of replacing the second type of memory modules 159. For each of the through silicon vias (TSVs) 157 of the topmost one of the memory chips 251 of said each of the second type of memory modules 159 or each of the through silicon vias (TSVs) 157 of said each of the known-good memory or logic chips or known-good ASIC chips in case of replacing the second type of memory modules 159, its insulating lining layer 153 at its backside is removed to be formed into an insulating lining surrounding its adhesion layer 154, seed layer 155 and copper layer 156, and a backside of its copper layer 156 is exposed.

Figure 21E:
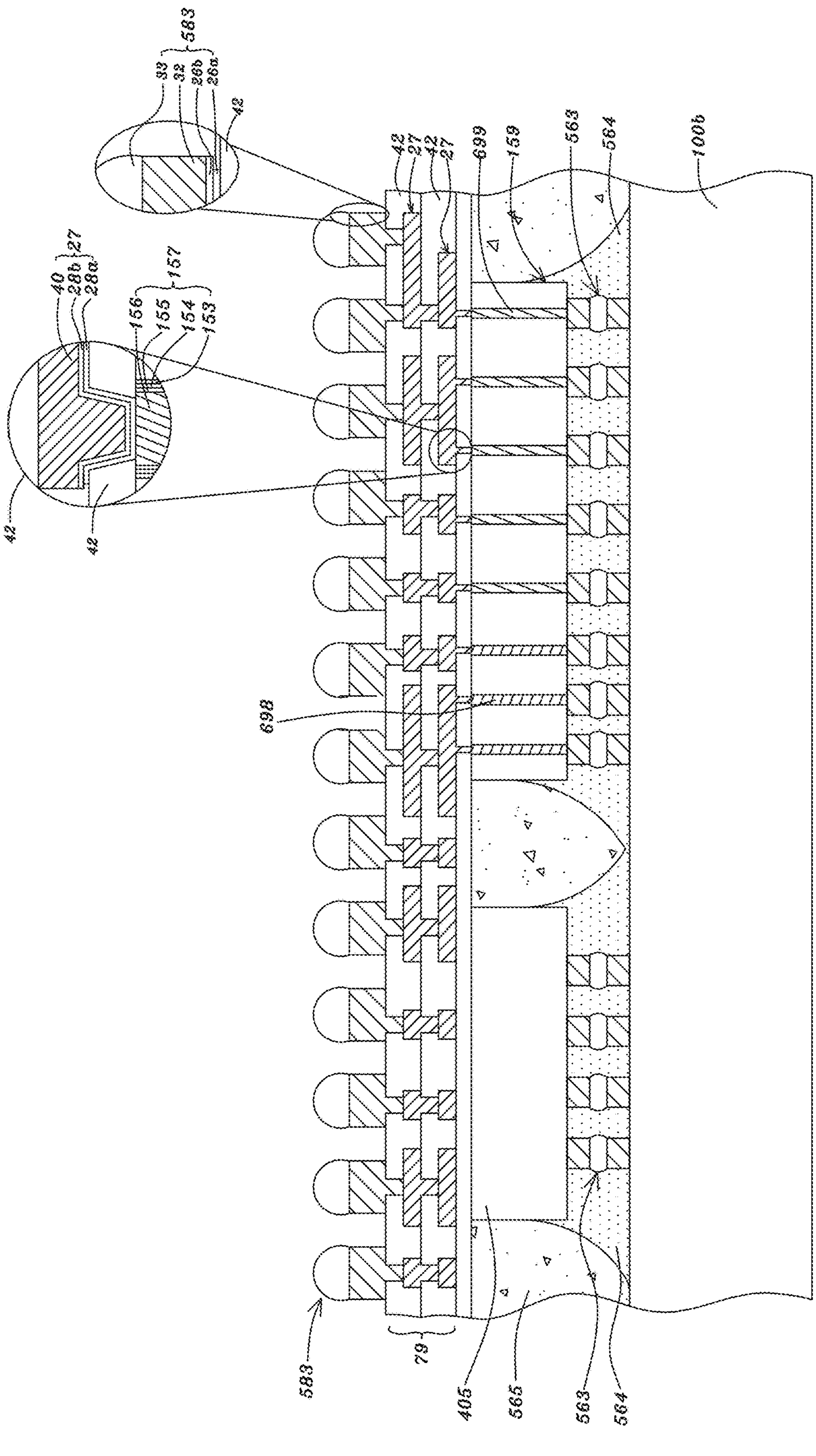
Figure 23E:
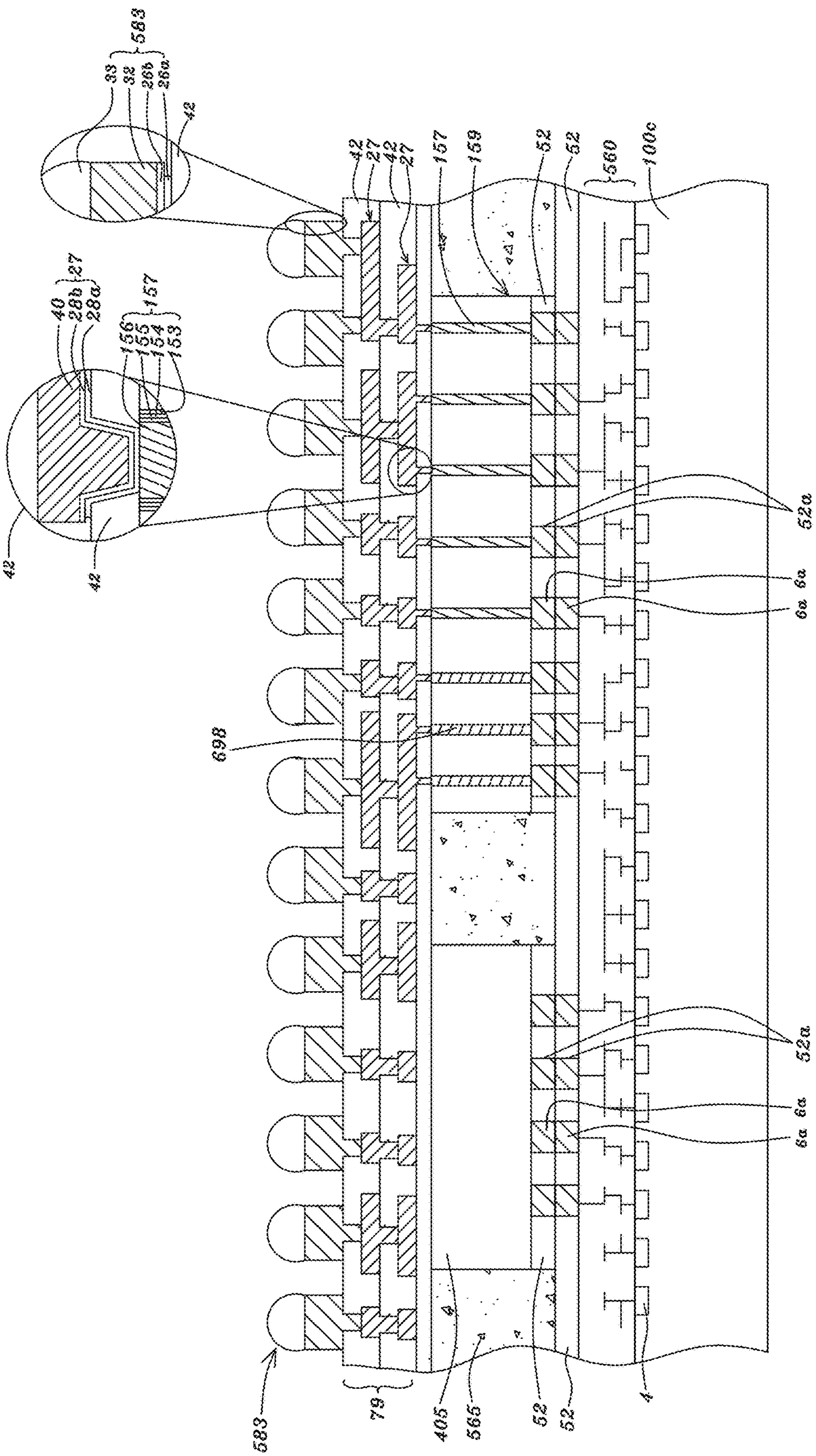

Referring to FIGS. 21E and 23E, a backside interconnection scheme 79 for a device (BISD) may be formed on each of the second type of memory modules 159, or known-good memory or logic chips or known-good ASIC chips, each of the known-good semiconductor chips 405 and the polymer layer 565. The backside interconnection scheme 79 may include one or more interconnection metal layers 27 coupling to the through silicon vias (TSVs) 157 of the memory chips 251 and control chip 688 of each of the second type of memory modules 159 or to the through silicon vias (TSVs) 157 of each of the known-good memory or logic chips or known-good ASIC chips in case of replacing the second type of memory modules 159, and one or more polymer layers 42, i.e., insulating dielectric layers, each between neighboring two of its interconnection metal layers 27, between a bottommost one of its interconnection metal layers 27 and a polished planar surface composed of a top surface of each of the known-good semiconductor chips 405, a top surface of each of the second type of memory modules 159, or known-good memory or logic chips or known-good ASIC chips, and a top surface of the polymer layer 565, or on and above a topmost one of its interconnection metal layers 27, wherein the topmost one of its interconnection metal layers 27 may have multiple metal pads at bottoms of multiple openings **42*a* in the topmost one of its polymer layers 42. Each of the interconnection metal layers 27 may include (1) a copper layer 40 having lower portions in openings in one of the polymer layers 42 having a thickness of between 0.3 μm and 20 μm and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. For the backside interconnection scheme 79 for a device (BISD), one of its interconnection metal layers 27 may have a metal line or trace with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm and a width between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm. One of its polymer layer may have a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. One of its interconnection metal layers 27** may have two planes used respectively for power are ground planes of a power supply and/or used as a heat dissipater or spreader for the heat dissipation or spreading, wherein the plane may have a thickness, for example, between 5 μm and 50 μm, 5 μm and 30 μm, 5 μm and 20 μm, or 5 μm and 15 μm, or greater than or equal to 5 μm, 10 μm, 20 μm, or 30 μm. The two planes may be layout as interlaced or interleaved shaped structures in a plane or may be layout in a fork shape.

Next, referring to FIGS. 21E and 23E, multiple metal bumps 583, which may be of one of the first through fourth types having the same specifications as the first through fourth types of micro-bumps or micro-pillars 34 as illustrated in FIG. 1F respectively, may be formed on the metal pads of the topmost one of the interconnection metal layers 27 of the backside interconnection scheme 79 at the bottoms of the openings **42*a* in the topmost one of the polymer layers 42 of the backside interconnection scheme 79**.

Figure 21F:
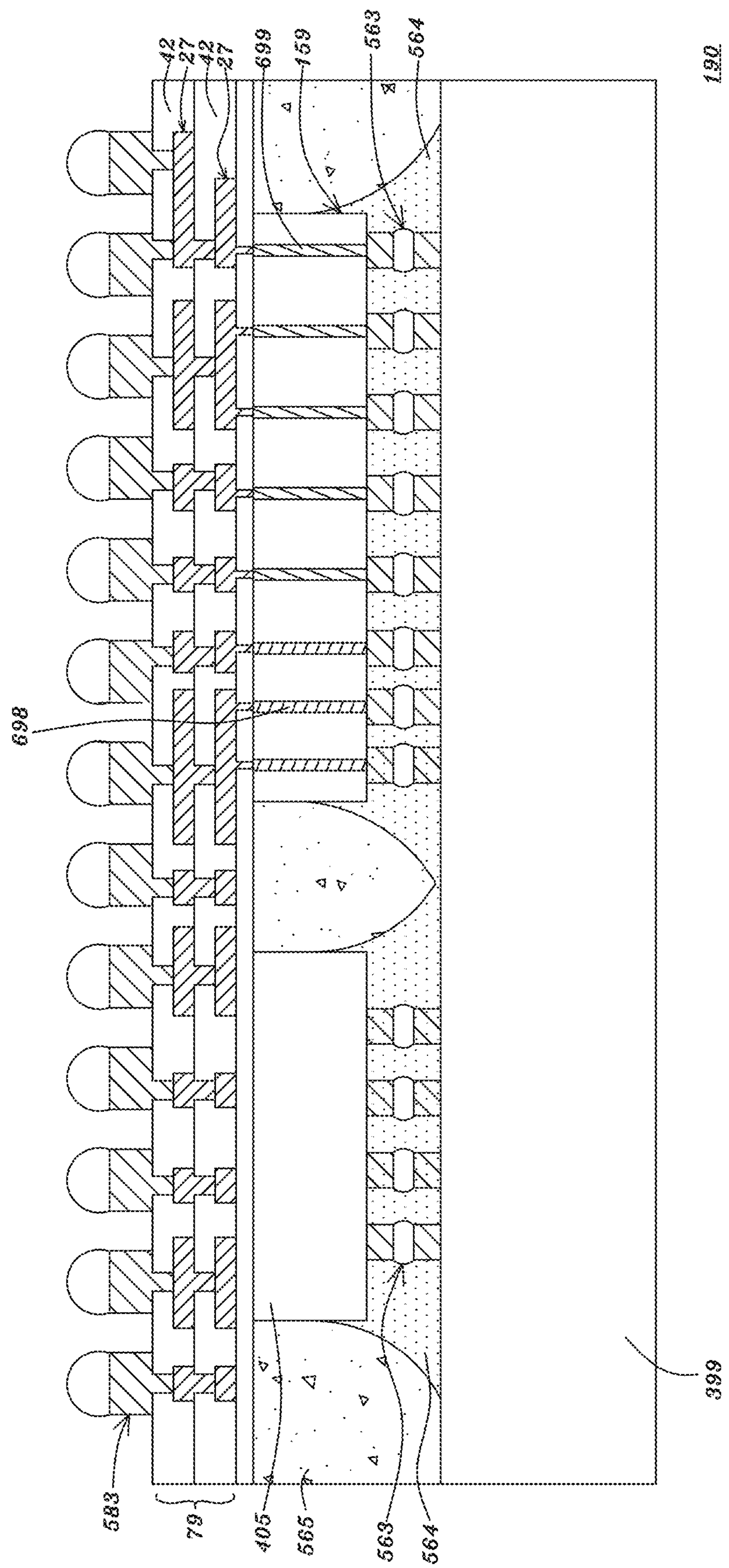
Figure 23F:
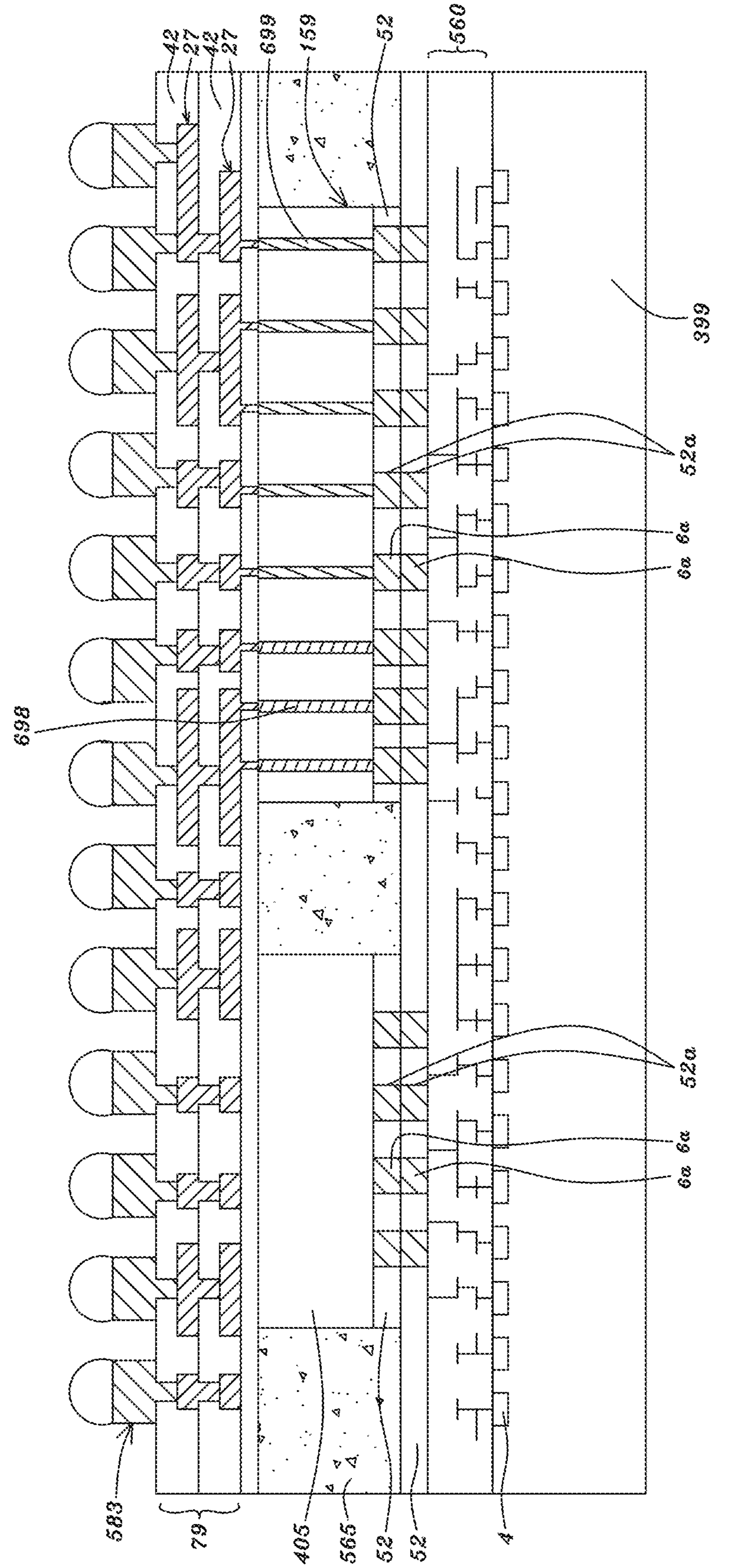

Next, referring to FIGS. 21E and 23E, the semiconductor wafer **100*b* or 100*c*, polymer layer 565 and polymer layers 42 of the backside interconnection scheme 79 may be cut or diced to form multiple first type of operation modules 190 or chip scale packages (CSP) as shown in FIGS. 21F and 23F by a laser cutting process or by a mechanical cutting process. At this time, the semiconductor wafer 100*b* or 100*c* may be cut or diced into multiple semiconductor chips that may be application specific integrated-circuit (ASIC) logic chips 399, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips. For the first type of operation module 190 as seen in FIG. 21E or 23E, its application specific integrated-circuit (ASIC) logic chip 399 may have the semiconductor devices 4 such as transistors at the active surface of the semiconductor substrate 2 thereof as illustrated in FIG. 17A or 17D respectively. The active surface of the semiconductor substrate 2 of its application specific integrated-circuit (ASIC) logic chip 399 may face an active surface of the semiconductor substrate 2 of its known-good memory or logic chip or known-good ASIC chip in case of replacing the second type of memory modules 159, wherein its known-good memory or logic chip or known-good ASIC chip in case of replacing the second type of memory modules 159 may have the semiconductor devices 4 such as transistors at the active surface of the semiconductor substrate 2 thereof as illustrated in FIG. 17B or 17E respectively. The active surface of the semiconductor substrate 2 of its application specific integrated-circuit (ASIC) logic chip 399 may face an active surface of the semiconductor substrate 2 of its known-good semiconductor chip 405, wherein its known-good semiconductor chip 405 may have the semiconductor devices 4 such as transistors at the active surface of the semiconductor substrate 2 thereof as illustrated in FIG. 17A or 17**D respectively.

Referring to FIGS. 21E and 23E, for the first type of operation module 190, its second type of memory module 159, or known-good memory or logic chip or known-good ASIC chip, may have multiple small I/O circuits coupling respectively to multiple small I/O circuits of its application specific integrated-circuit (ASIC) chip 399 through its bonded contacts 563 therebetween as seen in FIG. 21E or the bonded metal pads **6*a* of its second type of memory module 159, or known-good memory or logic chip or known-good ASIC chip, and application specific integrated-circuit (ASIC) chip 399 as seen in FIG. 23E for data transmission with a data bit width of equal to or greater than 64, 128, 256, 512, 1024, 2048, 4096, 8K, or 16K, wherein each of the small I/O circuits of its second type of memory module 159, or known-good memory or logic chip or known-good ASIC chip, and application specific integrated-circuit (ASIC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Further, its second type of memory module 159, or known-good memory or logic chip or known-good ASIC chip, may have a large input/output (I/O) circuit coupling to one of its metal bumps 583 for signal transmission or power or ground delivery through the interconnection metal layers 27 of its backside interconnection scheme 79, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Further, its second type of memory module 159, or known-good memory or logic chip or known-good ASIC chip, may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399 as encrypted CPM data to be passed to the metal bumps 583 and (2) to decrypt, in accordance with the password or key, encrypted CPM data from the metal bumps 583 as decrypted CPM data to be passed to the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399. Further, its second type of memory module 159, or known-good memory or logic chip or known-good ASIC chip, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 399. Further, its second type of memory module 159, or known-good memory or logic chip or known-good ASIC chip, may include multiple non-volatile memory cells, such as NAND memory cells, NOR memory cells, RARM cells, MRAM cells, FRAM cells or PCM cells, configured to store CPM data to be passed to the memory cells 490 for the look-up tables (LUT) 210 of the programmable logic cells (LC) 2014 of its application specific integrated-circuit (ASIC) logic chip 399 for programming or configuring the programmable logic cells (LC) 2014 of its application specific integrated-circuit (ASIC) logic chip 399 or to the memory cells 362 of the programmable switch cells 379 of its application specific integrated-circuit (ASIC) logic chip 399 for programming or configuring the programmable switch cells 379 of its application specific integrated-circuit (ASIC) logic chip 399**.

Referring to FIGS. 21F and 23F, for the first type of operation module 190, its application specific integrated-circuit (ASIC) logic chips 399 may have a large input/output (I/O) circuit coupling to one of its metal bumps 583 for signal transmission or power or ground delivery through, in sequence, one of the dedicated vertical bypasses 698 in its second type of memory module 159 as illustrated in FIGS. 19B and 19D, or one of the through silicon vias (TSVs) 157 of its known-good memory or logic chip or known-good ASIC chip in case of replacing its second type of memory module 159, and the interconnection metal layers 27 of its backside interconnection scheme 79, wherein said one of the dedicated vertical bypasses 698 is not connected to any transistor in the memory chips 251 or control chip 688 of its second type of memory module 159, or said one of the through silicon vias (TSVs) 157 is not connected to any transistor in its known-good memory or logic chip or known-good ASIC chip in case of replacing its second type of memory module 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One of the vertical interconnects 699 of its first or second type of memory module 159 as illustrated in FIGS. 19A-19D may couple to one of its metal bumps 583 through the interconnection metal layers 27 of its backside interconnection scheme 79 and to its application specific integrated-circuit (ASIC) chips 399 through one of its bonded contacts 563 as seen in FIG. 21F or through one of the metal pads 6*a* of the control chip 688 of its first or second type of memory module 159 as seen in FIG. 23F.

Referring to FIGS. 21F and 23F, for the first type of operation module 190, each of the memory chips 251 and control chip 688 of its second type of memory module 159, or known-good memory or logic chip or known-good ASIC chip, may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in each of the memory chips 251 and control chip 688 of its second type of memory module 159, or known-good memory or logic chip or known-good ASIC chip, may be 1, 2, 3, 4, 5 or greater than 5 nodes or generations older, more matured or less advanced than that used in its application specific integrated-circuit (ASIC) logic chip 399. Transistors used in each of the memory chips 251 and control chip 688 of its second type of memory module 159, or known-good memory or logic chip or known-good ASIC chip, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of its second type of memory module 159, or known-good memory or logic chip or known-good ASIC chip, may be different from that used in its application specific integrated-circuit (ASIC) logic chip 399; each of the memory chips 251 and control chip 688 of its second type of memory module 159, or known-good memory or logic chip or known-good ASIC chip, may use planar MOSFETs, while its application specific integrated-circuit (ASIC) logic chip 399 may use fin field effect transistors (FINFETs) or gate-all-around field effect transistors (GAAFETs). A power supply voltage (Vcc) applied in each of the memory chips 251 and control chip 688 of its second type of memory module 159, or known-good memory or logic chip or known-good ASIC chip, may be greater than or equal to 1.5, 2.0, 2.5, 3, 3.3, 4, or 5 voltages, while a power supply voltage (Vcc) applied in its application specific integrated-circuit (ASIC) logic chip 399 may be smaller than or equal to 1.8, 1.5 or 1 voltage. The power supply voltage applied in each of the memory chips 251 and control chip 688 of its second type of memory module 159, or known-good memory or logic chip or known-good ASIC chip, may be higher than that applied in its application specific integrated-circuit (ASIC) logic chip 399. A gate oxide of a field effect transistor (FET) of each of the memory chips 251 and control chip 688 of its second type of memory module 159, or known-good memory or logic chip or known-good ASIC chip, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 399 may have a physical thickness less than 4.5 nm, 4 nm, 3 nm or 2 nm. The thickness of the gate oxide of the field effect transistor (FET) of each of the memory chips 251 and control chip 688 of its second type of memory module 159, or known-good memory or logic chip or known-good ASIC chip, may be greater than that of its application specific integrated-circuit (ASIC) logic chip 399.

Figure 21G:
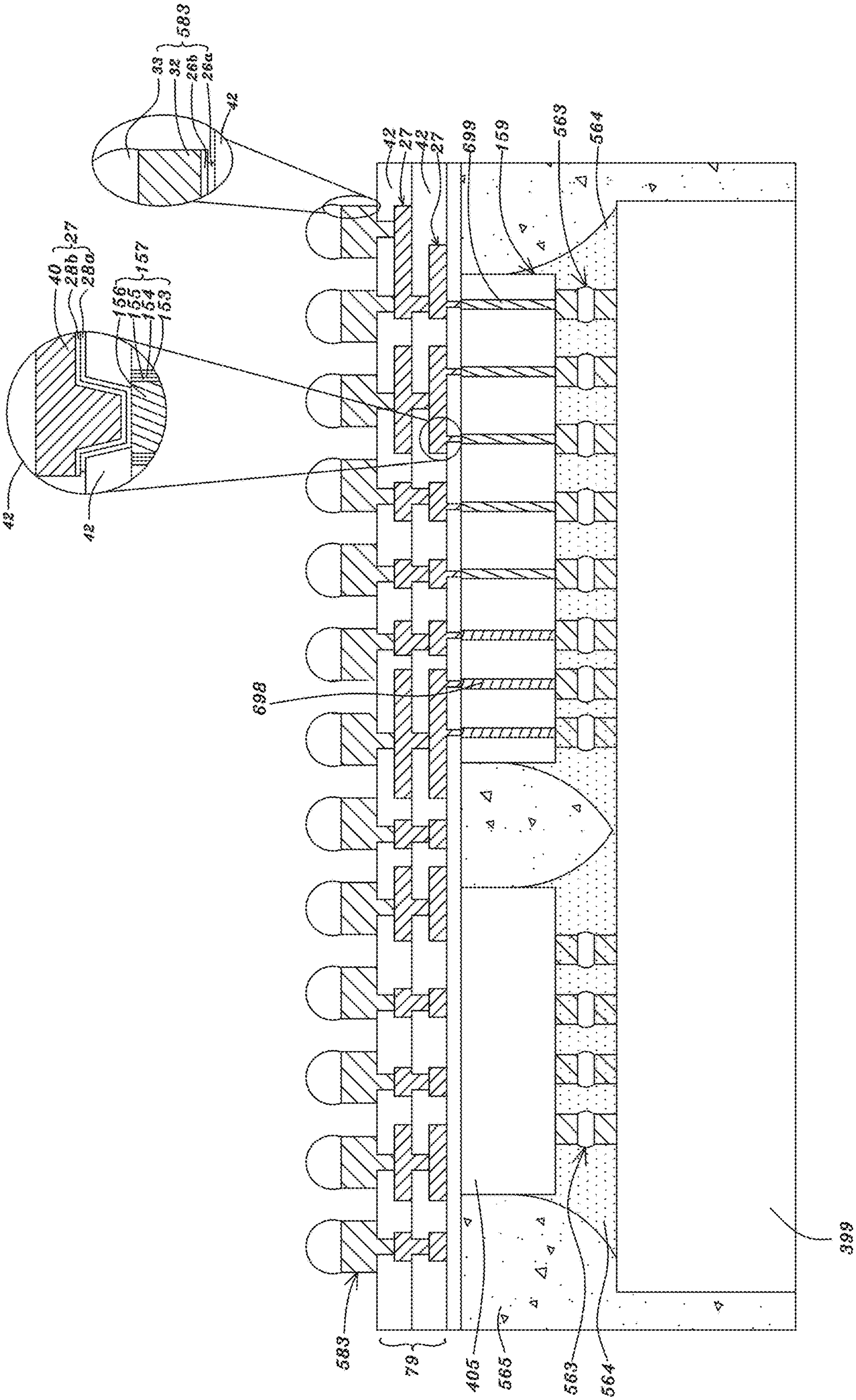
Figure 23G:
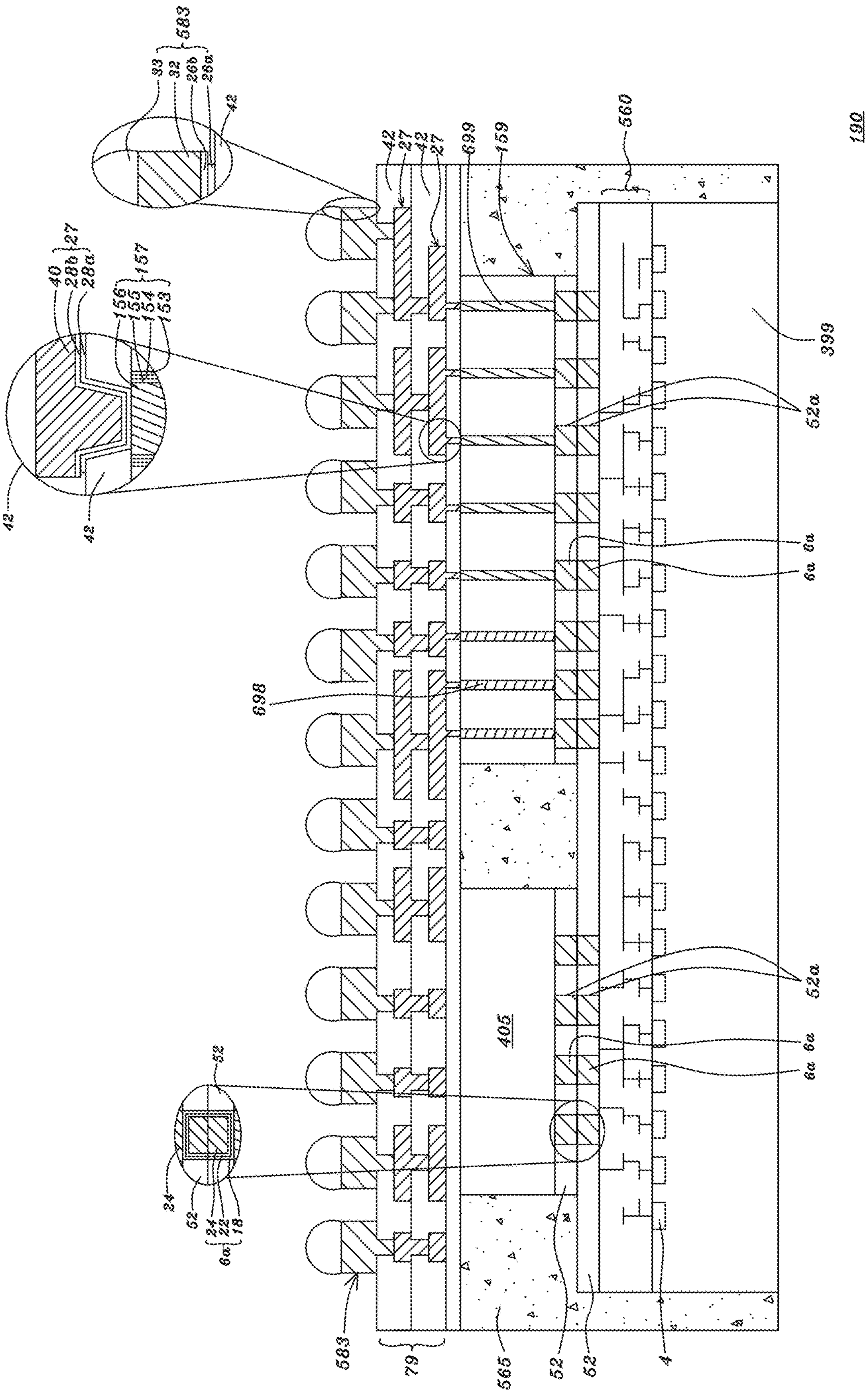

Alternatively, FIGS. 21G and 23G are schematically cross-sectional views showing various first type of operation modules in accordance with an embodiment of the present application. For an element indicated by the same reference number shown in FIGS. 21A-21G, 22A, 22B or 23A-23G, the specification of the element as seen in FIGS. 21G and 23G may be referred to that of the element as illustrated in FIG. 21A-21F, 22A, 22B or 23A-23F. Referring to FIG. 21G, the semiconductor wafer 100*b* as seen in FIG. 21A may be cut or diced into multiple semiconductor chips (only one is shown), which may be application specific integrated-circuit (ASIC) logic chips 399, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, in which known-good ones may have backsides to be attached to a temporary substrate. Next, each of the second type of memory modules 159 (only one is shown) may be held by the bonding head 161 as seen in FIG. 21A to have its first, second or third type of micro-bumps or micro-pillars 34 to be bonded to the first, second or fourth type of micro-bumps or micro-pillars 34 preformed at active sides of the respective known-good application specific integrated-circuit (ASIC) logic chips 399 into multiple bonded contacts 563 respectively therebetween. Alternatively, each of the second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip having the first and/or second interconnection scheme(s) 560 and/or 588 and the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of one of the known-good application specific integrated-circuit (ASIC) logic chips 399 into multiple bonded contacts 563 therebetween. Alternatively, each of the second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip having the first and/or second interconnection scheme(s) 560 and/or 588 and the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of one of the known-good application specific integrated-circuit (ASIC) logic chips 399 into multiple bonded contacts 563 therebetween. Alternatively, each of the second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B having the first and/or second interconnection scheme(s) 560 and/or 588 and the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of one of the known-good application specific integrated-circuit (ASIC) logic chips 399 into multiple bonded contacts 563 therebetween. Next, each of the known-good semiconductor chips 405 (only one is shown) may be held by the bonding head 162 as seen in FIG. 21B to have its first, second or third type of micro-bumps or micro-pillars 34 to be bonded to the first, second or fourth type of micro-bumps or micro-pillars 34 preformed at the active sides of one of the known-good application specific integrated-circuit (ASIC) logic chips 399 into multiple bonded contacts 563 therebetween. Next, the underfill 564 may be filled into a gap between each of the second type of memory modules 159, or known-good memory or logic chips or known-good ASIC chips, and one of the known-good application specific integrated-circuit (ASIC) logic chips 399 to enclose the bonded contacts 563 therebetween and into a gap between each of the known-good semiconductor chips 405 and one of the known-good application specific integrated-circuit (ASIC) logic chips 399 to enclose the bonded contacts 563 therebetween.

Alternatively, referring to FIG. 23G, the semiconductor wafer 100*c* as seen in FIG. 23A may be cut or diced into multiple semiconductor chips (only one is shown), which may be application specific integrated-circuit (ASIC) logic chips 399, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, in which known-good ones may have backsides to be attached to a temporary substrate. A joining surface, i.e., silicon oxide, of the insulating bonding layer 52 at the active side of each of the known-good application specific integrated-circuit (ASIC) logic chips 399 may be activated with nitrogen plasma for increasing a hydrophilic property thereof, and then the joining surface of the insulating bonding layer 52 at the active side of each of the known-good application specific integrated-circuit (ASIC) logic chips 399 may be rinsed with deionized water for water adsorption and cleaning. Next, referring to FIGS. 23A-23C and 23G, each of the second type of memory modules 159, or known-good memory or logic chips or known-good ASIC chips, and each of the known-good semiconductor chips 405 may join one of the known-good application specific integrated-circuit (ASIC) logic chips 399 by (1) picking up, by a bonding head 161, said each of the second type of memory modules 159, or known-good memory or logic chips or known-good ASIC chips, to be placed on said one of the known-good application specific integrated-circuit (ASIC) logic chips 399 with each of the metal pads 6*a* at the active side of the control chip 688 of said each of the second type of memory modules 159, or at the active side of said each of the known-good memory or logic chips or known-good ASIC chips, in contact with one of the metal pads 6*a* at the active side of said one of the known-good application specific integrated-circuit (ASIC) logic chips 399 and with the joining surface of the insulating bonding layer 52 at the active side of the control chip 688 of said each of the second type of memory modules 159, or at the active side of said each of the known-good memory or logic chips or known-good ASIC chips, in contact with the joining surface of the insulating bonding layer 52 at the active side of said one of the known-good application specific integrated-circuit (ASIC) logic chips 399, (2) picking up, by a bonding head 162, said each of the known-good semiconductor chips 405 to be placed on said one of the known-good application specific integrated-circuit (ASIC) logic chips 399 with each of the metal pads 6*a* at the active side of said each of the known-good semiconductor chips 405 in contact with one of the metal pads 6*a* at the active side of said one of the known-good application specific integrated-circuit (ASIC) logic chips 399 and with the joining surface of the insulating bonding layer 52 at the active side of said each of the known-good semiconductor chips 405 in contact with the joining surface of the insulating bonding layer 52 at the active side of said one of the application specific integrated-circuit (ASIC) logic chips 399, and (3) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the control chip 688 of said each of the second type of memory modules 159, or at the active side of said each of the known-good memory or logic chips or known-good ASIC chips, and the joining surface of the insulating bonding layer 52 at the active side of said each of the known-good semiconductor chips 405 to the joining surface of the insulating bonding layer 52 at the active side of said one of the known-good application specific integrated-circuit (ASIC) logic chips 399 and (b) copper-to-copper bonding at a temperature between 300 and 350 degrees Celsius and for a time period between 10 and 60 minutes to bond the copper layer 24 of each of the metal pads 6*a* at the active side of the control chip 688 of said each of the second type of memory modules 159, or at the active side of said each of the known-good memory or logic chips or known-good ASIC chips, to the copper layer 24 of one of the metal pads 6*a* at the active side of said one of the known-good application specific integrated-circuit (ASIC) logic chips 399 and to bond the copper layer 24 of each of the metal pads 6*a* at the active side of said each of the known-good semiconductor chips 405 to the copper layer 24 of one of the metal pads 6*a* at the active side of said one of the known-good application specific integrated-circuit (ASIC) logic chips 399, wherein the oxide-to-oxide bonding may be caused by water desorption from reaction between the joining surface of the insulating bonding layer 52 at the active side of the control chip 688 of said each of the second type of memory modules 159, or at the active side of said each of the known-good memory or logic chips or known-good ASIC chips, and the joining surface of the insulating bonding layer 52 at the active side of said one of the known-good application specific integrated-circuit (ASIC) logic chips 399 and between the joining surface of the insulating bonding layer 52 at the active side of said each of the known-good semiconductor chips 405 and the joining surface of the insulating bonding layer 52 at the active side of said one of the known-good application specific integrated-circuit (ASIC) logic chips 399, and the copper-to-copper bonding may be caused by metal inter-diffusion between the copper layer 24 of the metal pads 6*a* at the active side of the control chip 688 of said each of the second type of memory modules 159, or at the active side of said each of the known-good memory or logic chips or known-good ASIC chips, and the copper layer 24 of the metal pads 6*a* at the active side of said one of the known-good application specific integrated-circuit (ASIC) logic chips 399 and between the copper layer 24 of the metal pads 6*a* at the active side of said each of the known-good semiconductor chips 405 and the copper layer 24 of the metal pads 6*a* at the active side of said one of the known-good application specific integrated-circuit (ASIC) logic chips 399.

Next, referring to FIGS. 21G and 23G, the polymer layer 565 may be applied to fill a gap between each neighboring two of the second type of memory modules 159, or known-good memory or logic chips or known-good ASIC chips, and known-good semiconductor chips 405 and a gap between each neighboring two of the known-good application specific integrated-circuit (ASIC) logic chips 399 on the temporary substrate and to cover a backside of each of the second type of memory modules 159, or known-good memory or logic chips or known-good ASIC chips, and a backside of each of the known-good semiconductor chips 405. Next, the chemical mechanical polishing (CMP), polishing or grinding process as illustrated in FIGS. 21D and 23D and the steps of forming the backside interconnection scheme 79 and metal bumps 583 as illustrated in FIGS. 21E and 23E may be performed. Next, the temporary substrate may be removed from the backsides of the known-good application specific integrated-circuit (ASIC) logic chips 399 and the polymer layer 565. Next, the polymer layer 565 and polymer layers 42 of the backside interconnection scheme 79 may be cut or diced to form multiple first type of operation modules 190 or chip scale packages (CSP) by a laser cutting process or by a mechanical cutting process. For the first type of operation module 190, its polymer layer 565 may cover sidewalls of its known-good application specific integrated-circuit (ASIC) logic chips 399.

Figure 21H:
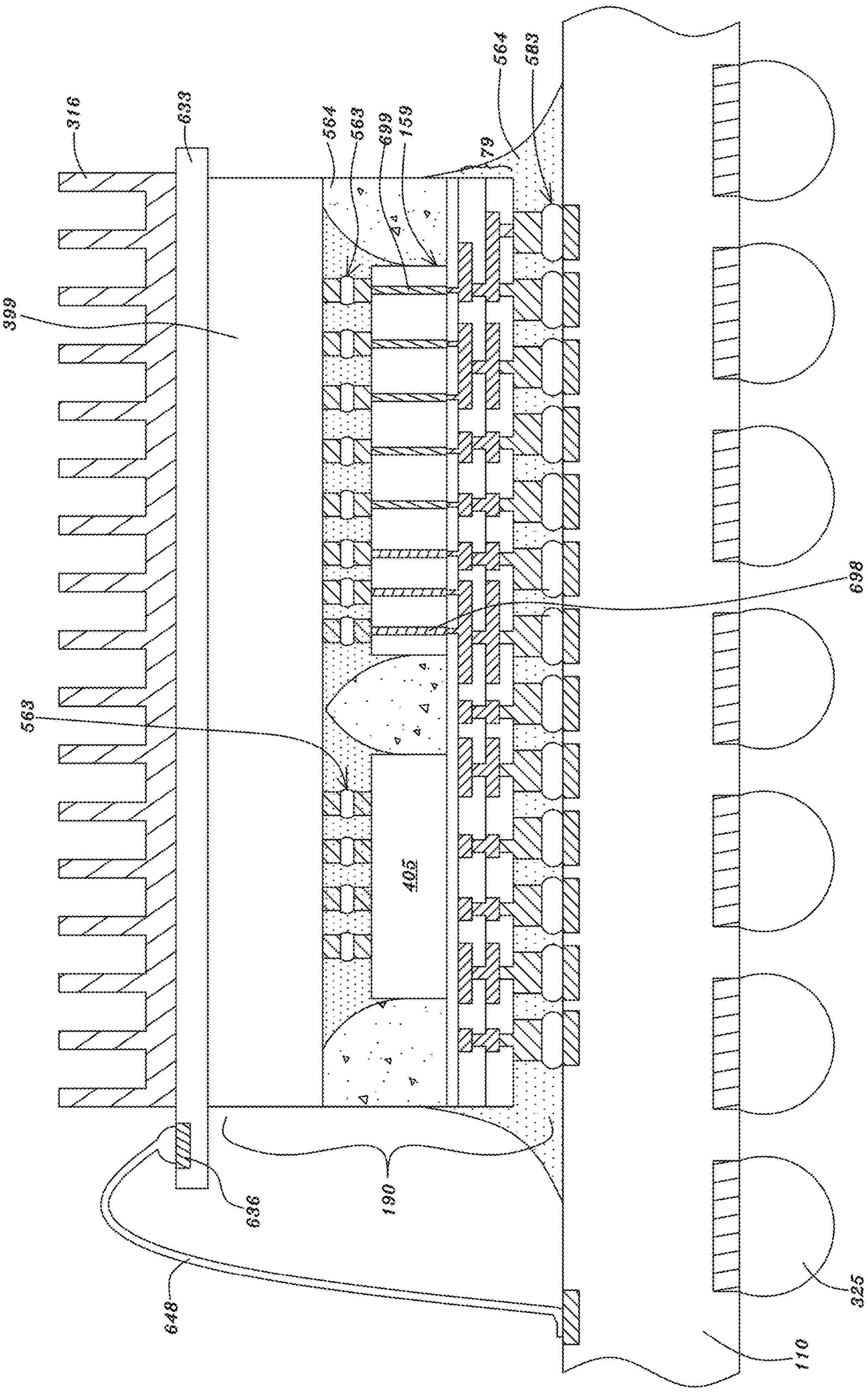
FIGS. 21H and 23H are schematically cross-sectional view showing various chip packages based on various first type of operation modules in accordance with an embodiment of the present application.
Figure 23H:
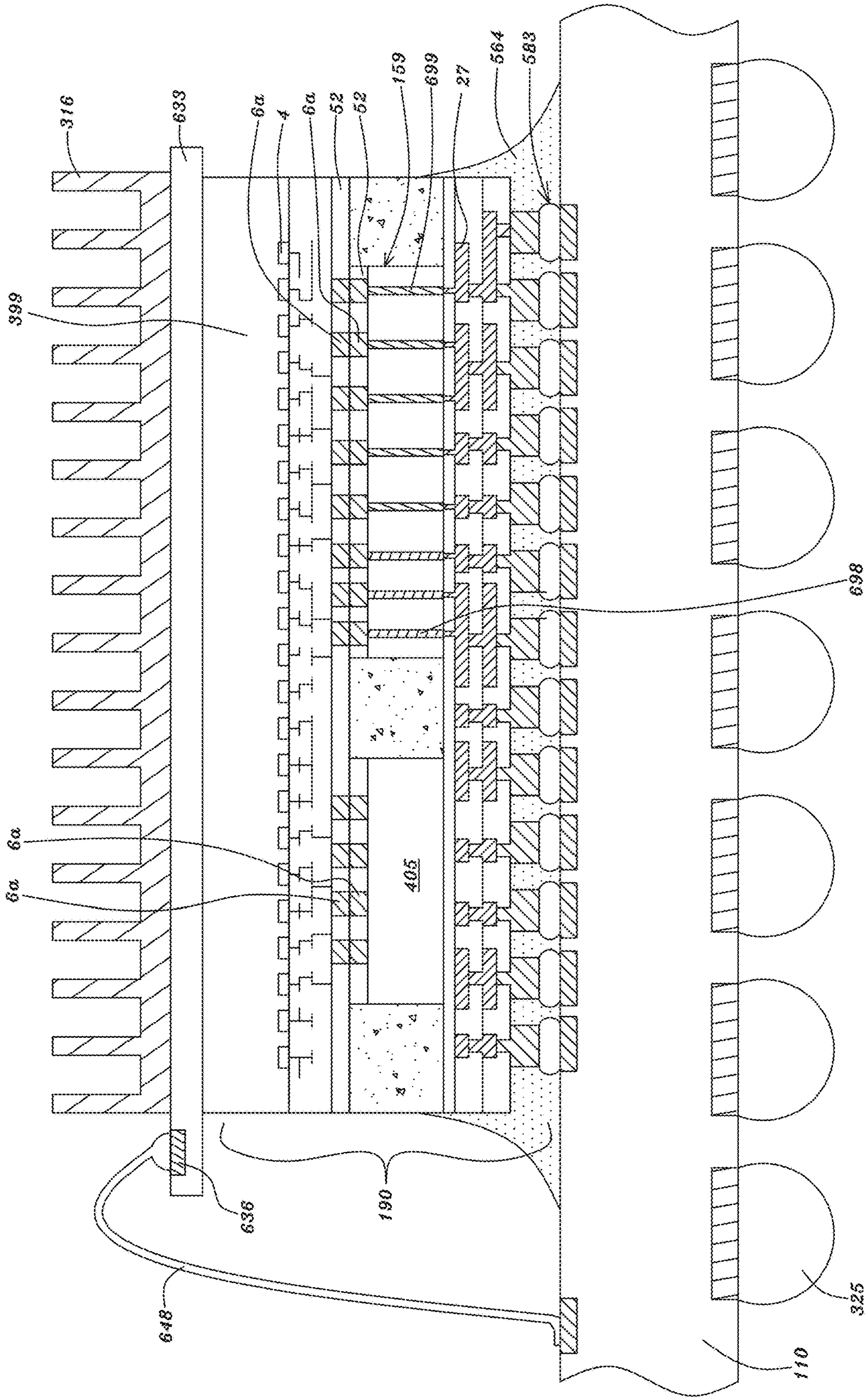

FIGS. 21H and 23H are schematically cross-sectional views showing various chip packages based on various first type of operation modules in accordance with an embodiment of the present application. Referring to FIGS. 21H and 23H, the first type of operation module 190 as illustrated in FIG. 21F, 21G, 23F or 23G may have the metal bumps 583 to be bonded to multiple metal pads of a circuit substrate 110, such as printed circuit board, ball-grid-array (BGA) substrate, flexible circuit film or tape, or ceramic circuit substrate, at a top side of the circuit substrate 110. The first type of operation module 190 as illustrated in FIG. 21F is taken as an example herein for the chip package shown in FIG. 21H. The first type of operation module 190 as illustrated in FIG. 23F is taken as an example herein for the chip package shown in FIG. 23H. Next, an underfill 564, such as epoxy resins or compounds, may be filled into a gap between the first type of operation module 190 and the circuit substrate 110 to enclose the metal bumps 583 therebetween. Next, a heat dissipation module having the thermoelectric (TE) cooler 633 as illustrated in FIG. 18A and a heat sink 316 attached to a hot side of its thermoelectric (TE) cooler 633 is provided to attach the cold side of its thermoelectric (TE) cooler 633 to the backside of the application specific integrated-circuit (ASIC) logic chips 399 of the first type of operation module 190 as illustrated in FIG. 21F, 21G, 23F or 23G. Next, multiple wires 648 (only one is shown) may be provided each having a terminal bonded by a wirebonding process to the patterned circuit layer 636 of the thermoelectric (TE) cooler 633 as illustrated in FIG. 18A and another terminal bonded by the wirebonding process to another metal pad of the circuit substrate 110. Next, a polymer encapsulant (not shown) may be formed to enclose the wires 648 to protect the wires 648 from being damaged due to external forces. Next, multiple solder balls 325 such as tin-lead alloy or tin-silver alloy may be formed at a bottom side of the circuit substrate 110.

2. Second Type of Operation Module (Stacked 3D Chip-Scale-Package (CSP))

Figure 24A:
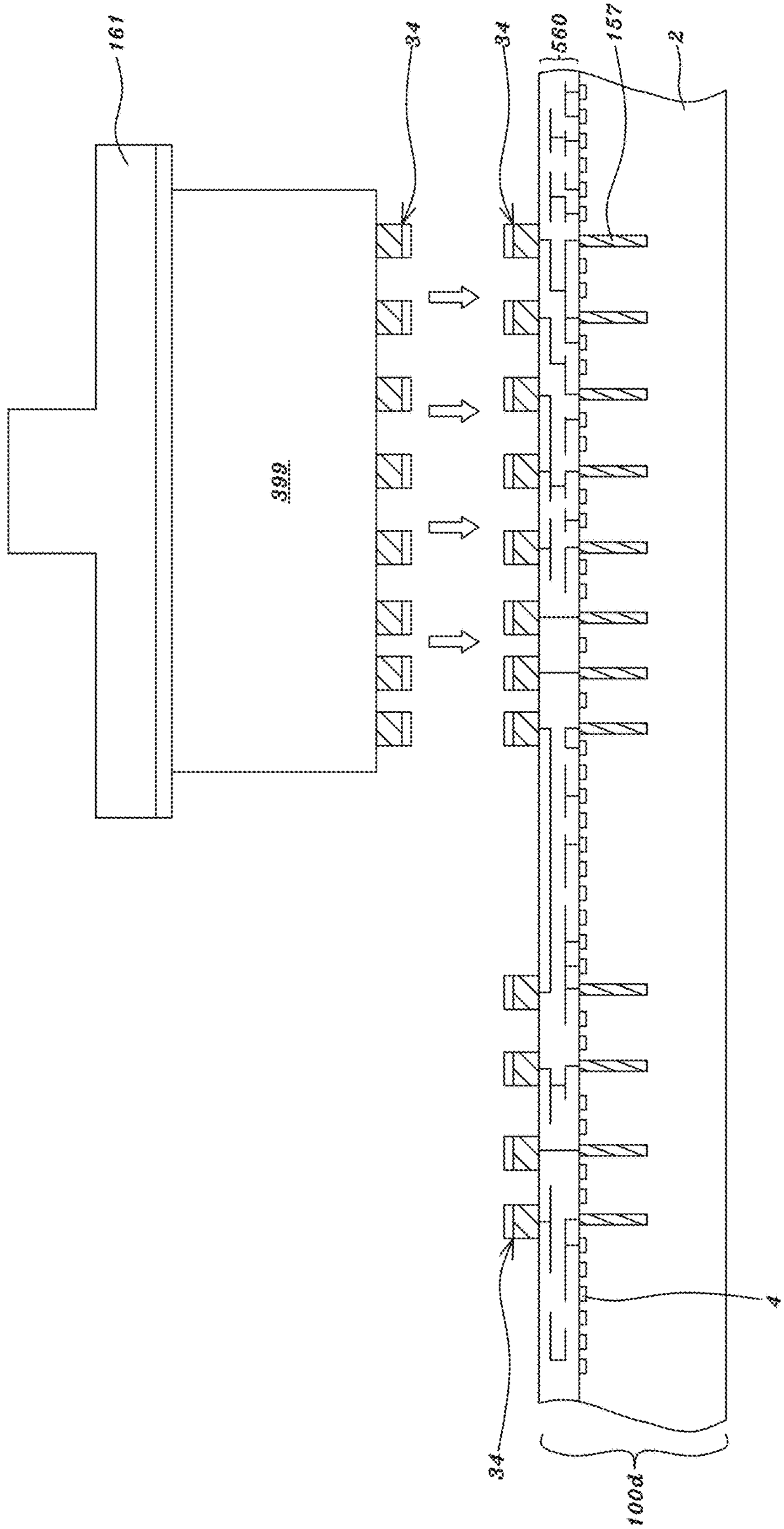
FIGS. 24A-24H and 25A-25H are schematically cross-sectional views showing various processes for fabricating various second type of operation modules for a standard commodity logic drive in accordance with an embodiment of the present application.
Figure 24B:
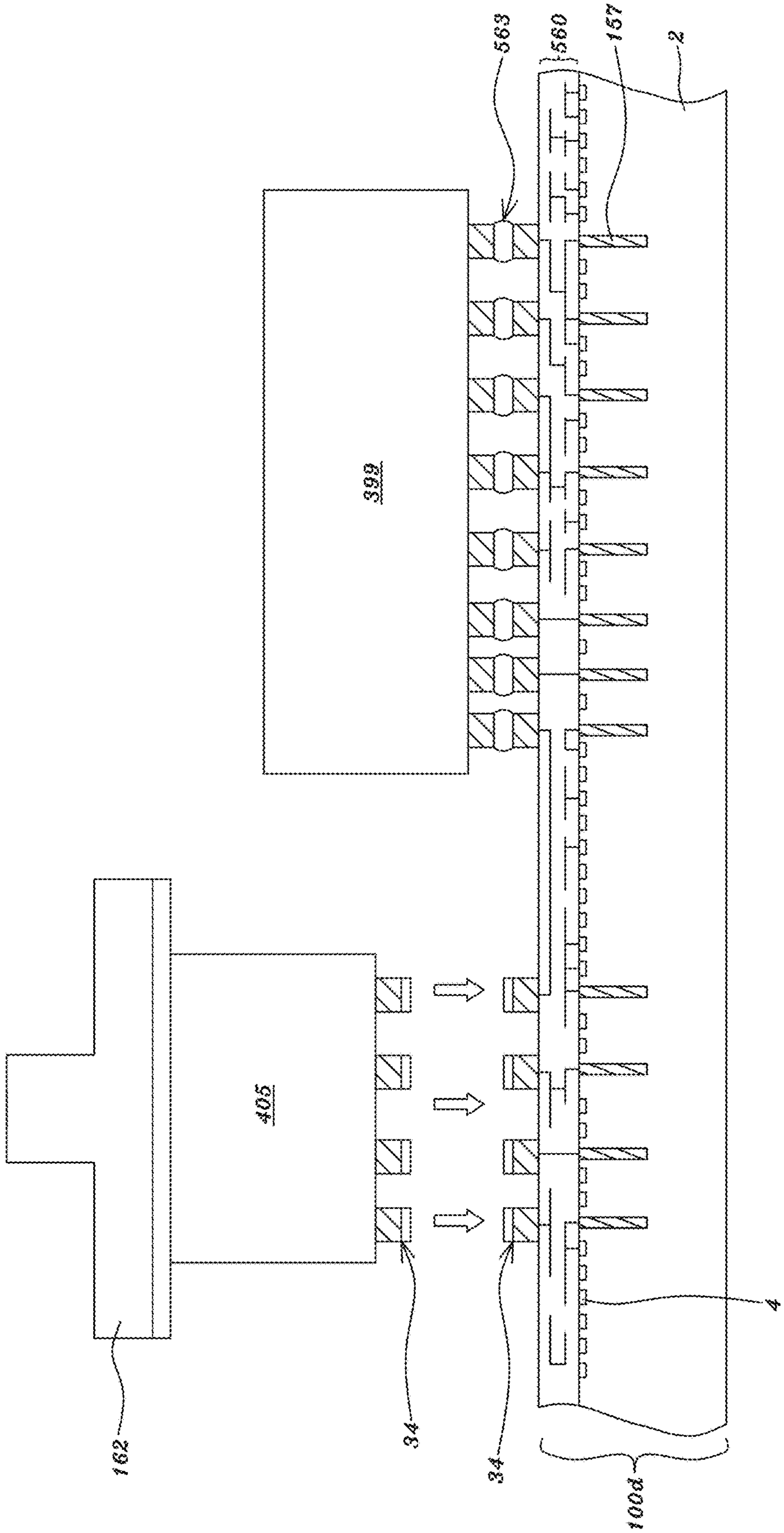

FIGS. 24A-24G are schematically cross-sectional views showing a process for fabricating a second type of operation module in accordance with an embodiment of the present application. Referring to FIGS. 24A and 24B, a semiconductor wafer 100*d* may be provided with the first and/or second interconnection scheme(s) 560 and/or 588, through silicon vias (TSVs) 157 and first, second or fourth type of micro-bumps or micro-pillars 34 as illustrated in FIG. 17B. Multiple known-good application specific integrated-circuit (ASIC) logic chips 399 (only one is shown), such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, each may be provided with the first and/or second interconnection scheme(s) 560 and/or 588 and first, second or third type of micro-bumps or micro-pillars 34 as illustrated in FIG. 19A. One or more of the known-good application specific integrated-circuit (ASIC) logic chips 399 may be held by a bonding head 161 to have its first, second or third type of micro-bumps or micro-pillars 34 to be bonded to the first, second or fourth type of micro-bumps or micro-pillars 34 preformed at an active side of the semiconductor wafer 100*d* into multiple bonded contacts 563 respectively therebetween, as referred to any of the first through fourth cases illustrated in FIGS. 23A-23C.

Figure 24C:
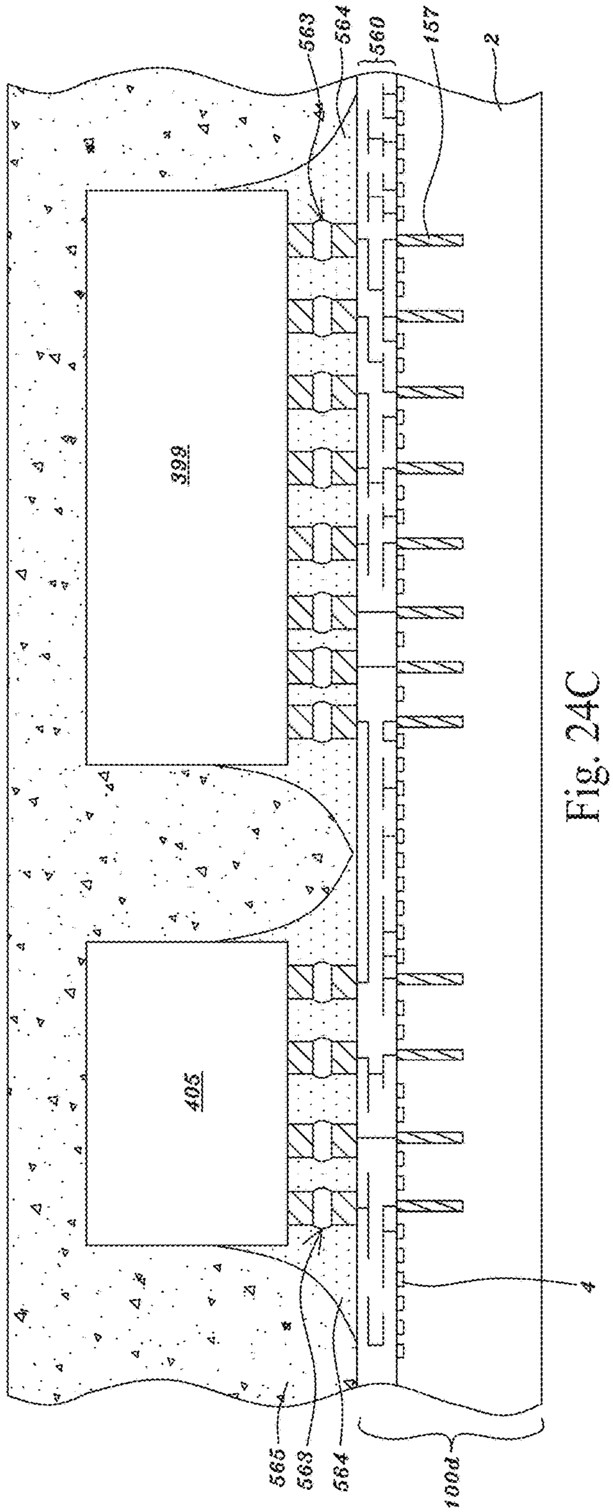

Next, referring to FIGS. 24B and 24C, each of the known-good semiconductor chips 405 (only one is shown) as illustrated in FIGS. 21B and 21C may be held by the bonding head 162 to have its first, second or third type of micro-bumps or micro-pillars 34 to be bonded to the first, second or fourth type of micro-bumps or micro-pillars 34 preformed at the active side of the semiconductor wafer 100*d* into multiple bonded contacts 563 respectively therebetween, as referred to any of the first through fourth cases illustrated in FIGS. 21A-21C.

Next, referring to FIG. 24C, an underfill 564, such as epoxy resins or compounds, may be filled into a gap between each of the known-good application specific integrated-circuit (ASIC) logic chips 399 and the semiconductor wafer 100*d* to enclose the bonded contacts 563 therebetween and into a gap between each of the known-good semiconductor chips 405 and the semiconductor wafer 100*d* to enclose the bonded contacts 563 therebetween. The underfill 564 may be cured at temperature equal to or above 100, 120 or 150 degrees Celsius.

Figure 25A:
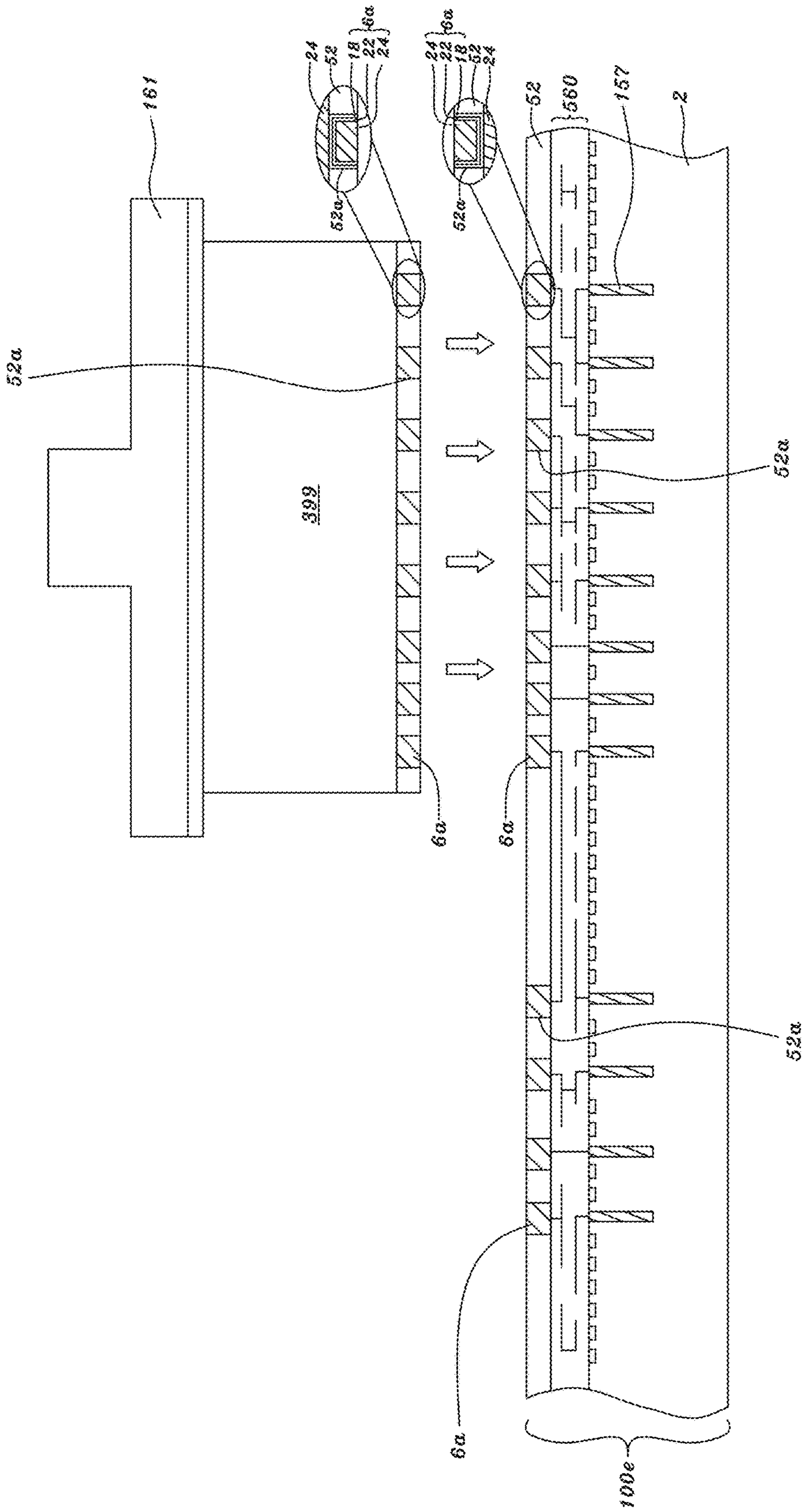
Figure 25B:
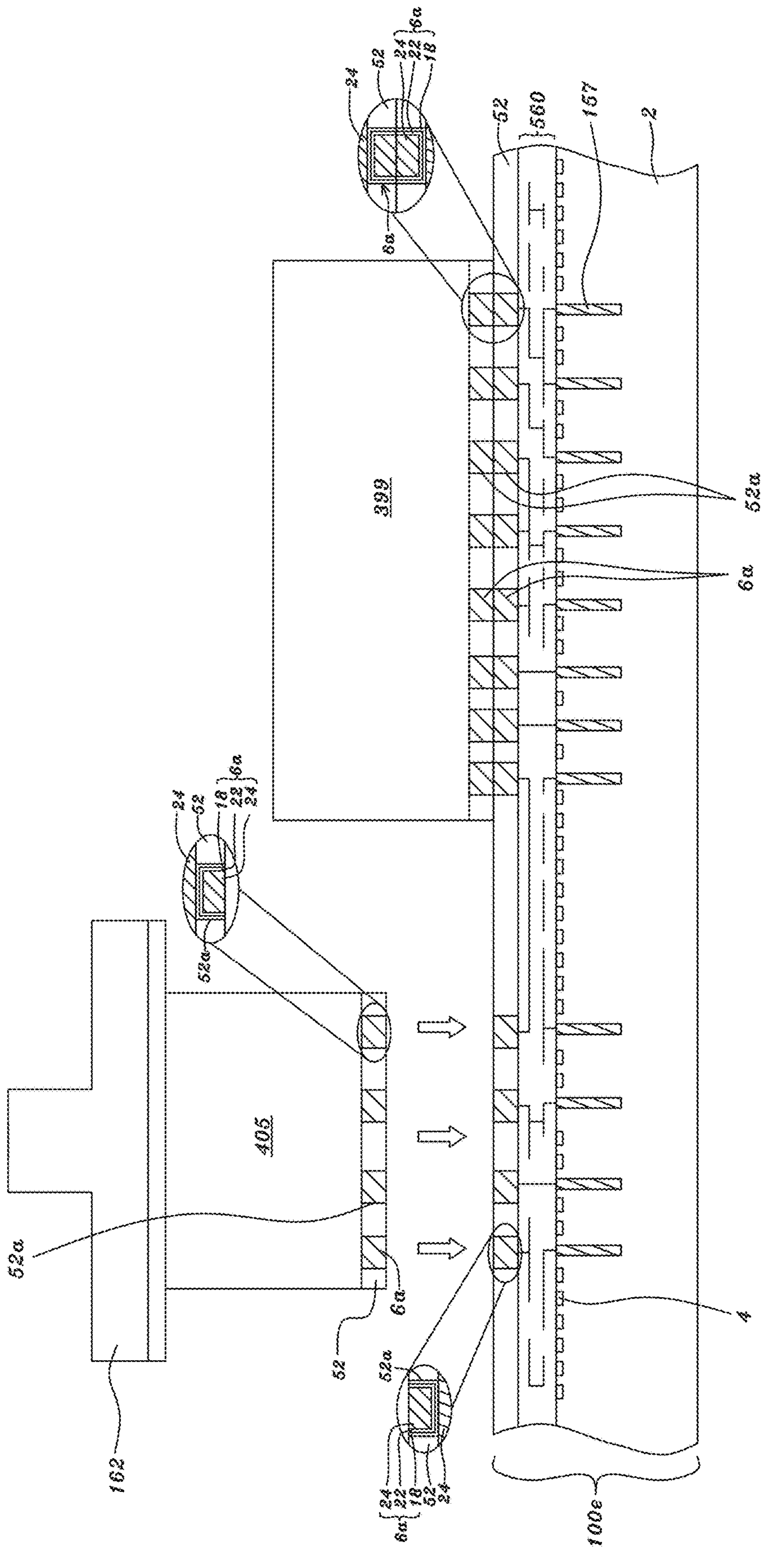
Figure 25C:
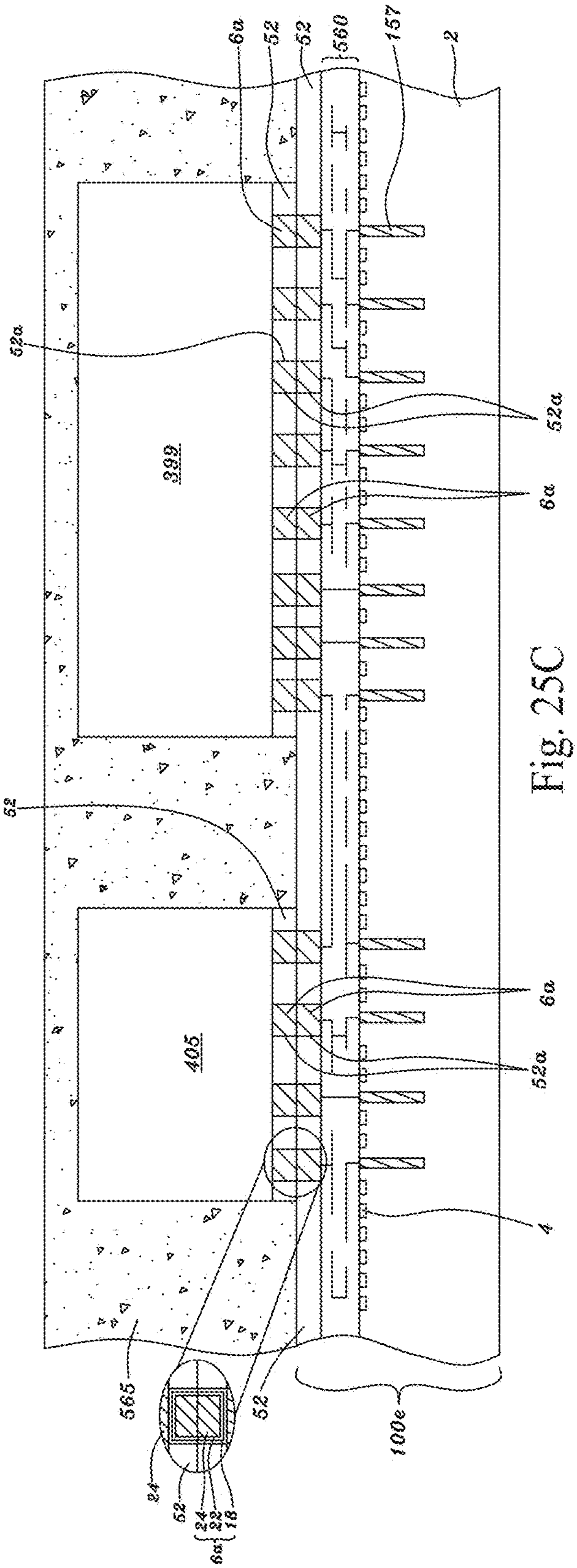

Alternatively, FIGS. 25A-25G are schematically cross-sectional views showing another process for fabricating another second type of operation module in accordance with an embodiment of the present application. Referring to FIGS. 25A-25C, a semiconductor wafer 100*e* may be provided at an active side thereof with the insulating bonding layer 52 and metal pads 6*a* as illustrated in FIG. 17E. Each of known-good application specific integrated-circuit (ASIC) logic chips 399 (only one is shown), such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, may have the structure as illustrated in FIG. 17D provided at the active side thereof with the insulating bonding layer 52 to be bonded to the insulating bonding layer 52 of the semiconductor wafer 100*e* and the metal pads 6*a* to be bonded to the metal pads 6*a* of the semiconductor wafer 100*e*. Each of known-good semiconductor chips 405 (only one is shown) such as application specific integrated-circuit (ASIC) chips may have analog circuits, mixed-mode signal circuits, radio-frequency (RF) circuits, transmitter, receiver or transceiver therein and have the structure as illustrated in FIG. 17D provided at the active side thereof with the insulating bonding layer 52 to be bonded to the insulating bonding layer 52 of the semiconductor wafer 100*e* and the metal pads 6*a* to be bonded to the metal pads 6*a* of the semiconductor wafer 100*e*.

Referring to FIGS. 25A-25C, before the known-good application specific integrated-circuit (ASIC) logic chips 399 and known-good semiconductor chips 405 join the semiconductor wafer 100*e*, a joining surface, i.e., silicon oxide, of the insulating bonding layer 52 at the active side of the semiconductor wafer 100*e* may be activated with nitrogen plasma for increasing a hydrophilic property thereof, and then the joining surface of the insulating bonding layer 52 at the active side of the semiconductor wafer 100*e* may be rinsed with deionized water for water adsorption and cleaning. Further, a joining surface, i.e., silicon oxide, of the insulating bonding layer 52 at the active side of each of the known-good application specific integrated-circuit (ASIC) logic chips 399, the backside of which may be attached to a temporary substrate (not shown) in advance, and a joining surface, i.e., silicon oxide, of the insulating bonding layer 52 at the active side of each of the known-good semiconductor chips 405, the backside of which may be attached to a temporary substrate in advance, may be activated with nitrogen plasma for increasing a hydrophilic property thereof, and then the joining surface of the insulating bonding layer 52 at the active side of each of the known-good application specific integrated-circuit (ASIC) logic chips 399 and the joining surface of the insulating bonding layer 52 at the active side of each of the known-good semiconductor chips 405 may be rinsed with deionized water for water adsorption and cleaning. Next, each of the known-good application specific integrated-circuit (ASIC) logic chips 399 and known-good semiconductor chips 405 may be released from the temporary substrate(s).

Next, referring to FIGS. 25A-25C, the known-good application specific integrated-circuit (ASIC) logic chips 399 and known-good semiconductor chips 405 may join the semiconductor wafer 100*e* by (1) picking up, by a bonding head 161, each of the known-good application specific integrated-circuit (ASIC) logic chips 399 to be placed on the semiconductor wafer 100*e* with each of the metal pads 6*a* at the active side of each of the known-good application specific integrated-circuit (ASIC) logic chips 399 in contact with one of the metal pads 6*a* at the active side of the semiconductor wafer 100*e* and with the joining surface of the insulating bonding layer 52 at the active side of each of the known-good application specific integrated-circuit (ASIC) logic chips 399 in contact with the joining surface of the insulating bonding layer 52 at the active side of the semiconductor wafer 100*e*, (2) picking up, by a bonding head 162, each of the known-good semiconductor chips 405 to be placed on the semiconductor wafer 100*e* with each of the metal pads 6*a* at the active side of each of the known-good semiconductor chips 405 in contact with one of the metal pads 6*a* at the active side of the semiconductor wafer 100*e* and with the joining surface of the insulating bonding layer 52 at the active side of each of the known-good semiconductor chips 405 in contact with the joining surface of the insulating bonding layer 52 at the active side of the semiconductor wafer 100*e*, and (3) next performing a direct bonding process including (a) oxide-to-oxide bonding at a temperature between 100 and 200 degrees Celsius and for a time period between 5 and 20 minutes to bond the joining surface of the insulating bonding layer 52 at the active side of each of the known-good application specific integrated-circuit (ASIC) logic chips 399 and known-good semiconductor chips 405 to the joining surface of the insulating bonding layer 52 at the active side of the semiconductor wafer 100*e* and (b) copper-to-copper bonding at a temperature between 300 and 350 degrees Celsius and for a time period between 10 and 60 minutes to bond the copper layer 24 of each of the metal pads 6*a* at the active side of each of the known-good application specific integrated-circuit (ASIC) logic chips 399 and known-good semiconductor chips 405 to the copper layer 24 of one of the metal pads 6*a* at the active side of the semiconductor wafer 100*e*, wherein the oxide-to-oxide bonding may be caused by water desorption from reaction between the joining surface of the insulating bonding layer 52 at the active side of each of the known-good application specific integrated-circuit (ASIC) logic chips 399 and known-good semiconductor chips 405 and the joining surface of the insulating bonding layer 52 at the active side of the semiconductor wafer 100*e*, and the copper-to-copper bonding may be caused by metal inter-diffusion between the copper layer 24 of the metal pads 6*a* at the active side of each of the known-good application specific integrated-circuit (ASIC) logic chips 399 and known-good semiconductor chips 405 and the copper layer 24 of the metal pads 6*a* at the active side of the semiconductor wafer 100*e*.

Next, referring to FIGS. 24C and 25C, a polymer layer 565, e.g., resin or compound, may be applied to fill a gap between each neighboring two of the known-good application specific integrated-circuit (ASIC) logic chips 399 and known-good semiconductor chips 405 and to cover a backside of each of the known-good application specific integrated-circuit (ASIC) logic chips 399 and a backside of each of the known-good semiconductor chips 405 by methods, for example, spin-on coating, screen-printing, dispensing or molding. The polymer layer 565 may be, for example, polyimide, BenzoCycloButene (BCB), parylene, epoxy-based material or compound, photo epoxy SU-8, elastomer, or silicone. The polymer layer 565 may be cured or cross-linked at a temperature higher than or equal to 50, 70, 90, 100, 125, 150, 175, 200, 225, 250, 275 or 300 degrees Celsius.

Figure 24D:
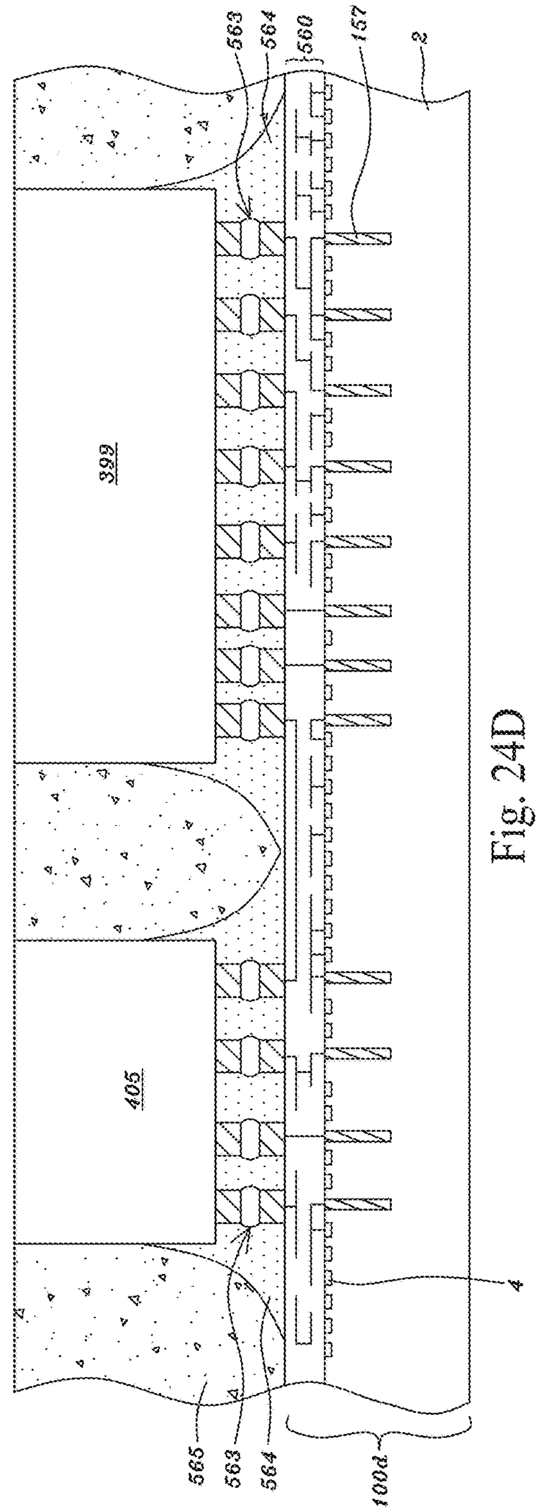
Figure 25D:
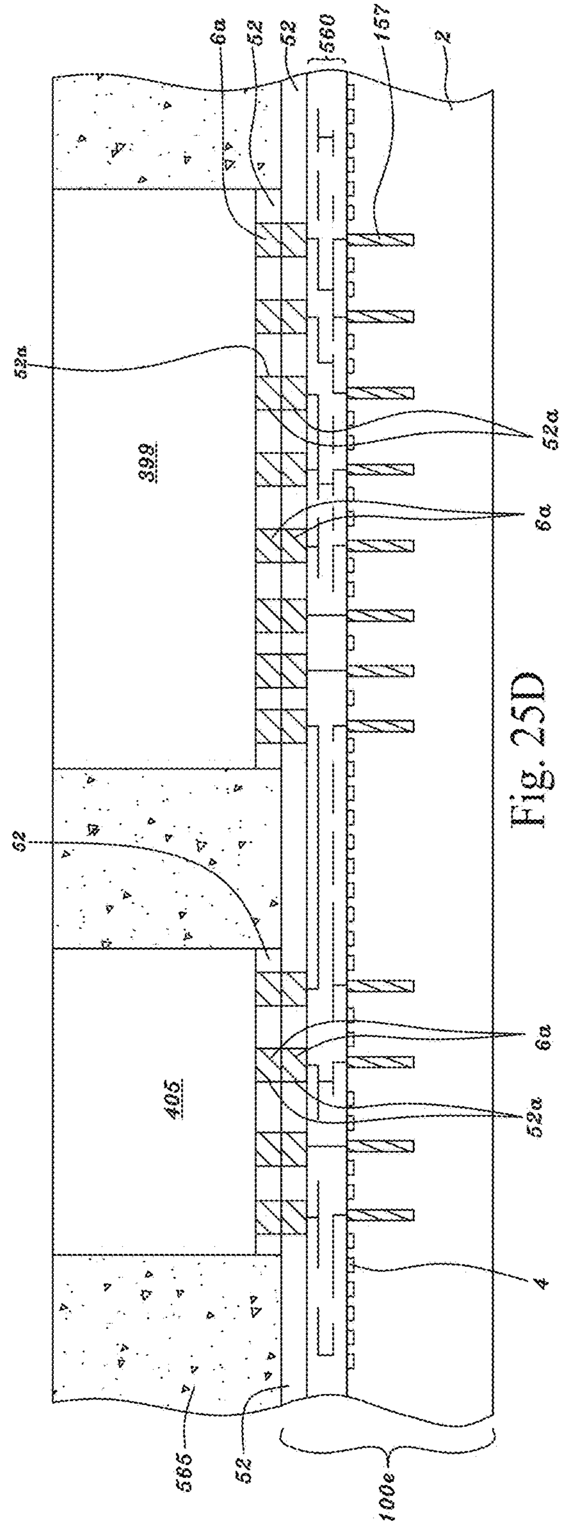

Next, referring to FIGS. 24D and 25D, a chemical mechanical polishing (CMP), polishing or grinding process may be applied to remove a top portion of the polymer layer 565, a top portion of each of the known-good application specific integrated-circuit (ASIC) logic chips 399 and a top portion of each of the known-good semiconductor chips 405 to planarize a top surface of the polymer layer 565, a top surface of each of the known-good application specific integrated-circuit (ASIC) logic chips 399 and a top surface of each of the known-good semiconductor chips 405 and to expose the top surface of each of the known-good application specific integrated-circuit (ASIC) logic chips 399 and the top surface of each of the known-good semiconductor chips 405.

Figure 24E:
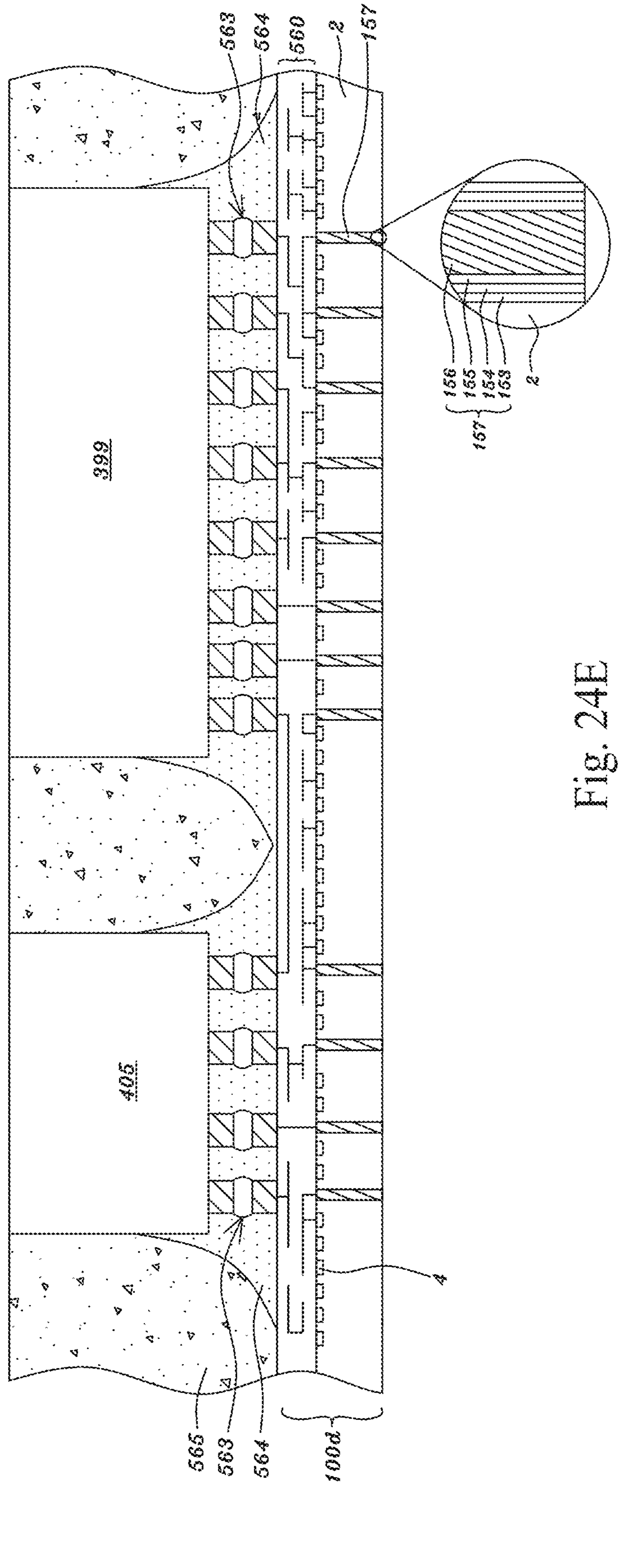
Figure 25E:
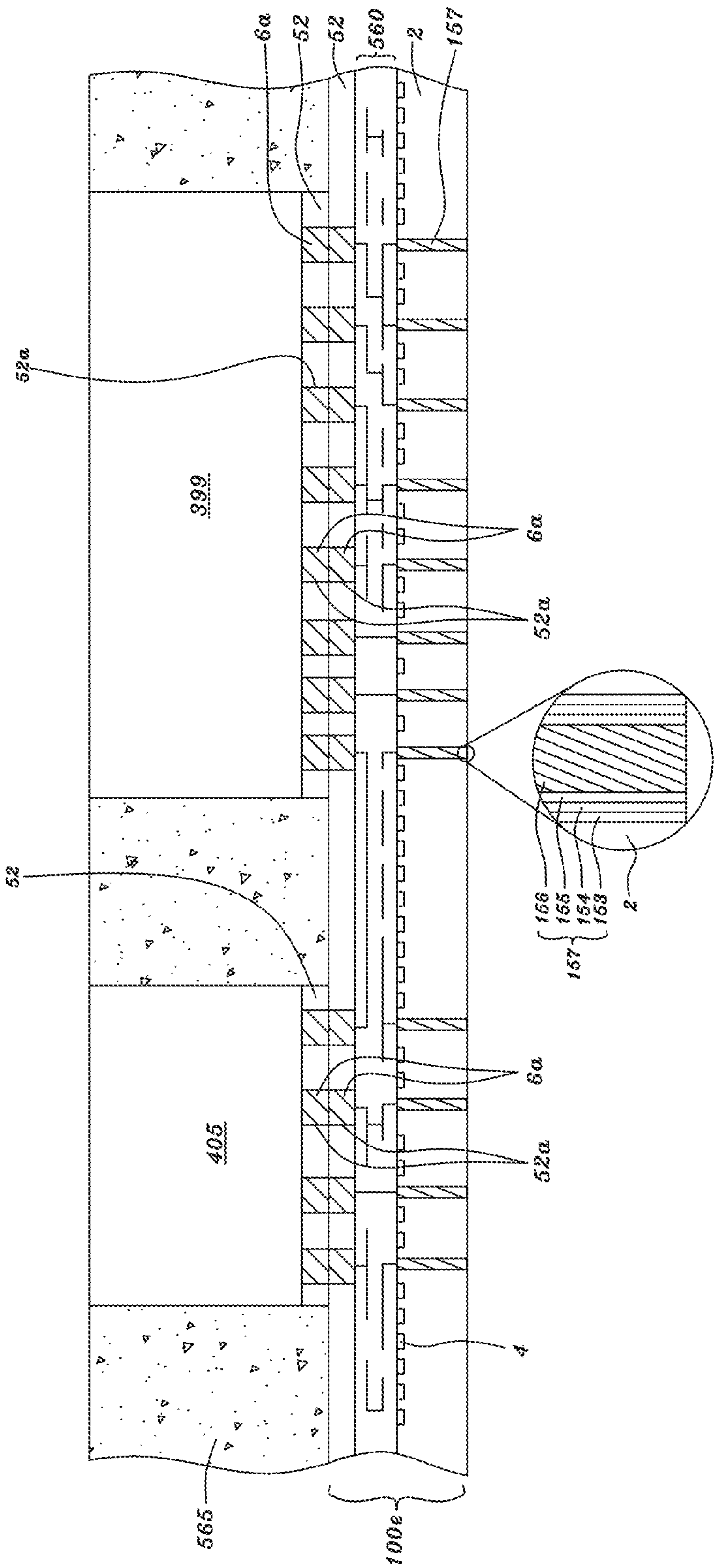

Next, referring to FIGS. 24E and 25E, a chemical mechanical polishing (CMP), polishing or grinding process may be applied to remove a bottom portion of the semiconductor wafer 100*d* or 100*e* and to expose a backside of the copper layer 156 of each of the through silicon vias (TSVs) 157 of the semiconductor wafer 100*d* or 100*e*. For each of the through silicon vias (TSVs) 157, its insulating lining layer 153 at its backside is removed to be formed into an insulating lining surrounding its adhesion layer 154, seed layer 155 and copper layer 156, and a backside of its copper layer 156 is exposed.

Figure 24F:
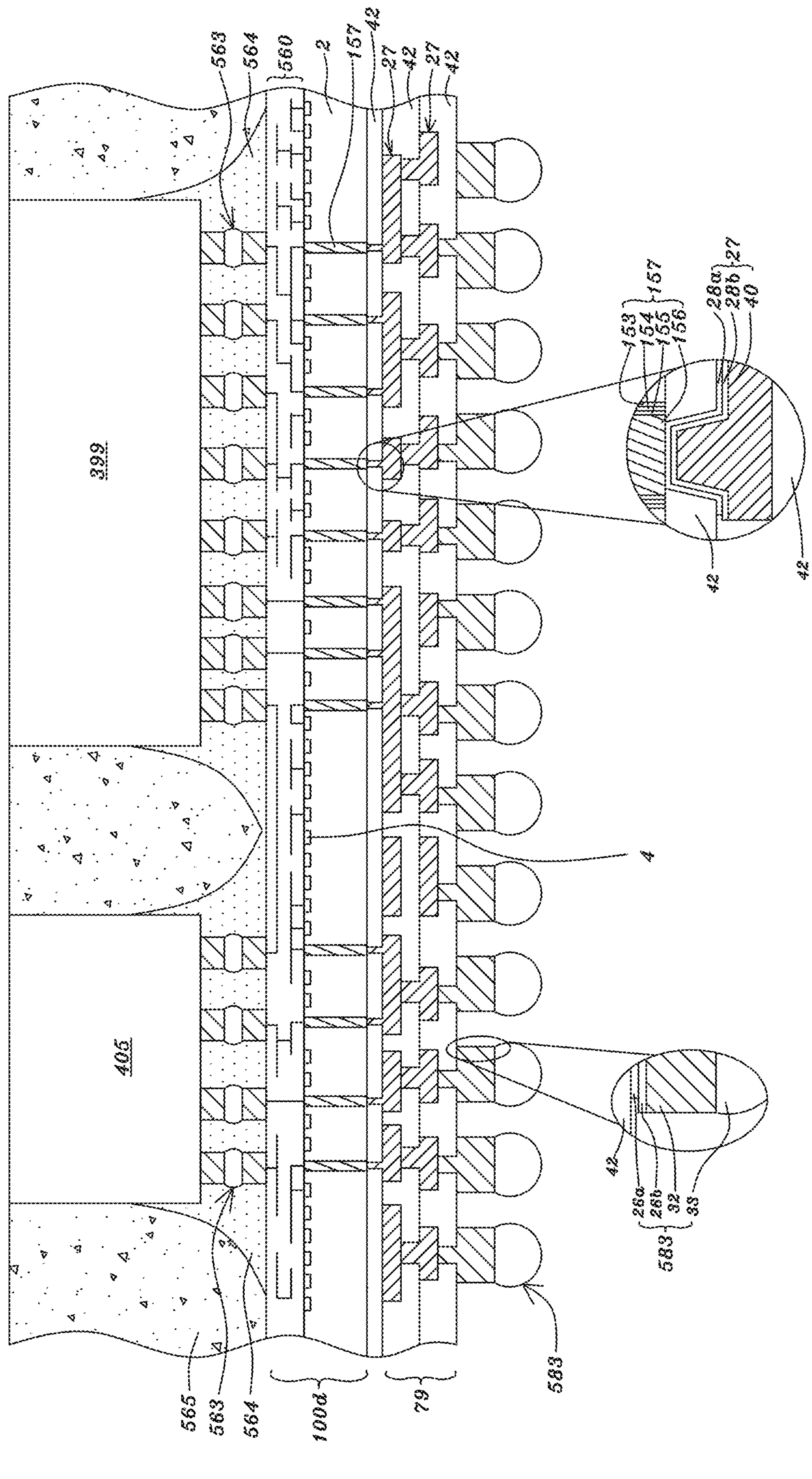
Figure 25F:
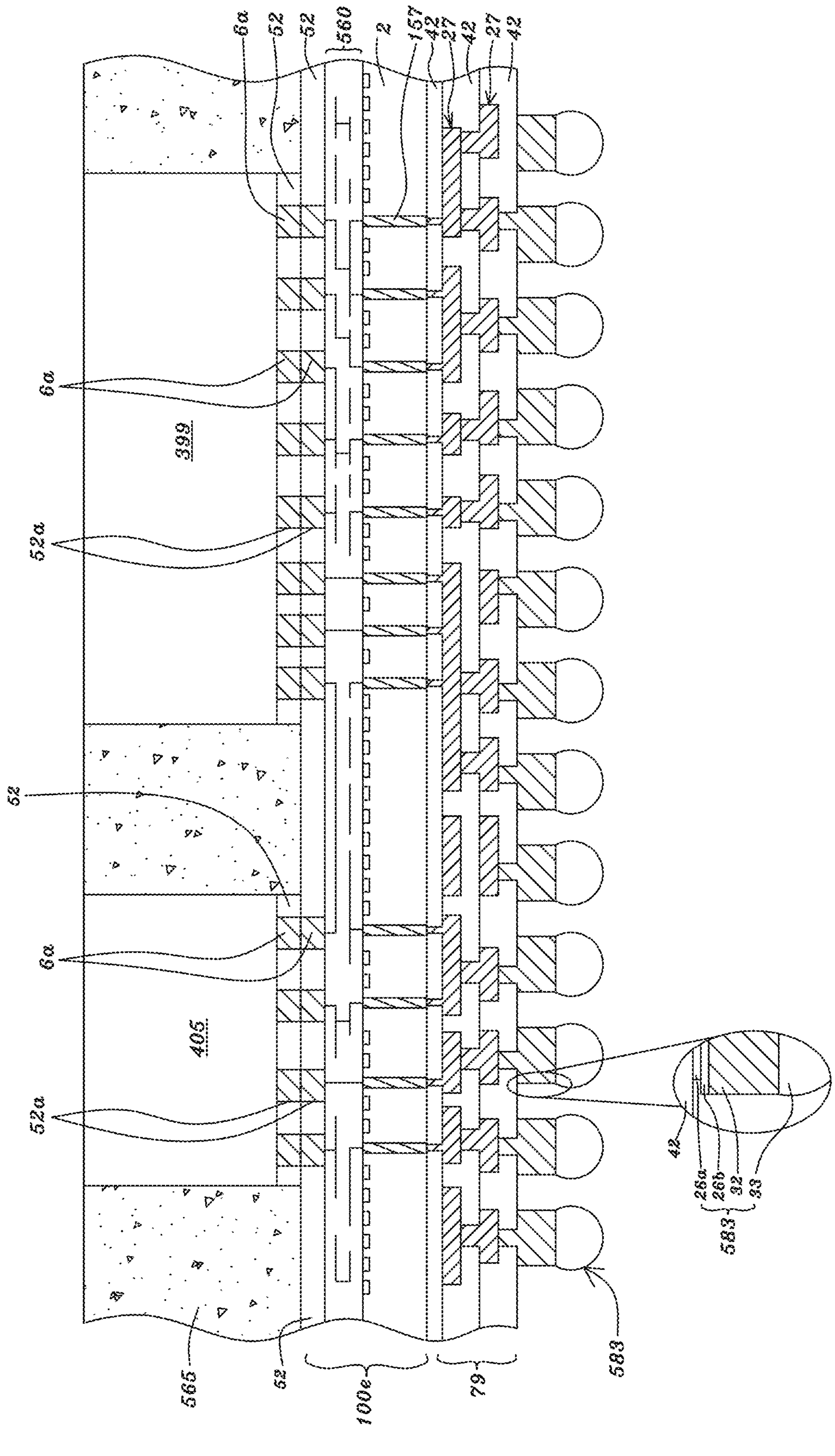

Next, referring to FIGS. 24F and 25F, a backside interconnection scheme 79 for a device (BISD) may be formed on a backside of the semiconductor wafer 100*d* or 100*e*. The backside interconnection scheme 79 may include one or more interconnection metal layers 27 coupling to the through silicon vias (TSVs) 157 of the semiconductor wafer 100*c* or 100*e* and one or more polymer layers 42, i.e., insulating dielectric layers, each between neighboring two of its interconnection metal layers 27, between a topmost one of its interconnection metal layers 27 and a bottom surface of the semiconductor wafer 100*c* or 100*e* or on and under a bottommost one of its interconnection metal layers 27, wherein the bottommost one of its interconnection metal layers 27 may have multiple metal pads at tops of multiple openings 42*a* in the bottommost one of its polymer layers 42. Each of the interconnection metal layers 27 may include (1) a copper layer 40 having upper portions in openings in one of the polymer layers 42 having a thickness of between 0.3 μm and 20 μm and lower portions having a thickness 0.3 μm and 20 μm under said one of the polymer layers 42, (2) an adhesion layer 28*a*, such as titanium or titanium nitride having a thickness of between 1 nm and 50 nm, at a top and sidewall of each of the upper portions of the copper layer 40 and at a top of each of the lower portions of the copper layer 40, and (3) a seed layer 28*b*, such as copper, between the copper layer 40 and the adhesion layer 28*a*, wherein said each of the lower portions of the copper layer 40 may have a sidewall not covered by the adhesion layer 28*a*. Each of the interconnection metal layers 27 and polymer layer 42 of the backside interconnection scheme 79 may have the same specifications as that as illustrated in FIGS. 21E and 23E.

Next, referring to FIGS. 24F and 25F, multiple metal bumps 583, which may be of one of the first through fourth types having the same specifications as the first through fourth types of micro-bumps or micro-pillars 34 as illustrated in FIG. 1F respectively, may be formed on the metal pads of the bottommost one of the interconnection metal layers 27 of the backside interconnection scheme 79 at the tops of the openings 42*a* in the bottommost one of its polymer layers 42.

Figure 24G:
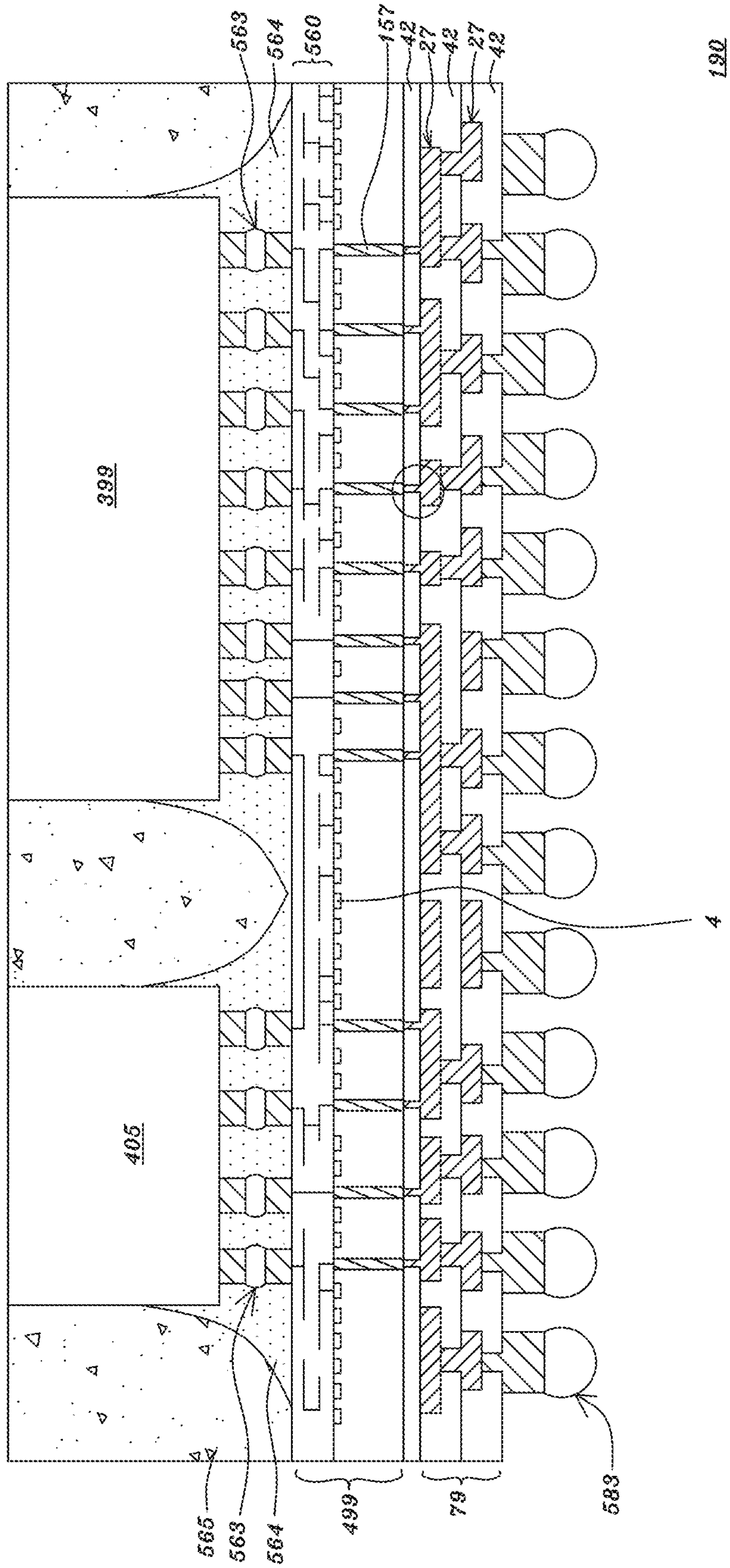
Figure 25G:
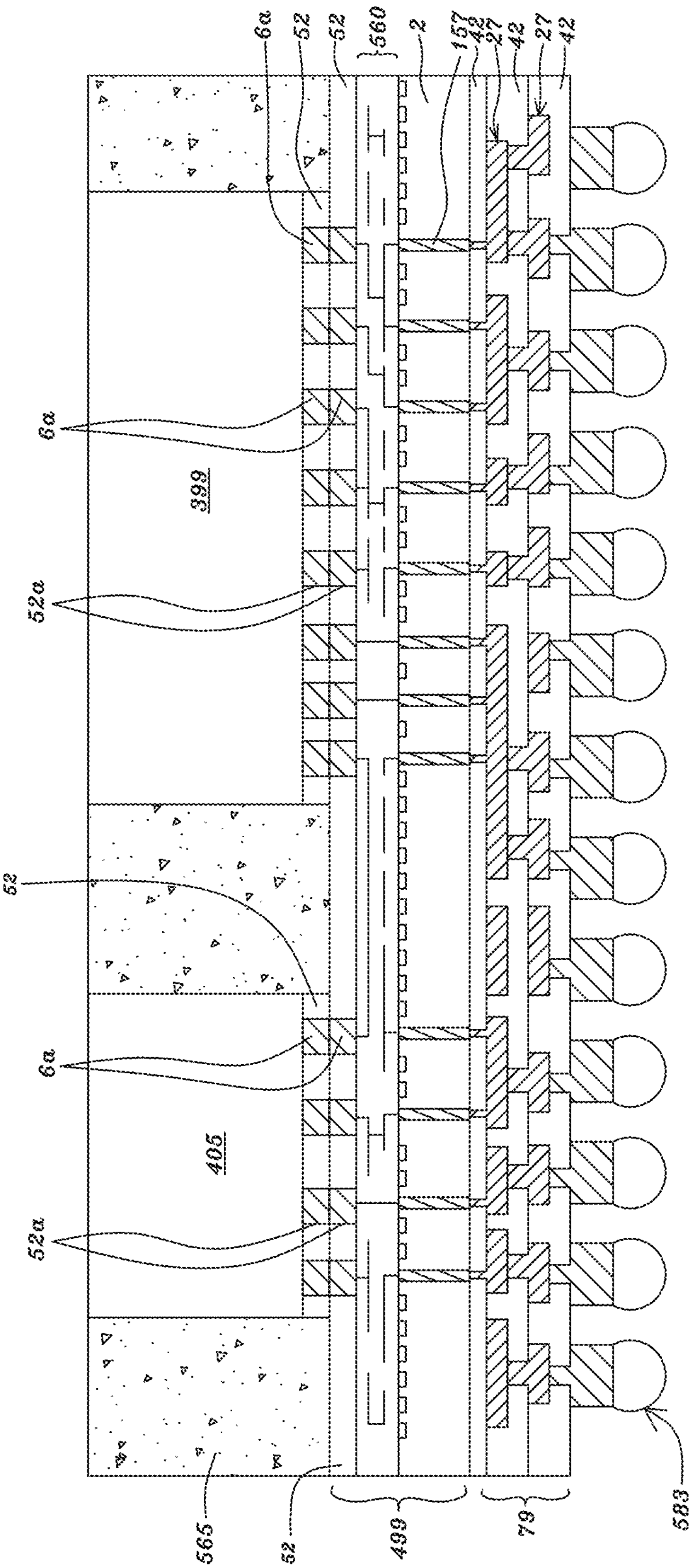

Next, referring to FIGS. 24F and 25F, the semiconductor wafer 100*d* or 100*e*, polymer layer 565 and polymer layers 42 of the backside interconnection scheme 79 may be cut or diced to form multiple second type of operation modules 190 or chip scale packages (CSP) as shown in FIG. 24G or 25G by a laser cutting process or by a mechanical cutting process. At this time, the semiconductor wafer 100*d* or 100*e* may be cut or diced into multiple semiconductor chips 499 that may be memory chips, such as high-bit-width memory chip, DRAM IC chip, SRAM IC chip, MRAM IC chip, RRAM IC chip or PCM IC chip or FRAM IC chip having the first and/or second interconnection scheme(s) 560 and/or 588 and the through silicon vias (TSVs) 157 as illustrated in FIG. 17B. Alternatively, for each of the operation modules 190 (only one is shown), its semiconductor chip 499 may be a logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip having the first and/or second interconnection scheme(s) 560 and/or 588 and the through silicon vias (TSVs) 157 as illustrated in FIG. 17B. Alternatively, its semiconductor chip 499 may be an application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B having the first and/or second interconnection scheme(s) 560 and/or 588 and the through silicon vias (TSVs) 157 as illustrated in FIG. 17B. For the second type of operation module 190 as seen in FIG. 24F or 25F, its semiconductor chip 499 may have the semiconductor devices 4 such as transistors at the active surface of the semiconductor substrate 2 thereof as illustrated in FIG. 17B or 17E respectively. The active surface of the semiconductor substrate 2 of its semiconductor chip 499 may face an active surface of the semiconductor substrate 2 of its known-good application specific integrated-circuit (ASIC) logic chips 399, wherein its known-good application specific integrated-circuit (ASIC) logic chips 399 may have the semiconductor devices 4 such as transistors at the active surface of the semiconductor substrate 2 thereof as illustrated in FIG. 17A or 17D respectively. The active surface of the semiconductor substrate 2 of its semiconductor chip 499 may face an active surface of the semiconductor substrate 2 of its known-good semiconductor chip 405, wherein its known-good semiconductor chip 405 may have the semiconductor devices 4 such as transistors at the active surface of the semiconductor substrate 2 thereof as illustrated in FIG. 17A or 17D respectively.

Further, for the second type of operation module 190 as seen in FIG. 24F or 25F, its known-good application specific integrated-circuit (ASIC) logic chips 399 may have a large input/output (I/O) circuit coupling to one of its metal bumps 583 for signal transmission or power or ground delivery through, in sequence, one of multiple dedicated vertical bypasses each provided from one of the through silicon vias (TSVs) 157 of its semiconductor chip 499 and the interconnection metal layers 27 of its backside interconnection scheme 79, wherein said one of the dedicated vertical bypasses is not connected to any transistor in its semiconductor chip 499, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example.

Referring to FIG. 24G or 25G, for the second type of operation module 190, its memory or logic chip or ASIC chip 499 may have multiple small I/O circuits coupling respectively to multiple small I/O circuits of its known-good application specific integrated-circuit (ASIC) chip 399 through its bonded contacts 563 therebetween as seen in FIG. 24G or the bonded metal pads 6*a* of its memory or logic chip or ASIC chip 499 and known-good application specific integrated-circuit (ASIC) chip 399 as seen in FIG. 25G for data transmission with a data bit width of equal to or greater than 64, 128, 256, 512, 1024, 2048, 4096, 8K, or 16K, wherein each of the small I/O circuits of its memory or logic chip or ASIC chip 499 and known-good application specific integrated-circuit (ASIC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Further, its memory or logic chip or ASIC chip 499 may have a large input/output (I/O) circuit coupling to one of its metal bumps 583 for signal transmission or power or ground delivery through the interconnection metal layers 27 of its backside interconnection scheme 79, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Further, its memory or logic chip or ASIC chip 499 may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of its known-good application specific integrated-circuit (ASIC) logic chip 399 or the memory cells 362 of the programmable switch cells 379 of its known-good application specific integrated-circuit (ASIC) logic chip 399 as encrypted CPM data to be passed to the metal bumps 583 and (2) to decrypt, in accordance with the password or key, encrypted CPM data from the metal bumps 583 as decrypted CPM data to be passed to the memory cells 490 for the look-up tables (LUT) 210 of the programmable logic cells (LC) 2014 of its known-good application specific integrated-circuit (ASIC) logic chip 399 or the memory cells 362 of the programmable switch cells 379 of its known-good application specific integrated-circuit (ASIC) logic chip 399. Further, its memory or logic chip or ASIC chip 499 may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its known-good application specific integrated-circuit (ASIC) logic chip 399. Further, its memory or logic chip or ASIC chip 499 may include multiple non-volatile memory cells, such as NAND memory cells, NOR memory cells, RARM cells, MRAM cells, FRAM cells or PCM cells, configured to store CPM data to be passed to the memory cells 490 for the look-up tables (LUT) 210 of the programmable logic cells (LC) 2014 of its known-good application specific integrated-circuit (ASIC) logic chip 399 for programming or configuring the programmable logic cells (LC) 2014 of its known-good application specific integrated-circuit (ASIC) logic chip 399 or to the memory cells 362 of the programmable switch cells 379 of its known-good application specific integrated-circuit (ASIC) logic chip 399 for programming or configuring the programmable switch cells 379 of its known-good application specific integrated-circuit (ASIC) logic chip 399.

Referring to FIGS. 24G and 25G, for the second type of operation module 190, its memory or logic chip or ASIC chip 499 may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in its memory or logic chip or ASIC chip 499 may be 1, 2, 3, 4, 5 or greater than 5 nodes or generations older, more matured or less advanced than that used in its known-good application specific integrated-circuit (ASIC) logic chip 399. Transistors used in its memory or logic chip or ASIC chip 499 may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in its memory or logic chip or ASIC chip 499 may be different from that used in its known-good application specific integrated-circuit (ASIC) logic chip 399; its memory or logic chip or ASIC chip 499 may use planar MOSFETs, while its known-good application specific integrated-circuit (ASIC) logic chip 399 may use fin field effect transistors (FINFETs) or gate-all-around field effect transistors (GAAFETs). A power supply voltage (Vcc) applied in its memory or logic chip or ASIC chip 499 may be greater than or equal to 1.5, 2.0, 2.5, 3, 3.3, 4, or 5 voltages, while a power supply voltage (Vcc) applied in its known-good application specific integrated-circuit (ASIC) logic chip 399 may be smaller than or equal to 1.8, 1.5 or 1 voltage. The power supply voltage applied in its memory or logic chip or ASIC chip 499 may be higher than that applied in its known-good application specific integrated-circuit (ASIC) logic chip 399. A gate oxide of a field effect transistor (FET) of its memory or logic chip or ASIC chip 499 may have a physical thickness greater than or equal to 5 nm, 6 nm, 7.5 nm, 10 nm, 12.5 nm, or 15 nm, while a gate oxide of a field effect transistor (FET) of its known-good application specific integrated-circuit (ASIC) logic chip 399 may have a physical thickness less than 4.5 nm, 4 nm, 3 nm or 2 nm. The thickness of the gate oxide of the field effect transistor (FET) of its memory or logic chip or ASIC chip 499 may be greater than that of its known-good application specific integrated-circuit (ASIC) logic chip 399.

Figure 24H:
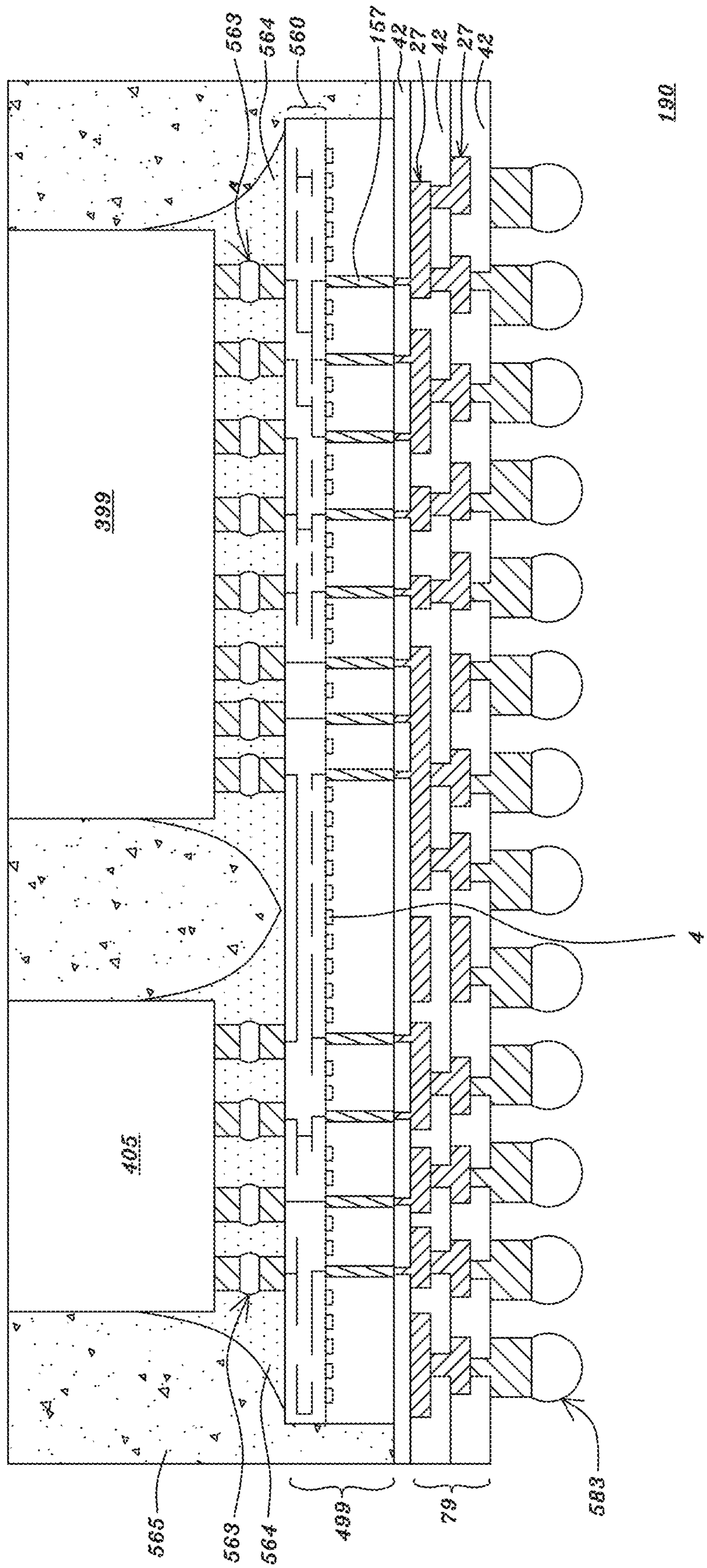
Figure 25H:
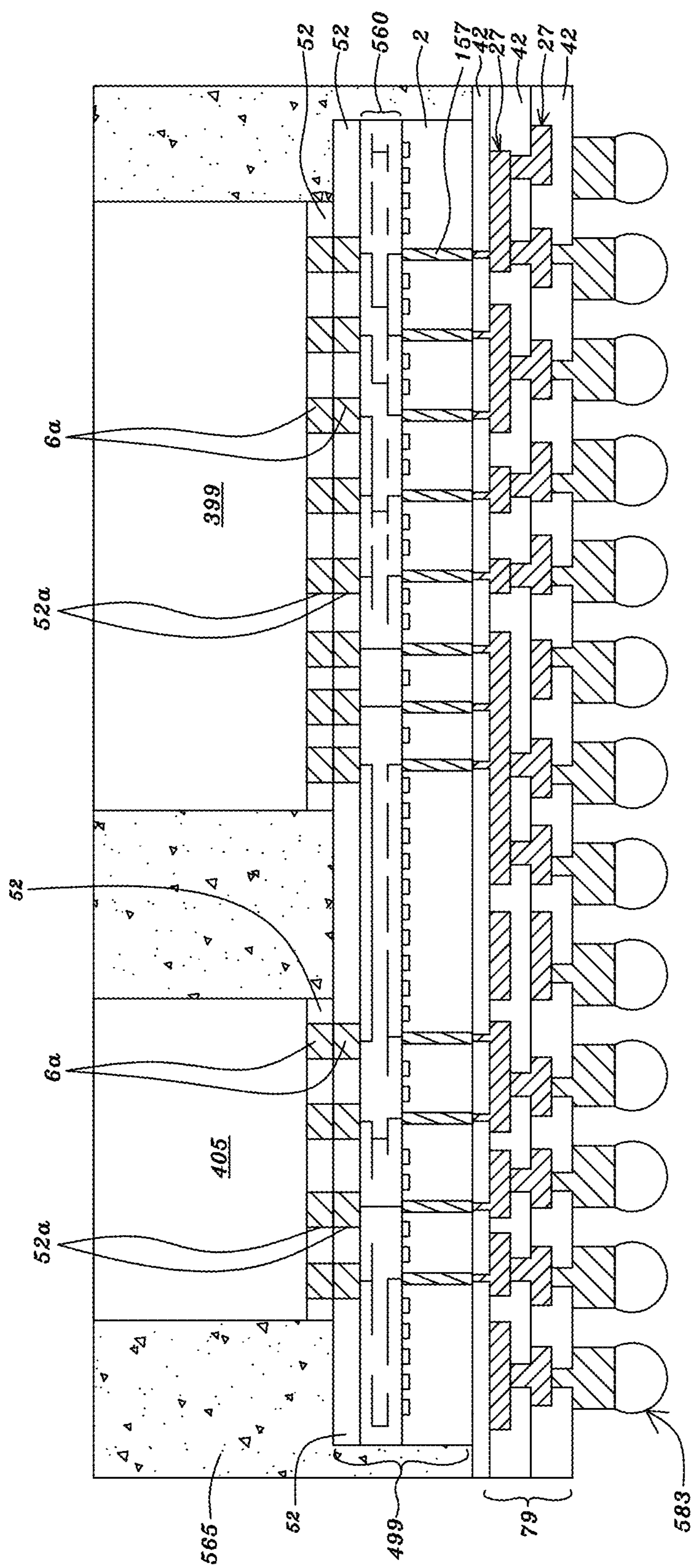

Alternatively, FIGS. 24H and 25H are schematically cross-sectional views showing various second type of operation modules in accordance with an embodiment of the present application. For an element indicated by the same reference number shown in FIG. 22A, 22B or 24A-24H, the specification of the element as seen in FIG. 24H may be referred to that of the element as illustrated in FIG. 22A, 22B or 24A-24G. Referring to FIG. 24H, the semiconductor wafer 100*d* as seen in FIG. 24A may be cut or diced into multiple semiconductor chips 499 (only one is shown) having the first and/or second interconnection scheme(s) 560 and/or 588 and the through silicon vias (TSVs) 157 as illustrated in FIG. 17B, in which known-good ones may have backsides to be attached to a temporary substrate. Each of the known-good semiconductor chips 499 may be (1) a memory chip such as high-bitwidth memory (HBM) IC chip, DRAM IC chip, SRAM IC chip, MRAM IC chip, RRAM IC chip, PCM IC chip or FRAM IC chip, (2) a logic chip such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip, or (3) an application-specific-integrated-circuit (ASIC) chip such as auxiliary and supporting (AS) integrated-circuit (IC) chip 411, dedicated I/O chip 265 or dedicated control and I/O chip 260 as illustrated in FIGS. 13, 14A and 14B. Next, each of the known-good application specific integrated-circuit (ASIC) logic chips 399 (only one is shown) may be held by the bonding head 161 as seen in FIG. 24A to have its first, second or third type of micro-bumps or micro-pillars 34 to be bonded to the first, second or fourth type of micro-bumps or micro-pillars 34 preformed at the active side of the known-good semiconductor chips 499 into multiple bonded contacts 563 respectively therebetween. Furthermore, each of the known-good semiconductor chips 405 (only one is shown) may be held by the bonding head 162 as seen in FIG. 24B to have its first, second or third type of micro-bumps or micro-pillars 34 to be bonded to the first, second or fourth type of micro-bumps or micro-pillars 34 preformed at the active sides of the known-good semiconductor chips 499 into multiple bonded contacts 563 respectively therebetween. Next, the underfill 564 may be filled into a gap between each of the known-good application specific integrated-circuit (ASIC) logic chips 399 and one of the known-good semiconductor chips 499 to enclose the bonded contacts 563 therebetween and into a gap between each of the known-good semiconductor chips 405 and one of the known-good semiconductor chips 499 to enclose the bonded contacts 563 therebetween.

Alternatively, referring to FIG. 25H, the semiconductor wafer 100*e* as seen in FIG. 25A may be cut or diced into multiple semiconductor chips 499 (only one is shown) having the first and/or second interconnection scheme(s) 560 and/or 588 and the through silicon vias (TSVs) 157 as illustrated in FIG. 17E, in which known-good ones may have backsides to be attached to a temporary substrate. Each of the known-good semiconductor chips 499 may be (1) a memory chip such as high-bitwidth memory (HBM) IC chip, DRAM IC chip, SRAM IC chip, MRAM IC chip, RRAM IC chip, PCM IC chip or FRAM IC chip, (2) a logic chip such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip, or (3) an application-specific-integrated-circuit (ASIC) chip such as auxiliary and supporting (AS) integrated-circuit (IC) chip 411, dedicated I/O chip 265 or dedicated control and I/O chip 260 as illustrated in FIGS. 13, 14A and 14B. A joining surface, i.e., silicon oxide, of the insulating bonding layer 52 at the active side of each of the known-good semiconductor chips 499 may be activated with nitrogen plasma for increasing a hydrophilic property thereof, and then the joining surface of the insulating bonding layer 52 at the active side of each of the known-good semiconductor chips 499 may be rinsed with deionized water for water adsorption and cleaning. Next, referring to FIGS. 25A-25C, each of the known-good application specific integrated-circuit (ASIC) logic chips 399 and each of the known-good semiconductor chips 405 may join one of the known-good semiconductor chips 499 by (1) picking up, by a bonding head 161, said each of the known-good application specific integrated-circuit (ASIC) logic chips 399 to be placed on said one of the known-good semiconductor chips 499 with each of the metal pads 6*a* at the active side of said each of the known-good application specific integrated-circuit (ASIC) logic chips 399 in contact with one of the metal pads 6*a* at the active side of said one of the known-good semiconductor chips 499 and with the joining surface of the insulating bonding layer 52 at the active side of said each of the known-good application specific integrated-circuit (ASIC) logic chips 399 in contact with the joining surface of the insulating bonding layer 52 at the active side of said one of the known-good semiconductor chips 499, (2) picking up, by a bonding head 162, said each of the known-good semiconductor chips 405 to be placed on said one of the known-good semiconductor chips 499 with each of the metal pads 6*a* at the active side of said each of the known-good semiconductor chips 405 in contact with one of the metal pads 6*a* at the active side of said one of the known-good semiconductor chips 499 and with the joining surface of the insulating bonding layer 52 at the active side of said each of the known-good semiconductor chips 405 in contact with the joining surface of the insulating bonding layer 52 at the active side of said one of the known-good semiconductor chips 499, and (3) next performing a direct bonding process including (a) oxide-to-oxide bonding at a temperature between 100 and 200 degrees Celsius and for a time period between 5 and 20 minutes to bond the joining surface of the insulating bonding layer 52 at the active side of said each of the known-good application specific integrated-circuit (ASIC) logic chips 399 and the joining surface of the insulating bonding layer 52 at the active side of said each of the known-good semiconductor chips 405 to the joining surface of the insulating bonding layer 52 at the active side of said one of the known-good semiconductor chips 499 and (b) copper-to-copper bonding at a temperature between 300 and 350 degrees Celsius and for a time period between 10 and 60 minutes to bond the copper layer 24 of each of the metal pads 6*a* at the active side of said each of the known-good application specific integrated-circuit (ASIC) logic chips 399 to the copper layer 24 of one of the metal pads 6*a* at the active side of said one of the known-good semiconductor chips 499 and to bond the copper layer 24 of each of the metal pads 6*a* at the active side of said each of the known-good semiconductor chips 405 to the copper layer 24 of one of the metal pads 6*a* at the active side of said one of the known-good semiconductor chips 499, wherein the oxide-to-oxide bonding may be caused by water desorption from reaction between the joining surface of the insulating bonding layer 52 at the active side of said each of the known-good application specific integrated-circuit (ASIC) logic chips 399 and the joining surface of the insulating bonding layer 52 at the active side of said one of the known-good semiconductor chips 499 and between the joining surface of the insulating bonding layer 52 at the active side of said each of the known-good semiconductor chips 405 and the joining surface of the insulating bonding layer 52 at the active side of said one of the known-good semiconductor chips 499, and the copper-to-copper bonding may be caused by metal inter-diffusion between the copper layer 24 of the metal pads 6*a* at the active side of said each of the known-good application specific integrated-circuit (ASIC) logic chips 399 and the copper layer 24 of the metal pads 6*a* at the active side of said one of the known-good semiconductor chips 499 and between the copper layer 24 of the metal pads 6*a* at the active side of said each of the known-good semiconductor chips 405 and the copper layer 24 of the metal pads 6*a* at the active side of said one of the known-good semiconductor chips 499.

Next, referring to FIGS. 24H and 25H, the polymer layer 565 may be applied to fill a gap between each neighboring two of the known-good application specific integrated-circuit (ASIC) logic chips 399 and known-good semiconductor chips 405 and a gap between each neighboring two of the known-good semiconductor chips 499 on the temporary substrate and to cover a backside of each of the known-good application specific integrated-circuit (ASIC) logic chips 399 and a backside of each of the semiconductor chips 405. Next, the chemical mechanical polishing (CMP), polishing or grinding processes as illustrated in FIG. 24C or 25C may be performed. Next, the temporary substrate may be removed from the backsides of the semiconductor chips 499 and the polymer layer 565. Next, a chemical mechanical polishing (CMP), polishing or grinding process may be applied to remove a bottom portion of the known-good semiconductor chips 499 and a bottom portion of the polymer layer 565 and to expose a backside of the copper layer 156 of each of the through silicon vias (TSVs) 157 of each of the known-good semiconductor chips 499. For each of the through silicon vias (TSVs) 157, its insulating lining layer 153 at its backside is removed to be formed into an insulating lining surrounding its adhesion layer 154, seed layer 155 and copper layer 156, and a backside of its copper layer 156 is exposed. Next, the backside interconnection scheme 79 as illustrated in FIG. 24F or 25F may be formed on a backside of the known-good semiconductor chips 499 and on a bottom of the polymer layer 565. The backside interconnection scheme 79 may include one or more interconnection metal layers 27 coupling to the through silicon vias (TSVs) 157 of the known-good semiconductor chips 499 and one or more polymer layers 42, i.e., insulating dielectric layers, each between neighboring two of its interconnection metal layers 27, between a topmost one of its interconnection metal layers 27 and a polished planar surface composed of the backside of the known-good semiconductor chips 499 and the bottom surface of the polymer layer 565 or on and under a bottommost one of its interconnection metal layers 27, wherein the bottommost one of its interconnection metal layers 27 may have multiple metal pads at tops of multiple openings 42*a* in the bottommost one of its polymer layers 42. For the backside interconnection scheme 79, the specification of its interconnection metal layers 27 may be referred to that as illustrated in FIG. 24F or 25F. Next, the step of forming the metal bumps 583 as illustrated in FIG. 24F or 25F may be performed. Next, the polymer layer 565 and polymer layers 42 of the backside interconnection scheme 79 may be cut or diced to form multiple second type of operation modules 190 or chip scale packages (CSP) by a laser cutting process or by a mechanical cutting process. For the second type of operation module 190, its polymer layer 565 may cover sidewalls of its known-good semiconductor chips 499 and contact a top surface of the topmost one of the polymer layers 42 of its backside interconnection scheme 79.

Figure 24I:
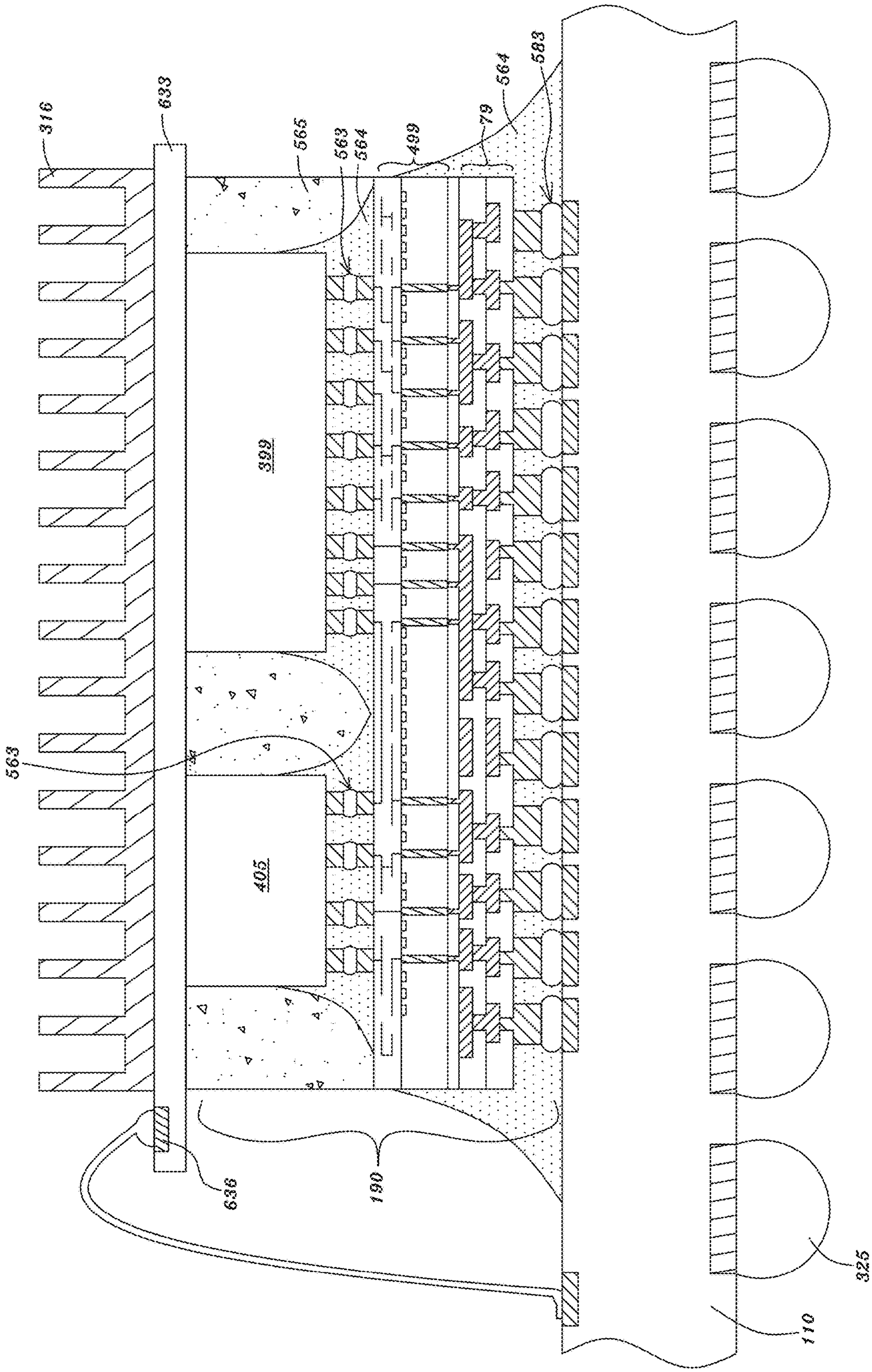
FIGS. 24I and 25I are schematically cross-sectional views showing various chip packages based on various second type of operation modules in accordance with an embodiment of the present application.
Figure 25I:
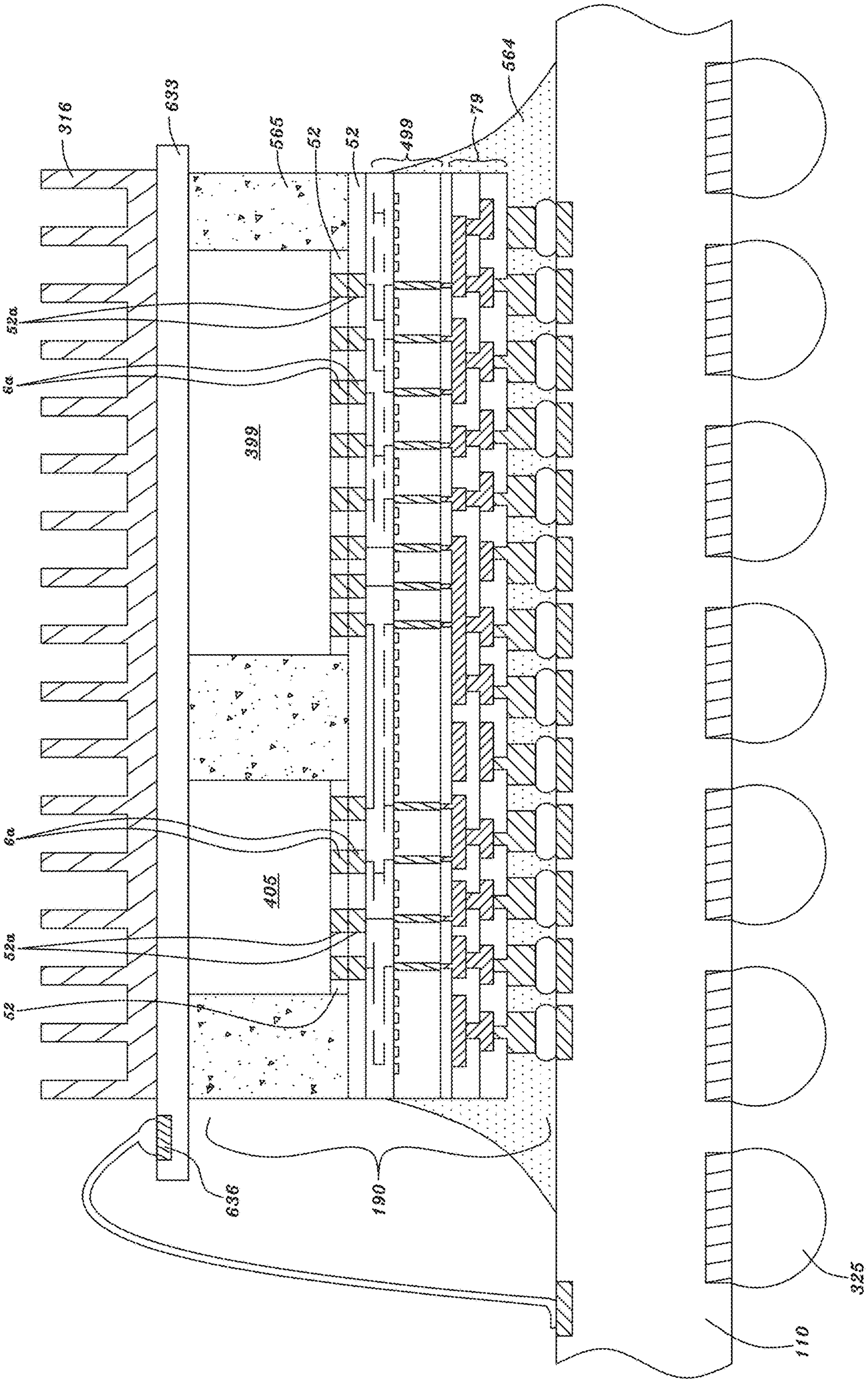

FIGS. 24I and 25I are schematically cross-sectional views showing various chip packages based on various second type of operation modules in accordance with an embodiment of the present application. Referring to FIGS. 24I and 25I, the second type of operation module 190 as illustrated in FIG. 24G, 24H, 25G or 25H may have the metal bumps 583 to be bonded to multiple metal pads of a circuit substrate 110, such as printed circuit board, ball-grid-array (BGA) substrate, flexible circuit film or tape, or ceramic circuit substrate, at a top side of the circuit substrate 110. The second type of operation module 190 as illustrated in FIG. 24G is taken as an example herein for the chip package shown in FIG. 24I. The second type of operation module 190 as illustrated in FIG. 25G is taken as an example herein for the chip package shown in FIG. 25I. Next, an underfill 564, such as epoxy resins or compounds, may be filled into a gap between the second type of operation module 190 and the circuit substrate 110 to enclose the metal bumps 583 therebetween. Next, a heat dissipation module having the thermoelectric (TE) cooler 633 as illustrated in FIG. 18A and a heat sink 316 attached to a hot side of its thermoelectric (TE) cooler 633 is provided to attach the cold side of its thermoelectric (TE) cooler 633 to the backsides of the known-good semiconductor chips 399 and 405 of the second type of operation module 190 as illustrated in FIG. 24G, 24H, 25G or 25H. Next, multiple wires 648 (only one is shown) may be provided each having a terminal bonded by a wirebonding process to the patterned circuit layer 636 of the thermoelectric (TE) cooler 633 as illustrated in FIG. 18A and another terminal bonded by the wirebonding process to another metal pad of the circuit substrate 110. Next, a polymer encapsulant (not shown) may be formed to enclose the wires 648 to protect the wires 648 from being damaged due to external forces. Next, multiple solder balls 325 such as tin-lead alloy or tin-silver alloy may be formed at a bottom side of the circuit substrate 110.

3. Third Type of Operation Module (Stacked 3D Chip-Scale-Package (CSP))

Figure 26A:
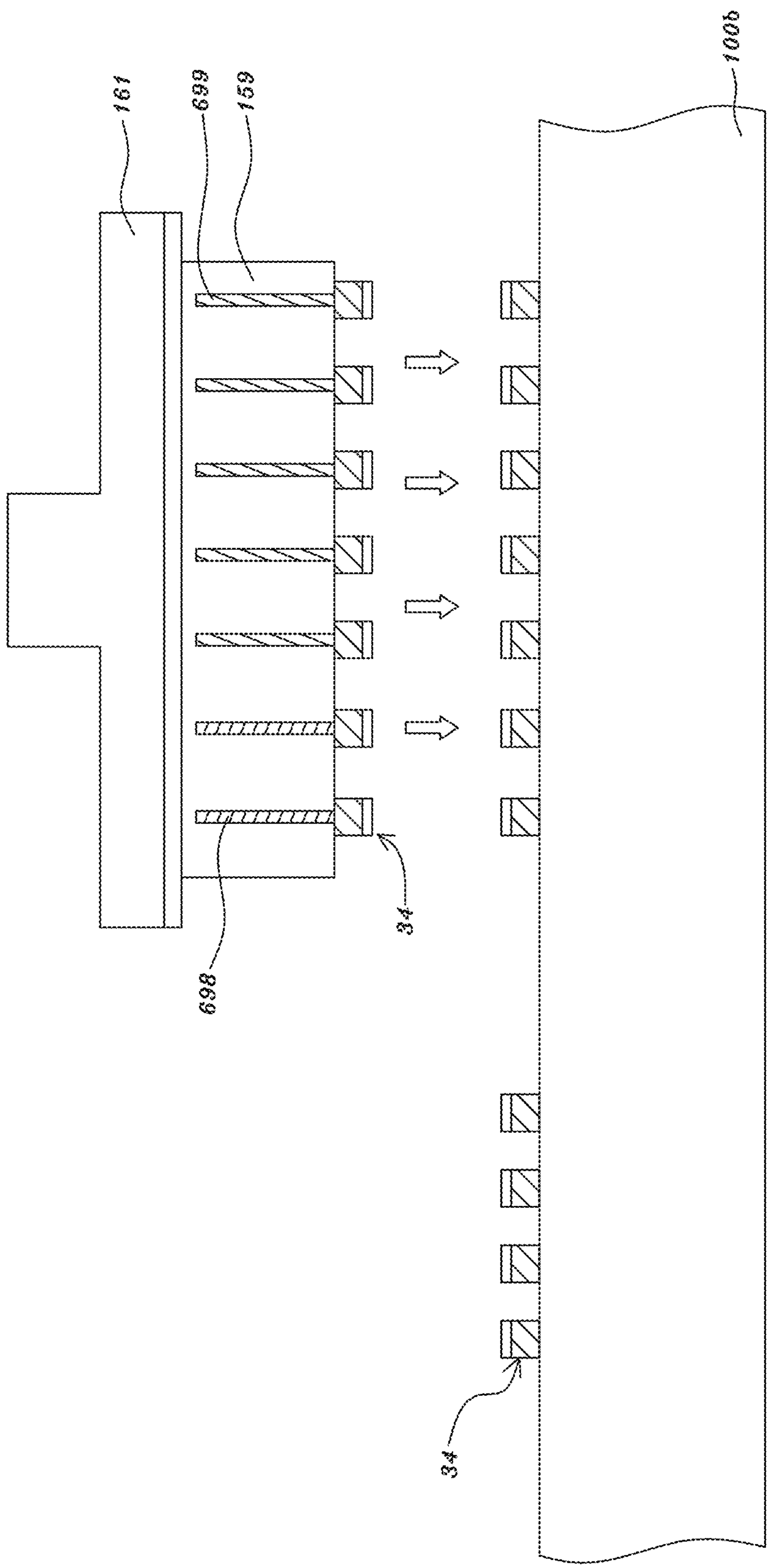
FIGS. 26A-26H and 27A-27H are schematically cross-sectional views showing various processes for fabricating various third type of operation modules in accordance with an embodiment of the present application.
Figure 26B:
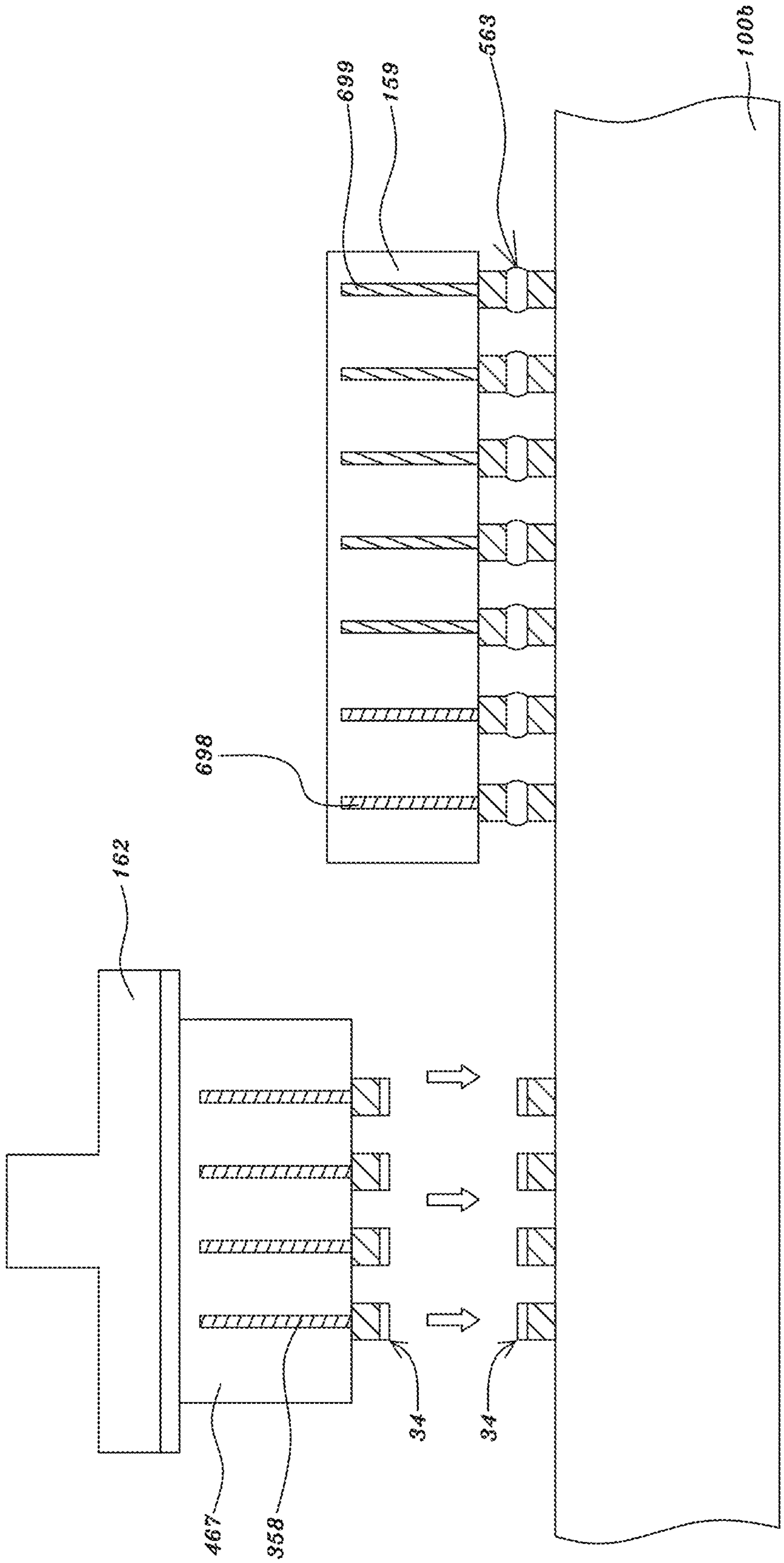

FIGS. 26A-26F are schematically cross-sectional views showing a process for fabricating a third type of operation module in accordance with an embodiment of the present application. Referring to FIGS. 26A and 26B, the semiconductor wafer 100*b* may be provided as illustrated in FIG. 21A. Each of the first or second type of memory modules 159 (only one is shown) formed as illustrated in FIG. 19A or 19B respectively may be held by a bonding head 161 to have its first, second or third type of micro-bumps or micro-pillars 34 to be bonded to the first, second or fourth type of micro-bumps or micro-pillars 34 preformed at an active side of the semiconductor wafer 100*b* into multiple bonded contacts 563 respectively therebetween. Alternatively, each of the first or second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip either having the first and/or second interconnection scheme(s) 560 and/or 588 as illustrated in FIG. 17A or further having the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 respectively therebetween. Alternatively, each of the first or second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip either having the first and/or second interconnection scheme(s) 560 and/or 588 as illustrated in FIG. 17A or further having the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 respectively therebetween. Alternatively, each of the first or second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B either having the first and/or second interconnection scheme(s) 560 and/or 588 as illustrated in FIG. 17A or further having the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 respectively therebetween.

Figure 26C:
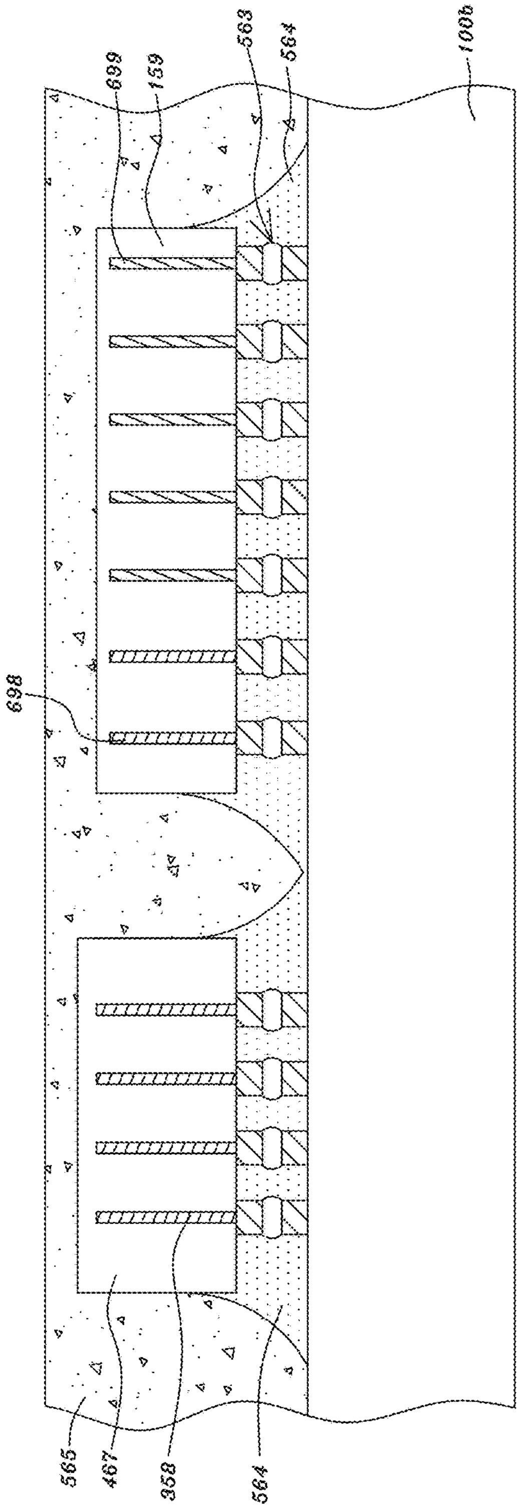

Next, referring to FIGS. 26B and 26C, multiple first type of vertical-through-via (VTV) connectors 467 (only one is shown), each of which may be one as illustrated in any of FIGS. 1F, 1I, 1L, 2D, 2G, 2J, 5J, 5L, 5N, 6D, 6F, 6H and 7E, may be provided with the first, second, third, fifth or sixth type of micro-bumps or micro-pillars 34. Each of the first type of vertical-through-via (VTV) connectors 467 as illustrated in FIG. 1F, 1I, 1L, 2D, 2G or 2J may be held by the bonding head 162 to have its first, second or third type of micro-bumps or micro-pillars 34 to be bonded to the first, second or fourth type of micro-bumps or micro-pillars 34 preformed at the active side of the semiconductor wafer 100*b* into multiple bonded contacts 563 respectively therebetween, as referred to any of the first through fourth cases illustrated in FIGS. 21A-21C.

Alternatively, each of the first type of vertical-through-via (VTV) connectors 467 as illustrated in FIG. 5J, 5L, 5N, 6D, 6F or 6H may be held by the bonding head 162 to have its fifth type of micro-bumps or micro-pillars 34 to be bonded to the first or second type of micro-bumps or micro-pillars 34 preformed at the active side of the semiconductor wafer 100*b* into multiple bonded contacts 563 respectively therebetween. For example, the fifth type of micro-bumps or micro-pillars 34 of said each of the first type of vertical-through-via (VTV) connectors 467 may have the solder layer 719 to be bonded onto the copper layer 32 of the first type of micro-bumps or micro-pillars 34 of the semiconductor wafer 100*b* into multiple bonded contacts 563 between said each of the first type of vertical-through-via (VTV) connectors 467 and the semiconductor wafer 100*b*; the fifth type of micro-bumps or micro-pillars 34 of said each of the first type of vertical-through-via (VTV) connectors 467 may have the solder layer 719 to be bonded onto the solder cap 33 of the second type of micro-bumps or micro-pillars 34 of the semiconductor wafer 100_b_ into multiple bonded contacts 563 between said each of the first type of vertical-through-via (VTV) connectors 467 and the semiconductor wafer 100_b_.

Alternatively, each of the first type of vertical-through-via (VTV) connectors 467 as illustrated in FIG. 7E may be held by the bonding head 162 to have its sixth type of micro-bumps or micro-pillars 34 to be bonded to the first or second type of micro-bumps or micro-pillars 34 preformed at the active side of the semiconductor wafer 100_b_ into multiple bonded contacts 563 respectively therebetween. For example, each of the sixth type of micro-bumps or micro-pillars 34 of said each of the first type of vertical-through-via (VTV) connectors 467 may have the solder ball 321 to be bonded onto the copper layer 32 of one of the first type of micro-bumps or micro-pillars 34 of the semiconductor wafer 100_b_ into multiple bonded contacts 563 between said each of the first type of vertical-through-via (VTV) connectors 467 and the semiconductor wafer 100_b_; each of the sixth type of micro-bumps or micro-pillars 34 of said each of the first type of vertical-through-via (VTV) connectors 467 may have the solder ball 321 to be bonded onto the solder cap 33 of one of the second type of micro-bumps or micro-pillars 34 of the semiconductor wafer 100_b_ into multiple a bonded contact 563 between said each of the first type of vertical-through-via (VTV) connectors 467 and the semiconductor wafer 100_b_.

Next, referring to FIG. 26C, an underfill 564, such as epoxy resins or compounds, may be filled into a gap between each of the first or second type of memory modules 159, or known-good memory or logic chips or known-good ASIC chips, and the semiconductor wafer 100_b_ to enclose the bonded contacts 563 therebetween and into a gap between each of the first type of vertical-through-via (VTV) connectors 467 and the semiconductor wafer 100_b_ to enclose the bonded contacts 563 therebetween. The underfill 564 may be cured at temperature equal to or above 100, 120 or 150 degrees Celsius.

Figure 27A:
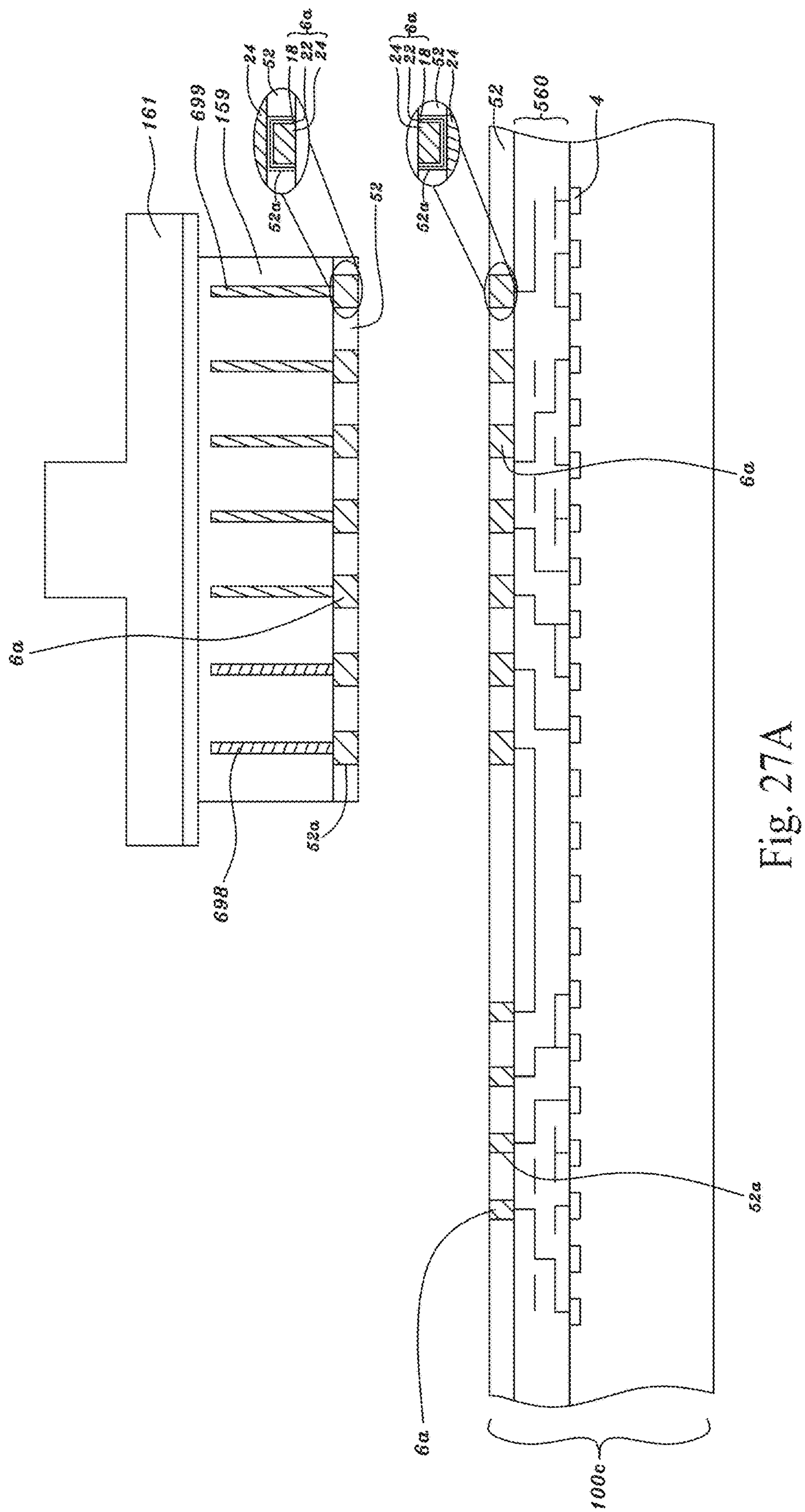
Figure 27B:
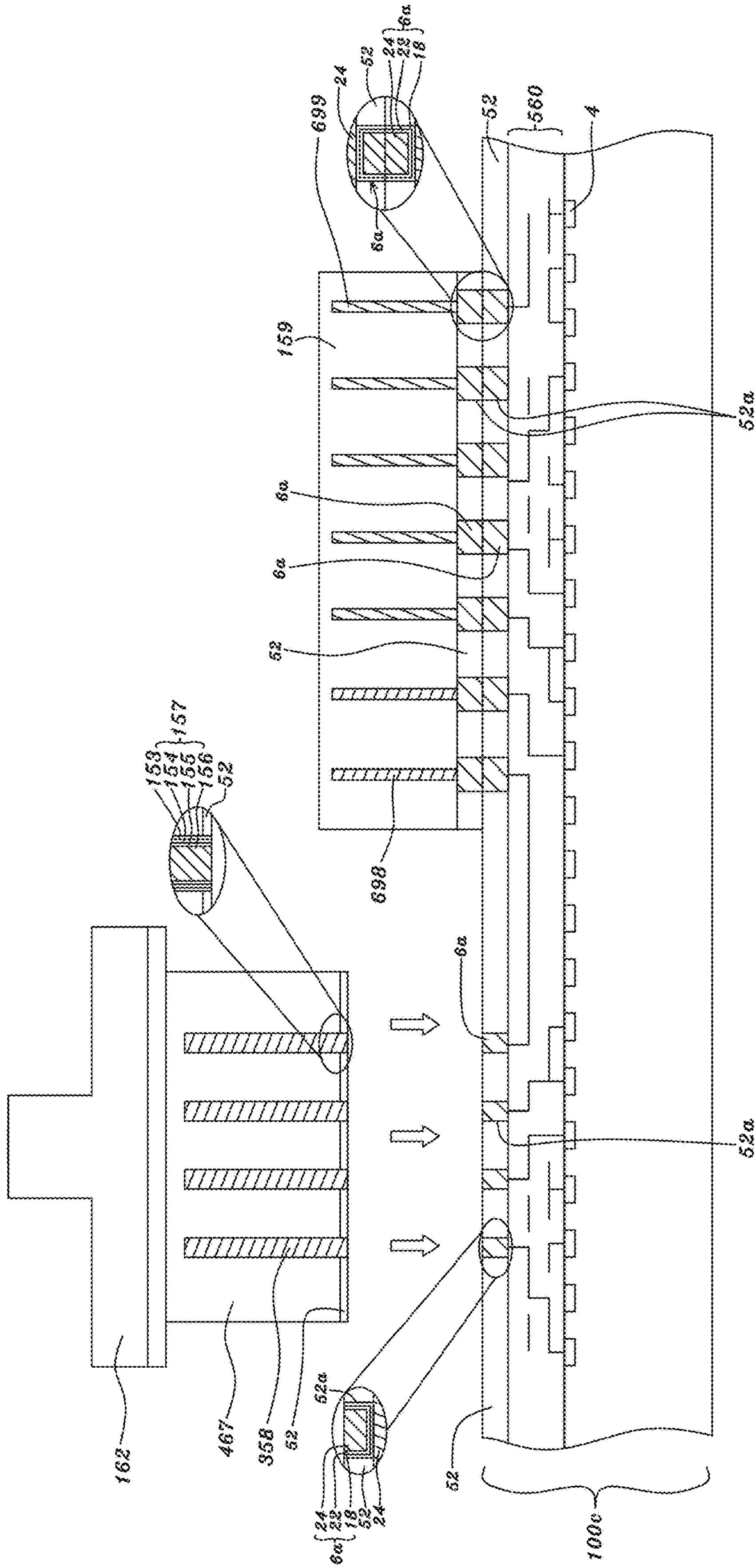

Alternatively, FIGS. 27A-27F are schematically cross-sectional views showing another process for fabricating another third type of operation module in accordance with an embodiment of the present application. Referring to FIGS. 27A and 27B, the semiconductor wafer 100_c_ may be provided as illustrated in FIGS. 23A-23C. Each of first or second type of memory modules 159 may have the structure as illustrated in FIG. 19B or 19D provided with the insulating bonding layer 52 to be bonded to the insulating bonding layer 52 of the semiconductor wafer 100_c_ and the metal pads 6_a_ to be bonded to the metal pads 6_a_ of the semiconductor wafer 100_c_. Alternatively, each of the first or second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip having the structure as illustrated in FIG. 17E provided at an active side thereof with the insulating bonding layer 52 to be bonded to the insulating bonding layer 52 of the semiconductor wafer 100_c_ and the metal pads 6_a_ to be bonded to the metal pads 6_a_ of the semiconductor wafer 100_c_. Alternatively, each of the first or second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip having the structure as illustrated in FIG. 17E provided at an active side thereof with the insulating bonding layer 52 to be bonded to the insulating bonding layer 52 of the semiconductor wafer 100_c_ and the metal pads 6_a_ to be bonded to the metal pads 6_a_ of the semiconductor wafer 100_c_. Alternatively, each of the first or second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B having the structure as illustrated in FIG. 17E provided at an active side thereof with the insulating bonding layer 52 to be bonded to the insulating bonding layer 52 of the semiconductor wafer 100_c_ and the metal pads 6_a_ to be bonded to the metal pads 6_a_ of the semiconductor wafer 100_c_. Multiple second type of vertical-through-via (VTV) connectors 467 (only one is shown), each of which may be one as illustrated in any of FIGS. 1G, 1J, 1M, 2E, 2H and 2K, may be provided with the insulating bonding layer 52 to be bonded to the insulating bonding layer 52 of the semiconductor wafer 100_c_ and the vertical through vias (VTVs) 358 to be bonded to the metal pads 6_a_ of the semiconductor wafer 100_c_.

Figure 27C:
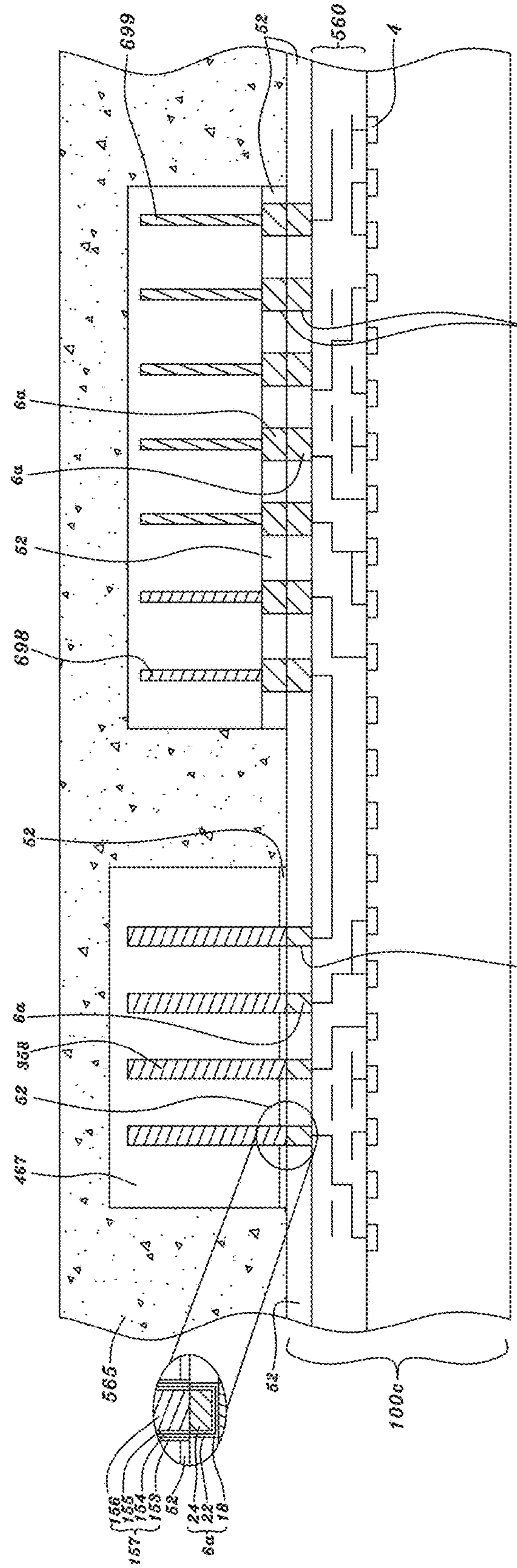

Referring to FIGS. 27A-27C, before the first or second type of memory modules 159, or known-good memory or logic chips or known-good ASIC chips, and the second type of vertical-through-via (VTV) connectors 467 join the semiconductor wafer 100_c_, a joining surface, i.e., silicon oxide, of the insulating bonding layer 52 at the active side of the semiconductor wafer 100_c_ may be activated with nitrogen plasma for increasing a hydrophilic property thereof, and then the joining surface of the insulating bonding layer 52 at the active side of the semiconductor wafer 100_c_ may be rinsed with deionized water for water adsorption and cleaning. Further, a joining surface, i.e., silicon oxide, of the insulating bonding layer 52 at the active side of the control chip 688 of each of the first or second type of memory modules 159, the exposed backside of the topmost one of the memory chips 251 of which may be attached to a temporary substrate (not shown) in advance, or at the active side of each of the known-good memory or logic chips or known-good ASIC chips, the backside of which may be attached to a temporary substrate (not shown) in advance, and a joining surface, i.e., silicon oxide, of the insulating bonding layer 52 of each of the first or second type of vertical-through-via (VTV) connectors 467, the backside of which may be attached to a temporary substrate in advance, may be activated with nitrogen plasma for increasing a hydrophilic property thereof, and then the joining surface of the insulating bonding layer 52 at the active side of the control chip 688 of each of the first or second type of memory modules 159, or at the active side of each of the known-good memory or logic chips or known-good ASIC chips, and the joining surface of the insulating bonding layer 52 of each of the first or second type of vertical-through-via (VTV) connectors 467 may be rinsed with deionized water for water adsorption and cleaning. Next, each of the first or second type of memory modules 159, or known-good memory or logic chips or known-good ASIC chips, and the second type of vertical-through-via (VTV) connectors 467 may be released from the temporary substrate(s).

Next, referring to FIGS. 27A-27C, the first or second type of memory modules 159, or known-good memory or logic chips or known-good ASIC chips, and the second type of vertical-through-via (VTV) connectors 467 may join the semiconductor wafer 100*c* by (1) picking up, by a bonding head 161, each of the first or second type of memory modules 159, or known-good memory or logic chips or known-good ASIC chips, to be placed on the semiconductor wafer 100*c* with each of the metal pads 6*a* at the active side of the control chip 688 of each of the first or second type of memory modules 159, or at the active side of each of the known-good memory or logic chips or known-good ASIC chips, in contact with one of the metal pads 6*a* at the active side of the semiconductor wafer 100*c* and with the joining surface of the insulating bonding layer 52 at the active side of the control chip 688 of each of the first or second type of memory modules 159, or at the active side of each of the known-good memory or logic chips or known-good ASIC chips, in contact with the joining surface of the insulating bonding layer 52 at the active side of the semiconductor wafer 100*c*, (2) picking up, by a bonding head 162, each of the second type of vertical-through-via (VTV) connectors 467 to be placed on the semiconductor wafer 100*c* with each of the vertical through vias (VTVs) 358 of each of the second type of vertical-through-via (VTV) connectors 467 in contact with one of the metal pads 6*a* at the active side of the semiconductor wafer 100*c* and with the joining surface of the insulating bonding layer 52 of each of the second type of vertical-through-via (VTV) connectors 467 in contact with the joining surface of the insulating bonding layer 52 at the active side of the semiconductor wafer 100*c*, and (3) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the control chip 688 of each of the first or second type of memory modules 159, or at the active side of each of the known-good memory or logic chips or known-good ASIC chips, and the joining surface of the insulating bonding layer 52 of each of the second type of vertical-through-via (VTV) connectors 467 to the joining surface of the insulating bonding layer 52 at the active side of the semiconductor wafer 100*c* and (b) copper-to-copper bonding at a temperature between 300 and 350 degrees Celsius and for a time period between 10 and 60 minutes to bond the copper layer 24 of each of the metal pads 6*a* at the active side of the control chip 688 of each of the first or second type of memory modules 159, or at the active side of each of the known-good memory or logic chips or known-good ASIC chips, to the copper layer 24 of one of the metal pads 6*a* at the active side of the semiconductor wafer 100*c* and to bond the copper layer 24 of each of the vertical through vias (VTVs) 358 of each of the second type of vertical-through-via (VTV) connectors 467 to the copper layer 24 of one of the metal pads 6*a* at the active side of the semiconductor wafer 100*c*, wherein the oxide-to-oxide bonding may be caused by water desorption from reaction between the joining surface of the insulating bonding layer 52 at the active side of the control chip 688 of each of the first or second type of memory modules 159, or at the active side of each of the known-good memory or logic chips or known-good ASIC chips, and the joining surface of the insulating bonding layer 52 at the active side of the semiconductor wafer 100*c* and between the joining surface of the insulating bonding layer 52 of each of the second type of vertical-through-via (VTV) connectors 467 and the joining surface of the insulating bonding layer 52 at the active side of the semiconductor wafer 100*c*, and the copper-to-copper bonding may be caused by metal inter-diffusion between the copper layer 24 of the metal pads 6*a* at the active side of the control chip 688 of each of the first or second type of memory modules 159, or at the active side of each of the known-good memory or logic chips or known-good ASIC chips, and the copper layer 24 of the metal pads 6*a* at the active side of the semiconductor wafer 100*c* and between the copper layer 24 of the vertical through vias (VTVs) 358 of each of the second type of vertical-through-via (VTV) connectors 467 and the copper layer 24 of the metal pads 6*a* at the active side of the semiconductor wafer 100*c*.

Next, referring to each of FIGS. 26C and 27C, a polymer layer 565, e.g., resin or compound, may be applied to fill a gap between each neighboring two of the first or second type of memory modules 159, or known-good memory or logic chips or known-good ASIC chips, and first or second type of vertical-through-via (VTV) connectors 467 and to cover a backside of each of the first or second type of memory modules 159, or known-good memory or logic chips or known-good ASIC chips, and a backside of each of the first or second type of vertical-through-via (VTV) connectors 467 by methods, for example, spin-on coating, screen-printing, dispensing or molding. The polymer layer 565 may be, for example, polyimide, BenzoCycloButene (BCB), parylene, epoxy-based material or compound, photo epoxy SU-8, elastomer, or silicone. The polymer layer 565 may be cured or cross-linked at a temperature higher than or equal to 50, 70, 90, 100, 125, 150, 175, 200, 225, 250, 275 or 300 degrees Celsius.

Figure 26D:
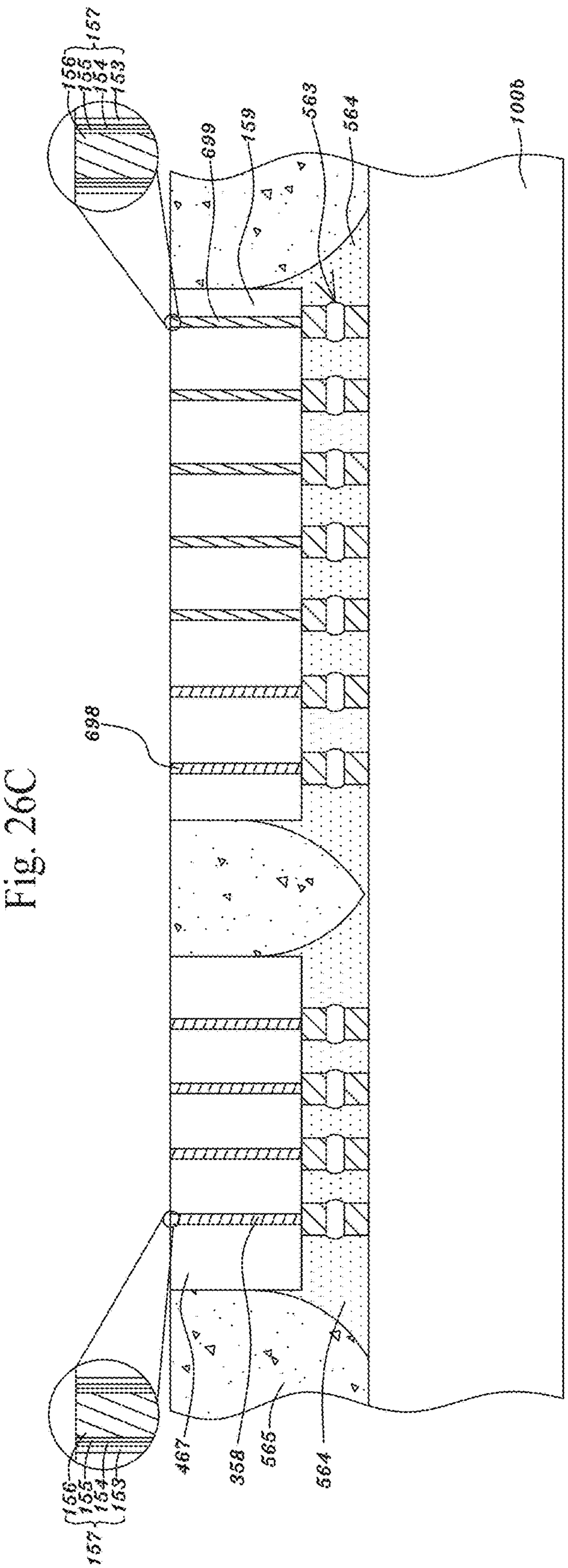
Figure 27D:
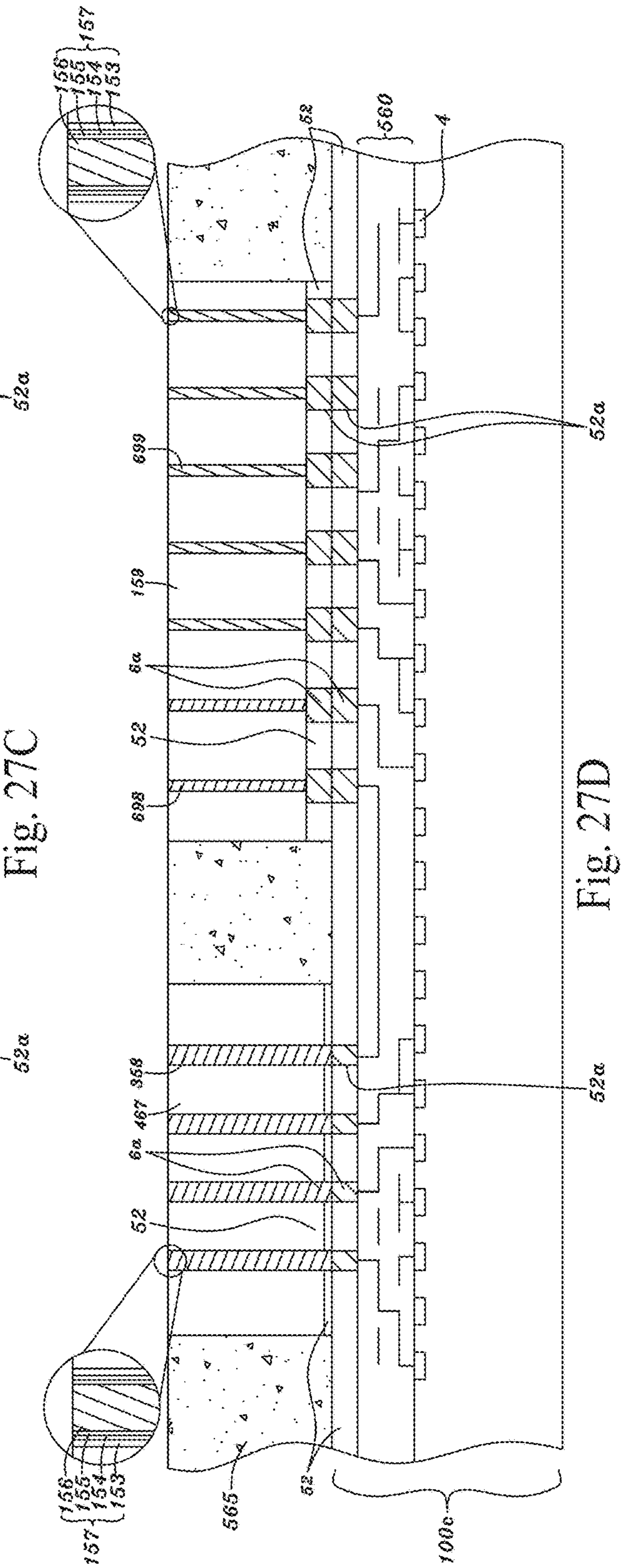

Next, referring to each of FIGS. 26D and 27D, a chemical mechanical polishing (CMP), polishing or grinding process may be applied to remove a top portion of the polymer layer 565, a top portion of each of the first or second type of memory modules 159, or known-good memory or logic chips or known-good ASIC chips, and a top portion of each of the first or second type of vertical-through-via (VTV) connectors 467, to planarize a top surface of the polymer layer 565, a top surface of each of the first or second type of memory modules 159, or known-good memory or logic chips or known-good ASIC chips, and a top surface of each of the first or second type of vertical-through-via (VTV) connectors 467 and to expose a backside of the copper layer 156 of each of the vertical through vias (VTVs) 358 of each of the first or second type of vertical-through-via (VTV) connectors 467 and, optionally, a backside of the copper layer 156 of each of the through silicon vias (TSVs) 157 of the topmost one of the memory chips 251 of each of the first or second type of memory modules 159, or a backside of the copper layer 156 of the through silicon vias (TSVs) 157 of each of the known-good memory or logic chips or known-good ASIC chips in case of replacing the first or second type of memory modules 159. Optionally, for each of the through silicon vias (TSVs) 157 of the topmost one of the memory chips 251 of said each of the first or second type of memory modules 159, or said each of the known-good memory or logic chips or known-good ASIC chips in case of replacing the first or second type of memory modules 159, its insulating lining layer 153, adhesion layer 154 and seed layer 155 at its backside may be removed and its insulating lining layer 153, adhesion layer 154 and seed layer 155 may be left at a sidewall of its copper layer 156.

Referring to each of FIGS. 26D and 27D, for each of the vertical through vias (VTVs) 358 of said each of the first or second type of vertical-through-via (VTV) connectors 467, if made of one or more of the through silicon vias (TSVs) 157 as illustrated in one of FIGS. 1F, 1G, 1I, 1J, 1L, 1M, 2D, 2E, 2G, 2H, 2J and 2K, its insulating lining layer 153, adhesion layer 154 and seed layer 155 at its backside may be removed to expose its copper layer 156 and its insulating lining layer 153, adhesion layer 154 and seed layer 155 may be left at a sidewall of its copper layer 156. For each of the vertical through vias (VTVs) 358 of said each of the first or second type of vertical-through-via (VTV) connectors 467, if made of one or more of the through glass vias (TGVs) 259 as illustrated in one of FIGS. 5J, SL, 5N, 6D, 6F and 6H, its adhesion layer 154 and seed layer 155 at its backside may be removed to expose its copper layer 156 and its adhesion layer 154 and seed layer 155 may be left at a sidewall of its copper layer 156. For each of the vertical through vias (VTVs) 358 of said each of the first or second type of vertical-through-via (VTV) connectors 467, if made of one or more of the through polymer vias (TPVs) 318 as illustrated in one of FIG. 7E, each of its metal pads 336 or copper posts 318 may be exposed to have a top surface coplanar with a top surface of the polymer layer 565.

Figure 26E:
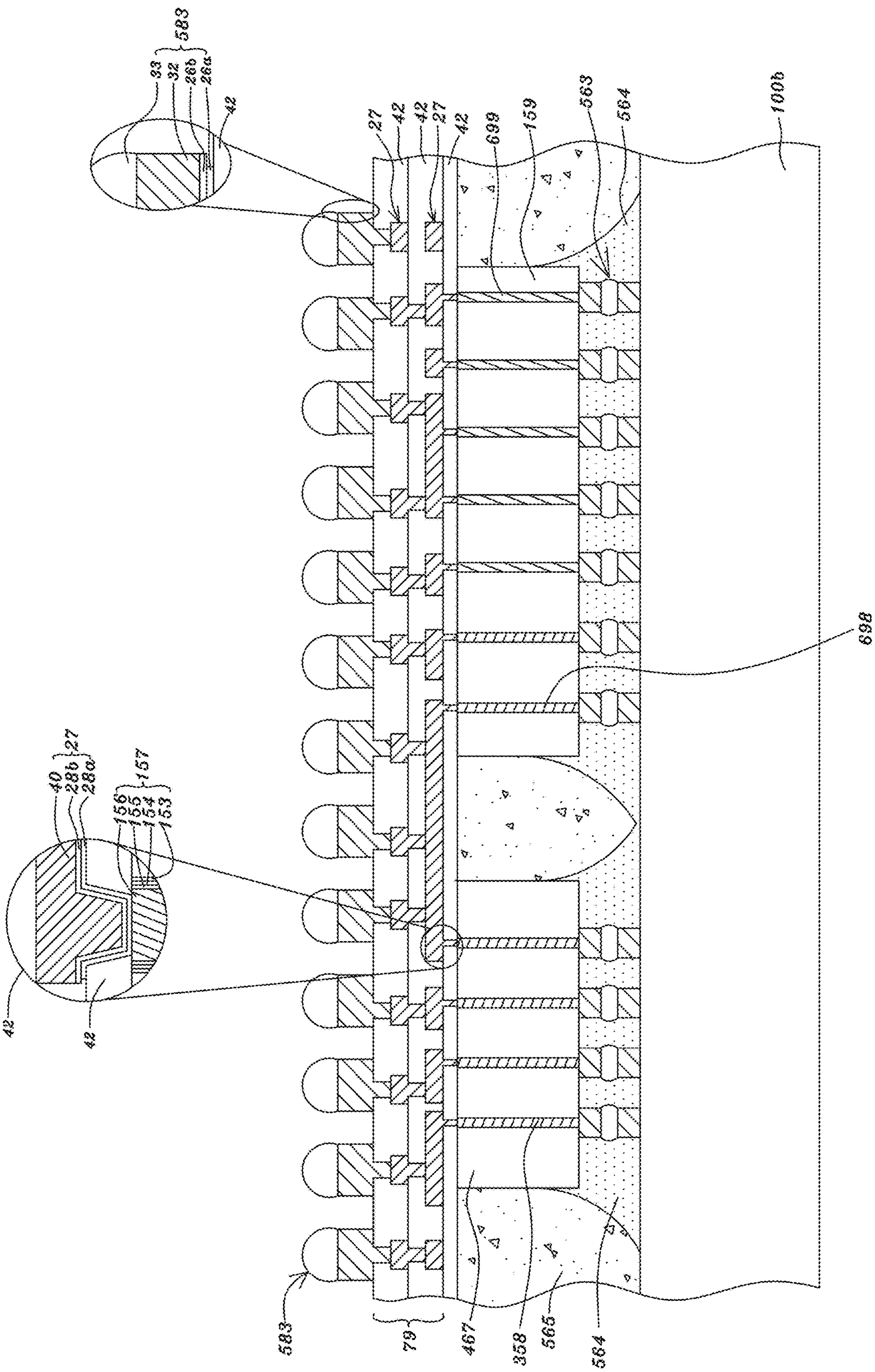
Figure 27E:
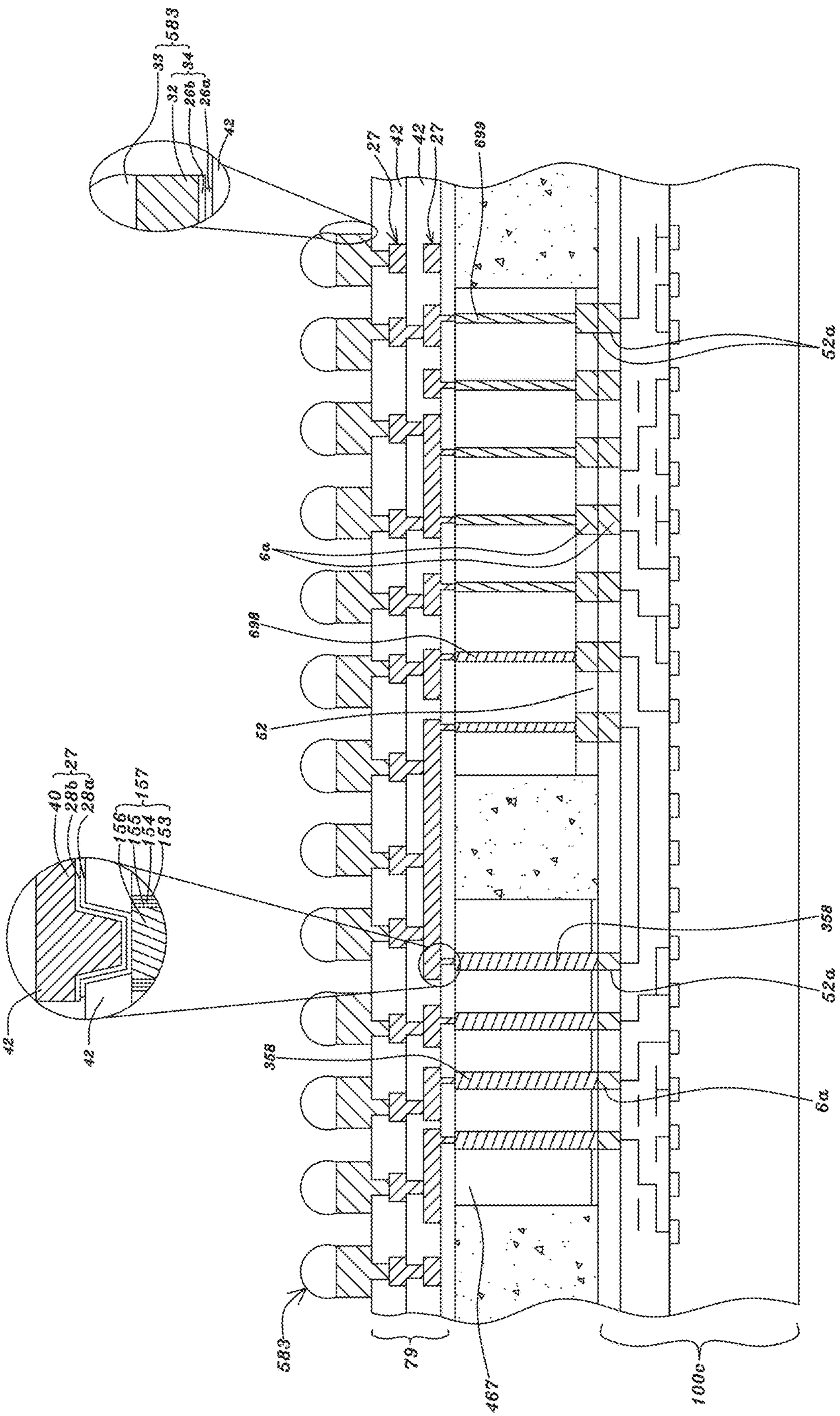

Referring to each of FIGS. 26E and 27E, a backside interconnection scheme 79 for a device (BISD) may be formed on each of the first or second type of memory modules 159, or known-good memory or logic chips or known-good ASIC chips, each of the first or second type of vertical-through-via (VTV) connectors 467 and the polymer layer 565. The backside interconnection scheme 79 may include (1) one or more interconnection metal layers 27 coupling to the vertical through vias (VTVs) 358 of the first or second type of vertical-through-via (VTV) connectors 467 and/or the through silicon vias (TSVs) 157 of the memory chips 251 and control chip 688 of each of the first or second type of memory modules 159, or the through silicon vias (TSVs) 157 of each of the known-good memory or logic chips or known-good ASIC chips in case of replacing the first or second type of memory modules 159, and (2) one or more polymer layers 42, i.e., insulating dielectric layers, each between neighboring two of its interconnection metal layers 27, between a bottommost one of its interconnection metal layers 27 and a polished planar surface composed of a top surface of each of the first or second type of vertical-through-via (VTV) connectors 467, a top surface of each of the first or second type of memory modules 159, or known-good memory or logic chips or known-good ASIC chips, and a top surface of the polymer layer 565, or on and above a topmost one of its interconnection metal layers 27, wherein the topmost one of its interconnection metal layers 27 may have multiple metal pads at bottoms of multiple openings 42*a* in the topmost one of its polymer layers 42. Each of the interconnection metal layers 27 may include (1) a copper layer 40 having lower portions in openings in one of the polymer layers 42 having a thickness of between 0.3 μm and 20 μm and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 and polymer layer 42 of the backside interconnection scheme 79 may have the same specifications as that as illustrated in FIGS. 21E and 23E.

Next, referring to each of FIGS. 26E and 27E, multiple metal bumps 583, which may be of one of the first through fourth types having the same specifications as the first through fourth types of micro-bumps or micro-pillars 34 as illustrated in FIG. 1F respectively, may be formed on the metal pads of the topmost one of the interconnection metal layers 27 of the backside interconnection scheme 79 at the bottoms of the openings 42*a* in the topmost one of the polymer layers 42 of the backside interconnection scheme 79.

Figure 26F:
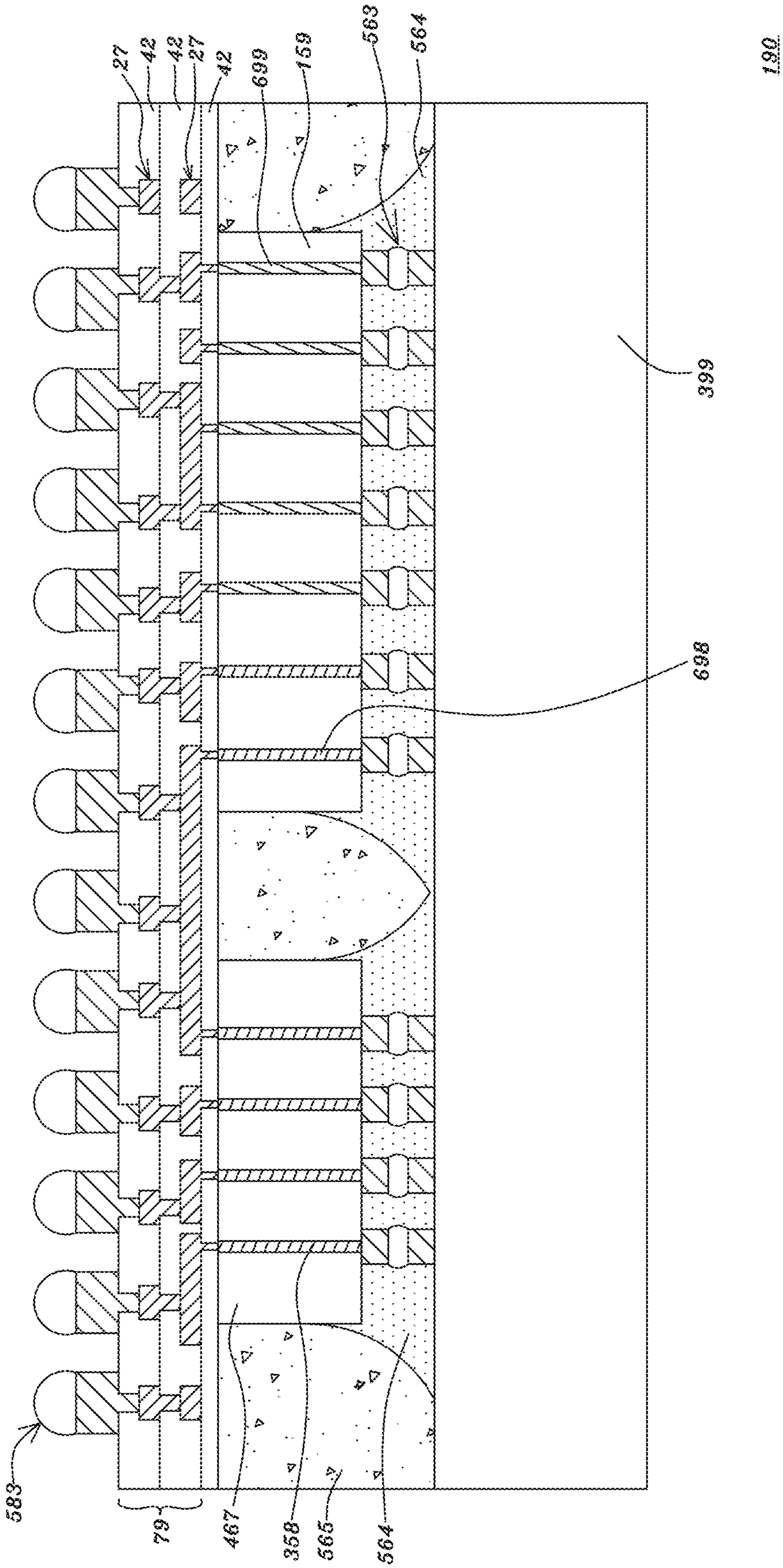
Figure 27F:
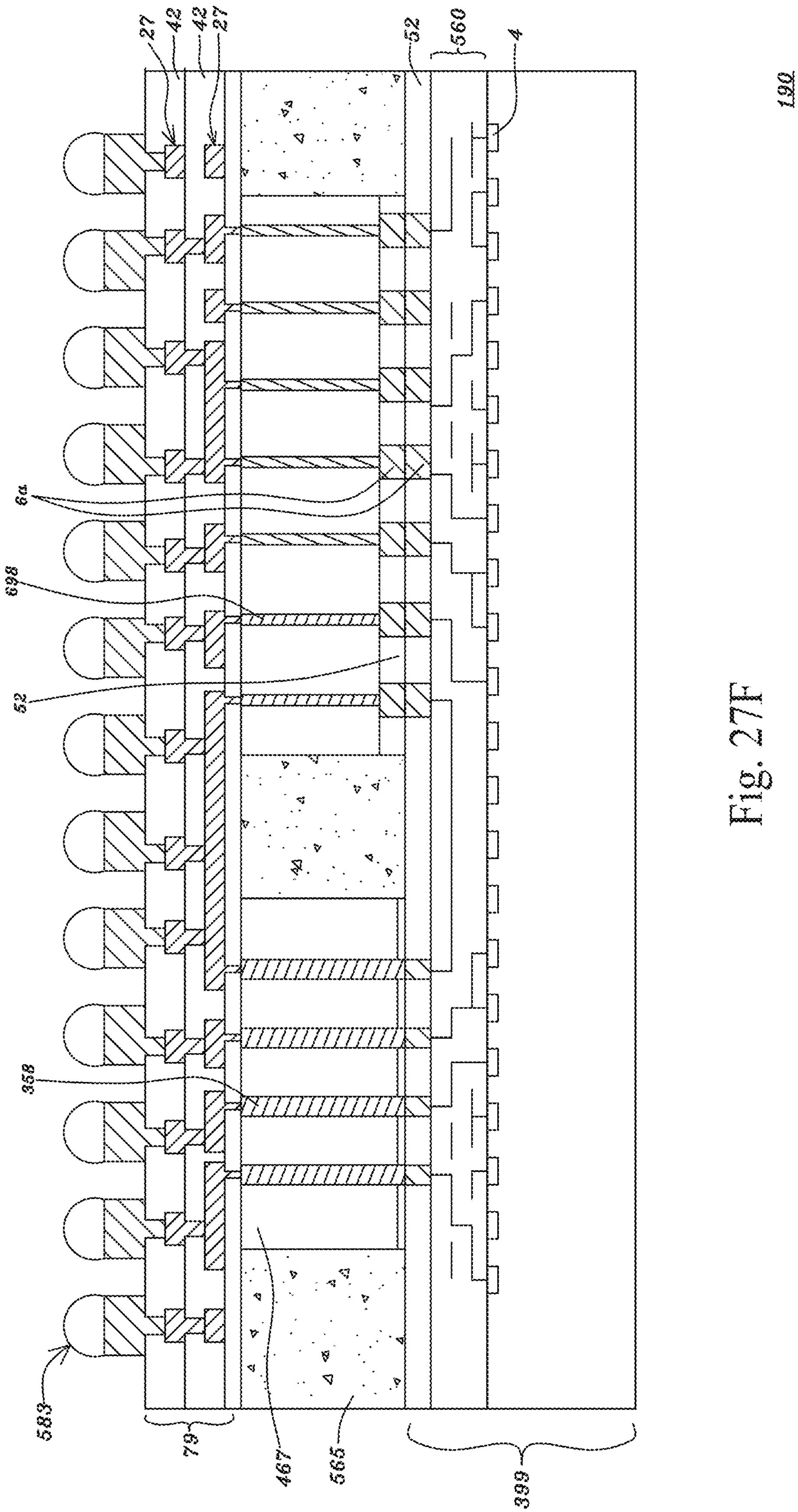

Next, referring to each of FIGS. 26E and 27E, the semiconductor wafer 100*b* or 100*c*, polymer layer 565 and polymer layers 42 of the backside interconnection scheme 79 may be cut or diced to form multiple third type of operation modules 190 or chip scale packages (CSP) as shown in FIGS. 26F and 27F by a laser cutting process or by a mechanical cutting process. At this time, the semiconductor wafer 100*b* or 100*c* may be cut or diced into multiple semiconductor chips that may be application specific integrated-circuit (ASIC) chips 399, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips. For the third type of operation module 190 as seen in FIG. 26E or 27E, its application specific integrated-circuit (ASIC) logic chip 399 may have the semiconductor devices 4 such as transistors at the active surface of the semiconductor substrate 2 thereof as illustrated in FIG. 17A or 17D respectively. The active surface of the semiconductor substrate 2 of its application specific integrated-circuit (ASIC) logic chip 399 may face an active surface of the semiconductor substrate 2 of its known-good memory or logic chip or known-good ASIC chip in case of replacing the first or second type of memory modules 159, wherein its known-good memory or logic chip or known-good ASIC chip in case of replacing the first or second type of memory modules 159 may have the semiconductor devices 4 such as transistors at the active surface of the semiconductor substrate 2 thereof as illustrated in FIG. 17B or 17E respectively. The active surface of the semiconductor substrate 2 of its application specific integrated-circuit (ASIC) logic chip 399 may face its first or second type of vertical-through-via (VTV) connector 467.

Referring to each of FIGS. 26F and 27F, for the third type of operation module 190, its first or second type of memory module 159, or known-good memory or logic chip or known-good ASIC chip, may have multiple small I/O circuits coupling respectively to multiple small I/O circuits of its application specific integrated-circuit (ASIC) chip 399 through its bonded contacts 563 therebetween as seen in FIG. 26F or the bonded metal pads 6*a* of its first or second type of memory module 159, or known-good memory or logic chip or known-good ASIC chip, and application specific integrated-circuit (ASIC) chip 399 as seen in FIG. 27F for data transmission with a data bit width of equal to or greater than 64, 128, 256, 512, 1024, 2048, 4096, 8K, or 16K, wherein each of the small I/O circuits of its first or second type of memory module 159, or known-good memory or logic chip or known-good ASIC chip, and application specific integrated-circuit (ASIC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Further, its first or second type of memory module 159, or known-good memory or logic chip or known-good ASIC chip, may have a large input/output (I/O) circuit coupling to one of its metal bumps 583 for signal transmission or power or ground delivery through the interconnection metal layers 27 of its backside interconnection scheme 79, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Further, its first or second type of memory module 159, or known-good memory or logic chip or known-good ASIC chip, may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399 as encrypted CPM data to be passed to the metal bumps 583 and (2) to decrypt, in accordance with the password or key, encrypted CPM data from the metal bumps 583 as decrypted CPM data to be passed to the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399. Further, its first or second type of memory module 159, or known-good memory or logic chip or known-good ASIC chip, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 399. Further, its first or second type of memory module 159, or known-good memory or logic chip or known-good ASIC chip, may include multiple non-volatile memory cells, such as NAND memory cells, NOR memory cells, RARM cells, MRAM cells, FRAM cells or PCM cells, configured to store CPM data to be passed to the memory cells 490 for the look-up tables (LUT) 210 of the programmable logic cells (LC) 2014 of its application specific integrated-circuit (ASIC) logic chip 399 for programming or configuring the programmable logic cells (LC) 2014 of its application specific integrated-circuit (ASIC) logic chip 399 or to the memory cells 362 of the programmable switch cells 379 of its application specific integrated-circuit (ASIC) logic chip 399 for programming or configuring the programmable switch cells 379 of its application specific integrated-circuit (ASIC) logic chip 399.

Referring to each of FIGS. 26F and 27F, for the third type of operation module 190, its application specific integrated-circuit (ASIC) logic chips 399 may have a large input/output (I/O) circuit coupling to one of its metal bumps 583 for signal transmission or power or ground delivery through, in sequence, one of the vertical through vias (VTVs) 358 of its first or second type of vertical-through-via (VTV) connectors 467, or one of the dedicated vertical bypasses 698 in its second type of memory module 159 as illustrated in FIGS. 19B and 19D, or one of the through silicon vias (TSVs) 157 of its known-good memory or logic chip or known-good ASIC chip in case of replacing its second type of memory module 159, and the interconnection metal layers 27 of its backside interconnection scheme 79, wherein said one of the dedicated vertical bypasses 698 is not connected to any transistor in the memory chips 251 or control chip 688 of its second type of memory module 159, or said one of the through silicon vias (TSVs) 157 is not connected to any transistor in its known-good memory or logic chip or known-good ASIC chip in case of replacing its second type of memory module 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One of the vertical interconnects 699 of its first or second type of memory module 159 as illustrated in FIGS. 19A-19D may couple to one of its metal bumps 583 through the interconnection metal layers 27 of its backside interconnection scheme 79 and to its application specific integrated-circuit (ASIC) chip 399 through one of its bonded contacts 563 as seen in FIG. 26F or through one of the metal pads **6*a* of the control chip 688 of its first or second type of memory module 159 as seen in FIG. 27**F.

Referring to FIGS. 26F and 27F, for the third type of operation module 190, each of the memory chips 251 and control chip 688 of its first or second type of memory module 159, or known-good memory or logic chip or known-good ASIC chip, may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in each of the memory chips 251 and control chip 688 of its first or second type of memory module 159, or known-good memory or logic chip or known-good ASIC chip, may be 1, 2, 3, 4, 5 or greater than 5 nodes or generations older, more matured or less advanced than that used in its application specific integrated-circuit (ASIC) logic chip 399. Transistors used in each of the memory chips 251 and control chip 688 of its first or second type of memory module 159, or known-good memory or logic chip or known-good ASIC chip, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of its first or second type of memory module 159, or known-good memory or logic chip or known-good ASIC chip, may be different from that used in its application specific integrated-circuit (ASIC) logic chip 399; each of the memory chips 251 and control chip 688 of its first or second type of memory module 159, or known-good memory or logic chip or known-good ASIC chip, may use planar MOSFETs, while its application specific integrated-circuit (ASIC) logic chip 399 may use fin field effect transistors (FINFETs) or gate-all-around field effect transistors (GAAFETs). A power supply voltage (Vcc) applied in each of the memory chips 251 and control chip 688 of its first or second type of memory module 159, or known-good memory or logic chip or known-good ASIC chip, may be greater than or equal to 1.5, 2.0, 2.5, 3, 3.3, 4, or 5 voltages, while a power supply voltage (Vcc) applied in its application specific integrated-circuit (ASIC) logic chip 399 may be smaller than or equal to 1.8, 1.5 or 1 voltage. The power supply voltage applied in each of the memory chips 251 and control chip 688 of its first or second type of memory module 159, or known-good memory or logic chip or known-good ASIC chip, may be higher than that applied in its application specific integrated-circuit (ASIC) logic chip 399. A gate oxide of a field effect transistor (FET) of each of the memory chips 251 and control chip 688 of its first or second type of memory module 159, or known-good memory or logic chip or known-good ASIC chip, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 399 may have a physical thickness less than 4.5 nm, 4 nm, 3 nm or 2 nm. The thickness of the gate oxide of the field effect transistor (FET) of each of the memory chips 251 and control chip 688 of its first or second type of memory module 159, or known-good memory or logic chip or known-good ASIC chip, may be greater than that of its application specific integrated-circuit (ASIC) logic chip 399.

Figure 26G:
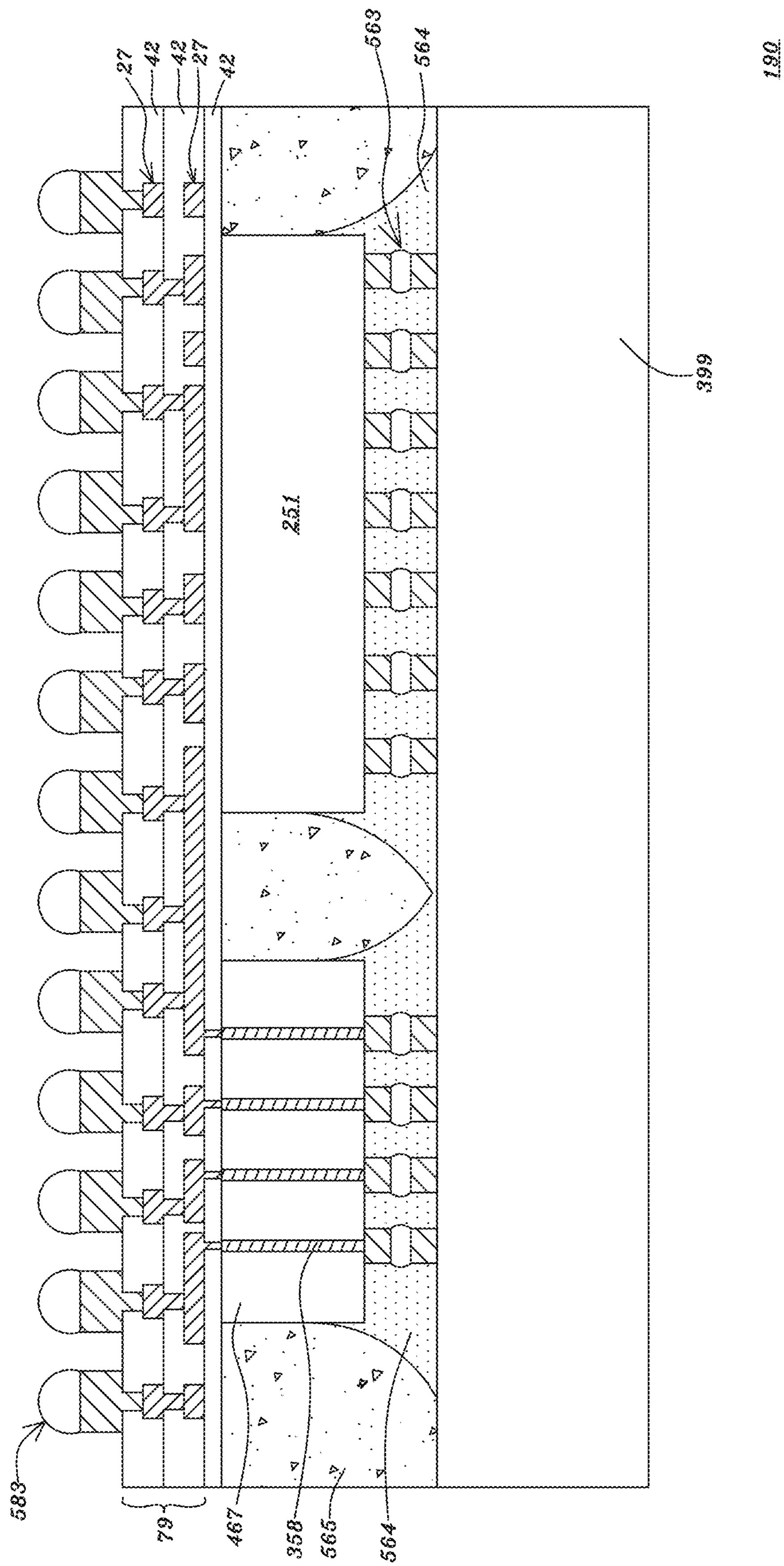
Figure 27G:
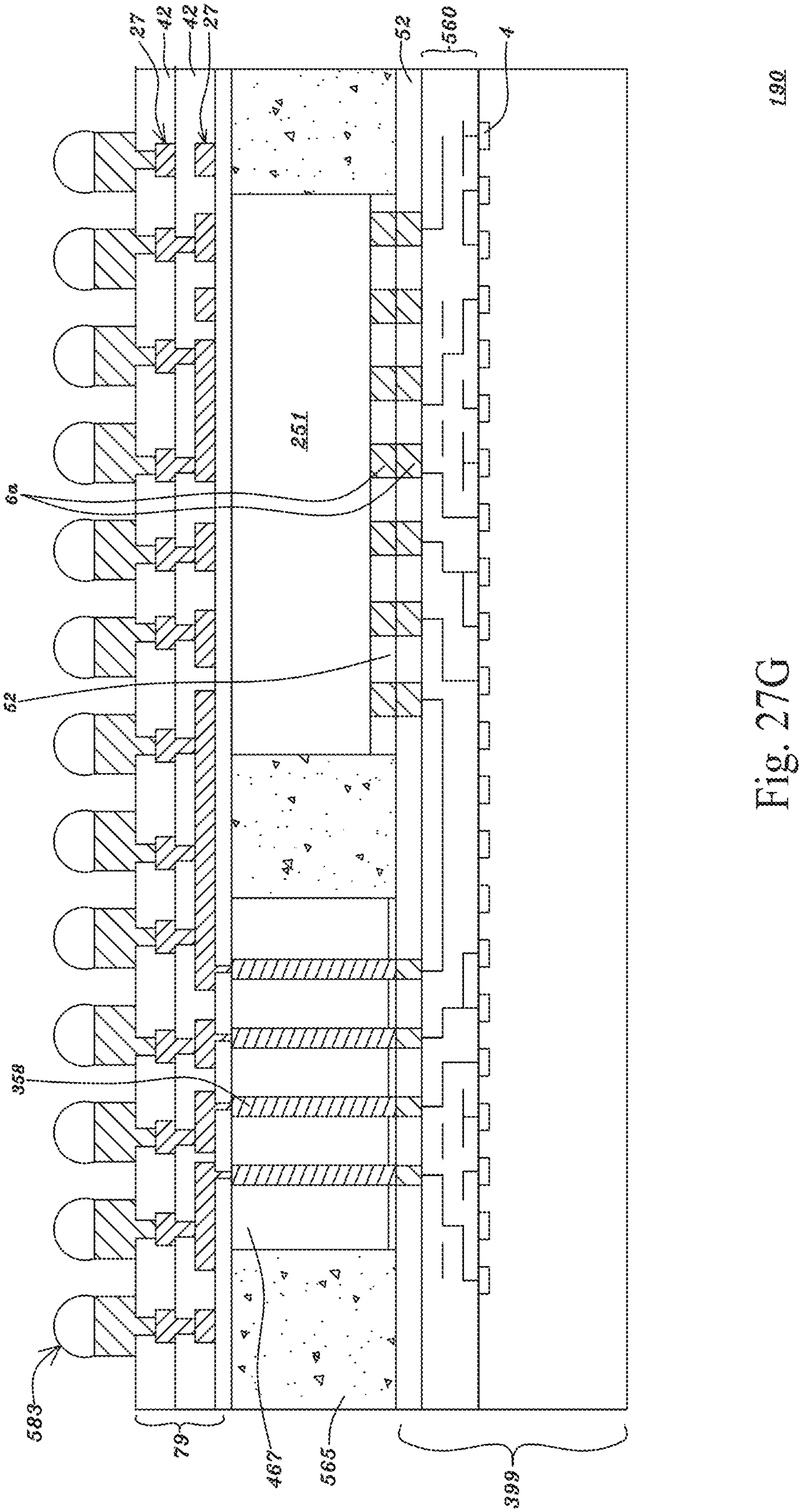

Alternatively, FIGS. 26G and 27G are schematically cross-sectional views showing various third type of operation modules in accordance with an embodiment of the present application. Referring to FIGS. 26G and 27G, each of the first or second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip not having any of the through silicon vias (TSVs) 157 therein coupling to the interconnection metal layers 27 of the backside interconnection scheme 79 of the third type of operation module 190 through its backside. Alternatively, each of the second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip not having any of the through silicon vias (TSVs) 157 therein coupling to the interconnection metal layers 27 of the backside interconnection scheme 79 of the third type of operation module 190 through its backside. Alternatively, each of the second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B not having any of the through silicon vias (TSVs) 157 therein coupling to the interconnection metal layers 27 of the backside interconnection scheme 79 of the third type of operation module 190 through its backside.

Figure 26H:
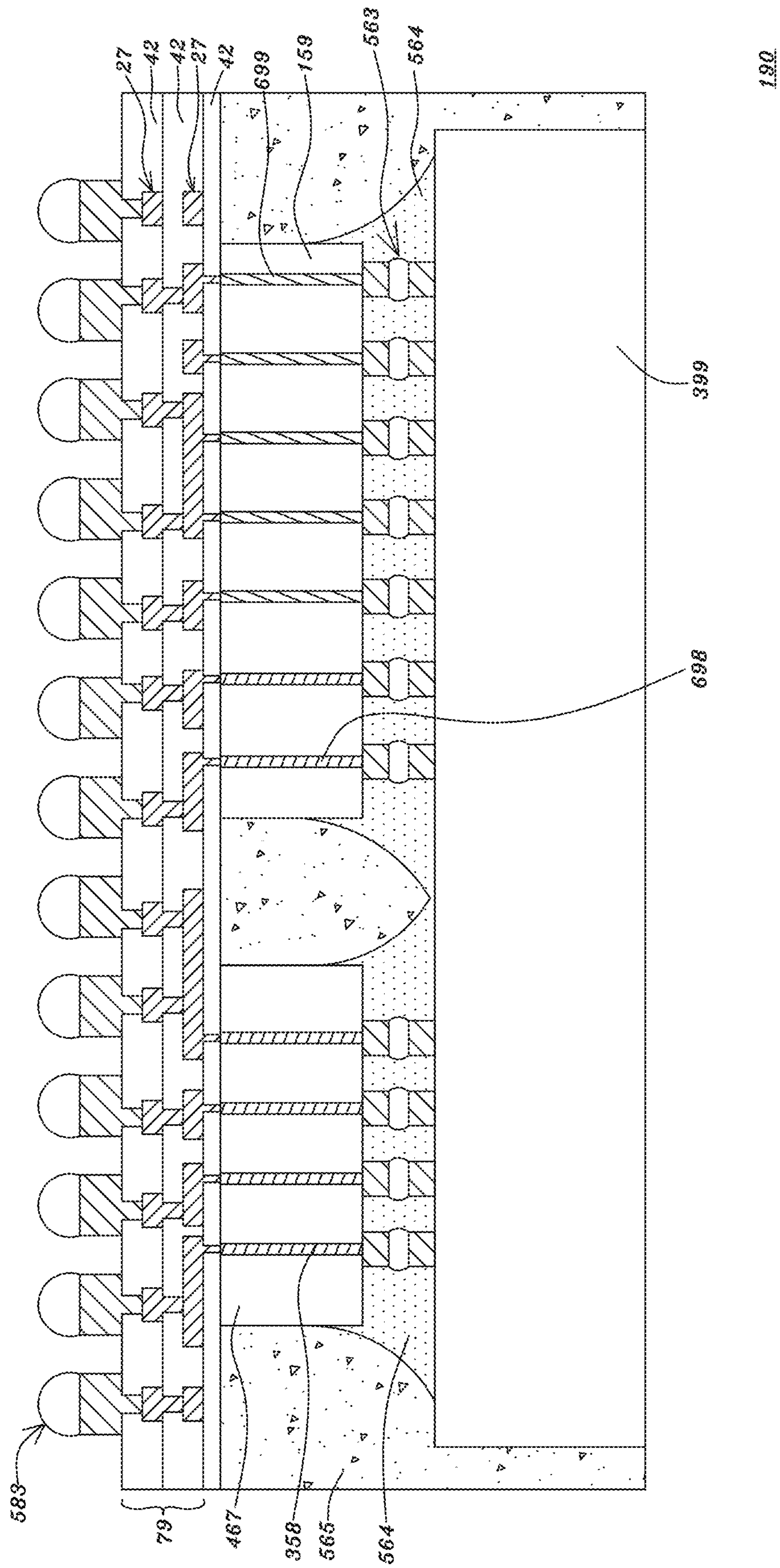
Figure 27H:
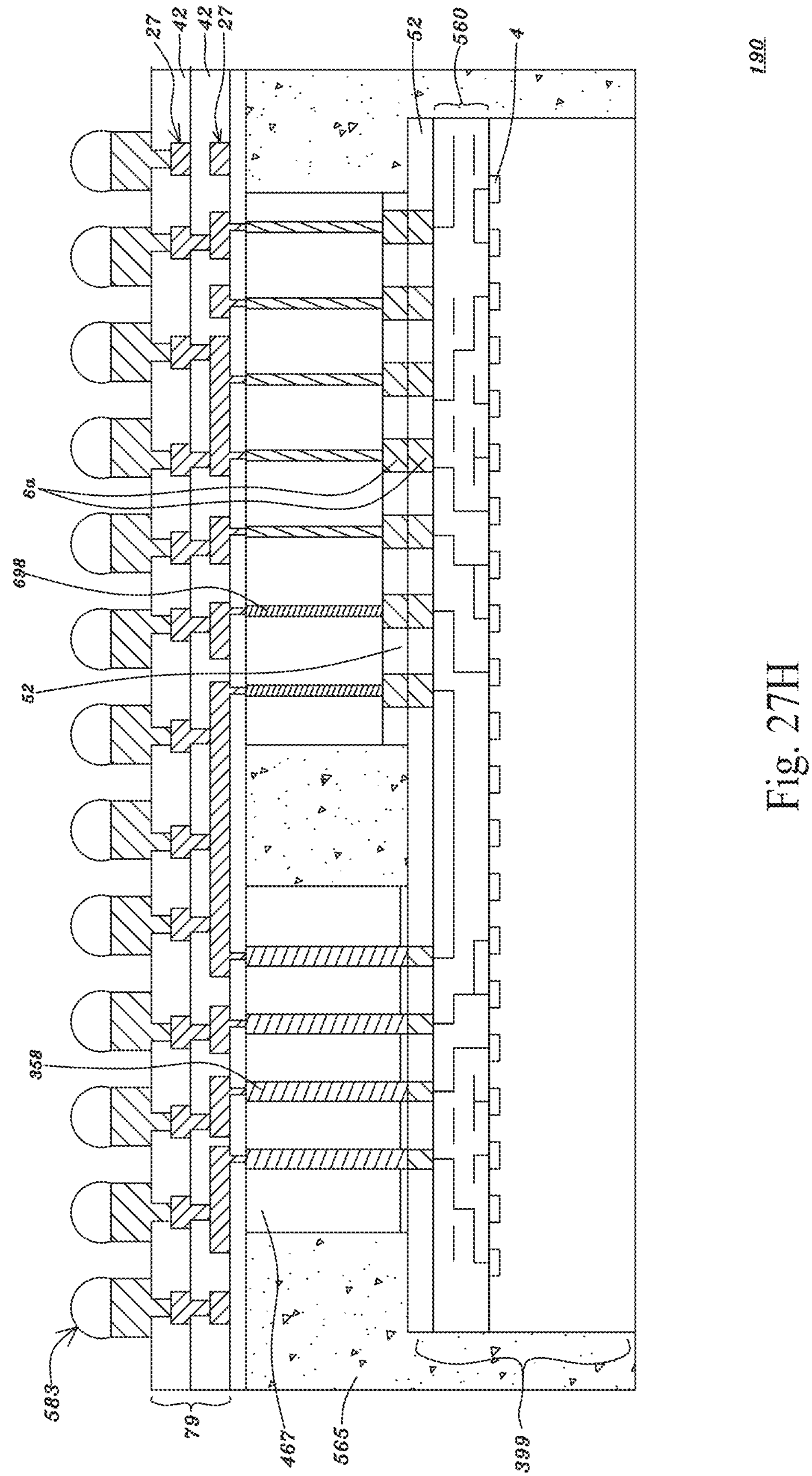

Alternatively, FIGS. 26H and 27H are schematically cross-sectional views showing various third type of operation modules in accordance with an embodiment of the present application. For an element indicated by the same reference number shown in FIGS. 26A-26H or 27A-27H, the specification of the element as seen in FIGS. 26H and 27H may be referred to that of the element as illustrated in FIG. 26A-26G or 27A-27G. The process for forming the third type of operation module as seen in FIGS. 26H and 27H is similar to that for forming the first type of operation module as illustrated in FIGS. 21G and 23G, and the process for forming the third type of operation module as seen in FIGS. 26H and 27H may be referred to that for forming the first type of operation module as illustrated in FIGS. 21G and 23G. The difference therebetween is that each of the known-good semiconductor chips 405 formed for the first type of operation module 190 as illustrated in FIGS. 21G and 23G may be replaced with the first type of vertical-through-via (VTV) connector 467 as illustrated in FIGS. 26A-26F, that is, each of the first type of vertical-through-via (VTV) connectors 467 may be held by the bonding head 162 as seen in FIG. 26B to have its first, second or third type of micro-bumps or micro-pillars 34 to be bonded to the first, second or fourth type of micro-bumps or micro-pillars 34 preformed at the active sides of one of the known-good application specific integrated-circuit (ASIC) logic chips 399 into multiple bonded contacts 563 respectively therebetween. Alternatively, each of the known-good semiconductor chips 405 formed for the first type of operation module 190 as illustrated in FIGS. 21G and 23G may be replaced with the second type of vertical-through-via (VTV) connector 467 as illustrated in FIGS. 27A-27F, that is, each of the second type of vertical-through-via (VTV) connectors 467 may join one of the known-good application specific integrated-circuit (ASIC) logic chips 399 by (1) picking up, by a bonding head 162, said each of the second type of vertical-through-via (VTV) connectors 467 to be placed on said one of the known-good application specific integrated-circuit (ASIC) logic chips 399 with each of the vertical through vias (VTVs) 358 of said each of the second type of vertical-through-via (VTV) connectors 467 in contact with one of the metal pads 6*a* at the active side of said one of the known-good application specific integrated-circuit (ASIC) logic chips 399 and with the joining surface of the insulating bonding layer 52 of said each of the second type of vertical-through-via (VTV) connectors 467 in contact with the joining surface of the insulating bonding layer 52 at the active side of said one of the application specific integrated-circuit (ASIC) logic chips 399, and (3) next performing a direct bonding process including (a) oxide-to-oxide bonding at a temperature between 100 and 200 degrees Celsius and for a time period between 5 and 20 minutes to bond the joining surface of the insulating bonding layer 52 of said each of the second type of vertical-through-via (VTV) connectors 467 to the joining surface of the insulating bonding layer 52 at the active side of said one of the known-good application specific integrated-circuit (ASIC) logic chips 399 and (b) copper-to-copper bonding at a temperature between 300 and 350 degrees Celsius and for a time period between 10 and 60 minutes to bond the copper layer 156 of each of the through vertical vias (VTVs) 358 of said each of the second type of vertical-through-via (VTV) connectors 467 to the copper layer 24 of one of the metal pads 6*a* at the active side of said one of the known-good application specific integrated-circuit (ASIC) logic chips 399, wherein the oxide-to-oxide bonding may be caused by water desorption from reaction between the joining surface of the insulating bonding layer 52 of said each of the second type of vertical-through-via (VTV) connectors 467 and the joining surface of the insulating bonding layer 52 at the active side of said one of the known-good application specific integrated-circuit (ASIC) logic chips 399, and the copper-to-copper bonding may be caused by metal inter-diffusion between the copper layer 156 of each of the vertical through vias (VTVs) 358 of said each of the second type of vertical-through-via (VTV) connectors 467 and the copper layer 24 of one of the metal pads 6*a* at the active side of said one of the known-good application specific integrated-circuit (ASIC) logic chips 399.

Figure 26I:
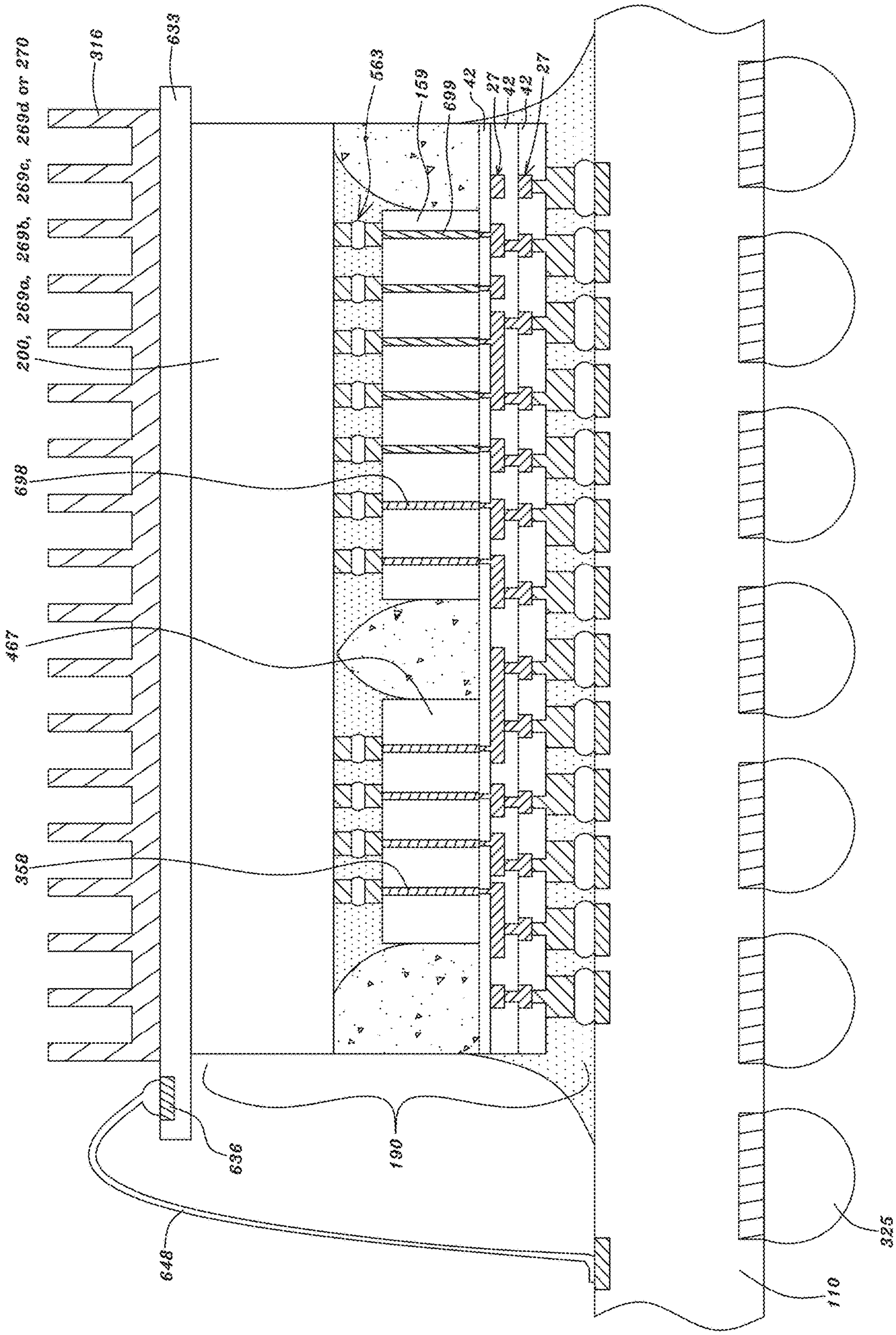
FIGS. 26I and 27I are schematically cross-sectional views showing various chip packages based on various third type of operation modules in accordance with an embodiment of the present application.
Figure 27I:
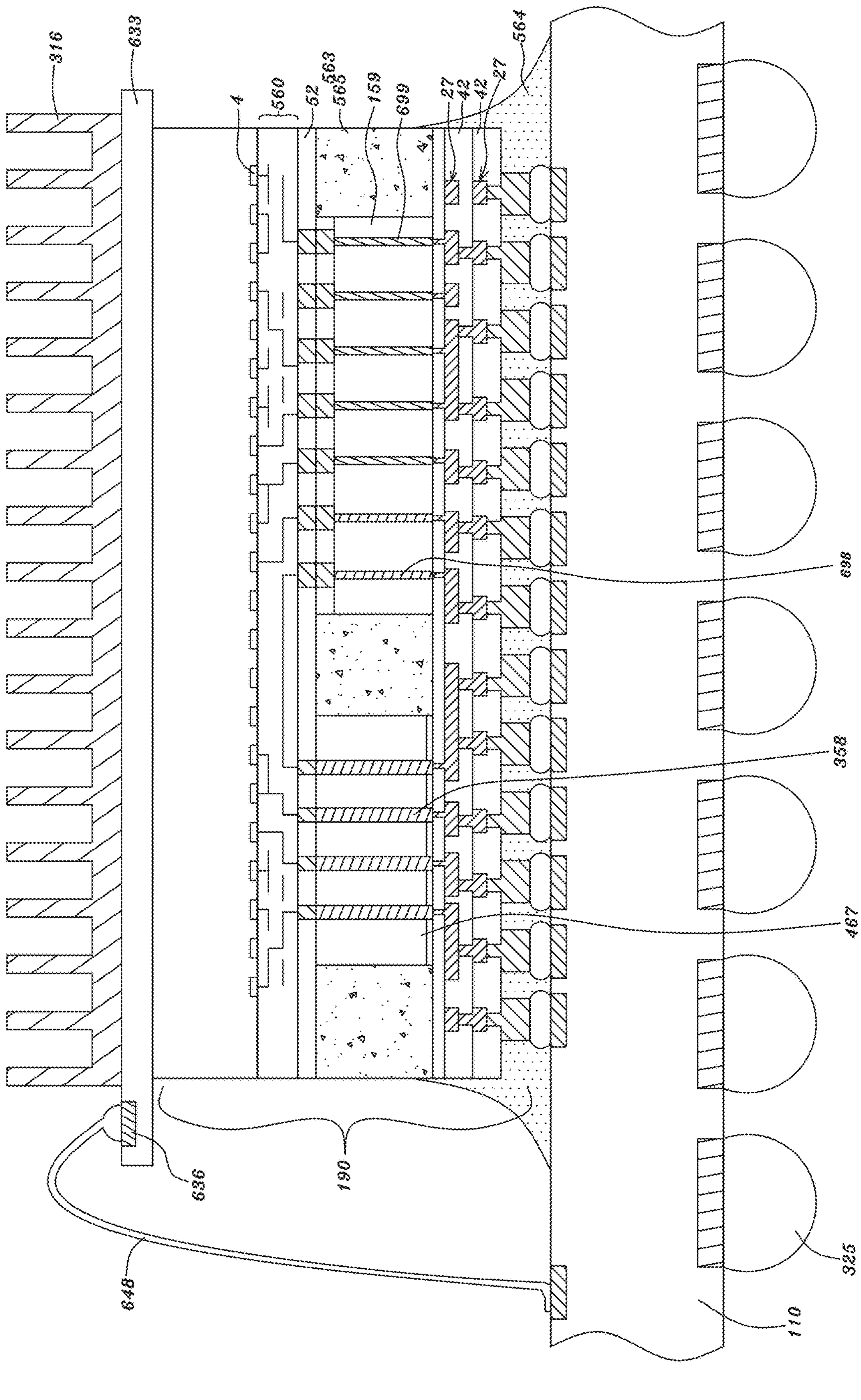

FIGS. 26I and 27I are schematically cross-sectional views showing various chip packages based on various third type of operation modules in accordance with an embodiment of the present application. Referring to FIGS. 26I and 27I, the third type of operation module 190 as illustrated in FIG. 26F, 26G, 26H, 27F, 27G or 27H may have the metal bumps 583 to be bonded to multiple metal pads of a circuit substrate 110, such as printed circuit board, ball-grid-array (BGA) substrate, flexible circuit film or tape, or ceramic circuit substrate, at a top side of the circuit substrate 110. The third type of operation module 190 as illustrated in FIG. 26F is taken as an example herein for the chip package shown in FIG. 26I. The third type of operation module 190 as illustrated in FIG. 27F is taken as an example herein for the chip package shown in FIG. 27I. Next, an underfill 564, such as epoxy resins or compounds, may be filled into a gap between the third type of operation module 190 and the circuit substrate 110 to enclose the metal bumps 583 therebetween. Next, a heat dissipation module having the thermoelectric (TE) cooler 633 as illustrated in FIG. 18A and a heat sink 316 attached to a hot side of its thermoelectric (TE) cooler 633 is provided to attach the cold side of its thermoelectric (TE) cooler 633 to the backside of the known-good application specific integrated-circuit (ASIC) logic chip 399 of the third type of operation module 190 as illustrated in FIG. 26F, 26G, 26H, 27F, 27G or 27H. Next, multiple wires 648 (only one is shown) may be provided each having a terminal bonded by a wirebonding process to the patterned circuit layer 636 of the thermoelectric (TE) cooler 633 as illustrated in FIG. 18A and another terminal bonded by the wirebonding process to another metal pad of the circuit substrate 110. Next, a polymer encapsulant (not shown) may be formed to enclose the wires 648 to protect the wires 648 from being damaged due to external forces. Next, multiple solder balls 325 such as tin-lead alloy or tin-silver alloy may be formed at a bottom side of the circuit substrate 110.

4. Fourth Type of Operation Module

Figure 28A:
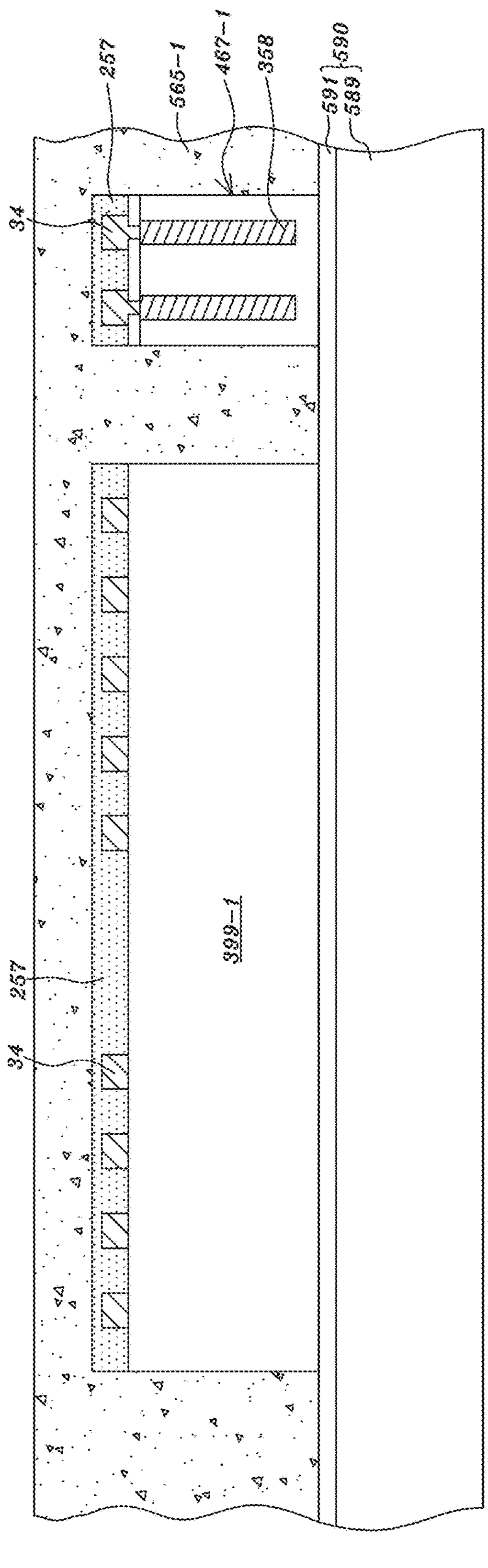
FIGS. 28A-28J are schematically cross-sectional views showing a process for fabricating a fourth type of operation module in accordance with an embodiment of the present application.

FIGS. 28A-28J are schematically cross-sectional views showing a process for fabricating a fourth type of operation module in accordance with an embodiment of the present application. Referring to FIG. 28A, a temporary substrate 590 may be provided with a glass or silicon substrate 589 and a sacrificial bonding layer 591 formed on the glass or silicon substrate 589. The sacrificial bonding layer 591 may have the glass or silicon substrate 589 to be easily debonded or released from a structure subsequently formed on the sacrificial bonding layer 591. For example, the sacrificial bonding layer 591 may be a material of light-to-heat conversion (LTHC) that may be deposited on the glass or silicon substrate 589 by printing or spin-on coating and then cured or dried with a thickness of about 1 micrometer or between 0.5 and 2 micrometers. The LTHC material may be a liquid ink containing carbon black and binder in a mixture of solvents.

Next, referring to FIG. 28A, multiple first known-good semiconductor chips that may be first application specific integrated-circuit (ASIC) chips 399-1, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, each may be provided with the first and/or second interconnection scheme(s) 560 and/or 588 and first type of micro-bumps or micro-pillars 34 as illustrated in FIG. 17A. Each of the first known-good application specific integrated-circuit (ASIC) chips 399-1 may further include an insulating dielectric layer 257, such as polymer layer, on top of the first and/or second interconnection scheme(s) 560 and/or 588 thereof, covering a top surface of its first type of micro-bumps or micro-pillars 34 thereof. Each of the first known-good application specific integrated-circuit (ASIC) chips 399-1 may have a backside to be attached to the sacrificial bonding layer 591 of the temporary substrate 590.

Further, referring to FIG. 28A, multiple first type of vertical-through-via (VTV) connectors 467-1 (only one is shown), each of which may be one as illustrated in any of FIGS. 1F, 1I, 1L, 2D, 2G and 2J, may be provided with the first type of micro-bumps or micro-pillars 34. Alternatively, each of the first type of vertical-through-via (VTV) connectors 467-1 may have a structure as illustrated in any of FIGS. 5J, 5L, 5N, 6D, 6F and 6H, but its fifth type of micro-bumps or micro-pillars 34 is replaced with the first type of micro-bumps or micro-pillars 34 as illustrated in FIG. 1F. Alternatively, each of the first type of vertical-through-via (VTV) connectors 467-1 may have a structure as illustrated in any of FIG. 7E, but its sixth type of micro-bumps or micro-pillars 34 is replaced with the first type of micro-bumps or micro-pillars 34 as illustrated in FIG. 1F. Each of the first type of vertical-through-via (VTV) connectors 467-1 may further include an insulating dielectric layer 257, such as polymer, at a top thereof, covering a top surface of its first type of micro-bumps or micro-pillars 34. Each of the first type of vertical-through-via (VTV) connectors 467-1 may have a backside to be attached to the sacrificial bonding layer 591 of the temporary substrate 590.

Next, referring to FIG. 28A, a first polymer layer 565-1, e.g., resin or compound, may be applied to fill a gap between each neighboring two of the first known-good application specific integrated-circuit (ASIC) chips 399-1 and the first type of vertical-through-via (VTV) connectors 467-1 and to cover the insulating dielectric layer 257 of each of the first known-good application specific integrated-circuit (ASIC) chips 399-1 and first type of vertical-through-via (VTV) connectors 467-1 by methods, for example, spin-on coating, screen-printing, dispensing or molding. The first polymer layer 565-1 may be, for example, polyimide, BenzoCycloButene (BCB), parylene, epoxy-based material or compound, photo epoxy SU-8, elastomer, or silicone. The first polymer layer 565-1 may be cured or cross-linked at a temperature higher than or equal to 50, 70, 90, 100, 125, 150, 175, 200, 225, 250, 275 or 300 degrees Celsius.

Figure 28B:
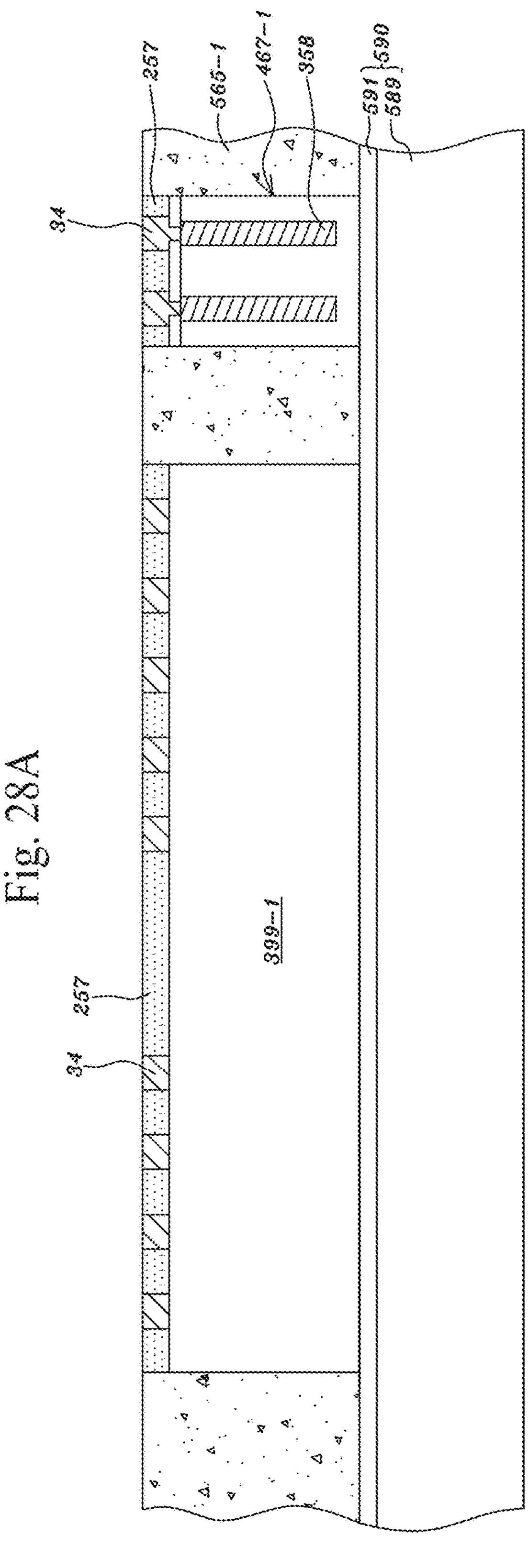

Next, referring to FIG. 28B, a chemical mechanical polishing (CMP), polishing or grinding process may be applied to remove a top portion of the first polymer layer 565-1 and a top portion of the insulating dielectric layer 257 each of the first known-good application specific integrated-circuit (ASIC) chips 399-1 and first type of vertical-through-via (VTV) connectors 467-1 and to planarize a top surface of the first polymer layer 565-1, the top of each of the first type of micro-bumps or micro-pillars 34 of each of the first known-good application specific integrated-circuit (ASIC) chips 399-1 and first type of vertical-through-via (VTV) connectors 467-1. Thereby, the top of each of the first type of micro-bumps or micro-pillars 34 of each of the first known-good application specific integrated-circuit (ASIC) chips 399-1 and first type of vertical-through-via (VTV) connectors 467-1 may be exposed.

Figure 28C:
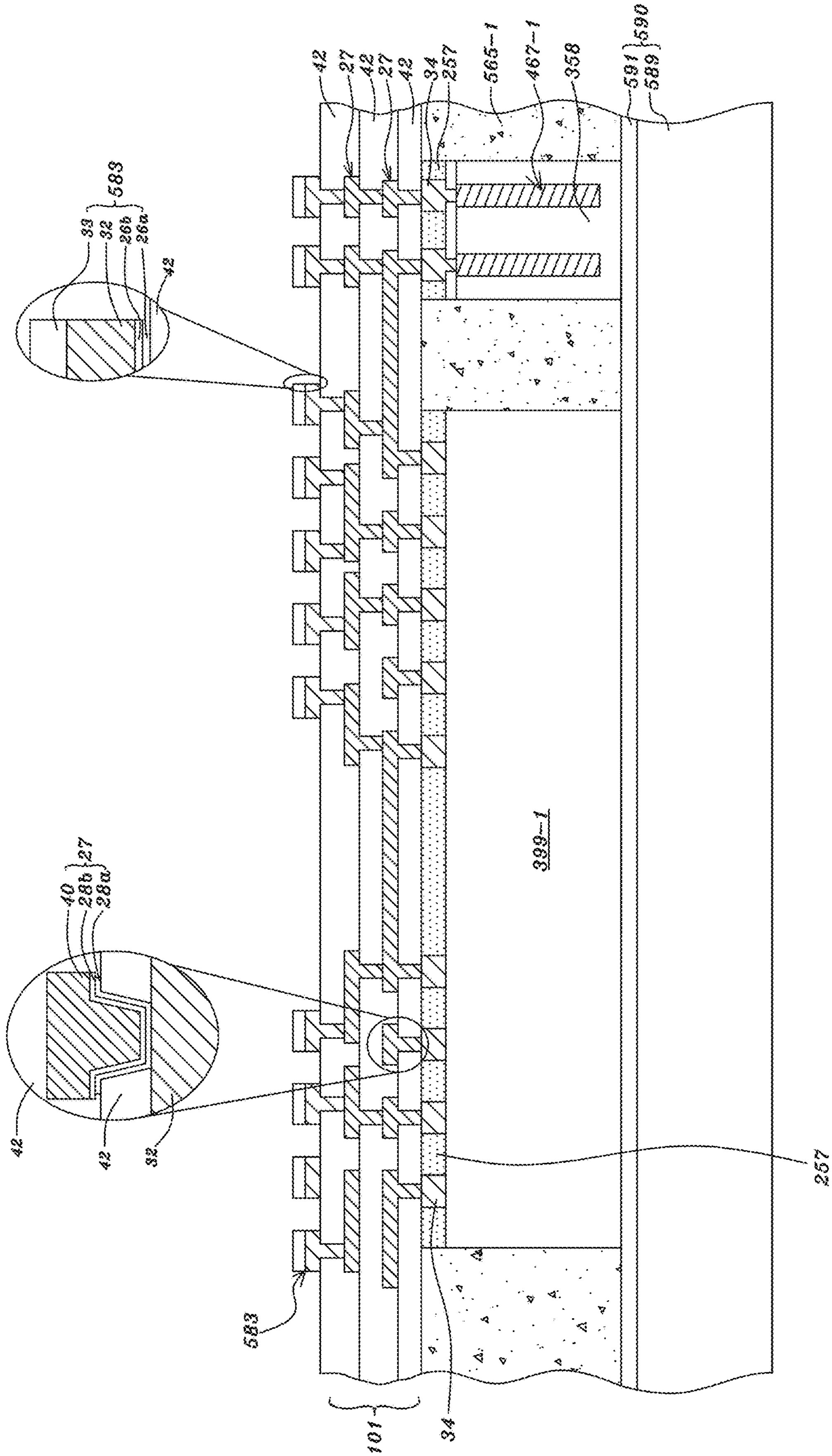

Referring to FIG. 28C, a frontside interconnection scheme 101 may be formed on the first polymer layer 565-1 and over the first known-good application specific integrated-circuit (ASIC) chips 399-1 and first type of vertical-through-via (VTV) connectors 467-1. The frontside interconnection scheme 101 may include one or more interconnection metal layers 27 coupling to the first type of micro-bumps or micro-pillars 34 of each of the first known-good application specific integrated-circuit (ASIC) chips 399-1 and first type of vertical-through-via (VTV) connectors 467-1, and one or more polymer layers 42, i.e., insulating dielectric layers, each between neighboring two of its interconnection metal layers 27, between a bottommost one of its interconnection metal layers 27 and a polished planar surface composed of a top surface of each of the first type of micro-bumps or micro-pillars 34 of each of the first known-good application specific integrated-circuit (ASIC) chips 399-1 and first type of vertical-through-via (VTV) connectors 467-1, the insulating dielectric layer 257 of each of the first known-good application specific integrated-circuit (ASIC) chips 399-1 and first type of vertical-through-via (VTV) connectors 467-1, and a top surface of the first polymer layer 565-1, or on and above a topmost one of its interconnection metal layers 27, wherein the topmost one of its interconnection metal layers 27 may have multiple metal pads at bottoms of multiple openings 42*a* in the topmost one of its polymer layers 42. Each of the interconnection metal layers 27 and polymer layers 42 of the frontside interconnection scheme 101 may have the same specification as that of the backside interconnection scheme 79 as illustrated in FIG. 21E.

Referring to FIG. 28C, multiple micro-bumps or micro-pillars 34 may be formed on the metal pads of the topmost one of the interconnection metal layers 27 of the frontside interconnection scheme 101 at the bottoms of the openings 42*a* in the topmost one of the polymer layers 42 of the frontside interconnection scheme 101. The micro-bumps or micro-pillars 34 may be of first, second or fourth type having the same specifications as the first, second or fourth type of micro-bumps or micro-pillars 34 as illustrated in FIG. 1F, respectively.

Figure 28D:
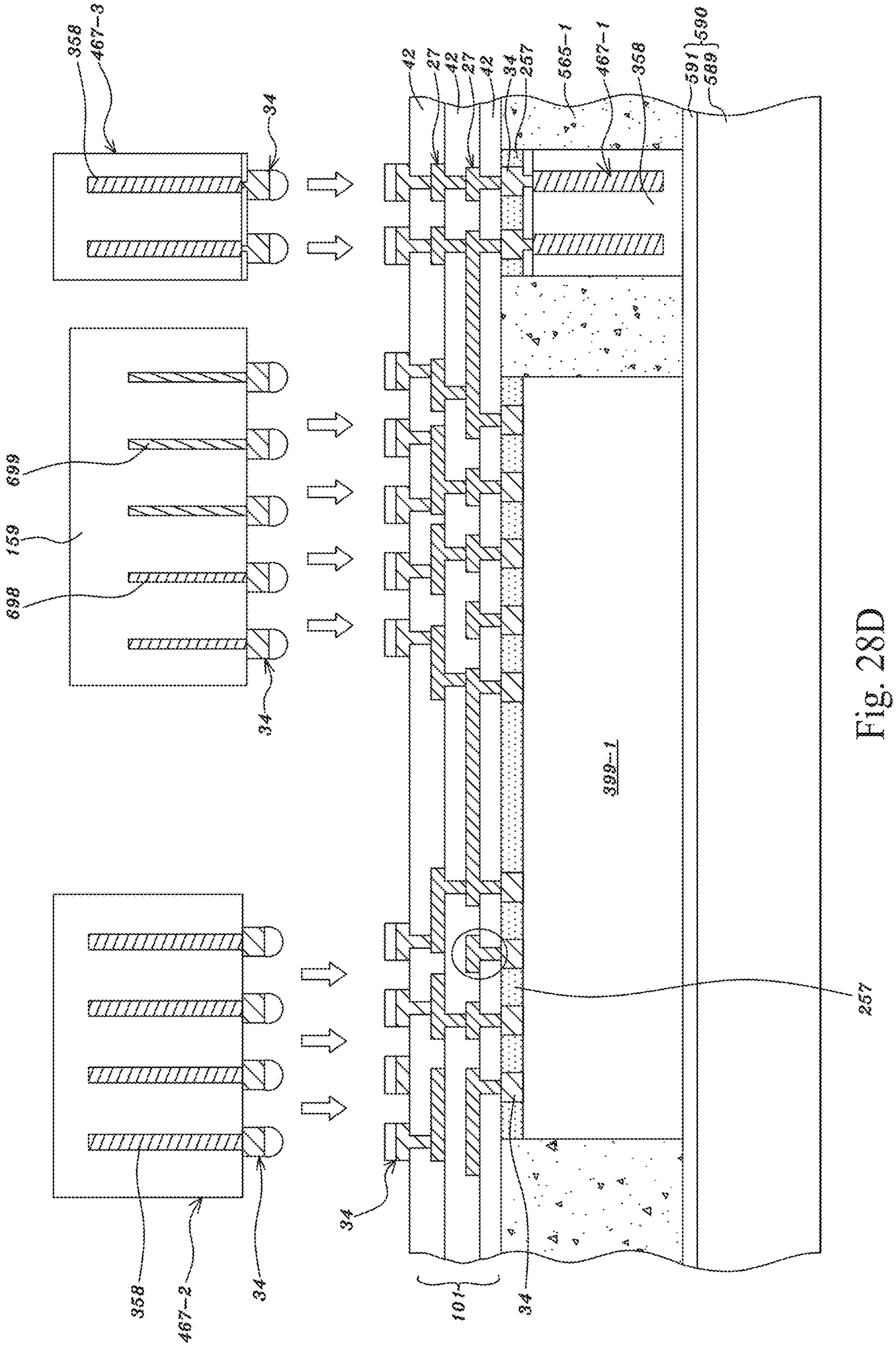
Figure 28E:
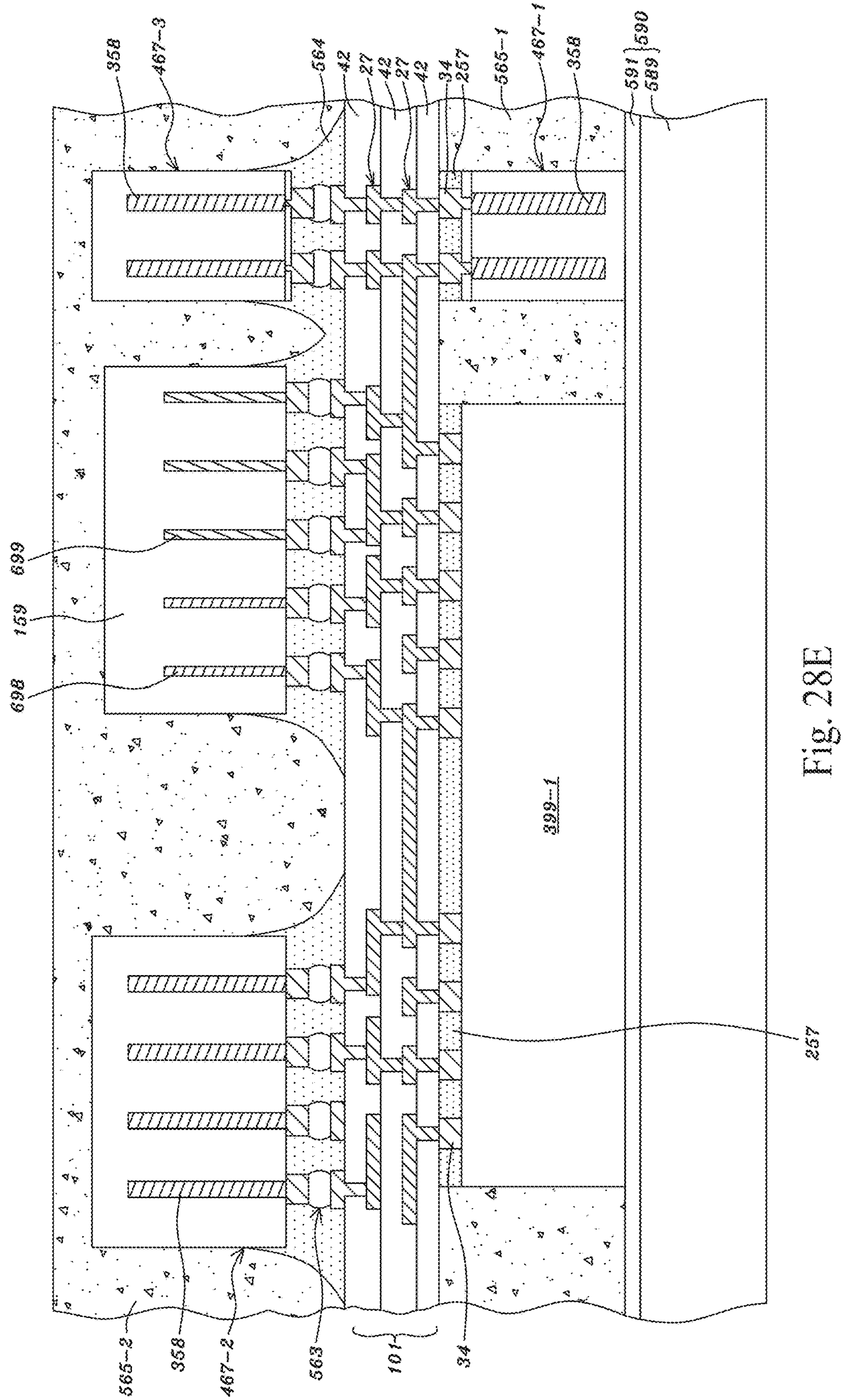

Referring to FIGS. 28D and 28E, each of the first or second type of memory modules 159 (only one is shown) as illustrated in FIGS. 19A and 19B may be provided to have its first, second or third type of micro-bumps or micro-pillars 34 to be bonded to the first, second or fourth type of micro-bumps or micro-pillars 34 at a top side of the frontside interconnection scheme 101 into multiple bonded contacts 563 therebetween, as referred to any of the first through fourth cases illustrated in FIGS. 21A-21C. Each of the first or second type of memory modules 159 may extend across over an edge of one of the first known-good application specific integrated-circuit (ASIC) chips 399-1. Alternatively, each of the first or second type of memory modules 159 may be replaced with a known-good memory chip, such as high-bit-width memory chip, DRAM IC chip, SRAM IC chip, MRAM IC chip, RRAM IC chip, PCM IC chip or FRAM IC chip either having the first and/or second interconnection scheme(s) 560 and/or 588 as illustrated in FIG. 17A or further having the through silicon vias (TSVs) 157 as illustrated in FIG. 17B, to be provided to have its first, second or third type of micro-bumps or micro-pillars 34 to be bonded to the first, second or fourth type of micro-bumps or micro-pillars 34 at a top side of the frontside interconnection scheme 101 into multiple bonded contacts 563 therebetween. Alternatively, each of the first or second type of memory modules 159 may be replaced with a known-good logic chip, such as field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, network-processing-unit (NPU) integrated-circuit (IC) chip, application-processing-unit (APU) integrated-circuit (IC) chip or digital-signal-processing (DSP) integrated-circuit (IC) chip either having the first and/or second interconnection scheme (s) 560 and/or 588 as illustrated in FIG. 17A or further having the through silicon vias (TSVs) 157 as illustrated in FIG. 17B, to be provided to have its first, second or third type of micro-bumps or micro-pillars 34 to be bonded to the first, second or fourth type of micro-bumps or micro-pillars 34 at a top side of the frontside interconnection scheme 101 into multiple bonded contacts 563 therebetween. Alternatively, each of the first or second type of memory modules 159 may be replaced with another known-good application-specific-integrated-circuit (ASIC) chip, such as auxiliary and supporting (AS) integrated-circuit (IC) chip 411, dedicated I/O chip 265 or dedicated control and I/O chip 260 as illustrated in FIGS. 13, 14A and 14B either having the first and/or second interconnection scheme(s) 560 and/or 588 as illustrated in FIG. 17A or further having the through silicon vias (TSVs) 157 as illustrated in FIG. 17B, to be held by the bonding head 161 to have its first, second or third type of micro-bumps or micro-pillars 34 to be bonded to the first, second or fourth type of micro-bumps or micro-pillars 34 at a top side of the frontside interconnection scheme 101 into multiple bonded contacts 563 respectively therebetween.

Next, referring to FIGS. 28D and 28E, multiple first type of vertical-through-via (VTV) connectors 467-2 and 467-3, each of which may be one as illustrated in any of FIGS. 1F, 1I, 1L, 2D, 2G, 2J, 5J, 5L, 5N, 6D, 6F, 6H and 7E, may be provided with the first, second, third, fifth or sixth type of micro-bumps or micro-pillars 34. For a case, each of the first type of vertical-through-via (VTV) connectors 467-2 and 467-3 as illustrated in FIG. 1F, 1I, 1L, 2D, 2G or 2J may be provided to have its first, second or third type of micro-bumps or micro-pillars 34 to be bonded to the first, second or fourth type of micro-bumps or micro-pillars 34 at a top side of the frontside interconnection scheme 101 into multiple bonded contacts 563 therebetween, as referred to any of the first through fourth cases illustrated in FIGS. 21A-21C. For another case, each of the first type of vertical-through-via (VTV) connectors 467-2 and 467-3 as illustrated in FIG. 5J, 5L, 5N, 6D, 6F or 6H may be provided to have its fifth type of micro-bumps or micro-pillars 34 to be bonded to the first or second type of micro-bumps or micro-pillars 34 at a top side of the frontside interconnection scheme 101 into multiple bonded contacts 563 therebetween, as referred to the process illustrated in FIGS. 26B and 26C for bonding the fifth type of micro-bumps or micro-pillars 34 of the first type of vertical-through-via (VTV) connector 467 to the first or second type of micro-bumps or micro-pillars 34 preformed at the active side of the semiconductor wafer 100*b*. For another case, each of the first type of vertical-through-via (VTV) connectors 467-2 and 467-3 as illustrated in FIG. 7E may be provided to have its sixth type of micro-bumps or micro-pillars 34 to be bonded to the first or second type of micro-bumps or micro-pillars 34 at a top side of the frontside interconnection scheme 101 into multiple bonded contacts 563 respectively therebetween, as referred to the process illustrated in FIGS. 26B and 26C for bonding the sixth type of micro-bumps or micro-pillars 34 of the first type of vertical-through-via (VTV) connector 467 to the first or second type of micro-bumps or micro-pillars 34 preformed at the active side of the semiconductor wafer 100*b*. Each of the first type of vertical-through-via (VTV) connectors 467-2 may extend across over an edge of one of the first known-good application specific integrated-circuit (ASIC) chips 399-1. Each of the first type of vertical-through-via (VTV) connectors 467-3 may be arranged vertically over one of the first type of vertical-through-via (VTV) connectors 467-1, wherein each of the bonded contacts 563 between each of the first type of vertical-through-via (VTV) connectors 467-3 and the frontside interconnection scheme 101 may be formed vertically over one of the first type of micro-bumps or micro-pillars 34 of the first type of vertical-through-via (VTV) connectors 467-1.

Next, referring to FIG. 28E, an underfill 564, such as epoxy resins or compounds, may be filled into a gap between each of the first type of vertical-through-via (VTV) connectors 467-2 and the frontside interconnection scheme 101 to enclose the bonded contacts 563 therebetween, into a gap between each of the first type of vertical-through-via (VTV) connectors 467-3 and the frontside interconnection scheme 101 to enclose the bonded contacts 563 therebetween and into a gap between each of the first or second type of memory modules 159, or known-good memory or logic chips or known-good ASIC chips, and the frontside interconnection scheme 101 to enclose the bonded contacts 563 therebetween. The underfill 564 may be cured at temperature equal to or above 100, 120 or 150 degrees Celsius.

Next, referring to FIG. 28E, a second polymer layer 565-2, e.g., resin or compound, may be applied to fill a gap between each neighboring two of the first or second type of memory modules 159, or known-good memory or logic chips or known-good ASIC chips, and first type of vertical-through-via (VTV) connectors 467-2 and a gap between each neighboring two of the first or second type of memory modules 159, or known-good memory or logic chips or known-good ASIC chips, and first type of vertical-through-via (VTV) connectors 467-3 and to cover a backside of each of the first or second type of memory modules 159, or known-good memory or logic chips or known-good ASIC chips, and a backside of each of the first type of vertical-through-via (VTV) connectors 467-2 and 467-3 by methods, for example, spin-on coating, screen-printing, dispensing or molding. The second polymer layer 565-2 may be, for example, polyimide, BenzoCycloButene (BCB), parylene, epoxy-based material or compound, photo epoxy SU-8, elastomer, or silicone. The second polymer layer 565-2 may be cured or cross-linked at a temperature higher than or equal to 50, 70, 90, 100, 125, 150, 175, 200, 225, 250, 275 or 300 degrees Celsius.

Figure 28F:
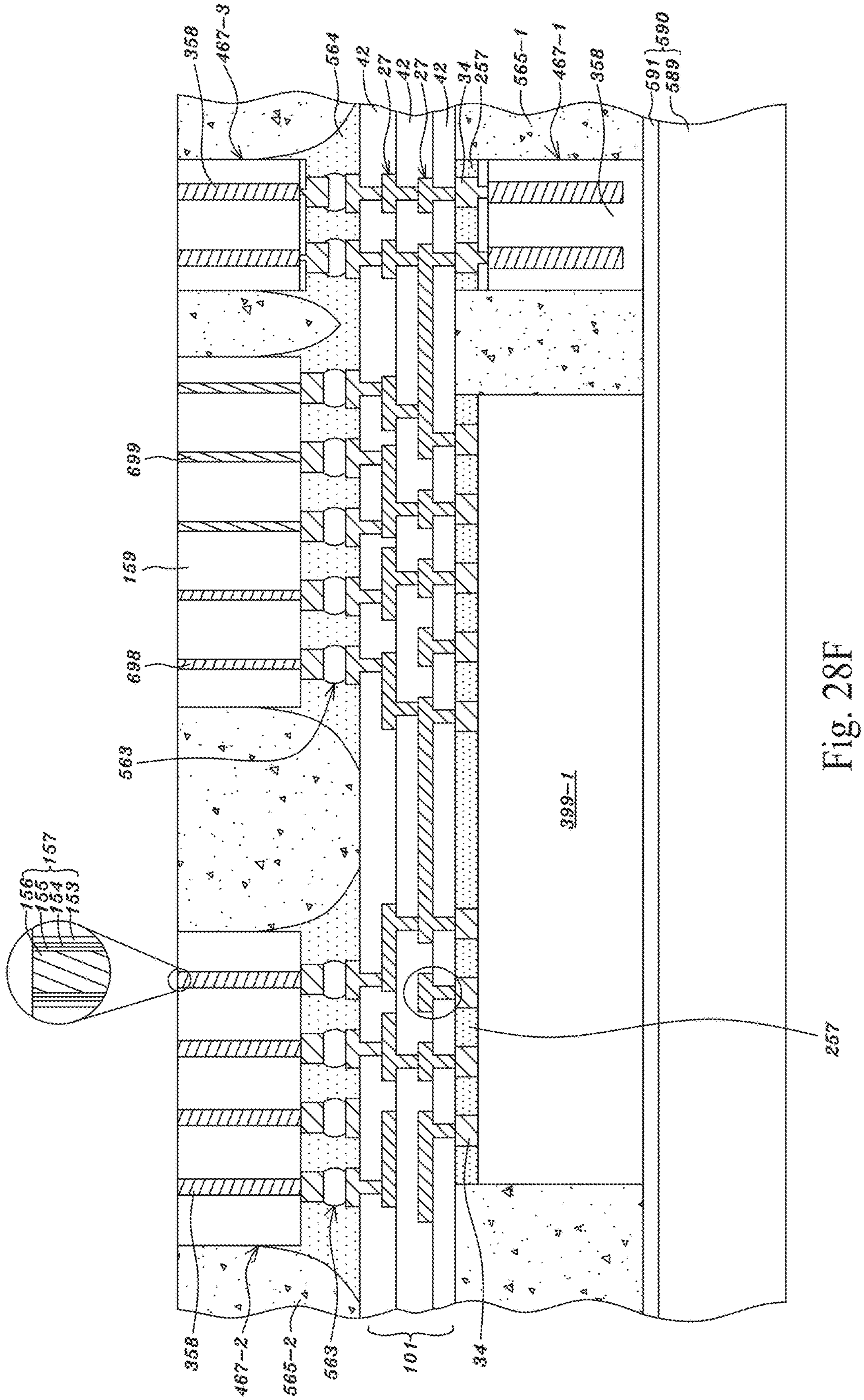

Next, referring to FIG. 28F, a chemical mechanical polishing (CMP), polishing or grinding process may be applied to remove a top portion of the second polymer layer 565-2, a top portion of each of the first or second type of memory modules 159, or known-good memory or logic chips or known-good ASIC chips, and a top portion of each of the first type of vertical-through-via (VTV) connectors 467-2 and 467-3, to planarize a top surface of the second polymer layer 565-2, a top surface of each of the first or second type of memory modules 159, or known-good memory or logic chips or known-good ASIC chips, and a top surface of each of the first type of vertical-through-via (VTV) connectors 467-2 and 467-3 and to expose a backside of each of the vertical through vias (VTVs) 358 of each of the first type of vertical-through-via (VTV) connectors 467-2 and 467-3 and, optionally, a backside of the copper layer 156 of each of the through silicon vias (TSVs) 157 of the topmost one of the memory chips 251 of each of the first or second type of memory modules 159, or a backside of the copper layer 156 of the through silicon vias (TSVs) 157 of each of the known-good memory or logic chips or known-good ASIC chips in case of replacing the first or second type of memory modules 159. Optionally, for each of the through silicon vias (TSVs) 157 of the topmost one of the memory chips 251 of said each of the first or second type of memory modules 159, or said each of the known-good memory or logic chips or known-good ASIC chips in case of replacing the first or second type of memory modules 159, its insulating lining layer 153, adhesion layer 154 and seed layer 155 at its backside may be removed and its insulating lining layer 153, adhesion layer 154 and seed layer 155 may be left at a sidewall of its copper layer 156.

For each of the vertical through vias (VTVs) 358 of said each of the first type of vertical-through-via (VTV) connectors 467-2 and 467-3, if made of one or more of the through silicon vias (TSVs) 157 as illustrated in one of FIGS. 1F, 1I, 1L, 2D, 2G and 2J, its insulating lining layer 153, adhesion layer 154 and seed layer 155 at its backside may be removed to expose its copper layer 156 and its insulating lining layer 153, adhesion layer 154 and seed layer 155 may be left at a sidewall of its copper layer 156. For each of the vertical through vias (VTVs) 358 of said each of the first type of vertical-through-via (VTV) connectors 467-2 and 467-3, if made of one or more of the through glass vias (TGVs) 259 as illustrated in one of FIGS. 5J, 5L, 5N, 6D, 6F and 6H, its adhesion layer 154 and seed layer 155 at its backside may be removed to expose its copper layer 156 and its adhesion layer 154 and seed layer 155 may be left at a sidewall of its copper layer 156. For each of the vertical through vias (VTVs) 358 of said each of the first type of vertical-through-via (VTV) connectors 467-2 and 467-3, if made of one or more of the through polymer vias (TPVs) 318 as illustrated in one of FIG. 7E, each of its metal pads 336 or copper posts 318 may be exposed to have a top surface coplanar with a top surface of the second polymer layer 565-2.

Figure 28G:
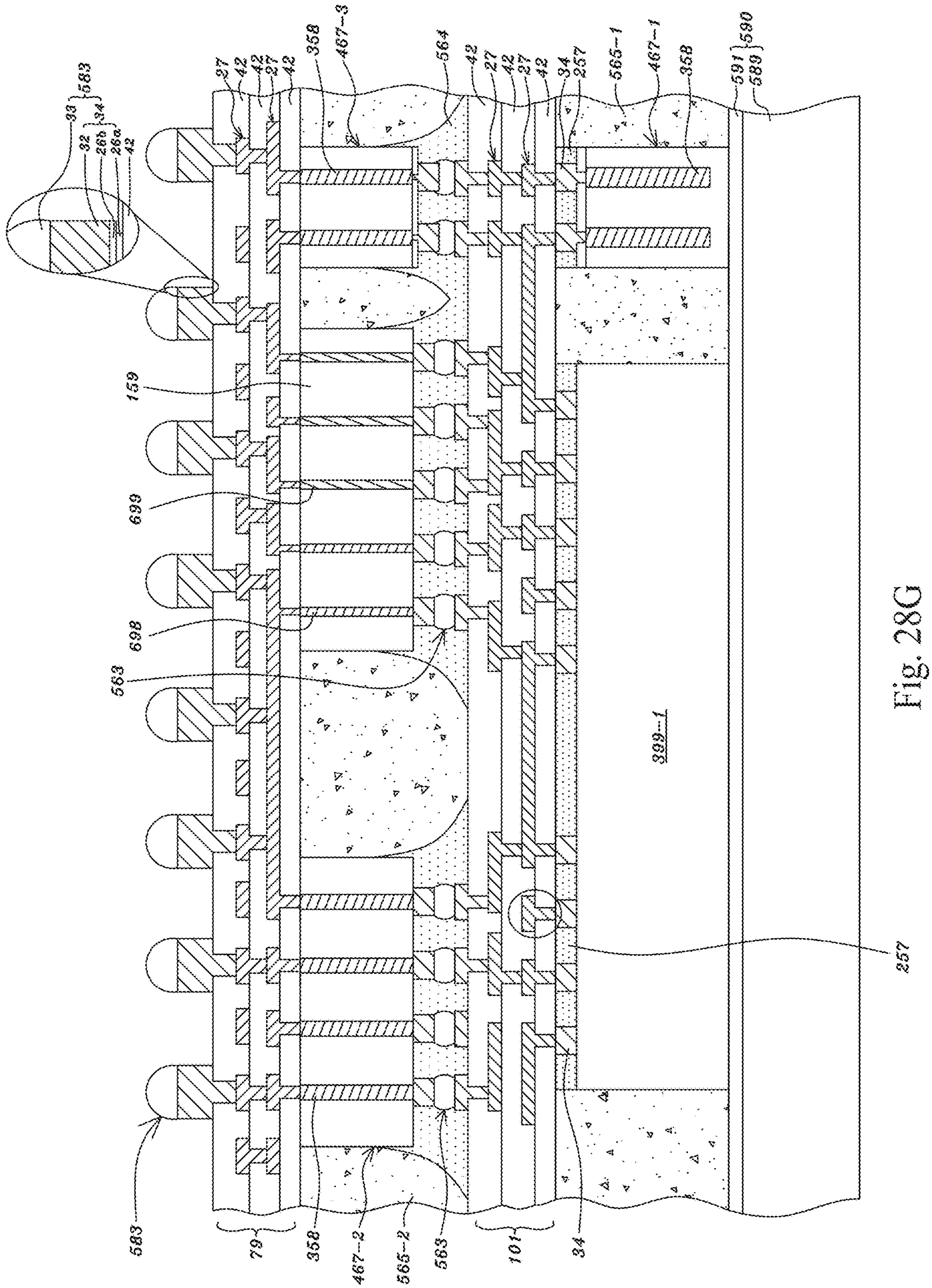

Referring to FIG. 28G, a backside interconnection scheme 79 for a device (BISD) may be formed on the top surface of the second polymer layer 565-2, the top surface of each of the first or second type of memory modules 159, or known-good memory or logic chips or known-good ASIC chips, and the top surface of each of the first type of vertical-through-via (VTV) connectors 467-2 and 467-3. The backside interconnection scheme 79 may include (1) one or more interconnection metal layers 27 each coupling to one or more of the vertical through vias (VTVs) 358 of each of the first type of vertical-through-via (VTV) connectors 467-2 and 467-3 and, optionally, to one or more of the through silicon vias (TSVs) 157 of the topmost one of the memory chips 251 of each of the first or second type of memory modules 159, or one or more of the through silicon vias (TSVs) 157 of each of the known-good memory or logic chips or known-good ASIC chips in case of replacing the first or second type of memory modules 159, and (2) one or more polymer layers 42, i.e., insulating dielectric layers, each between neighboring two of its interconnection metal layers 27, between a bottommost one of its interconnection metal layers 27 and a polished planar surface composed of the top surface of each of the first type of vertical-through-via (VTV) connectors 467-2 and 467-3, the top surface of each of the first or second type of memory modules 159, or known-good memory or logic chips or known-good ASIC chips, and the top surface of the second polymer layer 565-2 or on and above a topmost one of its interconnection metal layers 27, wherein the topmost one of its interconnection metal layers 27 may have multiple metal pads at bottoms of multiple openings 42*a* in the topmost one of its polymer layers 42. Each of the interconnection metal layers 27 and polymer layer 42 of the backside interconnection scheme 79 may have the same specifications as that as illustrated in FIGS. 21E and 23E.

Referring to FIG. 28G, multiple metal bumps 583, which may be of one of the first through fourth types having the same specifications as the first through fourth types of micro-bumps or micro-pillars 34 as illustrated in FIG. 1F respectively, may be formed on the metal pads of the topmost one of the interconnection metal layers 27 of the backside interconnection scheme 79 at the bottoms of the openings in the topmost one of the polymer layers 42 of the backside interconnection scheme 79.

Figure 28H:
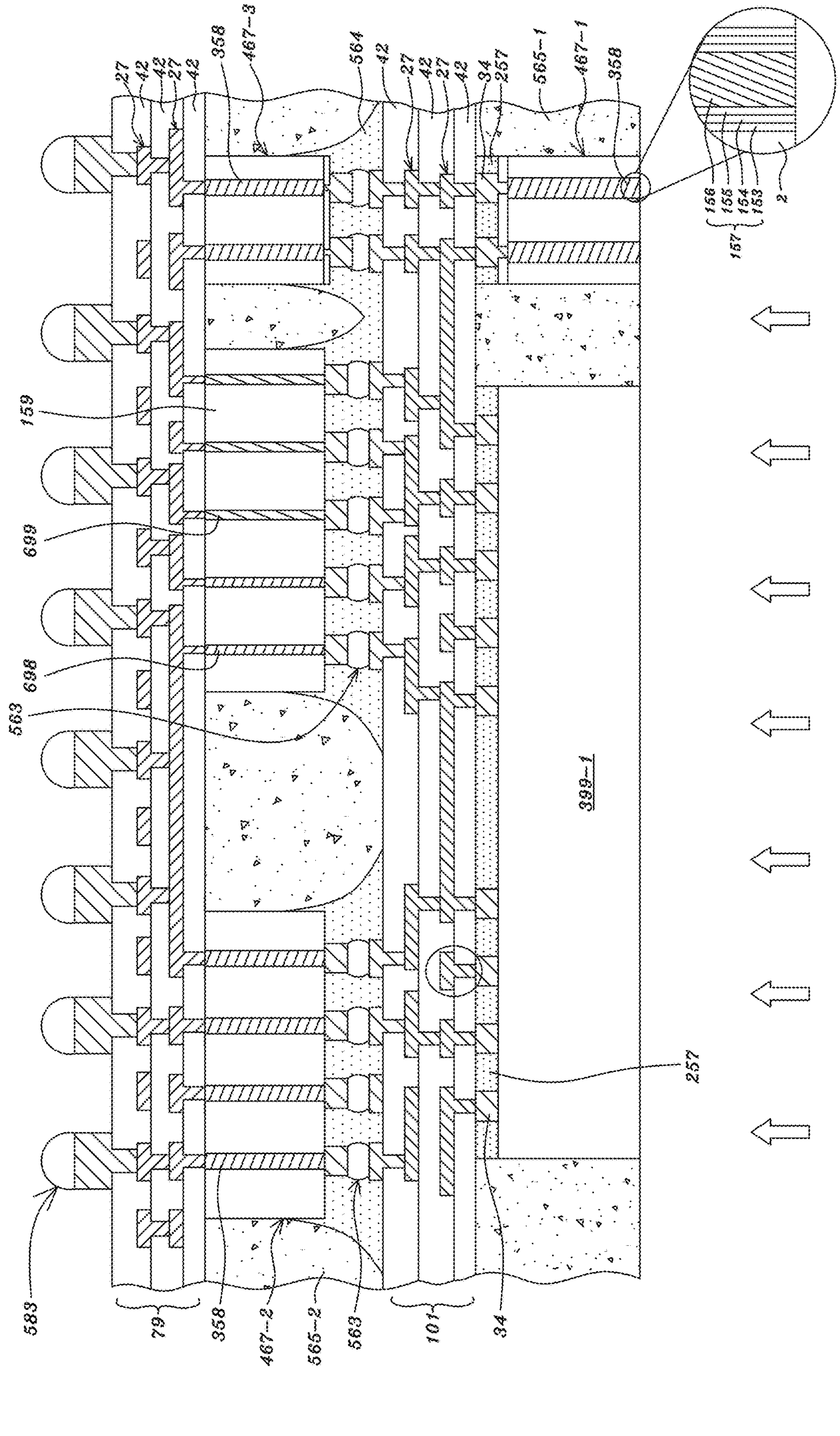

Next, referring to FIG. 28H, the glass or silicon substrate 589 may be released from the sacrificial bonding layer 591. For example, in the case that the sacrificial bonding layer 591 is the material of light-to-heat conversion (LTHC) and the substrate 589 is made of glass, a laser light, such as YAG laser having a wavelength of about 1064 nm, an output power between 20 and 50 W and a spot size of 0.3 mm in diameter at a focal point, may be generated to pass from the backside of the glass substrate 589 to the sacrificial bonding layer 591 through the glass substrate 589 to scan the sacrificial bonding layer 591 at a speed of 8.0 m/s, for example, such that the sacrificial bonding layer 591 may be decomposed and thus the glass substrate 589 may be easily released from the sacrificial bonding layer 591. Next, an adhesive peeling tape (not shown) may be attached to a bottom surface of the remainder of the sacrificial bonding layer 591. Next, the adhesive peeling tape may be peeled off to pull the remainder of the sacrificial bonding layer 591 attached to the adhesive peeling tape off the backside of each of the first known-good application specific integrated-circuit (ASIC) chips 399-1, the backside of each of the first type of vertical-through-via (VTV) connectors 467-1 and a bottom surface of the first polymer layer 565-1.

Next, referring to FIG. 28H, a chemical mechanical polishing (CMP), polishing or grinding process may be applied to remove a bottom portion of the first polymer layer 565-1, a bottom portion of each of the first known-good application specific integrated-circuit (ASIC) chips 399-1 and a bottom portion of each of the first type of vertical-through-via (VTV) connectors 467-1, to planarize a bottom surface of the first polymer layer 565-1, a bottom surface of each of the first known-good application specific integrated-circuit (ASIC) chips 399-1 and a bottom surface of each of the first type of vertical-through-via (VTV) connectors 467-1 and to expose a backside of each of the vertical through vias (VTVs) 358 of each of the first type of vertical-through-via (VTV) connectors 467-1. For each of the vertical through vias (VTVs) 358 of said each of the first type of vertical-through-via (VTV) connectors 467-1, if made of one or more of the through silicon vias (TSVs) 157 as illustrated in one of FIGS. 1F, 1I, 1L, 2D, 2G and 2J, its insulating lining layer 153, adhesion layer 154 and seed layer 155 at its backside may be removed to expose its copper layer 156 and its insulating lining layer 153, adhesion layer 154 and seed layer 155 may be left at a sidewall of its copper layer 156. For each of the vertical through vias (VTVs) 358 of said each of the first type of vertical-through-via (VTV) connectors 467-1, if made of one or more of the through glass vias (TGVs) 259 as illustrated in one of FIGS. 5J, SL, 5N, 6D, 6F and 6H, its adhesion layer 154 and seed layer 155 at its backside may be removed to expose its copper layer 156 and its adhesion layer 154 and seed layer 155 may be left at a sidewall of its copper layer 156. For each of the vertical through vias (VTVs) 358 of said each of the first type of vertical-through-via (VTV) connectors 467-1, if made of one or more of the through polymer vias (TPVs) 318 as illustrated in one of FIG. 7E, each of its metal pads 336 or copper posts 318 may be exposed to have a top surface coplanar with a bottom surface of the first polymer layer 565-1.

Figure 28I:
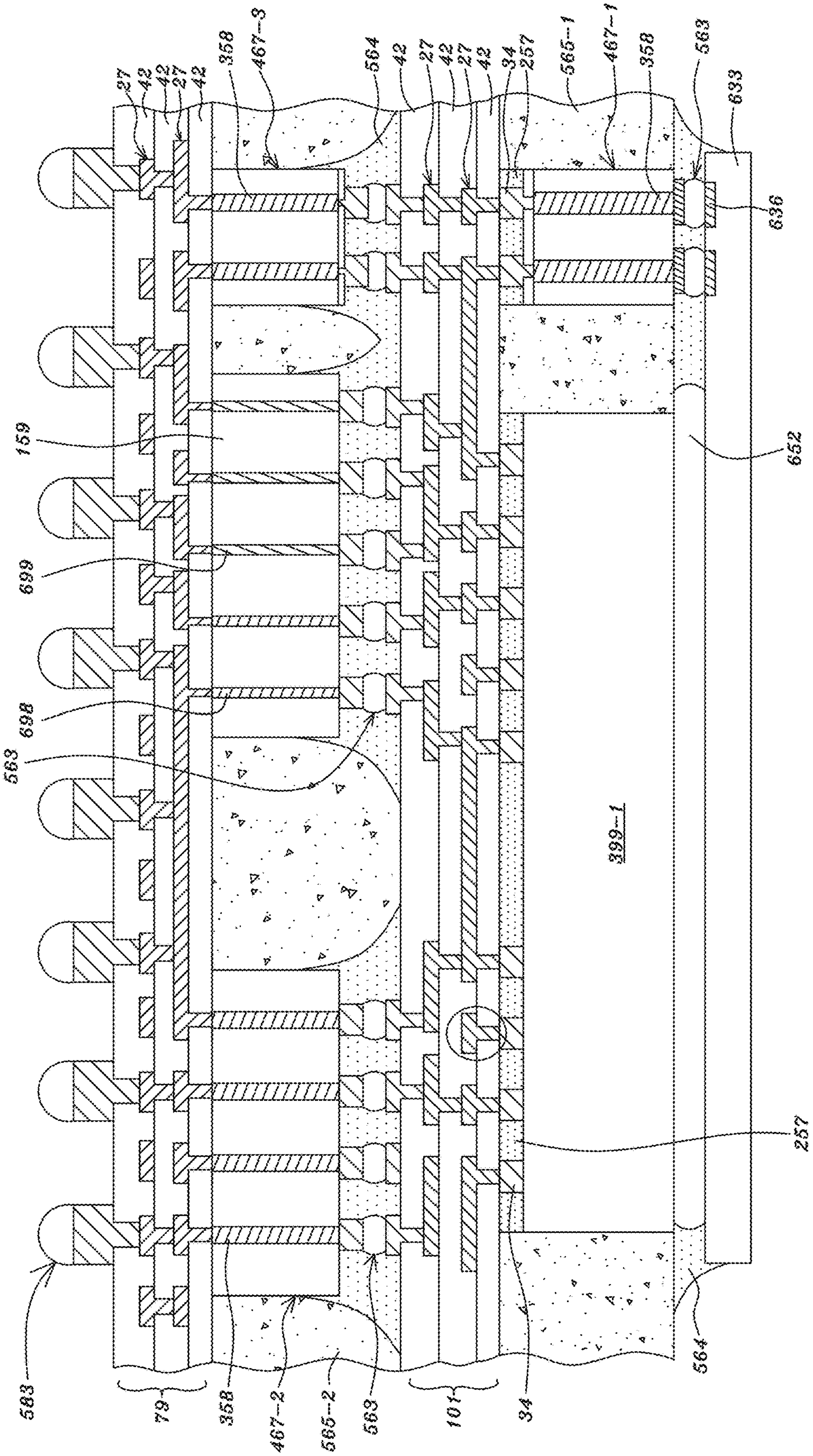

Next, referring to FIG. 28I, each of the thermoelectric (TE) coolers 633 as illustrated in FIG. 18B may be provided with the cold side to be attached to the bottom surface of one of the first known-good application specific integrated-circuit (ASIC) chips 399-1 via a heat conductive adhesive 652 and the solder bumps 659 each to be attached to a solder paste preformed on one of the vertical through vias (VTVs) 358 of the first type of vertical-through-via (VTV) connectors 467-1 and then to be reflowed into a bonded contact 563 therebetween. Next, an underfill 564, such as epoxy resins or compounds, may be filled into a gap between each of the thermoelectric (TE) coolers 633 and a polished planar surface composed of the bottom surface of each of the first known-good application specific integrated-circuit (ASIC) chips 399-1, the bottom surface of each of the first type of vertical-through-via (VTV) connectors 467-1 and the bottom surface of the first polymer layer 565-1 to enclose the bonded contacts 563 therebetween. The underfill 564 may be cured at temperature equal to or above 100, 120 or 150 degrees Celsius.

Figure 28J:
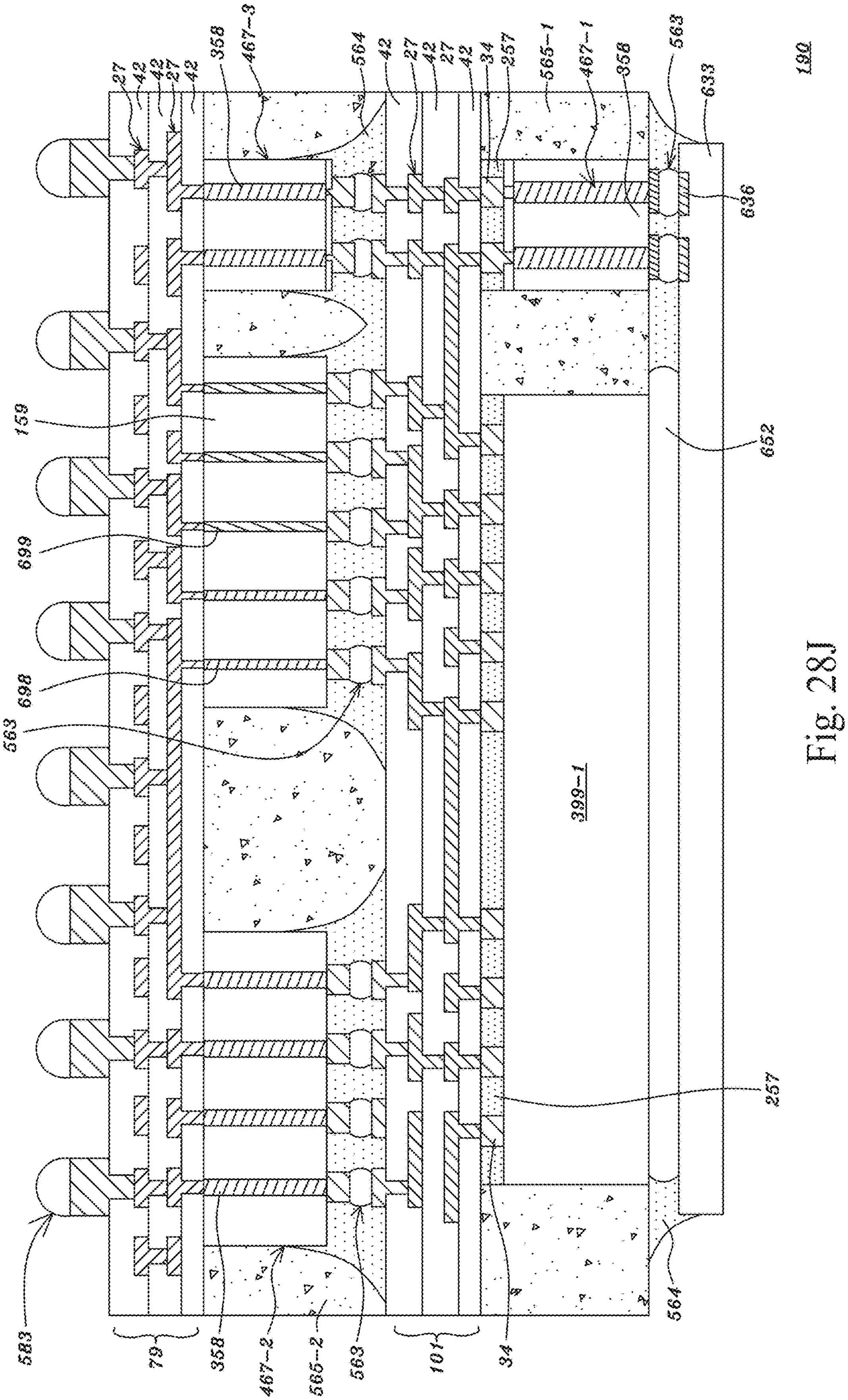

Next, referring to FIG. 28I, the first and second polymer layers 565-1 and 565-2 and polymer layers 42 of the frontside and backside interconnection schemes 101 and 79 may be cut or diced to form multiple fourth type of operation modules 190 or chip scale packages (CSP) as shown in FIG. 28J by a laser cutting process or by a mechanical cutting process. For the fourth type of operation module 190 as seen in FIG. 28J, its first known-good application specific integrated-circuit (ASIC) logic chip 399-1 may have the semiconductor devices 4 such as transistors at the active surface of the semiconductor substrate 2 thereof as illustrated in FIG. 17A. The active surface of the semiconductor substrate 2 of its first known-good application specific integrated-circuit (ASIC) logic chip 399-1 may face an active surface of the semiconductor substrate 2 of its known-good memory or logic chip or known-good ASIC chip in case of replacing the first or second type of memory modules 159, wherein its known-good memory or logic chip or known-good ASIC chip in case of replacing the second type of memory modules 159 may have the semiconductor devices 4 such as transistors at the active surface of the semiconductor substrate 2 thereof as illustrated in FIG. 17B. The active surface of the semiconductor substrate 2 of its first known-good application specific integrated-circuit (ASIC) logic chip 399-1 may face its first type of vertical-through-via (VTV) connector 467-2.

Referring to each of FIG. 28J, for the fourth type of operation module 190, its first or second type of memory module 159, or known-good memory or logic chip or known-good ASIC chip, may have multiple small I/O circuits coupling respectively to multiple small I/O circuits of its first known-good application specific integrated-circuit (ASIC) chip 399-1 through the interconnection metal layers 27 of its frontside interconnection scheme 101 for data transmission with a data bit width of equal to or greater than 64, 128, 256, 512, 1024, 2048, 4096, 8K, or 16K, wherein each of the small I/O circuits of its first or second type of memory module 159, or known-good memory or logic chip or known-good ASIC chip, and first known-good application specific integrated-circuit (ASIC) chip 399-1 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Further, its first or second type of memory module 159, or known-good memory or logic chip or known-good ASIC chip, may have a large input/output (I/O) circuit coupling to one of its metal bumps 583 for signal transmission or power or ground delivery through the interconnection metal layers 27 of its backside interconnection scheme 79, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Further, its first or second type of memory module 159, or known-good memory or logic chip or known-good ASIC chip, may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of its first known-good application specific integrated-circuit (ASIC) logic chip 399-1 or the memory cells 362 of the programmable switch cells 379 of its first known-good application specific integrated-circuit (ASIC) logic chip 399-1 as encrypted CPM data to be passed to the metal bumps 583 and (2) to decrypt, in accordance with the password or key, encrypted CPM data from the metal bumps 583 as decrypted CPM data to be passed to the memory cells 490 for the look-up tables (LUT) 210 of the programmable logic cells (LC) 2014 of its first known-good application specific integrated-circuit (ASIC) logic chip 399-1 or the memory cells 362 of the programmable switch cells 379 of its first known-good application specific integrated-circuit (ASIC) logic chip 399-1. Further, its first or second type of memory module 159, or known-good memory or logic chip or known-good ASIC chip, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its first known-good application specific integrated-circuit (ASIC) logic chip 399-1. Further, its first or second type of memory module 159, or known-good memory or logic chip or known-good ASIC chip, may include multiple non-volatile memory cells, such as NAND memory cells, NOR memory cells, RARM cells, MRAM cells, FRAM cells or PCM cells, configured to store CPM data to be passed to the memory cells 490 for the look-up tables (LUT) 210 of the programmable logic cells (LC) 2014 of its first known-good application specific integrated-circuit (ASIC) logic chip 399-1 for programming or configuring the programmable logic cells (LC) 2014 of its first known-good application specific integrated-circuit (ASIC) logic chip 399-1 or to the memory cells 362 of the programmable switch cells 379 of its first known-good application specific integrated-circuit (ASIC) logic chip 399-1 for programming or configuring the programmable switch cells 379 of its first known-good application specific integrated-circuit (ASIC) logic chip 399-1.

Referring to each of FIG. 28J, for the fourth type of operation module 190, its first known-good application specific integrated-circuit (ASIC) logic chip 399-1 may have a large input/output (I/O) circuit coupling to one of its metal bumps 583 for signal transmission or power or ground delivery through, in sequence, the interconnection metal layers 27 of its frontside interconnection scheme 101, one of the vertical through vias (VTVs) 358 of its first type of vertical-through-via (VTV) connector 467-2, or one of the dedicated vertical bypasses 698 in its second type of memory module 159 as illustrated in FIG. 19B, or one of the through silicon vias (TSVs) 157 of its known-good memory or logic chip or known-good ASIC chip in case of replacing its second type of memory module 159, and the interconnection metal layers 27 of its backside interconnection scheme 79, wherein said one of the dedicated vertical bypasses 698 is not connected to any transistor in the memory chips 251 or control chip 688 of its second type of memory module 159, or said one of the through silicon vias (TSVs) 157 is not connected to any transistor in its known-good memory or logic chip or known-good ASIC chip in case of replacing its second type of memory module 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One of the vertical interconnects 699 of its first or second type of memory module 159 as illustrated in FIGS. 19A and 19B may couple to one of its metal bumps 583 through the interconnection metal layers 27 of its backside interconnection scheme 79 and to its first known-good application specific integrated-circuit (ASIC) chip 399-1 through, in sequence, one of the bonded contacts 563 between its first or second type of memory module 159 and its frontside interconnection scheme 101 and the interconnection metal layers 27 of its frontside interconnection scheme 101. Its thermoelectric (TE) cooler 633 may couple to two of its metal bumps 583 for power and ground delivery respectively through, in sequence, two of the vertical through vias (VTVs) 358 of its first type of vertical-through-via (VTV) connector 467-1 and two of the vertical through vias (VTVs) 358 of its first type of vertical-through-via (VTV) connector 467-3.

Referring to FIG. 28J, for the fourth type of operation module 190, each of the memory chips 251 and control chip 688 of its first or second type of memory module 159, or known-good memory or logic chip or known-good ASIC chip, may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in each of the memory chips 251 and control chip 688 of its first or second type of memory module 159, or known-good memory or logic chip or known-good ASIC chip, may be 1, 2, 3, 4, 5 or greater than 5 nodes or generations older, more matured or less advanced than that used in its first known-good application specific integrated-circuit (ASIC) logic chip 399-1. Transistors used in each of the memory chips 251 and control chip 688 of its first or second type of memory module 159, or known-good memory or logic chip or known-good ASIC chip, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of its first or second type of memory module 159, or known-good memory or logic chip or known-good ASIC chip, may be different from that used in its first known-good application specific integrated-circuit (ASIC) logic chip 399-1; each of the memory chips 251 and control chip 688 of its first or second type of memory module 159, or known-good memory or logic chip or known-good ASIC chip, may use planar MOSFETs, while its first known-good application specific integrated-circuit (ASIC) logic chip 399-1 may use fin field effect transistors (FINFETs) or gate-all-around field effect transistors (GAAFETs). A power supply voltage (Vcc)

applied in each of the memory chips 251 and control chip 688 of its first or second type of memory module 159, or known-good memory or logic chip or known-good ASIC chip, may be greater than or equal to 1.5, 2.0, 2.5, 3, 3.3, 4, or 5 voltages, while a power supply voltage (Vcc) applied in its first known-good application specific integrated-circuit (ASIC) logic chip 399-1 may be smaller than or equal to 1.8, 1.5 or 1 voltage. The power supply voltage applied in each of the memory chips 251 and control chip 688 of its first or second type of memory module 159, or known-good memory or logic chip or known-good ASIC chip, may be higher than that applied in its first known-good application specific integrated-circuit (ASIC) logic chip 399-1. A gate oxide of a field effect transistor (FET) of each of the memory chips 251 and control chip 688 of its first or second type of memory module 159, or known-good memory or logic chip or known-good ASIC chip, may have a physical thickness greater than or equal to 5 nm, 6 nm, 7.5 nm, 10 nm, 12.5 nm, or 15 nm, while a gate oxide of a field effect transistor (FET) of its first known-good application specific integrated-circuit (ASIC) logic chip 399-1 may have a physical thickness less than 4.5 nm, 4 nm, 3 nm or 2 nm. The thickness of the gate oxide of the field effect transistor (FET) of each of the memory chips 251 and control chip 688 of its first or second type of memory module 159, or known-good memory or logic chip or known-good ASIC chip, may be greater than that of its first known-good application specific integrated-circuit (ASIC) logic chip 399-1.

Figure 28K:
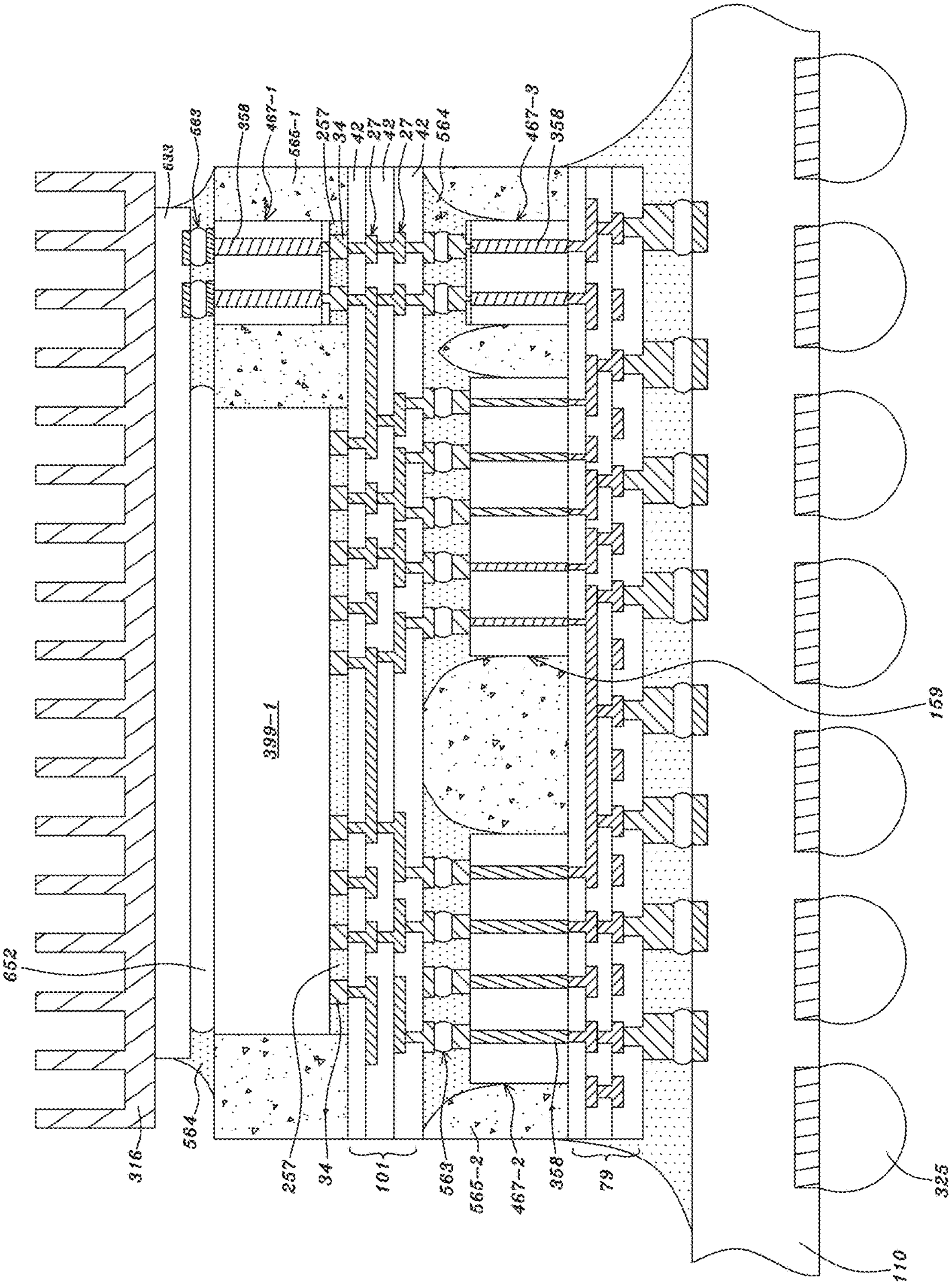
FIG. 28K is a schematically cross-sectional view showing a chip package based on a fourth type of operation module in accordance with an embodiment of the present application.

FIG. 28K is a schematically cross-sectional view showing a chip package based on a fourth type of operation module in accordance with an embodiment of the present application. Referring to FIG. 28K, the fourth type of operation module 190 as seen in FIG. 28J may have the metal bumps 583 to be bonded to multiple metal pads of a circuit substrate 110, such as printed circuit board, ball-grid-array (BGA) substrate, flexible circuit film or tape, or ceramic circuit substrate, at a bottom side of the circuit substrate 110. Next, an underfill 564, such as epoxy resins or compounds, may be filled into a gap between the fourth type of operation module 190 and the circuit substrate 110 to enclose the metal bumps 583 therebetween. Next, multiple solder balls 325 such as tin-lead alloy or tin-silver alloy may be formed at a top side of the circuit substrate 110. Next, a heat sink 316 may be provided to be attached to a hot side of the thermoelectric (TE) cooler 633.

5. Fifth Type of Operation Module

Figure 29:
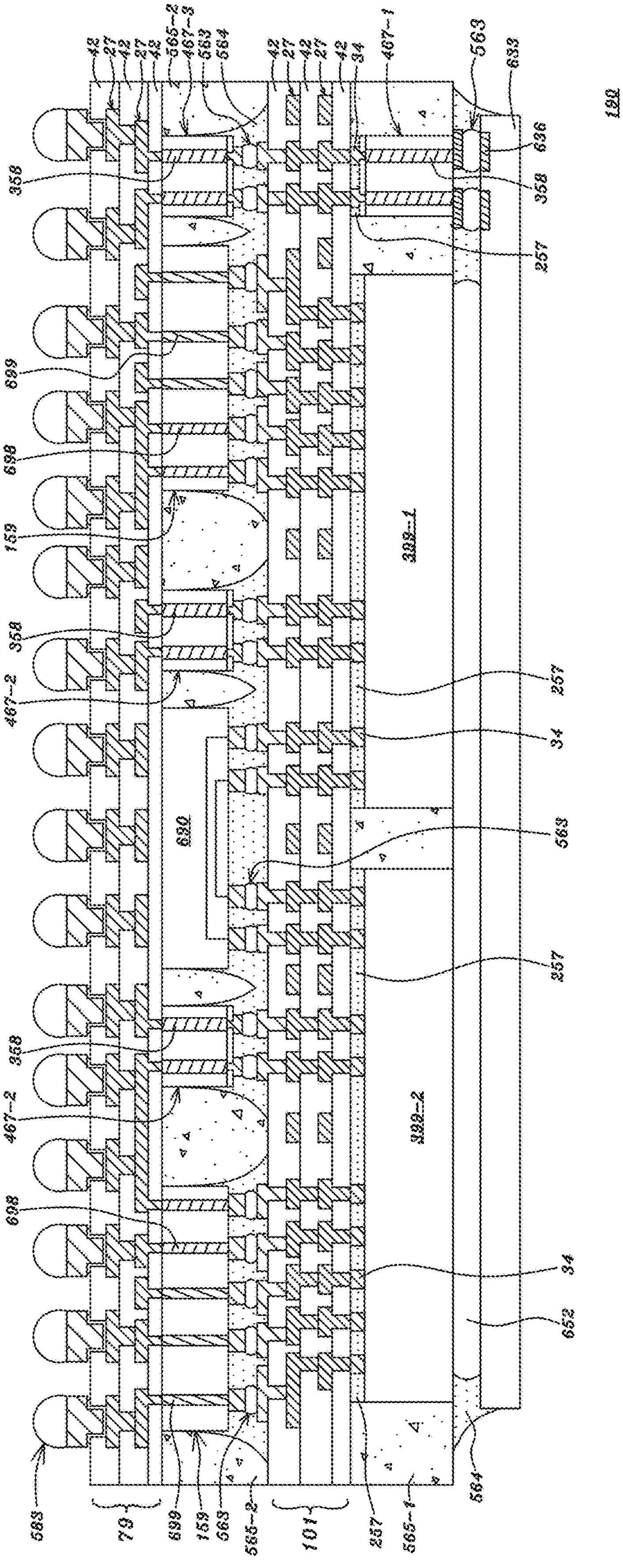
FIG. 29 is a schematically cross-sectional view showing a fifth type of operation module in accordance with an embodiment of the present application.

FIG. 29 is a schematically cross-sectional view showing a fifth type of operation module in accordance with an embodiment of the present application. Referring to FIG. 29, a fifth type of operation module 190 may be fabricated by a process similar to that as illustrated in FIGS. 28A-28J and may have a structure similar to that as illustrated in FIGS. 28A-28J. For an element indicated by the same reference number shown in FIGS. 28A-28J and 29, the specification of the element as seen in FIG. 29 may be referred to that of the element as illustrated in FIGS. 28A-28J. The difference between the fourth and fifth types of operation modules 190 is that the fifth type of operation module 190 may further include (1) a second known-good semiconductor chip, which may be a second application specific integrated-circuit (ASIC) chip 399-2, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, adjacent to the first known-good application specific integrated-circuit (ASIC) chip 399-1 in the same horizontal level and (2) a fine-line interconnection bridge (FIB) 690 extending across over an edge of each of the first and second known-good application specific integrated-circuit (ASIC) chips 399-1 and 399-2 to couple the first known-good application specific integrated-circuit (ASIC) chip 399-1 to the second known-good application specific integrated-circuit (ASIC) chip 399-2.

Referring to FIG. 29, with regard to the process for fabricating the fifth type of operation module 190, in the step as illustrated in FIG. 28A, multiple of the second known-good application specific integrated-circuit (ASIC) chips 399-2 may be provided with the first and/or second interconnection scheme(s) 560 and/or 588 and first type of micro-bumps or micro-pillars 34 as illustrated in FIG. 17A. Each of the second known-good application specific integrated-circuit (ASIC) chips 399-2 may further include an insulating dielectric layer 257, such as polymer layer, on top of the first and/or second interconnection scheme(s) 560 and/or 588 thereof, covering a top surface of its first type of micro-bumps or micro-pillars 34 thereof. Each of the second known-good application specific integrated-circuit (ASIC) chips 399-2 may have a backside to be attached to the sacrificial bonding layer 591 of the temporary substrate 590 and may be arranged adjacent one of the first known-good application specific integrated-circuit (ASIC) chips 399-1. The first polymer layer 565-1 may be applied to further fill a gap between each neighboring two of the first and second known-good application specific integrated-circuit (ASIC) chips 399-1 and 399-2 and to further cover a top of each of the first type of micro-bumps or micro-pillars 34 at a front side of each of the second known-good application specific integrated-circuit (ASIC) chips 399-2.

Referring to FIG. 29, with regard to the process for fabricating the fifth type of operation module 190, in the step as illustrated in FIG. 28B, the chemical mechanical polishing (CMP), polishing or grinding process may be applied to further planarize the top of each of the first type of micro-bumps or micro-pillars 34 of each of the second known-good application specific integrated-circuit (ASIC) chips 399-2 with the top surface of the first polymer layer 565-1, the top of each of the first type of micro-bumps or micro-pillars 34 of each of the first known-good application specific integrated-circuit (ASIC) chips 399-1 and the top of each of the first type of micro-bumps or micro-pillars 34 of each of the first type of vertical-through-via (VTV) connectors 467-1. Thereby, the top of each of the first type of micro-bumps or micro-pillars 34 of each of the second known-good application specific integrated-circuit (ASIC) chips 399-2 may be further exposed.

Referring to FIG. 29, with regard to the process for fabricating the fifth type of operation module 190, in the step as illustrated in FIG. 28C, the frontside interconnection scheme 101 may be formed further over the second known-good application specific integrated-circuit (ASIC) chips 399-2 and its one or more interconnection metal layers 27 may further couple to the first type of micro-bumps or micro-pillars 34 of each of the second known-good application specific integrated-circuit (ASIC) chips 399-2. Next, the micro-bumps or micro-pillars 34 are formed on the metal pads of the topmost one of the interconnection metal layers 27 of the frontside interconnection scheme 101 at the bottoms of the openings 42*a* in the topmost one of the polymer layers 42 of the frontside interconnection scheme 101.

Referring to FIG. 29, with regard to the process for fabricating the fifth type of operation module 190, in the step as illustrated in FIGS. 28D and 28E, each of the first or second type of memory modules 159 as illustrated in FIG. 19A or 19B may be provided to have its first, second or third type of micro-bumps or micro-pillars 34 to be bonded to the first, second or fourth type of micro-bumps or micro-pillars 34 at a top side of the frontside interconnection scheme 101 into multiple bonded contacts 563 respectively therebetween, as referred to any of the first through fourth cases illustrated in FIGS. 21A-21C. Each of the first or second type of memory modules 159 may extend across over an edge of one of the first and second known-good application specific integrated-circuit (ASIC) chips 399-1 and 399-2. Alternatively, each of the first or second type of memory modules 159 may be replaced with a known-good memory or logic chip or known-good ASIC chip as illustrated in FIGS. 28D and 28E. Further, multiple first type of vertical-through-via (VTV) connectors 467-2 and 467-3, each of which may be one as illustrated in any of FIGS. 1F, 1I, 1L, 2D, 2G, 2J, 5J, 5L, 5N, 6D, 6F, 6H and 7E, may be provided with the first, second, third, fifth or sixth type of micro-bumps or micro-pillars 34 to be bonded to the first, second or fourth type of micro-bumps or micro-pillars 34 at a top side of the frontside interconnection scheme 101 into multiple bonded contacts 563 therebetween, as referred to the process illustrated in FIGS. 28D and 28E for bonding the first, second, third, fifth or sixth type of micro-bumps or micro-pillars 34 of the first type of vertical-through-via (VTV) connectors 467-2 and 467-3 to the first, second or fourth type of micro-bumps or micro-pillars 34 at a top side of the frontside interconnection scheme 101. Each of the first type of vertical-through-via (VTV) connectors 467-2 may be arranged vertically over one of the first and second known-good application specific integrated-circuit (ASIC) chips 399-1 and 399-2. Each of the first type of vertical-through-via (VTV) connectors 467-3 may be arranged vertically over one of the first type of vertical-through-via (VTV) connectors 467-1, wherein each of the bonded contacts 563 between each of the first type of vertical-through-via (VTV) connectors 467-3 and the frontside interconnection scheme 101 may be formed vertically over one of the first type of micro-bumps or micro-pillars 34 of the first type of vertical-through-via (VTV) connectors 467-1. Further, multiple fine-line interconnection bridge (FIB) 690 (only one is shown), which may be of the first or second type as illustrated in FIG. 15A or 15B, may be provided with the first, second or third type of micro-bumps or micro-pillars 34. Each of the fine-line interconnection bridges (FIBs) 690 (only one is shown) may be provided to have its first, second or third type of micro-bumps or micro-pillars 34 to be bonded to the first, second or fourth type of micro-bumps or micro-pillars 34 at the top side of the frontside interconnection scheme 101 into multiple bonded contacts 563 therebetween, as referred to any of the first through fourth cases illustrated in FIGS. 21A-21C. Each of the fine-line interconnection bridges (FIBs) 690 may be arranged across over an edge of one of the first known-good application specific integrated-circuit (ASIC) chips 399-1 and an edge of one of the second known-good application specific integrated-circuit (ASIC) chips 399-2 adjacent to said one of the first known-good application specific integrated-circuit (ASIC) chips 399-1.

Referring to FIG. 29, with regard to the process for fabricating the fifth type of operation module 190, in the step as illustrated in FIG. 28E, the underfill 564 may be filled into a gap between each of the first type of vertical-through-via (VTV) connectors 467-2 and the frontside interconnection scheme 101 to enclose the bonded contacts 563 therebetween, into a gap between each of the first type of vertical-through-via (VTV) connectors 467-3 and the frontside interconnection scheme 101 to enclose the bonded contacts 563 therebetween, into a gap between each of the first or second type of memory modules 159, or known-good memory or logic chips or known-good ASIC chips, and the frontside interconnection scheme 101 to enclose the bonded contacts 563 therebetween and into a gap between each of the fine-line interconnection bridges (FIB) 690 and the frontside interconnection scheme 101 to enclose the bonded contacts 563 therebetween.

Referring to FIG. 29, with regard to the process for fabricating the fifth type of operation module 190, in the step as illustrated in FIG. 28E, the second polymer layer 565-2 may be applied to fill a gap between each neighboring two of the first or second type of memory modules 159, or known-good memory or logic chips or known-good ASIC chips, and first type of vertical-through-via (VTV) connectors 467-2, a gap between each neighboring two of the first or second type of memory modules 159, or known-good memory or logic chips or known-good ASIC chips, and first type of vertical-through-via (VTV) connectors 467-3 and a gap between each neighboring two of the first type of vertical-through-via (VTV) connectors 467-2 and fine-line interconnection bridges (FIB) 690 and to cover a backside of each of the first or second type of memory modules 159, or known-good memory or logic chips or known-good ASIC chips, a backside of each of the first type of vertical-through-via (VTV) connectors 467-2 and 467-3 and a backside of each of the fine-line interconnection bridges (FIB) 690 by methods, for example, spin-on coating, screen-printing, dispensing or molding.

Referring to FIG. 29, with regard to the process for fabricating the fifth type of operation module 190, in the step as illustrated in FIG. 28F, the chemical mechanical polishing (CMP), polishing or grinding process may be applied to remove a top portion of the second polymer layer 565-2, a top portion of each of the first or second type of memory modules 159, or known-good memory or logic chips or known-good ASIC chips, a top portion of each of the first type of vertical-through-via (VTV) connectors 467-2 and 467-3 and a top portion of each of the fine-line interconnection bridges (FIB) 690, to planarize a top surface of the second polymer layer 565-2, a top surface of each of the first or second type of memory modules 159, or known-good memory or logic chips or known-good ASIC chips, a top surface of each of the first type of vertical-through-via (VTV) connectors 467-2 and 467-3 and a top surface of each of the fine-line interconnection bridges (FIB) 690 and to expose a backside of each of the vertical through vias (VTVs) 358 of each of the first type of vertical-through-via (VTV) connectors 467-2 and 467-3 and, optionally, a backside of the copper layer 156 of each of the through silicon vias (TSVs) 157 of the topmost one of the memory chips 251 of each of the first or second type of memory modules 159, or a backside of the copper layer 156 of the through silicon vias (TSVs) 157 of each of the known-good memory or logic chips or known-good ASIC chips in case of replacing the first or second type of memory modules 159.

Referring to FIG. 29, with regard to the process for fabricating the fifth type of operation module 190, in the step as illustrated in FIG. 28G, the backside interconnection scheme 79 may be formed on the top surface of the second polymer layer 565-2, the top surface of each of the first or second type of memory modules 159, or known-good memory chips or known-good FPGA IC chips, the top surface of each of the first type of vertical-through-via (VTV) connectors 467-2 and 467-3 and the top surface of each of the fine-line interconnection bridges (FIB) 690. The backside interconnection scheme 79 may include (1) one or more interconnection metal layers 27 each coupling to one or more of the vertical through vias (VTVs) 358 of each of the first type of vertical-through-via (VTV) connectors 467-2 and 467-3 and, optionally, to one or more of the through silicon vias (TSVs) 157 of the topmost one of the memory chips 251 of each of the first or second type of memory modules 159, or one or more of the through silicon vias (TSVs) 157 of each of the known-good memory or logic chips or known-good ASIC chips in case of replacing the first or second type of memory modules 159, and (2) one or more polymer layers 42 each between neighboring two of its interconnection metal layers 27, between a bottommost one of its interconnection metal layers 27 and a polished planar surface composed of the top surface of each of the first type of vertical-through-via (VTV) connectors 467-2 and 467-3, the top surface of each of the first or second type of memory modules 159, or known-good memory or logic chips or known-good ASIC chips, the top surface of each of the fine-line interconnection bridges (FIB) 690 and the top surface of the second polymer layer 565-2 or on and above a topmost one of its interconnection metal layers 27, wherein the topmost one of its interconnection metal layers 27 may have multiple metal pads at bottoms of multiple openings 42*a* in the topmost one of its polymer layers 42. Each of the interconnection metal layers 27 and polymer layer 42 of the backside interconnection scheme 79 may have the same specifications as that as illustrated in FIGS. 21E and 23E.

Referring to FIG. 29, with regard to the process for fabricating the fifth type of operation module 190, in the step as illustrated in FIG. 28G, the metal bumps 583 may be formed on the metal pads of the topmost one of the interconnection metal layers 27 of the backside interconnection scheme 79 at the bottoms of the openings 42*a* in the topmost one of the polymer layers 42 of the backside interconnection scheme 79.

Referring to FIG. 29, with regard to the process for fabricating the fifth type of operation module 190, in the step as seen in FIG. 28H, the glass or silicon substrate 589 and may be released from the sacrificial bonding layer 591. Next, the adhesive peeling tape (not shown) may be attached to a bottom surface of the remainder of the sacrificial bonding layer 591. Next, the adhesive peeling tape may be peeled off to pull the remainder of the sacrificial bonding layer 591 attached to the adhesive peeling tape off the backside of each of the first and second known-good application specific integrated-circuit (ASIC) chips 399-1 and 399-2, the backside of each of the first type of vertical-through-via (VTV) connectors 467-1 and a bottom surface of the first polymer layer 565-1.

Referring to FIG. 29, with regard to the process for fabricating the fifth type of operation module 190, in the step as illustrated in FIG. 28H, the chemical mechanical polishing (CMP), polishing or grinding process may be applied to remove a bottom portion of the first polymer layer 565-1, a bottom portion of each of the first and second known-good application specific integrated-circuit (ASIC) chips 399-1 and 399-2 and a bottom portion of each of the first type of vertical-through-via (VTV) connectors 467-1, to planarize a bottom surface of the first polymer layer 565-1, a bottom surface of each of the first and second known-good application specific integrated-circuit (ASIC) chips 399-1 and 399-2 and a bottom surface of each of the first type of vertical-through-via (VTV) connectors 467-1 and to expose a backside of each of the vertical through vias (VTVs) 358 of each of the first type of vertical-through-via (VTV) connectors 467-1.

Referring to FIG. 29, with regard to the process for fabricating the fifth type of operation module 190, in the step as illustrated in FIG. 28I, each of the thermoelectric (TE) coolers 633 as illustrated in FIG. 18B may be provided with the cold side to be attached to the bottom surface of one of the first known-good application specific integrated-circuit (ASIC) chips 399-1 and the bottom surface of one of the second known-good application specific integrated-circuit (ASIC) chips 399-2 via the heat conductive adhesive 652 and the solder bumps 659 each to be attached to a solder paste preformed on the backside of one of the vertical through vias (VTVs) 358 of the first type of vertical-through-via (VTV) connectors 467-1 and then to be reflowed into a bonded contact 563 therebetween. Next, the underfill 564 may be filled into a gap between each of the thermoelectric (TE) coolers 633 and a polished planar surface composed of the bottom surface of each of the first and second known-good application specific integrated-circuit (ASIC) chips 399-1 and 399-2, the bottom surface of each of the first type of vertical-through-via (VTV) connectors 467-1 and the bottom surface of the first polymer layer 565-1 to enclose the bonded contacts 563 therebetween.

With regard to the process for fabricating the fifth type of operation module 190, in the step as illustrated in FIG. 28I, the first and second polymer layers 565-1 and 565-2 and polymer layers 42 of the frontside and backside interconnection schemes 101 and 79 may be cut or diced to form multiple fifth type of operation modules 190 or chip scale packages (CSP) as shown in FIG. 29 by a laser cutting process or by a mechanical cutting process.

Referring to FIG. 29, for the fifth type of operation module 190, each of its first and second known-good application specific integrated-circuit (ASIC) logic chips 399-1 and 399-2 may have the semiconductor devices 4 such as transistors at the active surface of the semiconductor substrate 2 thereof as illustrated in FIG. 17A. The active surface of the semiconductor substrate 2 of said each of its first and second known-good application specific integrated-circuit (ASIC) logic chips 399-1 and 399-2 may face an active surface of the semiconductor substrate 2 of one of its known-good memory or logic chip or known-good ASIC chips in case of replacing the first or second type of memory modules 159, wherein said one of its known-good memory or logic chip or known-good ASIC chips is arranged over said each of its first and second known-good application specific integrated-circuit (ASIC) logic chips 399-1 and 399-2 and may have the semiconductor devices 4 such as transistors at the active surface of the semiconductor substrate 2 thereof as illustrated in FIG. 17B. The active surface of the semiconductor substrate 2 of said each of its first and second known-good application specific integrated-circuit (ASIC) logic chips 399-1 and 399-2 may face one of its first type of vertical-through-via (VTV) connectors 467-2 over said each of its first and second known-good application specific integrated-circuit (ASIC) logic chips 399-1 and 399-2 and its fine-line interconnection bridge (FIB) 690.

Referring to FIG. 29, for the fifth type of operation module 190, each of its first or second type of memory modules 159, or known-good memory or logic chips or known-good ASIC chips, over one of its first and second known-good application specific integrated-circuit (ASIC) chips 399-1 and 399-2 may have multiple small I/O circuits coupling respectively to multiple small I/O circuits of said one of its first and second known-good application specific integrated-circuit (ASIC) chips 399-1 and 399-2 through the interconnection metal layers 27 of its frontside interconnection scheme 101 for data transmission with a data bit width of equal to or greater than 64, 128, 256, 512, 1024, 2048, 4096, 8K, or 16K, wherein each of the small I/O circuits of said each of its first or second type of memory modules 159, or known-good memory or logic chips or known-good ASIC chips, and said one of its first and second known-good application specific integrated-circuit (ASIC) chips 399-1 and 399-2 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Further, said each of its first or second type of memory modules 159, or known-good memory or logic chips or known-good ASIC chips, may have a large input/output (I/O) circuit coupling to one of its metal bumps 583 for signal transmission or power or ground delivery through the interconnection metal layers 27 of its backside interconnection scheme 79, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Further, said each of its first or second type of memory modules 159, or known-good memory or logic chips or known-good ASIC chips, may include multiple non-volatile memory cells configured to store a password or key and a cryptography block or circuit configured (1) to encrypt, in accordance with the password or key, CPM data from the memory cells 490 for the look-up tables (LUT) 210 of the programmable logic cells (LC) 2014 of said one of its first and second known-good application specific integrated-circuit (ASIC) logic chips 399-1 and 399-2 or the memory cells 362 of the programmable switch cells 379 of said one of its first and second known-good application specific integrated-circuit (ASIC) logic chips 399-1 and 399-2 as encrypted CPM data to be passed to the metal bumps 583 and (2) to decrypt, in accordance with the password or key, encrypted CPM data from the metal bumps 583 as decrypted CPM data to be passed to the memory cells 490 for the look-up tables (LUT) 210 of the programmable logic cells (LC) 2014 of said one of its first and second known-good application specific integrated-circuit (ASIC) logic chips 399-1 and 399-2 or the memory cells 362 of the programmable switch cells 379 of said one of its first and second known-good application specific integrated-circuit (ASIC) logic chips 399-1 and 399-2. Further, said each of its first or second type of memory modules 159, or known-good memory or logic chips or known-good ASIC chips, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to said one of its first and second known-good application specific integrated-circuit (ASIC) logic chips 399-1 and 399-2. Further, said each of its first or second type of memory modules 159, or known-good memory or logic chips or known-good ASIC chips, may include multiple non-volatile memory cells, such as NAND memory cells, NOR memory cells, RARM cells, MRAM cells, FRAM cells or PCM cells, configured to store CPM data to be passed to the memory cells 490 for the look-up tables (LUT) 210 of the programmable logic cells (LC) 2014 of said one of its first and second known-good application specific integrated-circuit (ASIC) logic chips 399-1 and 399-2 for programming or configuring the programmable logic cells (LC) 2014 of said one of its first and second known-good application specific integrated-circuit (ASIC) logic chips 399-1 and 399-2 or to the memory cells 362 of the programmable switch cells 379 of said one of its first and second known-good application specific integrated-circuit (ASIC) logic chips 399-1 and 399-2 for programming or configuring the programmable switch cells 379 of said one of its first and second known-good application specific integrated-circuit (ASIC) logic chips 399-1 and 399-2.

Referring to each of FIG. 29, for the fifth type of operation module 190, each of its first and second known-good application specific integrated-circuit (ASIC) chips 399-1 and 399-2 may have a large input/output (I/O) circuit coupling to one of its metal bumps 583 for signal transmission or power or ground delivery through, in sequence, (1) the interconnection metal layers 27 of its frontside interconnection scheme 101, (2) one of the vertical through vias (VTVs) 358 of one of its first type of vertical-through-via (VTV) connectors 467-2 over said each of its first and second known-good application specific integrated-circuit (ASIC) chips 399-1 and 399-2, or one of the dedicated vertical bypasses 698 in one of its second type of memory modules 159 as illustrated in FIG. 19B partially over said each of its first and second known-good application specific integrated-circuit (ASIC) chips 399-1 and 399-2, or one of the through silicon vias (TSVs) 157 of its known-good memory or logic chip or known-good ASIC chip in case of replacing said one of its second type of memory modules 159, and (3) the interconnection metal layers 27 of its backside interconnection scheme 79, wherein said one of the dedicated vertical bypasses 698 is not connected to any transistor in the memory chips 251 or control chip 688 of said one of its second type of memory modules 159, or said one of the through silicon vias (TSVs) 157 is not connected to any transistor in its known-good memory or logic chip or known-good ASIC chip in case of replacing said one of its second type of memory modules 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One or more of the vertical interconnects 699 of each of its first or second type of memory modules 159 as illustrated in FIG. 19A or 19B may couple to one or more of its second metal bumps 583 respectively through the interconnection metal layers 27 of its backside interconnection scheme 79 and to one of its first and second known-good application specific integrated-circuit (ASIC) chips 399-1 and 399-2 under said each of its first or second type of memory modules 159 through the interconnection metal layers 27 of its frontside interconnection scheme 101. Its first and second known-good application specific integrated-circuit (ASIC) chips 399-1 and 399-2 may couple to each other through one or more of the interconnection metal layers 6 of the first interconnection scheme 560 of its fine-line interconnection bridge (FIB) 690 and/or interconnection metal layers 27 of the second interconnection scheme 588 of its fine-line interconnection bridges (FIB) 690. Its thermoelectric (TE) cooler 633 may couple to two of its metal bumps 583 for power and ground delivery respectively through, in sequence, two of the vertical through vias (VTVs) 358 of its first type of vertical-throughvia (VTV) connector 467-1 and two of the vertical through vias (VTVs) 358 of its first type of vertical-through-via (VTV) connector 467-3.

Referring to FIG. 29, for the fifth type of operation module 190, each of the memory chips 251 and control chip 688 of each of its first or second type of memory modules 159, or known-good memory or logic chips or known-good ASIC chips, may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in each of the memory chips 251 and control chip 688 of its first or second type of memory module 159, or known-good memory or logic chips or known-good ASIC chips, may be 1, 2, 3, 4, 5 or greater than 5 nodes or generations older, more matured or less advanced than that used in each of its first and second known-good application specific integrated-circuit (ASIC) logic chips 399-1 and 399-2. Transistors used in each of the memory chips 251 and control chip 688 of each of its first or second type of memory modules 159, or known-good memory or logic chips or known-good ASIC chips, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of each of its first or second type of memory modules 159, or known-good memory or logic chip or known-good ASIC chip, may be different from that used in each of its first and second known-good application specific integrated-circuit (ASIC) logic chips 399-1 and 399-2; each of the memory chips 251 and control chip 688 of each of its first or second type of memory modules 159, or known-good memory or logic chips or known-good ASIC chips, may use planar MOSFETs, while each of its first and second known-good application specific integrated-circuit (ASIC) logic chips 399-1 and 399-2 may use fin field effect transistors (FINFETs) or gate-all-around field effect transistors (GAAFETs). A power supply voltage (Vcc) applied in each of the memory chips 251 and control chip 688 of each of its first or second type of memory modules 159, or known-good memory or logic chips or known-good ASIC chips, may be greater than or equal to 1.5, 2.0, 2.5, 3, 3.3, 4, or 5 voltages, while a power supply voltage (Vcc) applied in each of its first and second known-good application specific integrated-circuit (ASIC) logic chips 399-1 and 399-2 may be smaller than or equal to 1.8, 1.5 or 1 voltage. The power supply voltage applied in each of the memory chips 251 and control chip 688 of its each of first or second type of memory modules 159, or known-good memory or logic chips or known-good ASIC chips, may be higher than that applied in each of its first and second known-good application specific integrated-circuit (ASIC) logic chips 399-1 and 399-2. A gate oxide of a field effect transistor (FET) of each of the memory chips 251 and control chip 688 of each of its first or second type of memory modules 159, or known-good memory or logic chips or known-good ASIC chips, may have a physical thickness greater than or equal to 5 nm, 6 nm, 7.5 nm, 10 nm, 12.5 nm, or 15 nm, while a gate oxide of a field effect transistor (FET) of each of its first and second known-good application specific integrated-circuit (ASIC) logic chips 399-1 and 399-2 may have a physical thickness less than 4.5 nm, 4 nm, 3 nm or 2 nm. The thickness of the gate oxide of the field effect transistor (FET) of each of the memory chips 251 and control chip 688 of each of its first or second type of memory modules 159, or known-good memory or logic chips or known-good ASIC chips, may be greater than that of each of its first and second known-good application specific integrated-circuit (ASIC) logic chips 399-1 and 399-2.

6. Sixth Type of Operation Module

Figure 30:
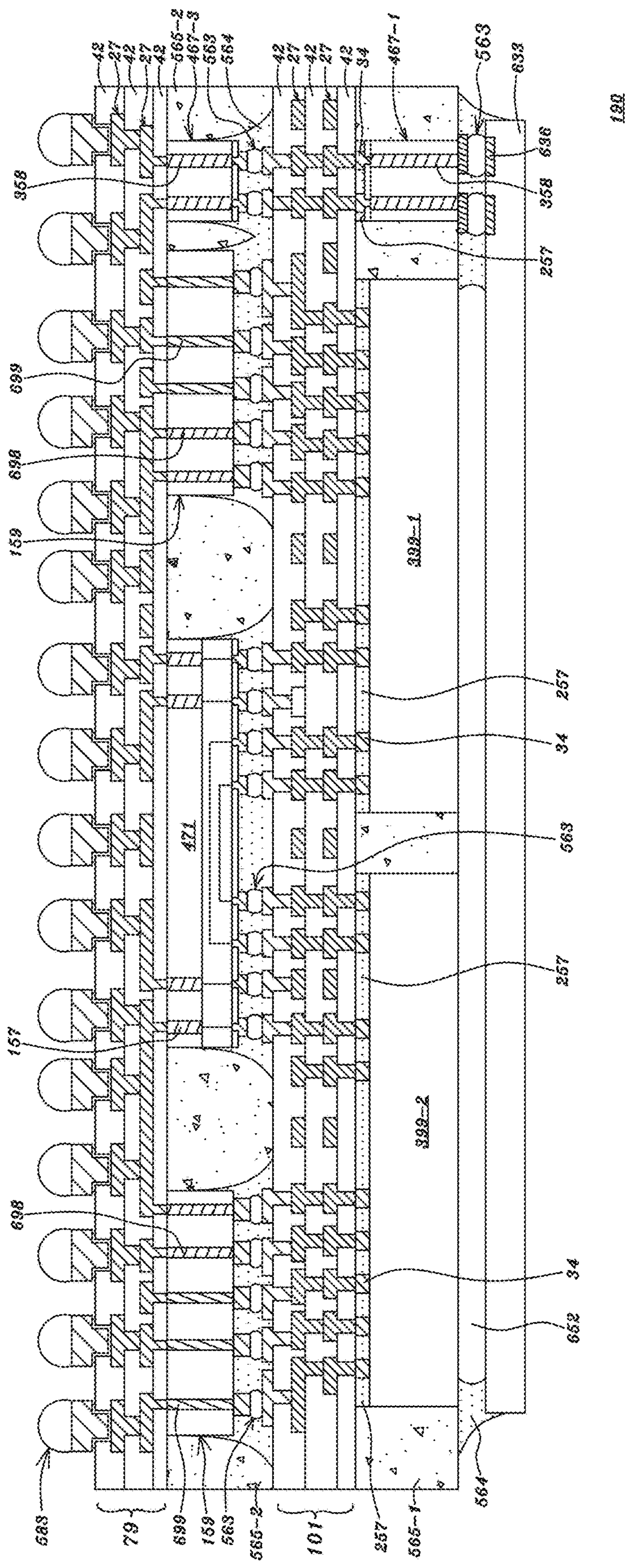
FIG. 30 is a schematically cross-sectional view showing a sixth type of operation module in accordance with an embodiment of the present application.

FIG. 30 is a schematically cross-sectional view showing a sixth type of operation module in accordance with an embodiment of the present application. Referring to FIG. 30, a sixth type of operation module 190 may be fabricated by a process similar to that as illustrated in FIGS. 28A-28J and 29 for the fifth type of operation module and may have a structure similar to that as illustrated in FIG. 29 for the fifth type of operation module. For an element indicated by the same reference number shown in FIGS. 28A-28J, 29 and 30, the specification of the element as seen in FIG. 30 may be referred to that of the element as illustrated in FIG. 28A-28J or 29. The difference between the fifth and sixth types of operation modules 190 is that the sixth type of operation module 190 may include a through-silicon-via (TSV) bridge 471 as illustrated in FIG. 16A or 16B for replacing the fine-line interconnection bridge (FIB) 690 and first type of vertical-through-via (VTV) connectors 467-2 of the fifth type of operation module 190, wherein the through-silicon-via (TSV) bridge 471 is provided without any transistor therein.

Referring to FIG. 30, with regard to the process for fabricating the sixth type of operation module 190, the steps before providing multiple of the first or second type of memory modules 159 as illustrated in FIG. 19A or 19B, multiple of the first type of vertical-through-via (VTV) connectors 467-2 and 467-3 and multiple of the through-silicon-via (TSV) bridges 471 may be referred to those as illustrated in FIGS. 28A-28C and 29 for fabricating the fifth type of operation module 190. Next, in the step as illustrated in FIGS. 28D, 28E and 29, each of the through-silicon-via (TSV) bridges 471 (only one is shown) in case of replacing the fine-line interconnection bridge (FIB) 690 and first type of vertical-through-via (VTV) connectors 467-2 as illustrated in FIG. 29 may be further provided to have its first, second or third type of micro-bumps or micro-pillars 34 to be bonded to the first, second or fourth type of micro-bumps or micro-pillars 34 at the top side of the frontside interconnection scheme 101 into multiple bonded contacts 563 respectively therebetween, as referred to any of the first through fourth cases illustrated in FIGS. 21A-21C. Each of the through-silicon-via (TSV) bridges 471 may be arranged across over an edge of one of the first known-good application specific integrated-circuit (ASIC) chips 399-1 and an edge of one of the second known-good application specific integrated-circuit (ASIC) chips 399-2 adjacent to said one of the first known-good application specific integrated-circuit (ASIC) chips 399-1.

Referring to FIG. 30, with regard to the process for fabricating the sixth type of operation module 190, in the step as illustrated in FIGS. 28E and 29, the underfill 564 may be filled into a gap between each of the first type of vertical-through-via (VTV) connectors 467-3 and the frontside interconnection scheme 101 to enclose the bonded contacts 563 therebetween, into a gap between each of the first or second type of memory modules 159, or known-good memory or logic chips or known-good ASIC chips, and the frontside interconnection scheme 101 to enclose the bonded contacts 563 therebetween and into a gap between each of the through-silicon-via (TSV) bridges 471 and the frontside interconnection scheme 101 to enclose the bonded contacts 563 therebetween.

Referring to FIG. 30, with regard to the process for fabricating the sixth type of operation module 190, in the step as seen in FIGS. 28E and 29, the second polymer layer 565-2 may be applied to fill a gap between each neighboring two of the first or second type of memory modules 159, or known-good memory or logic chips or known-good ASIC chips, and through-silicon-via (TSV) bridges 471 and a gap between each neighboring two of the first or second type of memory modules 159, or known-good memory or logic chips or known-good ASIC chips, and first type of vertical-through-via (VTV) connectors 467-3 and to cover a backside of each of the first or second type of memory modules 159, or known-good memory or logic chips or known-good ASIC chips, a backside of each of the first type of vertical-through-via (VTV) connectors 467-3 and a backside of each of the through-silicon-via (TSV) bridges 471 by methods, for example, spin-on coating, screen-printing, dispensing or molding.

Referring to FIG. 30, with regard to the process for fabricating the sixth type of operation module 190, in the step as seen in FIGS. 28F and 29, the chemical mechanical polishing (CMP), polishing or grinding process may be applied to remove a top portion of the second polymer layer 565-2, a top portion of each of the first or second type of memory modules 159, or known-good memory or logic chips or known-good ASIC chips, a top portion of each of the first type of vertical-through-via (VTV) connectors 467-3 and a top portion of each of the through-silicon-via (TSV) bridges 471, to planarize a top surface of the second polymer layer 565-2, a top surface of each of the first or second type of memory modules 159, or known-good memory or logic chips or known-good ASIC chips, a top surface of each of the first type of vertical-through-via (VTV) connectors 467-3 and a top surface of each of the through-silicon-via (TSV) bridges 471 and to expose a backside of each of the vertical through vias (VTVs) 358 of each of the first type of vertical-through-via (VTV) connectors 467-3, a backside of the copper layer 156 of each of the through silicon vias (TSVs) of each of the through-silicon-via (TSV) bridges 471 and, optionally, a backside of the copper layer 156 of each of the through silicon vias (TSVs) 157 of the topmost one of the memory chips 251 of each of the first or second type of memory modules 159, or a backside of the copper layer 156 of the through silicon vias (TSVs) 157 of each of the known-good memory or logic chips or known-good ASIC chips in case of replacing the first or second type of memory modules 159.

Referring to FIG. 30, with regard to the process for fabricating the sixth type of operation module 190, in the step as illustrated in FIGS. 28F and 29, the backside interconnection scheme 79 may be formed on the top surface of the second polymer layer 565-2, the top surface of each of the first or second type of memory modules 159, or known-good memory or logic chips or known-good ASIC chips, the top surface of each of the first type of vertical-through-via (VTV) connectors 467-3 and the top surface of each of the through-silicon-via (TSV) bridges 471. The backside interconnection scheme 79 may include (1) one or more interconnection metal layers 27 each coupling to one or more of the vertical through vias (VTVs) 358 of each of the first type of vertical-through-via (VTV) connectors 467-3, to one or more of the through silicon vias (TSVs) 157 of the through-silicon-via (TSV) bridges 471 and, optionally, to one or more of the through silicon vias (TSVs) 157 of the topmost one of the memory chips 251 of each of the first or second type of memory modules 159, or one or more of the through silicon vias (TSVs) 157 of each of the known-good memory or logic chips or known-good ASIC chips in case of replacing the first or second type of memory modules 159, and (2) one or more polymer layers 42 each between neighboring two of its interconnection metal layers 27, between a bottommost one of its interconnection metal layers 27 and a polished planar surface composed of the top surface of each of the first type of vertical-through-via (VTV) connectors 467-3, the top surface of each of the first or second type of memory modules 159, or known-good memory or logic chips or known-good ASIC chips, the top surface of each of the through-silicon-via (TSV) bridges 471 and the top surface of the second polymer layer 565-2 or on and above a topmost one of its interconnection metal layers 27, wherein the topmost one of its interconnection metal layers 27 may have multiple metal pads at bottoms of multiple openings **42*a* in the topmost one of its polymer layers 42. Each of the interconnection metal layers 27 and polymer layer 42 of the backside interconnection scheme 79 may have the same specifications as that as illustrated in FIGS. 21E and 23**E.

Referring to FIG. 30, the steps after forming the backside interconnection scheme 79 may be referred to those as illustrated in FIGS. 28G-28J and 29 for fabricating the fifth type of operation module 190. For the sixth type of operation module 190, the operation among each of its first or second type of memory modules 159, or known-good memory or logic chips or known-good ASIC chips, over one of its first and second known-good application specific integrated-circuit (ASIC) chips 399-1 and 399-2, said one of its first and second known-good application specific integrated-circuit (ASIC) chips 399-1 and 399-2 and the metal bumps 583 may be referred to that as illustrated in FIG. 29.

Referring to FIG. 30, for the sixth type of operation module 190, each of its first and second known-good application specific integrated-circuit (ASIC) logic chips 399-1 and 399-2 may have the semiconductor devices 4 such as transistors at the active surface of the semiconductor substrate 2 thereof as illustrated in FIG. 17A. The active surface of the semiconductor substrate 2 of said each of its first and second known-good application specific integrated-circuit (ASIC) logic chips 399-1 and 399-2 may face an active surface of the semiconductor substrate 2 of one of its known-good memory or logic chip or known-good ASIC chips in case of replacing the first or second type of memory modules 159, wherein said one of its known-good memory or logic chip or known-good ASIC chips is arranged over said each of its first and second known-good application specific integrated-circuit (ASIC) logic chips 399-1 and 399-2 and may have the semiconductor devices 4 such as transistors at the active surface of the semiconductor substrate 2 thereof as illustrated in FIG. 17B. The active surface of the semiconductor substrate 2 of each of its first and second known-good application specific integrated-circuit (ASIC) logic chips 399-1 and 399-2 may face its through-silicon-via (TSV) bridge 471.

Referring to FIG. 30, for the sixth type of operation module 190, each of its first and second known-good application specific integrated-circuit (ASIC) chips 399-1 and 399-2 may have a large input/output (I/O) circuit coupling to one of its metal bumps 583 for signal transmission or power or ground delivery through, in sequence, (1) the interconnection metal layers 27 of its frontside interconnection scheme 101, (2) one of the through silicon vias (TSVs) 157 of one of its through-silicon-via (TSV) bridges 471 partially over said each of its first and second known-good application specific integrated-circuit (ASIC) chips 399-1 and 399-2 or one of the dedicated vertical bypasses 698 in one of its second type of memory modules 159 as illustrated in FIG. 19B partially over said each of its first and second known-good application specific integrated-circuit (ASIC)

chips 399-1 and 399-2, or one of the through silicon vias (TSVs) 157 of its known-good memory or logic chip or known-good ASIC chip in case of replacing said one of its second type of memory modules 159, and (3) the interconnection metal layers 27 of its backside interconnection scheme 79, wherein said one of the dedicated vertical bypasses 698 is not connected to any transistor in the memory chips 251 or control chip 688 of said one of its second type of memory modules 159, or said one of the through silicon vias (TSVs) 157 is not connected to any transistor in its known-good memory or logic chip or known-good ASIC chip in case of replacing said one its second type of memory modules 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One or more of the vertical interconnects 699 of each of its first or second type of memory modules 159 as illustrated in FIG. 19A or 19B may couple to one or more of its metal bumps 583 respectively through the interconnection metal layers 27 of its backside interconnection scheme 79 and to one of its first and second known-good application specific integrated-circuit (ASIC) chips 399-1 and 399-2 under said each of its first or second type of memory modules 159 through the interconnection metal layers 27 of its frontside interconnection scheme 101. Its first and second known-good application specific integrated-circuit (ASIC) chips 399-1 and 399-2 may couple to each other through one or more of the interconnection metal layers 6 of the first interconnection scheme 560 of its through-silicon-via (TSV) bridge 471 and/or interconnection metal layers 27 of the second interconnection scheme 588 of its through-silicon-via (TSV) bridge 471. Its thermoelectric (TE) cooler 633 may couple to two of its second metal bumps 583 for power and ground delivery respectively through, in sequence, two of the vertical through vias (VTVs) 358 of its first type of vertical-through-via (VTV) connector 467-1 and two of the vertical through vias (VTVs) 358 of its first type of vertical-through-via (VTV) connector 467-3.

7. Seventh Type of Operation Module

Figure 31:
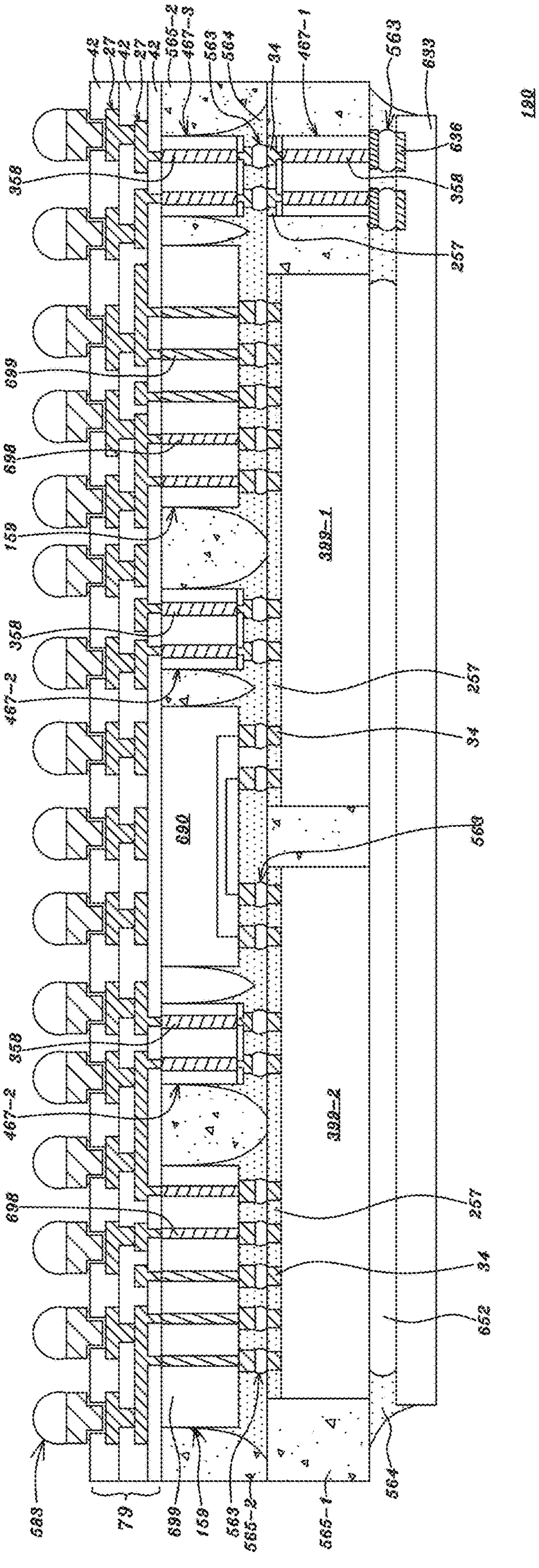
FIG. 31 is a schematically cross-sectional view showing a seventh type of operation module in accordance with an embodiment of the present application.

FIG. 31 is a schematically cross-sectional view showing a seventh type of operation module in accordance with an embodiment of the present application. Referring to FIG. 31, the seventh type of operation module 190 may be fabricated by a process similar to that as illustrated in FIGS. 28A-28J and 29 for the fifth type of operation module and may have a structure similar to that as illustrated in FIG. 29 for the fifth type of operation module. For an element indicated by the same reference number shown in FIGS. 28A-28J, 29 and 31, the specification of the element as seen in FIG. 31 may be referred to that of the element as illustrated in FIG. 28A-28J or 29. The difference between the fifth and seventh types of operation modules 190 is that the seventh type of operation module 190 may be provided without the frontside interconnection scheme 101 as seen in FIG. 29.

Referring to FIG. 31, with regard to the process for fabricating the seventh type of operation module 190, the steps before fabricating the frontside interconnection scheme 101 may be referred to those as illustrated in FIGS. 28A, 28B and 29 for fabricating the fifth type of operation module 190. Each of the first or second type of memory modules 159 as illustrated in FIG. 19A or 19B may be provided to have its second type of micro-bumps or micro-pillars 34 to be bonded to the first type of micro-bumps or micro-pillars 34 of one of the first and second known-good application specific integrated-circuit (ASIC) chips 399-1 and 399-2 into multiple bonded contacts 563 respectively therebetween, as referred to the second case illustrated in FIGS. 21A-21C. Each of the first or second type of memory modules 159 may extend across over an edge of one of the first and second known-good application specific integrated-circuit (ASIC) chips 399-1 and 399-2. Alternatively, each of the first or second type of memory modules 159 may be replaced with a known-good memory or logic chip or known-good ASIC chip as illustrated in FIGS. 28D and 28E having the structure as illustrated in FIG. 17B.

Further, referring to FIG. 31, for a case, each of the first type of vertical-through-via (VTV) connectors 467-2 as illustrated in FIG. 1F, 1I, 1L, 2D, 2G or 2J may be provided to have its second type of micro-bumps or micro-pillars 34 to be bonded to the first type of micro-bumps or micro-pillars 34 of one of the first and second known-good application specific integrated-circuit (ASIC) chips 399-1 and 399-2 vertically under said each of the first type of vertical-through-via (VTV) connectors 467-2 into multiple bonded contacts 563 therebetween, and each of the first type of vertical-through-via (VTV) connectors 467-3 as illustrated in FIG. 1F, 1I, 1L, 2D, 2G or 2J may be provided to have its second type of micro-bumps or micro-pillars 34 to be bonded to the first type of micro-bumps or micro-pillars 34 of one of the first type of vertical-through-via (VTV) connectors 467-1 vertically under said each of the first type of vertical-through-via (VTV) connectors 467-3 into multiple bonded contacts 563 therebetween, both as referred to the second case as illustrated in FIGS. 21A-21C for bonding the second type of micro-bumps or micro-pillars 34 of each of the second type of memory modules 159, or known-good memory or logic chips or known-good ASIC chips to the first type of micro-bumps or micro-pillars 34 of the semiconductor wafer 100*b*. For another case, each of the first type of vertical-through-via (VTV) connectors 467-2 as illustrated in FIG. 5J, 5L, 5N, 6D, 6F or 6H may be provided to have its fifth type of micro-bumps or micro-pillars 34 to be bonded to the first type of micro-bumps or micro-pillars 34 of one of the first and second known-good application specific integrated-circuit (ASIC) chips 399-1 and 399-2 vertically under said each of the first type of vertical-through-via (VTV) connectors 467-2 into multiple bonded contacts 563 therebetween, and each of the first type of vertical-through-via (VTV) connectors 467-3 as illustrated in FIG. 5J, SL, 5N, 6D, 6F or 6H may be provided to have its fifth type of micro-bumps or micro-pillars 34 to be bonded to the first type of micro-bumps or micro-pillars 34 of one of the first type of vertical-through-via (VTV) connectors 467-1 vertically under said each of the first type of vertical-through-via (VTV) connectors 467-3 into multiple bonded contacts 563 therebetween, both as referred to the process of bonding the first type of vertical-through-via (VTV) connectors 467 as illustrated in FIG. 5J, SL, 5N, 6D, 6F or 6H to the first type of micro-bumps or micro-pillars 34 preformed at the active side of the semiconductor wafer 100*b* as illustrated in FIGS. 26B and 26C. For another case, each of the first type of vertical-through-via (VTV) connectors 467-2 as illustrated in FIG. 7E may be provided to have its sixth type of micro-bumps or micro-pillars 34 to be bonded to the first type of micro-bumps or micro-pillars 34 of one of the first and second known-good application specific integrated-circuit (ASIC) chips 399-1 and 399-2 vertically under said each of the first type of verticalthrough-via (VTV) connectors 467-2 into multiple bonded contacts 563 therebetween, and each of the first type of vertical-through-via (VTV) connectors 467-3 as illustrated in FIG. 7E may be provided to have its sixth type of micro-bumps or micro-pillars 34 to be bonded to the first type of micro-bumps or micro-pillars 34 of one of the first type of vertical-through-via (VTV) connectors 467-1 vertically under said each of the first type of vertical-through-via (VTV) connectors 467-3 into multiple bonded contacts 563 therebetween, both as referred to the process of bonding the first type of vertical-through-via (VTV) connectors 467 as illustrated in FIG. 7E to the first type of micro-bumps or micro-pillars 34 preformed at the active side of the semiconductor wafer 100*b* as illustrated in FIGS. 26B and 26C.

Further, referring to FIG. 31, each of the fine-line interconnection bridges (FIBs) 690 (only one is shown), which may be of the first or second type as illustrated in FIG. 15A or 15B, may be provided with the first, second or third type of micro-bumps or micro-pillars 34, a right group of which each may be bonded to one of the first type of micro-bumps or micro-pillars 34 of one of the first known-good application specific integrated-circuit (ASIC) chips 399-1 into a bonded contact 563 therebetween and a left group of which each may be bonded to one of the first type of micro-bumps or micro-pillars 34 of one of the second known-good application specific integrated-circuit (ASIC) chips 399-2 into a bonded contact 563 therebetween, as referred to the second case as illustrated in FIGS. 21A-21C. Each of the fine-line interconnection bridges (FIBs) 690 may be arranged across over an edge of one of the first known-good application specific integrated-circuit (ASIC) chips 399-1 and an edge of one of the second known-good application specific integrated-circuit (ASIC) chips 399-2 adjacent to said one of the first known-good application specific integrated-circuit (ASIC) chips 399-1.

Referring to FIG. 31, with regard to the process for fabricating the seventh type of operation module 190, in the step as illustrated in FIG. 28E, the underfill 564 may be filled into a gap between each of the first type of vertical-through-via (VTV) connectors 467-2 and 467-3, fine-line interconnection bridges (FIBs) 690 and first or second type of memory modules 159, or known-good memory or logic chips or known-good ASIC chips, and a polished planar surface composed of a top surface of the first polymer layer 565-1 and a top surface of the insulating dielectric layer 257 of each of the first and second known-good application specific integrated-circuit (ASIC) chips 399-1 and 399-2 and first type of vertical-through-via (VTV) connectors 467-1 to enclose the bonded contacts 563 therebetween.

Referring to FIG. 31, with regard to the process for fabricating the seventh type of operation module 190, the steps after forming the underfill 564 may be referred to those as illustrated in FIGS. 28E-28J and 29 for fabricating the fifth type of operation module 190.

Referring to FIG. 31, for the seventh type of operation module 190, each of its first and second known-good application specific integrated-circuit (ASIC) logic chips 399-1 and 399-2 may have the semiconductor devices 4 such as transistors at the active surface of the semiconductor substrate 2 thereof as illustrated in FIG. 17A. The active surface of the semiconductor substrate 2 of said each of its first and second known-good application specific integrated-circuit (ASIC) logic chips 399-1 and 399-2 may face an active surface of the semiconductor substrate 2 of one of its known-good memory or logic chip or known-good ASIC chips in case of replacing the first or second type of memory modules 159, wherein said one of its known-good memory or logic chip or known-good ASIC chips is arranged over said each of its first and second known-good application specific integrated-circuit (ASIC) logic chips 399-1 and 399-2 and may have the semiconductor devices 4 such as transistors at the active surface of the semiconductor substrate 2 thereof as illustrated in FIG. 17B. The active surface of the semiconductor substrate 2 of said each of its first and second known-good application specific integrated-circuit (ASIC) logic chips 399-1 and 399-2 may face one of its first type of vertical-through-via (VTV) connectors 467-2 over said each of its first and second known-good application specific integrated-circuit (ASIC) logic chips 399-1 and 399-2 and its fine-line interconnection bridge (FIB) 690.

Referring to FIG. 31, for the seventh type of operation module 190, each of its first or second type of memory modules 159, or known-good memory or logic chips or known-good ASIC chips, over one of its first and second known-good application specific integrated-circuit (ASIC) chips 399-1 and 399-2 may have multiple small I/O circuits coupling respectively to multiple small I/O circuits of said one of its first and second known-good application specific integrated-circuit (ASIC) chips 399-1 and 399-2 through the bonded contacts 563 respectively therebetween for data transmission with a data bit width of equal to or greater than 64, 128, 256, 512, 1024, 2048, 4096, 8K, or 16K, wherein each of the small I/O circuits of said each of its first or second type of memory modules 159, or known-good memory or logic chips or known-good ASIC chips, and said one of its first and second known-good application specific integrated-circuit (ASIC) chips 399-1 and 399-2 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. The operation among each of its first or second type of memory modules 159, or known-good memory or logic chips or known-good ASIC chips, over one of its first and second known-good application specific integrated-circuit (ASIC) chips 399-1 and 399-2, said one of its first and second known-good application specific integrated-circuit (ASIC) chips 399-1 and 399-2 and the metal bumps 583 may be referred to that as illustrated in FIG. 29.

Referring to each of FIG. 31, for the seventh type of operation module 190, each of its first and second known-good application specific integrated-circuit (ASIC) chips 399-1 and 399-2 may have a large input/output (I/O) circuit coupling to one of its metal bumps 583 for signal transmission or power or ground delivery through, in sequence, (1) one of the vertical through vias (VTVs) 358 of one of its first type of vertical-through-via (VTV) connectors 467-2 over said each of its first and second known-good application specific integrated-circuit (ASIC) chips 399-1 and 399-2, or one of the dedicated vertical bypasses 698 in one of its second type of memory modules 159 as illustrated in FIG. 19B partially over said each of its first and second known-good application specific integrated-circuit (ASIC) chips 399-1 and 399-2, or one of the through silicon vias (TSVs) 157 of its known-good memory or logic chip or known-good ASIC chip in case of replacing said one of its second type of memory modules 159, and (2) the interconnection metal layers 27 of its backside interconnection scheme 79, wherein said one of the dedicated vertical bypasses 698 is not connected to any transistor in the memory chips 251 or control chip 688 of said one of its second type of memory modules 159, or said one of the through silicon vias (TSVs) 157 is not connected to any transistor in its known-good memory or logic chip or known-good ASIC chip in case of replacing said one of its second type of memory modules 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One or more of the vertical interconnects 699 of each of its first or second type of memory modules 159 as illustrated in FIG. 19A or 19B may couple to one or more of its second metal bumps 583 respectively through the interconnection metal layers 27 of its backside interconnection scheme 79 and to one of its first and second known-good application specific integrated-circuit (ASIC) chips 399-1 and 399-2 under said each of its first or second type of memory modules 159 through one or more bonded contacts 563 between said each of its first or second type of memory modules 159 and said one of its first and second known-good application specific integrated-circuit (ASIC) chips 399-1 and 399-2 respectively. Its first and second known-good application specific integrated-circuit (ASIC) chips 399-1 and 399-2 may couple to each other through one or more of the interconnection metal layers 6 of the first interconnection scheme 560 of its fine-line interconnection bridge (FIB) 690 and/or interconnection metal layers 27 of the second interconnection scheme 588 of its fine-line interconnection bridges (FIB) 690. Its thermoelectric (TE) cooler 633 may couple to two of its metal bumps 583 for power and ground delivery respectively through, in sequence, two of the vertical through vias (VTVs) 358 of its first type of vertical-through-via (VTV) connector 467-1 and two of the vertical through vias (VTVs) 358 of its first type of vertical-through-via (VTV) connector 467-3.

8. Eighth Type of Operation Module

Figure 32:
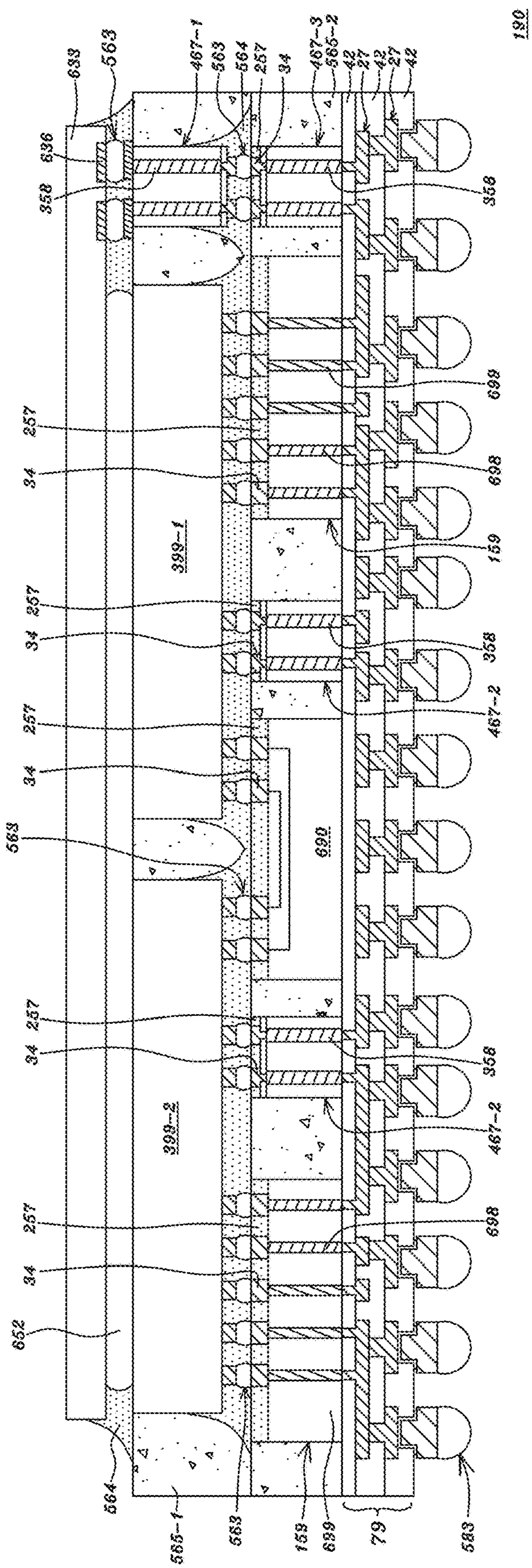
FIG. 32 is a schematically cross-sectional view showing an eighth type of operation module in accordance with an embodiment of the present application.

FIG. 32 is a schematically cross-sectional view showing an eighth type of operation module in accordance with an embodiment of the present application. Referring to FIG. 32, the eighth type of operation module may have a similar structure as illustrated for the seventh type of operation module in FIG. 31. For an element indicated by the same reference number shown in FIGS. 28A-28J, 29, 31 and 32, the specification of the element as seen in FIG. 32 may be referred to that of the element as illustrated in FIG. 28A-28J, 29 or 31.

Referring to FIG. 32, multiple first or second type of memory modules 159 as illustrated in FIG. 19A or 19B may be provided with the first type of micro-bumps or micro-pillars 34. Each of the first or second type of memory modules 159 may further include an insulating dielectric layer 257, such as polymer layer, at a top thereof, covering a top surface of its first type of micro-bumps or micro-pillars 34 thereof. Each of the first or second type of memory modules 159 may have a backside to be attached to the sacrificial bonding layer 591 of the temporary substrate 590 as illustrated in FIG. 28A. Alternatively, each of the first or second type of memory modules 159 may be replaced with a known-good memory or logic chip or known-good ASIC chip as illustrated in FIGS. 28D and 28E, and the known-good memory or logic chip or known-good ASIC chip may have the structure as illustrated in FIG. 17B and further include an insulating dielectric layer 257, such as polymer layer, at a top thereof, covering a top surface of its first type of micro-bumps or micro-pillars 34 thereof. The known-good memory or logic chip or known-good ASIC chip may have a backside to be attached to the sacrificial bonding layer 591 of the temporary substrate 590 as illustrated in FIG. 28A.

Further, referring to FIG. 32, multiple first type of vertical-through-via (VTV) connectors 467-2 and 467-3, which may be one as illustrated in any of FIGS. 1F, 1I, 1L, 2D, 2G and 2J, may be provided with the first type of micro-bumps or micro-pillars 34. Alternatively, each of the first type of vertical-through-via (VTV) connectors 467-2 and 467-3 may have a structure as illustrated in any of FIGS. 5J, 5L, 5N, 6D, 6F and 6H, but its fifth type of micro-bumps or micro-pillars 34 is replaced with the first type of micro-bumps or micro-pillars 34 as illustrated in FIG. 1F. Alternatively, each of the first type of vertical-through-via (VTV) connectors 467-2 and 467-3 may have a structure as illustrated in any of FIG. 7E, but its sixth type of micro-bumps or micro-pillars 34 is replaced with the first type of micro-bumps or micro-pillars 34 as illustrated in FIG. 1F. Each of the first type of vertical-through-via (VTV) connectors 467-2 and 467-3 may further include an insulating dielectric layer 257, such as polymer layer, at a top thereof, covering a top surface of its first type of micro-bumps or micro-pillars 34. Each of the first type of vertical-through-via (VTV) connectors 467-2 and 467-3 may have a backside to be attached to the sacrificial bonding layer 591 of the temporary substrate 590 as illustrated in FIG. 28A.

Further, referring to FIG. 32, multiple fine-line interconnection bridges (FIBs) 690 (only one is shown), which may be of the first or second type as illustrated in FIG. 15A or 15B, may be provided with the first type of micro-bumps or micro-pillars 34. Each of the first type of vertical-through-via (VTV) connectors 467-2 and 467-3 may further include an insulating dielectric layer 257, such as polymer layer, at a top thereof, covering a top surface of its first type of micro-bumps or micro-pillars 34 thereof. Each of the fine-line interconnection bridges (FIBs) 690 may have a backside to be attached to the sacrificial bonding layer 591 of the temporary substrate 590 as illustrated in FIG. 28A.

Next, referring to FIG. 32, the second polymer layer 565-2, e.g., resin or compound, may be applied to fill a gap between each neighboring two of the first or second type of memory modules 159, or known-good memory or logic chips or known-good ASIC chips, and first type of vertical-through-via (VTV) connectors 467-2 and 467-3 and a gap between each neighboring two of the fine-line interconnection bridges (FIBs) 690 and first type of vertical-through-via (VTV) connectors 467-2 and to cover the insulating dielectric layer 257 of each of the first or second type of memory modules 159, or known-good memory or logic chips or known-good ASIC chips, the first type of vertical-through-via (VTV) connectors 467-2 and 467-3 and the fine-line interconnection bridges (FIBs) 690 by methods, for example, spin-on coating, screen-printing, dispensing or molding. The second polymer layer 565-2 may be, for example, polyimide, BenzoCycloButene (BCB), parylene, epoxy-based material or compound, photo epoxy SU-8, elastomer, or silicone. The second polymer layer 565-2 may be cured or cross-linked at a temperature higher than or equal to 50, 70, 90, 100, 125, 150, 175, 200, 225, 250, 275 or 300 degrees Celsius.

Next, referring to FIG. 32, a chemical mechanical polishing (CMP), polishing or grinding process may be applied to remove a top portion of the second polymer layer 565-2 and a top portion of the insulating dielectric layer 257 of each of the first or second type of memory modules 159, or known-good memory or logic chips or known-good ASIC chips, the first type of vertical-through-via (VTV) connectors 467-2 and 467-3 and the fine-line interconnection bridges (FIBs) 690 and to planarize a top surface of the second polymer layer 565-2, the top of each of the first type of micro-bumps or micro-pillars 34 of each of the first or second type of memory modules 159, or known-good memory or logic chips or known-good ASIC chips, the first type of vertical-through-via (VTV) connectors 467-2 and 467-3 and the fine-line interconnection bridges (FIBs) 690. Thereby, the top of each of the first type of micro-bumps or micro-pillars 34 of each of the first or second type of memory modules 159, or known-good memory or logic chips or known-good ASIC chips, the first type of vertical-through-via (VTV) connectors 467-2 and 467-3 and the fine-line interconnection bridges (FIBs) 690 may be exposed.

Next, referring to FIG. 32, multiple first known-good semiconductor chips that may be first application specific integrated-circuit (ASIC) chips 399-1, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, each may be provided with the first and/or second interconnection scheme(s) 560 and/or 588 and second type of micro-bumps or micro-pillars 34 as illustrated in FIG. 17A. Multiple second known-good semiconductor chips that may be second application specific integrated-circuit (ASIC) chips 399-2, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, each may be provided with the first and/or second interconnection scheme(s) 560 and/or 588 and second type of micro-bumps or micro-pillars 34 as illustrated in FIG. 17A. Each of the first and second application specific integrated-circuit (ASIC) chips 399-1 and 399-2 may be provided to have its second type of micro-bumps or micro-pillars 34 each to be bonded to one of the first type of micro-bumps or micro-pillars 34 of one of the first or second type of memory modules 159, or known-good memory or logic chips or known-good ASIC chips, the first type of vertical-through-via (VTV) connectors 467-2 and the fine-line interconnection bridges (FIBs) 690 vertically under said each of the first and second application specific integrated-circuit (ASIC) chips 399-1 and 399-2, as referred to the second case illustrated in FIGS. 21A-21C for bonding the second type of micro-bumps or micro-pillars 34 of each of the second type of memory modules 159, or known-good memory or logic chips or known-good ASIC chips, to the first type of micro-bumps or micro-pillars 34 of the semiconductor wafer 100*b*. Each of the second type of memory modules 159, or known-good memory or logic chips or known-good ASIC chips, may extend under one of the first and second application specific integrated-circuit (ASIC) chips 399-1 and 399-2 and across an edge said one of the first and second application specific integrated-circuit (ASIC) chips 399-1 and 399-2. Each of the fine-line interconnection bridges (FIBs) 690 may extend under neighboring two of the first and second application specific integrated-circuit (ASIC) chips 399-1 and 399-2 and across an edge of each of said neighboring two of the first and second application specific integrated-circuit (ASIC) chips 399-1 and 399-2.

Further, referring to FIG. 32, each of the first type of vertical-through-via (VTV) connectors 467-1 as illustrated in any of FIG. 1F, 1I, 1L, 2D, 2G or 2J may be provided with the second type of micro-bumps or micro-pillars 34 to be bonded to the first type of micro-bumps or micro-pillars 34 of one of the first type of vertical-through-via (VTV) connectors 467-3 into multiple bonded contacts 563 respectively therebetween, as referred to the second case as illustrated in FIGS. 21A-21C for bonding the second type of micro-bumps or micro-pillars 34 of each of the second type of memory modules 159, or known-good memory or logic chips or known-good ASIC chips to the first type of micro-bumps or micro-pillars 34 of the semiconductor wafer 100*b*. For another case, each of the first type of vertical-through-via (VTV) connectors 467-1 as illustrated in any of FIG. 5J, 5L, 5N, 6D, 6F or 6H may be provided with the fifth type of micro-bumps or micro-pillars 34 to be bonded to the first type of micro-bumps or micro-pillars 34 of one of the first type of vertical-through-via (VTV) connectors 467-3 into multiple bonded contacts 563 respectively therebetween, as referred to the process of bonding the first type of vertical-through-via (VTV) connectors 467 as illustrated in FIG. 5J, 5L, 5N, 6D, 6F or 6H to the first type of micro-bumps or micro-pillars 34 preformed at the active side of the semiconductor wafer 100*b* as illustrated in FIGS. 26B and 26C. For another case, each of the first type of vertical-through-via (VTV) connectors 467-1 as illustrated in any of FIG. 7E may be provided with the sixth type of micro-bumps or micro-pillars 34 to be bonded to the first type of micro-bumps or micro-pillars 34 of one of the first type of vertical-through-via (VTV) connectors 467-3 into multiple bonded contacts 563 respectively therebetween, as referred to the process of bonding the first type of vertical-through-via (VTV) connectors 467 as illustrated in FIG. 7E to the first type of micro-bumps or micro-pillars 34 preformed at the active side of the semiconductor wafer 100*b* as illustrated in FIGS. 26B and 26C.

Next, referring to FIG. 32, the underfill 564 may be filled into a gap between each of the first and second known-good application specific integrated-circuit (ASIC) chips 399-1 and 399-2 and first type of vertical-through-via (VTV) connectors 467-1 and a polished planar surface composed of a top surface of the second polymer layer 565-2 and a top surface of the insulating dielectric layer 257 of each of the first type of vertical-through-via (VTV) connectors 467-2 and 467-3, fine-line interconnection bridges (FIBs) 690 and first or second type of memory modules 159, or known-good memory or logic chips or known-good ASIC chips, to enclose the bonded contacts 563 therebetween.

Next, referring to FIG. 32, the first polymer layer 565-1, e.g., resin or compound, may be applied to fill a gap between each neighboring two of the first and second known-good application specific integrated-circuit (ASIC) chips 399-1 and 399-2 and a gap between each neighboring two of the first known-good application specific integrated-circuit (ASIC) chips 399-1 and first type of vertical-through-via (VTV) connectors 467-1 and to cover a backside of each of the first and second known-good application specific integrated-circuit (ASIC) chips 399-1 and 399-2 and first type of vertical-through-via (VTV) connectors 467-1 by methods, for example, spin-on coating, screen-printing, dispensing or molding. The first polymer layer 565-1 may be, for example, polyimide, BenzoCycloButene (BCB), parylene, epoxy-based material or compound, photo epoxy SU-8, elastomer, or silicone. The first polymer layer 565-1 may be cured or cross-linked at a temperature higher than or equal to 50, 70, 90, 100, 125, 150, 175, 200, 225, 250, 275 or 300 degrees Celsius.

Next, referring to FIG. 32, the glass or silicon substrate 589 and sacrificial bonding layer 591 may be released from a bottom surface of the second polymer layer 565-2 and the backside of each of the first type of vertical-through-via (VTV) connectors 467-2 and 467-3, fine-line interconnection bridges (FIBs) 690 and first or second type of memory modules 159, or known-good memory or logic chips or known-good ASIC chips, as referred to the process illustrated in FIG. 28H for releasing the glass or silicon substrate 589 and sacrificial bonding layer 591 from the bottom surface of the first polymer layer 565-1 and the backside of each of the first known-good application specific integrated-circuit (ASIC) chips 399-1 and first type of vertical-through-via (VTV) connectors 467-1.

Next, referring to FIG. 32, a chemical mechanical polishing (CMP), polishing or grinding process may be applied to remove a bottom portion of the second polymer layer 565-2, a bottom portion of each of the first or second type of memory modules 159, or known-good memory or logic chips or known-good ASIC chips, a bottom portion of each of the fine-line interconnection bridges (FIBs) 690 and a bottom portion of each of the first type of vertical-through-via (VTV) connectors 467-2 and 467-3, to planarize a bottom surface of the second polymer layer 565-2, a bottom surface of each of the first or second type of memory modules 159, or known-good memory or logic chips or known-good ASIC chips, a bottom surface of each of the fine-line interconnection bridges (FIBs) 690 and a bottom surface of each of the first type of vertical-through-via (VTV) connectors 467-2 and 467-3 and to expose a backside of each of the vertical through vias (VTVs) 358 of each of the first type of vertical-through-via (VTV) connectors 467-2 and 467-3 and, optionally, a backside of the copper layer 156 of each of the through silicon vias (TSVs) 157 of the bottommost one of the memory chips 251 of each of the first or second type of memory modules 159, or a backside of the copper layer 156 of the through silicon vias (TSVs) 157 of each of the known-good memory or logic chips or known-good ASIC chips in case of replacing the first or second type of memory modules 159, as referred to the process illustrated upside down in FIG. 28F for applying the chemical mechanical polishing (CMP), polishing or grinding process.

Next, referring to FIG. 32, the backside interconnection scheme 79 may be formed under the bottom surface of the second polymer layer 565-2 and the bottom surface of each of the first or second type of memory modules 159, or known-good memory or logic chips or known-good ASIC chips, the bottom surface of each of the fine-line interconnection bridges (FIBs) 690 and the bottom surface of each of the first type of vertical-through-via (VTV) connectors 467-2 and 467-3, as referred to the process illustrated upside down in FIG. 28G for forming the backside interconnection scheme 79. Each of the interconnection metal layers 27 and polymer layer 42 of the backside interconnection scheme 79 may have the same specifications as that as illustrated in FIGS. 21E and 23E.

Next, referring to FIG. 32, the metal bumps 583, which may be of one of the first through fourth types having the same specifications as the first through fourth types of micro-bumps or micro-pillars 34 as illustrated upside down in FIG. 1F respectively, may be formed on the metal pads of the bottommost one of the interconnection metal layers 27 of the backside interconnection scheme 79 at the tops of the openings in the bottommost one of the polymer layers 42 of the backside interconnection scheme 79.

Next, referring to FIG. 32, a chemical mechanical polishing (CMP), polishing or grinding process may be applied to remove a top portion of the first polymer layer 565-1, a top portion of each of the first or second known-good application specific integrated-circuit (ASIC) chips 399-1 and 399-2 and a top portion of each of the first type of vertical-through-via (VTV) connectors 467-1, to planarize a top surface of the first polymer layer 565-1, a top surface of each of the first and second known-good application specific integrated-circuit (ASIC) chips 399-1 and 399-2 and a top surface of each of the first type of vertical-through-via (VTV) connectors 467-1 and to expose a backside of each of the vertical through vias (VTVs) 358 of each of the first type of vertical-through-via (VTV) connectors 467-1, as referred to the process illustrated upside down in FIG. 28H for applying the chemical mechanical polishing (CMP), polishing or grinding process.

Next, referring to FIG. 32, each of the thermoelectric (TE) coolers 633 as illustrated in FIG. 18B may be provided with the cold side to be attached to the top surface of one of the first known-good application specific integrated-circuit (ASIC) chips 399-1 and the top surface of one of the second known-good application specific integrated-circuit (ASIC) chips 399-2 via the heat conductive adhesive 652 and the solder bumps 659 each to be attached to a solder paste preformed on the backside of one of the vertical through vias (VTVs) 358 of the first type of vertical-through-via (VTV) connectors 467-1 and then to be reflowed into a bonded contact 563 therebetween. Next, the underfill 564 may be filled into a gap between each of the thermoelectric (TE) coolers 633 and a polished planar surface composed of the top surface of each of the first and second known-good application specific integrated-circuit (ASIC) chips 399-1 and 399-2, the top surface of each of the first type of vertical-through-via (VTV) connectors 467-1 and the top surface of the first polymer layer 565-1 to enclose the bonded contacts 563 therebetween.

Next, the first and second polymer layers 565-1 and 565-2 and polymer layers 42 of the backside interconnection scheme 79 may be cut or diced to form multiple eighth type of operation modules 190 or chip scale packages (CSP) as shown in FIG. 32 by a laser cutting process or by a mechanical cutting process.

Referring to FIG. 32, for the eighth type of operation module 190, each of its first and second known-good application specific integrated-circuit (ASIC) logic chips 399-1 and 399-2 may have the semiconductor devices 4 such as transistors at the active surface of the semiconductor substrate 2 thereof as illustrated in FIG. 17A. The active surface of the semiconductor substrate 2 of said each of its first and second known-good application specific integrated-circuit (ASIC) logic chips 399-1 and 399-2 may face an active surface of the semiconductor substrate 2 of one of its known-good memory or logic chip or known-good ASIC chips in case of replacing the first or second type of memory modules 159, wherein said one of its known-good memory or logic chip or known-good ASIC chips is arranged under said each of its first and second known-good application specific integrated-circuit (ASIC) logic chips 399-1 and 399-2 and may have the semiconductor devices 4 such as transistors at the active surface of the semiconductor substrate 2 thereof as illustrated in FIG. 17B. The active surface of the semiconductor substrate 2 of said each of its first and second known-good application specific integrated-circuit (ASIC) logic chips 399-1 and 399-2 may face one of its first type of vertical-through-via (VTV) connectors 467-2 under said each of its first and second known-good application specific integrated-circuit (ASIC) logic chips 399-1 and 399-2 and its fine-line interconnection bridge (FIB) 690.

Referring to FIG. 32, for the eighth type of operation module 190, each of its first or second type of memory modules 159, or known-good memory or logic chips or known-good ASIC chips, under one of its first and second known-good application specific integrated-circuit (ASIC) chips 399-1 and 399-2 may have multiple small I/O circuits coupling respectively to multiple small I/O circuits of said one of its first and second known-good application specific integrated-circuit (ASIC) chips 399-1 and 399-2 through the bonded contacts 563 respectively therebetween for data transmission with a data bit width of equal to or greater than 64, 128, 256, 512, 1024, 2048, 4096, 8K, or 16K, wherein each of the small I/O circuits of said each of its first or second type of memory modules 159, or known-good memory or logic chips or known-good ASIC chips, and said one of its first and second known-good application specific integrated-circuit (ASIC) chips 399-1 and 399-2 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. The operation among each of its first or second type of memory modules 159, or known-good memory or logic chips or known-good ASIC chips, over one of its first and second known-good application specific integrated-circuit (ASIC) chips 399-1 and 399-2, said one of its first and second known-good application specific integrated-circuit (ASIC) chips 399-1 and 399-2 and the metal bumps 583 may be referred to that as illustrated in FIG. 29.

Referring to each of FIG. 32, for the eighth type of operation module 190, each of its first and second known-good application specific integrated-circuit (ASIC) chips 399-1 and 399-2 may have a large input/output (I/O) circuit coupling to one of its metal bumps 583 for signal transmission or power or ground delivery through, in sequence, (1) one of the vertical through vias (VTVs) 358 of one of its first type of vertical-through-via (VTV) connectors 467-2 under said each of its first and second known-good application specific integrated-circuit (ASIC) chips 399-1 and 399-2 or one of the dedicated vertical bypasses 698 in one of its second type of memory modules 159 as illustrated in FIG. 19B partially under said each of its first and second known-good application specific integrated-circuit (ASIC) chips 399-1 and 399-2, or one of the through silicon vias (TSVs) 157 of its known-good memory or logic chip or known-good ASIC chip in case of replacing said one of its second type of memory modules 159, and (2) the interconnection metal layers 27 of its backside interconnection scheme 79, wherein said one of the dedicated vertical bypasses 698 is not connected to any transistor in the memory chips 251 or control chip 688 of said one of its second type of memory modules 159, or said one of the through silicon vias (TSVs) 157 is not connected to any transistor in its known-good memory or logic chip or known-good ASIC chip in case of replacing said one of its second type of memory modules 159, wherein the large input/output (I/O) circuit may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. One or more of the vertical interconnects 699 of each of its first or second type of memory modules 159 as illustrated in FIG. 19A or 19B may couple to one or more of its second metal bumps 583 respectively through the interconnection metal layers 27 of its backside interconnection scheme 79 and to one of its first and second known-good application specific integrated-circuit (ASIC) chips 399-1 and 399-2 over said each of its first or second type of memory modules 159 through one or more bonded contacts 563 between said each of its first or second type of memory modules 159 and said one of its first and second known-good application specific integrated-circuit (ASIC) chips 399-1 and 399-2 respectively. Its first and second known-good application specific integrated-circuit (ASIC) chips 399-1 and 399-2 may couple to each other through one or more of the interconnection metal layers 6 of the first interconnection scheme 560 of its fine-line interconnection bridge (FIB) 690 and/or interconnection metal layers 27 of the second interconnection scheme 588 of its fine-line interconnection bridges (FIB) 690. Its thermoelectric (TE) cooler 633 may couple to two of its metal bumps 583 for power and ground delivery respectively through, in sequence, two of the vertical through vias (VTVs) 358 of its first type of vertical-through-via (VTV) connector 467-1 and two of the vertical through vias (VTVs) 358 of its first type of vertical-through-via (VTV) connector 467-3.

Ninth Type of Operation Module

Figure 33:
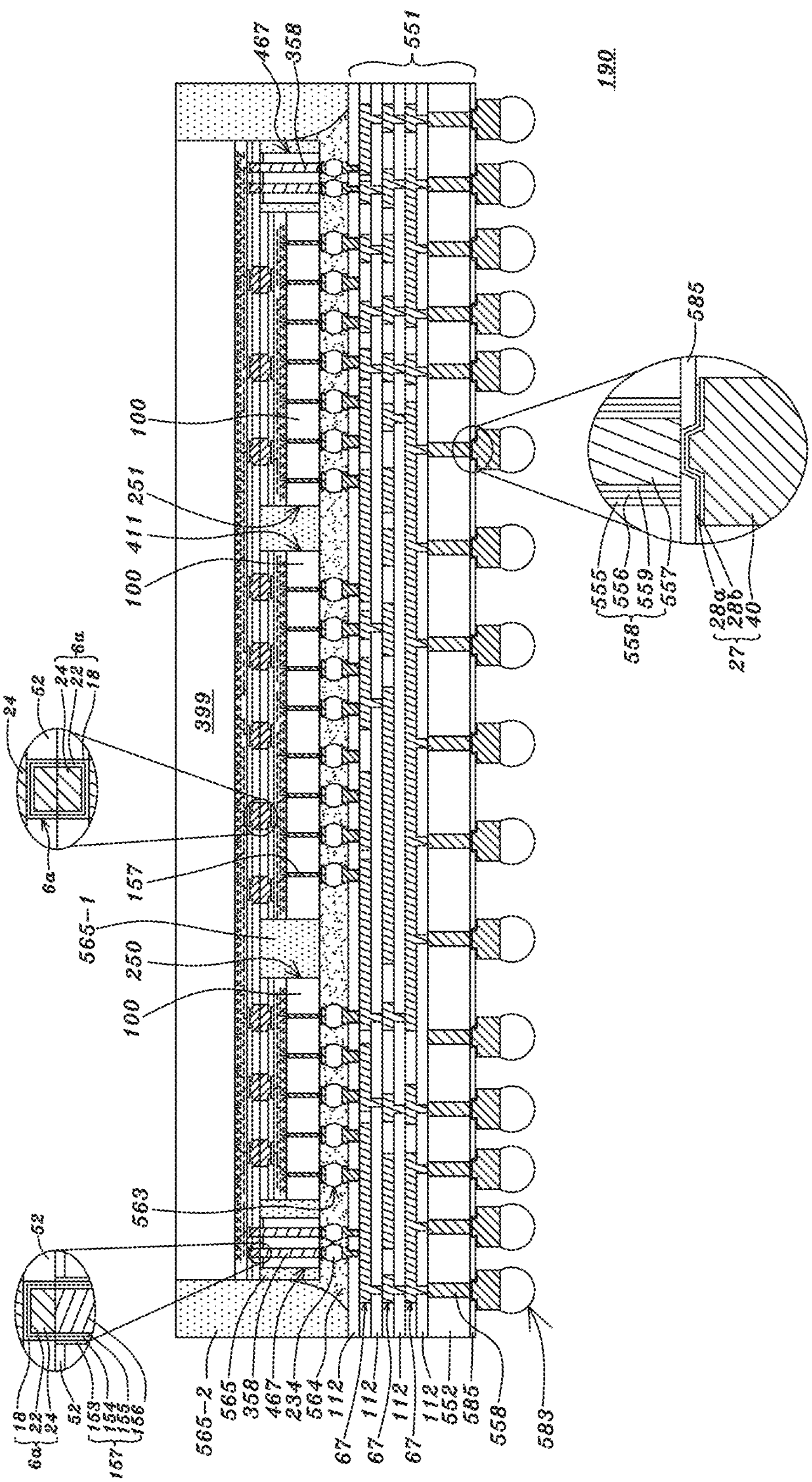
FIG. 33 is a schematically cross-sectional view showing a ninth type of operation module in accordance with an embodiment of the present application.

FIG. 33 is a schematically cross-sectional view showing a ninth type of operation module in accordance with an embodiment of the present application. Referring to FIG. 33, the ninth type of operation module 190 may include (1) a fourth type of semiconductor chip 100 having the same specification as illustrated in FIG. 17D, which may be used for an application specific integrated-circuit (ASIC) chip 399, such as field-programmable-gate-array (FPGA) integrated-circuit (IC) chips 200 as illustrated in FIG. 11, graphic-processing-unit (GPU) integrated-circuit (IC) chips, central-processing-unit (CPU) integrated-circuit (IC) chips, tensor-processing-unit (TPU) integrated-circuit (IC) chips, network-processing-unit (NPU) integrated-circuit (IC) chips, application-processing-unit (APU) integrated-circuit (IC) chips or digital-signal-processing (DSP) integrated-circuit (IC) chips, (2) multiple fifth type of semiconductor chip 100 each having the same specification as illustrated in FIG. 17E, each of which may be an NVM IC chip 250, such as NAND or NOR flash chip, MRAM IC chip, RRAM IC chip of FRAM IC chip, an HBM IC chip 251, such as SRAM IC chip or DRAM IC chip, or an AS IC chip 411 as illustrated in FIG. 13, and (3) multiple second type of vertical-through-via (VTV) connectors 467 each having the same specification as illustrated in any of FIGS. 1G, 1J, 1M, 2E, 2H and 2K, For Example, for the ninth type of operation module 190, a left one of its fifth type of semiconductor chips 100 may be the NVM IC chip 250, a middle one of its fifth type of semiconductor chips 100 may be the AS IC chip 411, and a right one of its fifth type of semiconductor chips 100 may be the HBM IC chip 251.

Referring to FIG. 33, for the ninth type of operation module 190, each of its fifth type of semiconductor chip 100 may be provided with (1) the insulating bonding layer 52, i.e., silicon oxide, having a top surface attached to a bottom surface of the insulating bonding layer 52, i.e., silicon oxide, of its application specific integrated-circuit (ASIC) chip 399 and (2) the metal pads 6*a*, i.e., copper layer 24, each having a top surface bonded to a bottom surface of one of the metal pads 6*a*, i.e., copper layer 24 thereof, of its application specific integrated-circuit (ASIC) chip 399. Each of its second type of vertical-through-via (VTV) connectors 467 may be provided with (1) the insulating bonding layer 52, i.e., silicon oxide, having a top surface attached to a bottom surface of the insulating bonding layer 52, i.e., silicon oxide, of its application specific integrated-circuit (ASIC) chip 399 and (2) the vertical through vias (VTVs) 358 each having a top surface bonded to a bottom surface of one of the metal pads 6*a*, i.e., copper layer 24 thereof, of its application specific integrated-circuit (ASIC) chip 399.

Referring to FIG. 33, the ninth type of operation module 190 may include a first polymer layer 565-1, such as molding compound, epoxy-based material or polyimide, filled into multiple gaps each between neighboring two of its fifth type of semiconductor chips 100 and second type of vertical-through-via (VTV) connectors 467. For each of the fifth type of semiconductor chips 100 of the ninth type of operation module 190, its semiconductor substrate 2 may have a portion at a backside thereof removed by a chemical-mechanical-polishing (CMP) or mechanical grinding process such that each of its through silicon vias (TSVs) 157, that is, the copper layer 156 thereof, may have a backside substantially coplanar to the backside of its semiconductor substrate 2 and a bottom surface of the first polymer layer 565-1 of the ninth type of operation module 190. For each of the second type of vertical-through-via (VTV) connectors 467 of the ninth type of operation module 190, each of the first or second type of vertical-through-via (VTV) connectors 467 may have a portion at a backside thereof removed by a chemical-mechanical-polishing (CMP) or mechanical grinding process such that its vertical through vias (VTVs) 358 may have a backside exposed with being substantially coplanar with a bottom surface of the first polymer layer 565-1 of the ninth type of operation module 190.

Referring to FIG. 33, the ninth type of operation module 190 may further include multiple metal bumps or pillars in an array at a bottom thereof, each having various types, i.e., first, second, third and fourth types, which may have the same specification as that of the first, second, third and fourth types of micro-bump or micro-pillars 34 respectively as illustrated in FIG. 1F. Each of its first, second, third or fourth metal bumps or pillars may have the adhesion layer 26*a* on a bottom surface of one of the through silicon vias (TSVs) 157 of one of its fourth type of semiconductor chip 100 or on a bottom surface of one of the vertical through vias (VTVs) 358 of one of its second type of vertical-through-via (VTV) connectors 467.

Referring to FIG. 33, the ninth type of operation module 190 may include an interposer 551 under the fourth type of semiconductor chips 100. The interposer 551 may be provided with (1) a silicon substrate 552, (2) multiple through silicon vias 558 extending vertically through its silicon substrate 552, (3) an interconnection scheme over the silicon substrate 552, having the same specification as illustrated for the first interconnection scheme 560, second interconnection scheme 588 or combination of and first interconnection scheme 560 and second interconnection scheme 588 as illustrated in FIGS. 15A and 15B, wherein its interconnection scheme may include multiple interconnection metal layers 67 over the silicon substrate 552, coupling to its through silicon vias 558 and each having the same specification as that of the interconnection metal layer 6 of the first interconnection scheme 560 or that of the interconnection metal layer 27 of the second interconnection scheme 588, and multiple insulating dielectric layers 112 each between neighboring two of its interconnection metal layers 67, under the bottommost one of its interconnection metal layers 67 or over the topmost one of its interconnection metal layers 67, each having the same specification as that of the insulating dielectric layer 12 of the first interconnection scheme 560 or that of polymer layer 42 of the second interconnection scheme 588, and (4) an insulating dielectric layer 585, i.e., polymer layer, on a bottom surface of its silicon substrate 552, wherein each opening in the insulating dielectric layer 585 may be vertically under a backside of one of its through silicon vias 558.

Referring to FIG. 33, each of the through silicon vias 558 of the interposer 551 of the ninth type of chip package 190 may include (1) a copper layer 557 extending vertically through the silicon substrate 552, (2) an insulating layer 555 around a sidewall of its copper layer 557 and in the silicon substrate 552 of the interposer 551, (3) an adhesion layer 556 around the sidewall of the copper layer 557 and between the copper layer 557 and the insulating layer 555 and (4) a seed layer 559 around the sidewall of the copper layer 557 and between the copper layer 557 and the adhesion layer 556. Each of the through silicon vias 558, i.e., the copper layer 557 thereof, may have a depth between 30 μm and 150 μm, or 50 μm and 100 μm, and a diameter or largest transverse size between 5 μm and 50 μm, or 5 μm and 15 μm. The adhesion layer 556 may include a titanium (Ti) or titanium nitride (TiN) layer having a thickness between 1 nm to 50 nm. The seed layer 559 may be a copper layer having a thickness of between 3 nm and 200 nm. The insulating layer 555 may include a thermally grown silicon oxide ($SiO_2$) and/or a CVD silicon nitride ($Si_3N_4$), for example.

For the ninth type of operation module 190, each of its fourth type of semiconductor chips 100 and second type of vertical-through-via (VTV) connectors 467 may have the first, second, third or fourth type of micro-bumps or micro-pillars bonded to its interposer 551 to form multiple metal contacts 563 between said each of its fourth type of semiconductor chips 100 and second type of vertical-through-via (VTV) connectors 467 and its interposer 551, wherein each of its metal contacts 563 may include a copper layer having a thickness between 2 μm and 20 μm and a largest transverse dimension 1 μm and 15 μm between said each of its fourth type of semiconductor chips 100 and second type of vertical-through-via (VTV) connectors 467 and its interposer 551 and a solder cap, made of a tin-silver alloy, a tin-gold alloy, a tin-copper alloy, a tin-indium alloy, indium or tin, having a thickness of between 1 μm and 15 μm between the copper layer of said each of its metal contacts 563 and its interposer 551. The ninth type of operation module 190 may further include (1) an underfill 564, i.e, polymer layer, between each of its fourth type of semiconductor chips 100 and second type of vertical-through-via (VTV) connectors 467 and its interposer 551 and between its first polymer layer 565-1 and its interposer 551, covering a sidewall of each of its metal contacts 563 between said each of its fourth type of semiconductor chips 100 and second type of vertical-through-via (VTV) connectors 467 and its interposer 551, (2) a second polymer layer 565-2, such as molding compound, epoxy-based material or polyimide, on its interposer 551 and underfill 564, wherein its second polymer layer 565-2 has a top surface coplanar to a top surface of its application specific integrated-circuit (ASIC) chip 399, and (3) multiple metal bumps or pillars 583 in an array on a bottom surface of its interposer 551. Each of its metal bumps or pillars 583, which may of one of the first through fourth types having the same specifications as the first through fourth types of micro-bumps or micro-pillars 34 as illustrated in FIG. 1F respectively, may be formed on the backside of one of the through silicon vias 558 of its interposer 551, i.e., a backside of the copper layer 557 thereof.

Referring to FIG. 33, for the ninth type of operation module 190, its application specific integrated-circuit (ASIC) logic chip 399 may have the semiconductor devices 4 such as transistors at the active surface of the semiconductor substrate 2 thereof as illustrated in FIG. 17D. The active surface of the semiconductor substrate 2 of its application specific integrated-circuit (ASIC) logic chip 399 may face an active surface of the semiconductor substrate 2 of each of its NVM IC chip 250, HBM IC chip 251 and AS IC chip 411, wherein each of its NVM IC chip 250, HBM IC chip 251 and AS IC chip 411 is arranged under its application specific integrated-circuit (ASIC) logic chip 399 and may have the semiconductor devices 4 such as transistors at the active surface of the semiconductor substrate 2 thereof as illustrated in FIG. 17E. The active surface of the semiconductor substrate 2 of its application specific integrated-circuit (ASIC) logic chip 399 may face each of its second type of vertical-through-via (VTV) connectors 467.

Referring to FIG. 33, for the ninth type of operation module 190, in the case that its application specific integrated-circuit (ASIC) chip 399 is the FPGA IC chip 200 as illustrated in FIG. 11, a first one of large I/O circuits of its NVM IC chip 250 may have a large driver coupling to a large receiver of a second one of large I/O circuits of its AS IC chip 411 via, in sequence, one of the through silicon vias (TSVs) of its NVM IC chip 250, one of its metal contacts 563 under its NVM IC chip 250, one or more of the interconnection metal layers 67 of its interposer 551, one of its metal contacts 563 under its AS IC chip 411, and one of the through silicon vias (TSVs) of its AS IC chip 411 for passing first encrypted CPM data from the large driver of the first one of the large I/O circuits to the large receiver of the second one of the large I/O circuits. Next, the first encrypted CPM data may be decrypted as illustrated in FIG. 13 by the cryptography block or circuit 517 of its AS IC chip 411 as first decrypted CPM data. Next, a first one of small I/O circuits of its AS IC chip 411 may have a small driver coupling to a small receiver of a second one of small I/O circuits of its application specific integrated-circuit (ASIC) chip 399 via one of the metal pads **6*a* of its AS IC chip 411 and one of the metal pads 6*a* of its application specific integrated-circuit (ASIC) chip 399 for passing the first decrypted CPM data from the small driver of the first one of the small I/O circuits to the small receiver of the second one of the small I/O circuits. Next, for the application specific integrated-circuit (ASIC) chip 399 of the seventh type of chip package 307, one of the first type of memory cells 490 of one of its programmable logic cells (LC) 2014 as seen in FIGS. 9A-9D may be programmed or configured in accordance with the first decrypted CPM data, or one of the first type of memory cells 362 of one of its programmable switch cells 379 as seen in FIG. 10 may be programmed or configured in accordance with the first decrypted CPM data. Alternatively, for the ninth type of operation module 190, a third one of the small I/O circuits of its application specific integrated-circuit (ASIC) chip 399 may have a small driver coupling to a small receiver of a fourth one of the small I/O circuits of its AS IC chips 411 via one of the metal pads 6*a* of its application specific integrated-circuit (ASIC) chip 399 and one of the metal pads 6*a* of its AS IC chip 411 for passing second CPM data used to program or configure the first type of memory cells 490 of one of the programmable logic cells (LC) 2014 of its application specific integrated-circuit (ASIC) chip 399 or the first type of memory cells 362 of one of the programmable switch cells 379 of its application specific integrated-circuit (ASIC) chip 399 from the small driver of the third one of the small I/O circuits to the small receiver of the fourth one of the small I/O circuits. Next, the second CPM data may be encrypted as illustrated in FIG. 13 by the cryptography block or circuit 517 of its AS IC chip 411 as second encrypted CPM data. Next, a third one of the large I/O circuits of its AS IC chips 411 may have a large driver coupling to a large receiver of a fourth one of the large I/O circuits of its NVM IC chip 250 via, in sequence, one of the through silicon vias (TSVs) of its AS IC chip 411, one of its metal contacts 563 under its AS IC chip 411, one or more of the interconnection metal layers 67 of its interposer 551, one of its metal contacts 563 under its NVM IC chip 250 and one of the through silicon vias (TSVs) of its NVM IC chip 250 for passing the second encrypted CPM data from the large driver of the third one of the large I/O circuits to the large receiver of the fourth one of the large I/O circuits to be stored in its NVM IC chip 250**. It is noted that each of the first, second, third and fourth ones of the large input/output (I/O) circuits may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example. Each of the first, second, third and fourth ones of the small input/output (I/O) circuits may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF for example.

Referring to FIG. 33, for the ninth type of operation module 190, its AS IC chip 411 may include the regulating block 415 as seen in FIG. 13 configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) chip 399, its NVM IC chip 250 and/or its NVM IC chip 250.

Referring to FIG. 33, for the ninth type of operation module 190, its HBM IC chip 251 may have multiple small I/O circuits coupling respectively to multiple small I/O circuits of its application specific integrated-circuit (ASIC) chip 399 through the bonding of each of a set of metal pads **6*a* of its application specific integrated-circuit (ASIC) chip 399 to one of a set of metal pads 6*a* of its HBM IC chip 251 for data transmission with a data bit width of equal to or greater than 64, 128, 256, 512, 1024, 2048, 4096, 8K, or 16K. Each of the small I/O circuits of its HBM IC chip 251 and application specific integrated-circuit (ASIC) chip 399** may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF.

Referring to FIG. 33, for the ninth type of operation module 190, each of its NVM IC chip 250, HBM IC chip 251 and AS IC chip 411 may be implemented using a semiconductor note or generation less advanced than or equal to, or above or equal to 20 nm, 30 nm, 40 nm, 50 nm, 90 nm, 130 nm, 250 nm, 350 nm or 500 nm. The semiconductor technology node or generation used in each of its NVM IC chip 250, HBM IC chip 251 and AS IC chip 411 may be 1, 2, 3, 4, 5 or greater than 5 nodes or generations older, more matured or less advanced than that used in its known-good application specific integrated-circuit (ASIC) logic chip 399. Transistors used in each of its NVM IC chip 250, HBM IC chip 251 and AS IC chip 411 may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of its NVM IC chip 250, HBM IC chip 251 and AS IC chip 411 may be different from that used in its known-good application specific integrated-circuit (ASIC) logic chip 399; each of its NVM IC chip 250, HBM IC chip 251 and AS IC chip 411 may use planar MOSFETs, while its known-good application specific integrated-circuit (ASIC) logic chip 399 may use fin field effect transistors (FINFETs) or gate-all-around field effect transistors (GAAFETs). A power supply voltage (Vcc) applied in each of its NVM IC chip 250, HBM IC chip 251 and AS IC chip 411 may be greater than or equal to 1.5, 2.0, 2.5, 3, 3.3, 4, or 5 voltages, while a power supply voltage (Vcc) applied in its known-good application specific integrated-circuit (ASIC) logic chip 399 may be smaller than or equal to 1.8, 1.5 or 1 voltage. The power supply voltage applied in each of its NVM IC chip 250, HBM IC chip 251 and AS IC chip 411 may be higher than that applied in its known-good application specific integrated-circuit (ASIC) logic chip 399. A gate oxide of a field effect transistor (FET) of each of its NVM IC chip 250, HBM IC chip 251 and AS IC chip 411 may have a physical thickness greater than or equal to 5 nm, 6 nm, 7.5 nm, 10 nm, 12.5 nm, or 15 nm, while a gate oxide of a field effect transistor (FET) of its known-good application specific integrated-circuit (ASIC) logic chip 399 may have a physical thickness less than 4.5 nm, 4 nm, 3 nm or 2 nm. The thickness of the gate oxide of the field effect transistor (FET) of each of its NVM IC chip 250, HBM IC chip 251 and AS IC chip 411 may be greater than that of its known-good application specific integrated-circuit (ASIC) logic chip 399.

Chip Package for Logic Drive

FIG. 34 is a schematically cross-sectional view showing a first type of chip package for a standard commodity logic drive in accordance with an embodiment of the present application. The standard commodity logic drive as seen in FIG. 14A may be formed as illustrated for a first type of chip package shown in FIG. 34. Referring to FIG. 34, an interposer 551 may be provided with the same structure as illustrated in FIG. 33 and multiple micro-bumps or micro-pillars 34, which may be of one of the first, second and fourth types having the same specifications as the first, second and fourth types of micro-bumps or micro-pillars 34 as illustrated in FIG. 1F respectively, on multiple metal pads of a topmost one of the interconnection metal layers 67 of the interposer 551 at bottoms of multiple openings in a topmost one of the insulating dielectric layers 112 of the interposer 551.

Each of the operation modules 190, which may be of the first type as seen in FIG. 21F, 21G, 23F or 23G, the second type as seen in FIG. 24G, 24H, 25G or 25H, the third type as seen in FIG. 26F, 26G, 26H, 27F, 27G or 27H, the fourth type as seen in FIG. 28J, the fifth type as seen in FIG. 29, the sixth type as seen in FIG. 30, the seventh type as seen in FIG. 31, the eighth type as seen in FIG. 32, or the ninth type as seen in FIG. 33, may have its first, second or third type of metal bumps 583 to be bonded to the first, second or fourth type of micro-bumps or micro-pillars 34 of the interposer 551 into multiple bonded contacts 563 therebetween, as referred to any of the first through fourth cases illustrated in FIGS. 21A-21C. Each of the semiconductor chips 100 may be formed with the structure as illustrated in FIG. 17A to have its first, second or third type of micro-bumps or micro-pillars 34 to be bonded to the first, second or fourth type of micro-bumps or micro-pillars 34 of the interposer 551 into multiple bonded contacts 563 therebetween, as referred to any of the first through fourth cases illustrated in FIGS. 21A-21C. Each of the semiconductor chips 100 may be a standard commodity FPGA IC chip 200, graphic-processing-unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, high-bandwidth-memory (HBM) integrated-circuit (IC) chips 251, dedicated control and input/output (I/O) chip 260, IAC chip 402 or non-volatile memory (NVM) IC chip 250 as illustrated in FIG. 14A. Next, an underfill 564, such as epoxy resins or compounds, may be filled into a gap between each of the operation modules 190 and the interposer 551 to enclose the bonded contacts 563 therebetween and into a gap between each of the semiconductor chips 100 and the interposer 551 to enclose the bonded contacts 563 therebetween. The underfill 564 may be cured at temperature equal to or above 100, 120 or 150 degrees Celsius. Next, a chemical mechanical polishing (CMP), polishing or grinding process may be applied to remove a bottom portion of the silicon substrate 2 of the interposer 551, to planarize a backside of each of the through silicon vias (TSVs) 157 of the interposer 551 and a bottom surface of the silicon substrate 2 of the interposer 551 and to expose a backside of the copper layer 156 of each of the through silicon vias (TSVs) 157 of the interposer 551. For each of the through silicon vias (TSVs) 157 of the interposer 551, its insulating lining layer 153, adhesion layer 154 and seed layer 155 at its backside is removed to expose a backside of its copper layer 156, wherein its insulating lining layer 153, adhesion layer 154 and seed layer 155 surrounds its copper layer 156 at a sidewall thereof. Next, a passivation layer 14 having the same specification as that illustrated in FIG. 1F may be formed on the bottom surface of the silicon substrate 552 of the interposer 551. Next, multiple metal bumps 593, which may be of one of the first through fourth types having the same specifications as the first through fourth types of micro-bumps or micro-pillars 34 as illustrated in FIG. 1F respectively, may be formed on the backsides of the copper layer 156 of the through silicon vias (TSVs) 157 of the interposer 551 respectively. Next, the interposer 551 may be cut or diced to form multiple individual standard commodity logic drives 300 as shown in FIG. 34 by a laser cutting process or by a mechanical cutting process. After the metal bumps 593 of the standard commodity logic drives 300 are bonded to a mother board (not shown), the heat dissipation module as illustrated in as illustrated in FIG. 21F, 21G, 23F or 23G may be provided to attach the cold side of its thermoelectric (TE) cooler 633 to the backside of the application specific integrated-circuit (ASIC) chip 399 of the first type of operation module 190 of the standard commodity logic drive 300 as illustrated in FIG. 21F, 21G, 23F or 23G, to the backside of each of the known-good application specific integrated-circuit (ASIC) chip 399 and known-good semiconductor chip 405 of the second type of operation module 190 of the standard commodity logic drive 300 as illustrated in FIG. 24G, 24H, 25G or 25H, to the backside of the application specific integrated-circuit (ASIC) chip 399 of the third type of operation module 190 of the standard commodity logic drive 300 as illustrated in FIG. 26F, 26G, 26H, 27F, 27G or 27H or to the backside of the application specific integrated-circuit (ASIC) chip 399 of the ninth type of operation module 190 of the standard commodity logic drive 300 as illustrated in FIG. 33; alternatively, a heat sink 316 may be provided to be attached to the hot side of the thermoelectric (TE) cooler 633 of the fourth, fifth, sixth, seventh or eighth type of operation module 190 of the standard commodity logic drive 300 as illustrated in FIG. 28J, 29, 30, 31 or 32 respectively.

FIG. 35 is a schematically cross-sectional view showing a second type of chip package for a standard commodity logic drive in accordance with an embodiment of the present application. The standard commodity logic drive as seen in FIG. 14A may be formed as illustrated for a second type of chip package shown in FIG. 35. Referring to FIG. 35, the standard commodity logic drive 300 may include (1) a polymer layer 565; (2) multiple of the operation modules 190, which may be of the first type as seen in FIG. 21F, 21G, 23F or 23G, the second type as seen in FIG. 24G, 24H, 25G or 25H, the third type as seen in FIG. 26F, 26G, 26H, 27F, 27G or 27H, the fourth type as seen in FIG. 28J, the fifth type as seen in FIG. 29, the sixth type as seen in FIG. 30, the seventh type as seen in FIG. 31, the eighth type as seen in FIG. 32, or the ninth type as seen in FIG. 33, embedded in the polymer layer 565, wherein each of the operation modules 190 may be provided with an insulating dielectric layer 257 such as polymer layer at a top thereof, wherein each of the operation modules 190 may be provided with the first type of metal bumps 583 each having a top surface, i.e., top surface of the copper layer 32 thereof, coplanar with a top surface of the insulating dielectric layer 257 thereof and a top surface of the polymer layer 565; (3) multiple of the semiconductor chips 100, each of which may have a structure similar to that as illustrated in FIG. 17A, embedded in the polymer layer 565, wherein each of the semiconductor chips 100 may be provided with an insulating dielectric layer 257 such as polymer layer at a top thereof, wherein each of the semiconductor chips 100 may be provided with the first type of metal bumps 34 each having a top surface, i.e., top surface of the copper layer 32 thereof, coplanar with a top surface of the insulating dielectric layer 257 thereof and a top surface of the polymer layer 565, wherein each of the semiconductor chips 100 may be a standard commodity FPGA IC chip 200, graphic-processing-unit (GPU) integrated-circuit (IC) chip 269*a*, central-processing-unit (CPU) integrated-circuit (IC) chip 269*b*, tensor-processing-unit (TPU) integrated-circuit (IC) chip 269*c*, network-processing-unit (NPU) integrated-circuit (IC) chip 269*d*, digital-signal-processing (DSP) integrated-circuit (IC) chip 270, auxiliary and supporting (AS) integrated-circuit (IC) chip 411, high-bandwidth-memory (HBM) integrated-circuit (IC) chips 251, dedicated control and input/output (I/O) chip 260, IAC chip 402 or non-volatile memory (NVM) IC chip 250 as illustrated in FIG. 14A; (4) a frontside interconnection scheme 101 on the top surface of the polymer layer 565 and the top surface of the insulating dielectric layer 257 of each of the operation modules 190 and semiconductor chips 100, wherein the frontside interconnection scheme 101 may include one or more interconnection metal layers 27 coupling to the first type of micro-bumps or micro-pillars 34 of each of the semiconductor chips 100 and to the first type of metal bumps 583 of each of the operation modules 190 and one or more polymer layers 42 each between neighboring two of the interconnection metal layers 27 of its frontside interconnection scheme 101, between a bottommost one of the interconnection metal layers 27 of its frontside interconnection scheme 101 and a top planar surface composed of the top surface of its polymer layer 565 and the top surface of the insulating dielectric layer 257 of each of the operation modules 190 and semiconductor chips 100, or on and above a topmost one of the interconnection metal layers 27 of its frontside interconnection scheme 101, wherein each of the interconnection metal layers 27 of its frontside interconnection scheme 101 may have the specification that may be referred to that of one of the interconnection metal layers 27 of the backside interconnection scheme 79 as illustrated in FIG. 21E; and (5) multiple metal bumps 593, which may be of one of the first through fourth types having the same specifications as the first through fourth types of micro-bumps or micro-pillars 34 as illustrated in FIG. 1F respectively, on metal pads of the topmost one of the interconnection metal layers 27 of its frontside interconnection scheme 101 at bottoms of multiple openings in the topmost one of the polymer layers 42 of its frontside interconnection scheme 101. After the metal bumps 593 of the standard commodity logic drives 300 are bonded to a mother board (not shown), the heat dissipation module as illustrated in as illustrated in FIG. 21F, 21G, 23F or 23G may be provided to attach the cold side of its thermoelectric (TE) cooler 633 to the backside of the application specific integrated-circuit (ASIC) chip 399 of the first type of operation module 190 of the standard commodity logic drive 300 as illustrated in FIG. 21F, 21G, 23F or 23G, to the backside of each of the known-good application specific integrated-circuit (ASIC) chip 399 and known-good semiconductor chip 405 of the second type of operation module 190 of the standard commodity logic drive 300 as illustrated in FIG. 24G, 24H, 25G or 25H, to the backside of the application specific integrated-circuit (ASIC) chip 399 of the third type of operation module 190 of the standard commodity logic drive 300 as illustrated in FIG. 26F, 26G, 26H, 27F, 27G or 27H, or to the backside of the application specific integrated-circuit (ASIC) chip 399 of the ninth type of operation module 190 of the standard commodity logic drive 300 as illustrated in FIG. 33; alternatively, a heat sink 316 may be provided to be attached to the hot side of the thermoelectric (TE) cooler 633 of the fourth, fifth, sixth, seventh or eighth type of operation module 190 of the standard commodity logic drive 300 as illustrated in FIG. 28J, 29, 30, 31 or 32 respectively.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multichip package comprising:

an interposer comprising a first silicon substrate, a first through-silicon via vertically in the first silicon substrate and a first interconnection scheme over the first silicon substrate;

a first metal bump at a bottom of the multichip package, under the interposer and coupling to the first through-silicon via;

a stacked chip package over the interposer and coupling to the interposer, wherein the stacked chip package comprises:

an element over the interposer, wherein the element comprises a second silicon substrate, a first insulating bonding layer over the second silicon substrate and at a top of the element and a first copper pad over the second silicon substrate and at the top of the element and in a first opening in the first insulating bonding layer, wherein the first insulating bonding layer comprises silicon, a second metal bump between the element and interposer and coupling the element to the interposer, and a first integrated-circuit (IC) chip on the element, wherein the first integrated-circuit (IC) chip comprises a second insulating bonding layer at a bottom of the first integrated-circuit (IC) chip and a second copper pad at the bottom of the first integrated-circuit (IC) chip and in an opening in the second insulating bonding layer, wherein the second copper pad has a bottom surface bonded to and in contact with a top surface of the first copper pad and the second insulating bonding layer has a bottom surface bonded to and in contact with a top surface of the first insulating bonding layer, wherein the second insulating bonding layer comprises silicon;

a second integrated-circuit (IC) chip over the interposer and at a same horizontal level as the stacked chip package, wherein the second integrated-circuit (IC) chip couples to the stacked chip package through the first interconnection scheme; and a third metal bump between the second integrated-circuit (IC) chip and interposer, wherein the third metal bump has a top joining a bottom of the second integrated-circuit (IC) chip and a bottom joining a top of the interposer.

2. The multichip package of claim 1, wherein the element comprises a third integrated-circuit (IC) chip comprising the second silicon substrate therein and a second through-silicon via vertically in the second silicon substrate.

3. The multichip package of claim 2, wherein the second through-silicon via comprises a copper layer in an opening in the second silicon substrate and an adhesion metal layer at a sidewall of the copper layer.

4. The multichip package of claim 2, wherein the first copper pad is vertically over and aligned with the second through-silicon via.

5. The multichip package of claim 2, wherein the second metal bump is vertically under and aligned with the second through-silicon via.

6. The multichip package of claim 2, wherein the third integrated-circuit (IC) chip further comprises an adhesion metal layer having a first portion at a bottom of the first copper pad and a second portion at a sidewall of the first copper pad.

7. The multichip package of claim 1, wherein the first integrated-circuit (IC) chip further comprises a third silicon substrate, a transistor at a bottom of the third silicon substrate and a second interconnection scheme under the third silicon substrate, wherein the second insulating bonding layer is under the second interconnection scheme and the second copper pad is under and couples to the second interconnection scheme.

8. The multichip package of claim 1, wherein the first integrated-circuit (IC) chip further comprises a first adhesion metal layer having a first portion at a top of the second copper pad and a second portion at a sidewall of the second copper pad.

9. The multichip package of claim 8, wherein the first integrated-circuit (IC) chip further comprises a third silicon substrate, a transistor at a bottom of the third silicon substrate and an interconnection metal layer under the third silicon substrate, wherein the interconnection metal layer comprises a copper layer and a second adhesion metal layer having a first portion at a top of the copper layer and a second portion at a sidewall of the copper layer, wherein the first portion of the first adhesion metal layer is between the copper layer of the interconnection metal layer and the second copper pad and under and in contact with the copper layer of the interconnection metal layer.

10. The multichip package of claim 1, wherein the first through-silicon via comprises a copper layer in an opening in the first silicon substrate and an adhesion metal layer at a sidewall of the copper layer.

11. The multichip package of claim 1, wherein the stacked chip package further comprises a sealing layer having a first portion and a second portion opposite to the first portion of the sealing layer, wherein the element comprises a third integrated-circuit (IC) chip comprising the second silicon substrate therein, wherein the third integrated-circuit (IC) chip is, in a horizontal direction, between the first and second portions of the sealing layer, wherein the first portion of the sealing layer extends from a left sidewall of the third integrated-circuit (IC) chip and has a right sidewall in contact with the left sidewall of the third integrated-circuit (IC) chip and a left sidewall opposite to the right sidewall of the first portion of the sealing layer, wherein the left sidewall of the first portion of the sealing layer is at a left edge of the sealing layer, wherein the left sidewall of the first portion of the sealing layer extends in a vertical direction.

12. The multichip package of claim 11, wherein the first integrated-circuit (IC) chip has a left sidewall recessed from the left sidewall of the first portion of the sealing layer.

13. The multichip package of claim 11, wherein the first integrated-circuit (IC) chip has a left sidewall recessed from the left sidewall of the third integrated-circuit (IC) chip and a right sidewall opposite to the left sidewall of the first integrated-circuit (IC) chip and recessed from a right sidewall of the third integrated-circuit (IC) chip, wherein the right sidewall of the third integrated-circuit (IC) chip is opposite to the left sidewall of the third integrated-circuit (IC) chip.

14. The multichip package of claim 1, wherein the stacked chip package further comprises a third integrated-circuit (IC) chip on the element and at a same horizontal level as the first integrated-circuit (IC) chip, wherein the element further comprises a third copper pad at the top of the element and in a second opening in the first insulating bonding layer, wherein the third integrated-circuit (IC) chip comprises a third insulating bonding layer at a bottom of the third integrated-circuit (IC) chip and a fourth copper pad at the bottom of the third integrated-circuit (IC) chip and in an opening in the third insulating bonding layer, wherein the fourth copper pad has a bottom surface bonded to and in contact with a top surface of the third copper pad and the third insulating bonding layer has a bottom surface bonded to and in contact with the top surface of the first insulating bonding layer, wherein the third insulating bonding layer comprises silicon.

15. The multichip package of claim 1, wherein the second insulating bonding layer has a thickness between 0.1 and 2 micrometers.

16. The multichip package of claim 1, wherein the second metal bump comprises tin.

17. The multichip package of claim 1, wherein the first integrated-circuit (IC) chip is a logic chip.

18. The multichip package of claim 1, wherein the first integrated-circuit (IC) chip is a graphic-processing-unit (GPU) integrated-circuit (IC) chip.

19. The multichip package of claim 1, wherein the first integrated-circuit (IC) chip is a central-processing-unit (CPU) integrated-circuit (IC) chip.

20. The multichip package of claim 1, wherein the first integrated-circuit (IC) chip is a field-programmable-gate-array (FPGA) integrated-circuit (IC) chip.

21. The multichip package of claim 1, wherein the element comprises a memory chip.

22. The multichip package of claim 1, wherein the element comprises an input/output (I/O) chip.

23. The multichip package of claim 1, wherein the element comprises a memory chip and the first integrated-circuit (IC) chip is a logic chip.

24. The multichip package of claim 1, wherein the element comprises an input/output (I/O) chip and the first integrated-circuit (IC) chip is a logic chip.

25. The multichip package of claim 1, wherein the second integrated-circuit (IC) chip is a memory chip.

26. The multichip package of claim 1, wherein the element comprises a third integrated-circuit (IC) chip comprising the second silicon substrate, a transistor at a top of the second silicon substrate, a second through-silicon via vertically in the second silicon substrate, a second interconnection scheme over the second silicon substrate, the first insulating bonding layer over the second interconnection scheme and the first copper pad over and coupling to the second interconnection scheme.

27. The multichip package of claim 1, wherein the element further comprises a transistor at a top of the second silicon substrate, a second through-silicon via vertically in the second silicon substrate and a second interconnection scheme over the second silicon substrate, wherein the first insulating bonding layer is over the second interconnection scheme and the first copper pad is over and couples to the second interconnection scheme.

28. The multichip package of claim 1, wherein the stacked chip package further comprises a sealing layer having a first portion and a second portion opposite to the first portion of the sealing layer, wherein the first integrated-circuit (IC) chip is, in a horizontal direction, between the first and second portions of the sealing layer, wherein the first portion of the sealing layer extends from a left sidewall of the first integrated-circuit (IC) chip and has a right sidewall in contact with the left sidewall of the first integrated-circuit (IC) chip and a left sidewall opposite to the right sidewall of the first portion of the sealing layer, wherein the left sidewall of the first portion of the sealing layer is at a left edge of the sealing layer, wherein the left sidewall of the first portion of the sealing layer extends in a vertical direction.

29. The multichip package of claim 28, wherein the sealing layer comprises a molding compound.

* * * * *